US012740310B2

(12) United States Patent
Ji et al.

(10) Patent No.: US 12,740,310 B2
(45) Date of Patent: Sep. 15, 2026

(54) ORGANIC ELECTROLUMINESCENT MATERIALS AND DEVICES

(71) Applicant: UNIVERSAL DISPLAY CORPORATION, Ewing, NJ (US)

(72) Inventors: Zhiqiang Ji, Chalfont, PA (US); Pierre-Luc T. Boudreault, Pennington, NJ (US); Walter Yeager, Yardley, PA (US); Derek Ian Wozniak, Bensalem, PA (US); Wei-Chun Shih, Lawrenceville, NJ (US); Alexey Borisovich Dyatkin, Ambler, PA (US); Hsiao-Fan Chen, Lawrence Township, NJ (US); Elena Sheina, Yardley, PA (US); Peter Wolohan, Princeton Junction, NJ (US); Wystan Neil Palmer, Frenchtown, NJ (US)

(73) Assignee: Universal Display Corporation, Ewing, NJ (US)

( * ) Notice: Subject to any disclaimer, the term of this patent is extended or adjusted under 35 U.S.C. 154(b) by 368 days.

(21) Appl. No.: 18/438,528

(22) Filed: Feb. 12, 2024

(65) Prior Publication Data

US 2024/0373737 A1 Nov. 7, 2024

Related U.S. Application Data

(60) Provisional application No. 63/499,868, filed on May 3, 2023, provisional application No. 63/487,321, filed on Feb. 28, 2023.

(51) Int. Cl.

| | |
|---|---|
| *H10K 85/30* | (2023.01) |
| *C07F 15/00* | (2006.01) |

(Continued)

(52) U.S. Cl.

CPC ....... *H10K 85/342* (2023.02); *C07F 15/0033* (2013.01); *C09K 11/06* (2013.01);

(Continued)

(58) Field of Classification Search

CPC ................ C07F 15/0033; C09K 11/06; C09K 2211/1033; C09K 2211/185; H10K 50/12;

(Continued)

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |

(Continued)

FOREIGN PATENT DOCUMENTS

| | | | |
|---|---|---|---|
| CN | 1696137 | A | 11/2005 |
| CN | 102702075 | A | 10/2012 |

(Continued)

OTHER PUBLICATIONS

Ming Yan, et al., Tetrahedron 2015, 71, 1425-30 and Atzrodt et al., Angew. Chem. Int. Ed. (Reviews) 2007, 46, 7744-65.

(Continued)

*Primary Examiner* — Victor A Mandala
(74) *Attorney, Agent, or Firm* — LNK law, PLLC

(57) ABSTRACT

Provided are organometallic compounds comprising two moieties A and B which are each independently a monocyclic ring or a polycyclic fused ring structure, wherein the monocyclic ring or each ring of the polycyclic fused ring structure is independently a 5-membered to 10-membered carbocyclic or heterocyclic ring which are linked by a direct bond and which are further bridged by a linker comprising two groups which are each independently selected from the group consisting of O, S, Se, NR, BR, BRR', PR, CR, C═O, C═NR, C═CRR', C═S, CRR', SO, $SO_2$, P(O)R, SiRR', and GeRR'. Also provided are formulations comprising (Continued)

these organometallic compounds. Further provided are organic light emitting devices (OLEDs) and related consumer products that utilize these organometallic compounds.

20 Claims, 2 Drawing Sheets

(51) Int. Cl.
*C09K 11/06* (2006.01)
*H10K 50/12* (2023.01)
*H10K 101/10* (2023.01)

(52) U.S. Cl.
CPC ................ *C09K 2211/1033* (2013.01); *C09K 2211/185* (2013.01); *H10K 50/12* (2023.02); *H10K 50/121* (2023.02); *H10K 2101/10* (2023.02)

(58) Field of Classification Search
CPC .. H10K 50/121; H10K 2101/10; H10K 50/11; H10K 85/654; H10K 85/6576; H10K 85/6572; H10K 85/342
See application file for complete search history.

(56) References Cited

U.S. PATENT DOCUMENTS 5,247,190 A 9/1993 Friend et al.
5,639,914 A 6/1997 Tomiyama et al.
5,703,436 A 12/1997 Forrest et al.
5,707,745 A 1/1998 Forrest et al.
5,834,893 A 11/1998 Bulovic et al.
5,844,363 A 12/1998 Gu et al.
6,013,982 A 1/2000 Thompson et al.
6,087,196 A 7/2000 Sturm et al.
6,091,195 A 7/2000 Forrest et al.
6,097,147 A 8/2000 Baldo et al.
6,294,398 B1 9/2001 Kim et al.
6,303,238 B1 10/2001 Thompson et al.
6,337,102 B1 1/2002 Forrest et al.
6,413,656 B1 7/2002 Thompson
6,468,819 B1 10/2002 Kim et al.
6,517,957 B1 2/2003 Senoo et al.
6,653,654 B1 11/2003 Che
6,656,612 B2 12/2003 Okada et al.
6,670,645 B2 12/2003 Grushin et al.
6,687,266 B1 2/2004 Ma et al.
6,699,599 B2 3/2004 Li et al.
6,835,469 B2 12/2004 Kwong et al.
6,916,554 B2 7/2005 Ma et al.
6,921,915 B2 7/2005 Takiguchi et al.
7,154,114 B2 12/2006 Brooks et al.
7,279,704 B2 10/2007 Walters et al.
7,332,232 B2 2/2008 Ma et al.
7,345,301 B2 3/2008 Gerhard et al.
7,378,162 B2 5/2008 Jeong et al.
7,431,968 B1 10/2008 Shtein et al.
7,534,505 B2 5/2009 Lin et al.
7,605,277 B2 10/2009 Kai et al.
7,675,228 B2 3/2010 Ionkin et al.
7,728,137 B2 6/2010 Stössel et al.
7,740,957 B2 6/2010 Kim et al.
7,749,615 B2 7/2010 Fukumatsu et al.
7,759,489 B2 7/2010 Watanabe et al.
7,846,763 B2 12/2010 Bold et al.
7,951,947 B2 5/2011 Igarashi et al.
7,968,146 B2 6/2011 Wagner et al.
7,993,760 B2 8/2011 Komori et al.
8,044,222 B2 10/2011 Yabunouchi et al.
8,062,769 B2 11/2011 Kai et al.
8,067,099 B2 11/2011 Watanabe et al.
8,129,083 B2 3/2012 Yabunouchi et al.
8,222,637 B2 7/2012 Kawamura et al.
8,231,983 B2 7/2012 Sugita et al.
8,258,297 B2 9/2012 Molt et al.
8,263,770 B2 9/2012 Mat-Suo et al.
8,288,013 B2 10/2012 Morishita
8,372,527 B2 2/2013 Morishita et al.
8,373,159 B2 2/2013 Langer et al.
8,383,828 B2 2/2013 Molt et al.
8,415,031 B2 4/2013 Xia et al.
8,557,400 B2 10/2013 Xia et al.
8,574,725 B2 11/2013 Nishimura et al.
8,592,586 B2 11/2013 Molt et al.
8,597,798 B2 12/2013 Parham et al.
8,608,986 B2 12/2013 Akino et al.
8,614,010 B2 12/2013 Yabunouchi
8,703,304 B2 4/2014 Yabunouchi et al.
8,759,819 B2 6/2014 Nishimura et al.
8,871,361 B2 10/2014 Xia et al.
9,093,652 B2 7/2015 Jung et al.
9,169,282 B2 10/2015 Stoessel et al.
9,181,289 B2 11/2015 Stoessel et al.
9,196,842 B2 11/2015 Kato et al.
9,296,944 B2 3/2016 Toshihiro et al.
9,466,803 B1 10/2016 Park et al.
9,472,762 B2 10/2016 Murer et al.
9,490,432 B2 11/2016 Zeika et al.
9,564,595 B2 2/2017 Kato et al.
9,595,681 B2 3/2017 Mujica-Fernaud et al.
9,604,972 B2 3/2017 Yoshida et al.
9,634,255 B2 4/2017 Kato et al.
9,799,835 B2 10/2017 Kim et al.
9,837,622 B2 12/2017 Stoessel et al.
9,882,142 B2 1/2018 Mujica-Fernaud et al.
9,882,149 B2 1/2018 Kim et al.
9,978,975 B2 5/2018 Kambe et al.
10,008,672 B2 6/2018 Stoessel et al.
10,033,004 B2 * 7/2018 Lam .................... C09K 11/025
10,103,340 B2 10/2018 Stoessel et al.
10,347,850 B2 7/2019 Ono et al.
10,385,263 B2 8/2019 Fuchs et al.
10,418,568 B2 * 9/2019 Lam .................... H10K 85/658
10,522,768 B2 12/2019 Egen et al.
12,460,128 B2 * 11/2025 Beers .................... C09K 11/06
12,486,451 B2 * 12/2025 Shih .................... H10K 85/346
12,583,878 B2 * 3/2026 Chen .................. C07F 15/0086
2001/0019782 A1 9/2001 Igarashi et al.
2002/0034656 A1 3/2002 Thompson et al.
2002/0158242 A1 10/2002 Son et al.
2003/0068526 A1 4/2003 Kamatani et al.
2003/0072964 A1 4/2003 Kwong et al.
2003/0138657 A1 7/2003 Li et al.
2003/0162053 A1 8/2003 Marks et al.
2003/0175553 A1 9/2003 Thompson et al.
2003/0230980 A1 12/2003 Forrest et al.
2004/0036077 A1 2/2004 Ise
2004/0174116 A1 9/2004 Lu et al.
2005/0123751 A1 6/2005 Tsutsui
2005/0123788 A1 6/2005 Huo et al.
2005/0123791 A1 6/2005 Deaton et al.
2005/0139810 A1 6/2005 Kuehl et al.
2005/0238919 A1 10/2005 Ogasawara
2005/0244673 A1 11/2005 Satoh et al.
2005/0260449 A1 11/2005 Walters et al.
2006/0008670 A1 1/2006 Lin et al.
2006/0065890 A1 3/2006 Stossel et al.
2006/0127696 A1 6/2006 Stossel et al.
2006/0134459 A1 6/2006 Huo et al.
2006/0134462 A1 6/2006 Yeh et al.
2006/0182993 A1 8/2006 Ogata et al.
2006/0202194 A1 9/2006 Jeong et al.
2006/0240279 A1 10/2006 Adamovich et al.
2006/0251923 A1 11/2006 Lin et al.
2006/0280965 A1 12/2006 Kwong et al.
2007/0018155 A1 1/2007 Bae et al.
2007/0034863 A1 2/2007 Fortte et al.
2007/0087321 A1 4/2007 Pribenszky et al.
2007/0103060 A1 5/2007 Itoh et al.
2007/0104977 A1 5/2007 Arakane et al.
2007/0104979 A1 5/2007 Kim et al.
2007/0104980 A1 5/2007 Kim et al.
2007/0111026 A1 5/2007 Deaton et al.
2007/0138437 A1 6/2007 Haga et al.

(56) References Cited

U.S. PATENT DOCUMENTS

2007/0145888 A1 6/2007 Yabonouchi et al.
2007/0160905 A1 7/2007 Morishita et al.
2007/0181874 A1 8/2007 Prakash et al.
2007/0190359 A1 8/2007 Knowles et al.
2007/0224450 A1 9/2007 Kim et al.
2007/0231600 A1 10/2007 Kamatani et al.
2007/0252140 A1 11/2007 Limmert et al.
2007/0278936 A1 12/2007 Herron et al.
2007/0278938 A1 12/2007 Yabunouchi et al.
2008/0005851 A1 1/2008 Perez-Prat Vinuesa et al.
2008/0014464 A1 1/2008 Kawamura et al.
2008/0018237 A1 1/2008 Yamamoto et al.
2008/0020237 A1 1/2008 Ren et al.
2008/0091025 A1 4/2008 Morishita et al.
2008/0106190 A1 5/2008 Yabunouchi et al.
2008/0107919 A1 5/2008 Hwang et al.
2008/0124572 A1 5/2008 Mizuki et al.
2008/0145707 A1 6/2008 Yabunouchi et al.
2008/0161567 A1 7/2008 Stoessel et al.
2008/0210930 A1 9/2008 Kamatani et al.
2008/0220265 A1 9/2008 Xia et al.
2008/0233410 A1 9/2008 Mashima et al.
2008/0233434 A1 9/2008 Kawamura et al.
2008/0261076 A1 10/2008 Kwong et al.
2008/0297033 A1 12/2008 Knowles et al.
2008/0303417 A1 12/2008 Yabunouchi et al.
2009/0017330 A1 1/2009 Toshihiro et al.
2009/0030202 A1 1/2009 Toshihiro et al.
2009/0039776 A1 2/2009 Yamada et al.
2009/0066235 A1 3/2009 Yabunouchi et al.
2009/0085476 A1 4/2009 Park et al.
2009/0091253 A1 4/2009 Yasukawa et al.
2009/0101870 A1 4/2009 Prakash et al.
2009/0104472 A1 4/2009 Je et al.
2009/0108737 A1 4/2009 Kwong et al.
2009/0115316 A1 5/2009 Zheng et al.
2009/0115320 A1 5/2009 Kawamura et al.
2009/0115322 A1 5/2009 Walters et al.
2009/0140637 A1 6/2009 Hosokawa et al.
2009/0167161 A1 7/2009 Yabunouchi et al.
2009/0167162 A1 7/2009 Chun et al.
2009/0167167 A1 7/2009 Aoyama et al.
2009/0179554 A1 7/2009 Kuma et al.
2009/0179555 A1 7/2009 Kim et al.
2009/0218940 A1 9/2009 Okajima et al.
2009/0302743 A1 12/2009 Kato et al.
2009/0309488 A1 12/2009 Kato et al.
2010/0012931 A1 1/2010 Kato et al.
2010/0084966 A1 4/2010 Shinya et al.
2010/0090591 A1 4/2010 Alleyne et al.
2010/0102716 A1 4/2010 Kim et al.
2010/0105902 A1 4/2010 Inoue et al.
2010/0108990 A1 5/2010 Hosokawa et al.
2010/0148663 A1 6/2010 Tsai et al.
2010/0187984 A1 7/2010 Chun et al.
2010/0219397 A1 9/2010 Watanabe et al.
2010/0244004 A1 9/2010 Xia et al.
2010/0270916 A1 10/2010 Xia et al.
2010/0288362 A1 11/2010 Hatwar et al.
2010/0295032 A1 11/2010 Kwong et al.
2011/0007385 A1 1/2011 Yamanashi et al.
2011/0037057 A1 2/2011 LeCloux et al.
2011/0057559 A1 3/2011 Xia et al.
2011/0108822 A1 5/2011 Parham et al.
2011/0156017 A1 6/2011 Lee et al.
2011/0163302 A1 7/2011 Lin et al.
2011/0204333 A1 8/2011 Xia et al.
2011/0210320 A1 9/2011 Shin et al.
2011/0215710 A1 9/2011 Xia et al.
2011/0227049 A1 9/2011 Xia et al.
2011/0240968 A1 10/2011 Kim et al.
2011/0278551 A1 11/2011 Yabunouchi et al.
2011/0285275 A1 11/2011 Huang et al.
2012/0075273 A1 3/2012 Shigemoto et al.
2012/0126221 A1 5/2012 Tetsu et al.
2012/0146012 A1 6/2012 Limmert et al.
2012/0193612 A1 8/2012 Chun et al.
2012/0205642 A1 8/2012 Yokoyama et al.
2012/0205645 A1 8/2012 Fuchs et al.
2012/0214993 A1 8/2012 Aihara et al.
2012/0292601 A1 11/2012 Kottas et al.
2012/0319091 A1 12/2012 Tomoki et al.
2013/0009543 A1 1/2013 Hiroshi et al.
2013/0033172 A1 2/2013 Huang et al.
2013/0105787 A1 5/2013 Daisaku et al.
2013/0146848 A1 6/2013 Ma et al.
2013/0165653 A1 6/2013 Inoue et al.
2013/0175519 A1 7/2013 Naoki et al.
2013/0181190 A1 7/2013 Ma et al.
2013/0241401 A1 9/2013 Kwong et al.
2013/0248830 A1 9/2013 Welsh et al.
2013/0334521 A1 12/2013 Lee et al.
2014/0001446 A1 1/2014 Mizuki et al.
2014/0014925 A1 1/2014 Jung et al.
2014/0014927 A1 1/2014 Kim et al.
2014/0034914 A1 2/2014 Takada et al.
2014/0103305 A1 4/2014 Ma et al.
2014/0117329 A1 5/2014 Lee et al.
2014/0183503 A1 7/2014 Hiroshi et al.
2014/0183517 A1 7/2014 Huh et al.
2014/0191225 A1 7/2014 Inoue et al.
2014/0225088 A1 8/2014 Hwang et al.
2014/0246656 A1 9/2014 Inoue et al.
2014/0284580 A1 9/2014 Balaganesan et al.
2015/0060804 A1 3/2015 Kanitz et al.
2015/0123047 A1 5/2015 Maltenberger et al.
2015/0171348 A1 6/2015 Stoessel et al.
2015/0221874 A1 8/2015 Kim et al.
2015/0228899 A1 8/2015 Tomoki et al.
2015/0263294 A1 9/2015 Kim et al.
2015/0280136 A1 10/2015 Ryu et al.
2016/0163995 A1 6/2016 Kang et al.
2016/0351811 A1* 12/2016 Lam .................... C09K 11/06
2017/0263869 A1 9/2017 Tada et al.
2018/0240987 A1* 8/2018 Ji .................... H10K 85/342
2018/0375035 A1* 12/2018 Ji .................... C07F 15/0033
2019/0081248 A1 3/2019 Lin et al.
2020/0227644 A1* 7/2020 Lee .................... H10K 85/636
2021/0217970 A1* 7/2021 Yeager .................... C07D 221/18
2022/0106343 A1* 4/2022 Shih .................... H10K 85/633
2022/0298190 A1* 9/2022 Shih .................... H10K 85/6574
2022/0302395 A1* 9/2022 Dyatkin .................... H10K 85/6576
2022/0363702 A1* 11/2022 Fleetham .................... C07F 15/0086
2023/0121594 A1* 4/2023 Szigethy .................... C09K 11/02 257/40
2024/0122056 A1* 4/2024 Ji .................... C09K 11/025
2024/0172552 A1 5/2024 Hong et al.
2024/0247017 A1* 7/2024 Ji .................... H10K 85/6576
2024/0276864 A1* 8/2024 Ji .................... H10K 85/654
2024/0306487 A1 9/2024 Kim et al.
2025/0081838 A1* 3/2025 Fleetham .................... H10K 85/346
2025/0318357 A1* 10/2025 Tsai .................... C07F 15/0086
2025/0324904 A1* 10/2025 Wozniak .................... C07F 15/0033
2025/0366362 A1* 11/2025 Tsai .................... H10K 85/342
2025/0374819 A1* 12/2025 Ryno .................... C07F 15/0033
2026/0082804 A1* 3/2026 Wozniak .................... H10K 85/342

FOREIGN PATENT DOCUMENTS

CN 103508940 A 1/2014
CN 103694277 A 4/2014
CN 117843689 A 4/2024
DE 102012005215 B3 4/2013
EP 0650955 A1 5/1995
EP 1238981 A2 9/2002
EP 1239526 A2 9/2002
EP 1244155 A2 9/2002
EP 01602648 A1 12/2005
EP 1617493 A2 1/2006
EP 1624500 A1 2/2006
EP 1642951 A2 4/2006
EP 1647554 A2 4/2006
EP 1698613 A1 9/2006
EP 1725079 A1 11/2006

(56) References Cited

FOREIGN PATENT DOCUMENTS

| | | | |
|---|---|---|---|
| EP | 01734038 | A1 | 12/2006 |
| EP | 1806334 | A1 | 7/2007 |
| EP | 1841834 | A1 | 10/2007 |
| EP | 1930964 | A1 | 6/2008 |
| EP | 01956007 | A1 | 8/2008 |
| EP | 1961743 | A | 8/2008 |
| EP | 1968131 | A1 | 9/2008 |
| EP | 1972613 | A1 | 9/2008 |
| EP | 1997799 | A1 | 12/2008 |
| EP | 2011790 | A1 | 1/2009 |
| EP | 2020694 | A1 | 2/2009 |
| EP | 2034538 | A1 | 3/2009 |
| EP | 2055700 | A1 | 5/2009 |
| EP | 2055701 | A1 | 5/2009 |
| EP | 2062907 | A2 | 5/2009 |
| EP | 2085382 | A1 | 8/2009 |
| EP | 2660300 | A2 | 11/2013 |
| EP | 2684932 | A1 | 1/2014 |
| EP | 2730583 | A1 | 5/2014 |
| EP | 2757608 | A1 | 7/2014 |
| JP | 2004022334 | A | 1/2004 |
| JP | 2005112765 | A | 4/2005 |
| JP | 2005149918 | A | 6/2005 |
| JP | 2005268199 | A | 9/2005 |
| JP | 2007073529 | A | 3/2007 |
| JP | 2007091719 | A | 4/2007 |
| JP | 2007254297 | A | 10/2007 |
| JP | 2008021687 | A | 1/2008 |
| JP | 4478555 | B2 | 3/2010 |
| JP | 2012074444 | A | 4/2012 |
| JP | 2013110263 | A | 6/2013 |
| JP | 2014009196 | A | 1/2014 |
| KR | 0117693 | Y1 | 4/1998 |
| KR | 20100079458 | A | 7/2010 |
| KR | 20110077173 | A | 7/2011 |
| KR | 20110088898 | A | 8/2011 |
| KR | 20120032054 | A | 4/2012 |
| KR | 20120088644 | A | 8/2012 |
| KR | 20120129733 | A | 11/2012 |
| KR | 20130043460 | A | 4/2013 |
| KR | 20130077473 | A | 7/2013 |
| KR | 20130108183 | A | 10/2013 |
| KR | 20130115564 | A | 10/2013 |
| TW | 201139402 | A | 1/2011 |
| TW | 201329200 | A1 | 7/2013 |
| TW | 201332980 | A | 8/2013 |
| WO | 2001039234 | A2 | 5/2001 |
| WO | 2002015645 | A1 | 2/2002 |
| WO | 2003040257 | A1 | 5/2003 |
| WO | 2003060956 | A1 | 7/2003 |
| WO | 2004093207 | A2 | 10/2004 |
| WO | 2005014551 | A1 | 2/2005 |
| WO | 2005019373 | A2 | 3/2005 |
| WO | 2005075451 | A1 | 8/2005 |
| WO | 2005089025 | A1 | 9/2005 |
| WO | 2006056418 | A2 | 6/2006 |
| WO | 2006072002 | A2 | 7/2006 |
| WO | 2006081780 | A1 | 8/2006 |
| WO | 2006081973 | A1 | 8/2006 |
| WO | 2006095951 | A1 | 9/2006 |
| WO | 2006114966 | A1 | 11/2006 |
| WO | 2006121811 | A1 | 11/2006 |
| WO | 2007018067 | A1 | 2/2007 |
| WO | 2007063754 | A1 | 6/2007 |
| WO | 2007108362 | A1 | 9/2007 |
| WO | 2007111263 | A1 | 10/2007 |
| WO | 2007115970 | A1 | 10/2007 |
| WO | 2007115981 | A1 | 10/2007 |
| WO | 2007125714 | A1 | 11/2007 |
| WO | 2008023550 | A1 | 2/2008 |
| WO | 2008023759 | A1 | 2/2008 |
| WO | 2008035571 | A1 | 3/2008 |
| WO | 2008054584 | A1 | 5/2008 |
| WO | 2008056746 | A1 | 5/2008 |
| WO | 2008057394 | A1 | 5/2008 |
| WO | 2008078800 | A1 | 7/2008 |
| WO | 2008096609 | A1 | 8/2008 |
| WO | 2008101842 | A | 8/2008 |
| WO | 2009000673 | A2 | 12/2008 |
| WO | 2009003455 | A1 | 1/2009 |
| WO | 2009003898 | A1 | 1/2009 |
| WO | 2009008277 | A1 | 1/2009 |
| WO | 2009011327 | A1 | 1/2009 |
| WO | 2009021126 | A2 | 2/2009 |
| WO | 2009050281 | A1 | 4/2009 |
| WO | 2009063833 | A1 | 5/2009 |
| WO | 2009066778 | A1 | 5/2009 |
| WO | 2009066779 | A1 | 5/2009 |
| WO | 2009086028 | A2 | 7/2009 |
| WO | 2009100991 | A1 | 8/2009 |
| WO | 2009145016 | A1 | 12/2009 |
| WO | 2009148269 | A1 | 12/2009 |
| WO | 2010011390 | A2 | 1/2010 |
| WO | 2010028151 | A1 | 3/2010 |
| WO | 2010054731 | A1 | 5/2010 |
| WO | 2010056066 | A1 | 5/2010 |
| WO | 2010061824 | A1 | 6/2010 |
| WO | 2010067894 | A1 | 6/2010 |
| WO | 2010072300 | A1 | 7/2010 |
| WO | 2010086089 | A1 | 8/2010 |
| WO | 2010107244 | A2 | 9/2010 |
| WO | 2010118029 | A1 | 10/2010 |
| WO | 2011044988 | A1 | 4/2011 |
| WO | 2011051404 | A1 | 5/2011 |
| WO | 2011074770 | A1 | 6/2011 |
| WO | 2011074770 | A2 | 6/2011 |
| WO | 2011075644 | A2 | 6/2011 |
| WO | 2011081423 | A2 | 7/2011 |
| WO | 2011081431 | A2 | 7/2011 |
| WO | 2011086863 | A1 | 7/2011 |
| WO | 2011105373 | A1 | 9/2011 |
| WO | 2011107491 | A1 | 9/2011 |
| WO | 2012020327 | A1 | 2/2012 |
| WO | 2012128298 | A1 | 9/2012 |
| WO | 2012133644 | A1 | 10/2012 |
| WO | 2012133649 | A1 | 10/2012 |
| WO | 2012163471 | A1 | 12/2012 |
| WO | 2012177006 | A2 | 12/2012 |
| WO | 2013018530 | A1 | 2/2013 |
| WO | 2013024872 | A1 | 2/2013 |
| WO | 2013035275 | A1 | 3/2013 |
| WO | 2013039073 | A1 | 3/2013 |
| WO | 2013079217 | A1 | 6/2013 |
| WO | 2013081315 | A1 | 6/2013 |
| WO | 2013087142 | A1 | 6/2013 |
| WO | 2013094620 | A1 | 6/2013 |
| WO | 2013107487 | A1 | 7/2013 |
| WO | 2013118812 | A1 | 8/2013 |
| WO | 2013120577 | A1 | 8/2013 |
| WO | 2013145667 | A1 | 10/2013 |
| WO | 2013157367 | A1 | 10/2013 |
| WO | 2013174471 | A1 | 11/2013 |
| WO | 2013175747 | A1 | 11/2013 |
| WO | 2013180376 | A1 | 12/2013 |
| WO | 2013191404 | A1 | 12/2013 |
| WO | 2014002873 | A1 | 1/2014 |
| WO | 2014007565 | A1 | 1/2014 |
| WO | 2014008982 | A1 | 1/2014 |
| WO | 2014009310 | A1 | 1/2014 |
| WO | 2014015935 | A2 | 1/2014 |
| WO | 2014015937 | A1 | 1/2014 |
| WO | 2014023377 | A2 | 2/2014 |
| WO | 2014024131 | A1 | 2/2014 |
| WO | 2014030872 | A2 | 2/2014 |
| WO | 2014030921 | A1 | 2/2014 |
| WO | 2014031977 | A1 | 2/2014 |
| WO | 2014034791 | A1 | 3/2014 |
| WO | 2014038456 | A1 | 3/2014 |
| WO | 2014104499 | A1 | 7/2014 |
| WO | 2014104514 | A1 | 7/2014 |
| WO | 2014104535 | A1 | 7/2014 |
| WO | 2014112450 | A1 | 7/2014 |

(56) References Cited

FOREIGN PATENT DOCUMENTS

| | | | |
|---|---|---|---|
| WO | 2014142472 | A1 | 9/2014 |
| WO | 2014157018 | A1 | 10/2014 |

OTHER PUBLICATIONS

Baldo et al., "Highly Efficient Phosphorescent Emission from Organic Electroluminescent Devices," Nature, vol. 395, 151-154, 1998.
Baldo et al., "Very high-efficiency green organic light-emitting devices based on electrophosphorescence," Appl. Phys. Lett., vol. 75, No. 3, 4-6 (1999).
Atzrodt et al., Angew. Chem. Int. Ed. (Reviews) 2007, 46, 7744-65.
Fink, R.; Heischkel, Y.; Thelakkat, M.; Schmidt, H.-W. Chem. Mater. 1998, 10, 3620-3625.
Pommerehne, J.; Vestweber, H.; Guss, W.; Mahrt, R. F.; Bassler, H.; Porsch, M.; Daub, J. Adv. Mater. 1995, 7, 551.
Hong et al., Chem. Mater. 2016, 28, 5791-98, 5792-93.
Tavasli et al., J. Mater. Chem. 2012, 22, 6419-29, 6422.
Morello, G.R., J. Mol. Model. 2017, 23:174.

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 63/487,321, filed on Feb. 28, 2023, and 63/499,868, filed on May 3, 2023, the entire contents of both applications are incorporated herein by reference.

FIELD

The present disclosure generally relates to organic or metal coordination compounds and formulations and their various uses including as emitters, sensitizers, charge transporters, or exciton transporters in devices such as organic light emitting diodes and related electronic devices and consumer products.

BACKGROUND

Opto-electronic devices that make use of organic materials are becoming increasingly desirable for various reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, organic scintillators, and organic photodetectors. For OLEDs, the organic materials may have performance advantages over conventional materials.

OLEDs make use of thin organic films that emit light when voltage is applied across the device. OLEDs are becoming an increasingly interesting technology for use in applications such as displays, illumination, and backlighting.

One application for emissive molecules is a full color display. Industry standards for such a display call for pixels adapted to emit particular colors, referred to as “saturated” colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single emissive layer (EML) device or a stack structure. Color may be measured using CIE coordinates, which are well known to the art.

SUMMARY

In one aspect, the present disclosure provides a compound comprising a first ligand $L_A$;

wherein $L_A$ comprises a structure R of Formula I:

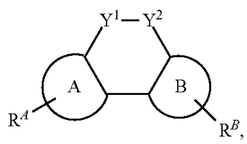

wherein moieties A and B are each independently a monocyclic ring or a polycyclic fused ring structure, wherein the monocyclic ring or each ring of the polycyclic fused ring structure is independently a 5-membered to 10-membered carbocyclic or heterocyclic ring;

wherein $Y^1$ and $Y^2$ are each independently selected from the group consisting of O, S, Se, NR, BR, BRR', PR, CR, C═O, C═NR, C═CRR', C═S, CRR', SO, $SO_2$, P(O)R, SiRR', and GeRR';

wherein each of $R^A$ and $R^B$ independently represents mono to the maximum allowable substitution, or no substitution;

wherein $L_A$ is coordinated to a metal M;

wherein moiety A and moiety B are not both joined to M by direct bonds;

wherein M is selected from the group consisting of Ir, Rh, Re, Ru, Os, Pt, Pd, Ag, Au, and Cu;

wherein M may be coordinated to other ligands;

wherein $L_A$ may be joined with other ligands to comprise a tridentate, tetradentate, pentadentate, or hexadentate ligand;

wherein any two substituents may be joined or fused to form a ring;

with the proviso that if moiety A is a pyridine ring joined to Ir by an Ir—N bond, then $Y^1$ is not $CF_2$ and $Y^2$ is not CRR'; and with the proviso that if moiety A is a benzene ring joined to Ir by a direct bond, then $Y^1$ is not O and $Y^2$ is not CRR';

wherein each R, R', $R^A$ and $R^B$ is independently hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof.

In another aspect, the present disclosure provides a formulation of the compound as described herein.

In yet another aspect, the present disclosure provides an OLED having an organic layer comprising the compound as described herein.

In yet another aspect, the present disclosure provides a consumer product comprising an OLED with an organic layer comprising the compound as described herein.

DETAILED DESCRIPTION

A. Terminology

Figure 1:
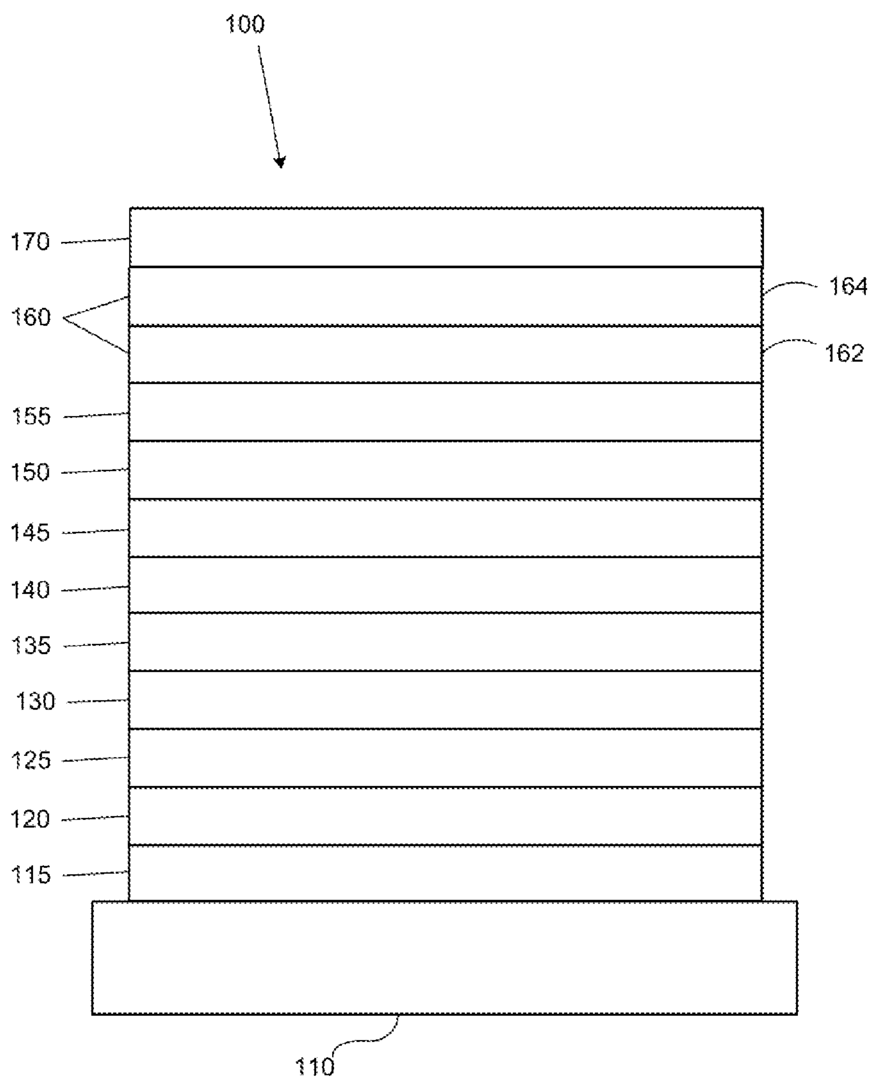
FIG. 1 shows an organic light emitting device.

Unless otherwise specified, the below terms used herein are defined as follows:

As used herein, “top” means furthest away from the substrate, while “bottom” means closest to the substrate. Where a first layer is described as “disposed over” a second layer, the first layer is disposed further away from substrate. There may be other layers between the first and second layer, unless it is specified that the first layer is “in contact with” the second layer. For example, a cathode may be described as “disposed over” an anode, even though there are various organic layers in between.

As used herein, "solution processable" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "NIR", "red", "green", "blue", "yellow" layer, material, region, or device refers to a layer, a material, a region, or a device that emits light in the wavelength range of about 700-1500 nm, 580-700 nm, 500-600 nm, 400-500 nm, 540-600 nm, respectively, or a layer, a material, a region, or a device that has a highest peak in its emission spectrum in the respective wavelength region. In some arrangements, separate regions, layers, materials, or devices may provide separate "deep blue" and "light blue" emissions. As used herein, the "deep blue" emission component refers to an emission having a peak emission wavelength that is at least about 4 nm less than the peak emission wavelength of the "light blue" emission component. Typically, a "light blue" emission component has a peak emission wavelength in the range of about 465-500 nm, and a "deep blue" emission component has a peak emission wavelength in the range of about 400-470 nm, though these ranges may vary for some configurations.

In some arrangements, a color altering layer that converts, modifies, or shifts the color of the light emitted by another layer to an emission having a different wavelength is provided. Such a color altering layer can be formulated to shift wavelength of the light emitted by the other layer by a defined amount, as measured by the difference in the wavelength of the emitted light and the wavelength of the resulting light. In general, there are two classes of color altering layers: color filters that modify a spectrum by removing light of unwanted wavelengths, and color changing layers that convert photons of higher energy to lower energy. For example, a "red" color filter can be present in order to filter an input light to remove light having a wavelength outside the range of about 580-700 nm. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material, region, or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; Interior: [0.2268, 0.3321 |
| Central Blue | Locus: [0.1746, 0.0052]; [0.0326, 0.3530]; Interior: [0.2268, 0.3321] |
| Central Yellow | Locus: [0.3731, 0.6245]; [0.6270, 0.3725]; Interior: [0.3700, 0.4087]; [0.2886, 0.4572] |

The terms "halo," "halogen," and "halide" are used interchangeably and refer to fluorine, chlorine, bromine, and iodine.

The term "acyl" refers to a substituted carbonyl group (—C(O)—$R_s$).

The term "ester" refers to a substituted oxycarbonyl (—O—C(O)—$R_s$ or —C(O)—O—$R_s$) group.

The term "ether" refers to an —OR, group.

The terms "sulfanyl" or "thio-ether" are used interchangeably and refer to a —$SR_s$ group.

The term "selenyl" refers to a —$SeR_s$ group.

The term "sulfinyl" refers to a —S(O)—$R_s$ group.

The term "sulfonyl" refers to a —$SO_2$—$R_s$ group.

The term "phosphino" refers to a group containing at least one phosphorus atom bonded to the relevant structure. Common examples of phosphino groups include, but are not limited to, groups such as a —$P(R_s)_2$ group or a —$PO(R_s)_2$ group, wherein each $R_s$ can be same or different.

The term "silyl" refers to a group containing at least one silicon atom bonded to the relevant structure. Common examples of silyl groups include, but are not limited to, groups such as a —$Si(R_s)_3$ group, wherein each $R_s$ can be same or different.

The term "germyl" refers to a group containing at least one germanium atom bonded to the relevant structure. Common examples of germyl groups include, but are not limited to, groups such as a —$Ge(R_s)_3$ group, wherein each $R_a$ can be same or different.

The term "boryl" refers to a group containing at least one boron atom bonded to the relevant structure. Common examples of boryl groups include, but are not limited to, groups such as a —$B(R_s)_2$ group or its Lewis adduct —$B(R_s)_3$ group, wherein $R_s$ can be same or different.

In each of the above, $R_s$ can be hydrogen or a substituent selected from the group consisting of the general substituents as defined in this application. Preferred $R_s$ is selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. More preferably $R_s$ is selected from the group consisting of alkyl, cycloalkyl, aryl, heteroaryl, and combination thereof.

The term "alkyl" refers to and includes both straight and branched chain alkyl groups having an alkyl carbon atom bonded to the relevant structure. Preferred alkyl groups are those containing from one to fifteen carbon atoms, preferably one to nine carbon atoms, and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group can be further substituted.

The term "cycloalkyl" refers to and includes monocyclic, polycyclic, and spiro alkyl groups having a ring alkyl carbon atom bonded to the relevant structure. Preferred cycloalkyl groups are those containing 3 to 12 ring carbon atoms and includes cyclopropyl, cyclopentyl, cyclohexyl, bicyclo [3.1.1]heptyl, spiro[4.5]decyl, spiro[5.5]undecyl, adamantyl, and the like. Additionally, the cycloalkyl group can be further substituted.

The terms "heteroalkyl" or "heterocycloalkyl" refer to an alkyl or a cycloalkyl group, respectively, having at least one carbon atom replaced by a heteroatom. Optionally the at least one heteroatom is selected from O, S, N, P, B, Si, Ge and Se, preferably, O, S or N. Additionally, the heteroalkyl or heterocycloalkyl group can be further substituted.

The term "alkenyl" refers to and includes both straight and branched chain alkene groups. Alkenyl groups are essentially alkyl groups that include at least one carbon-carbon double bond in the alkyl chain with one carbon atom from the carbon-carbon double bond that is bonded to the relevant structure. Cycloalkenyl groups are essentially cycloalkyl groups that include at least one carbon-carbon double bond in the cycloalkyl ring. The term "heteroalkenyl" as used herein refers to an alkenyl group having at least one carbon atom replaced by a heteroatom. Optionally the at least one heteroatom is selected from O, S, N, P, B, Si, Ge, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group can be further substituted.

The term "alkynyl" refers to and includes both straight and branched chain alkyne groups. Alkynyl groups are essentially alkyl groups that include at least one carbon-carbon triple bond in the alkyl chain with one carbon atom from the carbon-carbon triple bond that is bonded to the relevant structure. Preferred alkynyl groups are those containing two to fifteen carbon atoms. Additionally, the alkynyl group can be further substituted.

The terms "aralkyl" or "arylalkyl" are used interchangeably and refer to an aryl-substituted alkyl group having an alkyl carbon atom bonded to the relevant structure. Additionally, the aralkyl group can be further substituted.

The term "heterocyclic group" refers to and includes aromatic and non-aromatic cyclic groups containing at least one heteroatom. Optionally the at least one heteroatom is selected from O, S, Se, N, P, B, Si, Ge, and Se, preferably, O, S, N, or B. Hetero-aromatic cyclic groups may be used interchangeably with heteroaryl. Preferred hetero-non-aromatic cyclic groups are those containing 3 to 10 ring atoms, preferably those containing 3 to 7 ring atoms, which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group can be further substituted or fused.

The term "aryl" refers to and includes both single-ring and polycyclic aromatic hydrocarbyl groups. The polycyclic rings may have two or more rings in which two carbons are common to two adjoining rings (the rings are "fused"). Preferred aryl groups are those containing six to thirty carbon atoms, preferably six to twenty-four carbon atoms, six to eighteen carbon atoms, and more preferably six to twelve carbon atoms. Especially preferred is an aryl group having six carbons, ten carbons, twelve carbons, fourteen carbons, or eighteen carbons. Suitable aryl groups include phenyl, biphenyl, triphenyl, triphenylene, tetraphenylene, naphthalene, anthracene, phenalene, phenanthrene, pyrene, chrysene, perylene, and azulene, preferably phenyl, biphenyl, triphenyl, triphenylene, and naphthalene. Additionally, the aryl group can be further substituted or fused, such as, without limitation, fluorene.

The term "heteroaryl" refers to and includes both single-ring aromatic groups and polycyclic aromatic ring systems that include at least one heteroatom. The heteroatoms include, but are not limited to O, S, Se, N, P, B, Si, Ge, and Se. In many instances, O, S, N, or B are the preferred heteroatoms. Hetero-single ring aromatic systems are preferably single rings with 5 or 6 ring atoms, and the ring can have from one to six heteroatoms. The hetero-polycyclic ring systems can have two or more aromatic rings in which two atoms are common to two adjoining rings (the rings are "fused") wherein at least one of the rings is a heteroaryl. The hetero-polycyclic aromatic ring systems can have from one to six heteroatoms per ring of the polycyclic aromatic ring system. Preferred heteroaryl groups are those containing three to thirty carbon atoms, preferably three to twenty-four carbon atoms, three to eighteen carbon atoms, and more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, selenophenodipyridine, azaborine, borazine, 5$\lambda^2$, 9$\lambda^2$-diaza-13b-boranaphtho[2,3,4-de]anthracene, 5$\lambda^2$-benzo[d]benzo[4,5]imidazo[3,2-a]imidazole, and 5,9-dioxa-13b-boranaphtho[3,2,1-de]anthracene; preferably dibenzothiophene, dibenzofuran, dibenzoselenophene, carbazole, indolocarbazole, imidazole, pyridine, triazine, benzimidazole, 5$\lambda^2$, 9$\lambda^2$-diaza-13b-boranaphtho[2,3,4-de]anthracene, 5$\lambda^2$-benzo[d]benzo[4,5]imidazo[3,2-$\alpha$]imidazole, and 5,9-dioxa-13b-boranaphtho[3,2,1-de]anthracene. Additionally, the heteroaryl group can be further substituted or fused.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, benzimidazole, 5$\lambda^2$, 9$\lambda^2$-diaza-13b-boranaphtho[2,3,4-de]anthracene, 5$\lambda^2$-benzo[d]benzo[4,5]imidazo[3,2-$\alpha$]imidazole, 5,9-dioxa-13b-boranaphtho[3,2,1-de]anthracene, and the respective aza-analogs of each thereof are of particular interest.

In many instances, the General Substituents are selected from the group consisting of deuterium, halogen, alkyl, cycloalkyl, heteroalkyl, heterocycloalkyl, arylalkyl, alkoxy, aryloxy, amino, silyl, germyl, boryl, alkenyl, cycloalkenyl, heteroalkenyl, alkynyl, aryl, heteroaryl, acyl, carboxylic acid, ether, ester, nitrile, isonitrile, sulfanyl, selenyl, sulfinyl, sulfonyl, phosphino, and combinations thereof.

In some instances, the Preferred General Substituents are selected from the group consisting of deuterium, fluorine, alkyl, cycloalkyl, heteroalkyl, alkoxy, aryloxy, amino, silyl, germyl, boryl, alkenyl, cycloalkenyl, heteroalkenyl, aryl, heteroaryl, nitrile, isonitrile, sulfanyl, and combinations thereof.

In some instances, the More Preferred General Substituents are selected from the group consisting of deuterium, fluorine, alkyl, cycloalkyl, alkoxy, aryloxy, amino, silyl, germyl, boryl, aryl, heteroaryl, nitrile, sulfanyl, and combinations thereof.

In some instances, the Even More Preferred General Substituents are selected from the group consisting of deuterium, fluorine, alkyl, cycloalkyl, silyl, aryl, heteroaryl, nitrile, and combinations thereof.

In yet other instances, the Most Preferred General Substituents are selected from the group consisting of deuterium, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents zero or no substitution, $R^1$, for example, can be a hydrogen for all available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

As used herein, any specifically listed substituent, such as, without limitation, methyl, phenyl, pyridyl, etc. includes undeuterated, partially deuterated, and fully deuterated versions thereof. Similarly, classes of substituents such as, without limitation, alkyl, aryl, cycloalkyl, heteroaryl, etc. also include undeuterated, partially deuterated, and fully deuterated versions thereof. Unless otherwise specified, atoms in chemical structures without valences fully filled by H or D should be considered to include undeuterated, partially deuterated, and fully deuterated versions thereof. For example, the chemical structure of

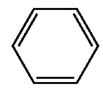

implies to include $C_6H_6$, $C_6D_6$, $C_6H_3D_3$, and any other partially deuterated variants thereof. Some common basic partially or fully deuterated group include, without limitation, $CD_3$, $CD_2C(CH_3)_3$, $C(CD_3)_3$, and $C_6D_5$.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instances, a pair of substituents in the molecule can be optionally joined or fused into a ring. The preferred ring is a five to nine-membered carbocyclic or heterocyclic ring, includes both instances where the portion of the ring formed by the pair of substituents is saturated and where the portion of the ring formed by the pair of substituents is unsaturated. In yet other instances, a pair of adjacent substituents can be optionally joined or fused into a ring. As used herein, "adjacent" means that the two substituents involved can be on the same ring next to each other, or on two neighboring rings having the two closest available substitutable positions, such as 2,2' positions in a biphenyl, or 1,8 position in a naphthalene.

B. The Compounds of the Present Disclosure

In one aspect, the present disclosure provides a compound comprising a first ligand $L_A$;

wherein $L_A$ comprises a structure R of Formula I:

Formula I

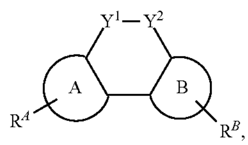

wherein moieties A and B are each independently a monocyclic ring or a polycyclic fused ring structure, wherein the monocyclic ring or each ring of the polycyclic fused ring structure is independently a 5-membered to 10-membered carbocyclic or heterocyclic ring;

wherein $Y^1$ and $Y^2$ are each independently selected from the group consisting of O, S, Se, NR, BR, BRR', PR, CR, C═O, C═NR, C═CRR', C═S, CRR', SO, $SO_2$, P(O)R, SiRR', and GeRR';

wherein each of $R^A$ and $R^B$ independently represents mono to the maximum allowable substitution, or no substitution;

wherein $L_A$ is coordinated to a metal M;

wherein moiety A and moiety B are not both joined to M by direct bonds;

wherein M is selected from the group consisting of Ir, Rh, Re, Ru, Os, Pt, Pd, Ag, Au, and Cu;

wherein M may be coordinated to other ligands;

wherein $L_A$ may be joined with other ligands to comprise a tridentate, tetradentate, pentadentate, or hexadentate ligand;

wherein any two substituents may be joined or fused to form a ring; and wherein each R, R', $R^A$ and $R^B$ is independently hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof.

In some embodiments, if moiety A is a pyridine ring joined to Ir by an Ir—N bond, then $Y^1$ is not $CF_2$ and $Y^2$ is not CRR'.

In some embodiments, if moiety A is a benzene ring joined to Ir by a direct bond, then $Y^1$ is not 0 and $Y^2$ is not CRR'.

In some embodiments, the first ligand $L_A$ has Formula II:

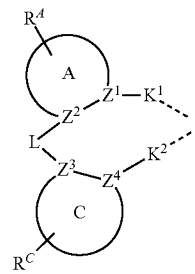

wherein moiety C is a monocyclic ring comprising one 5-membered to 10-membered carbocyclic or heterocyclic ring, or a polycyclic fused ring structure comprising at least two 5-membered to 10-membered carbocyclic or heterocyclic rings;

wherein $Z^1$-$Z^4$ are each independently C or N;

wherein $K^1$ and $K^2$ are each independently selected from the group consisting of a direct bond, O, S, $N(R^\alpha)$, $P(R^\alpha)$, $B(R^\alpha)$, $C(R^\alpha)(R^\beta)$, and $Si(R^\alpha)(R^\beta)$;

wherein $R^C$ represents mono to the maximum allowable substitution, or no substitution;

wherein L is a direct bond or an organic linker;

wherein each $R^\alpha$, $R^\beta$, and $R^C$ is independently hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof;

wherein two $R^A$ substituents are joined to form a structure of Formula III fused to ring A:

Formula III

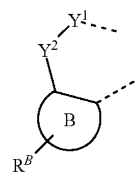

wherein moieties A and B, $R^A$, $R^B$, $Y^1$, and $Y^2$ are as defined above.

In some embodiments, each R, R', $R^\alpha$, $R^\beta$, $R^A$, $R^B$, and $R^C$ is independently a hydrogen or a substituent selected from the group consisting of deuterium, fluorine, alkyl, cycloalkyl, heteroalkyl, alkoxy, aryloxy, amino, silyl, boryl, germyl, alkenyl, cycloalkenyl, heteroalkenyl, aryl, heteroaryl, nitrile, isonitrile, sulfanyl, and combinations thereof.

In some embodiments, moieties A, moiety B, and moiety C are each independently a monocyclic ring comprising one 5-membered and/or 6-membered carbocyclic or heterocyclic ring, or a fused polycyclic ring system comprising at least two fused 5-membered and/or 6-membered carbocyclic or heterocyclic rings.

In some embodiments, one of moieties A and B is coordinated to the metal. In some embodiments, neither moiety A nor B is coordinated to the metal.

In some embodiments, L is a direct bond. In some embodiments, L is an organic linker selected from the group consisting of BR, BRR', NR, PR, P(O)R, O, S, Se, C═O, C═S, C═Se, C═NR, C═CRR', S═O, $SO_2$, CR, CRR', SiRR", and GeRR".

In some embodiments, moiety A is an aromatic ring.

In some embodiments, moiety A is a 6-membered aromatic ring.

In some embodiments, moiety A is a 6-membered heterocyclic aromatic ring.

In some embodiments, moiety A is a 6-membered carbocyclic aromatic ring.

In some embodiments, moiety A is joined to M by a direct bond.

In some embodiments, moieties A and B are both aromatic rings.

In some embodiments, moieties A and B are both 6-membered aromatic rings.

In some embodiments, one of moieties A and B is a 5-membered ring.

In some embodiments, one of moieties A and B is a 5-membered aromatic ring.

In some embodiments, moieties A and B are both 6-membered aromatic rings and one of the-membered aromatic rings is heterocyclic and one of the 6-membered aromatic rings is carbocyclic.

In some embodiments, moieties A and B are both 6-membered carbocyclic aromatic rings.

In some embodiments, moiety C is a 6-membered ring.

In some embodiments, moiety C is a 6-membered aromatic ring.

In some embodiments, moiety C is a 6-membered carbocyclic aromatic ring.

In some embodiments, at least one of moieties A, B and C is a 5-membered ring.

In some embodiments, two $R^A$ are fused to form a ring.

In some embodiments, two $R^A$ are fused to form a 5-membered or 6-membered ring.

In some embodiments, two $R^B$ are fused to form a ring.

In some embodiments, two $R^B$ are fused to form a 5-membered or 6-membered ring.

In some such embodiments, the 5-membered or 6-membered ring can be benzene, pyridine, pyrimidine, pyridazine, pyrazine, triazine, imidazole, imidazole derived carbene, pyrazole, pyrrole, oxazole, furan, thiophene, triazole, or thiazole.

In some embodiments, two $R^B$ are fused with moiety B to form a polycyclic fused ring structure. In some such embodiments, the polycyclic fused ring structure comprises at least three fused rings. In some such embodiments, the polycyclic fused ring structure has two 6-membered rings and one 5-membered ring. In some such embodiments, the polycyclic fused ring structure is selected from the group consisting of dibenzofuran, dibenzothiophene, dibenzoselenophene, and aza-variants thereof. In some such embodiments, the polycyclic fused ring structure can be further substituted at the ortho- or meta-position of the O, S, or Se atom if present by a substituent selected from the group consisting of deuterium, fluorine, nitrile, alkyl, cycloalkyl, aryl, heteroaryl, and combinations thereof. In some such embodiments, the aza-variants contain exactly one N atom at the 6-position (ortho to the O, S, or Se) with a substituent at the 7-position (meta to the O, S, or Se).

In some embodiments, the polycyclic fused ring structure comprises at least four fused rings. In some embodiments, the polycyclic fused ring structure comprises three 6-membered rings and one 5-membered ring. In some such embodiments, the 5-membered ring is fused to the ring coordinated to Ir, the second 6-membered ring is fused to the 5-membered ring, and the third 6-membered ring is fused to the second 6-membered ring. In some such embodiments, the third 6-membered ring is further substituted by a substituent selected from the group consisting of deuterium, fluorine, nitrile, alkyl, cycloalkyl, aryl, heteroaryl, and combinations thereof.

In some embodiments, the polycyclic fused ring structure comprises at least five fused rings. In some embodiments, the polycyclic fused ring structure comprises four 6-membered rings and one 5-membered ring or three 6-membered rings and two 5-membered rings. In some embodiments comprising two 5-membered rings, the 5-membered rings are fused together. In some embodiments comprising two 5-membered rings, the 5-membered rings are separated by at least one 6-membered ring. In some embodiments with one 5-membered ring, the 5-membered ring is fused to the ring coordinated to Ir, the second 6-membered ring is fused to the 5-membered ring, the third 6-membered ring is fused to the second 6-membered ring, and the fourth 6-membered ring is fused to the third 6-membered ring.

In some embodiments, each of moieties A, B, and C can be independently benzene, pyridine, pyrimidine, pyridazine, pyrazine, triazine, imidazole, imidazole derived carbene, pyrazole, pyrrole, oxazole, furan, thiophene, triazole, thiazole, naphthalene, quinoline, isoquinoline, quinazoline, benzofuran, benzoxazole, benzothiophene, benzothiazole, benzoselenophene, indene, indole, benzimidazole, benzimidazole derived carbene, carbazole, dibenzofuran, dibenzothiophene, quinoxaline, phthalazine, phenanthrene, phenanthridine, fluorene, or their aza variants.

In some embodiments, at least one of $Y^1$ and $Y^2$ is SiRR'.

In some embodiments, at least one of $Y^1$ and $Y^2$ is SiRR', wherein R and R' are alkyl.

In some embodiments, at least one of $Y^1$ and $Y^2$ is SiRR', wherein R and R' are methyl.

In some embodiments, at least one of $Y^1$ and $Y^2$ is GeRR'.

In some embodiments, at least one of $Y^1$ and $Y^2$ is GeRR', wherein R and R' are alkyl.

In some embodiments, at least one of $Y^1$ and $Y^2$ is GeRR', wherein R and R' are methyl.

In some embodiments, at least one of $Y^1$ and $Y^2$ is NR.

In some embodiments, at least one of $Y^1$ and $Y^2$ is NR, wherein R is alkyl.

In some embodiments, at least one of $Y^1$ and $Y^2$ is NR, wherein R is methyl.

In some embodiments, at least one of $Y^1$ and $Y^2$ is CRR'.

In some embodiments, at least one of $Y^1$ and $Y^2$ is CRR', wherein R and R' are alkyl.

In some embodiments, at least one of $Y^1$ and $Y^2$ is CRR', wherein R and R' are methyl.

In some embodiments, one of $Y^1$ and $Y^2$ is CRR', wherein R and R' are both F. In some embodiments, both of Y' and Y are CRR', wherein R and R' are both F.

In some embodiments, one of $Y^1$ and $Y^2$ is CRR', wherein R and R' are both D.

In some embodiments, one of $Y^1$ and $Y^2$ is $CF_2$, and the other is $CD_2$.

In some embodiments, at least one of Y' and $Y^2$ is CRR', wherein R and R' are both $CF_3$. In some embodiments, both of Y' and Y are CRR', wherein R and R' are both $CF_3$.

In some embodiments, one of $Y^1$ and $Y^2$ is CRR', wherein R and R' are both $CF_3$, and the other of $Y^1$ and $Y^2$ is CRR', wherein R and R' are both D.

In some embodiments, at least one of $Y^1$ and $Y^2$ is O.

In some embodiments, at least one of Y' and $Y^2$ is S.

In some embodiments, $Y^1$ and $Y^2$ are independently selected from the group consisting of O, S, NR, CRR', and SiRR'.

In some embodiments, one of $Y^1$ and $Y^2$ is SiRR', and one of $Y^1$ and $Y^2$ is selected from O, S, and NR.

In some embodiments, one of $Y^1$ and $Y^2$ is SiRR', and one of $Y^1$ and $Y^2$ is O.

In some embodiments, one of $K^1$ and $K^2$ is not a direct bond.

In some embodiments, one of $K^1$ and $K^2$ is O.

In some embodiments, both of $K^1$ and $K^2$ are a direct bond.

In some embodiments, at least one of $Z^1$-$Z^4$ is N.

In some embodiments, exactly one of $Z^1$-$Z^4$ is N.

In some embodiments, $Z^1$ or $Z^4$ is N.

In some embodiments, one of Z' and $Z^4$ is N, and one of $Z^1$ and $Z^4$ is C.

In some embodiments, $Z^2$ and $Z^3$ are C.

In some embodiments, two $R^C$ are joined to form a ring.

In some embodiments, two $R^C$ are joined to form a 6-membered ring.

In some embodiments, two $R^C$ are joined to form a 6-membered aromatic ring.

In some embodiments, the compound comprises at least one tert-butyl group.

In some embodiments, M is Ir.

In some embodiments, M is Pt.

In some embodiments, M is Pd.

In some embodiments of the compound, at least one of $R^A$, $R^B$, or $R^C$ is an electron-withdrawing group from LIST EWG 1 as defined herein. In some embodiments of the compound, at least one of $R^A$, $R^B$, or $R^C$ is an electron-withdrawing group from LIST EWG 2 as defined herein. In some embodiments of the compound, at least one of $R^A$, $R^B$, or $R^C$ is an electron-withdrawing group from LIST EWG 3 as defined herein. In some embodiments of the compound, at least one of $R^A$, $R^B$, or $R^C$ is an electron-withdrawing group from LIST EWG 4 as defined herein. In some embodiments of the compound, at least one of $R^A$, $R^B$, or $R^C$ is an electron-withdrawing group from LIST Pi-EWG as defined herein.

In some embodiments of the compound, one $R^A$ is an electron-withdrawing group from LIST EWG 1 as defined herein. In some embodiments of the compound, one of $R^A$ is an electron-withdrawing group from LIST EWG 2 as defined herein. In some embodiments of the compound, one of $R^A$ is an electron-withdrawing group from LIST EWG 3 as defined herein. In some embodiments of the compound, one of $R^A$ is an electron-withdrawing group from LIST EWG 4 as defined herein. In some embodiments of the compound, one of $R^A$ is an electron-withdrawing group from LIST Pi-EWG as defined herein.

In some embodiments of the compound, one $R^B$ is an electron-withdrawing group from LIST EWG 1 as defined herein. In some embodiments of the compound, one of $R^B$ is an electron-withdrawing group from LIST EWG 2 as defined herein. In some embodiments of the compound, one of $R^B$ is an electron-withdrawing group from LIST EWG 3 as defined herein. In some embodiments of the compound, one of $R^B$ is an electron-withdrawing group from LIST EWG 4 as defined herein. In some embodiments of the compound, one of $R^B$ is an electron-withdrawing group from LIST Pi-EWG as defined herein.

In some embodiments of the compound, one $R^C$ is an electron-withdrawing group from LIST EWG 1 as defined herein. In some embodiments of the compound, one of $R^C$ is an electron-withdrawing group from LIST EWG 2 as defined herein. In some embodiments of the compound, one of $R^C$ is an electron-withdrawing group from LIST EWG 3 as defined herein. In some embodiments of the compound, one of $R^C$ is an electron-withdrawing group from LIST EWG 4 as defined herein. In some embodiments of the compound, one of $R^C$ is an electron-withdrawing group from LIST Pi-EWG as defined herein.

In some embodiments of the compound, the ligand $L_A$ comprises an electron-withdrawing group from LIST EWG 1 as defined herein. In some embodiments of the compound, the ligand $L_A$ comprises an electron-withdrawing group from LIST EWG 2 as defined herein. In some embodiments of the compound, the ligand $L_A$ comprises an electron-withdrawing group from LIST EWG 3 as defined herein. In some embodiments of the compound, the ligand $L_A$ comprises an electron-withdrawing group from LIST EWG 4 as defined herein. In some embodiments of the compound, the ligand $L_A$ comprises an electron-withdrawing group from LIST Pi-EWG as defined herein.

In some embodiments of the compound, the compound comprises an electron-withdrawing group from LIST EWG 1 as defined herein. In some embodiments of the compound, the compound comprises an electron-withdrawing group from LIST EWG 2 as defined herein. In some embodiments of the compound, the compound comprises an electron-withdrawing group from LIST EWG 3 as defined herein. In some embodiments of the compound, the compound comprises an electron-withdrawing group from LIST EWG 4 as defined herein. In some embodiments of the compound, the compound comprises an electron-withdrawing group from LIST Pi-EWG as defined herein.

In some embodiments, the electron-withdrawing groups commonly comprise one or more highly electronegative elements including but not limited to fluorine, oxygen, sulfur, nitrogen, chlorine, and bromine.

In some embodiments of the compound, the electron-withdrawing group has a Hammett constant larger than 0. In some embodiments, the electron-withdrawing group has a Hammett constant equal or larger than 0.1, 0.2, 0.3, 0.4, 0.5, 0.6, 0.7, 0.8, 0.9, 1.0, or 1.1.

In some embodiments, the electron-withdrawn group is selected from the group consisting of the following structures (LIST EWG 1): F, $CF_3$, CN, $COCH_3$, CHO, $COCF_3$, COOMe, $COOCF_3$, $NO_2$, $SF_3$, $SiF_3$, $PF_4$, $SF_3$, $OCF_3$, $SCF_3$, $SeCF_3$, $SOCF_3$, $SeOCF_3$, $SO_2F$, $SO_2CF_3$, $SeO_2CF_3$, $OSeO_2CF_3$, OCN, SCN, SeCN, NC, $^+N(R^{k2})_3$, $(R^{k2})_2CCN$, $(R^{k2})_2CCF_3$, $CNC(CF_3)_2$, $BR^{k3}R^{k2}$, substituted or unsubstituted dibenzoborole, 1-substituted carbazole, 1,9-substituted carbazole, substituted or unsubstituted carbazole, substituted or unsubstituted pyridine, substituted or unsubstituted pyrimidine, substituted or unsubstituted pyrazine, substituted or unsubstituted pyridoxine, substituted or unsubstituted triazine, substituted or unsubstituted oxazole, substituted or unsubstituted benzoxazole, substituted or unsubstituted thiazole, substituted or unsubstituted benzothiazole, substituted or unsubstituted imidazole, substituted or unsubstituted benzimidazole, ketone, carboxylic acid, ester, nitrile, isonitrile, sulfinyl, sulfonyl, partially and fully fluorinated alkyl, partially and fully fluorinated aryl, partially and fully fluorinated heteroaryl, cyano-containing alkyl, cyano-containing aryl, cyano-containing heteroaryl, isocyanate,

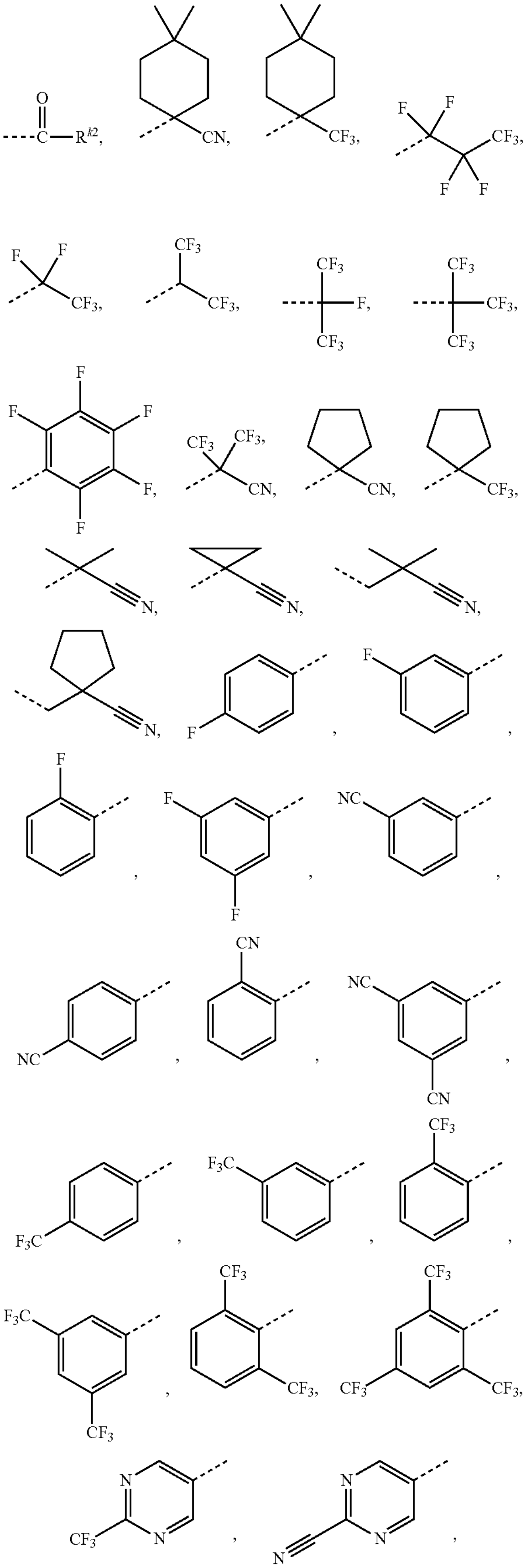

-continued

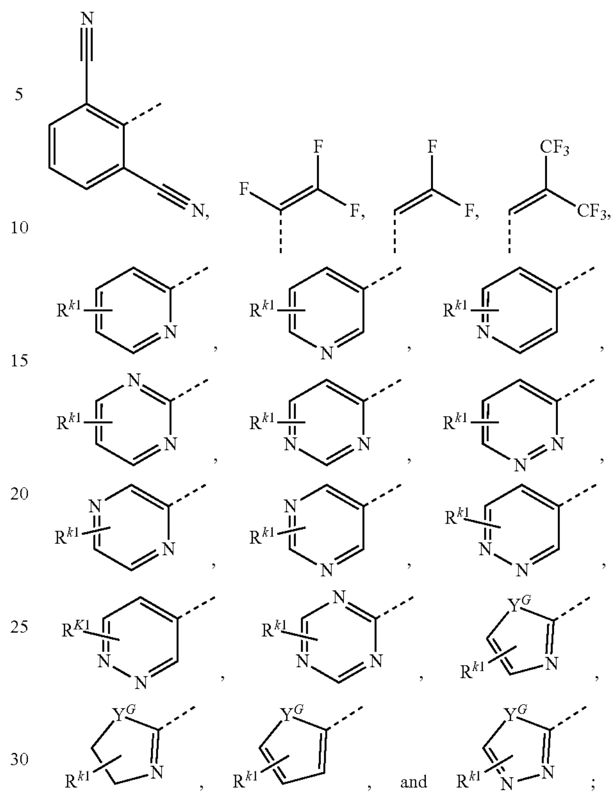

wherein each $R^{k1}$ represents mono to the maximum allowable substitution, or no substitutions;

wherein $Y^G$ is selected from the group consisting of $BR_e$, $NR_e$, $PR_e$, O, S, Se, C=O, S=O, $SO_2$, $CR_eR_f$, $SiR_eR_f$, and $GeR_eR_f$; and wherein each of $R^{k1}$, $R^{k2}$, $R^{k3}$, $R_e$, and $R_f$ is independently a hydrogen or a substituent selected from the group consisting of the General Substituents defined herein.

In some embodiments, the electron-withdrawing group is selected from the group consisting of the following structures (LIST EWG 2):

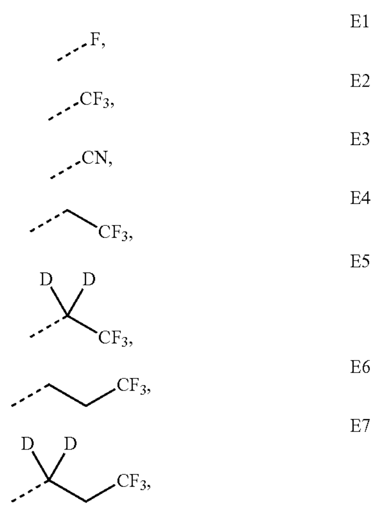

E1

E2

E3

E4

E5

E6

E7

-continued
E8
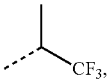
E9
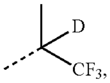
E10
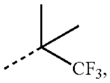
E11
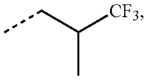
E12
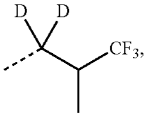
E13
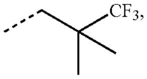
E14
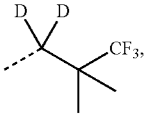
E15
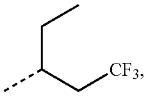
E16
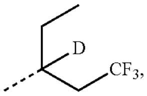
E17
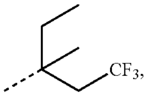
E18
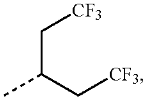
E19
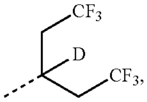
E20
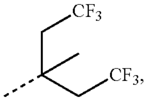
E21
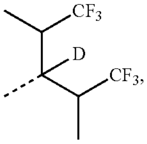
-continued
E22
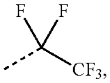
E23
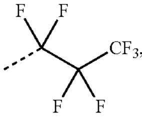
E24
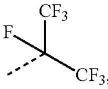
E25
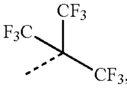
E26
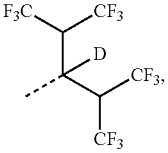
E27
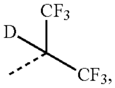
E28
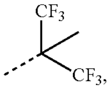
E29
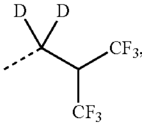
E30
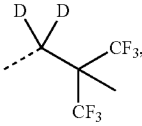
E31
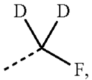
E32
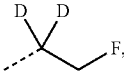
E33
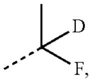
E34
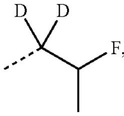
E35
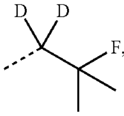

-continued
E36
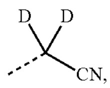
E37
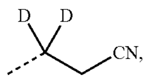
E38
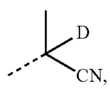
E39
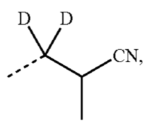
E40
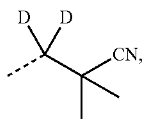
E41
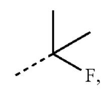
E42
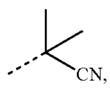
E43
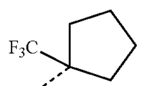
E44
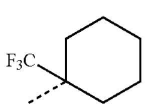
E45
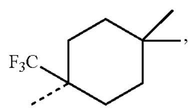
E46
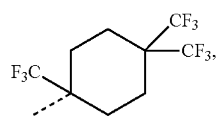
E47
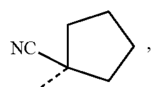
E48
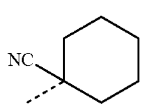
E49
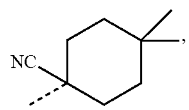
-continued
E50
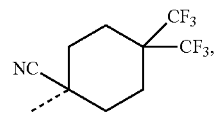
E51
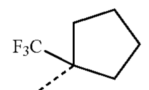
E52
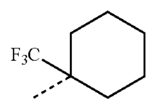
E53
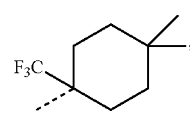
E54
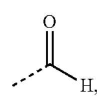
E55
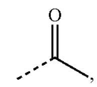
E56
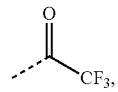
E57
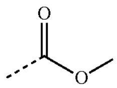
E58
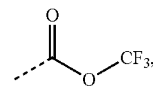
E59
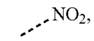
E60
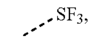
E61
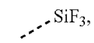
E62
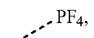
E63
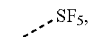
E64
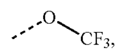
E65
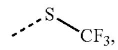
E66
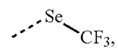
E67
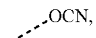
E68
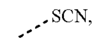
E69
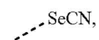

-continued
E70
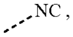
E71
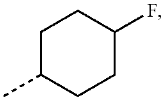
E72
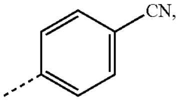
E73
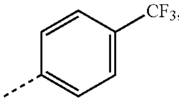
E74
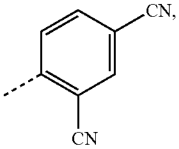
E75
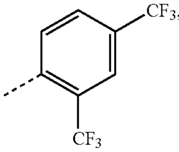
E76
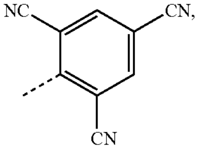
E77
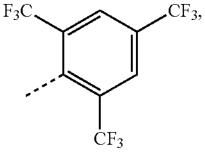
E78
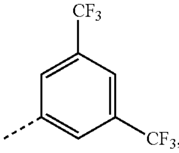
E79
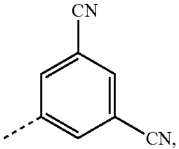
E80
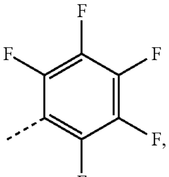
-continued
E81
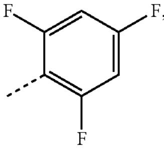
E82
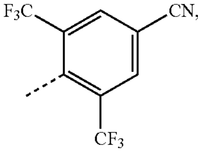
E83
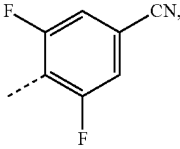
E84
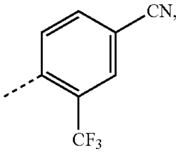
E85
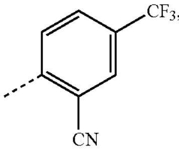
E86
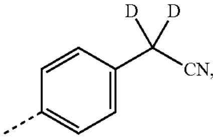
E87
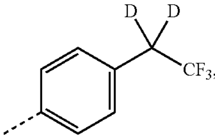
E88
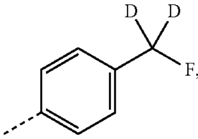
E89
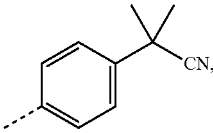
E90
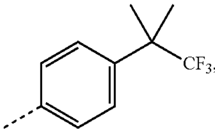

-continued
E91
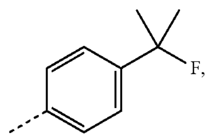
E92
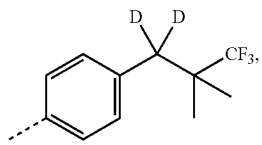
E93
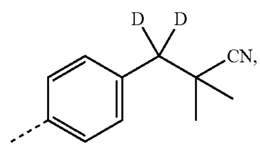
E94
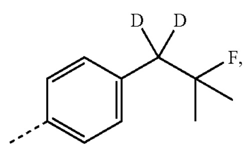
E95
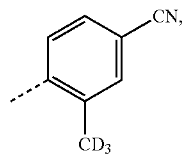
E96
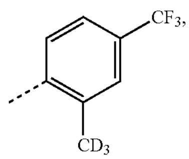
E97
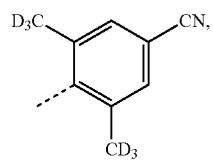
E98
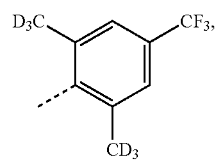
E99
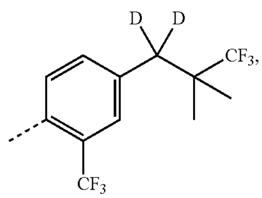
-continued
E100
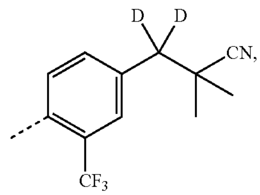
E101
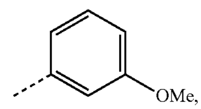
E102
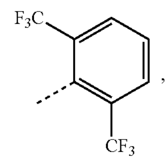
E103
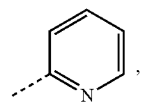
E104
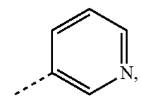
E105
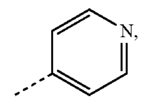
E106
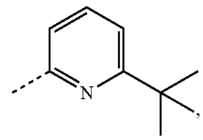
E107
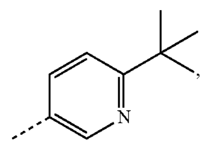
E108
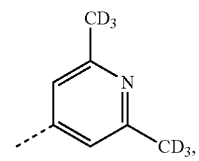
E109
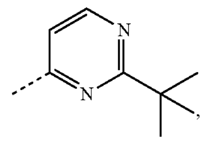
E110
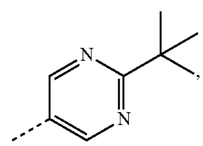

-continued
E111
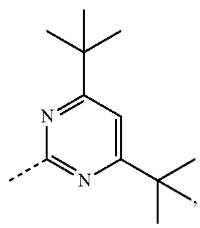
E112
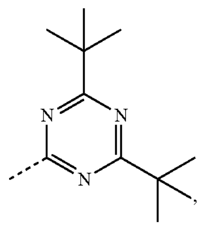
E113
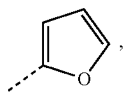
E114
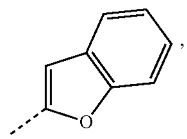
E115
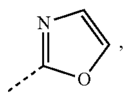
E116
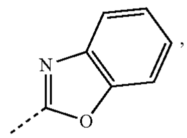
E117
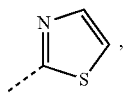
E118
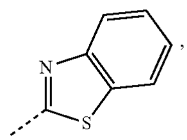
E119
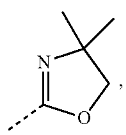
E120
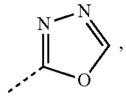
-continued
E121
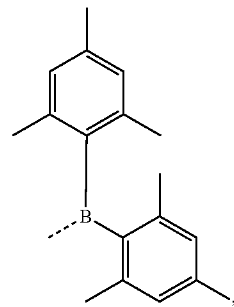
E122
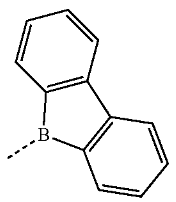
E123
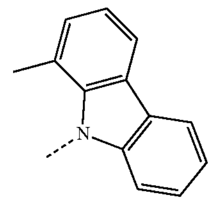
E124
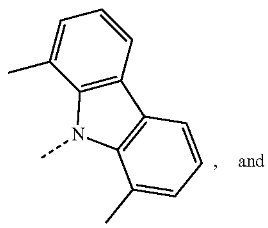
and
E125
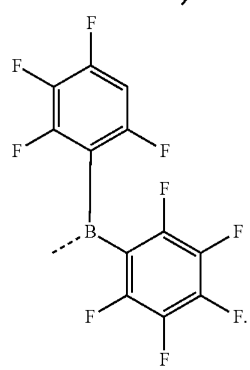
In some embodiments, the electron-withdrawing group is selected from the group consisting of the following structures (LIST EWG 3):
E1
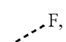
E2
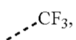
E3
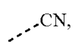

-continued
E5
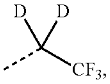
E7
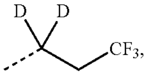
E9
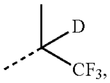
E10
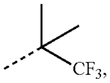
E12
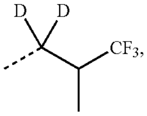
E14
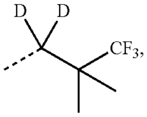
E22
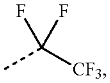
E23
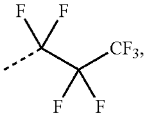
E24
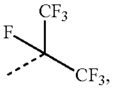
E25
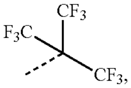
E27
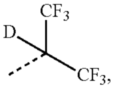
E28
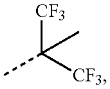
E29
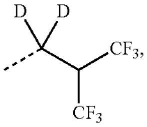
E30
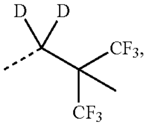
-continued
E35
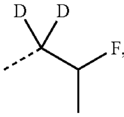
E36
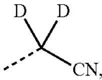
E38
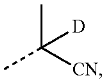
E40
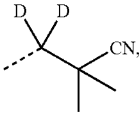
E41
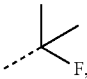
E42
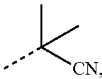
E71
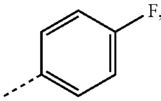
E72
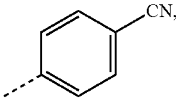
E73
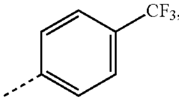
E75
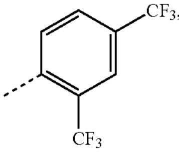
E78
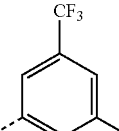
E79
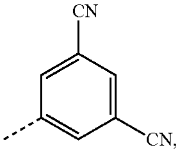

-continued
E80
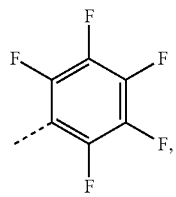
E89
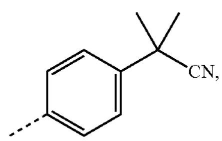
E90
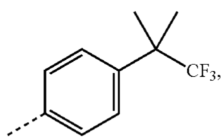
E91
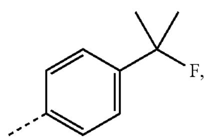
E92
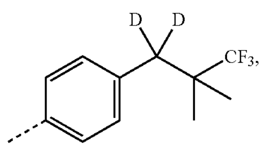
E93
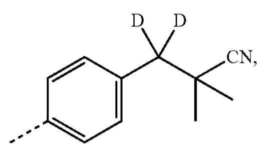
E94
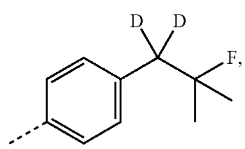
E95
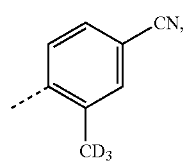
E96
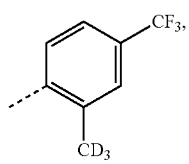
E97
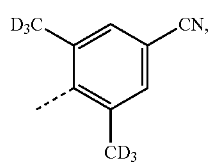
-continued
E98
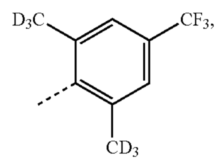
E106
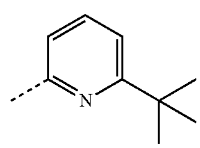
E107
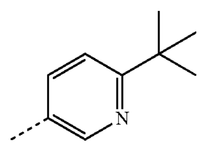
E108
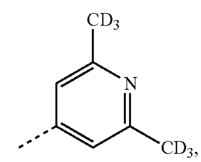
E109
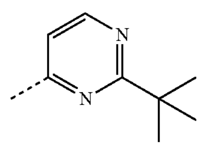
E110
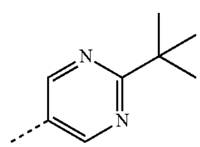
E112
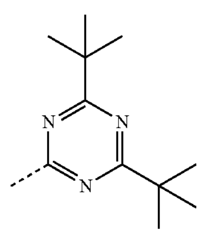
E114
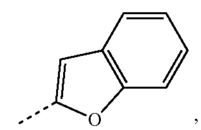
E115
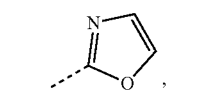
E116
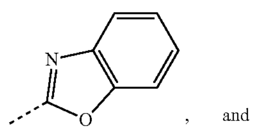
and -continued
E119
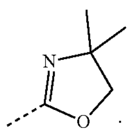
In some embodiments, the electron-withdrawing group is selected from the group consisting of the following structures (LIST EWG 4):
E1
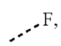
E2
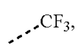
E3
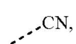
E5
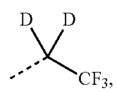
E9
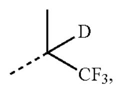
E10
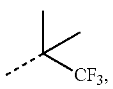
E14
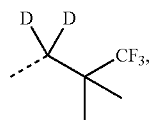
E28
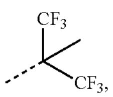
E35
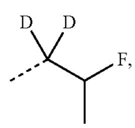
E36
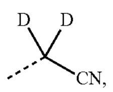
E38
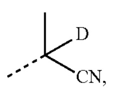
E42
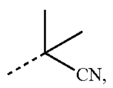
E71
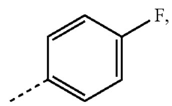
-continued
E72
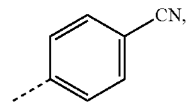
E73
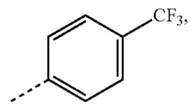
E106
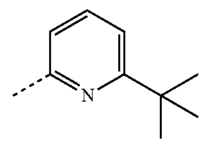
E107
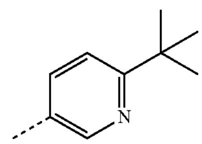
E108
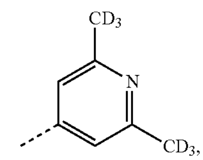
E109
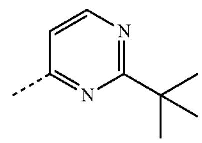
E110
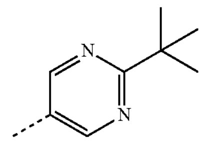
E112
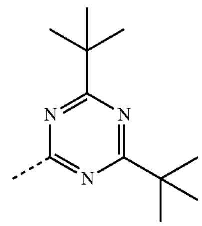
E114
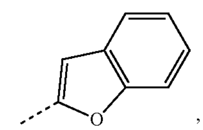
E115
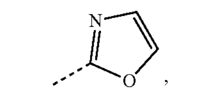
E116
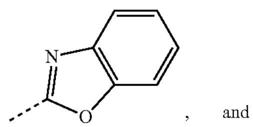
, and -continued

E119

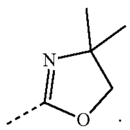

In some embodiments, the electron-withdrawing group is a π-electron deficient electron-withdrawing group. In some embodiments, the π-electron deficient electron-withdrawing group is selected from the group consisting of the following structures (LIST Pi-EWG): CN, $COCH_3$, CHO, $COCF_3$, COOMe, $COOCF_3$, $NO_2$, $SF_3$, $SiF_3$, $PF_4$, $SF_3$, $OCF_3$, $SCF_3$, $SeCF_3$, $SOCF_3$, $SeOCF_3$, $SO_2F$, $SO_2CF_3$, $SeO_2CF_3$, $OSeO_2CF_3$, OCN, SCN, SeCN, NC, $^+N(R^{k2})_3$, $BR^{k2}R^{k3}$, substituted or unsubstituted dibenzoborole, 1-substituted carbazole, 1,9-substituted carbazole, substituted or unsubstituted carbazole, substituted or unsubstituted pyridine, substituted or unsubstituted pyrimidine, substituted or unsubstituted pyrazine, substituted or unsubstituted pyridazine, substituted or unsubstituted triazine, substituted or unsubstituted oxazole, substituted or unsubstituted benzoxazole, substituted or unsubstituted thiazole, substituted or unsubstituted benzothiazole, substituted or unsubstituted imidazole, substituted or unsubstituted benzimidazole, ketone, carboxylic acid, ester, nitrile, isonitrile, sulfinyl, sulfonyl, partially and fully fluorinated aryl, partially and fully fluorinated heteroaryl, cyano-containing aryl, cyano-containing heteroaryl, isocyanate,

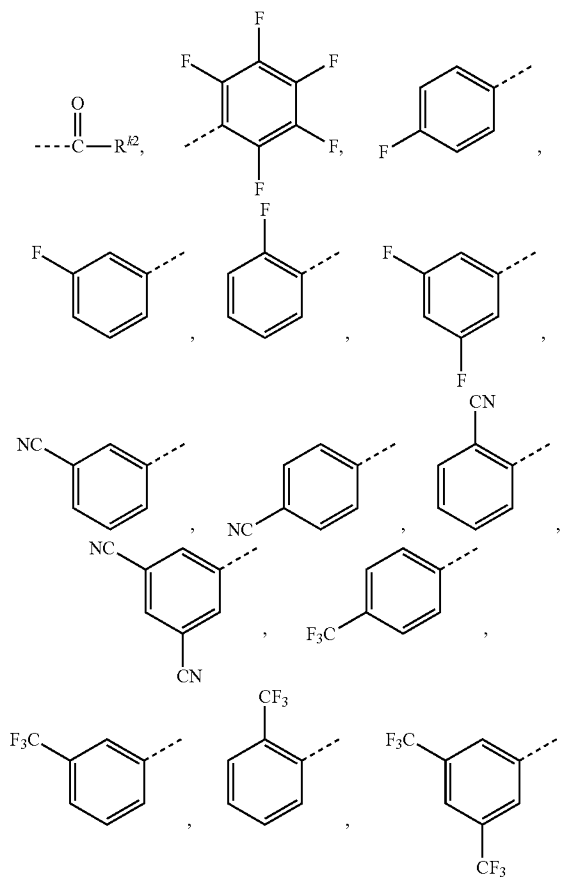

-continued

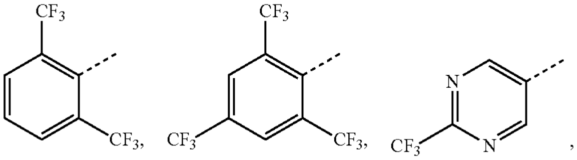

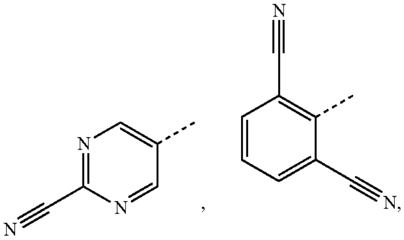

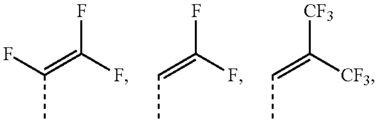

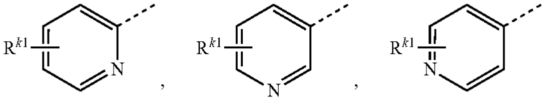

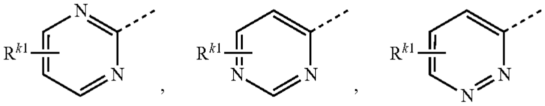

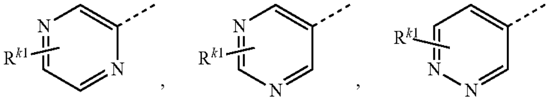

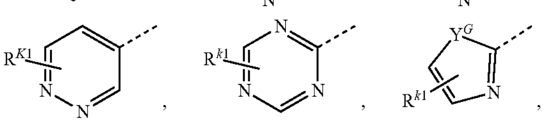

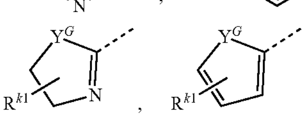

and

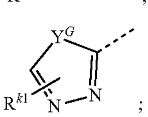

;

wherein the variables are the same as previously defined.

In some embodiments, the ligand $L_A$ is selected from the group consisting of the following structures of LIST 1:

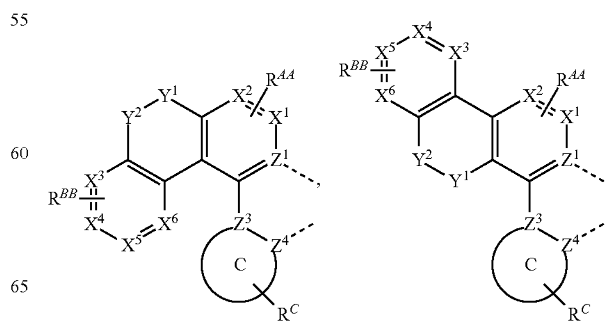

-continued
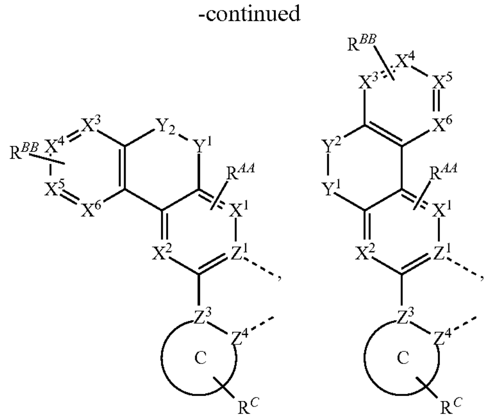
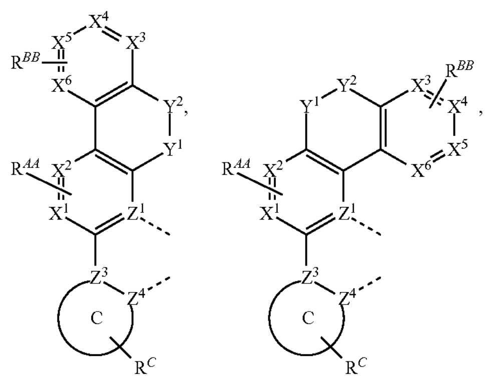
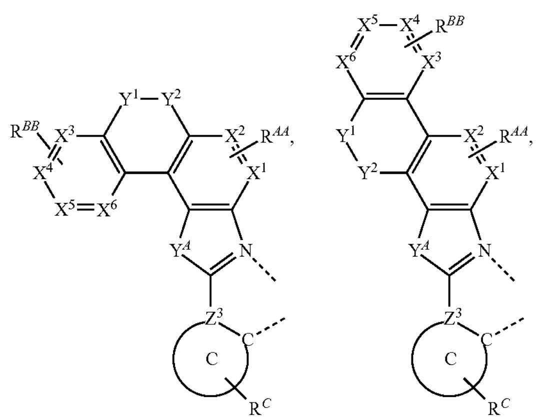
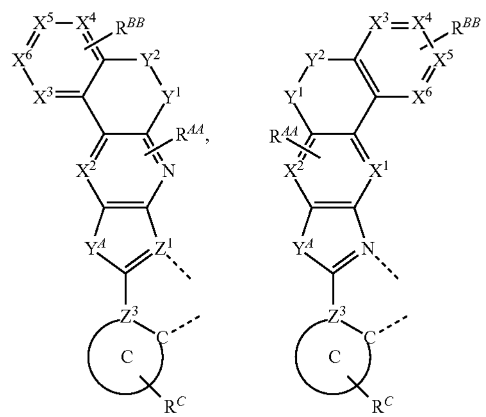
-continued
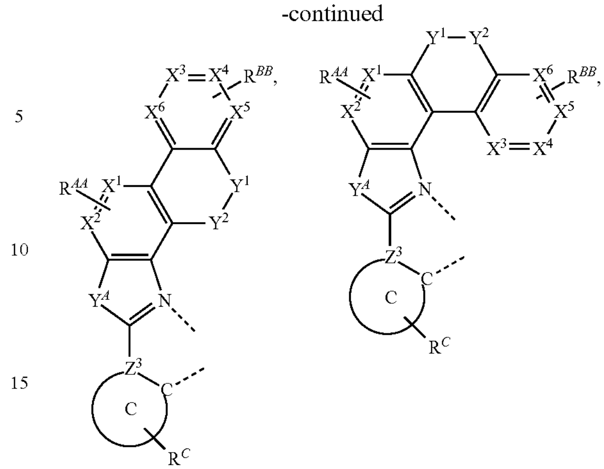
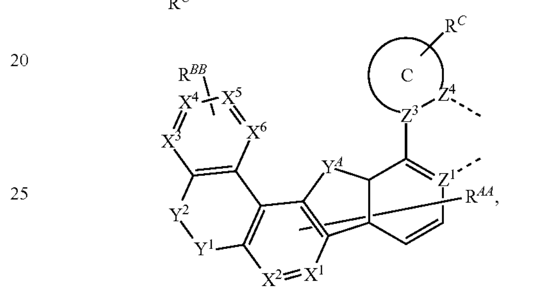
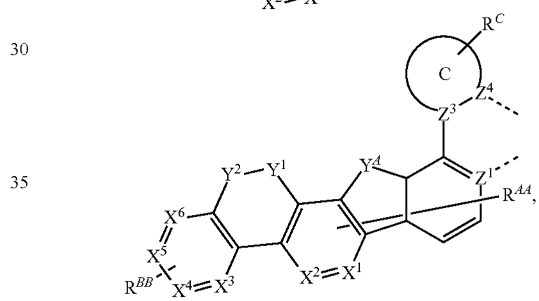
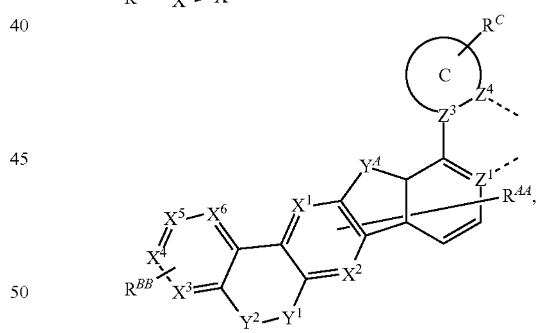
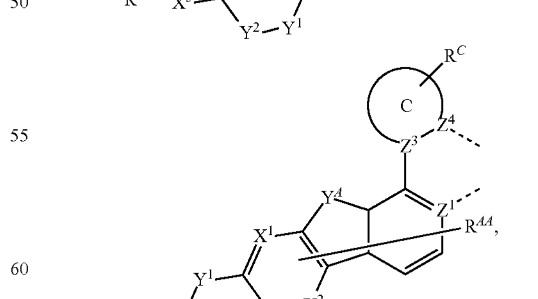
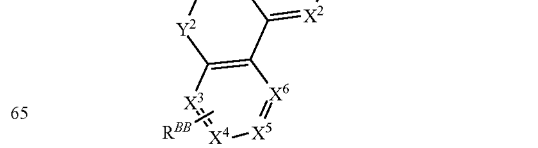

-continued

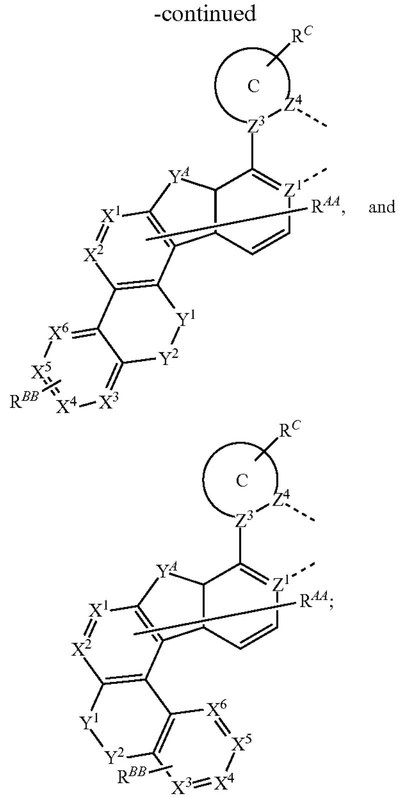

and wherein each of $R^{AA}$ and $R^{BB}$ independently represents mono to the maximum allowable substitution, or no substitution; each of $R^{AA}$ and $R^{BB}$ is independently hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof;

$X^1$—$X^6$ are each independently C or N;

$Y^A$ is selected from the group consisting of BR, BRR', NR, $PR_e$, P(O)R, O, S, Se, C═O, C═S, C═Se, C═NR, C═CRXR', S═O, $SO_2$, CR, CRR', SiRR', and GeRR';

The remaining variables are the same as previously defined; and any two substituents can be joined or fused to form a ring.

In some embodiments, where ligand $L_A$ is selected from LIST 1, at least one of $R^{AA}$, $R^{BB}$, or $R^C$ is partially or fully deuterated. In some embodiments, at least one $R^{AA}$ is partially or fully deuterated. In some embodiments, at least one $R^{BB}$ is partially or fully deuterated. In some embodiments, at least one $R^C$ is partially or fully deuterated.

In some embodiments where ligand $L_A$ is selected from LIST 1, $R^{AA}$ is or comprises an electron-withdrawing group from the LIST EWG 1 as defined herein. In some embodiments, $R^{AA}$ is or comprises an electron-withdrawing group from the LIST EWG 2 as defined herein. In some embodiments, $R^{AA}$ is or comprises an electron-withdrawing group from the LIST EWG 3 as defined herein. In some embodiments, $R^{AA}$ is or comprises an electron-withdrawing group from the LIST EWG 4 as defined herein. In some embodiments, $R^{AA}$ is or comprises an electron-withdrawing group from the LIST Pi-EWG as defined herein.

In some embodiments where ligand $L_A$ is selected from LIST 1, $R^{BB}$ is or comprises an electron-withdrawing group from the LIST EWG 1 as defined herein. In some embodiments, $R^{BB}$ is or comprises an electron-withdrawing group from the LIST EWG 2 as defined herein. In some embodiments, $R^{BB}$ is or comprises an electron-withdrawing group from the LIST EWG 3 as defined herein. In some embodiments, $R^{BB}$ is or comprises an electron-withdrawing group from the LIST EWG 4 as defined herein. In some embodiments, $R^{BB}$ is or comprises an electron-withdrawing group from the LIST Pi-EWG as defined herein.

In some embodiments where ligand $L_A$ is selected from LIST 1, $R^C$ is or comprises an electron-withdrawing group from the LIST EWG 1 as defined herein. In some embodiments, $R^C$ is or comprises an electron-withdrawing group from the LIST EWG 2 as defined herein. In some embodiments, $R^C$ is or comprises an electron-withdrawing group from the LIST EWG 3 as defined herein. In some embodiments, $R^C$ is or comprises an electron-withdrawing group from the LIST EWG 4 as defined herein. In some embodiments, $R^C$ is or comprises an electron-withdrawing group from the LIST Pi-EWG as defined herein.

In some embodiments, the ligand $L_A$ is selected from the group consisting of the following structures of LIST 2:

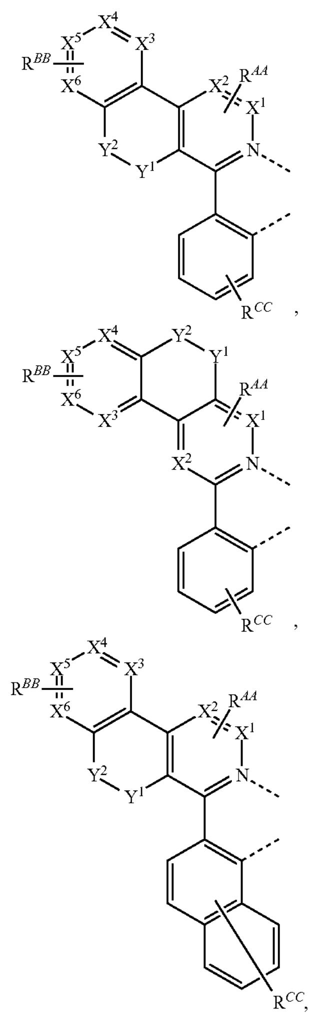

-continued
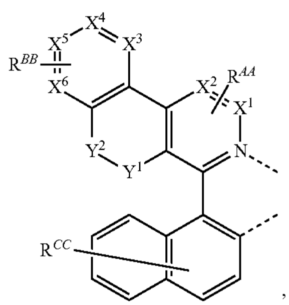
,
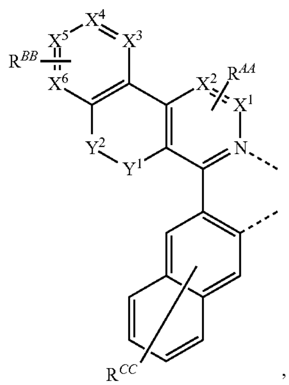
,
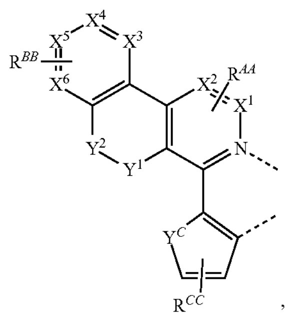
,
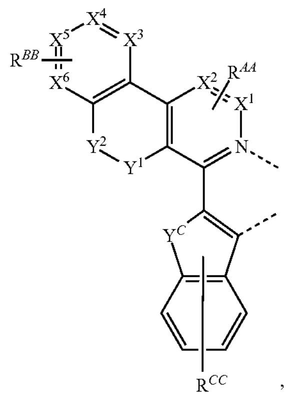
,
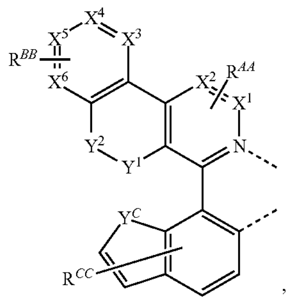
,
-continued
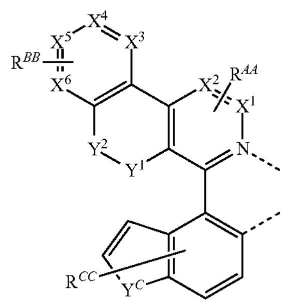
,
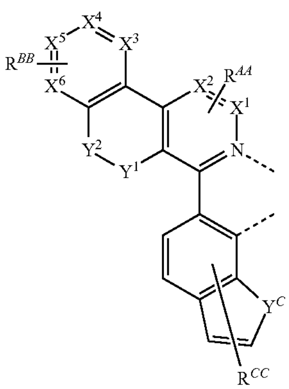
,
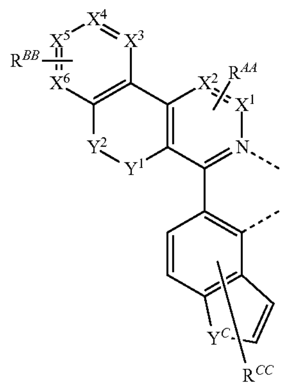
,
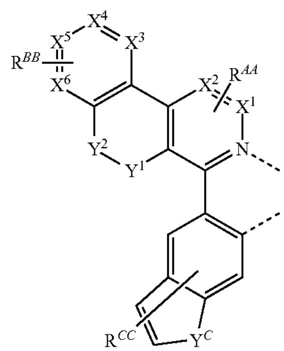
, -continued
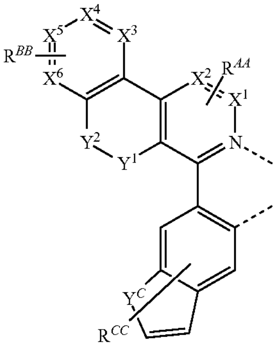
,
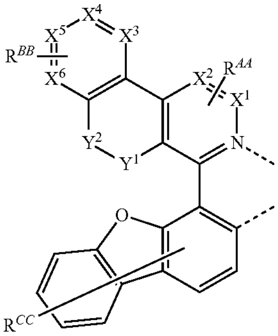
,
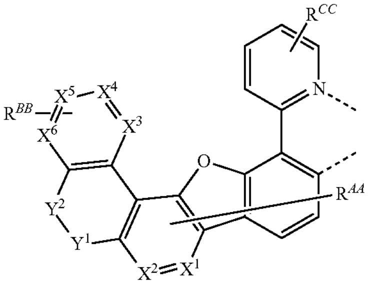
,
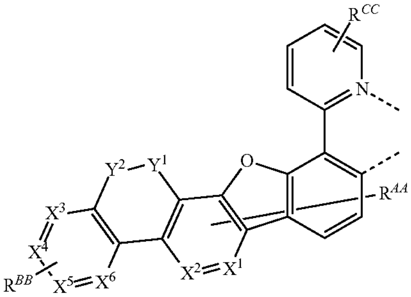
,
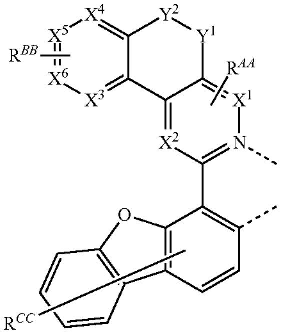
,
-continued
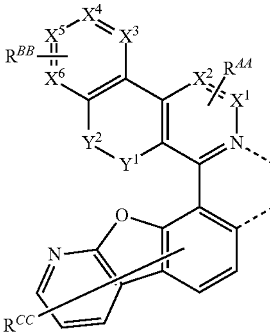
,
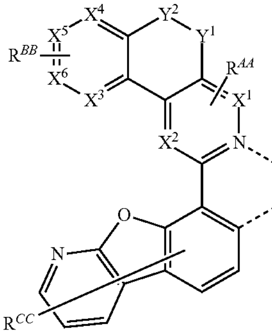
,
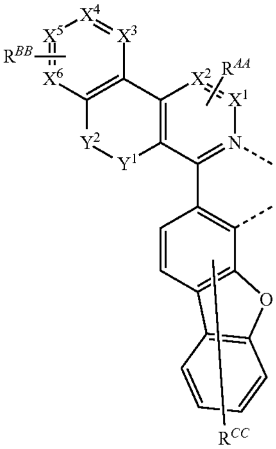
,
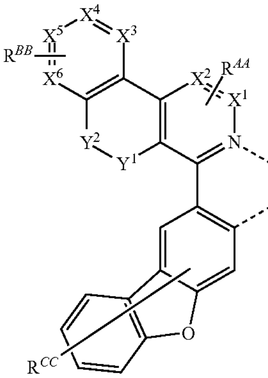
, -continued
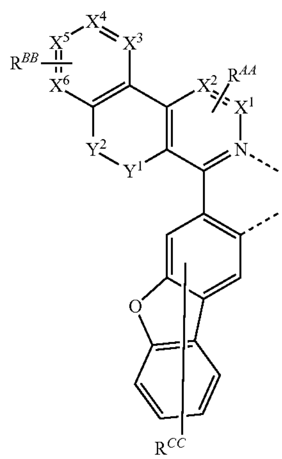
,
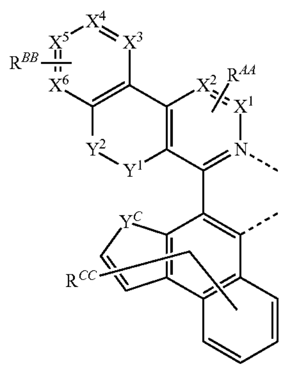
,
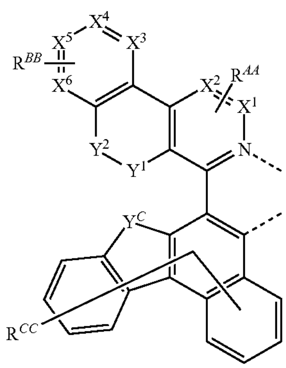
,
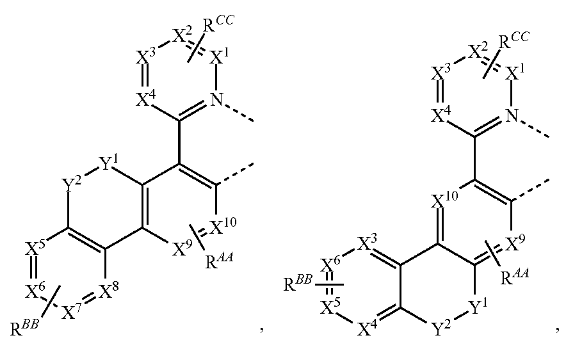
,
-continued
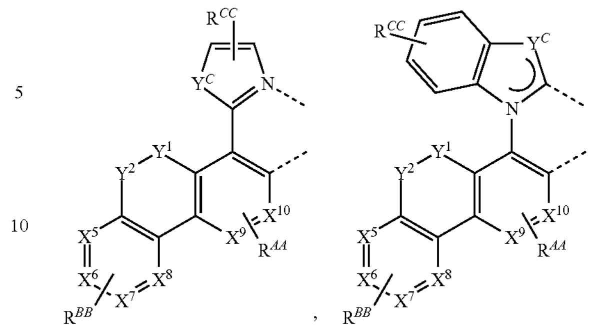
,
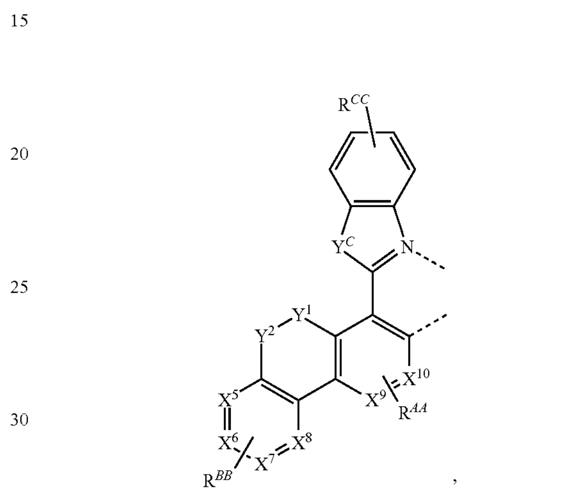
,
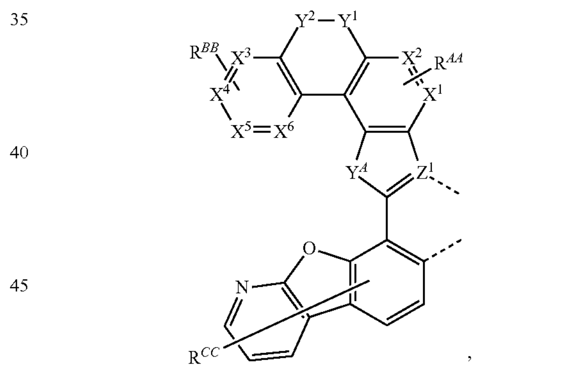
,
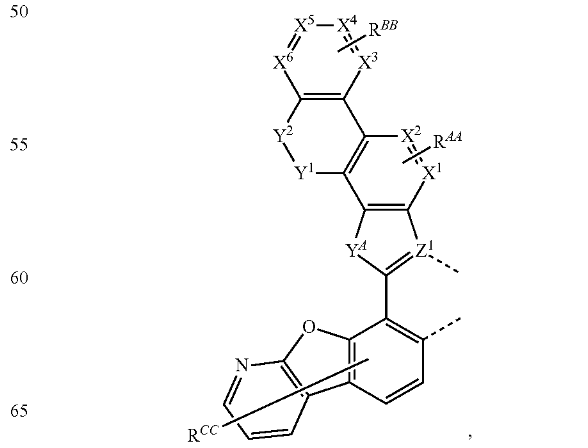
, -continued
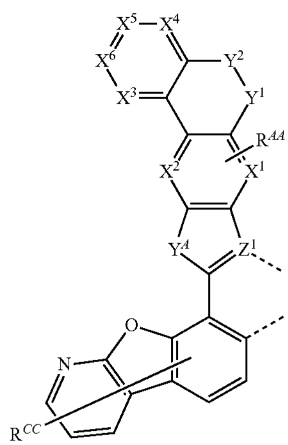
,
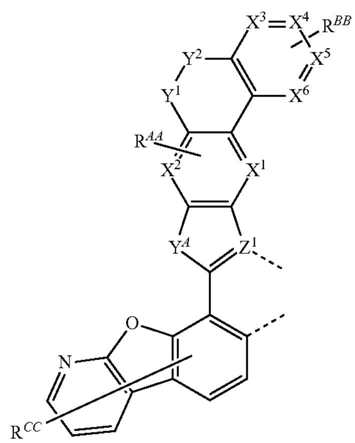
,
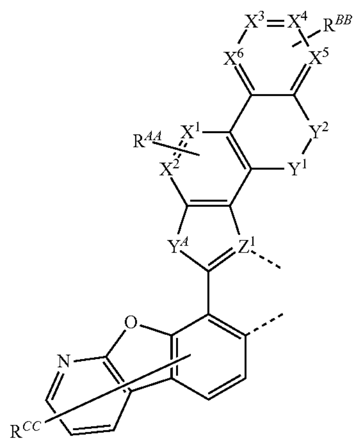
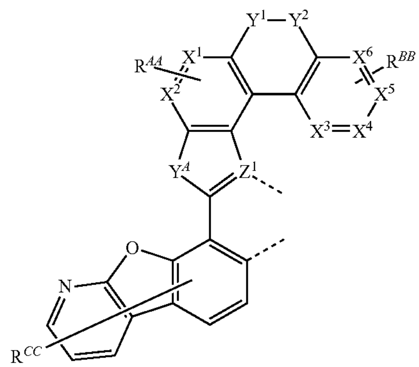
,
-continued
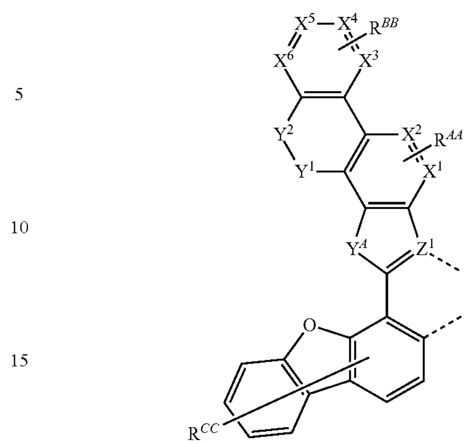
,
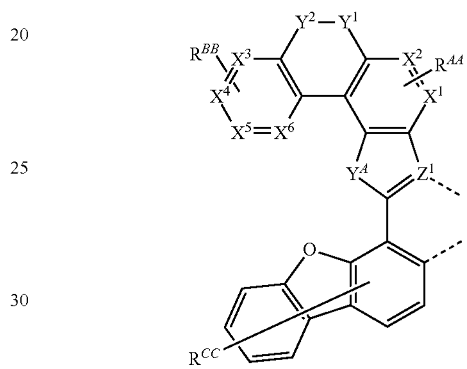
,
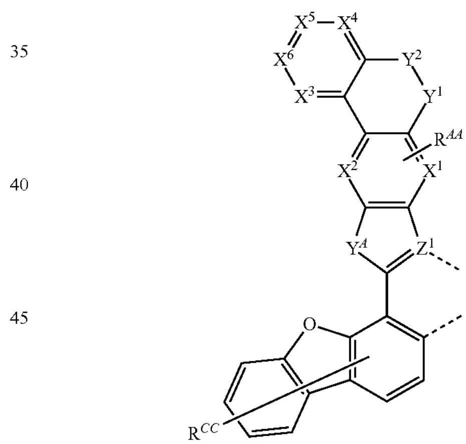
,
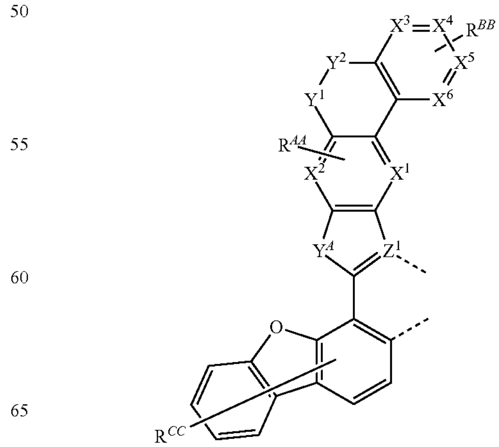
, -continued
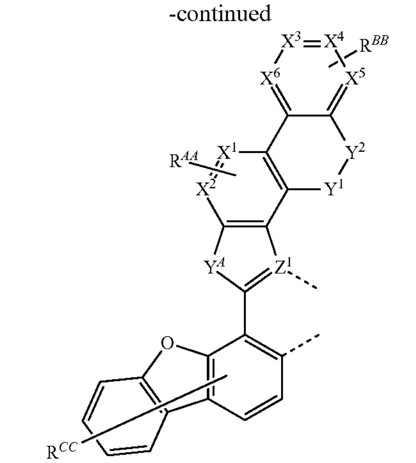
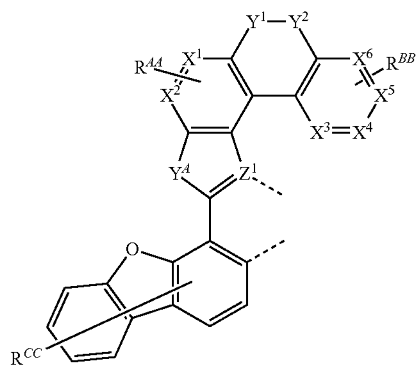
,
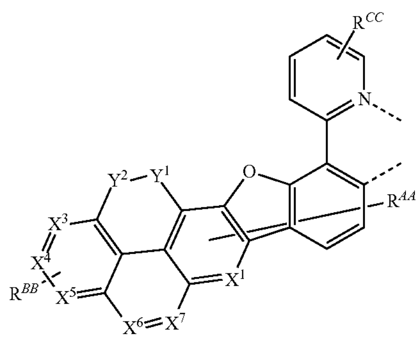
,
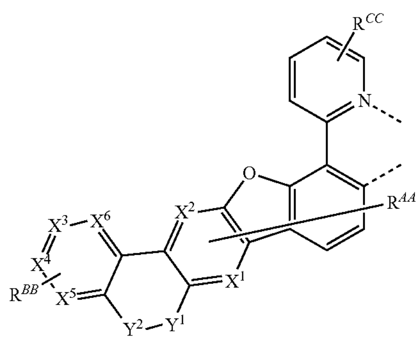
,
-continued
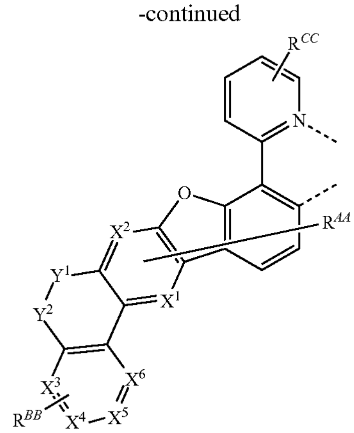
,
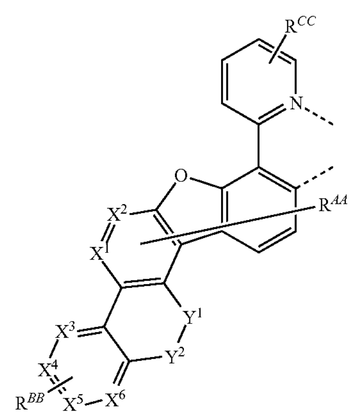
,
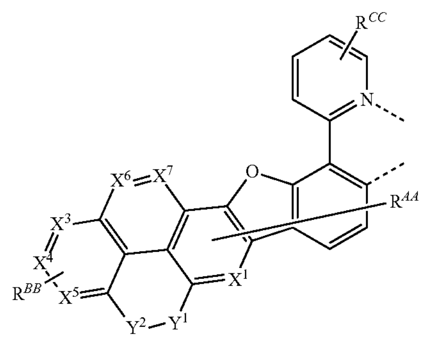
,
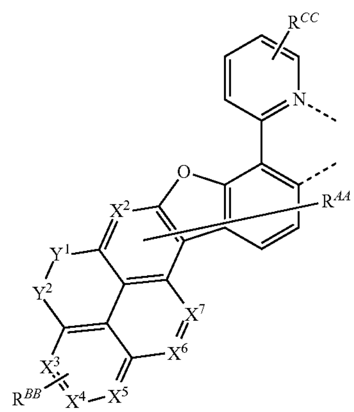
, -continued
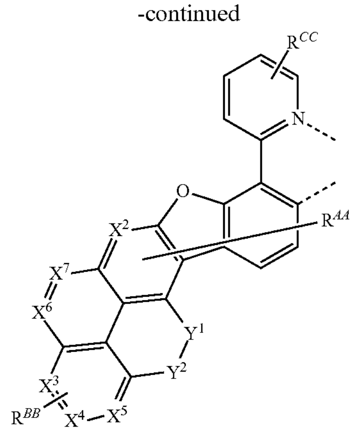
,
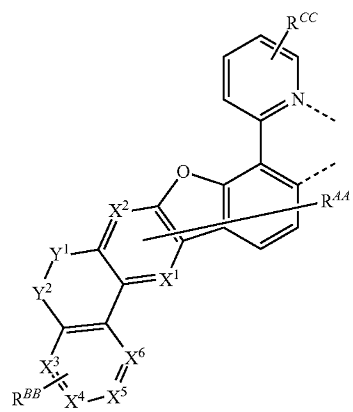
,
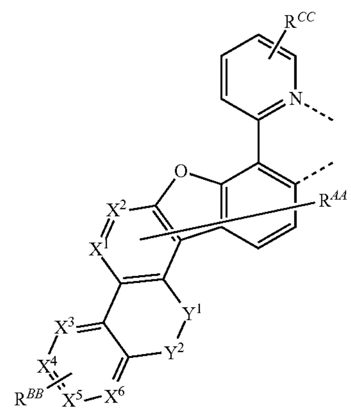
,
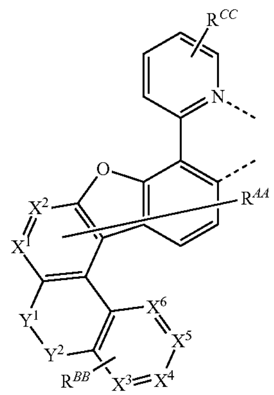
,
-continued
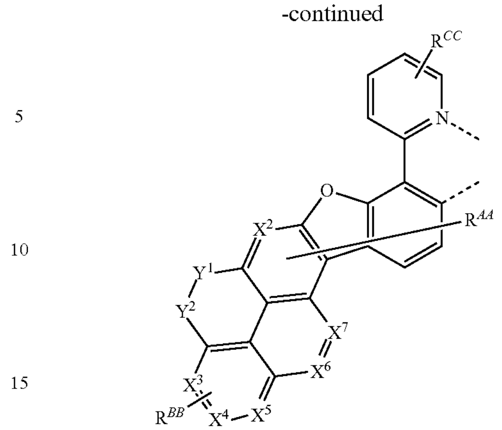
,
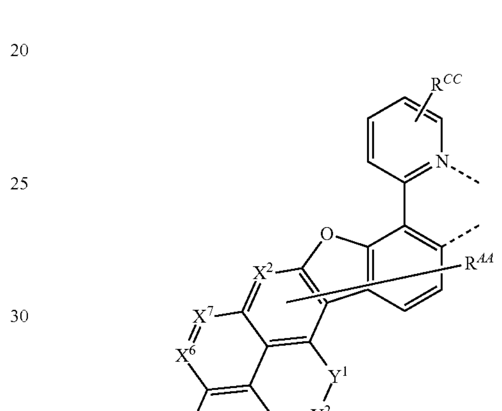
,
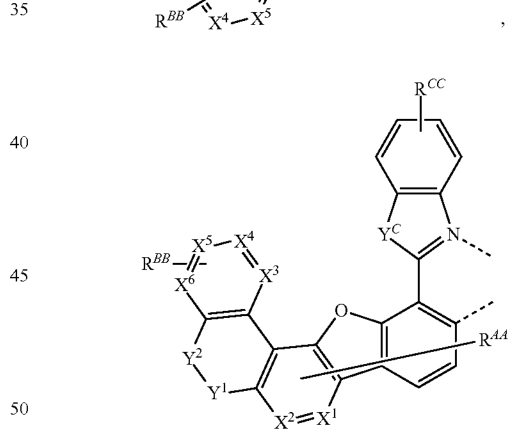
,
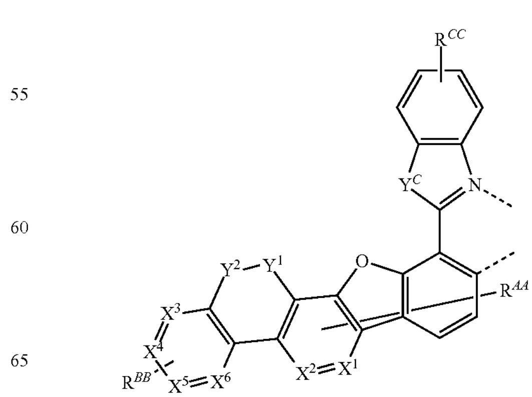
, -continued
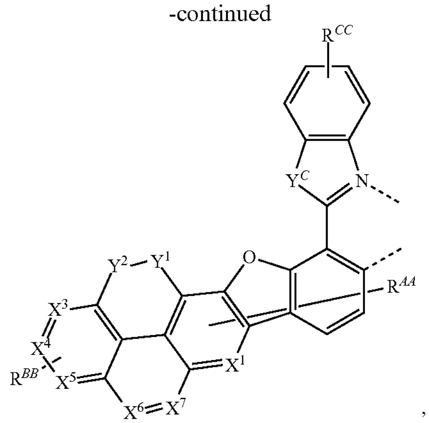
,
-continued
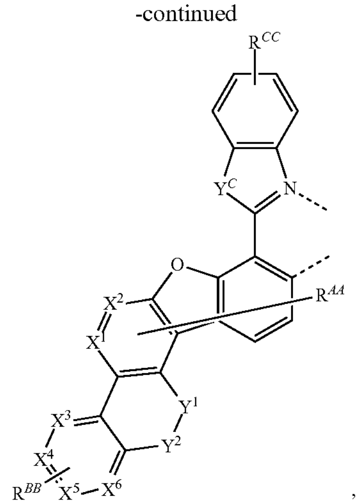
,
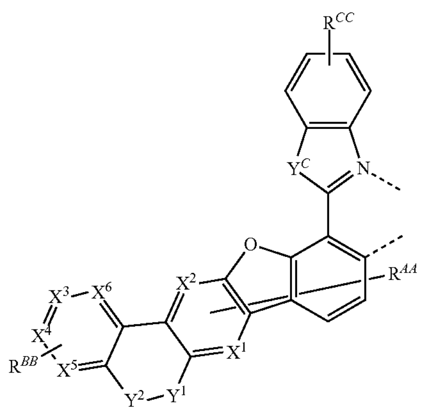
,
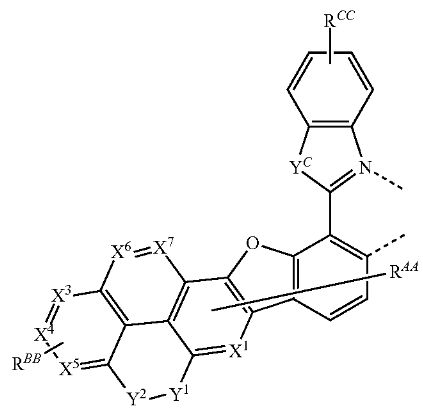
,
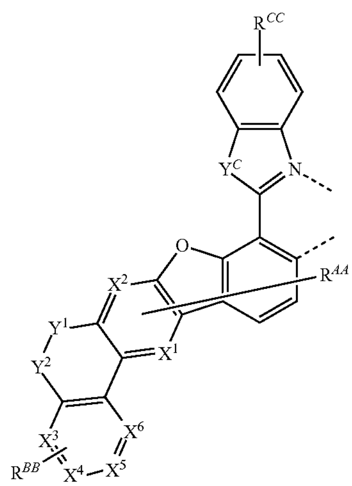
,
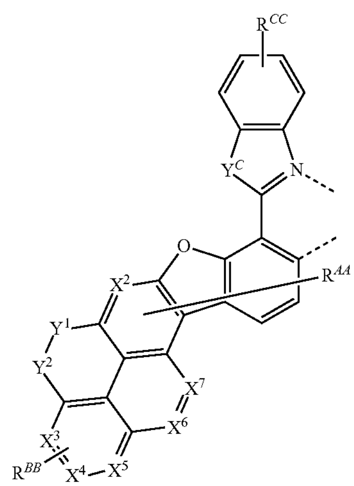
, -continued
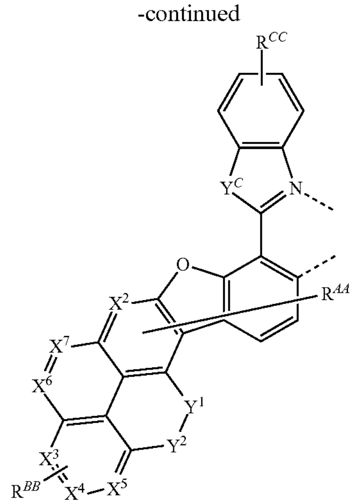
,
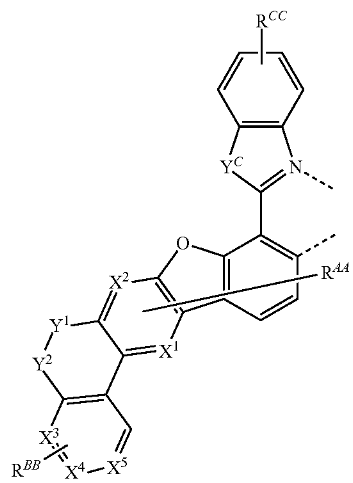
,
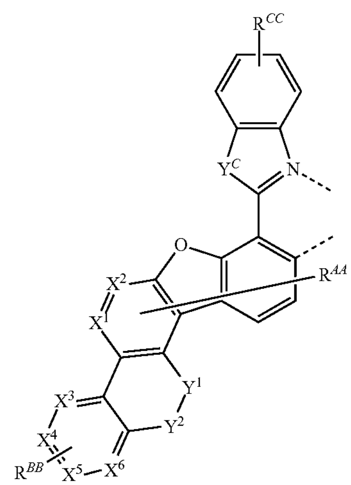
,
-continued
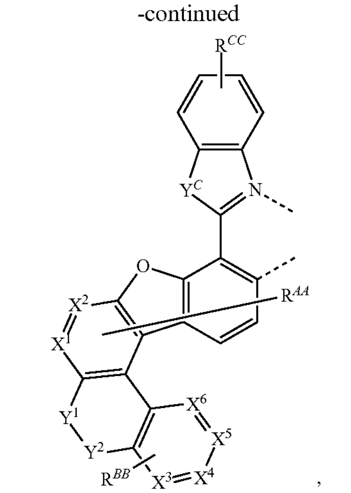
,
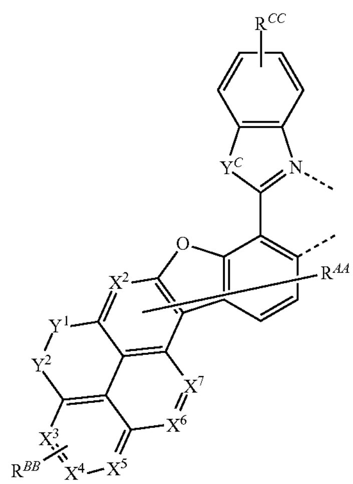
,
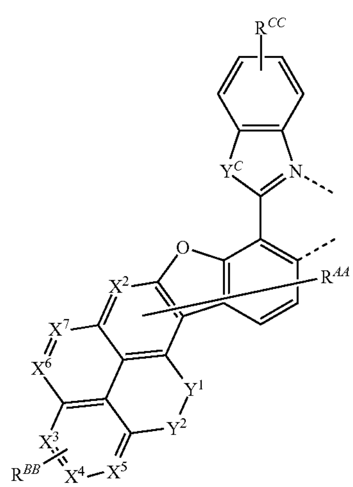
,
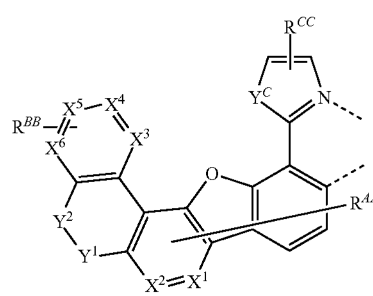
, -continued
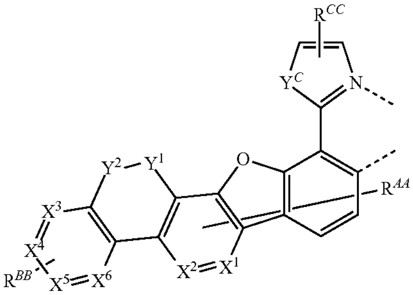
,
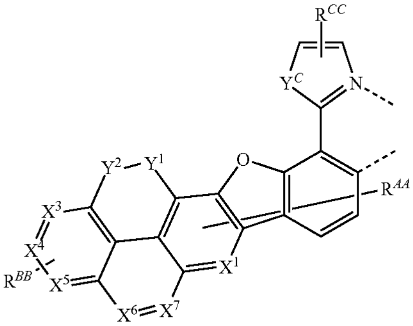
,
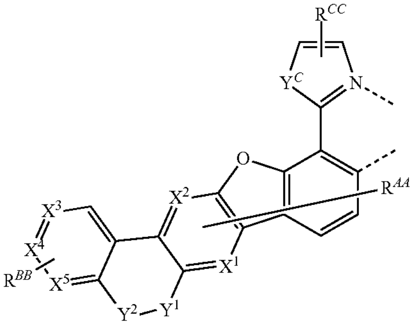
,
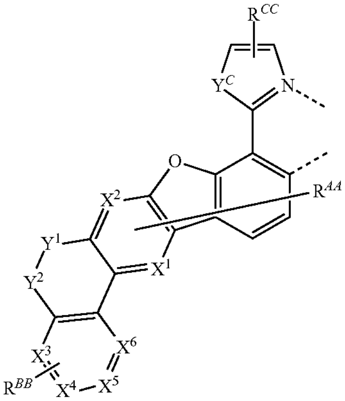
,
-continued
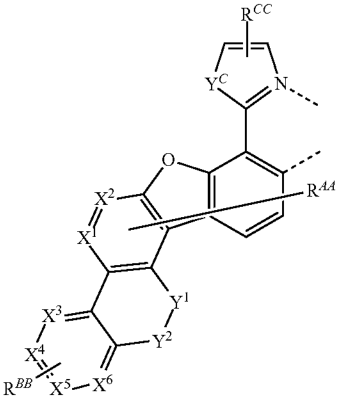
,
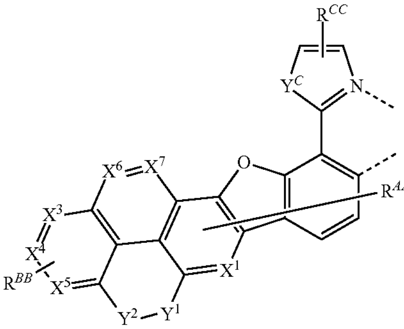
,
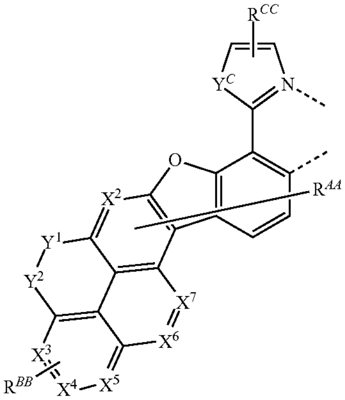
,
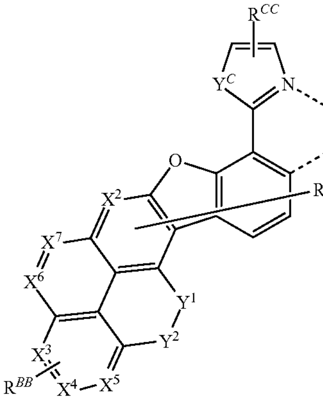
, -continued

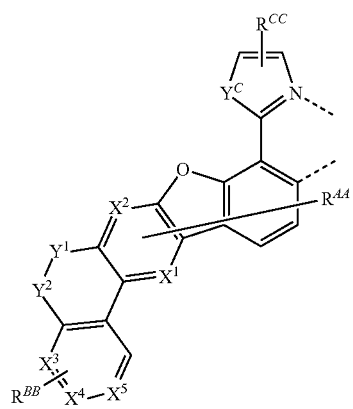

,

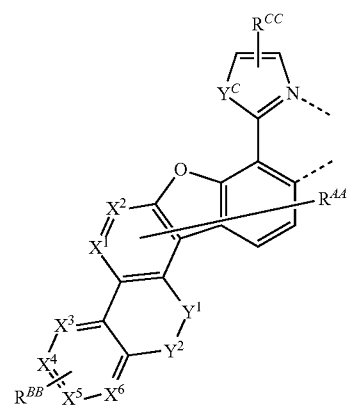

,

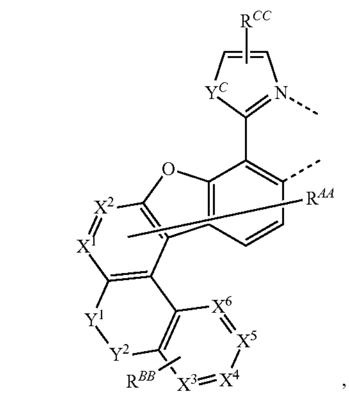

,

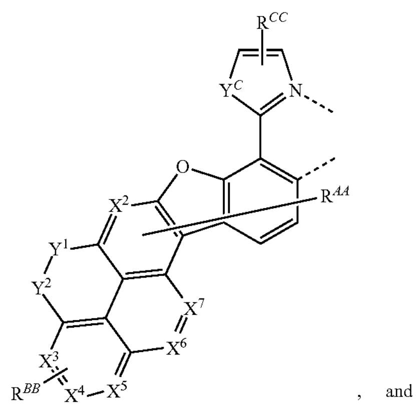

, and

-continued

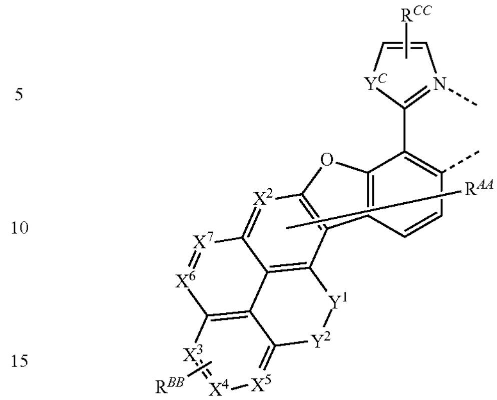

, wherein $R^{CC}$ independently represents mono to the maximum allowable substitution, or no substitution;

$X^7$ to $X^{10}$ are each independently C or N;

each $R^{CC}$ is independently hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof;

$Y^C$ is selected from the group consisting of BR, BRR', NR, PR, P(O)R, O, S, Se, C═O, C═S, C═Se, C═NR, C═CRXR', S═O, $SO_2$, CR, CRR', SiRR', and GeRR';

The remaining variables are the same as previously defined; and any two substituents can be joined or fused to form a ring.

In some embodiments, where ligand $L_A$ is selected from LIST 2, at least one of $R^{AA}$, $R^{BB}$, or $R^{CC}$ is partially or fully deuterated. In some embodiments, at least one $R^{AA}$ is partially or fully deuterated. In some embodiments, at least one $R^{BB}$ is partially or fully deuterated. In some embodiments, at least one $R^C$ is partially or fully deuterated.

In some embodiments where ligand $L_A$ is selected from LIST 2, $R^{AA}$ is or comprises an electron-withdrawing group from the LIST EWG 1 as defined herein. In some embodiments, $R^{AA}$ is or comprises an electron-withdrawing group from the LIST EWG 2 as defined herein. In some embodiments, $R^{AA}$ is or comprises an electron-withdrawing group from the LIST EWG 3 as defined herein. In some embodiments, $R^{AA}$ is or comprises an electron-withdrawing group from the LIST EWG 4 as defined herein. In some embodiments, $R^{AA}$ is or comprises an electron-withdrawing group from the LIST Pi-EWG as defined herein.

In some embodiments where ligand $L_A$ is selected from LIST 2, $R^{BB}$ is or comprises an electron-withdrawing group from the LIST EWG 1 as defined herein. In some embodiments, $R^{BB}$ is or comprises an electron-withdrawing group from the LIST EWG 2 as defined herein. In some embodiments, $R^{BB}$ is or comprises an electron-withdrawing group from the LIST EWG 3 as defined herein. In some embodiments, $R^{BB}$ is or comprises an electron-withdrawing group from the LIST EWG 4 as defined herein. In some embodiments, $R^{BB}$ is or comprises an electron-withdrawing group from the LIST Pi-EWG as defined herein.

In some embodiments where ligand $L_A$ is selected from LIST 2, $R^{CC}$ is or comprises an electron-withdrawing group from the LIST EWG 1 as defined herein. In some embodiments, $R^{CC}$ is or comprises an electron-withdrawing group from the LIST EWG 2 as defined herein. In some embodiments, $R^{CC}$ is or comprises an electron-withdrawing group from the LIST EWG 3 as defined herein. In some embodiments, $R^{CC}$ is or comprises an electron-withdrawing group from the LIST EWG 4 as defined herein. In some embodiments, $R^{CC}$ is or comprises an electron-withdrawing group from the LIST Pi-EWG as defined herein.

In some embodiments, the ligand $L_A$ is selected from $L_{Ai}(R^E)(R^F)(W)(G)$, wherein i is an integer from 1 to 52, each of $R^E$ and $R^F$ is independently selected from $R^1$ to $R^{89}$, W is from W1 to W42 when i is 2, 4, 6, 8, 14, 16, 17, 20-52, while W is from W1 to W36 when i is 1, 3, 5, 7, 9-13, 15, and 18-19, and G is from $G^1$ to $G^{25}$ when i is 1-20, 31-38, and 41-46, while G is from $G^{26}$ to $G^{53}$ when i is 21-30, 39-40, and 47-52, and each of $L_{Ai}(R^E)(R^F)(W^A)(G^B)$ is defined below (LIST 3):

| $L_A$ | Structure of $L_A$ |
| --- | --- |
| $L_{A1}$-$(R^1)(R^1)(W1)(G^1)$ to $L_{A1}$-$(R^{89})(R^{89})(W36)(G^{25})$ have the structure | 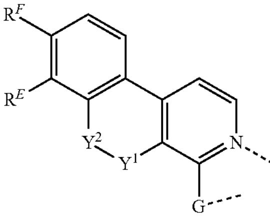 |
| $L_{A2}$-$(R^1)(R^1)(W1)(G^1)$ to $L_{A2}$-$(R^{89})(R^{89})(W42)(G^{25})$ have the structure | 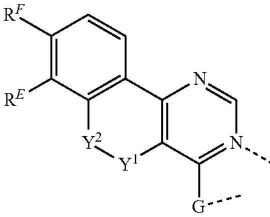 |
| $L_{A3}$-$(R^1)(R^1)(W1)(G^1)$ to $L_{A3}$-$(R^{89})(R^{89})(W36)(G^{25})$ have the structure | 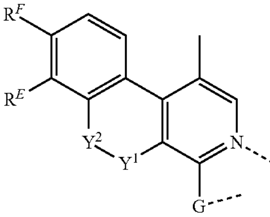 |
| $L_{A4}$-$(R^1)(R^1)(W1)(G^1)$ to $L_{A4}$-$(R^{89})(R^{89})(W36)(G^{25})$ have the structure | 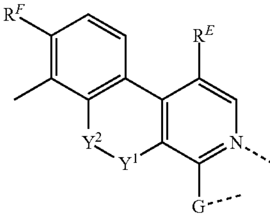 |
| $L_{A5}$-$(R^1)(R^1)(W1)(G^1)$ to $L_{A5}$-$(R^{89})(R^{89})(W36)(G^{25})$ have the structure | 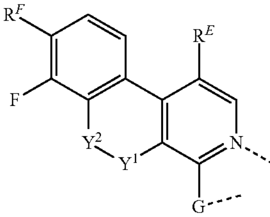 |
| $L_{A6}$-$(R^1)(R^1)(W1)(G^1)$ to $L_{A6}$-$(R^{89})(R^{89})(W36)(G^{25})$ have the structure | 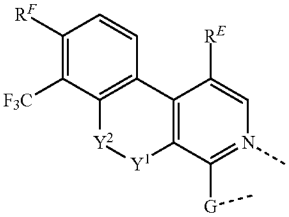 |

-continued

| $L_A$ | Structure of $L_A$ |
|---|---|
| $L_{A7}$-($R^1$)($R^1$)(W1)($G^1$) to $L_{A7}$-($R^{89}$)($R^{89}$)(W36)($G^{25}$) have the structure | 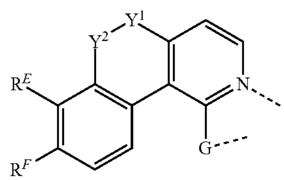 |
| $L_{A8}$-($R^1$)($R^1$)(W1)($G^1$) to $L_{A8}$-($R^{89}$)($R^{89}$)(W42)($G^{25}$) have the structure | 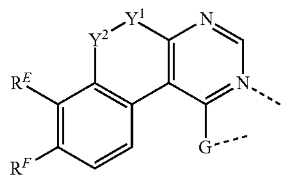 |
| $L_{A9}$-($R^1$)($R^1$)(W1)($G^1$) to $L_{A9}$-($R^{89}$)($R^{89}$)(W36)($G^{25}$) have the structure | 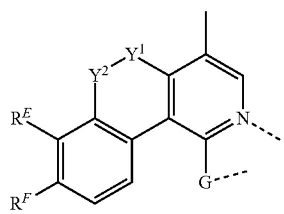 |
| $L_{A10}$-($R^1$)($R^1$)(W1)($G^1$) to $L_{A10}$-($R^{89}$)($R^{89}$)(W36)($G^{25}$) have the structure | 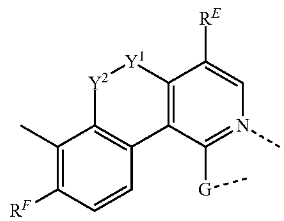 |
| $L_{A11}$-($R^1$)($R^1$)(W1)($G^1$) to $L_{A11}$-($R^{89}$)($R^{89}$)(W36)($G^{25}$) have the structure | 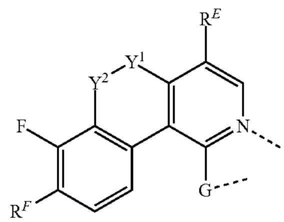 |
| $L_{A12}$-($R^1$)($R^1$)(W1)($G^1$) to $L_{A12}$-($R^{89}$)($R^{89}$)(W36)($G^{25}$) have the structure | 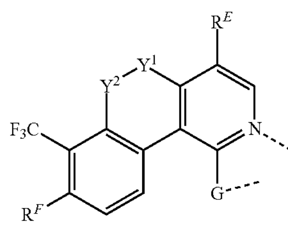 |
| $L_{A13}$-($R^1$)($R^1$)(W1)($G^1$) to $L_{A13}$-($R^{89}$)($R^{89}$)(W36)($G^{25}$) have the structure | 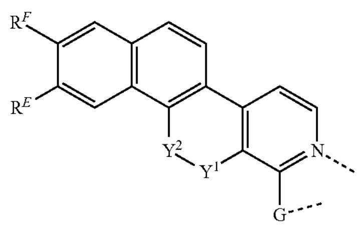 |

-continued

| $L_A$ | Structure of $L_A$ |
|---|---|
| $L_{A14}$-($R^1$)($R^1$)(W1)($G^1$) to $L_{A14}$-($R^{89}$)($R^{89}$)(W42)($G^{25}$) have the structure | 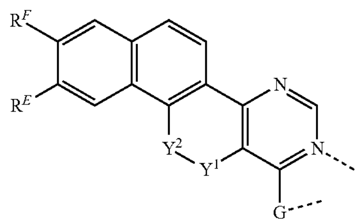 |
| $L_{A15}$-($R^1$)($R^1$)(W1)($G^1$) to $L_{A15}$-($R^{89}$)($R^{89}$)(W36)($G^{25}$) have the structure | 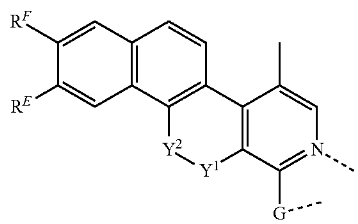 |
| $L_{A16}$-($R^1$)($R^1$)(W1)($G^1$) to $L_{A16}$-($R^{89}$)($R^{89}$)(W42)($G^{25}$) have the structure | 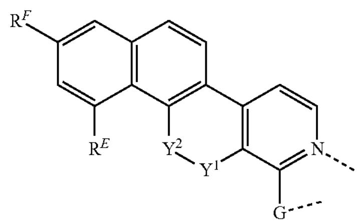 |
| $L_{A17}$-($R^1$)($R^1$)(W1)($G^1$) to $L_{A17}$-($R^{89}$)($R^{89}$)(W42)($G^{25}$) have the structure | 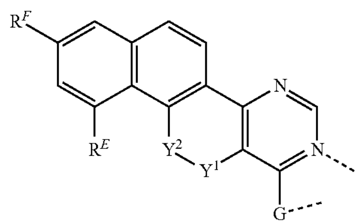 |
| $L_{A18}$-($R^1$)($R^1$)(W1)($G^1$) to $L_{A18}$-($R^{89}$)($R^{89}$)(W36)($G^{25}$) have the structure | 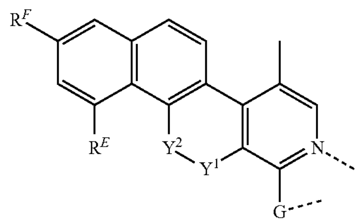 |
| $L_{A19}$-($R^1$)($R^1$)(W1)($G^1$) to $L_{A19}$-($R^{89}$)($R^{89}$)(W36)($G^{25}$) have the structure | 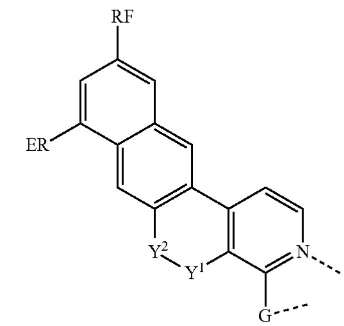 |

-continued

| $L_A$ | Structure of $L_A$ |
|---|---|
| $L_{A20}$-($R^1$)($R^1$)(W1)($G^1$) to $L_{A20}$-($R^{89}$)($R^{89}$)(W42)($G^{25}$) have the structure | 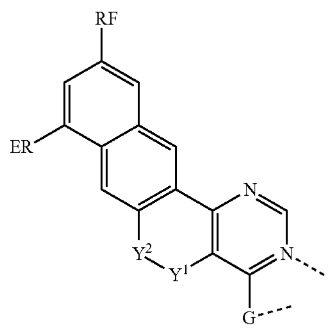 |
| $L_{A21}$-($R^1$)($R^1$)(W1)($G^{26}$) to $L_{A21}$-($R^{89}$)($R^{89}$)(W42)($G^{53}$) have the structure | 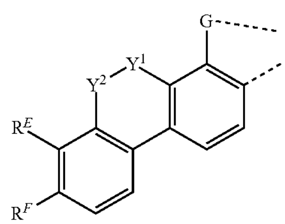 |
| $L_{A22}$-($R^1$)($R^1$)(W1)($G^{26}$) to $L_{A22}$-($R^{89}$)($R^{89}$)(W42)($G^{53}$) have the structure | 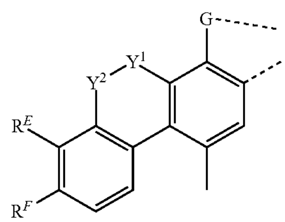 |
| $L_{A23}$-($R^1$)($R^1$)(W1)($G^{26}$) to $L_{A23}$-($R^{89}$)($R^{89}$)(W42)($G^{53}$) have the structure | 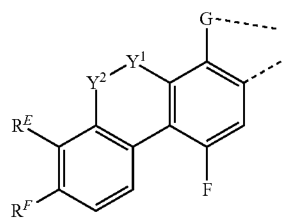 |
| $L_{A24}$-($R^1$)($R^1$)(W1)($G^{26}$) to $L_{A24}$-($R^{89}$)($R^{89}$)(W42)($G^{53}$) have the structure | 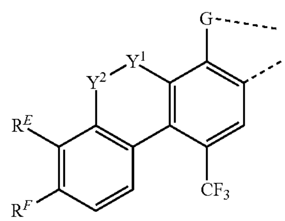 |
| $L_{A25}$-($R^1$)($R^1$)(W1)($G^{26}$) to $L_{A25}$-($R^{89}$)($R^{89}$)(W42)($G^{53}$) have the structure | 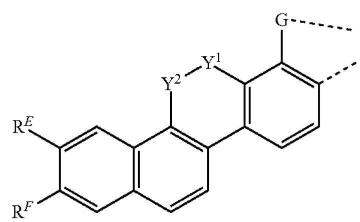 |

-continued
| $L_A$ | Structure of $L_A$ |
|---|---|
| $L_{A26}$-($R^1$)($R^1$)(W1)($G^{26}$) to $L_{A26}$-($R^{89}$)($R^{89}$)(W42)($G^{53}$) have the structure | 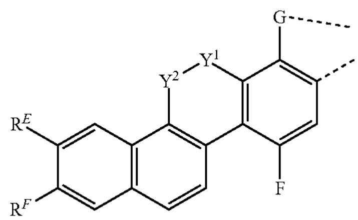 |
| $L_{A27}$-($R^1$)($R^1$)(W1)($G^{26}$) to $L_{A27}$-($R^{89}$)($R^{89}$)(W42)($G^{53}$) have the structure | 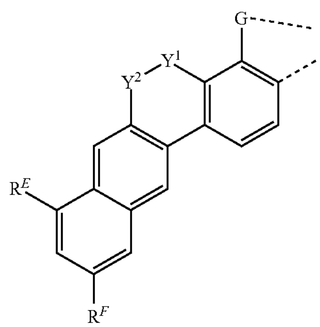 |
| $L_{A28}$-($R^1$)($R^1$)(W1)($G^{26}$) to $L_{A28}$-($R^{89}$)($R^{89}$)(W42)($G^{53}$) have the structure | 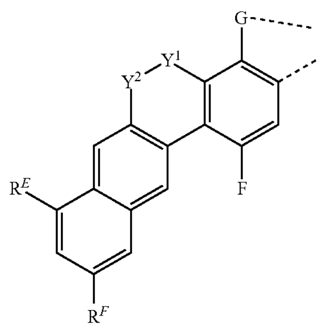 |
| $L_{A29}$-($R^1$)($R^1$)(W1)($G^{26}$) to $L_{A29}$-($R^{89}$)($R^{89}$)(W42)($G^{53}$) have the structure | 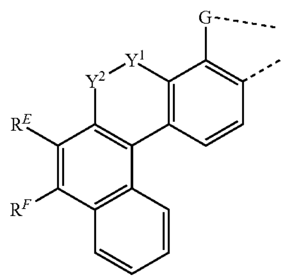 |
| $L_{A30}$-($R^1$)($R^1$)(W1)($G^{26}$) to $L_{A30}$-($R^{89}$)($R^{89}$)(W42)($G^{53}$) have the structure | 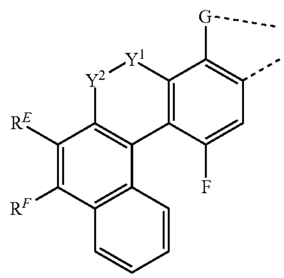 |

-continued
| $L_A$ | Structure of $L_A$ |
| --- | --- |
| $L_{A431}$-($R^1$)($R^1$)(W1)($G^1$) to $L_{A431}$-($R^{89}$)($R^{89}$)(W42)($G^{25}$) have the structure | 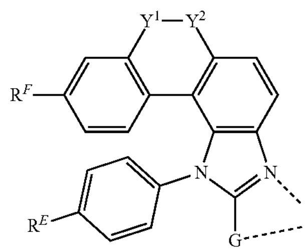 |
| $L_{A432}$-($R^1$)($R^1$)(W1)($G^1$) to $L_{A432}$-($R^{89}$)($R^{89}$)(W42)($G^{25}$) have the structure | 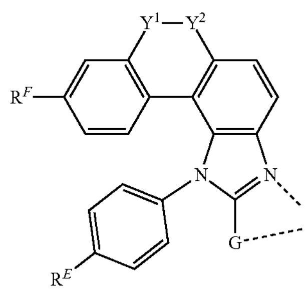 |
| $L_{A433}$-($R^1$)($R^1$)(W1)($G^1$) to $L_{A433}$-($R^{89}$)($R^{89}$)(W42)($G^{25}$) have the structure | 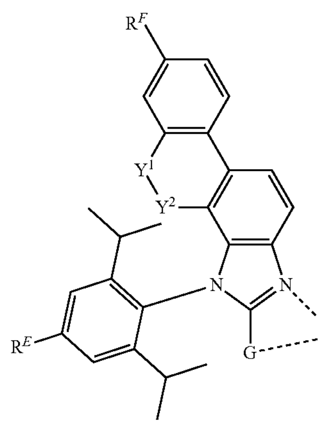 |
| $L_{A434}$-($R^1$)($R^1$)(W1)($G^1$) to $L_{A434}$-($R^{89}$)($R^{89}$)(W42)($G^{25}$) have the structure | 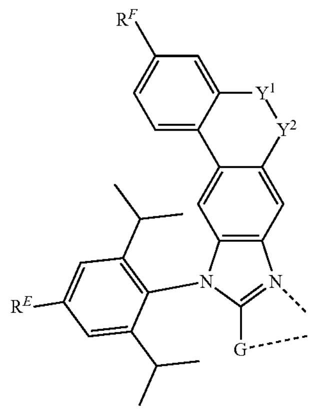 |

-continued
| $L_A$ | Structure of $L_A$ |
|---|---|
| $L_{A435}$-($R^1$)($R^1$)(W1)($G^1$) to $L_{A435}$-($R^{89}$)($R^{89}$)(W42)($G^{25}$) have the structure | 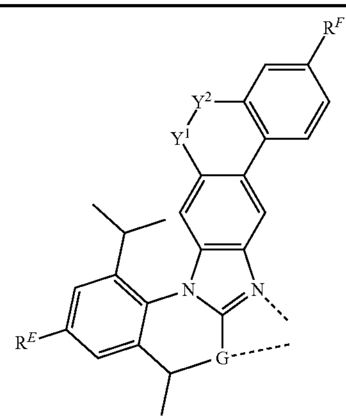 |
| $L_{A436}$-($R^1$)($R^1$)(W1)($G^1$) to $L_{A436}$-($R^{89}$)($R^{89}$)(W42)($G^{25}$) have the structure | 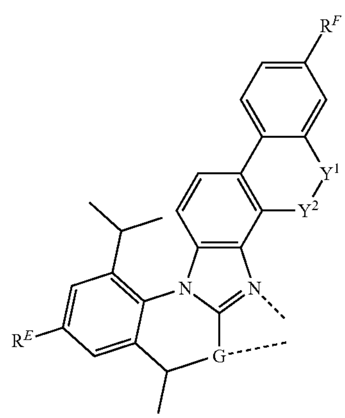 |
| $L_{A437}$-($R^1$)($R^1$)(W1)($G^1$) to $L_{A437}$-($R^{89}$)($R^{89}$)(W42)($G^{25}$) have the structure | 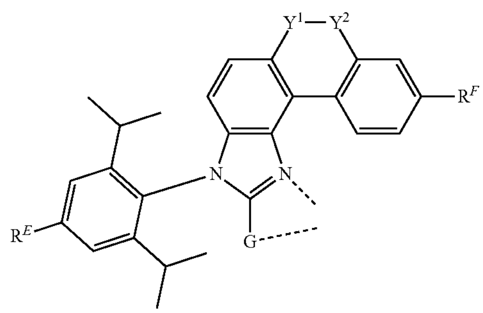 |
| $L_{A438}$-($R^1$)($R^1$)(W1)($G^1$) to $L_{A438}$-($R^{89}$)($R^{89}$)(W42)($G^{25}$) have the structure | 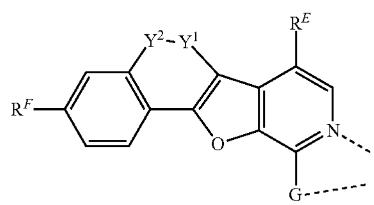 |
| $L_{A439}$-($R^1$)($R^1$)(W1)($G^{26}$) to $L_{A439}$-($R^{89}$)($R^{89}$)(W42)($G^{53}$) have the structure | 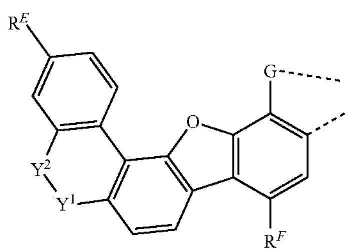 |

-continued

| $L_A$ | Structure of $L_A$ |
|---|---|
| $L_{A40}$-($R^1$)($R^1$)(W1)($G^{26}$) to $L_{A40}$-($R^{89}$)($R^{89}$)(W42)($G^{53}$) have the structure | 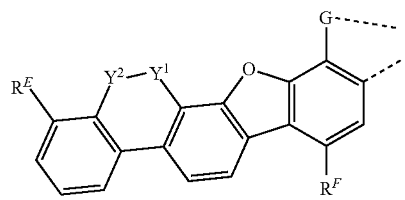 |
| $L_{A41}$-($R^1$)($R^1$)(W1)($G^1$) to $L_{A41}$-($R^{89}$)($R^{89}$)(W42)($G^{25}$) have the structure | 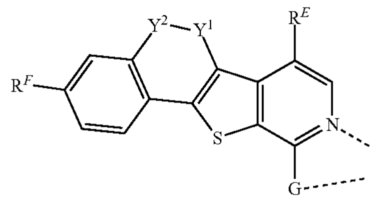 |
| $L_{A42}$-($R^1$)($R^1$)(W1)($G^1$) to $L_{A42}$-($R^{89}$)($R^{89}$)(W42)($G^{25}$) have the structure | 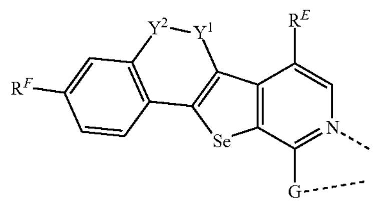 |
| $L_{A43}$-($R^1$)($R^1$)(W1)($G^1$) to $L_{A43}$-($R^{89}$)($R^{89}$)(W42)($G^{25}$) have the structure | 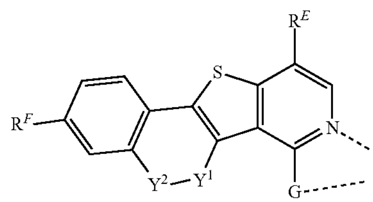 |
| $L_{A44}$-($R^1$)($R^1$)(W1)($G^1$) to $L_{A44}$-($R^{89}$)($R^{89}$)(W42)($G^{25}$) have the structure | 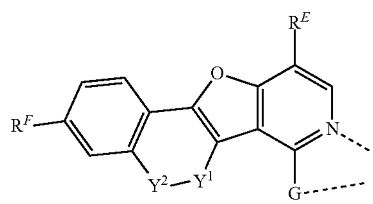 |
| $L_{A45}$-($R^1$)($R^1$)(W1)($G^1$) to $L_{A45}$-($R^{89}$)($R^{89}$)(W42)($G^{25}$) have the structure | 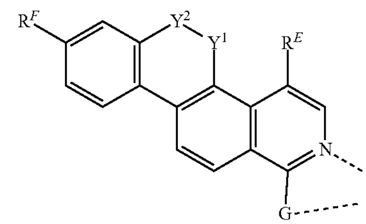 |
| $L_{A46}$-($R^1$)($R^1$)(W1)($G^1$) to $L_{A46}$-($R^{89}$)($R^{89}$)(W42)($G^{25}$) have the structure | 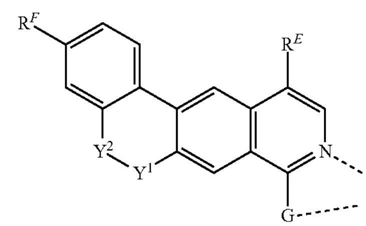 |

-continued
| $L_A$ | Structure of $L_A$ |
|---|---|
| $L_{A47}$-($R^1$)($R^1$)(W1)($G^{26}$) to $L_{A47}$-($R^{89}$)($R^{89}$)(W42)($G^{53}$) have the structure | 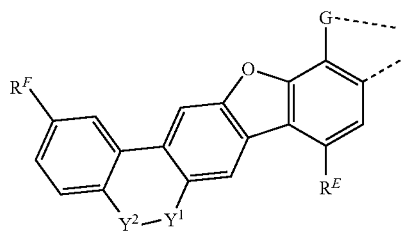 |
| $L_{A48}$-($R^1$)($R^1$)(W1)($G^{26}$) to $L_{A48}$-($R^{89}$)($R^{89}$)(W42)($G^{53}$) have the structure | 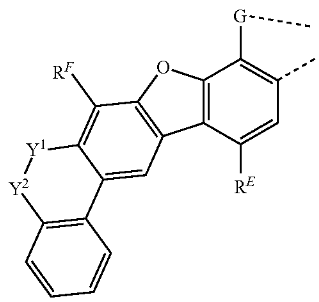 |
| $L_{A49}$-($R^1$)($R^1$)(W1)($G^{26}$) to $L_{A49}$-($R^{89}$)($R^{89}$)(W42)($G^{53}$) have the structure | 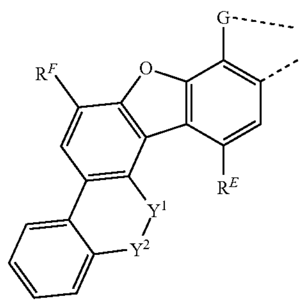 |
| $L_{A05}$-($R^1$)($R^1$)(W1)($G^{26}$) to $L_{A50}$-($R^{89}$)($R^{89}$)(W42)($G^{53}$) have the structure | 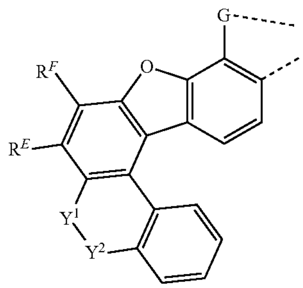 |
| $L_{A51}$-($R^1$)($R^1$)(W1)($G^{26}$) to $L_{A51}$-($R^{89}$)($R^{89}$)(W42)($G^{53}$) have the structure | 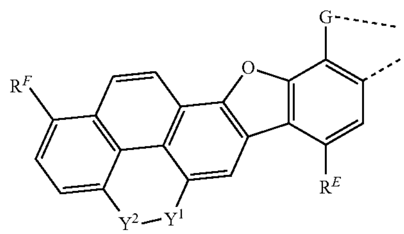 |

-continued

| $L_A$ | Structure of $L_A$ |
| --- | --- |
| $L_{A52}$-($R^1$)($R^1$)(W1)($G^{26}$) to $L_{A52}$-($R^{89}$)($R^{89}$)(W42)($G^{53}$) have the structure | 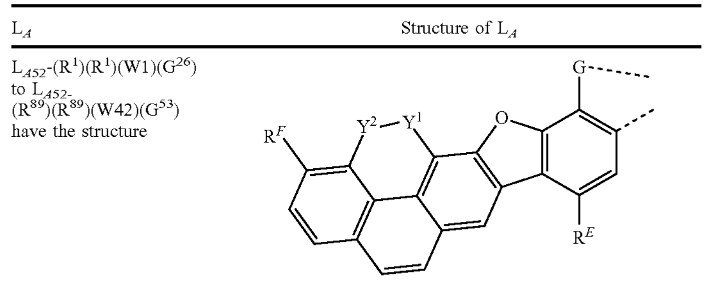 |

wherein, each of W1 to W42 representing $Y^1$ and $Y^2$, is defined in the following LIST:

| W1 | W2 | W3 | W4 | W5 | W6 |
| --- | --- | --- | --- | --- | --- |
| $Y^1 = Ge(CH_3)_2$; $Y^2 = N(CH_3)_2$ | $Y^1 = O$; $Y^2 = Si(CH_3)_2$ | $Y^1 = O$; $Y^2 = Ge(CH_3)_2$ | $Y^1 = S$; $Y^2 = C(CH_3)_2$ | $Y^1 = S$; $Y^2 = Si(CH_3)_2$ | $Y^1 = S$; $Y^2 = Ge(CH_3)_2$ |
| W7 | W8 | W9 | W10 | W11 | W12 |
| $Y^1 = N(CH_3)$; $Y^2 = C(CH_3)_2$ | $Y^1 = N(CH_3)$; $Y^2 = Si(CH_3)_2$ | $Y^1 = N(CH_3)$; $Y^2 = Ge(CH_3)_2$ | $Y^1 = Se$; $Y^2 = C(CH_3)_2$ | $Y^1 = Se$; $Y^2 = Si(CH_3)_2$ | $Y^1 = Se$; $Y^2 = Ge(CH_3)_2$ |
| W13 | W14 | W15 | W16 | W17 | W18 |
| $Y^1 = C(CH_3)_2$; $Y^2 = C(CH_3)_2$ | $Y^1 = C(CH_3)_2$; $Y^2 = Si(CH_3)_2$ | $Y^1 = C(CH_3)_2$; $Y^2 = Ge(CH_3)_2$ | $Y^1 = Si(CH_3)_2$; $Y^2 = C(CH_3)_2$ | $Y^1 = Si(CH_3)_2$; $Y^2 = Si(CH_3)_2$ | $Y^1 = Si(CH_3)_2$; $Y^2 = Ge(CH_3)_2$ |
| W19 | W20 | W21 | W22 | W23 | W24 |
| $Y^1 = C(CH_3)_2$; $Y^2 = O$ | $Y^1 = C(CH_3)_2$; $Y^2 = S$ | $Y^1 = C(CH_3)_2$; $Y^2 = Se$ | $Y^1 = Si(CH_3)_2$; $Y^2 = O$ | $Y^1 = Si(CH_3)_2$; $Y^2 = S$ | $Y^1 = Si(CH_3)_2$; $Y^2 = Se$ |
| W25 | W26 | W27 | W28 | W29 | W30 |
| $Y^1 = Ge(CH_3)_2$; $Y^2 = O$ | $Y^1 = Ge(CH_3)_2$; $Y^2 = S$ | $Y^1 = Ge(CH_3)_2$; $Y^2 = Se$ | $Y^1 = C(CH_3)_2$; $Y^2 = N(CH_3)_2$ | $Y^1 = Si(CH_3)_2$; $Y^2 = N(CH_3)_2$ | $Y^1 = O$; $Y^2 = C(CH_3)_2$ |
| W31 | W32 | W33 | W34 | W35 | W36 |
| $Y^1 = CH_2$; $Y^2 = CF_2$ | $Y^1 = CMe_2$; $Y^2 = CF_2$ | $Y^1 = CH_2$; $Y^2 = CHF$ | $Y^1 = CMe_2$; $Y^2 = CHF$ | $Y^1 = CHF$; $Y^2 = CH_2$ | $Y^1 = CHF$; $Y^2 = CMe_2$ |
| W37 | W38 | W39 | W40 | W41 | W42 |
| $Y^1 = CF_2$; $Y^2 = CHF$ | $Y^1 = CHF$; $Y^2 = CHF$ | $Y^1 = CF_2$; $Y^2 = CF_2$ | $Y^1 = CF_2$; $Y^2 = CH_2$ | $Y^1 = CF_2$; $Y^2 = CMe_2$ | $Y^1 = C(CF_3)_2$; $Y^2 = CH_2$ |

wherein $R^1$ to $R^{89}$ have the structures in the following LIST:

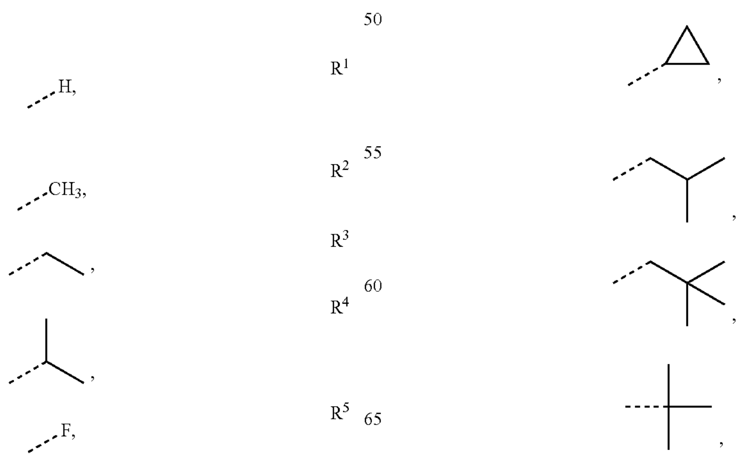

$R^1$ $R^2$ $R^3$ $R^4$ $R^5$

-continued $R^6$ $R^7$ $R^8$ $R^9$

-continued
$R^{10}$
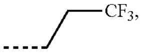
$R^{11}$
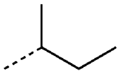,
$R^{12}$
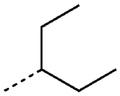,
$R^{13}$
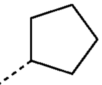,
$R^{14}$
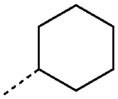,
$R^{15}$
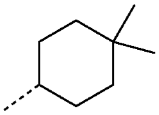,
$R^{16}$
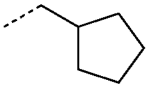,
$R^{17}$
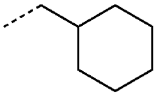,
$R^{18}$
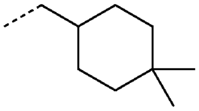,
$R^{19}$
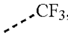
$R^{20}$
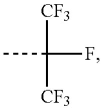
$R^{21}$
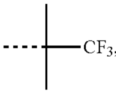
$R^{22}$
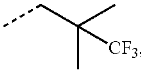
$R^{23}$
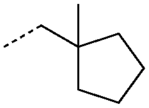,
-continued
$R^{24}$
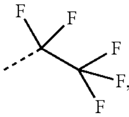
$R^{25}$
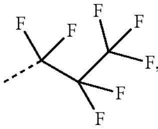
$R^{26}$
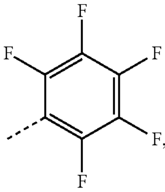
$R^{27}$
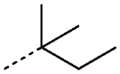,
$R^{28}$
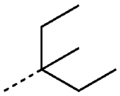,
$R^{29}$
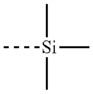,
$R^{30}$
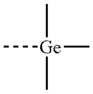,
$R^{31}$
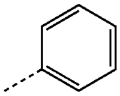,
$R^{32}$
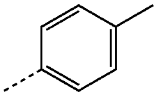,
$R^{33}$
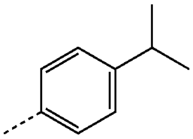,
$R^{34}$
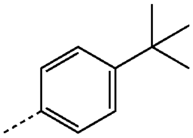,
$R^{35}$
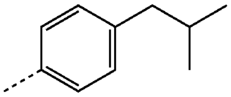, -continued
R[36]
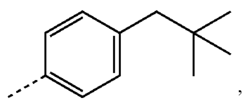
R[37]
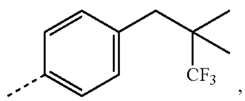
R[38]
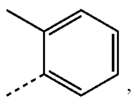
R[39]
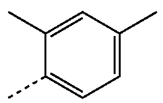
R[40]
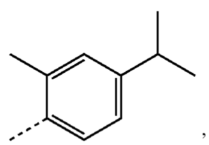
R[41]
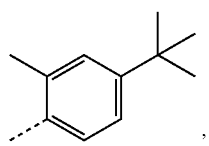
R[42]
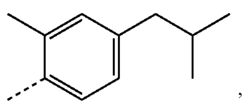
R[43]
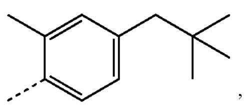
R[44]
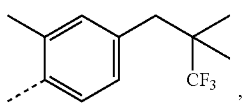
R[45]
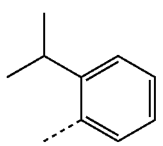
R[46]
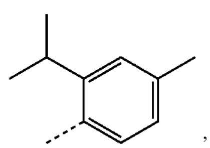
R[47]
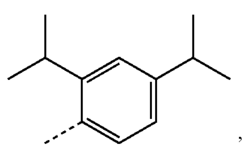
-continued
R[48]
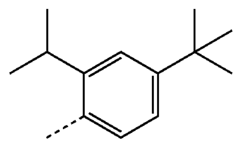
R[49]
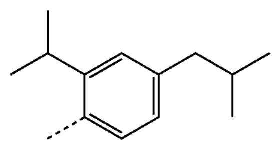
R[50]
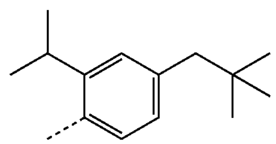
R[51]
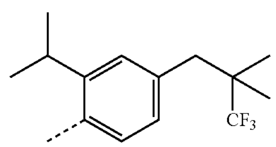
R[52]
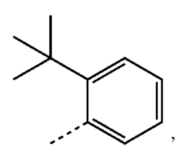
R[53]
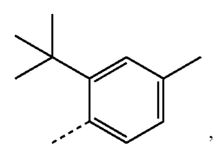
R[54]
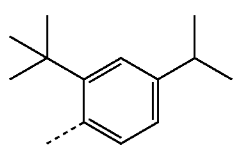
R[55]
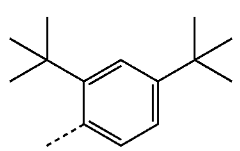
R[56]
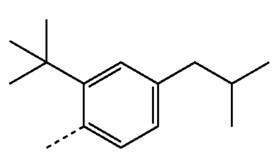
R[57]
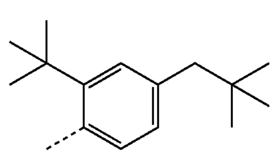

-continued
R$^{58}$
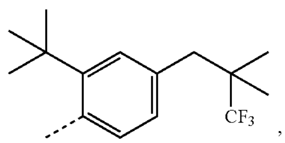
,
R$^{59}$
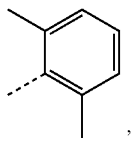
,
R$^{60}$
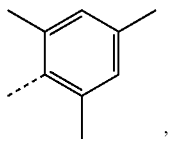
,
R$^{61}$
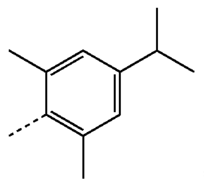
,
R$^{62}$
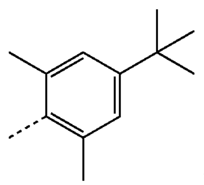
,
R$^{63}$
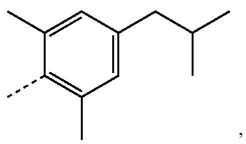
,
R$^{64}$
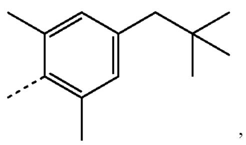
,
R$^{65}$
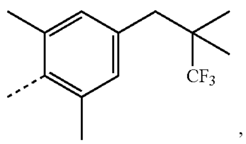
,
R$^{66}$
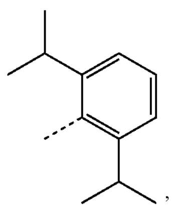
,
-continued
R$^{67}$
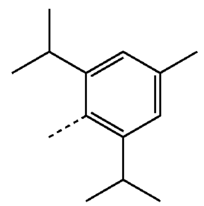
,
R$^{68}$
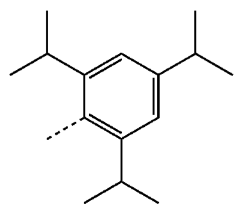
,
R$^{69}$
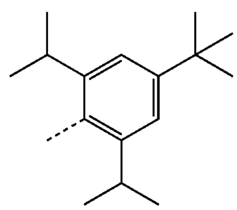
,
R$^{70}$
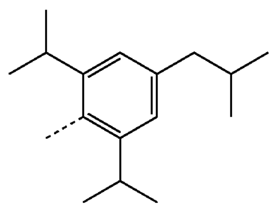
,
R$^{71}$
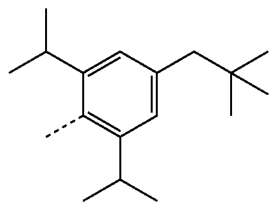
,
R$^{72}$
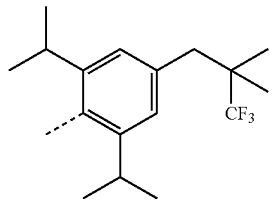
,
R$^{73}$
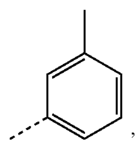
,
R$^{74}$
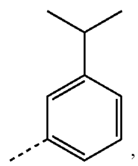
, -continued
R75
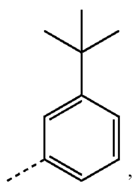
R76
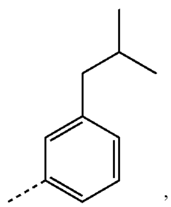
R77
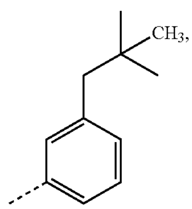
R78
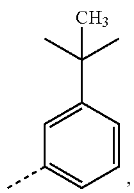
R79
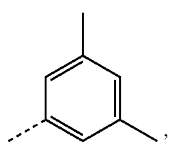
R80
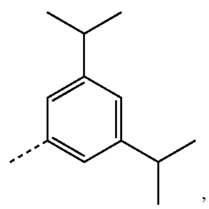
R81
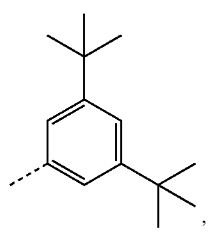
-continued
R82
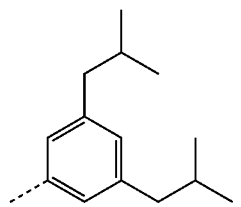
R83
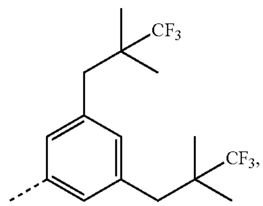
R84
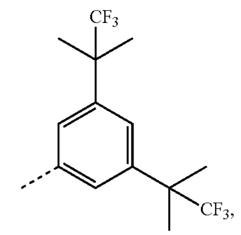
R85
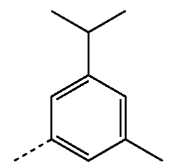
R86
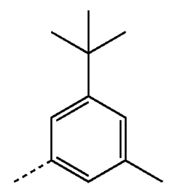
R87
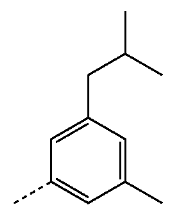
R88
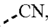
and
R89
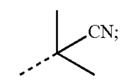
and
wherein $G^1$ to $G^{53}$ have the structures in the following LIST:

-continued
G[1]
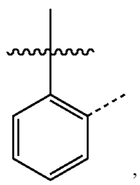
,
G[2]
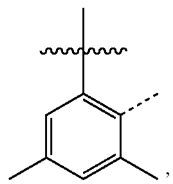
,
G[3]
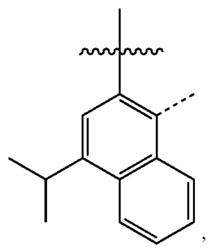
,
G[4]
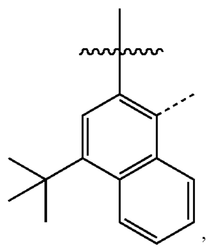
,
G[5]
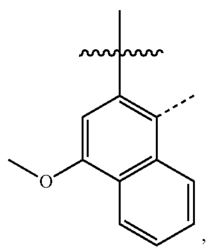
,
G[6]
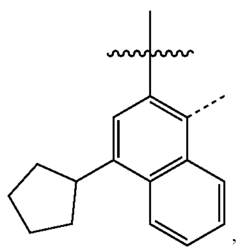
,
G[7]
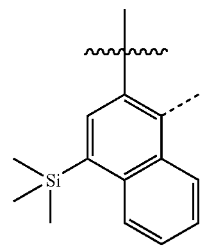
,
G[8]
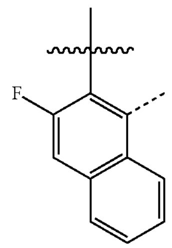
,
G[9]
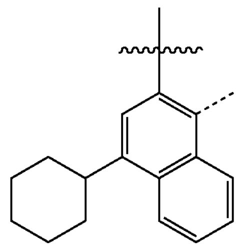
,
G[10]
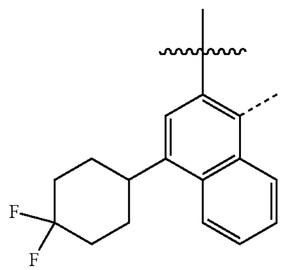
,
G[11]
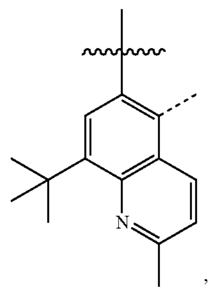
,
G[12]
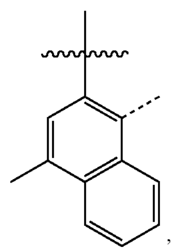
, -continued
G[13]
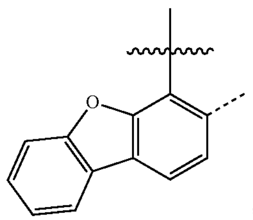
,
G[14]
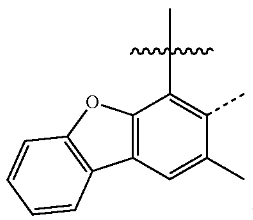
,
G[15]
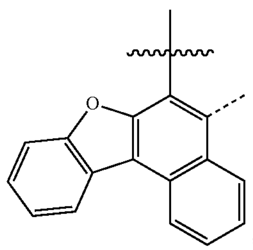
,
G[16]
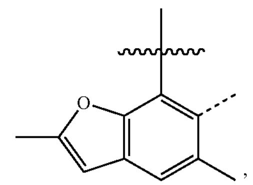
,
G[17]
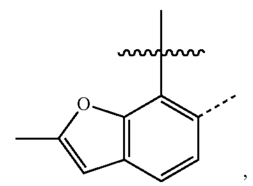
,
G[18]
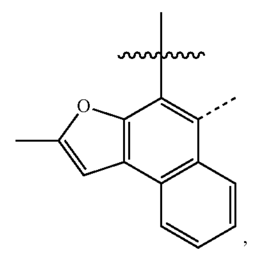
,
G[19]
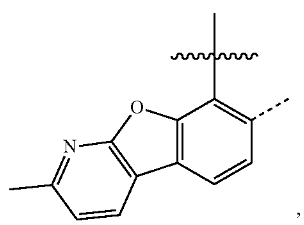
,
-continued
G[20]
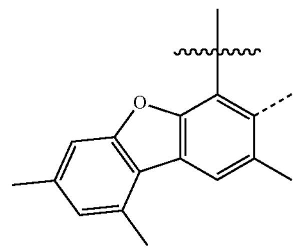
,
G[21]
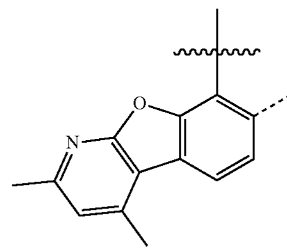
,
G[22]
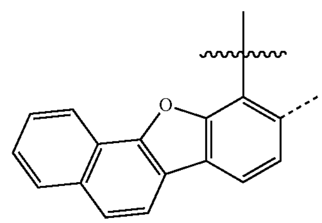
,
G[23]
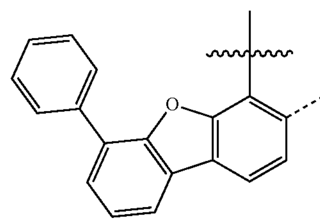
,
G[24]
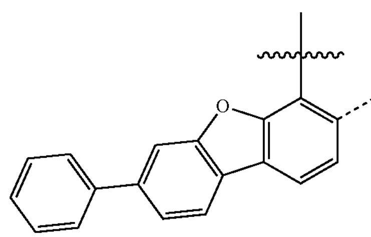
,
G[25]
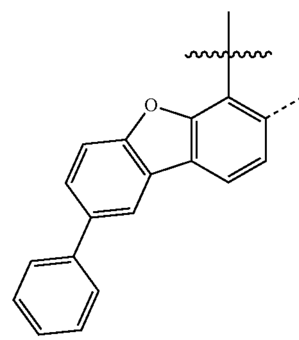
, -continued
G[26]
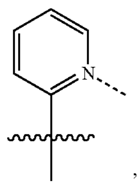
,
G[27]
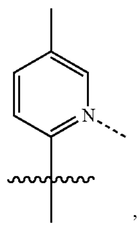
,
G[28]
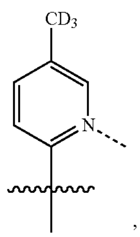
,
G[29]
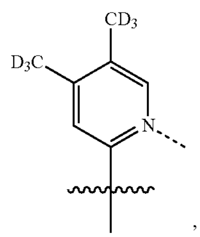
,
G[30]
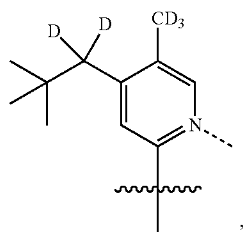
,
G[31]
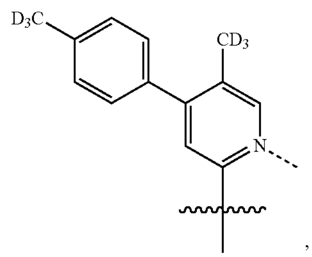
,
-continued
G[32]
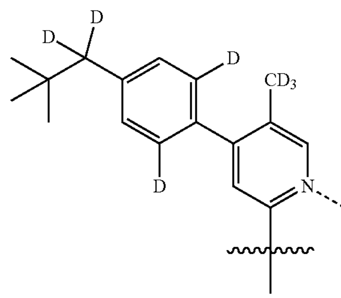
,
G[33]
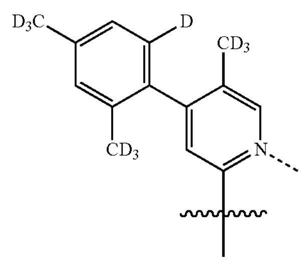
,
G[34]
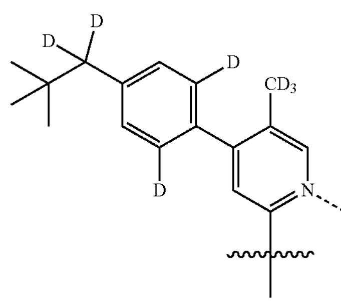
,
G[35]
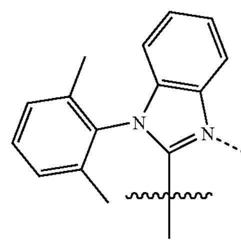
,
G[36]
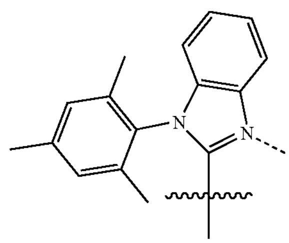
,
G[37]
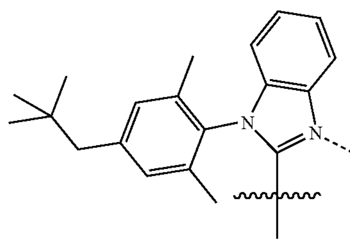
, -continued
G[38]
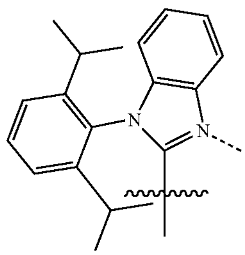
,
G[39]
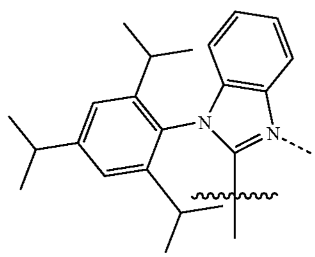
,
G[40]
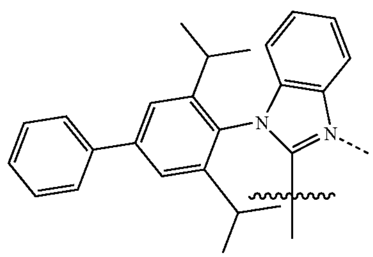
,
G[41]
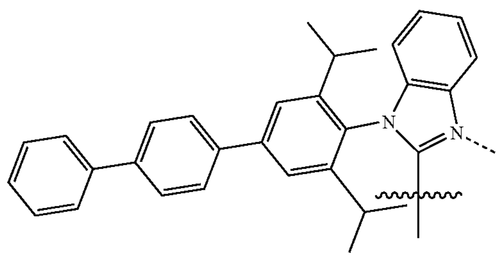
,
G[42]
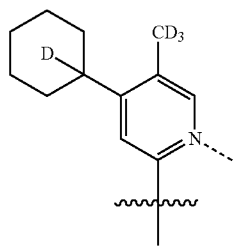
,
G[43]
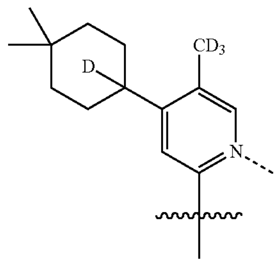
,
-continued
G[44]
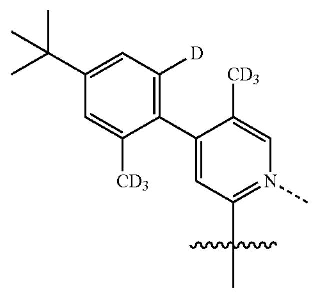
,
G[45]
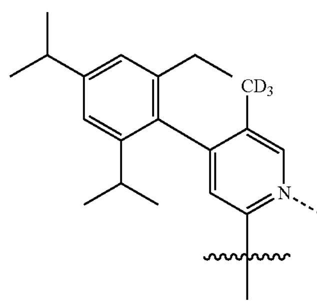
,
G[46]
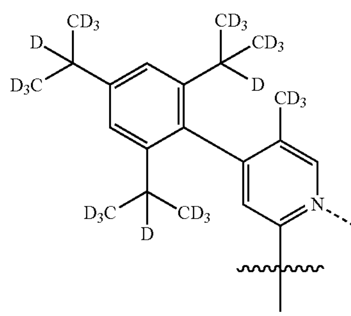
,
G[47]
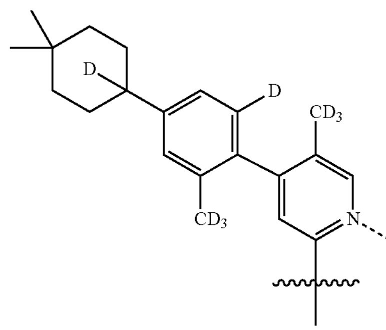
,
G[48]
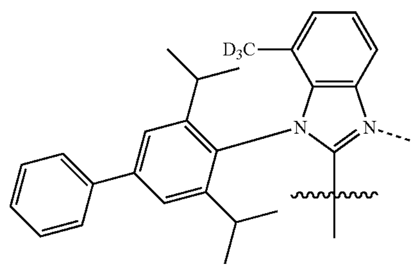
, -continued

G49

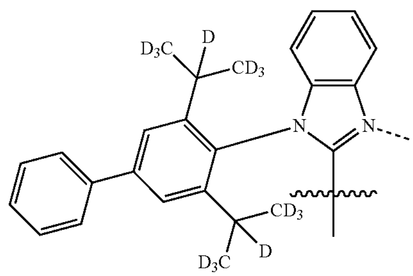

,

G50

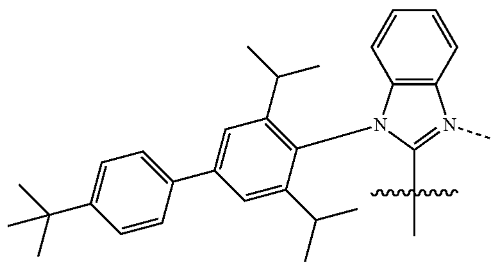

,

G51

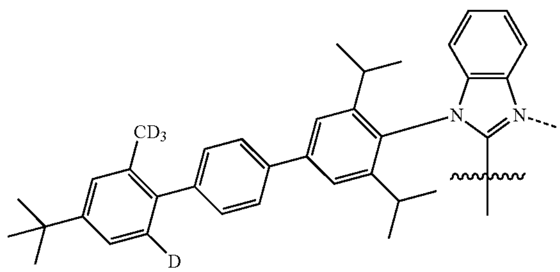

,

G52

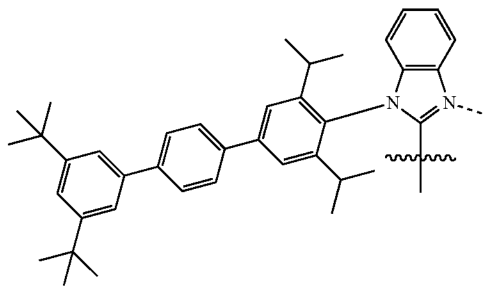

, and

G53

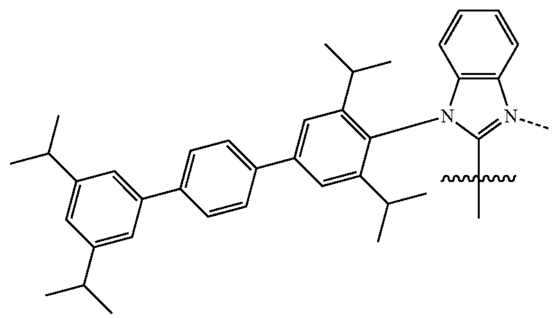

.

In some embodiments, the compound has a formula of $M(L_A)_p(L_B)_q(L_C)_r$, wherein $L_B$ and $L_C$ are each a bidentate ligand; and wherein p is 1, 2, or 3; q is 0, 1, or 2; r is 0, 1, or 2; and p+q+r is the oxidation state of the metal M.

In some embodiments, the compound has a formula selected from the group consisting of $Ir(L_A)_3$, $Ir(L_A)(L_B)_2$, $Ir(L_A)(L_B)$, $Ir(L_A)_2(L_C)$, and $Ir(L_A)(L_B)(L_C)$; and wherein $L_A$, $L_B$, and $L_C$ are different from each other.

In some embodiments, $L_B$ is a substituted or unsubstituted phenylpyridine, and $L_C$ is a substituted or unsubstituted acetylacetonate.

In some embodiments, the compound has a formula of $Pt(L_A)(L_B)$; and wherein $L_A$ and $L_B$ can be same or different.

In some embodiments, $L_A$ and $L_B$ are connected to form a tetradentate ligand.

In some embodiments, $L_B$ and $L_C$ are each independently selected from the group consisting of the following structures of LIST 4:

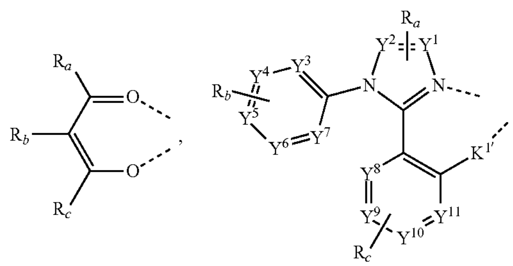

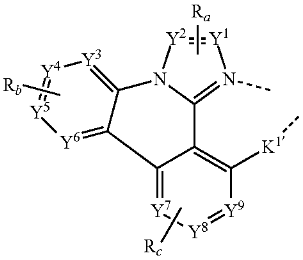

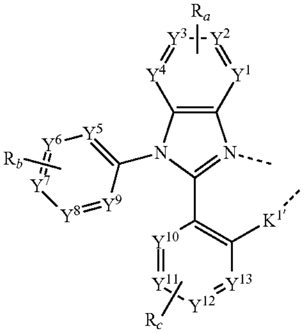

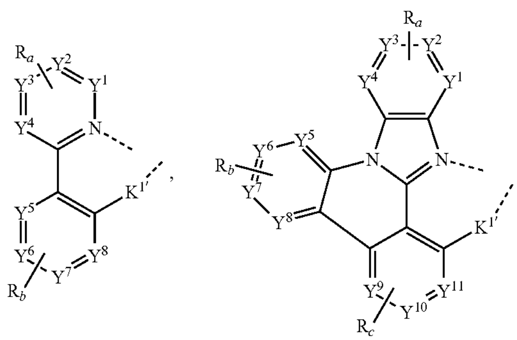

-continued
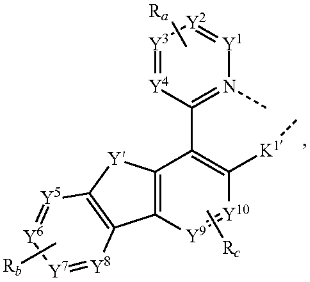
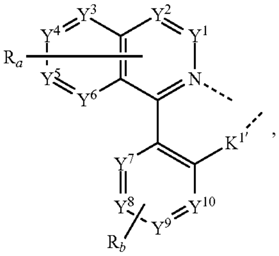
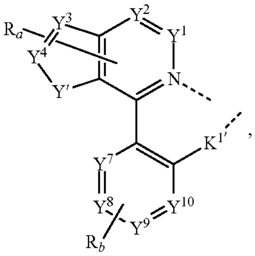
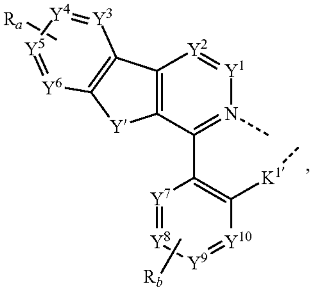
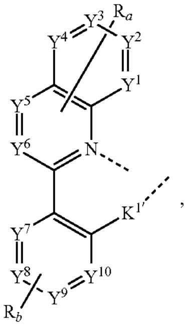
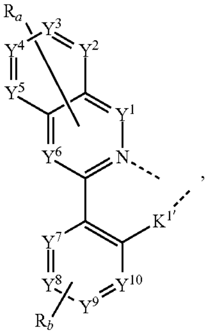
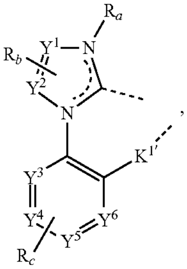
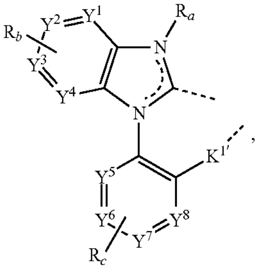
-continued
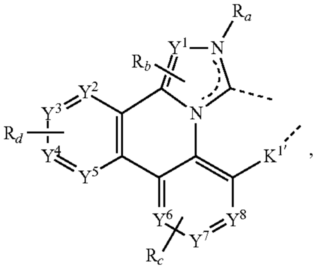
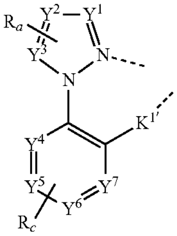
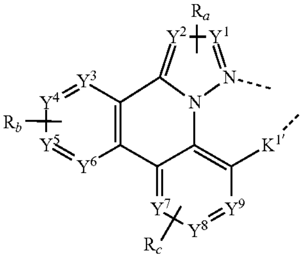
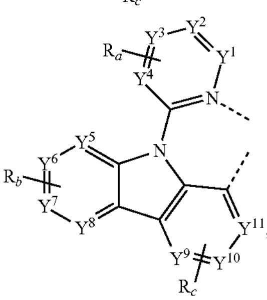
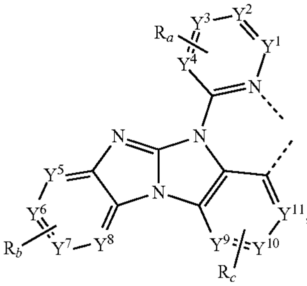
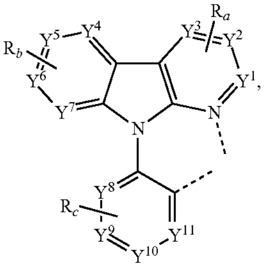
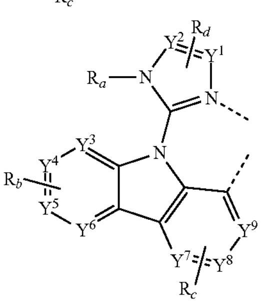
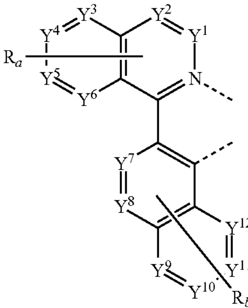
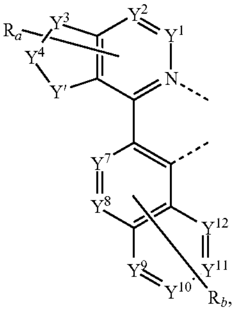

-continued

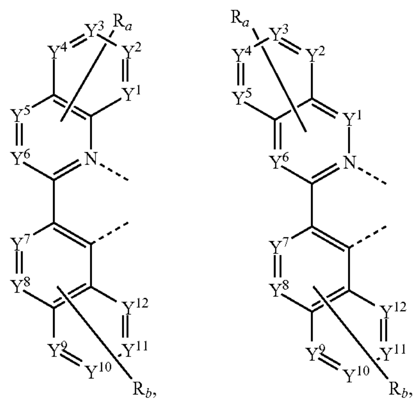

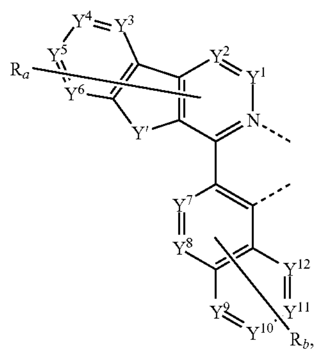

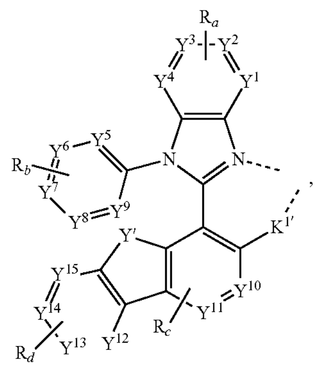

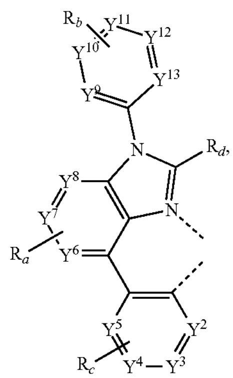

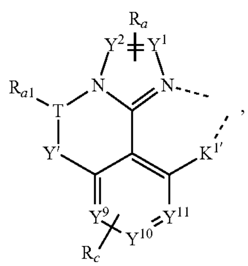

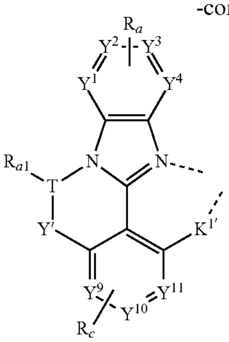

,

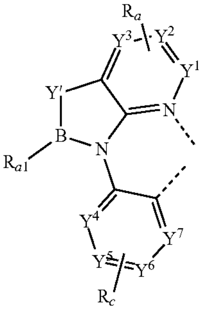

,

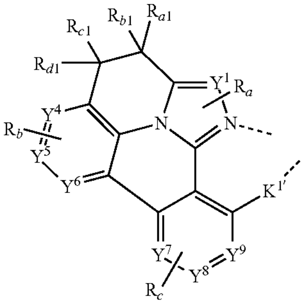

,

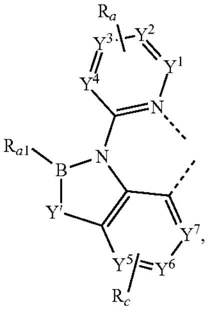

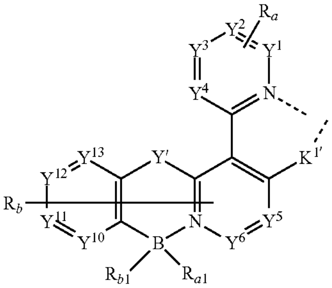

, and

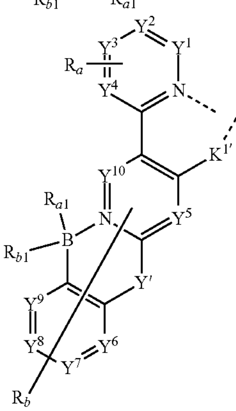

;

wherein:

T is selected from the group consisting of B, Al, Ga, and In;

wherein $K^{1'}$ is a direct bond or is selected from the group consisting of $NR_e$, $PR_e$, O, S, and Se;

each of $Y^1$ to $Y^{13}$ is independently selected from the group consisting of carbon and nitrogen;

Y' is selected from the group consisting of $BR_e$, $NR_e$, $PR_e$, O, S, Se, C═O, C═S, C═Se, S═O, $SO_2$, $P(O)R_e$, $C{=}NR_e$, $C{=}CR_eR_f$, $CR_eR_f$, $SiR_eR_f$, and $GeR_eR_f$, $R_e$ and $R_f$ can be fused or joined to form a ring, each $R_a$, $R_b$, $R_c$, and $R_d$ independently represent zero, mono, or up to a maximum allowed number of substitutions to its associated ring;

each of $R_{a1}$, $R_{b1}$, $R_{c1}$, $R_{d1}$, $R_a$, $R_b$, $R_c$, $R_d$, $R_e$ and $R_f$ is independently a hydrogen or a substituent selected from the group consisting of deuterium, halide, alkyl, cycloalkyl, heteroalkyl, arylalkyl, alkoxy, aryloxy, amino, silyl, germyl, boryl, alkenyl, cycloalkenyl, heteroalkenyl, alkynyl, aryl, heteroaryl, acyl, carbonyl, carboxylic acid, ester, nitrile, isonitrile, sulfenyl, sulfinyl, sulfonyl, phosphino, selenyl, and combinations thereof; the general substituents defined herein; and any two adjacent $R_a$, $R_b$, $R_c$, $R_d$, $R_e$ and $R_f$ can be fused or joined to form a ring or form a multidentate ligand.

In some embodiments, $L_B$ and $L_C$ are each independently selected from the group consisting of the following structures of LIST 5:

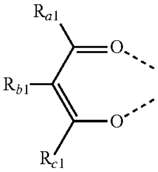,
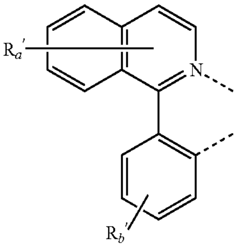,
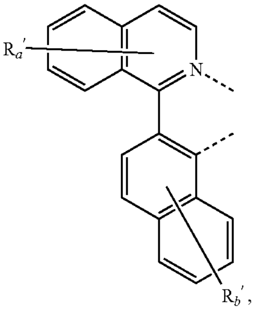,
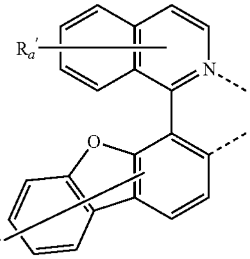,
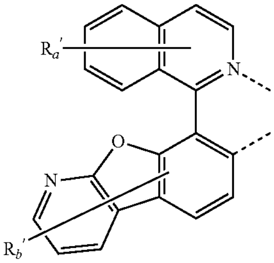,
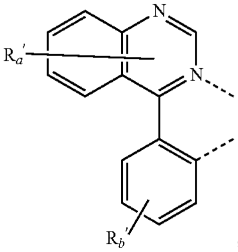,
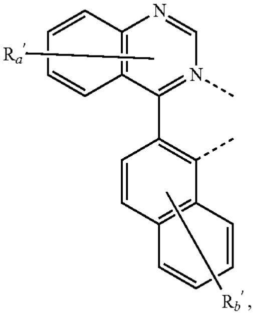,
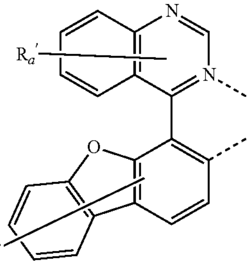, -continued

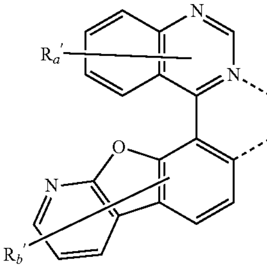,
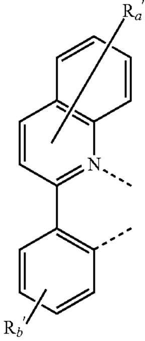,
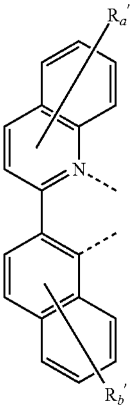,
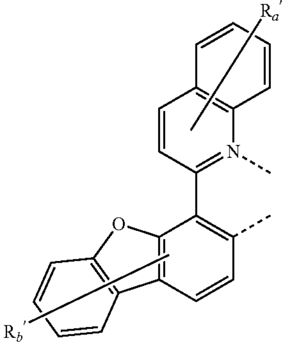,
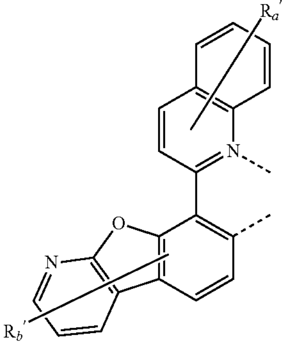,
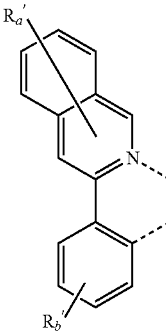,
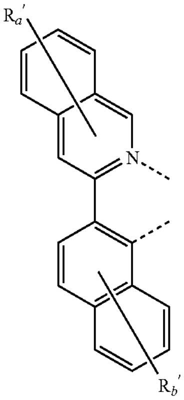,
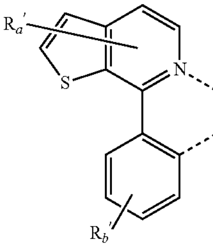, -continued
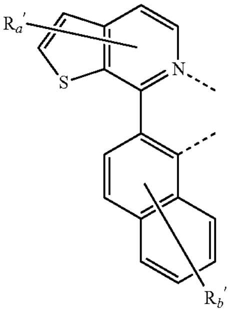
,
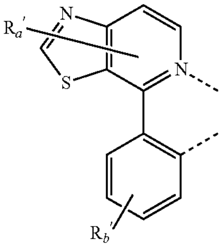
,
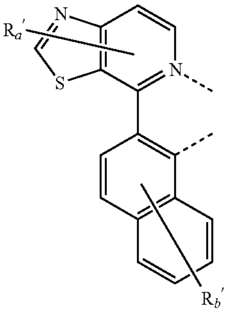
,
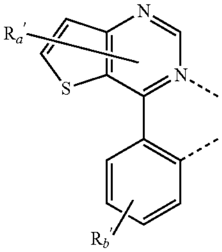
,
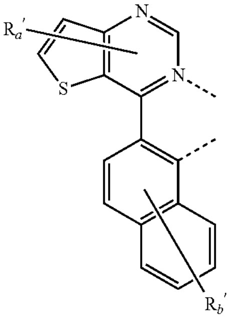
,
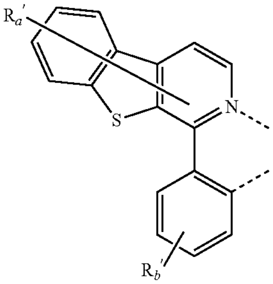
,
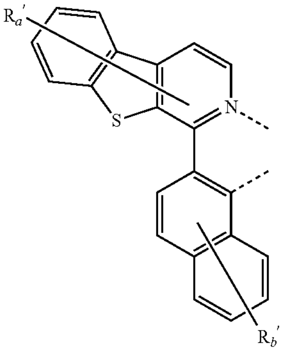
,
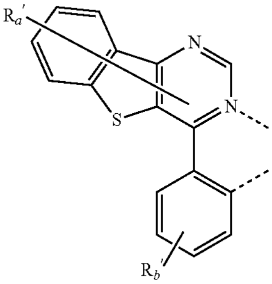
,
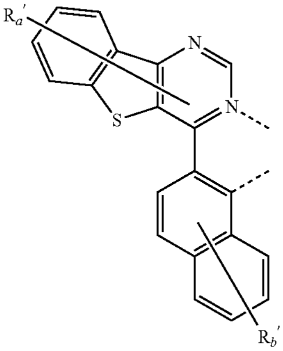
,
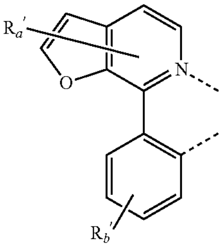
,
-continued
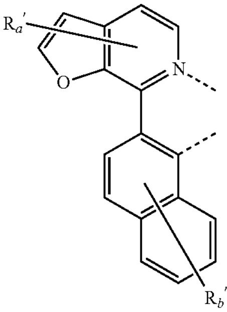
,
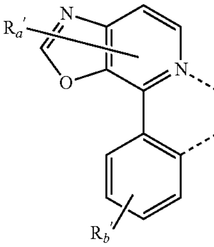
,
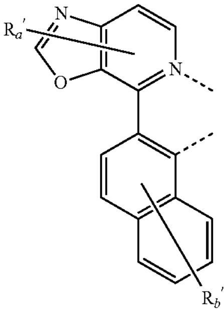
,
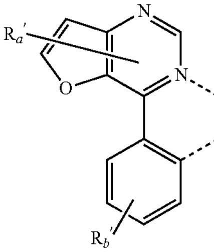
,
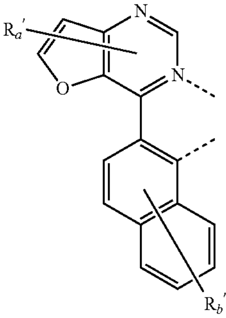
,
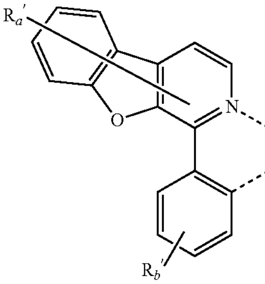
,
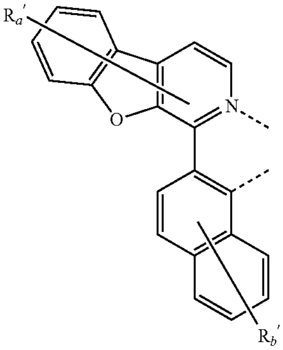
,
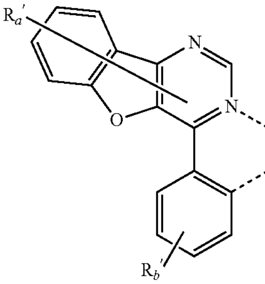
,
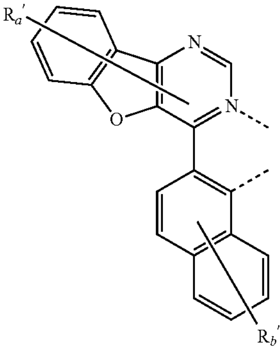
, -continued
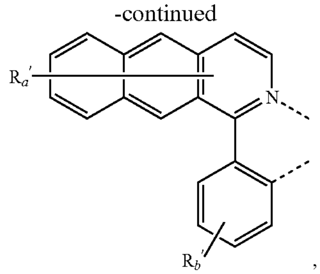
,
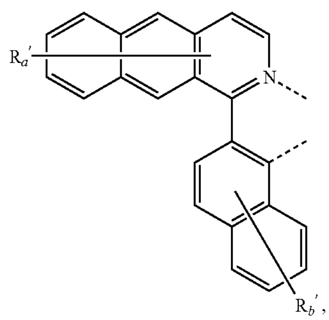
,
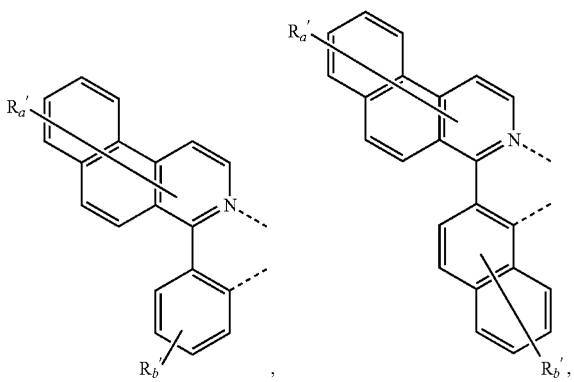
,
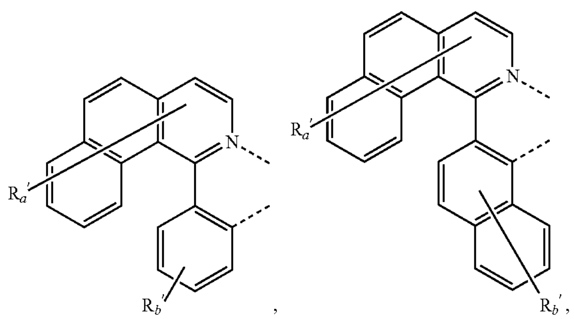
,
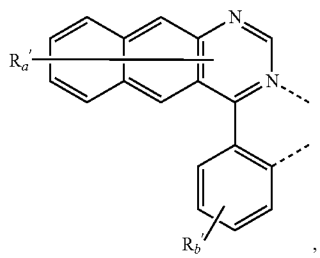
,
-continued
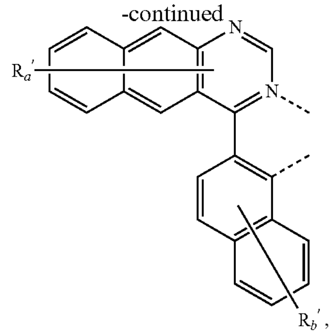
,
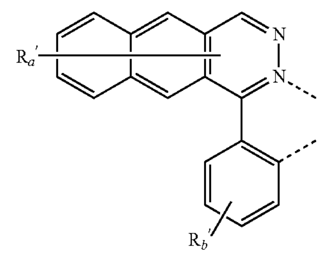
,
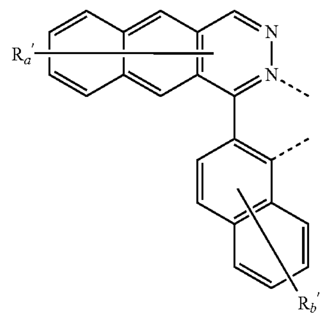
,
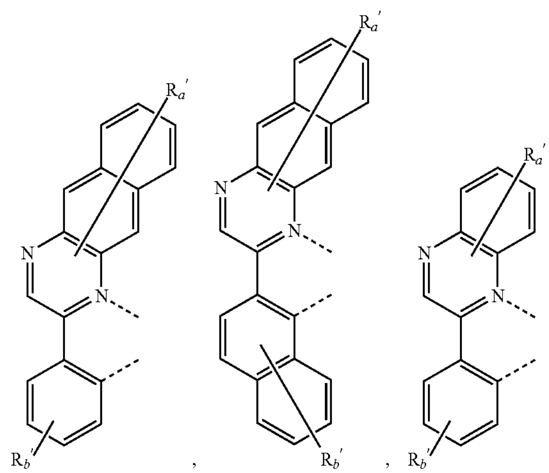
, -continued
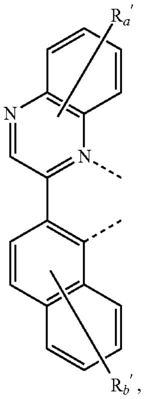,
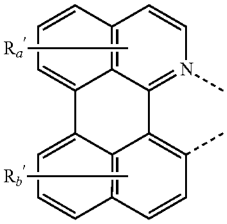,
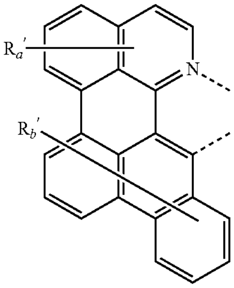,
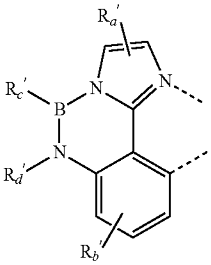,
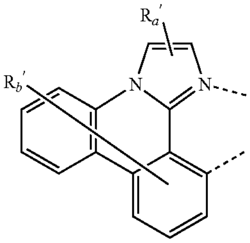,
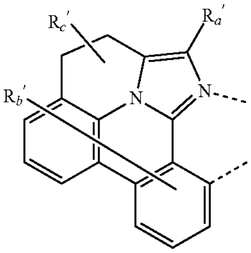,
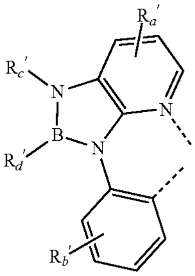,
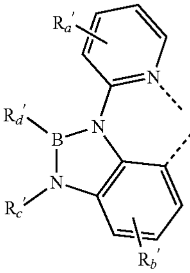,
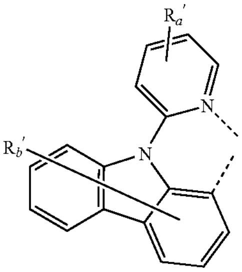,
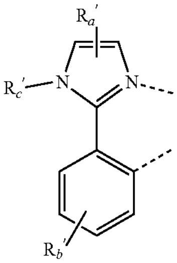,
-continued
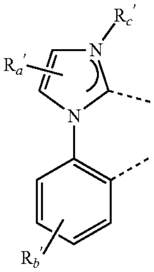,
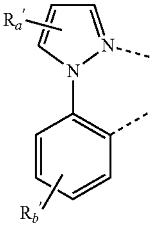,
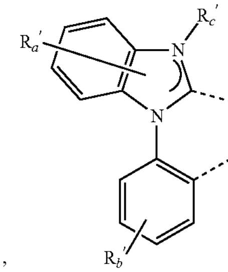,
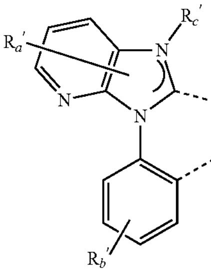,
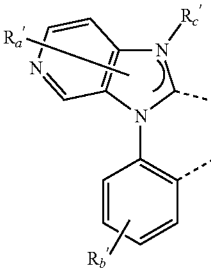,
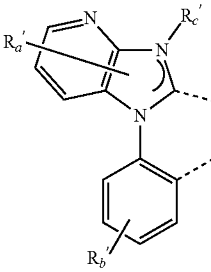,
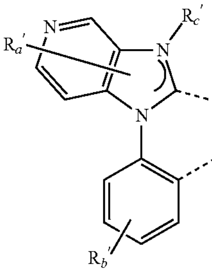,
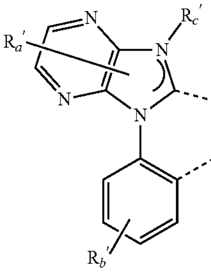,
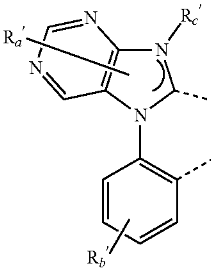,
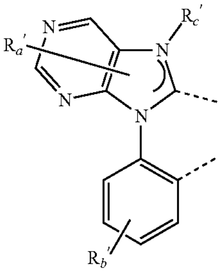,
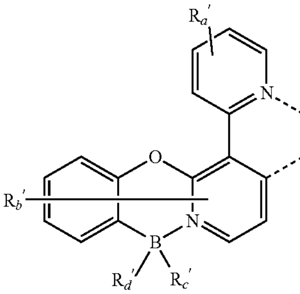, -continued
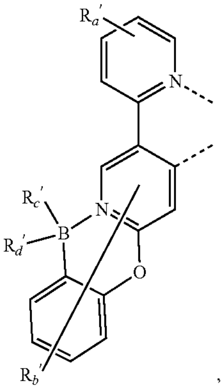,
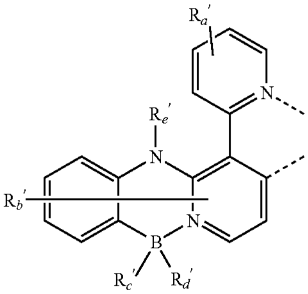,
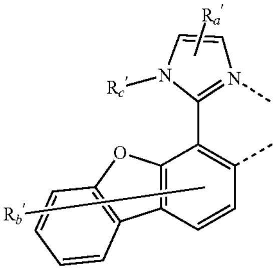,
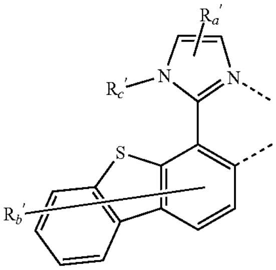,
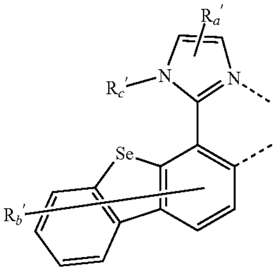,
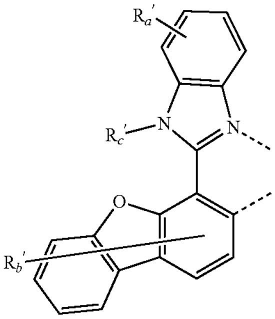,
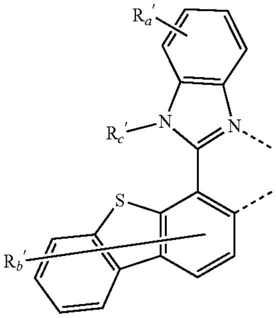,
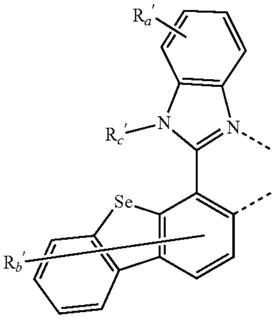,
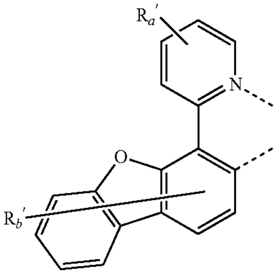,
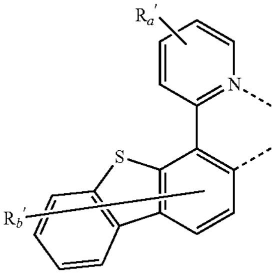,
-continued
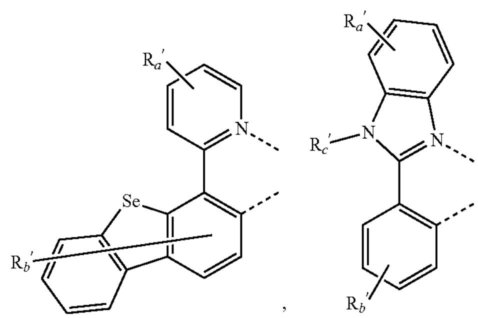
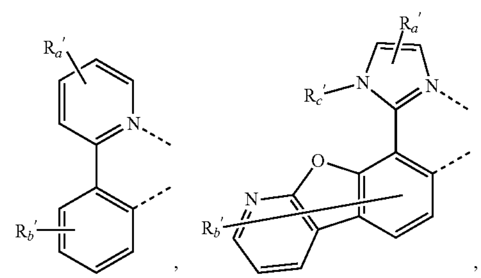
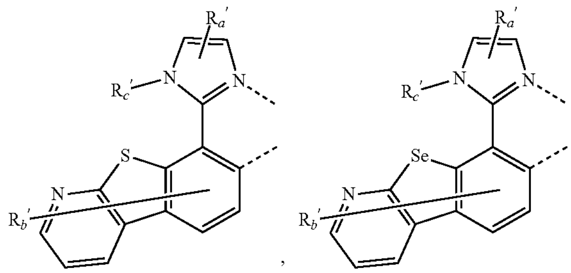
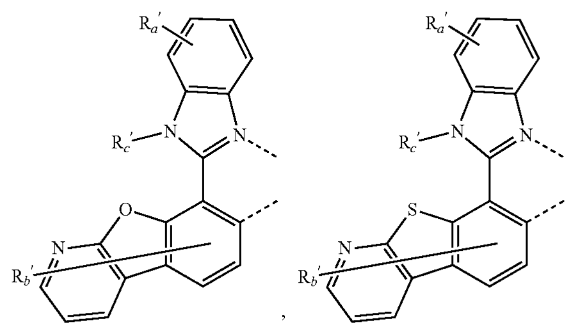
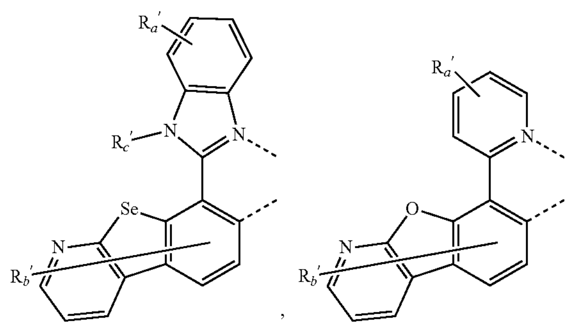

-continued
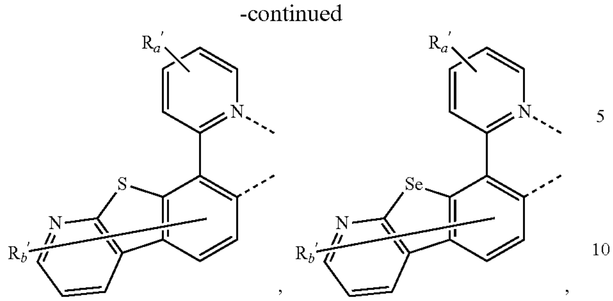
,
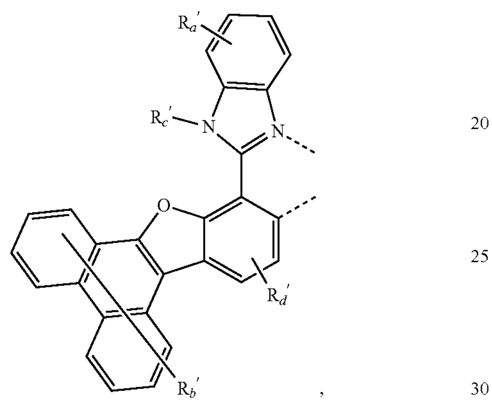
,
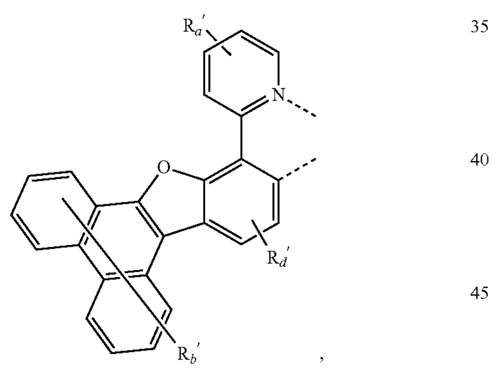
,
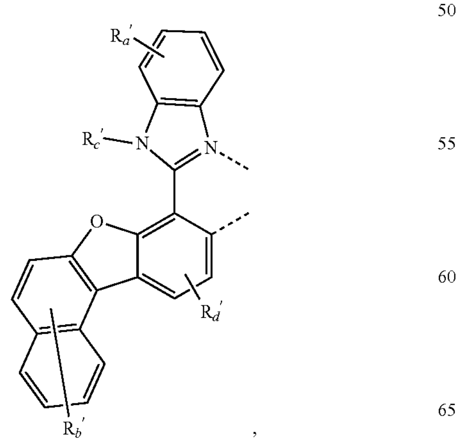
,
-continued
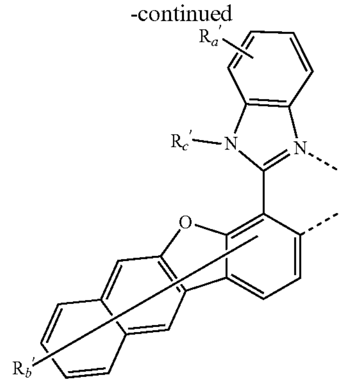
,
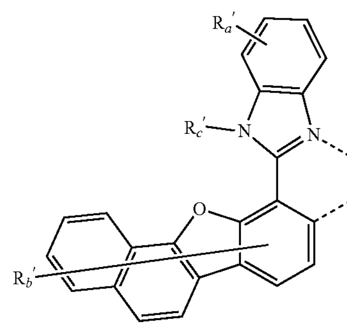
,
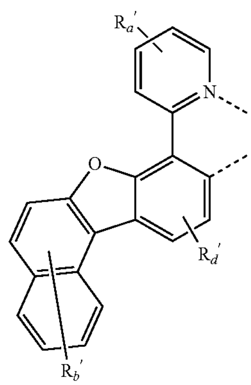
,
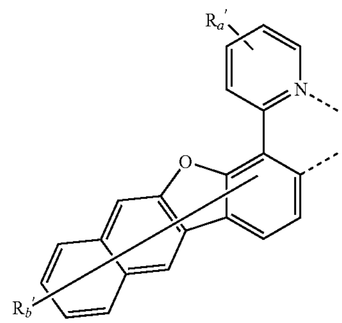
,
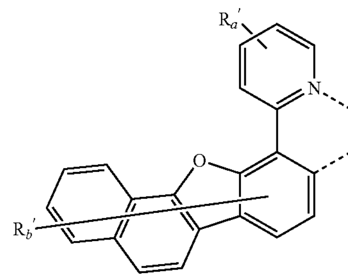
, -continued
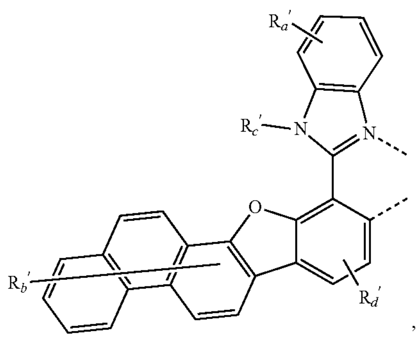
,
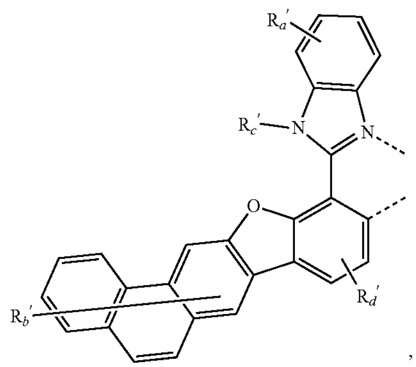
,
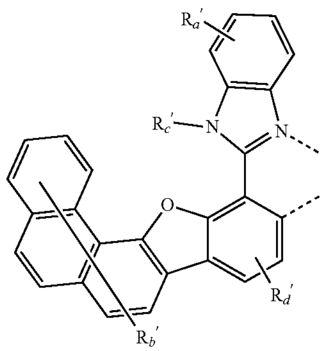
,
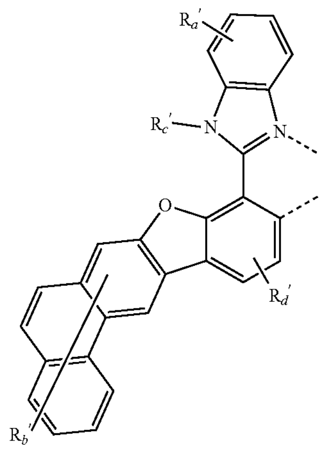
,
-continued
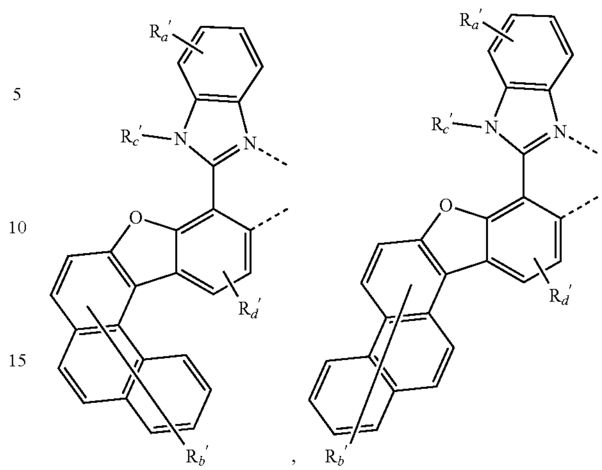
,
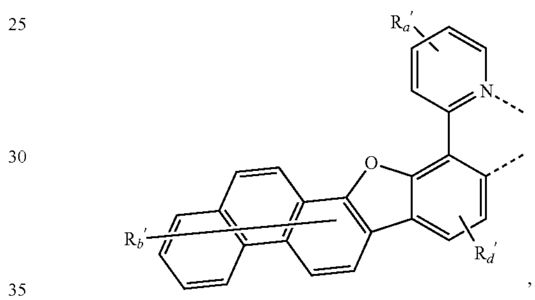
,
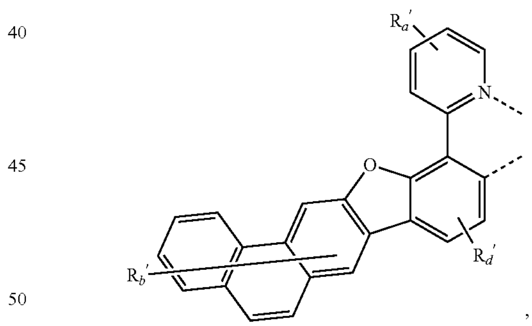
,
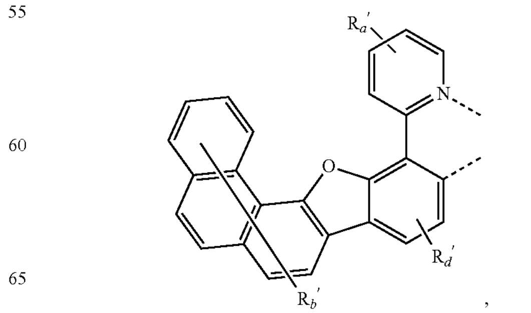
, -continued

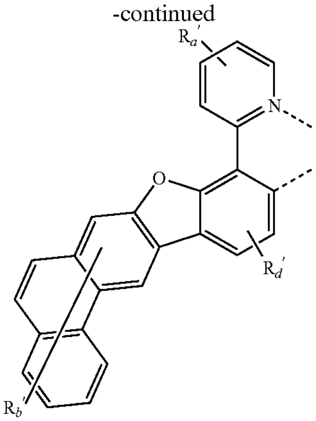

,

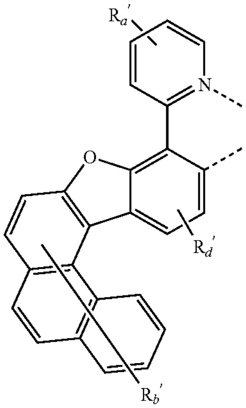

,

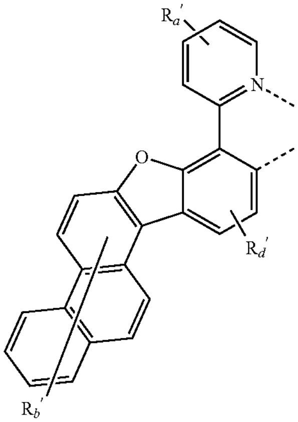

,

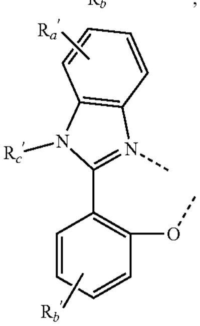

,

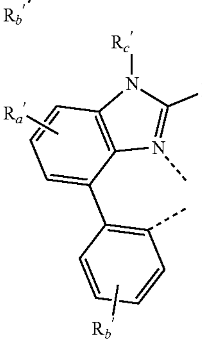

,

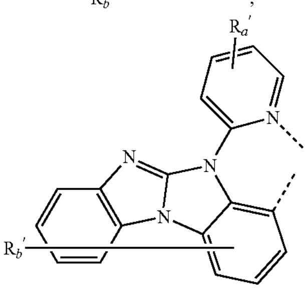

, and

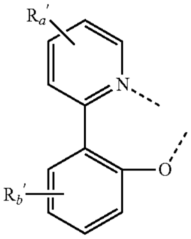

;

wherein $R_a'$, $R_b'$, $R_c'$, $R_d'$, and $R_e'$ each independently represent zero, mono, or up to a maximum allowed substitution to its associated ring;

wherein $R_a'$, $R_b'$, $R_c'$, $R_d'$, and $R_e'$ is each independently hydrogen or a substituent selected from the group consisting of deuterium, halide, alkyl, cycloalkyl, heteroalkyl, arylalkyl, alkoxy, aryloxy, amino, silyl, germyl, boryl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, selenyl, and combinations thereof; and wherein two adjacent substituents of $R_a'$, $R_b'$, $R_c'$, $R_d'$, and $R_e'$ can be fused or joined to form a ring or form a multidentate ligand.

In some embodiments, the compound has formula $Ir(L_A)_3$, formula $Ir(L_A)(L_{Bk})_2$, formula $Ir(L_A)_2(L_{Bk})$, formula $Ir(L_A)_2(L_{Cj-I})$, or, formula $Ir(L_A)_2(L_{Cj-II})$, wherein $L_A$ is as defined above;

wherein each $L_{Bk}$ has the structure defined as follows (LIST 6):

$L_{B1}$

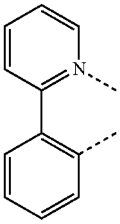

$L_{B2}$

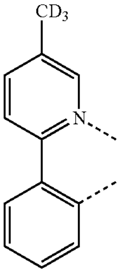

$L_{B3}$

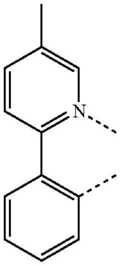

$L_{B4}$

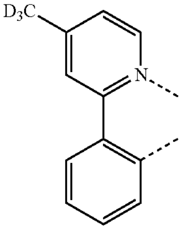

$L_{B5}$

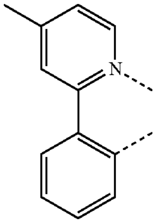

-continued
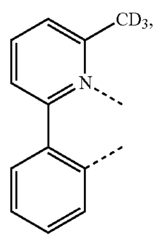
$L_{B6}$
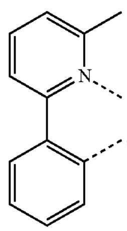
$L_{B7}$
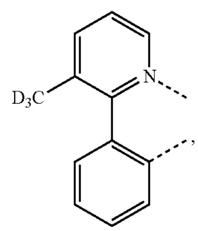
$L_{B8}$
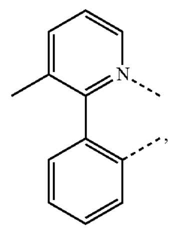
$L_{B9}$
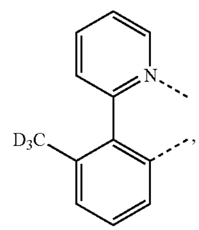
$L_{B10}$
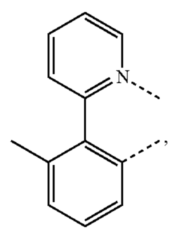
$L_{B11}$
-continued
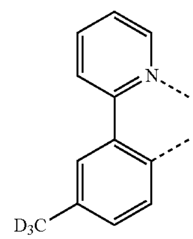
$L_{B12}$
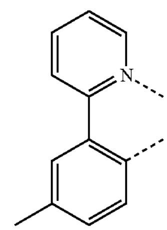
$L_{B13}$
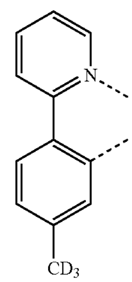
$L_{B14}$
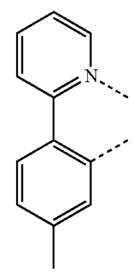
$L_{B15}$
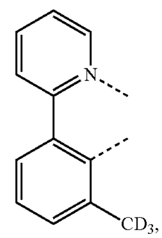
$L_{B16}$
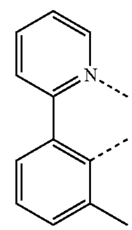
$L_{B17}$ -continued
$L_{B18}$
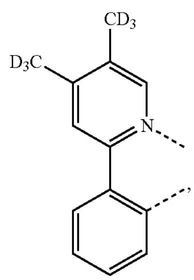
$L_{B19}$
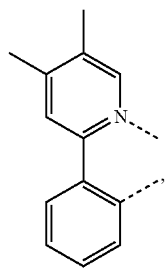
$L_{B20}$
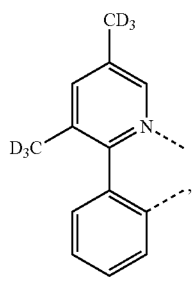
$L_{B21}$
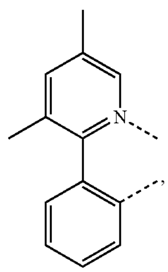
$L_{B22}$
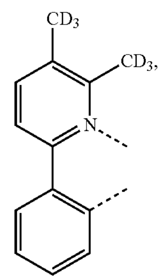
-continued
$L_{B23}$
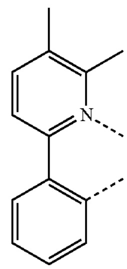
$L_{B24}$
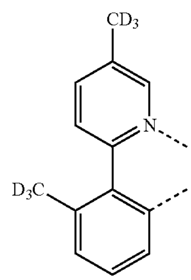
$L_{B25}$
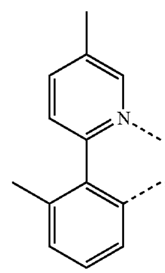
$L_{B26}$
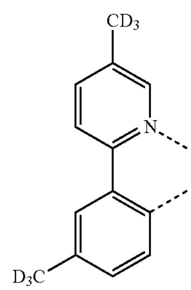
$L_{B27}$
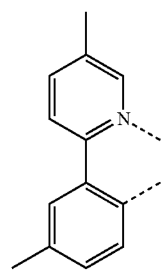

-continued
$L_{B28}$
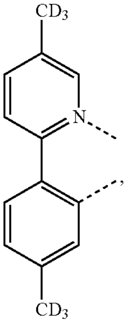
$L_{B29}$
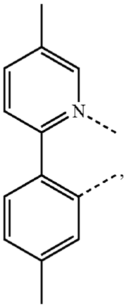
$L_{B30}$
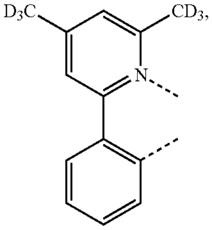
$L_{B31}$
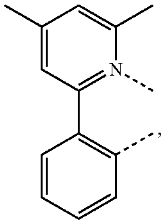
$L_{B32}$
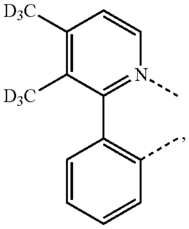
$L_{B33}$
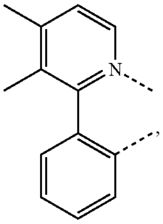
-continued
$L_{B34}$
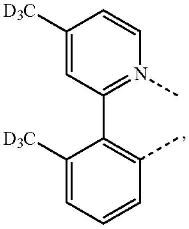
$L_{B35}$
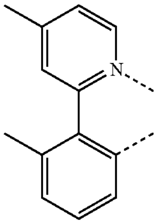
$L_{B36}$
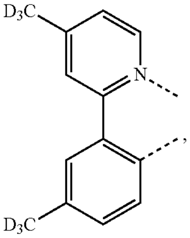
$L_{B37}$
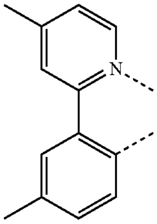
$L_{B38}$
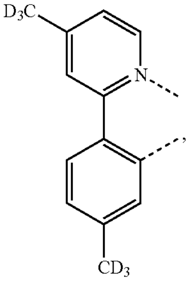
$L_{B39}$
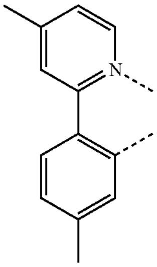

-continued
$L_{B40}$
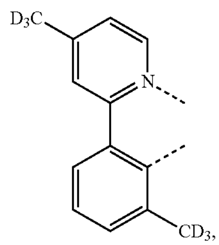
$L_{B41}$
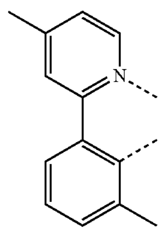
$L_{B42}$
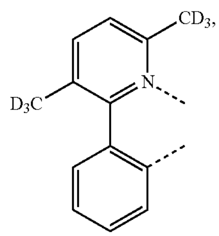
$L_{B43}$
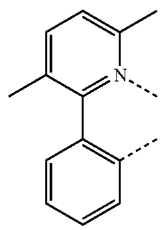
$L_{B44}$
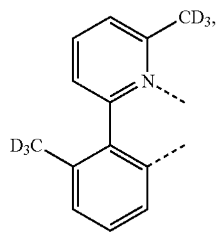
$L_{B45}$
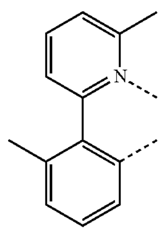
-continued
$L_{B46}$
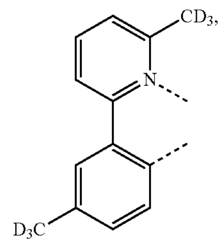
$L_{B47}$
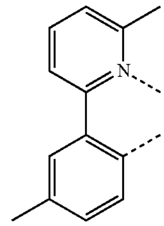
$L_{B48}$
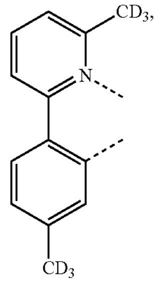
$L_{B49}$
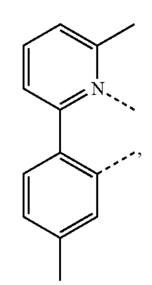
$L_{B50}$
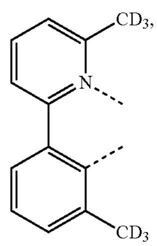
$L_{B51}$
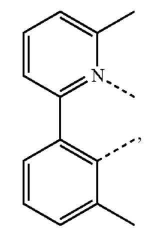

-continued
$L_{B52}$
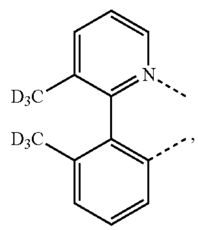
$L_{B53}$
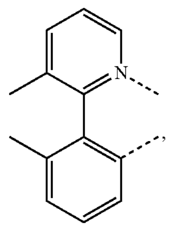
$L_{B54}$
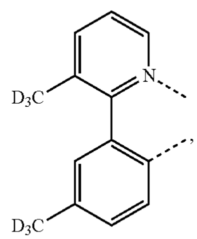
$L_{B55}$
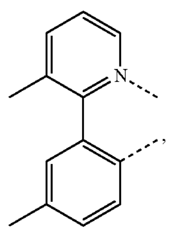
$L_{B56}$
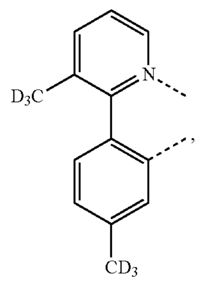
$L_{B57}$
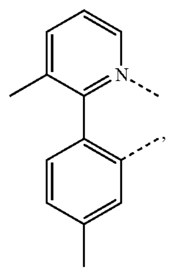
-continued
$L_{B58}$
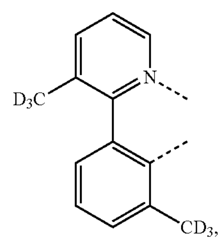
$L_{B59}$
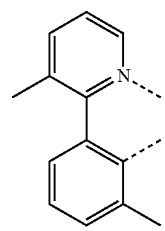
$L_{B60}$
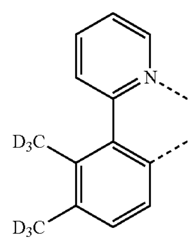
$L_{B61}$
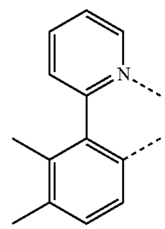
$L_{B62}$
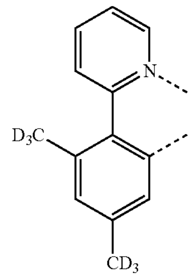
$L_{B63}$
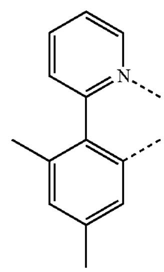

-continued
$L_{B64}$
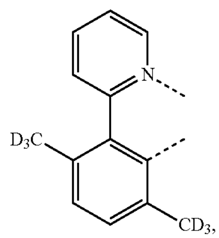
$L_{B65}$
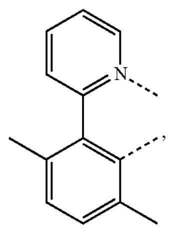
$L_{B66}$
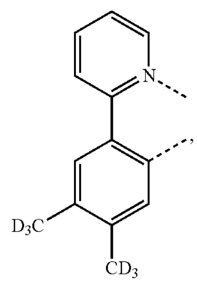
$L_{B67}$
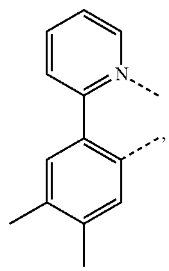
$L_{B68}$
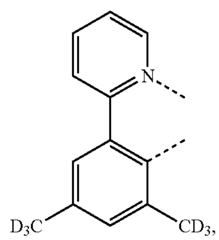
$L_{B69}$
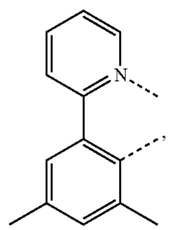
-continued
$L_{B70}$
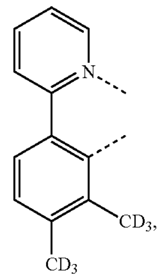
$L_{B71}$
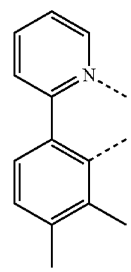
$L_{B72}$
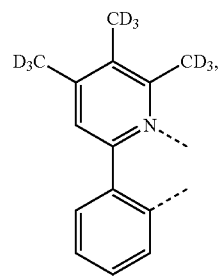
$L_{B73}$
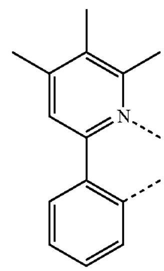
$L_{B74}$
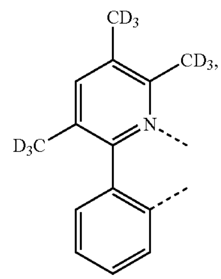

-continued
$L_{B75}$
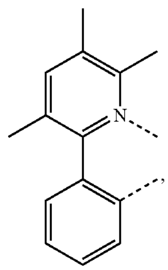
$L_{B76}$
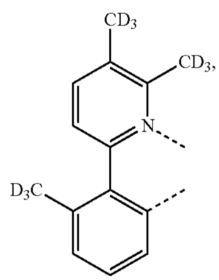
$L_{B77}$
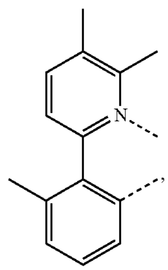
$L_{B78}$
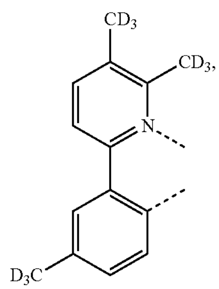
$L_{B79}$
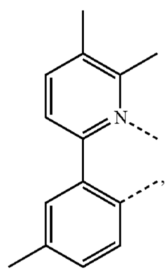
-continued
$L_{B80}$
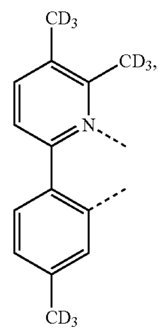
$L_{B81}$
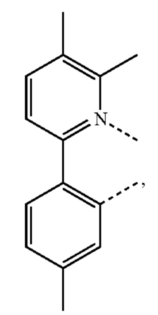
$L_{B82}$
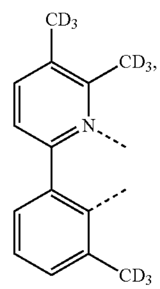
$L_{B83}$
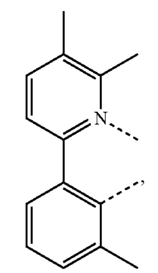
$L_{B84}$
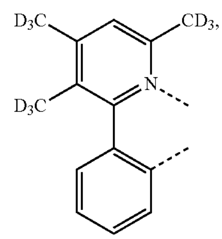

-continued
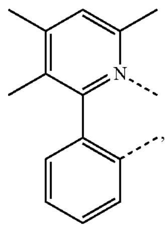
$L_{B85}$
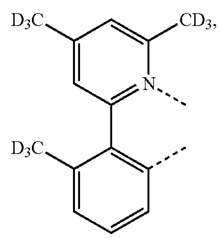
$L_{B86}$
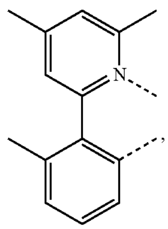
$L_{B87}$
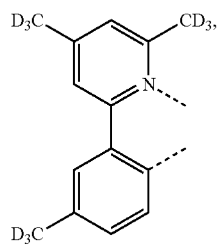
$L_{B88}$
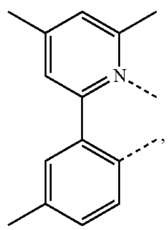
$L_{B89}$
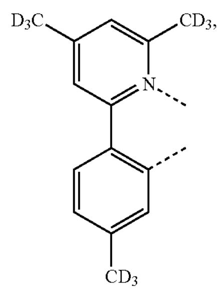
$L_{B90}$
-continued
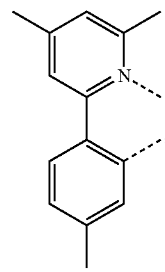
$L_{B91}$
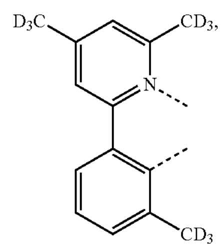
$L_{B92}$
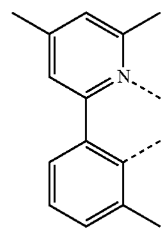
$L_{B93}$
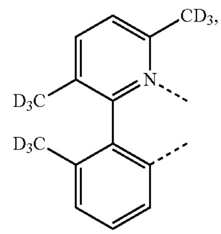
$L_{B94}$
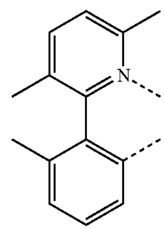
$L_{B95}$
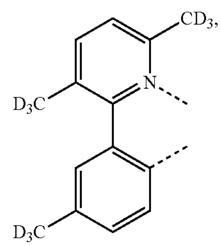
$L_{B96}$ -continued
$L_{B97}$
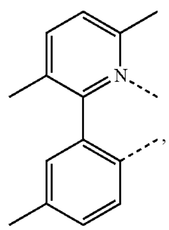
$L_{B98}$
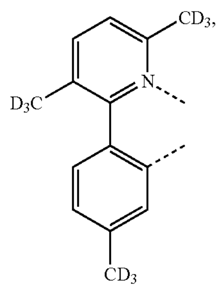
$L_{B99}$
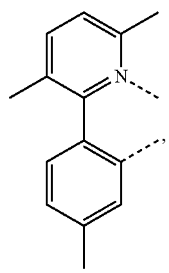
$L_{B100}$
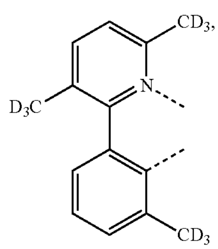
$L_{B101}$
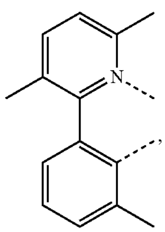
$L_{B102}$
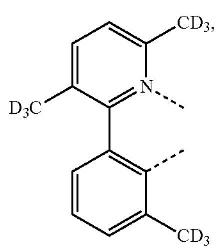
-continued
$L_{B103}$
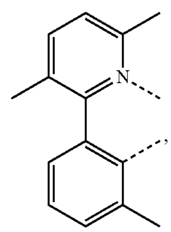
$L_{B104}$
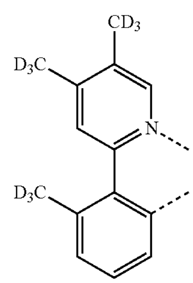
$L_{B105}$
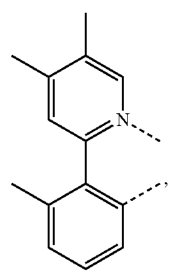
$L_{B106}$
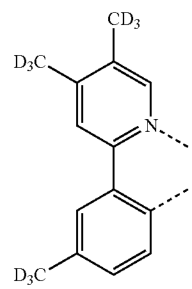
$L_{B107}$
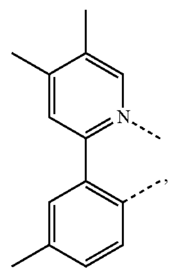

-continued
$L_{B108}$
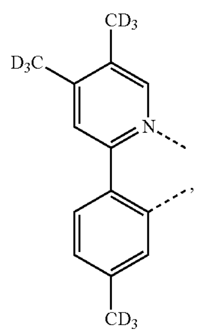
$L_{B109}$
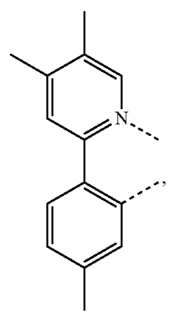
$L_{B110}$
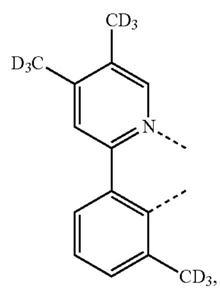
$L_{B111}$
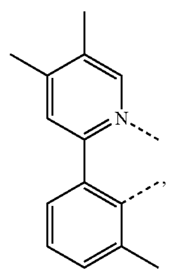
$L_{B112}$
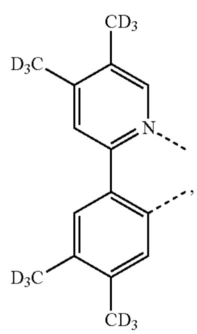
-continued
$L_{B113}$
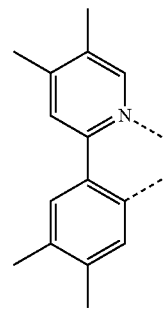
$L_{B114}$
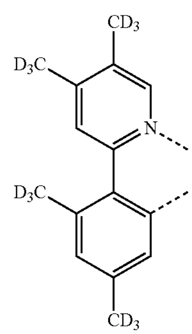
$L_{B115}$
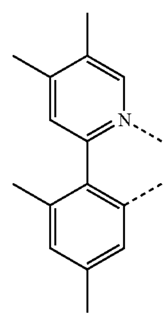
$L_{B116}$
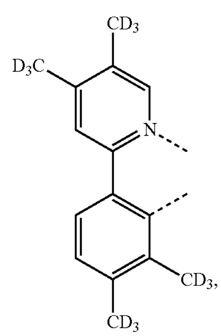
$L_{B117}$
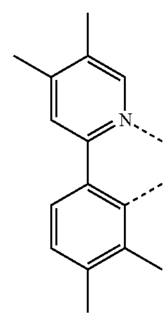

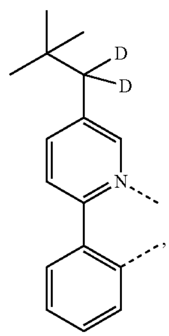
$L_{B118}$
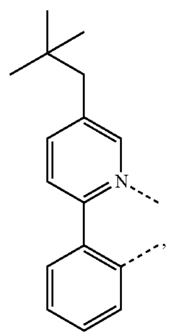
$L_{B119}$
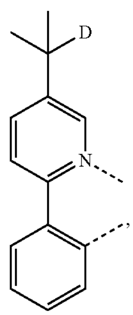
$L_{B120}$
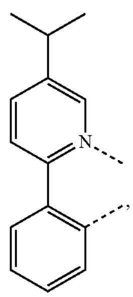
$L_{B121}$
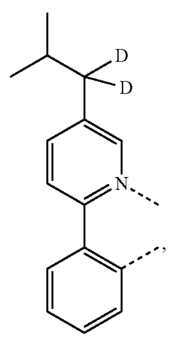
$L_{B122}$
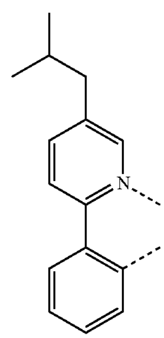
$L_{B123}$
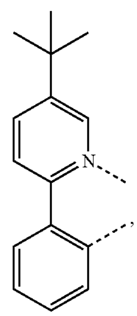
$L_{B124}$
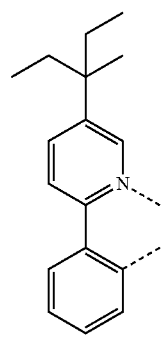
$L_{B125}$
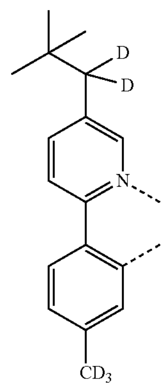
$L_{B126}$ -continued
$L_{B127}$
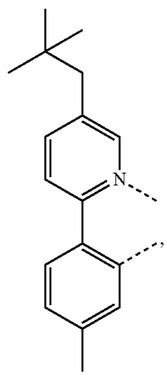
$L_{B128}$
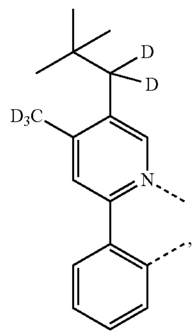
$L_{B129}$
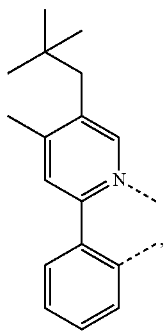
$L_{B130}$
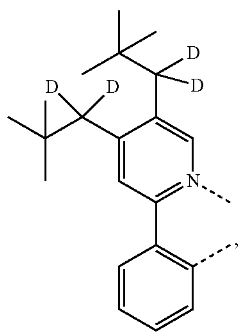
-continued
$L_{B131}$
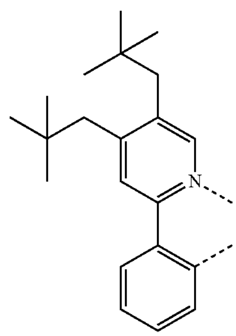
$L_{B132}$
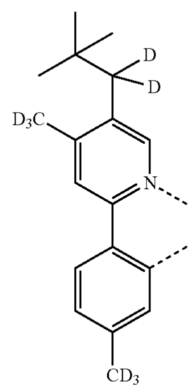
$L_{B133}$
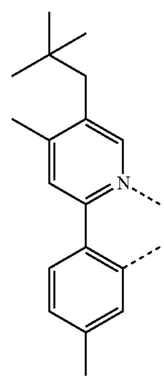
$L_{B134}$
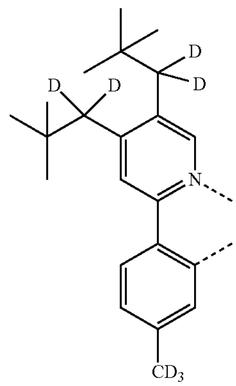

-continued
$L_{B135}$
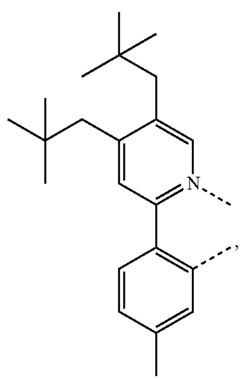
$L_{B136}$
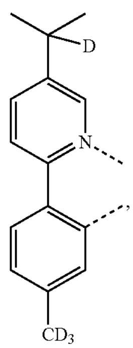
$L_{B137}$
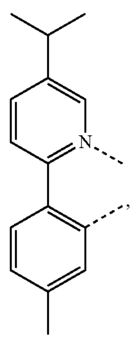
$L_{B138}$
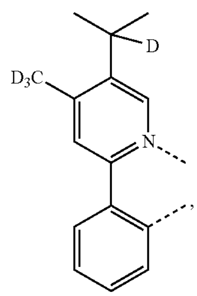
-continued
$L_{B139}$
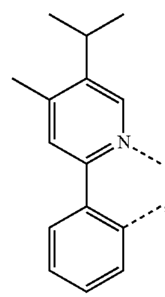
$L_{B140}$
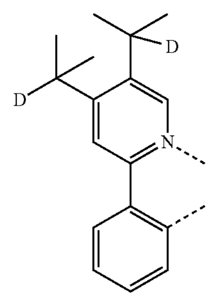
$L_{B141}$
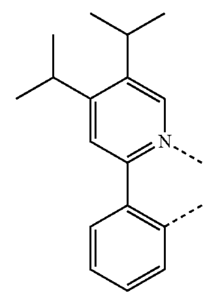
$L_{B142}$
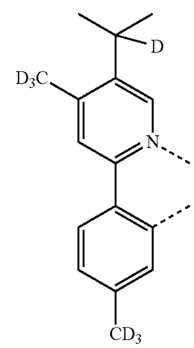
$L_{B143}$
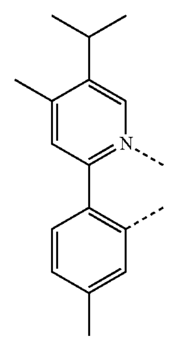

-continued
$L_{B144}$
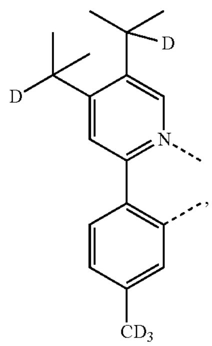
$L_{B145}$
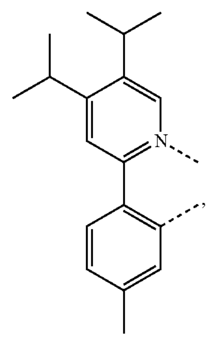
$L_{B146}$
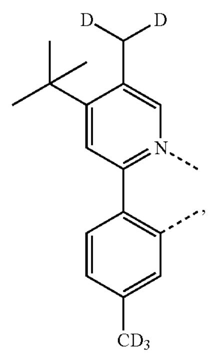
$L_{B147}$
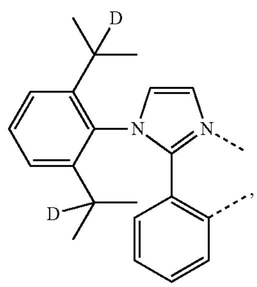
$L_{B148}$
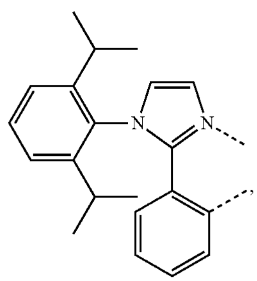
-continued
$L_{B149}$
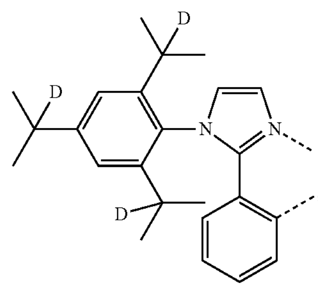
$L_{B150}$
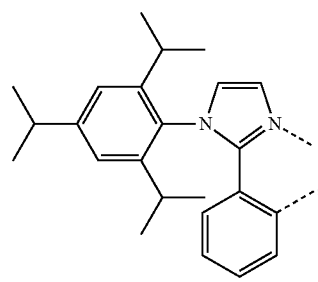
$L_{B151}$
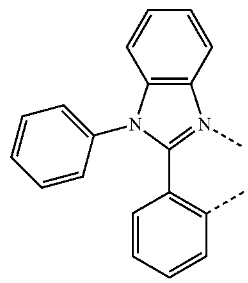
$L_{B152}$
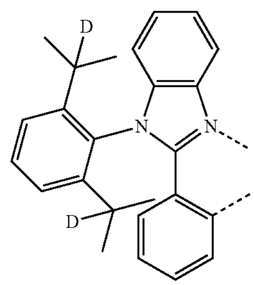
$L_{B153}$
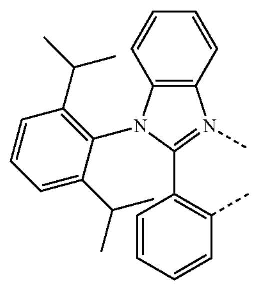

L$_{B154}$
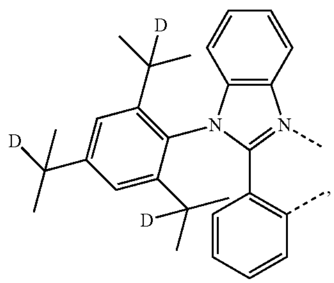
L$_{B155}$
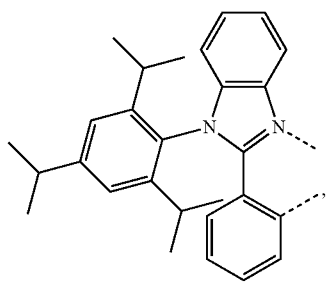
L$_{B156}$
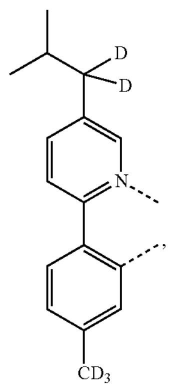
L$_{B157}$
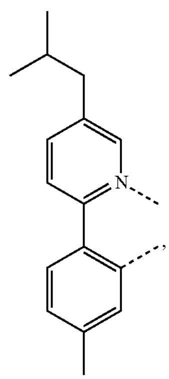
L$_{B158}$
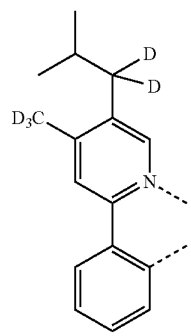
L$_{B159}$
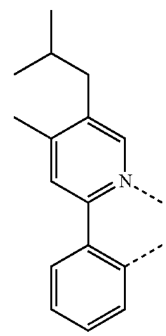
L$_{B160}$
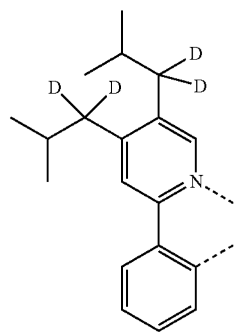
L$_{B161}$
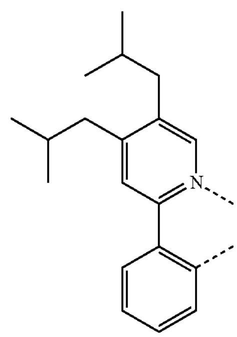

-continued
$L_{B162}$
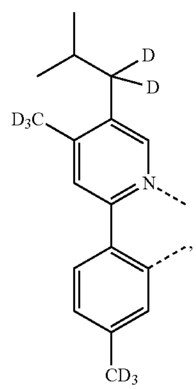
$L_{B163}$
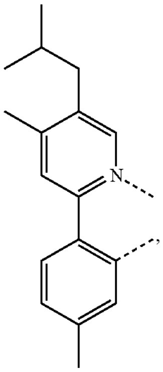
$L_{B164}$
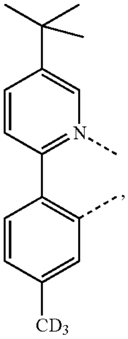
$L_{B165}$
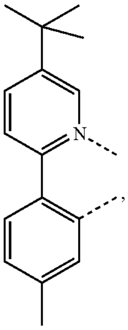
-continued
$L_{B166}$
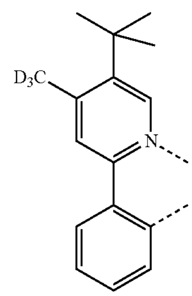
$L_{B167}$
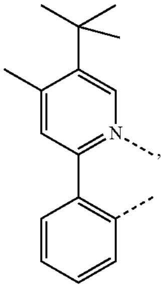
$L_{B168}$
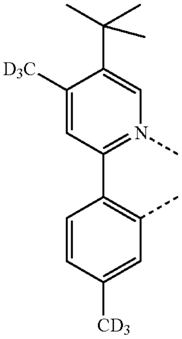
$L_{B169}$
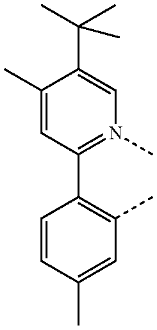

-continued
$L_{B170}$
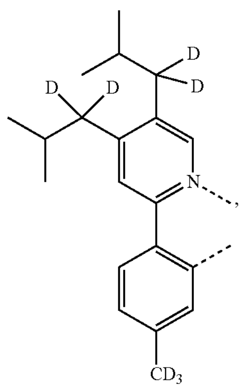
$L_{B171}$
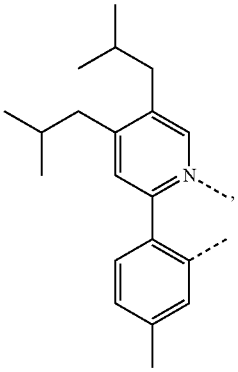
$L_{B172}$
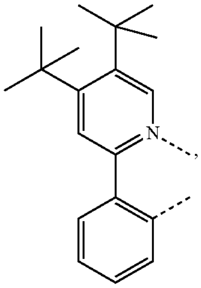
$L_{B173}$
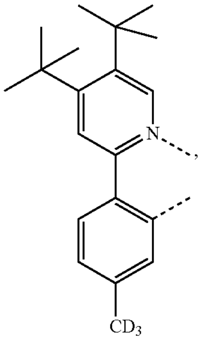
-continued
$L_{B174}$
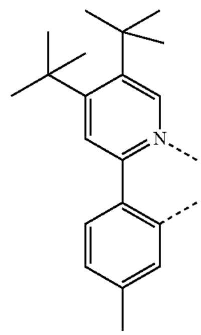
$L_{B175}$
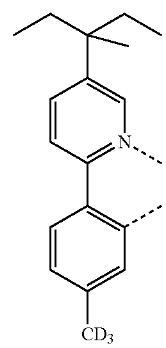
$L_{B176}$
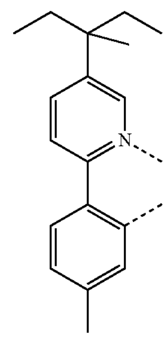
$L_{B177}$
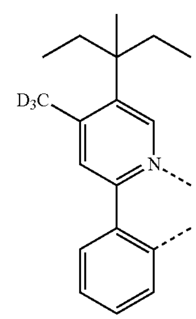

-continued
$L_{B178}$
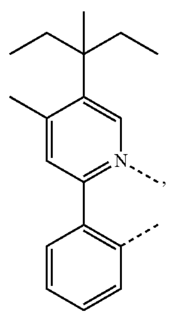
$L_{B179}$
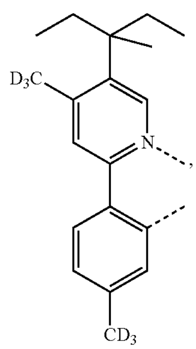
$L_{B180}$
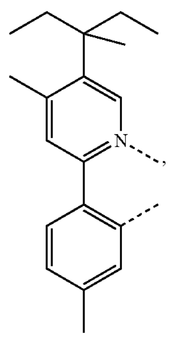
$L_{B181}$
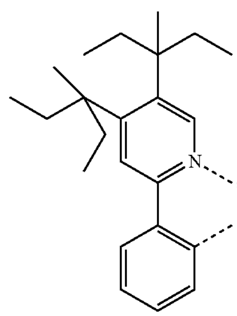
-continued
$L_{B182}$
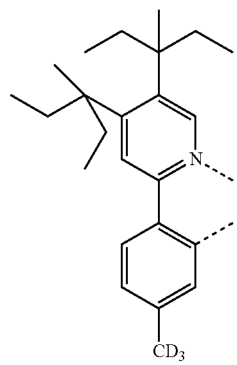
$L_{B183}$
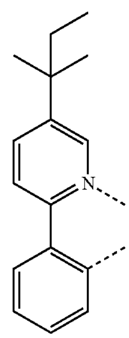
$L_{B184}$
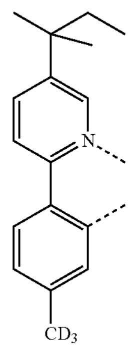
$L_{B185}$
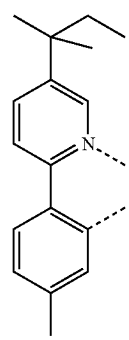

-continued
$L_{B186}$
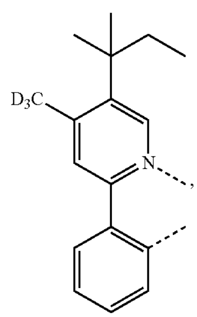
$L_{B187}$
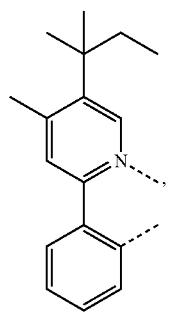
$L_{B188}$
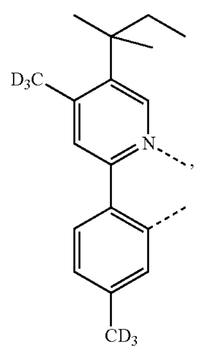
$L_{B189}$
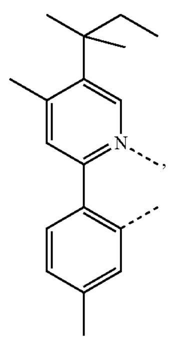
$L_{B190}$
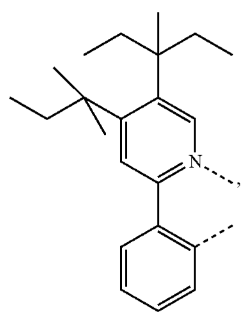
-continued
$L_{B191}$
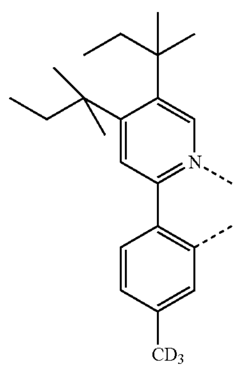
$L_{B192}$
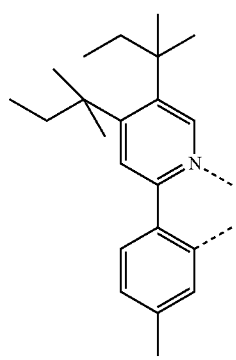
$L_{B193}$
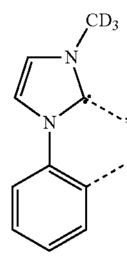
$L_{B194}$
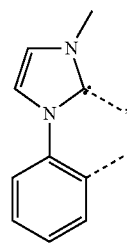
$L_{B195}$
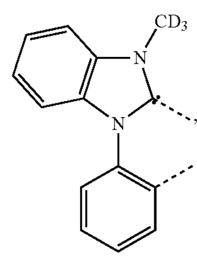

-continued
$L_{B196}$
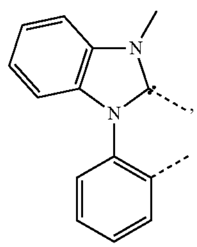
$L_{B197}$
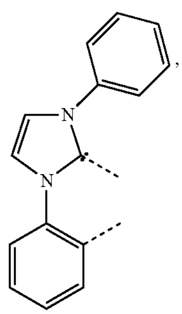
$L_{B198}$
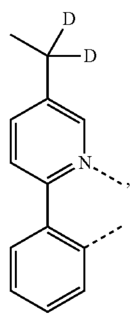
$L_{B199}$
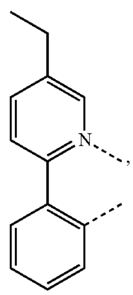
$L_{B200}$
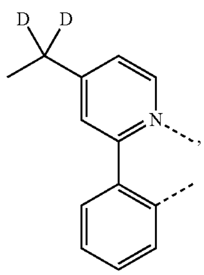
-continued
$L_{B201}$
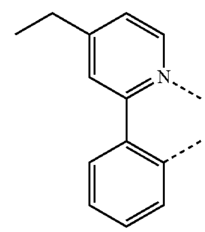
$L_{B202}$
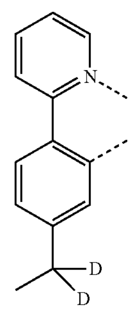
$L_{B203}$
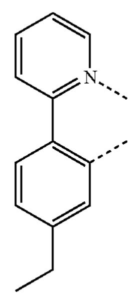
$L_{B204}$
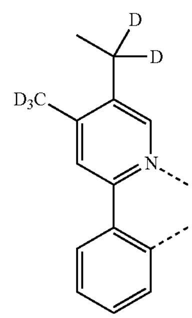
$L_{B205}$
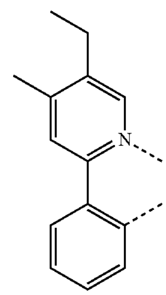

-continued
$L_{B206}$
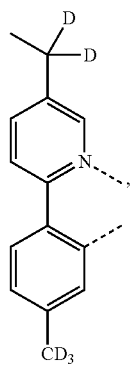
$L_{B207}$
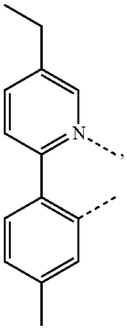
$L_{B208}$
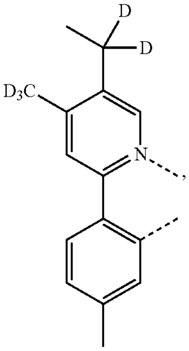
$L_{B209}$
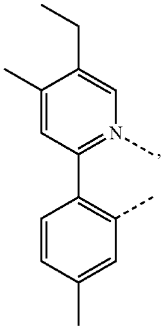
-continued
$L_{B210}$
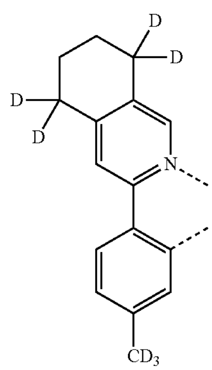
$L_{B211}$
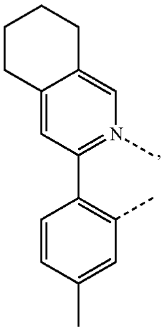
$L_{B212}$
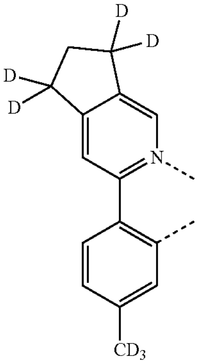
$L_{B213}$
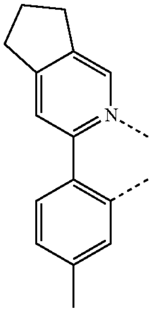

-continued
$L_{B214}$
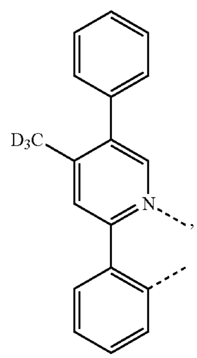
$L_{B215}$
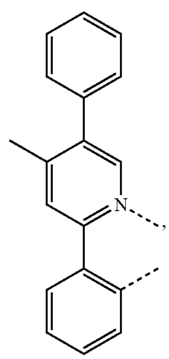
$L_{B216}$
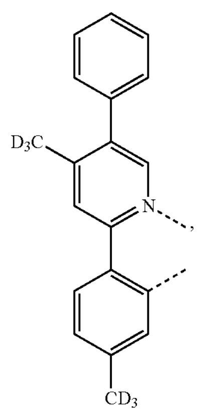
$L_{B217}$
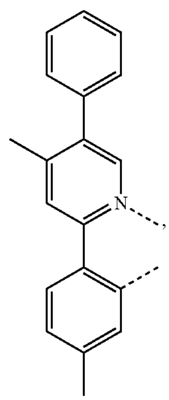
-continued
$L_{B218}$
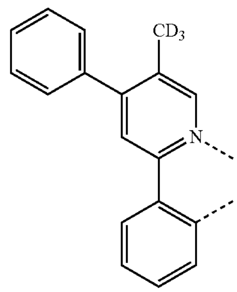
$L_{B219}$
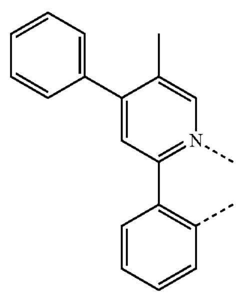
$L_{B220}$
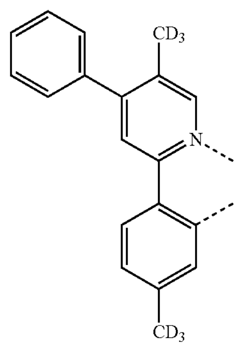
$L_{B221}$
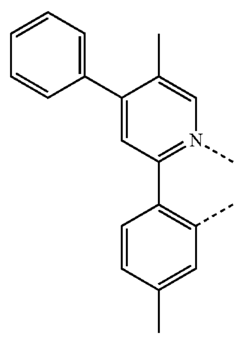

-continued
$L_{B222}$
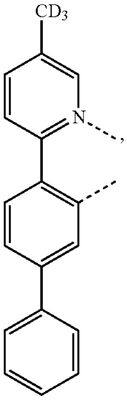
$L_{B223}$
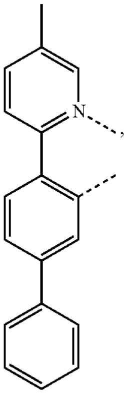
$L_{B224}$
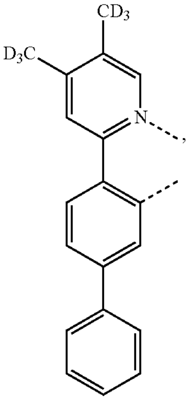
$L_{B225}$
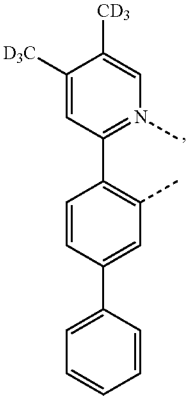
-continued
$L_{B226}$
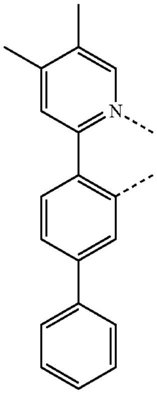
$L_{B227}$
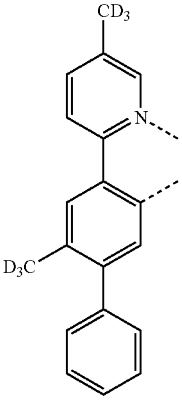
$L_{B228}$
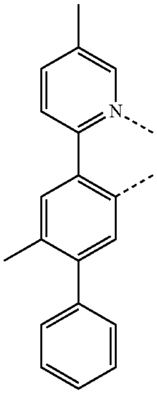
$L_{B229}$
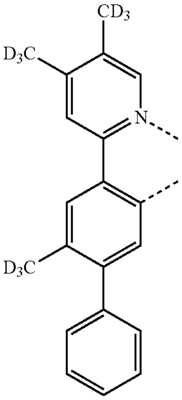

-continued
$L_{B230}$
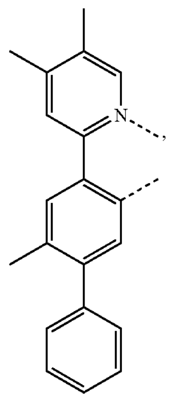
$L_{B231}$
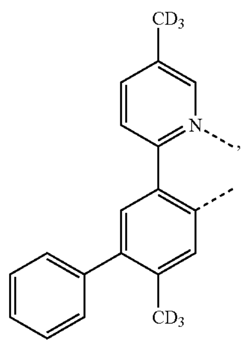
$L_{B232}$
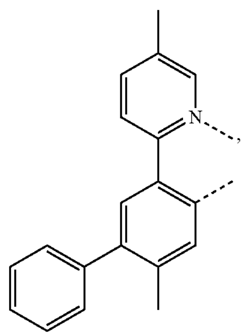
$L_{B233}$
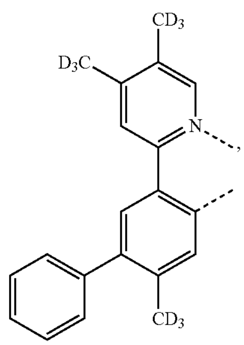
-continued
$L_{B234}$
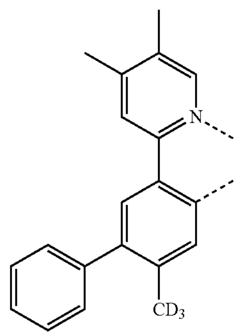
$L_{B235}$
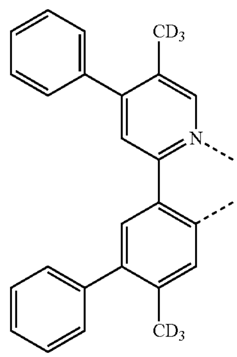
$L_{B236}$
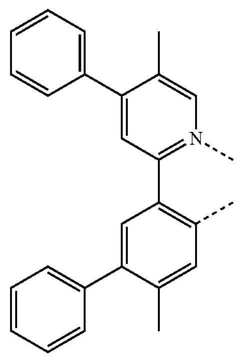
$L_{B237}$
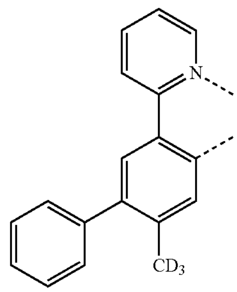
$L_{B238}$
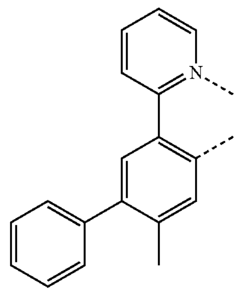

$L_{B239}$
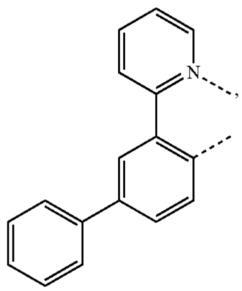
$L_{B240}$
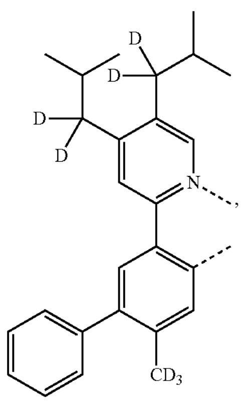
$L_{B241}$
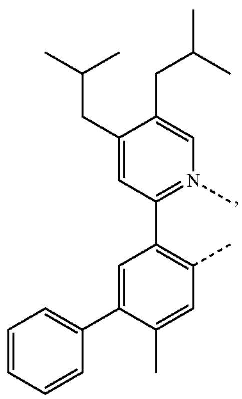
$L_{B242}$
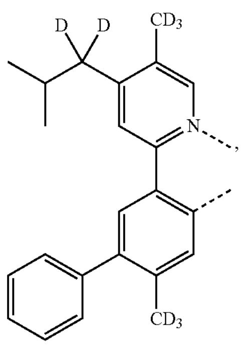
$L_{B243}$
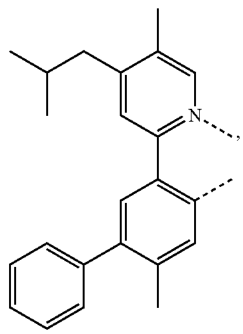
$L_{B244}$
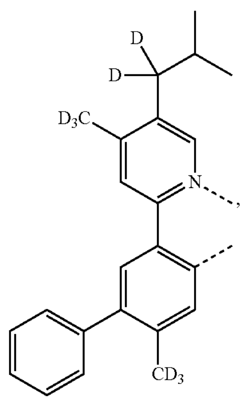
$L_{B245}$
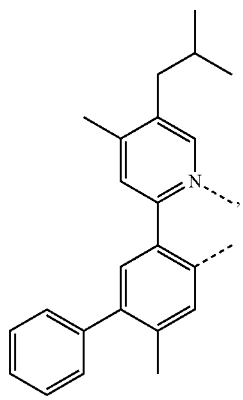
$L_{B246}$
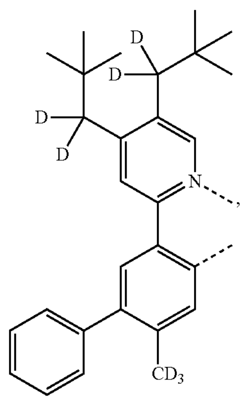

$L_{B247}$
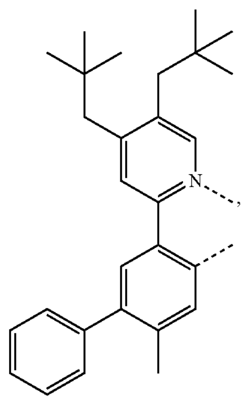
$L_{B248}$
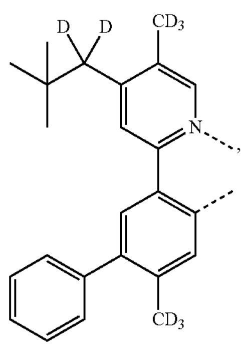
$L_{B249}$
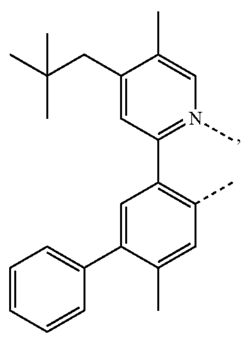
$L_{B250}$
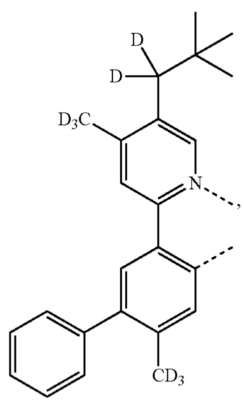
$L_{B251}$
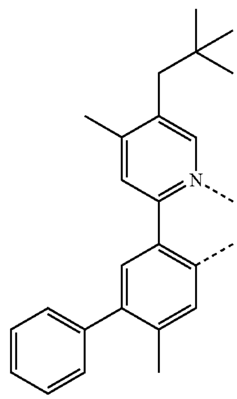
$L_{B252}$
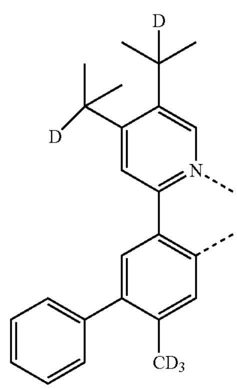
$L_{B253}$
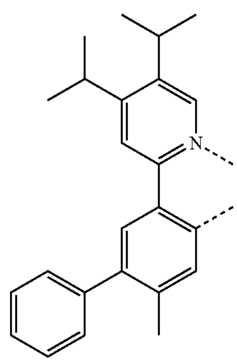
$L_{B254}$
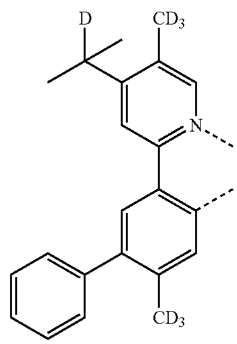

-continued
$L_{B255}$
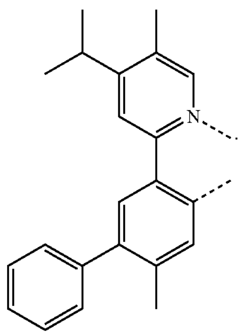
$L_{B256}$
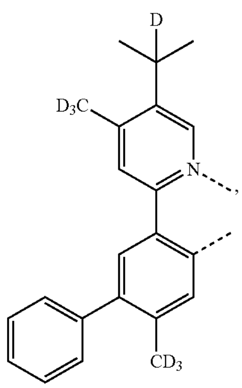
$L_{B257}$
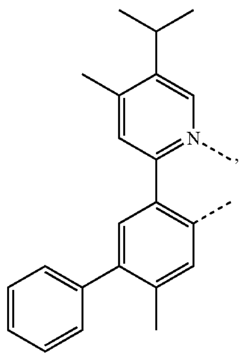
$L_{B258}$
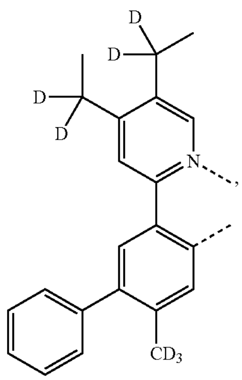
-continued
$L_{B259}$
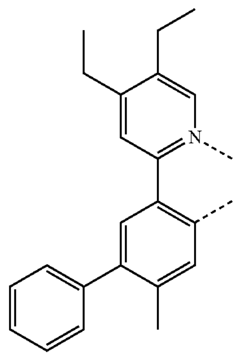
$L_{B260}$
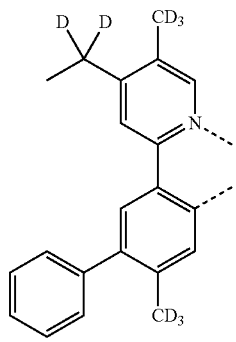
$L_{B261}$
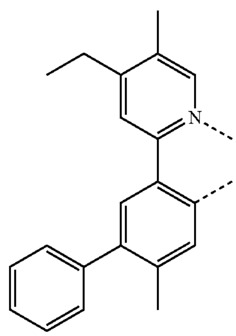
$L_{B262}$
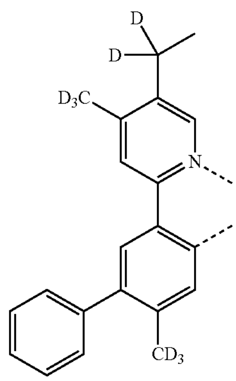

-continued
$L_{B263}$
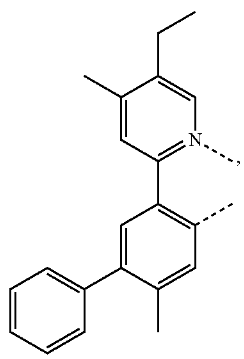
$L_{B264}$
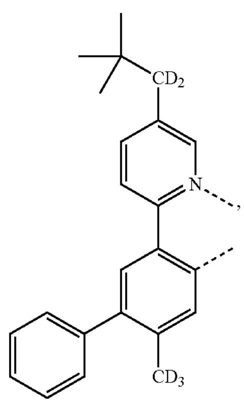
$L_{B265}$
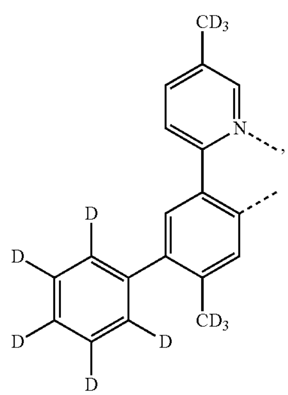
$L_{B266}$
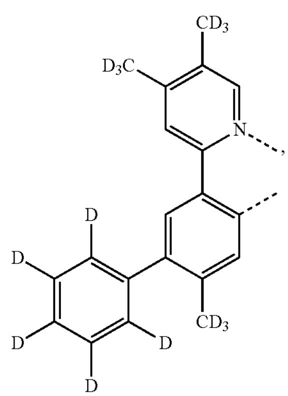
-continued
$L_{B267}$
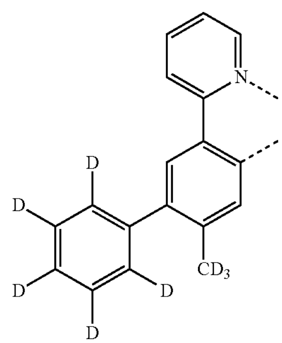
$L_{B268}$
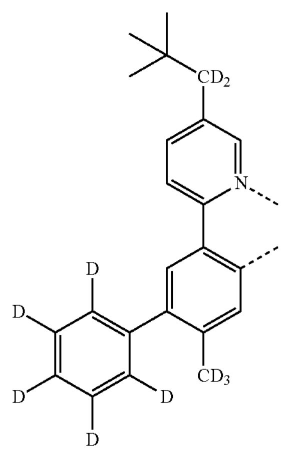
$L_{B269}$
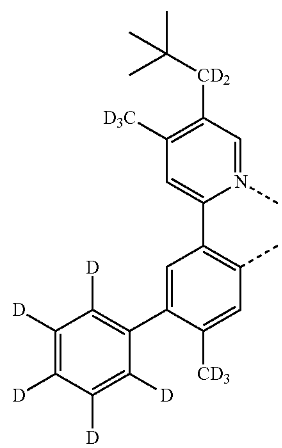

-continued
$L_{B270}$
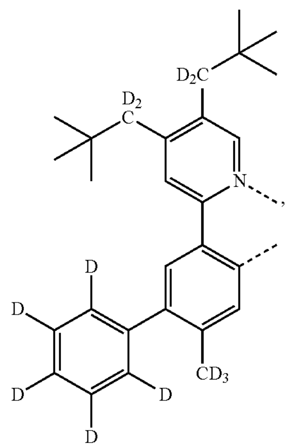
$L_{B271}$
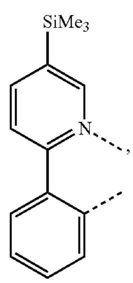
$L_{B272}$
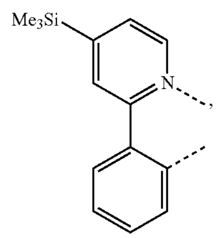
$L_{B273}$
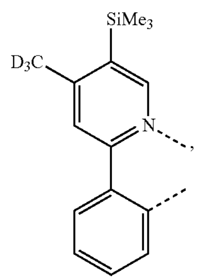
$L_{B274}$
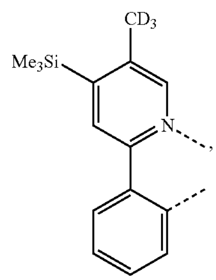
-continued
$L_{B275}$
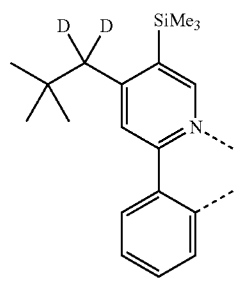
$L_{B276}$
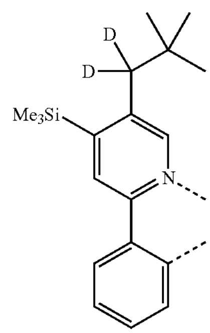
$L_{B277}$
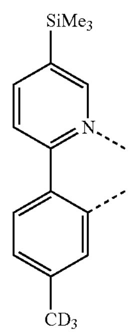
$L_{B278}$
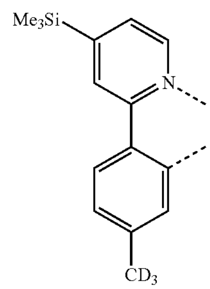
$L_{B279}$
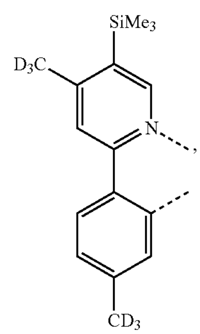

-continued
$L_{B280}$
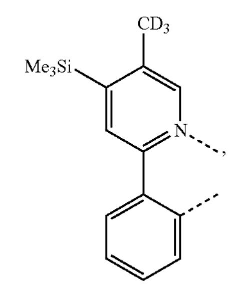
$L_{B281}$
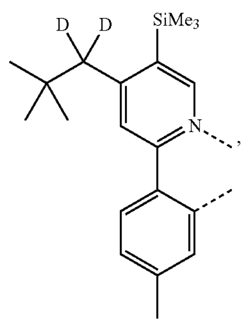
$L_{B282}$
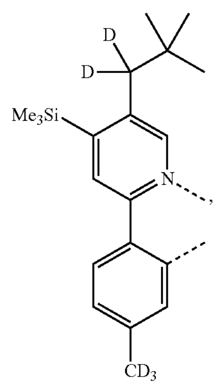
$L_{B283}$
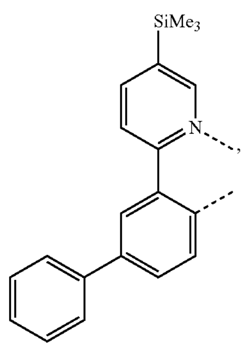
$L_{B284}$
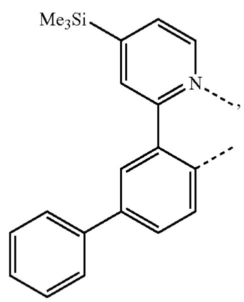
-continued
$L_{B285}$
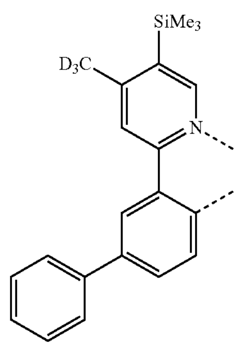
$L_{B286}$
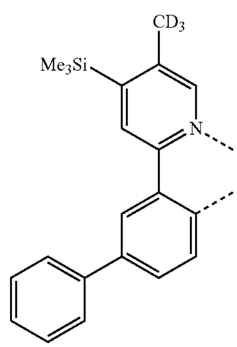
$L_{B287}$
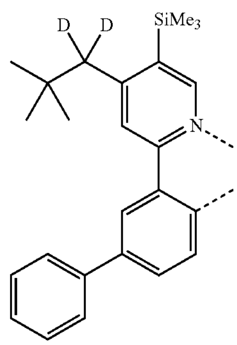
$L_{B288}$
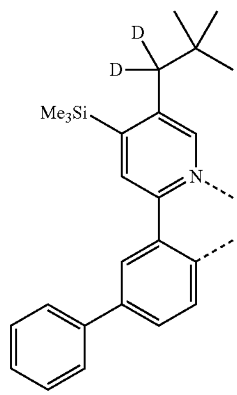

-continued
$L_{B289}$
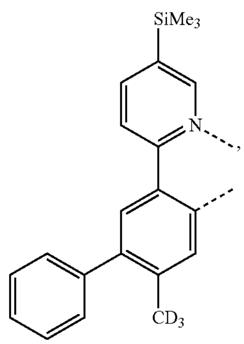
$L_{B290}$
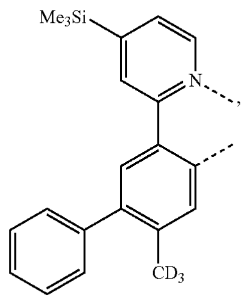
$L_{B291}$
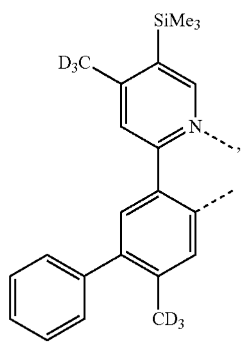
$L_{B292}$
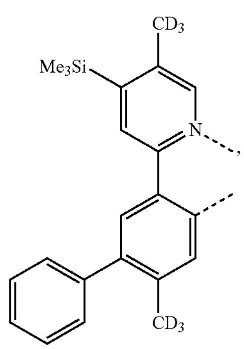
-continued
$L_{B293}$
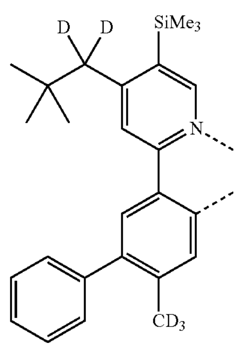
$L_{B294}$
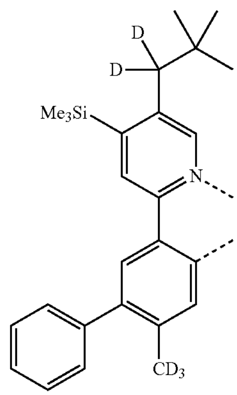
$L_{B295}$
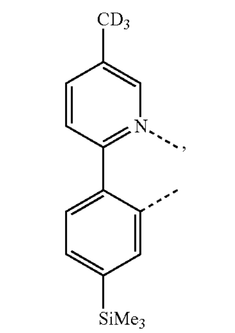
$L_{B296}$
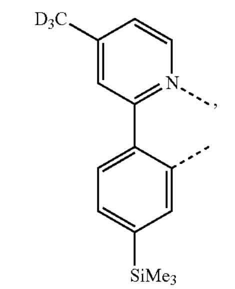

-continued
$L_{B297}$
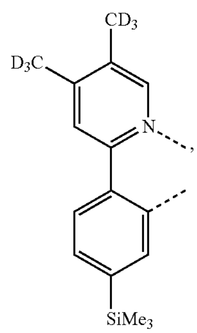
$L_{B298}$
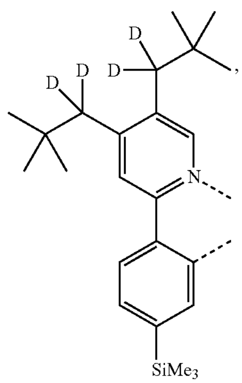
$L_{B299}$
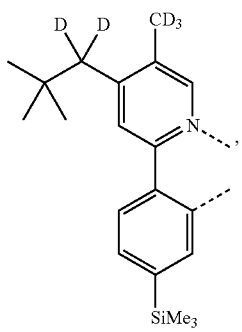
$L_{B300}$
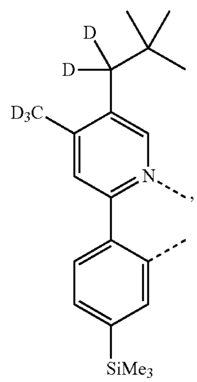
-continued
$L_{B301}$
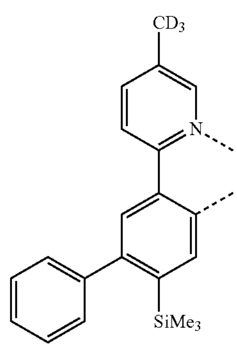
$L_{B302}$
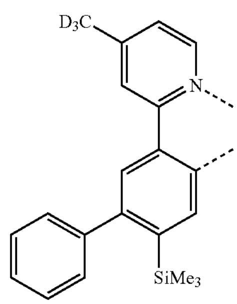
$L_{B303}$
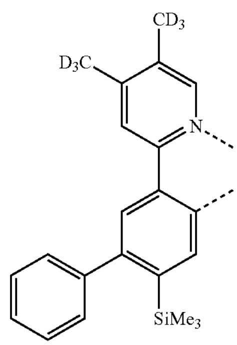
$L_{B304}$
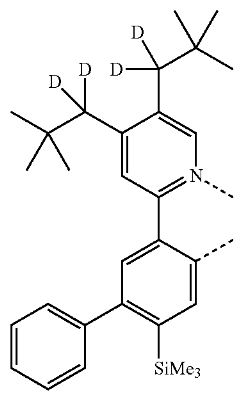

-continued
$L_{B305}$
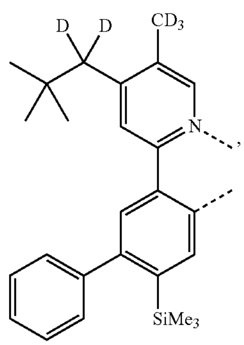
$L_{B306}$
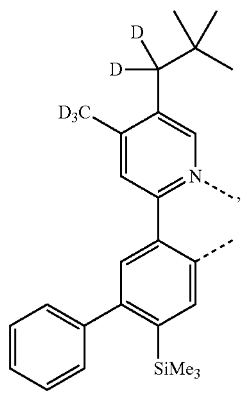
$L_{B307}$
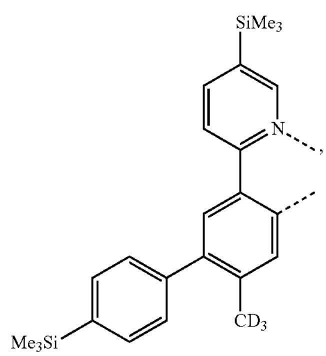
$L_{B308}$
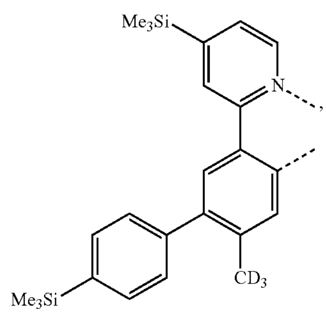
-continued
$L_{B309}$
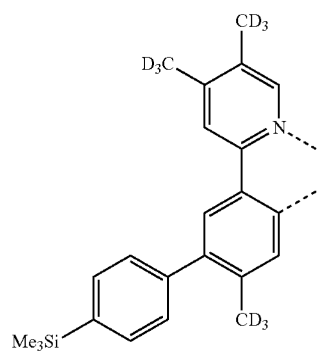
$L_{B310}$
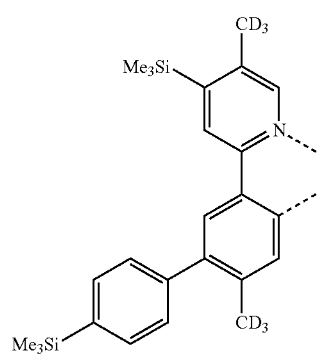
$L_{B311}$
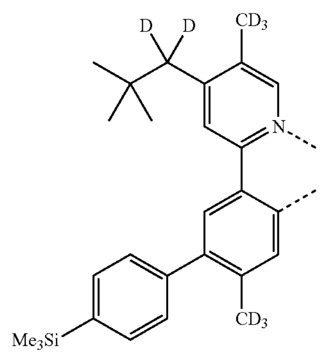
$L_{B312}$
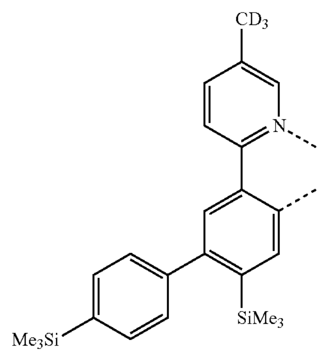

-continued
$L_{B313}$
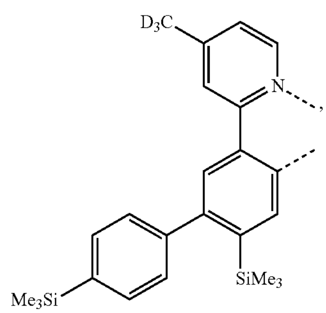
$L_{B314}$
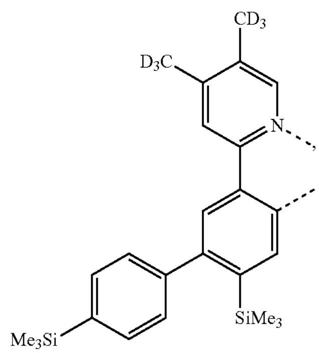
$L_{B315}$
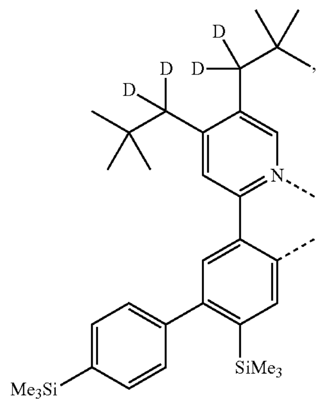
$L_{B316}$
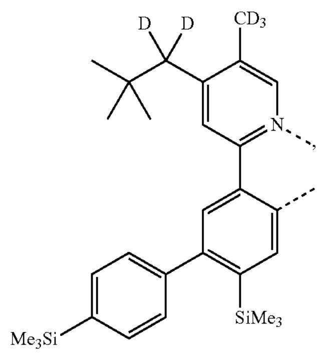
-continued
$L_{B317}$
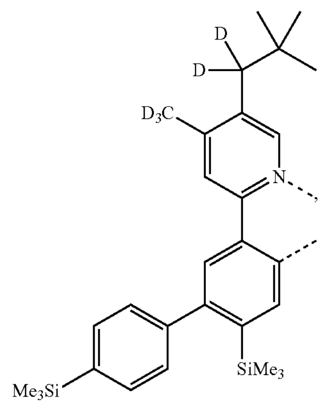
$L_{B318}$
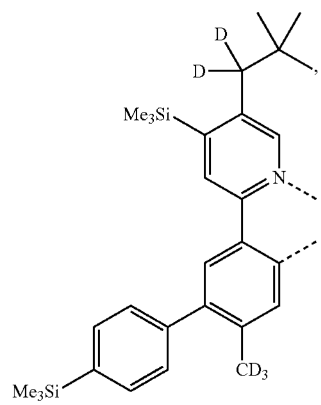
$L_{B319}$
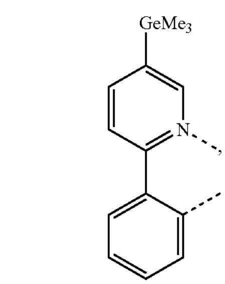
$L_{B320}$
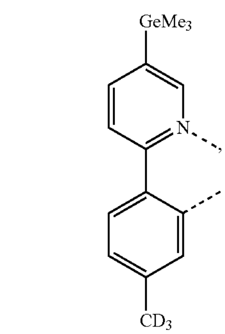

-continued
$L_{B321}$
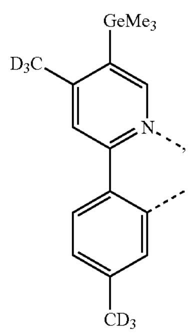
$L_{B322}$
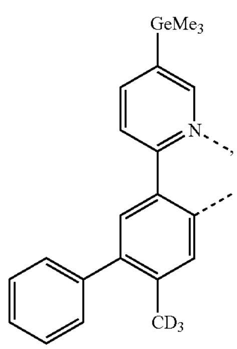
$L_{B323}$
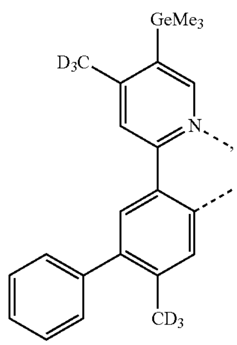
$L_{B324}$
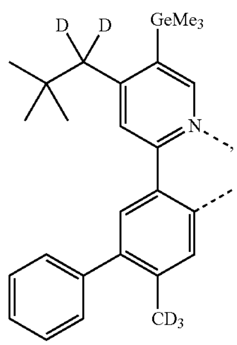
-continued
$L_{B325}$
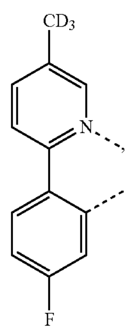
$L_{B326}$
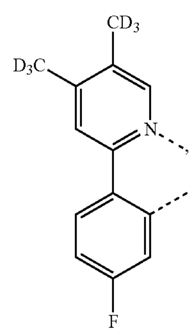
$L_{B327}$
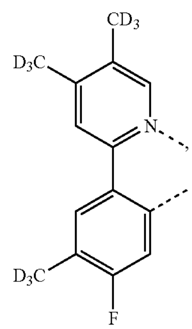
$L_{B328}$
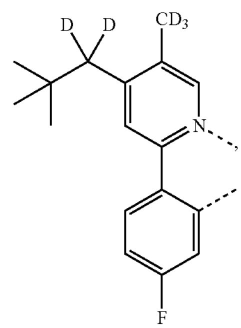

-continued
$L_{B329}$
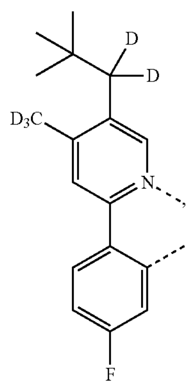
$L_{B330}$
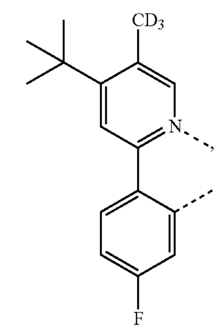
$L_{B331}$
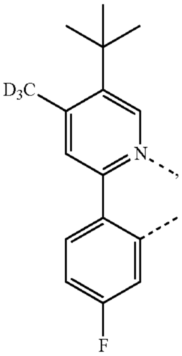
$L_{B332}$
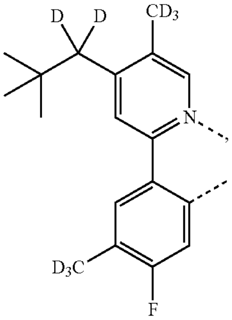
-continued
$L_{B333}$
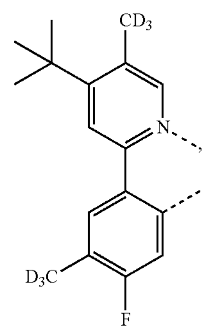
$L_{B334}$
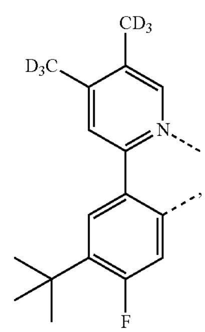
$L_{B335}$
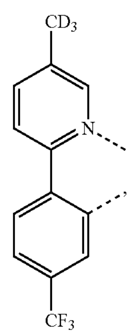
$L_{B336}$
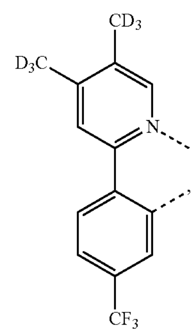

-continued
$L_{B337}$
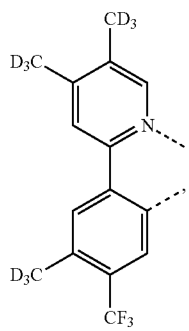
$L_{B338}$
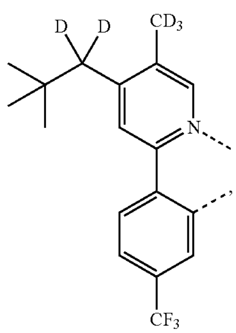
$L_{B339}$
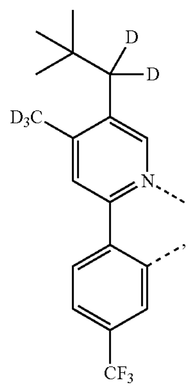
$L_{B340}$
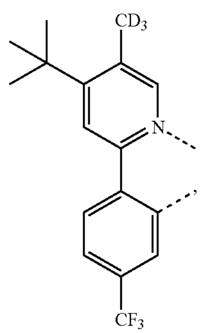
-continued
$L_{B341}$
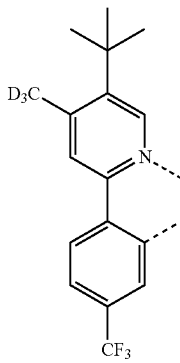
$L_{B342}$
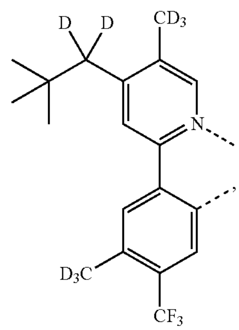
$L_{B343}$
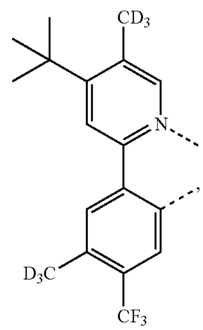
$L_{B344}$
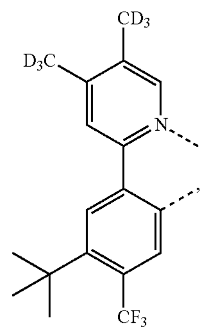
$L_{B345}$
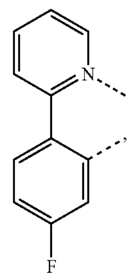

-continued
$L_{B346}$
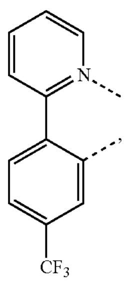
$L_{B347}$
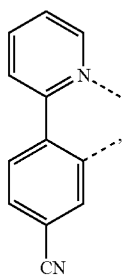
$L_{B348}$
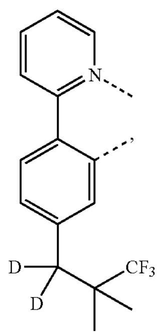
$L_{B349}$
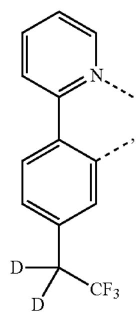
$L_{B350}$
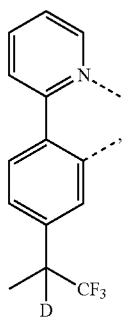
-continued
$L_{B351}$
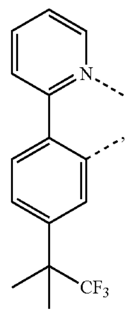
$L_{B352}$
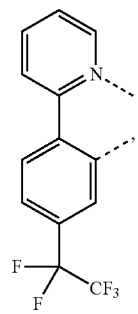
$L_{B353}$
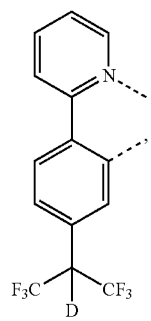
$L_{B354}$
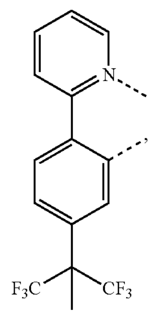
$L_{B355}$
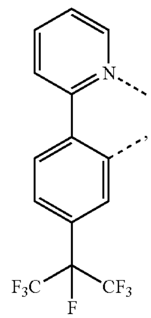

-continued
$L_{B356}$
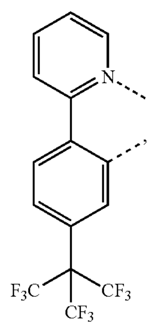
$L_{B357}$
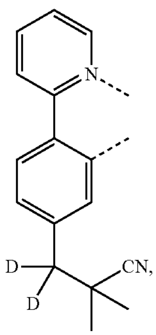
$L_{B358}$
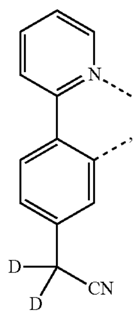
$L_{B359}$
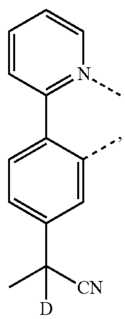
$L_{B360}$
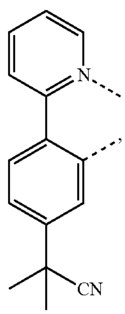
-continued
$L_{B361}$
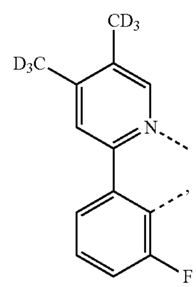
$L_{B362}$
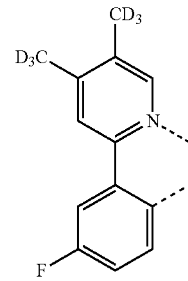
$L_{B363}$
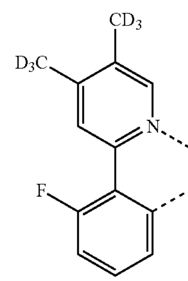
$L_{B364}$
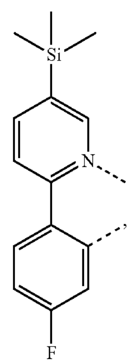
$L_{B365}$
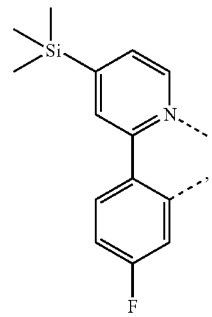

-continued
$L_{B366}$
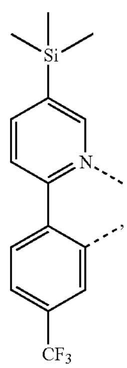
$L_{B367}$
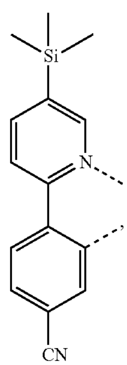
$L_{B368}$
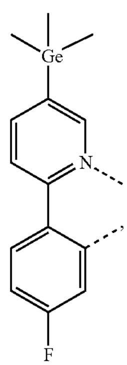
$L_{B369}$
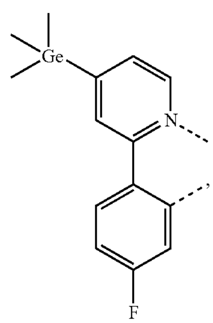
-continued
$L_{B370}$
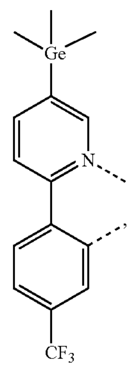
$L_{B371}$
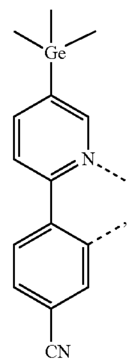
$L_{B372}$
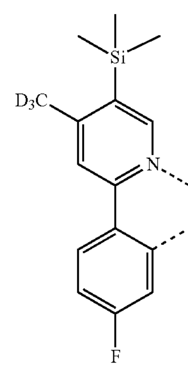
$L_{B373}$
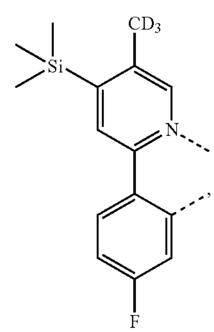

-continued
$L_{B374}$
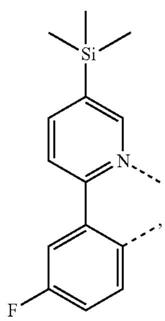
$L_{B375}$
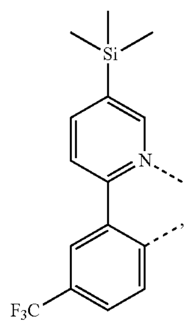
$L_{B376}$
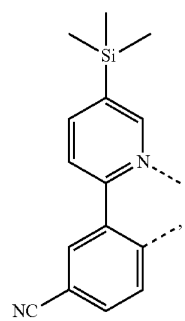
$L_{B377}$
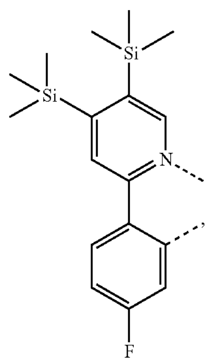
-continued
$L_{B378}$
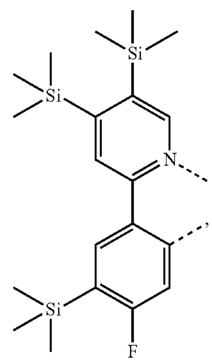
$L_{B379}$
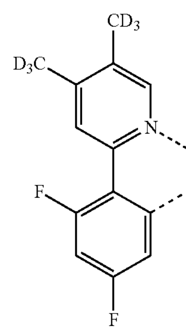
$L_{B380}$
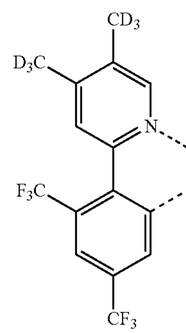
$L_{B381}$
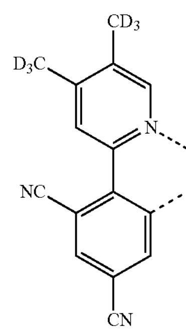

-continued
$L_{B382}$
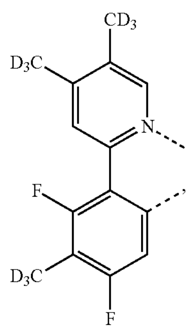
$L_{B383}$
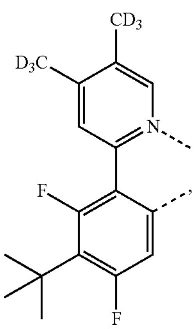
$L_{B384}$
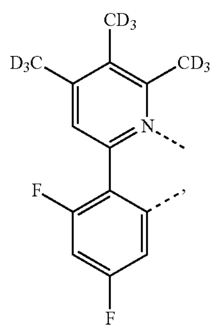
$L_{B385}$
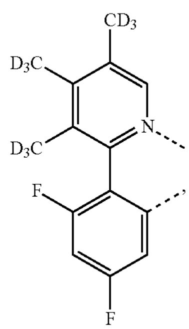
$L_{B386}$
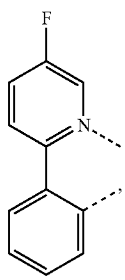
-continued
$L_{B387}$
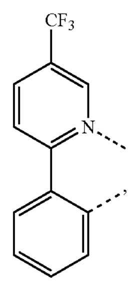
$L_{B388}$
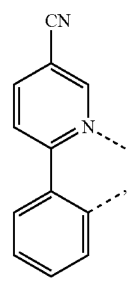
$L_{B389}$
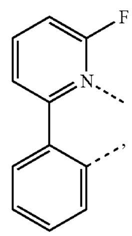
$L_{B390}$
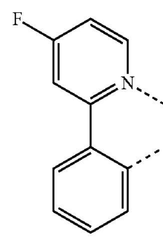
$L_{B391}$
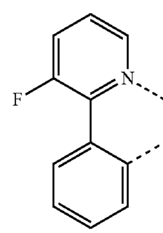
$L_{B392}$
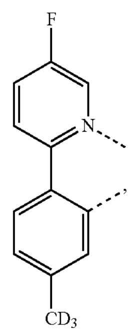

-continued
$L_{B393}$
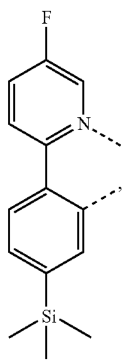
$L_{B394}$
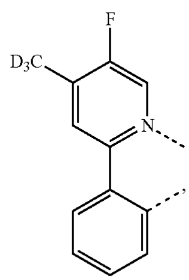
$L_{B395}$
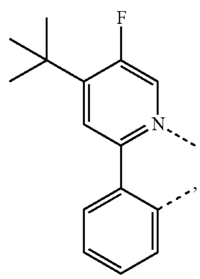
$L_{B396}$
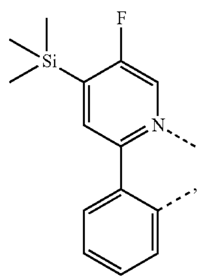
$L_{B397}$
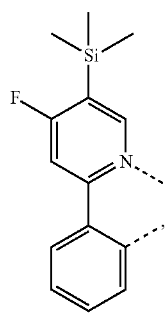
-continued
$L_{B398}$
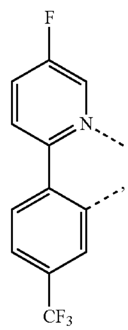
$L_{B399}$
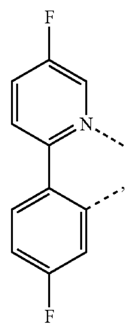
$L_{B400}$
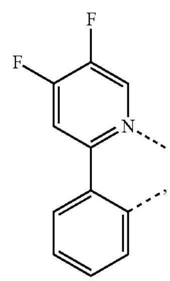
$L_{B401}$
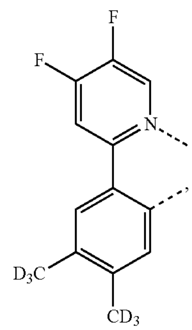
$L_{B402}$
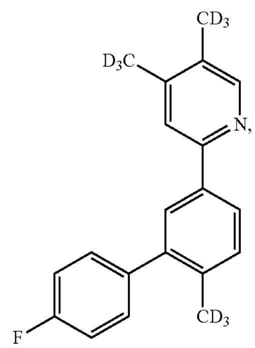

$L_{B403}$
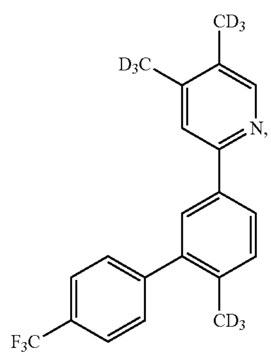
$L_{B404}$
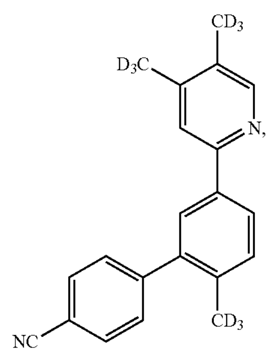
$L_{B405}$
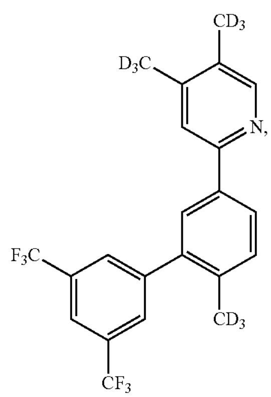
$L_{B406}$
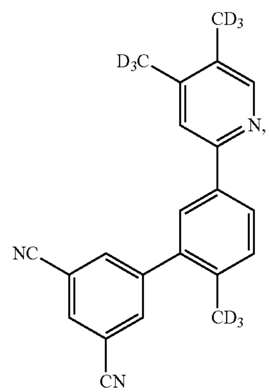
$L_{B406}$
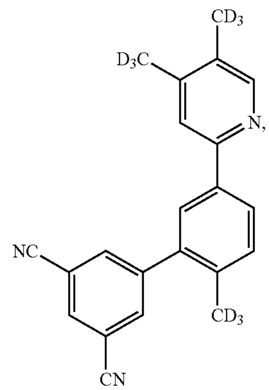
$L_{B408}$
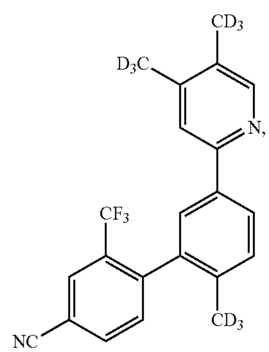
$L_{B409}$
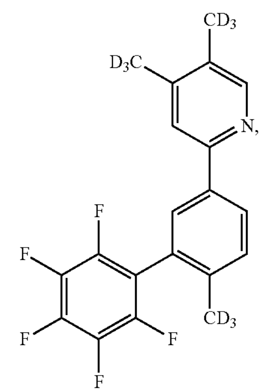
$L_{B410}$
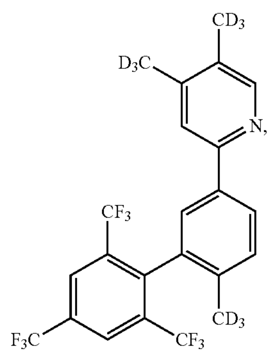

-continued
$L_{B411}$
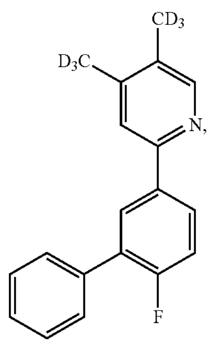
$L_{B412}$
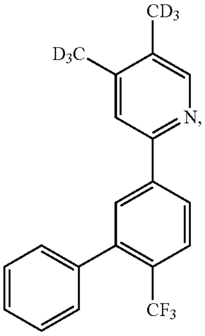
$L_{B413}$
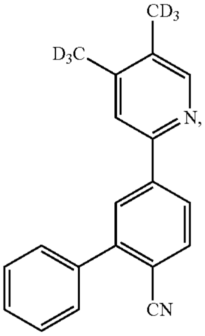
$L_{B414}$
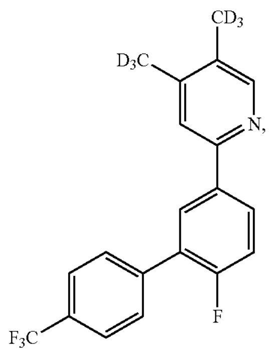
-continued
$L_{B415}$
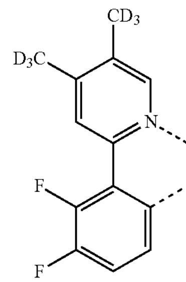
$L_{B416}$
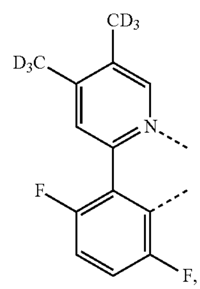
$L_{B417}$
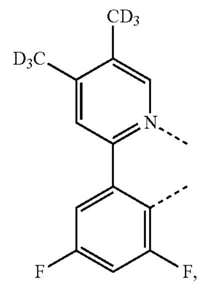
$L_{B418}$
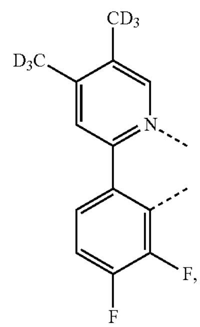
$L_{B419}$
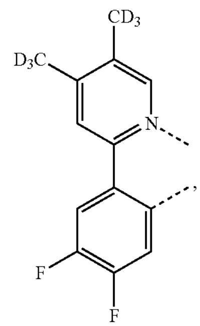

$L_{B420}$
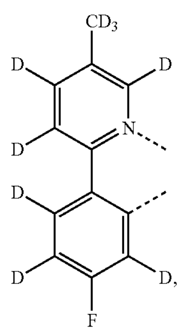
$L_{B421}$
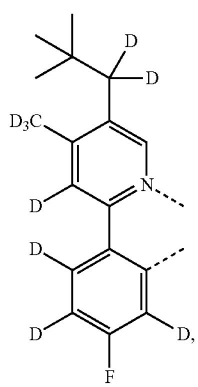
$L_{B422}$
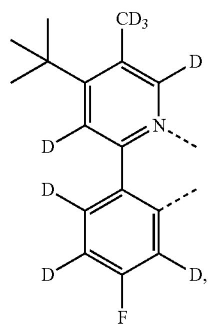
$L_{B423}$
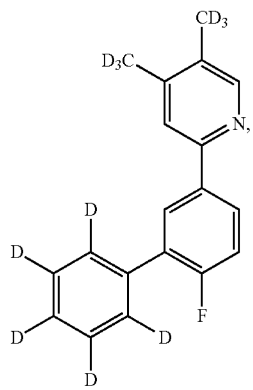
$L_{B424}$
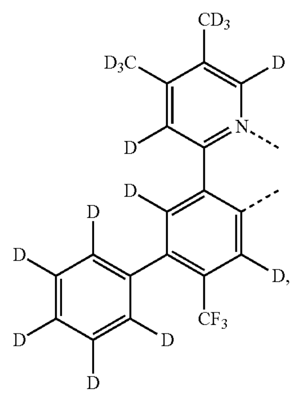
$L_{B425}$
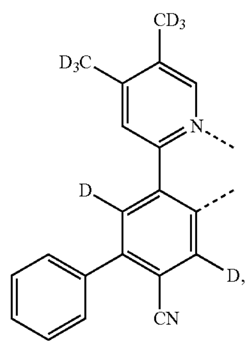
$L_{B426}$
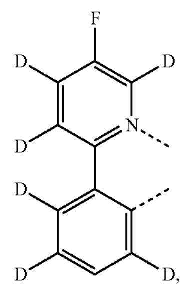
$L_{B427}$
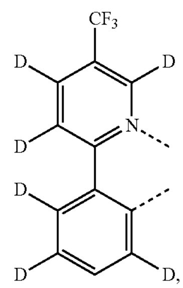
$L_{B428}$
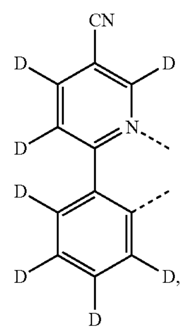

$L_{B429}$
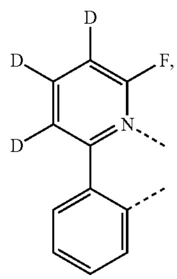
$L_{B430}$
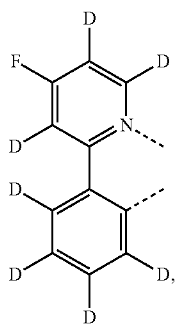
$L_{B431}$
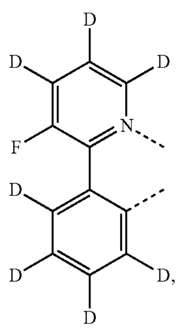
$L_{B432}$
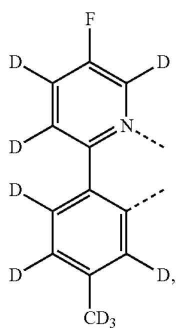
$L_{B433}$
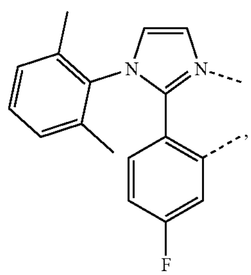
$L_{B434}$
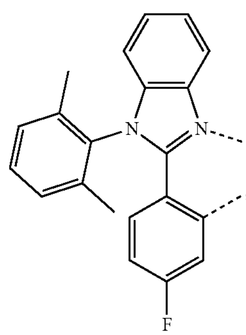
$L_{B435}$
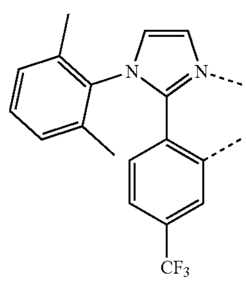
$L_{B436}$
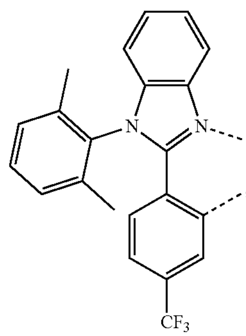
$L_{B437}$
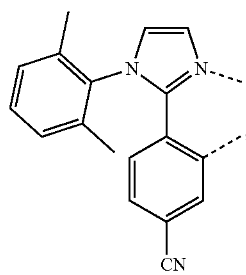
$L_{B438}$
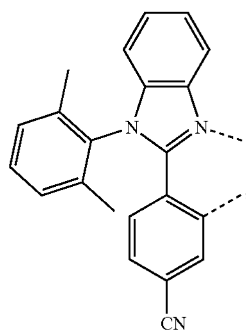

-continued
$L_{B439}$
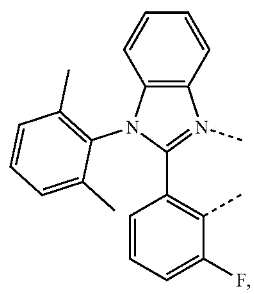
$L_{B440}$
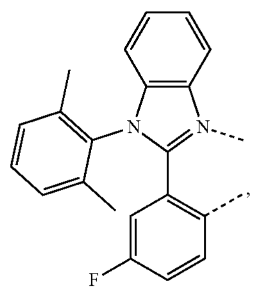
$L_{B441}$
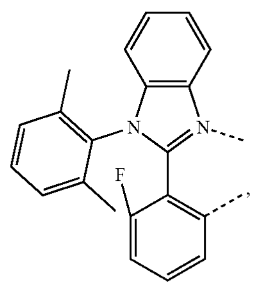
$L_{B442}$
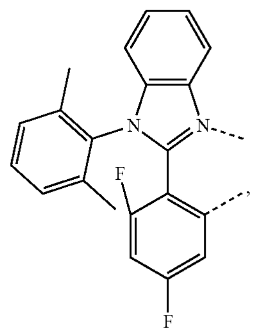
$L_{B443}$
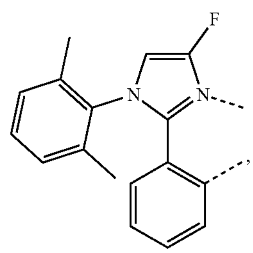
-continued
$L_{B444}$
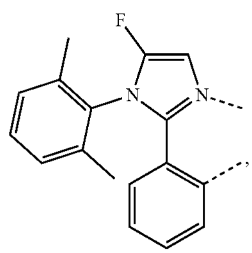
$L_{B445}$
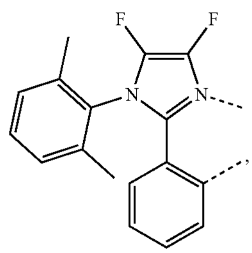
$L_{B446}$
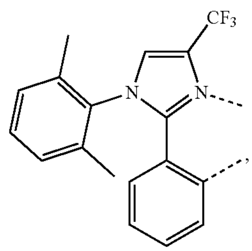
$L_{B447}$
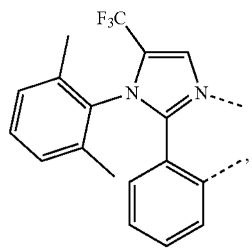
$L_{B448}$
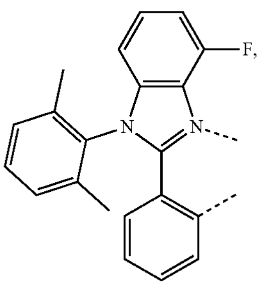
$L_{B449}$
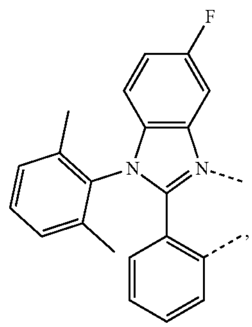

-continued
$L_{B450}$
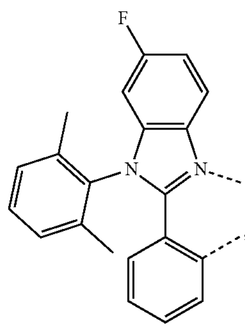
$L_{B451}$
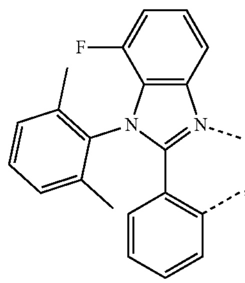
$L_{B452}$
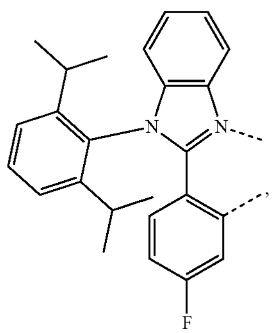
$L_{B453}$
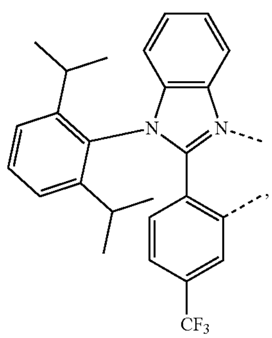
$L_{B454}$
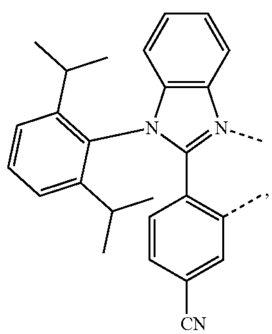
-continued
$L_{B455}$
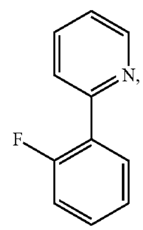
$L_{B456}$
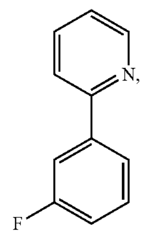
$L_{B457}$
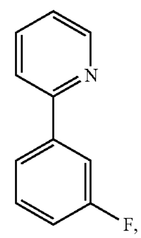
$L_{B458}$
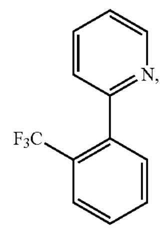
$L_{B459}$
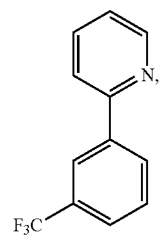
$L_{B460}$
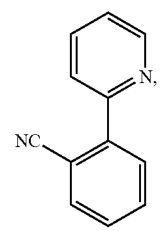

$L_{B461}$
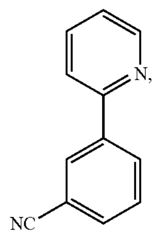
$L_{B462}$
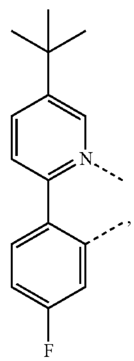
$L_{B463}$
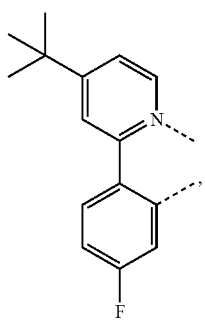
$L_{B464}$
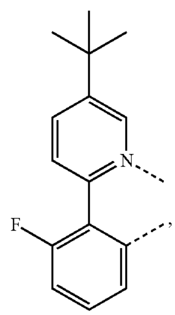
$L_{B465}$
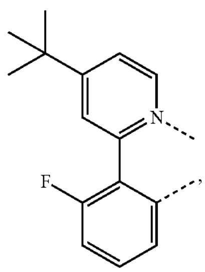
$L_{B466}$
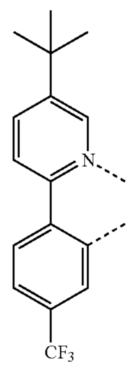
$L_{B467}$
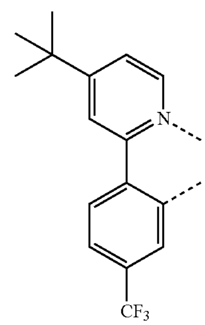
$L_{B468}$
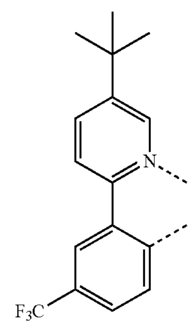
$L_{B469}$
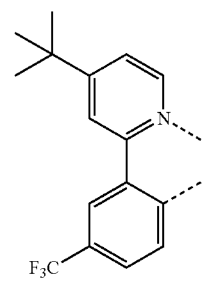

-continued $L_{B470}$

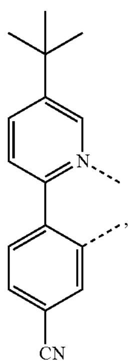

$L_{B471}$

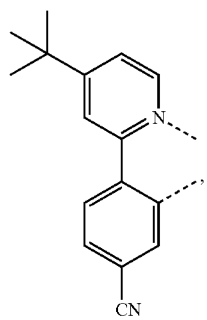

$L_{B472}$ $L_{B473}$

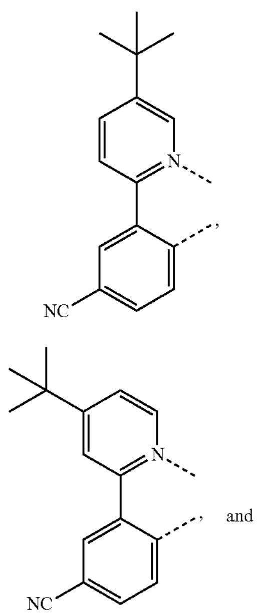

and $L_{B474}$

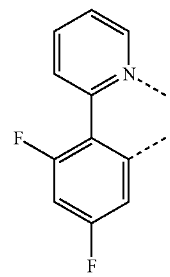

wherein each $L_{Cj-I}$ has a structure based on formula

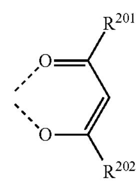

and each $L_{Cj-II}$ has a structure based on formula

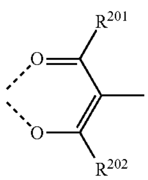

wherein for each $L_{Cj}$, in $L_{Cj-I}$, and $L_{Cj-II}$, $R^{201}$ and $R^{202}$ are each independently defined in the following TABLE 1 as follows:

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C1}$ | $R^{D1}$ | $R^{D1}$ | $L_{C193}$ | $R^{D1}$ | $R^{D3}$ | $L_{C385}$ | $R^{D17}$ | $R^{D40}$ | $L_{C577}$ | $R^{D143}$ | $R^{D120}$ |
| $L_{C2}$ | $R^{D2}$ | $R^{D2}$ | $L_{C194}$ | $R^{D1}$ | $R^{D4}$ | $L_{C386}$ | $R^{D17}$ | $R^{D41}$ | $L_{C578}$ | $R^{D143}$ | $R^{D133}$ |
| $L_{C3}$ | $R^{D3}$ | $R^{D3}$ | $L_{C195}$ | $R^{D1}$ | $R^{D5}$ | $L_{C387}$ | $R^{D17}$ | $R^{D42}$ | $L_{C579}$ | $R^{D143}$ | $R^{D134}$ |
| $L_{C4}$ | $R^{D4}$ | $R^{D4}$ | $L_{C196}$ | $R^{D1}$ | $R^{D9}$ | $L_{C388}$ | $R^{D17}$ | $R^{D43}$ | $L_{C580}$ | $R^{D143}$ | $R^{D135}$ |
| $L_{C5}$ | $R^{D5}$ | $R^{D5}$ | $L_{C197}$ | $R^{D1}$ | $R^{D10}$ | $L_{C389}$ | $R^{D17}$ | $R^{D48}$ | $L_{C581}$ | $R^{D143}$ | $R^{D136}$ |
| $L_{C6}$ | $R^{D6}$ | $R^{D6}$ | $L_{C198}$ | $R^{D1}$ | $R^{D17}$ | $L_{C390}$ | $R^{D17}$ | $R^{D49}$ | $L_{C582}$ | $R^{D143}$ | $R^{D144}$ |
| $L_{C7}$ | $R^{D7}$ | $R^{D7}$ | $L_{C199}$ | $R^{D1}$ | $R^{D18}$ | $L_{C391}$ | $R^{D17}$ | $R^{D50}$ | $L_{C583}$ | $R^{D143}$ | $R^{D145}$ |
| $L_{C8}$ | $R^{D8}$ | $R^{D8}$ | $L_{C200}$ | $R^{D1}$ | $R^{D20}$ | $L_{C392}$ | $R^{D17}$ | $R^{D54}$ | $L_{C584}$ | $R^{D143}$ | $R^{D146}$ |
| $L_{C9}$ | $R^{D9}$ | $R^{D9}$ | $L_{C201}$ | $R^{D1}$ | $R^{D22}$ | $L_{C393}$ | $R^{D17}$ | $R^{D55}$ | $L_{C585}$ | $R^{D143}$ | $R^{D147}$ |
| $L_{C10}$ | $R^{D10}$ | $R^{D10}$ | $L_{C202}$ | $R^{D1}$ | $R^{D37}$ | $L_{C394}$ | $R^{D17}$ | $R^{D58}$ | $L_{C586}$ | $R^{D143}$ | $R^{D149}$ |
| $L_{C11}$ | $R^{D11}$ | $R^{D11}$ | $L_{C203}$ | $R^{D1}$ | $R^{D40}$ | $L_{C395}$ | $R^{D17}$ | $R^{D59}$ | $L_{C587}$ | $R^{D143}$ | $R^{D151}$ |
| $L_{C12}$ | $R^{D12}$ | $R^{D12}$ | $L_{C204}$ | $R^{D1}$ | $R^{D41}$ | $L_{C396}$ | $R^{D17}$ | $R^{D78}$ | $L_{C588}$ | $R^{D143}$ | $R^{D154}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C13}$ | $R^{D13}$ | $R^{D13}$ | $L_{C205}$ | $R^{D1}$ | $R^{D42}$ | $L_{C397}$ | $R^{D17}$ | $R^{D79}$ | $L_{C589}$ | $R^{D143}$ | $R^{D155}$ |
| $L_{C14}$ | $R^{D14}$ | $R^{D14}$ | $L_{C206}$ | $R^{D1}$ | $R^{D43}$ | $L_{C398}$ | $R^{D17}$ | $R^{D81}$ | $L_{C590}$ | $R^{D143}$ | $R^{D161}$ |
| $L_{C15}$ | $R^{D15}$ | $R^{D15}$ | $L_{C207}$ | $R^{D1}$ | $R^{D48}$ | $L_{C399}$ | $R^{D17}$ | $R^{D87}$ | $L_{C591}$ | $R^{D143}$ | $R^{D175}$ |
| $L_{C16}$ | $R^{D16}$ | $R^{D16}$ | $L_{C208}$ | $R^{D1}$ | $R^{D49}$ | $L_{C400}$ | $R^{D17}$ | $R^{D88}$ | $L_{C592}$ | $R^{D144}$ | $R^{D3}$ |
| $L_{C17}$ | $R^{D17}$ | $R^{D17}$ | $L_{C209}$ | $R^{D1}$ | $R^{D50}$ | $L_{C401}$ | $R^{D17}$ | $R^{D89}$ | $L_{C593}$ | $R^{D144}$ | $R^{D5}$ |
| $L_{C18}$ | $R^{D18}$ | $R^{D18}$ | $L_{C210}$ | $R^{D1}$ | $R^{D54}$ | $L_{C402}$ | $R^{D17}$ | $R^{D93}$ | $L_{C594}$ | $R^{D144}$ | $R^{D17}$ |
| $L_{C19}$ | $R^{D19}$ | $R^{D19}$ | $L_{C211}$ | $R^{D1}$ | $R^{D55}$ | $L_{C403}$ | $R^{D17}$ | $R^{D116}$ | $L_{C595}$ | $R^{D144}$ | $R^{D18}$ |
| $L_{C20}$ | $R^{D20}$ | $R^{D20}$ | $L_{C212}$ | $R^{D1}$ | $R^{D58}$ | $L_{C404}$ | $R^{D17}$ | $R^{D117}$ | $L_{C596}$ | $R^{D144}$ | $R^{D20}$ |
| $L_{C21}$ | $R^{D21}$ | $R^{D21}$ | $L_{C213}$ | $R^{D1}$ | $R^{D59}$ | $L_{C405}$ | $R^{D17}$ | $R^{D118}$ | $L_{C597}$ | $R^{D144}$ | $R^{D22}$ |
| $L_{C22}$ | $R^{D22}$ | $R^{D22}$ | $L_{C214}$ | $R^{D1}$ | $R^{D78}$ | $L_{C406}$ | $R^{D17}$ | $R^{D119}$ | $L_{C598}$ | $R^{D144}$ | $R^{D37}$ |
| $L_{C23}$ | $R^{D23}$ | $R^{D23}$ | $L_{C215}$ | $R^{D1}$ | $R^{D79}$ | $L_{C407}$ | $R^{D17}$ | $R^{D120}$ | $L_{C599}$ | $R^{D144}$ | $R^{D40}$ |
| $L_{C24}$ | $R^{D24}$ | $R^{D24}$ | $L_{C216}$ | $R^{D1}$ | $R^{D81}$ | $L_{C408}$ | $R^{D17}$ | $R^{D133}$ | $L_{C600}$ | $R^{D144}$ | $R^{D41}$ |
| $L_{C25}$ | $R^{D25}$ | $R^{D25}$ | $L_{C217}$ | $R^{D1}$ | $R^{D87}$ | $L_{C409}$ | $R^{D17}$ | $R^{D134}$ | $L_{C601}$ | $R^{D144}$ | $R^{D42}$ |
| $L_{C26}$ | $R^{D26}$ | $R^{D26}$ | $L_{C218}$ | $R^{D1}$ | $R^{D88}$ | $L_{C410}$ | $R^{D17}$ | $R^{D135}$ | $L_{C602}$ | $R^{D144}$ | $R^{D43}$ |
| $L_{C27}$ | $R^{D27}$ | $R^{D27}$ | $L_{C219}$ | $R^{D1}$ | $R^{D89}$ | $L_{C411}$ | $R^{D17}$ | $R^{D136}$ | $L_{C603}$ | $R^{D144}$ | $R^{D48}$ |
| $L_{C28}$ | $R^{D28}$ | $R^{D28}$ | $L_{C220}$ | $R^{D1}$ | $R^{D93}$ | $L_{C412}$ | $R^{D17}$ | $R^{D143}$ | $L_{C604}$ | $R^{D144}$ | $R^{D49}$ |
| $L_{C29}$ | $R^{D29}$ | $R^{D29}$ | $L_{C221}$ | $R^{D1}$ | $R^{D116}$ | $L_{C413}$ | $R^{D17}$ | $R^{D144}$ | $L_{C605}$ | $R^{D144}$ | $R^{D54}$ |
| $L_{C30}$ | $R^{D30}$ | $R^{D30}$ | $L_{C222}$ | $R^{D1}$ | $R^{D117}$ | $L_{C414}$ | $R^{D17}$ | $R^{D145}$ | $L_{C606}$ | $R^{D144}$ | $R^{D58}$ |
| $L_{C31}$ | $R^{D31}$ | $R^{D31}$ | $L_{C223}$ | $R^{D1}$ | $R^{D118}$ | $L_{C415}$ | $R^{D17}$ | $R^{D146}$ | $L_{C607}$ | $R^{D144}$ | $R^{D59}$ |
| $L_{C32}$ | $R^{D32}$ | $R^{D32}$ | $L_{C224}$ | $R^{D1}$ | $R^{D119}$ | $L_{C416}$ | $R^{D17}$ | $R^{D147}$ | $L_{C608}$ | $R^{D144}$ | $R^{D78}$ |
| $L_{C33}$ | $R^{D33}$ | $R^{D33}$ | $L_{C225}$ | $R^{D1}$ | $R^{D120}$ | $L_{C417}$ | $R^{D17}$ | $R^{D149}$ | $L_{C609}$ | $R^{D144}$ | $R^{D79}$ |
| $L_{C34}$ | $R^{D34}$ | $R^{D34}$ | $L_{C226}$ | $R^{D1}$ | $R^{D133}$ | $L_{C418}$ | $R^{D17}$ | $R^{D151}$ | $L_{C610}$ | $R^{D144}$ | $R^{D81}$ |
| $L_{C35}$ | $R^{D35}$ | $R^{D35}$ | $L_{C227}$ | $R^{D1}$ | $R^{D134}$ | $L_{C419}$ | $R^{D17}$ | $R^{D154}$ | $L_{C611}$ | $R^{D144}$ | $R^{D87}$ |
| $L_{C36}$ | $R^{D36}$ | $R^{D36}$ | $L_{C228}$ | $R^{D1}$ | $R^{D135}$ | $L_{C420}$ | $R^{D17}$ | $R^{D155}$ | $L_{C612}$ | $R^{D144}$ | $R^{D88}$ |
| $L_{C37}$ | $R^{D37}$ | $R^{D37}$ | $L_{C229}$ | $R^{D1}$ | $R^{D136}$ | $L_{C421}$ | $R^{D17}$ | $R^{D161}$ | $L_{C613}$ | $R^{D144}$ | $R^{D89}$ |
| $L_{C38}$ | $R^{D38}$ | $R^{D38}$ | $L_{C230}$ | $R^{D1}$ | $R^{D143}$ | $L_{C422}$ | $R^{D17}$ | $R^{D175}$ | $L_{C614}$ | $R^{D144}$ | $R^{D93}$ |
| $L_{C39}$ | $R^{D39}$ | $R^{D39}$ | $L_{C231}$ | $R^{D1}$ | $R^{D144}$ | $L_{C423}$ | $R^{D50}$ | $R^{D3}$ | $L_{C615}$ | $R^{D144}$ | $R^{D116}$ |
| $L_{C40}$ | $R^{D40}$ | $R^{D40}$ | $L_{C232}$ | $R^{D1}$ | $R^{D145}$ | $L_{C424}$ | $R^{D50}$ | $R^{D5}$ | $L_{C616}$ | $R^{D144}$ | $R^{D117}$ |
| $L_{C41}$ | $R^{D41}$ | $R^{D41}$ | $L_{C233}$ | $R^{D1}$ | $R^{D146}$ | $L_{C425}$ | $R^{D50}$ | $R^{D18}$ | $L_{C617}$ | $R^{D144}$ | $R^{D118}$ |
| $L_{C42}$ | $R^{D42}$ | $R^{D42}$ | $L_{C234}$ | $R^{D1}$ | $R^{D147}$ | $L_{C426}$ | $R^{D50}$ | $R^{D20}$ | $L_{C618}$ | $R^{D144}$ | $R^{D119}$ |
| $L_{C43}$ | $R^{D43}$ | $R^{D43}$ | $L_{C235}$ | $R^{D1}$ | $R^{D149}$ | $L_{C427}$ | $R^{D50}$ | $R^{D22}$ | $L_{C619}$ | $R^{D144}$ | $R^{D120}$ |
| $L_{C44}$ | $R^{D44}$ | $R^{D44}$ | $L_{C236}$ | $R^{D1}$ | $R^{D151}$ | $L_{C428}$ | $R^{D50}$ | $R^{D37}$ | $L_{C620}$ | $R^{D144}$ | $R^{D133}$ |
| $L_{C45}$ | $R^{D45}$ | $R^{D45}$ | $L_{C237}$ | $R^{D1}$ | $R^{D154}$ | $L_{C429}$ | $R^{D50}$ | $R^{D40}$ | $L_{C621}$ | $R^{D144}$ | $R^{D134}$ |
| $L_{C46}$ | $R^{D46}$ | $R^{D46}$ | $L_{C238}$ | $R^{D1}$ | $R^{D155}$ | $L_{C430}$ | $R^{D50}$ | $R^{D41}$ | $L_{C622}$ | $R^{D144}$ | $R^{D135}$ |
| $L_{C47}$ | $R^{D47}$ | $R^{D47}$ | $L_{C239}$ | $R^{D1}$ | $R^{D161}$ | $L_{C431}$ | $R^{D50}$ | $R^{D42}$ | $L_{C623}$ | $R^{D144}$ | $R^{D136}$ |
| $L_{C48}$ | $R^{D48}$ | $R^{D48}$ | $L_{C240}$ | $R^{D1}$ | $R^{D175}$ | $L_{C432}$ | $R^{D50}$ | $R^{D43}$ | $L_{C624}$ | $R^{D144}$ | $R^{D145}$ |
| $L_{C49}$ | $R^{D49}$ | $R^{D49}$ | $L_{C241}$ | $R^{D4}$ | $R^{D3}$ | $L_{C433}$ | $R^{D50}$ | $R^{D48}$ | $L_{C625}$ | $R^{D144}$ | $R^{D146}$ |
| $L_{C50}$ | $R^{D50}$ | $R^{D50}$ | $L_{C242}$ | $R^{D4}$ | $R^{D5}$ | $L_{C434}$ | $R^{D50}$ | $R^{D49}$ | $L_{C626}$ | $R^{D144}$ | $R^{D147}$ |
| $L_{C51}$ | $R^{D51}$ | $R^{D51}$ | $L_{C243}$ | $R^{D4}$ | $R^{D9}$ | $L_{C435}$ | $R^{D50}$ | $R^{D54}$ | $L_{C627}$ | $R^{D144}$ | $R^{D149}$ |
| $L_{C52}$ | $R^{D52}$ | $R^{D52}$ | $L_{C244}$ | $R^{D4}$ | $R^{D10}$ | $L_{C436}$ | $R^{D50}$ | $R^{D55}$ | $L_{C628}$ | $R^{D144}$ | $R^{D151}$ |
| $L_{C53}$ | $R^{D53}$ | $R^{D53}$ | $L_{C245}$ | $R^{D4}$ | $R^{D17}$ | $L_{C437}$ | $R^{D50}$ | $R^{D58}$ | $L_{C629}$ | $R^{D144}$ | $R^{D154}$ |
| $L_{C54}$ | $R^{D54}$ | $R^{D54}$ | $L_{C246}$ | $R^{D4}$ | $R^{D18}$ | $L_{C438}$ | $R^{D50}$ | $R^{D59}$ | $L_{C630}$ | $R^{D144}$ | $R^{D155}$ |
| $L_{C55}$ | $R^{D55}$ | $R^{D55}$ | $L_{C247}$ | $R^{D4}$ | $R^{D20}$ | $L_{C439}$ | $R^{D50}$ | $R^{D78}$ | $L_{C631}$ | $R^{D144}$ | $R^{D161}$ |
| $L_{C56}$ | $R^{D56}$ | $R^{D56}$ | $L_{C248}$ | $R^{D4}$ | $R^{D22}$ | $L_{C440}$ | $R^{D50}$ | $R^{D79}$ | $L_{C632}$ | $R^{D144}$ | $R^{D175}$ |
| $L_{C57}$ | $R^{D57}$ | $R^{D57}$ | $L_{C249}$ | $R^{D4}$ | $R^{D37}$ | $L_{C441}$ | $R^{D50}$ | $R^{D81}$ | $L_{C633}$ | $R^{D145}$ | $R^{D3}$ |
| $L_{C58}$ | $R^{D58}$ | $R^{D58}$ | $L_{C250}$ | $R^{D4}$ | $R^{D40}$ | $L_{C442}$ | $R^{D50}$ | $R^{D87}$ | $L_{C634}$ | $R^{D145}$ | $R^{D5}$ |
| $L_{C59}$ | $R^{D59}$ | $R^{D59}$ | $L_{C251}$ | $R^{D4}$ | $R^{D41}$ | $L_{C443}$ | $R^{D50}$ | $R^{D88}$ | $L_{C635}$ | $R^{D145}$ | $R^{D17}$ |
| $L_{C60}$ | $R^{D60}$ | $R^{D60}$ | $L_{C252}$ | $R^{D4}$ | $R^{D42}$ | $L_{C444}$ | $R^{D50}$ | $R^{D89}$ | $L_{C636}$ | $R^{D145}$ | $R^{D18}$ |
| $L_{C61}$ | $R^{D61}$ | $R^{D61}$ | $L_{C253}$ | $R^{D4}$ | $R^{D43}$ | $L_{C445}$ | $R^{D50}$ | $R^{D93}$ | $L_{C637}$ | $R^{D145}$ | $R^{D20}$ |
| $L_{C62}$ | $R^{D62}$ | $R^{D62}$ | $L_{C254}$ | $R^{D4}$ | $R^{D48}$ | $L_{C446}$ | $R^{D50}$ | $R^{D116}$ | $L_{C638}$ | $R^{D145}$ | $R^{D22}$ |
| $L_{C63}$ | $R^{D63}$ | $R^{D63}$ | $L_{C255}$ | $R^{D4}$ | $R^{D49}$ | $L_{C447}$ | $R^{D50}$ | $R^{D117}$ | $L_{C639}$ | $R^{D145}$ | $R^{D37}$ |
| $L_{C64}$ | $R^{D64}$ | $R^{D64}$ | $L_{C256}$ | $R^{D4}$ | $R^{D50}$ | $L_{C448}$ | $R^{D50}$ | $R^{D118}$ | $L_{C640}$ | $R^{D145}$ | $R^{D40}$ |
| $L_{C65}$ | $R^{D65}$ | $R^{D65}$ | $L_{C257}$ | $R^{D4}$ | $R^{D54}$ | $L_{C449}$ | $R^{D50}$ | $R^{D119}$ | $L_{C641}$ | $R^{D145}$ | $R^{D41}$ |
| $L_{C66}$ | $R^{D66}$ | $R^{D66}$ | $L_{C258}$ | $R^{D4}$ | $R^{D55}$ | $L_{C450}$ | $R^{D50}$ | $R^{D120}$ | $L_{C642}$ | $R^{D145}$ | $R^{D42}$ |
| $L_{C67}$ | $R^{D67}$ | $R^{D67}$ | $L_{C259}$ | $R^{D4}$ | $R^{D58}$ | $L_{C451}$ | $R^{D50}$ | $R^{D133}$ | $L_{C643}$ | $R^{D145}$ | $R^{D43}$ |
| $L_{C68}$ | $R^{D68}$ | $R^{D68}$ | $L_{C260}$ | $R^{D4}$ | $R^{D59}$ | $L_{C452}$ | $R^{D50}$ | $R^{D134}$ | $L_{C644}$ | $R^{D145}$ | $R^{D48}$ |
| $L_{C69}$ | $R^{D69}$ | $R^{D69}$ | $L_{C261}$ | $R^{D4}$ | $R^{D78}$ | $L_{C453}$ | $R^{D50}$ | $R^{D135}$ | $L_{C645}$ | $R^{D145}$ | $R^{D49}$ |
| $L_{C70}$ | $R^{D70}$ | $R^{D70}$ | $L_{C262}$ | $R^{D4}$ | $R^{D79}$ | $L_{C454}$ | $R^{D50}$ | $R^{D136}$ | $L_{C646}$ | $R^{D145}$ | $R^{D54}$ |
| $L_{C71}$ | $R^{D71}$ | $R^{D71}$ | $L_{C263}$ | $R^{D4}$ | $R^{D81}$ | $L_{C455}$ | $R^{D50}$ | $R^{D143}$ | $L_{C647}$ | $R^{D145}$ | $R^{D58}$ |
| $L_{C72}$ | $R^{D72}$ | $R^{D72}$ | $L_{C264}$ | $R^{D4}$ | $R^{D87}$ | $L_{C456}$ | $R^{D50}$ | $R^{D144}$ | $L_{C648}$ | $R^{D145}$ | $R^{D59}$ |
| $L_{C73}$ | $R^{D73}$ | $R^{D73}$ | $L_{C265}$ | $R^{D4}$ | $R^{D88}$ | $L_{C457}$ | $R^{D50}$ | $R^{D145}$ | $L_{C649}$ | $R^{D145}$ | $R^{D78}$ |
| $L_{C74}$ | $R^{D74}$ | $R^{D74}$ | $L_{C266}$ | $R^{D4}$ | $R^{D89}$ | $L_{C458}$ | $R^{D50}$ | $R^{D146}$ | $L_{C650}$ | $R^{D145}$ | $R^{D79}$ |
| $L_{C75}$ | $R^{D75}$ | $R^{D75}$ | $L_{C267}$ | $R^{D4}$ | $R^{D93}$ | $L_{C459}$ | $R^{D50}$ | $R^{D147}$ | $L_{C651}$ | $R^{D145}$ | $R^{D81}$ |
| $L_{C76}$ | $R^{D76}$ | $R^{D76}$ | $L_{C268}$ | $R^{D4}$ | $R^{D116}$ | $L_{C460}$ | $R^{D50}$ | $R^{D149}$ | $L_{C652}$ | $R^{D145}$ | $R^{D87}$ |
| $L_{C77}$ | $R^{D77}$ | $R^{D77}$ | $L_{C269}$ | $R^{D4}$ | $R^{D117}$ | $L_{C461}$ | $R^{D50}$ | $R^{D151}$ | $L_{C653}$ | $R^{D145}$ | $R^{D88}$ |
| $L_{C78}$ | $R^{D78}$ | $R^{D78}$ | $L_{C270}$ | $R^{D4}$ | $R^{D118}$ | $L_{C462}$ | $R^{D50}$ | $R^{D154}$ | $L_{C654}$ | $R^{D145}$ | $R^{D89}$ |
| $L_{C79}$ | $R^{D79}$ | $R^{D79}$ | $L_{C271}$ | $R^{D4}$ | $R^{D119}$ | $L_{C463}$ | $R^{D50}$ | $R^{D155}$ | $L_{C655}$ | $R^{D145}$ | $R^{D93}$ |
| $L_{C80}$ | $R^{D80}$ | $R^{D80}$ | $L_{C272}$ | $R^{D4}$ | $R^{D120}$ | $L_{C464}$ | $R^{D50}$ | $R^{D161}$ | $L_{C656}$ | $R^{D145}$ | $R^{D116}$ |
| $L_{C81}$ | $R^{D81}$ | $R^{D81}$ | $L_{C273}$ | $R^{D4}$ | $R^{D133}$ | $L_{C465}$ | $R^{D50}$ | $R^{D175}$ | $L_{C657}$ | $R^{D145}$ | $R^{D117}$ |
| $L_{C82}$ | $R^{D82}$ | $R^{D82}$ | $L_{C274}$ | $R^{D4}$ | $R^{D134}$ | $L_{C466}$ | $R^{D55}$ | $R^{D3}$ | $L_{C658}$ | $R^{D145}$ | $R^{D118}$ |
| $L_{C83}$ | $R^{D83}$ | $R^{D83}$ | $L_{C275}$ | $R^{D4}$ | $R^{D135}$ | $L_{C467}$ | $R^{D55}$ | $R^{D5}$ | $L_{C659}$ | $R^{D145}$ | $R^{D119}$ |
| $L_{C84}$ | $R^{D84}$ | $R^{D84}$ | $L_{C276}$ | $R^{D4}$ | $R^{D136}$ | $L_{C468}$ | $R^{D55}$ | $R^{D18}$ | $L_{C660}$ | $R^{D145}$ | $R^{D120}$ |
| $L_{C85}$ | $R^{D85}$ | $R^{D85}$ | $L_{C277}$ | $R^{D4}$ | $R^{D143}$ | $L_{C469}$ | $R^{D55}$ | $R^{D20}$ | $L_{C661}$ | $R^{D145}$ | $R^{D133}$ |
| $L_{C86}$ | $R^{D86}$ | $R^{D86}$ | $L_{C278}$ | $R^{D4}$ | $R^{D144}$ | $L_{C470}$ | $R^{D55}$ | $R^{D22}$ | $L_{C662}$ | $R^{D145}$ | $R^{D134}$ |
| $L_{C87}$ | $R^{D87}$ | $R^{D87}$ | $L_{C279}$ | $R^{D4}$ | $R^{D145}$ | $L_{C471}$ | $R^{D55}$ | $R^{D37}$ | $L_{C663}$ | $R^{D145}$ | $R^{D135}$ |
| $L_{C88}$ | $R^{D88}$ | $R^{D88}$ | $L_{C280}$ | $R^{D4}$ | $R^{D146}$ | $L_{C472}$ | $R^{D55}$ | $R^{D40}$ | $L_{C664}$ | $R^{D145}$ | $R^{D136}$ |
| $L_{C89}$ | $R^{D89}$ | $R^{D89}$ | $L_{C281}$ | $R^{D4}$ | $R^{D147}$ | $L_{C473}$ | $R^{D55}$ | $R^{D41}$ | $L_{C665}$ | $R^{D145}$ | $R^{D146}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C90}$ | $R^{D90}$ | $R^{D90}$ | $L_{C282}$ | $R^{D4}$ | $R^{D149}$ | $L_{C474}$ | $R^{D55}$ | $R^{D42}$ | $L_{C666}$ | $R^{D145}$ | $R^{D147}$ |
| $L_{C91}$ | $R^{D91}$ | $R^{D91}$ | $L_{C283}$ | $R^{D4}$ | $R^{D151}$ | $L_{C475}$ | $R^{D55}$ | $R^{D43}$ | $L_{C667}$ | $R^{D145}$ | $R^{D149}$ |
| $L_{C92}$ | $R^{D92}$ | $R^{D92}$ | $L_{C284}$ | $R^{D4}$ | $R^{D154}$ | $L_{C476}$ | $R^{D55}$ | $R^{D48}$ | $L_{C668}$ | $R^{D145}$ | $R^{D151}$ |
| $L_{C93}$ | $R^{D93}$ | $R^{D93}$ | $L_{C285}$ | $R^{D4}$ | $R^{D155}$ | $L_{C477}$ | $R^{D55}$ | $R^{D49}$ | $L_{C669}$ | $R^{D145}$ | $R^{D154}$ |
| $L_{C94}$ | $R^{D94}$ | $R^{D94}$ | $L_{C286}$ | $R^{D4}$ | $R^{D161}$ | $L_{C478}$ | $R^{D55}$ | $R^{D54}$ | $L_{C670}$ | $R^{D145}$ | $R^{D155}$ |
| $L_{C95}$ | $R^{D95}$ | $R^{D95}$ | $L_{C287}$ | $R^{D4}$ | $R^{D175}$ | $L_{C479}$ | $R^{D55}$ | $R^{D58}$ | $L_{C671}$ | $R^{D145}$ | $R^{D161}$ |
| $L_{C96}$ | $R^{D96}$ | $R^{D96}$ | $L_{C288}$ | $R^{D9}$ | $R^{D3}$ | $L_{C480}$ | $R^{D55}$ | $R^{D59}$ | $L_{C672}$ | $R^{D145}$ | $R^{D175}$ |
| $L_{C97}$ | $R^{D97}$ | $R^{D97}$ | $L_{C289}$ | $R^{D9}$ | $R^{D5}$ | $L_{C481}$ | $R^{D55}$ | $R^{D78}$ | $L_{C673}$ | $R^{D146}$ | $R^{D3}$ |
| $L_{C98}$ | $R^{D98}$ | $R^{D98}$ | $L_{C290}$ | $R^{D9}$ | $R^{D10}$ | $L_{C482}$ | $R^{D55}$ | $R^{D79}$ | $L_{C674}$ | $R^{D146}$ | $R^{D5}$ |
| $L_{C99}$ | $R^{D99}$ | $R^{D99}$ | $L_{C291}$ | $R^{D9}$ | $R^{D17}$ | $L_{C483}$ | $R^{D55}$ | $R^{D81}$ | $L_{C675}$ | $R^{D146}$ | $R^{D17}$ |
| $L_{C100}$ | $R^{D100}$ | $R^{D100}$ | $L_{C292}$ | $R^{D9}$ | $R^{D18}$ | $L_{C484}$ | $R^{D55}$ | $R^{D87}$ | $L_{C676}$ | $R^{D146}$ | $R^{D18}$ |
| $L_{C101}$ | $R^{D101}$ | $R^{D101}$ | $L_{C293}$ | $R^{D9}$ | $R^{D20}$ | $L_{C485}$ | $R^{D55}$ | $R^{D88}$ | $L_{C677}$ | $R^{D146}$ | $R^{D20}$ |
| $L_{C102}$ | $R^{D102}$ | $R^{D102}$ | $L_{C294}$ | $R^{DS}$ | $R^{D22}$ | $L_{C486}$ | $R^{D55}$ | $R^{D89}$ | $L_{C678}$ | $R^{D146}$ | $R^{D22}$ |
| $L_{C103}$ | $R^{D103}$ | $R^{D103}$ | $L_{C295}$ | $R^{D9}$ | $R^{D37}$ | $L_{C487}$ | $R^{D55}$ | $R^{D93}$ | $L_{C679}$ | $R^{D146}$ | $R^{D37}$ |
| $L_{C104}$ | $R^{D104}$ | $R^{D104}$ | $L_{C296}$ | $R^{D9}$ | $R^{D40}$ | $L_{C488}$ | $R^{D55}$ | $R^{D116}$ | $L_{C680}$ | $R^{D146}$ | $R^{D40}$ |
| $L_{C105}$ | $R^{D105}$ | $R^{D105}$ | $L_{C297}$ | $R^{D9}$ | $R^{D41}$ | $L_{C489}$ | $R^{D55}$ | $R^{D117}$ | $L_{C681}$ | $R^{D146}$ | $R^{D41}$ |
| $L_{C106}$ | $R^{D106}$ | $R^{D106}$ | $L_{C298}$ | $R^{D9}$ | $R^{D42}$ | $L_{C490}$ | $R^{D55}$ | $R^{D118}$ | $L_{C682}$ | $R^{D146}$ | $R^{D42}$ |
| $L_{C107}$ | $R^{D107}$ | $R^{D107}$ | $L_{C299}$ | $R^{D9}$ | $R^{D43}$ | $L_{C491}$ | $R^{D55}$ | $R^{D119}$ | $L_{C683}$ | $R^{D146}$ | $R^{D43}$ |
| $L_{C108}$ | $R^{D108}$ | $R^{D108}$ | $L_{C300}$ | $R^{D9}$ | $R^{D48}$ | $L_{C492}$ | $R^{D55}$ | $R^{D120}$ | $L_{C684}$ | $R^{D146}$ | $R^{D48}$ |
| $L_{C109}$ | $R^{D109}$ | $R^{D109}$ | $L_{C301}$ | $R^{D9}$ | $R^{D49}$ | $L_{C493}$ | $R^{D55}$ | $R^{D133}$ | $L_{C685}$ | $R^{D146}$ | $R^{D49}$ |
| $L_{C110}$ | $R^{D110}$ | $R^{D110}$ | $L_{C302}$ | $R^{D9}$ | $R^{D50}$ | $L_{C494}$ | $R^{D55}$ | $R^{D134}$ | $L_{C686}$ | $R^{D146}$ | $R^{D54}$ |
| $L_{C111}$ | $R^{D111}$ | $R^{D111}$ | $L_{C303}$ | $R^{D9}$ | $R^{D54}$ | $L_{C495}$ | $R^{D55}$ | $R^{D135}$ | $L_{C687}$ | $R^{D146}$ | $R^{D58}$ |
| $L_{C112}$ | $R^{D112}$ | $R^{D112}$ | $L_{C304}$ | $R^{D9}$ | $R^{D55}$ | $L_{C496}$ | $R^{D55}$ | $R^{D136}$ | $L_{C688}$ | $R^{D146}$ | $R^{D59}$ |
| $L_{C113}$ | $R^{D113}$ | $R^{D113}$ | $L_{C305}$ | $R^{D9}$ | $R^{D58}$ | $L_{C497}$ | $R^{D55}$ | $R^{D143}$ | $L_{C689}$ | $R^{D146}$ | $R^{D78}$ |
| $L_{C114}$ | $R^{D114}$ | $R^{D114}$ | $L_{C306}$ | $R^{D9}$ | $R^{D59}$ | $L_{C498}$ | $R^{D55}$ | $R^{D144}$ | $L_{C690}$ | $R^{D146}$ | $R^{D79}$ |
| $L_{C115}$ | $R^{D115}$ | $R^{D115}$ | $L_{C307}$ | $R^{D9}$ | $R^{D78}$ | $L_{C499}$ | $R^{D55}$ | $R^{D145}$ | $L_{C691}$ | $R^{D146}$ | $R^{D81}$ |
| $L_{C116}$ | $R^{D116}$ | $R^{D116}$ | $L_{C308}$ | $R^{D9}$ | $R^{D79}$ | $L_{C500}$ | $R^{D55}$ | $R^{D146}$ | $L_{C692}$ | $R^{D146}$ | $R^{D87}$ |
| $L_{C117}$ | $R^{D117}$ | $R^{D117}$ | $L_{C309}$ | $R^{D9}$ | $R^{D81}$ | $L_{C501}$ | $R^{D55}$ | $R^{D147}$ | $L_{C693}$ | $R^{D146}$ | $R^{D88}$ |
| $L_{C118}$ | $R^{D118}$ | $R^{D118}$ | $L_{C310}$ | $R^{D9}$ | $R^{D87}$ | $L_{C502}$ | $R^{D55}$ | $R^{D149}$ | $L_{C694}$ | $R^{D146}$ | $R^{D89}$ |
| $L_{C119}$ | $R^{D119}$ | $R^{D119}$ | $L_{C311}$ | $R^{D9}$ | $R^{D88}$ | $L_{C503}$ | $R^{D55}$ | $R^{D151}$ | $L_{C695}$ | $R^{D146}$ | $R^{D93}$ |
| $L_{C120}$ | $R^{D120}$ | $R^{D120}$ | $L_{C312}$ | $R^{D9}$ | $R^{D89}$ | $L_{C504}$ | $R^{D55}$ | $R^{D154}$ | $L_{C696}$ | $R^{D146}$ | $R^{D117}$ |
| $L_{C121}$ | $R^{D121}$ | $R^{D121}$ | $L_{C313}$ | $R^{D9}$ | $R^{D93}$ | $L_{C505}$ | $R^{D55}$ | $R^{D155}$ | $L_{C697}$ | $R^{D146}$ | $R^{D118}$ |
| $L_{C122}$ | $R^{D122}$ | $R^{D122}$ | $L_{C314}$ | $R^{D9}$ | $R^{D116}$ | $L_{C506}$ | $R^{D55}$ | $R^{D161}$ | $L_{C698}$ | $R^{D146}$ | $R^{D119}$ |
| $L_{C123}$ | $R^{D123}$ | $R^{D123}$ | $L_{C315}$ | $R^{D9}$ | $R^{D117}$ | $L_{C507}$ | $R^{D55}$ | $R^{D175}$ | $L_{C699}$ | $R^{D146}$ | $R^{D120}$ |
| $L_{C124}$ | $R^{D124}$ | $R^{D124}$ | $L_{C316}$ | $R^{D9}$ | $R^{D118}$ | $L_{C508}$ | $R^{D116}$ | $R^{D3}$ | $L_{C700}$ | $R^{D146}$ | $R^{D133}$ |
| $L_{C125}$ | $R^{D125}$ | $R^{D125}$ | $L_{C317}$ | $R^{D9}$ | $R^{D119}$ | $L_{C509}$ | $R^{D116}$ | $R^{D5}$ | $L_{C701}$ | $R^{D146}$ | $R^{D134}$ |
| $L_{C126}$ | $R^{D126}$ | $R^{D126}$ | $L_{C318}$ | $R^{D9}$ | $R^{D120}$ | $L_{C510}$ | $R^{D116}$ | $R^{D17}$ | $L_{C702}$ | $R^{D146}$ | $R^{D135}$ |
| $L_{C127}$ | $R^{D127}$ | $R^{D127}$ | $L_{C319}$ | $R^{D9}$ | $R^{D133}$ | $L_{C511}$ | $R^{D116}$ | $R^{D18}$ | $L_{C703}$ | $R^{D146}$ | $R^{D136}$ |
| $L_{C128}$ | $R^{D128}$ | $R^{D128}$ | $L_{C320}$ | $R^{D9}$ | $R^{D134}$ | $L_{C512}$ | $R^{D116}$ | $R^{D20}$ | $L_{C704}$ | $R^{D146}$ | $R^{D146}$ |
| $L_{C129}$ | $R^{D129}$ | $R^{D129}$ | $L_{C321}$ | $R^{D9}$ | $R^{D135}$ | $L_{C513}$ | $R^{D116}$ | $R^{D22}$ | $L_{C705}$ | $R^{D146}$ | $R^{D147}$ |
| $L_{C130}$ | $R^{D130}$ | $R^{D130}$ | $L_{C322}$ | $R^{D9}$ | $R^{D136}$ | $L_{C514}$ | $R^{D116}$ | $R^{D37}$ | $L_{C706}$ | $R^{D146}$ | $R^{D149}$ |
| $L_{C131}$ | $R^{D131}$ | $R^{D131}$ | $L_{C323}$ | $R^{D9}$ | $R^{D143}$ | $L_{C515}$ | $R^{D116}$ | $R^{D40}$ | $L_{C707}$ | $R^{D146}$ | $R^{D151}$ |
| $L_{C132}$ | $R^{D132}$ | $R^{D132}$ | $L_{C324}$ | $R^{D9}$ | $R^{D144}$ | $L_{C516}$ | $R^{D116}$ | $R^{D41}$ | $L_{C708}$ | $R^{D146}$ | $R^{D154}$ |
| $L_{C133}$ | $R^{D133}$ | $R^{D133}$ | $L_{C325}$ | $R^{D9}$ | $R^{D145}$ | $L_{C517}$ | $R^{D116}$ | $R^{D42}$ | $L_{C709}$ | $R^{D146}$ | $R^{D155}$ |
| $L_{C134}$ | $R^{D134}$ | $R^{D134}$ | $L_{C326}$ | $R^{D9}$ | $R^{D146}$ | $L_{C518}$ | $R^{D116}$ | $R^{D43}$ | $L_{C710}$ | $R^{D146}$ | $R^{D161}$ |
| $L_{C135}$ | $R^{D135}$ | $R^{D135}$ | $L_{C327}$ | $R^{D9}$ | $R^{D147}$ | $L_{C519}$ | $R^{D116}$ | $R^{D48}$ | $L_{C711}$ | $R^{D146}$ | $R^{D175}$ |
| $L_{C136}$ | $R^{D136}$ | $R^{D136}$ | $L_{C328}$ | $R^{D9}$ | $R^{D149}$ | $L_{C520}$ | $R^{D116}$ | $R^{D49}$ | $L_{C712}$ | $R^{D133}$ | $R^{D3}$ |
| $L_{C137}$ | $R^{D137}$ | $R^{D137}$ | $L_{C329}$ | $R^{D9}$ | $R^{D151}$ | $L_{C521}$ | $R^{D116}$ | $R^{D54}$ | $L_{C713}$ | $R^{D133}$ | $R^{D5}$ |
| $L_{C138}$ | $R^{D138}$ | $R^{D138}$ | $L_{C330}$ | $R^{D9}$ | $R^{D154}$ | $L_{C522}$ | $R^{D116}$ | $R^{D58}$ | $L_{C714}$ | $R^{D133}$ | $R^{D3}$ |
| $L_{C139}$ | $R^{D139}$ | $R^{D139}$ | $L_{C331}$ | $R^{DS}$ | $R^{D155}$ | $L_{C523}$ | $R^{D116}$ | $R^{D59}$ | $L_{C715}$ | $R^{D133}$ | $R^{D18}$ |
| $L_{C140}$ | $R^{D140}$ | $R^{D140}$ | $L_{C332}$ | $R^{D9}$ | $R^{D161}$ | $L_{C524}$ | $R^{D116}$ | $R^{D78}$ | $L_{C716}$ | $R^{D133}$ | $R^{D20}$ |
| $L_{C141}$ | $R^{D141}$ | $R^{D141}$ | $L_{C333}$ | $R^{D9}$ | $R^{D175}$ | $L_{C525}$ | $R^{D116}$ | $R^{D79}$ | $L_{C717}$ | $R^{D133}$ | $R^{D22}$ |
| $L_{C142}$ | $R^{D142}$ | $R^{D142}$ | $L_{C344}$ | $R^{D10}$ | $R^{D3}$ | $L_{C526}$ | $R^{D116}$ | $R^{D81}$ | $L_{C718}$ | $R^{D133}$ | $R^{D37}$ |
| $L_{C143}$ | $R^{D143}$ | $R^{D143}$ | $L_{C335}$ | $R^{D10}$ | $R^{D5}$ | $L_{C527}$ | $R^{D116}$ | $R^{D87}$ | $L_{C719}$ | $R^{D133}$ | $R^{D40}$ |
| $L_{C144}$ | $R^{D144}$ | $R^{D144}$ | $L_{C336}$ | $R^{D10}$ | $R^{D17}$ | $L_{C528}$ | $R^{D116}$ | $R^{D88}$ | $L_{C720}$ | $R^{D133}$ | $R^{D41}$ |
| $L_{C145}$ | $R^{D145}$ | $R^{D145}$ | $L_{C337}$ | $R^{D10}$ | $R^{D18}$ | $L_{C529}$ | $R^{D116}$ | $R^{D89}$ | $L_{C721}$ | $R^{D133}$ | $R^{D42}$ |
| $L_{C146}$ | $R^{D146}$ | $R^{D146}$ | $L_{C338}$ | $R^{D10}$ | $R^{D20}$ | $L_{C530}$ | $R^{D116}$ | $R^{D93}$ | $L_{C722}$ | $R^{D133}$ | $R^{D43}$ |
| $L_{C147}$ | $R^{D147}$ | $R^{D147}$ | $L_{C339}$ | $R^{D10}$ | $R^{D22}$ | $L_{C531}$ | $R^{D116}$ | $R^{D117}$ | $L_{C723}$ | $R^{D133}$ | $R^{D48}$ |
| $L_{C148}$ | $R^{D148}$ | $R^{D148}$ | $L_{C340}$ | $R^{D10}$ | $R^{D37}$ | $L_{C532}$ | $R^{D116}$ | $R^{D118}$ | $L_{C724}$ | $R^{D133}$ | $R^{D49}$ |
| $L_{C149}$ | $R^{D149}$ | $R^{D149}$ | $L_{C341}$ | $R^{D10}$ | $R^{D40}$ | $L_{C533}$ | $R^{D116}$ | $R^{D119}$ | $L_{C725}$ | $R^{D133}$ | $R^{D54}$ |
| $L_{C150}$ | $R^{D150}$ | $R^{D150}$ | $L_{C342}$ | $R^{D10}$ | $R^{D41}$ | $L_{C534}$ | $R^{D116}$ | $R^{D120}$ | $L_{C726}$ | $R^{D133}$ | $R^{D58}$ |
| $L_{C151}$ | $R^{D151}$ | $R^{D151}$ | $L_{C343}$ | $R^{D10}$ | $R^{D42}$ | $L_{C535}$ | $R^{D116}$ | $R^{D133}$ | $L_{C727}$ | $R^{D133}$ | $R^{D59}$ |
| $L_{C152}$ | $R^{D152}$ | $R^{D152}$ | $L_{C344}$ | $R^{D10}$ | $R^{D43}$ | $L_{C536}$ | $R^{D116}$ | $R^{D134}$ | $L_{C728}$ | $R^{D133}$ | $R^{D78}$ |
| $L_{C153}$ | $R^{D153}$ | $R^{D153}$ | $L_{C345}$ | $R^{D10}$ | $R^{D48}$ | $L_{C537}$ | $R^{D116}$ | $R^{D135}$ | $L_{C729}$ | $R^{D133}$ | $R^{D79}$ |
| $L_{C154}$ | $R^{D154}$ | $R^{D154}$ | $L_{C346}$ | $R^{D10}$ | $R^{D49}$ | $L_{C538}$ | $R^{D116}$ | $R^{D136}$ | $L_{C730}$ | $R^{D133}$ | $R^{D81}$ |
| $L_{C155}$ | $R^{D155}$ | $R^{D155}$ | $L_{C347}$ | $R^{D10}$ | $R^{D50}$ | $L_{C539}$ | $R^{D116}$ | $R^{D143}$ | $L_{C731}$ | $R^{D133}$ | $R^{D87}$ |
| $L_{C156}$ | $R^{D156}$ | $R^{D156}$ | $L_{C348}$ | $R^{D10}$ | $R^{D54}$ | $L_{C540}$ | $R^{D116}$ | $R^{D144}$ | $L_{C732}$ | $R^{D133}$ | $R^{D88}$ |
| $L_{C157}$ | $R^{D157}$ | $R^{D157}$ | $L_{C349}$ | $R^{D10}$ | $R^{D55}$ | $L_{C541}$ | $R^{D116}$ | $R^{D145}$ | $L_{C733}$ | $R^{D133}$ | $R^{D89}$ |
| $L_{C158}$ | $R^{D158}$ | $R^{D158}$ | $L_{C350}$ | $R^{D10}$ | $R^{D58}$ | $L_{C542}$ | $R^{D116}$ | $R^{D146}$ | $L_{C734}$ | $R^{D133}$ | $R^{D93}$ |
| $L_{C159}$ | $R^{D159}$ | $R^{D159}$ | $L_{C351}$ | $R^{D10}$ | $R^{D59}$ | $L_{C543}$ | $R^{D116}$ | $R^{D147}$ | $L_{C735}$ | $R^{D133}$ | $R^{D117}$ |
| $L_{C160}$ | $R^{D160}$ | $R^{D160}$ | $L_{C352}$ | $R^{D10}$ | $R^{D78}$ | $L_{C544}$ | $R^{D116}$ | $R^{D149}$ | $L_{C736}$ | $R^{D133}$ | $R^{D118}$ |
| $L_{C161}$ | $R^{D161}$ | $R^{D161}$ | $L_{C353}$ | $R^{D10}$ | $R^{D79}$ | $L_{C545}$ | $R^{D116}$ | $R^{D151}$ | $L_{C737}$ | $R^{D133}$ | $R^{D119}$ |
| $L_{C162}$ | $R^{D162}$ | $R^{D162}$ | $L_{C354}$ | $R^{D10}$ | $R^{D81}$ | $L_{C546}$ | $R^{D116}$ | $R^{D154}$ | $L_{C738}$ | $R^{D133}$ | $R^{D120}$ |
| $L_{C163}$ | $R^{D163}$ | $R^{D163}$ | $L_{C355}$ | $R^{D10}$ | $R^{D87}$ | $L_{C547}$ | $R^{D116}$ | $R^{D155}$ | $L_{C739}$ | $R^{D133}$ | $R^{D133}$ |
| $L_{C164}$ | $R^{D164}$ | $R^{D164}$ | $L_{C356}$ | $R^{D10}$ | $R^{D88}$ | $L_{C548}$ | $R^{D116}$ | $R^{D161}$ | $L_{C740}$ | $R^{D133}$ | $R^{D134}$ |
| $L_{C165}$ | $R^{D165}$ | $R^{D165}$ | $L_{C357}$ | $R^{D10}$ | $R^{D89}$ | $L_{C549}$ | $R^{D116}$ | $R^{D175}$ | $L_{C741}$ | $R^{D133}$ | $R^{D135}$ |
| $L_{C166}$ | $R^{D166}$ | $R^{D166}$ | $L_{C358}$ | $R^{D10}$ | $R^{D93}$ | $L_{C550}$ | $R^{D143}$ | $R^{D3}$ | $L_{C742}$ | $R^{D133}$ | $R^{D136}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C167}$ | $R^{D167}$ | $R^{D167}$ | $L_{C359}$ | $R^{D10}$ | $R^{D116}$ | $L_{C551}$ | $R^{D143}$ | $R^{D5}$ | $L_{C743}$ | $R^{D133}$ | $R^{D146}$ |
| $L_{C168}$ | $R^{D168}$ | $R^{D168}$ | $L_{C360}$ | $R^{D10}$ | $R^{D117}$ | $L_{C552}$ | $R^{D143}$ | $R^{D17}$ | $L_{C744}$ | $R^{D133}$ | $R^{D147}$ |
| $L_{C169}$ | $R^{D169}$ | $R^{D169}$ | $L_{C361}$ | $R^{D10}$ | $R^{D118}$ | $L_{C553}$ | $R^{D143}$ | $R^{D18}$ | $L_{C745}$ | $R^{D133}$ | $R^{D149}$ |
| $L_{C170}$ | $R^{D170}$ | $R^{D170}$ | $L_{C362}$ | $R^{D10}$ | $R^{D119}$ | $L_{C554}$ | $R^{D143}$ | $R^{D20}$ | $L_{C746}$ | $R^{D133}$ | $R^{D151}$ |
| $L_{C171}$ | $R^{D171}$ | $R^{D171}$ | $L_{C363}$ | $R^{D10}$ | $R^{D120}$ | $L_{C555}$ | $R^{D143}$ | $R^{D22}$ | $L_{C747}$ | $R^{D133}$ | $R^{D154}$ |
| $L_{C172}$ | $R^{D172}$ | $R^{D172}$ | $L_{C364}$ | $R^{D10}$ | $R^{D133}$ | $L_{C556}$ | $R^{D143}$ | $R^{D37}$ | $L_{C748}$ | $R^{D133}$ | $R^{D155}$ |
| $L_{C173}$ | $R^{D173}$ | $R^{D173}$ | $L_{C365}$ | $R^{D10}$ | $R^{D134}$ | $L_{C557}$ | $R^{D143}$ | $R^{D40}$ | $L_{C749}$ | $R^{D133}$ | $R^{D161}$ |
| $L_{C174}$ | $R^{D174}$ | $R^{D174}$ | $L_{C366}$ | $R^{D10}$ | $R^{D135}$ | $L_{C558}$ | $R^{D143}$ | $R^{D41}$ | $L_{C750}$ | $R^{D133}$ | $R^{D175}$ |
| $L_{C175}$ | $R^{D175}$ | $R^{D175}$ | $L_{C367}$ | $R^{D10}$ | $R^{D136}$ | $L_{C559}$ | $R^{D143}$ | $R^{D42}$ | $L_{C751}$ | $R^{D175}$ | $R^{D3}$ |
| $L_{C176}$ | $R^{D176}$ | $R^{D176}$ | $L_{C368}$ | $R^{D10}$ | $R^{D143}$ | $L_{C560}$ | $R^{D143}$ | $R^{D43}$ | $L_{C752}$ | $R^{D175}$ | $R^{D5}$ |
| $L_{C177}$ | $R^{D177}$ | $R^{D177}$ | $L_{C369}$ | $R^{D10}$ | $R^{D144}$ | $L_{C561}$ | $R^{D143}$ | $R^{D48}$ | $L_{C753}$ | $R^{D175}$ | $R^{D18}$ |
| $L_{C178}$ | $R^{D178}$ | $R^{D178}$ | $L_{C370}$ | $R^{D10}$ | $R^{D145}$ | $L_{C562}$ | $R^{D143}$ | $R^{D49}$ | $L_{C754}$ | $R^{D175}$ | $R^{D20}$ |
| $L_{C179}$ | $R^{D179}$ | $R^{D179}$ | $L_{C371}$ | $R^{D10}$ | $R^{D146}$ | $L_{C563}$ | $R^{D143}$ | $R^{D54}$ | $L_{C755}$ | $R^{D175}$ | $R^{D22}$ |
| $L_{C180}$ | $R^{D180}$ | $R^{D180}$ | $L_{C372}$ | $R^{D10}$ | $R^{D147}$ | $L_{C564}$ | $R^{D143}$ | $R^{D58}$ | $L_{C756}$ | $R^{D175}$ | $R^{D37}$ |
| $L_{C181}$ | $R^{D181}$ | $R^{D181}$ | $L_{C373}$ | $R^{D10}$ | $R^{D149}$ | $L_{C565}$ | $R^{D143}$ | $R^{D59}$ | $L_{C757}$ | $R^{D175}$ | $R^{D40}$ |
| $L_{C182}$ | $R^{D182}$ | $R^{D182}$ | $L_{C374}$ | $R^{D10}$ | $R^{D151}$ | $L_{C566}$ | $R^{D143}$ | $R^{D78}$ | $L_{C758}$ | $R^{D175}$ | $R^{D41}$ |
| $L_{C183}$ | $R^{D183}$ | $R^{D183}$ | $L_{C375}$ | $R^{D10}$ | $R^{D154}$ | $L_{C567}$ | $R^{D143}$ | $R^{D79}$ | $L_{C759}$ | $R^{D175}$ | $R^{D42}$ |
| $L_{C184}$ | $R^{D184}$ | $R^{D184}$ | $L_{C376}$ | $R^{D10}$ | $R^{D155}$ | $L_{C568}$ | $R^{D143}$ | $R^{D81}$ | $L_{C760}$ | $R^{D175}$ | $R^{D43}$ |
| $L_{C185}$ | $R^{D185}$ | $R^{D185}$ | $L_{C377}$ | $R^{D10}$ | $R^{D161}$ | $L_{C569}$ | $R^{D143}$ | $R^{D87}$ | $L_{C761}$ | $R^{D175}$ | $R^{D48}$ |
| $L_{C186}$ | $R^{D186}$ | $R^{D186}$ | $L_{C378}$ | $R^{D10}$ | $R^{D175}$ | $L_{C570}$ | $R^{D143}$ | $R^{D88}$ | $L_{C762}$ | $R^{D175}$ | $R^{D49}$ |
| $L_{C187}$ | $R^{D187}$ | $R^{D187}$ | $L_{C379}$ | $R^{D17}$ | $R^{D3}$ | $L_{C571}$ | $R^{D143}$ | $R^{D89}$ | $L_{C763}$ | $R^{D175}$ | $R^{D54}$ |
| $L_{C188}$ | $R^{D188}$ | $R^{D188}$ | $L_{C380}$ | $R^{D17}$ | $R^{D5}$ | $L_{C572}$ | $R^{D143}$ | $R^{D93}$ | $L_{C764}$ | $R^{D175}$ | $R^{D58}$ |
| $L_{C189}$ | $R^{D189}$ | $R^{D189}$ | $L_{C381}$ | $R^{D17}$ | $R^{D18}$ | $L_{C573}$ | $R^{D143}$ | $R^{D116}$ | $L_{C765}$ | $R^{D175}$ | $R^{D59}$ |
| $L_{C190}$ | $R^{D190}$ | $R^{D190}$ | $L_{C382}$ | $R^{D17}$ | $R^{D20}$ | $L_{C574}$ | $R^{D143}$ | $R^{D117}$ | $L_{C766}$ | $R^{D175}$ | $R^{D78}$ |
| $L_{C191}$ | $R^{D191}$ | $R^{D191}$ | $L_{C383}$ | $R^{D17}$ | $R^{D22}$ | $L_{C575}$ | $R^{D143}$ | $R^{D118}$ | $L_{C767}$ | $R^{D175}$ | $R^{D79}$ |
| $L_{C192}$ | $R^{D192}$ | $R^{D192}$ | $L_{C384}$ | $R^{D17}$ | $R^{D37}$ | $L_{C576}$ | $R^{D143}$ | $R^{D119}$ | $L_{C768}$ | $R^{D175}$ | $R^{D81}$ |
| $L_{C769}$ | $R^{D193}$ | $R^{D193}$ | $L_{C877}$ | $R^{D1}$ | $R^{D193}$ | $L_{C985}$ | $R^{D4}$ | $R^{D193}$ | $L_{C1093}$ | $R^{D9}$ | $R^{D193}$ |
| $L_{C770}$ | $R^{D194}$ | $R^{D194}$ | $L_{C878}$ | $R^{D1}$ | $R^{D194}$ | $L_{C986}$ | $R^{D4}$ | $R^{D194}$ | $L_{C1094}$ | $R^{D9}$ | $R^{D194}$ |
| $L_{C771}$ | $R^{D195}$ | $R^{D195}$ | $L_{C879}$ | $R^{D1}$ | $R^{D195}$ | $L_{C987}$ | $R^{D4}$ | $R^{D195}$ | $L_{C1095}$ | $R^{D9}$ | $R^{D195}$ |
| $L_{C772}$ | $R^{D196}$ | $R^{D196}$ | $L_{C880}$ | $R^{D1}$ | $R^{D196}$ | $L_{C988}$ | $R^{D4}$ | $R^{D196}$ | $L_{C1096}$ | $R^{D9}$ | $R^{D196}$ |
| $L_{C773}$ | $R^{D197}$ | $R^{D197}$ | $L_{C881}$ | $R^{D1}$ | $R^{D197}$ | $L_{C989}$ | $R^{D4}$ | $R^{D197}$ | $L_{C1097}$ | $R^{D9}$ | $R^{D197}$ |
| $L_{C774}$ | $R^{D198}$ | $R^{D198}$ | $L_{C882}$ | $R^{D1}$ | $R^{D198}$ | $L_{C990}$ | $R^{D4}$ | $R^{D198}$ | $L_{C1098}$ | $R^{D9}$ | $R^{D198}$ |
| $L_{C775}$ | $R^{D199}$ | $R^{D199}$ | $L_{C883}$ | $R^{D1}$ | $R^{D199}$ | $L_{C991}$ | $R^{D4}$ | $R^{D199}$ | $L_{C1099}$ | $R^{D9}$ | $R^{D199}$ |
| $L_{C776}$ | $R^{D200}$ | $R^{D200}$ | $L_{C884}$ | $R^{D1}$ | $R^{D200}$ | $L_{C992}$ | $R^{D4}$ | $R^{D200}$ | $L_{C1100}$ | $R^{D9}$ | $R^{D200}$ |
| $L_{C777}$ | $R^{D201}$ | $R^{D201}$ | $L_{C885}$ | $R^{D1}$ | $R^{D201}$ | $L_{C993}$ | $R^{D4}$ | $R^{D201}$ | $L_{C1101}$ | $R^{D9}$ | $R^{D201}$ |
| $L_{C778}$ | $R^{D202}$ | $R^{D202}$ | $L_{C886}$ | $R^{D1}$ | $R^{D202}$ | $L_{C994}$ | $R^{D4}$ | $R^{D202}$ | $L_{C1102}$ | $R^{D9}$ | $R^{D202}$ |
| $L_{C779}$ | $R^{D203}$ | $R^{D203}$ | $L_{C887}$ | $R^{D1}$ | $R^{D203}$ | $L_{C995}$ | $R^{D4}$ | $R^{D203}$ | $L_{C1103}$ | $R^{D9}$ | $R^{D203}$ |
| $L_{C780}$ | $R^{D204}$ | $R^{D204}$ | $L_{C888}$ | $R^{D1}$ | $R^{D204}$ | $L_{C996}$ | $R^{D4}$ | $R^{D204}$ | $L_{C1104}$ | $R^{D9}$ | $R^{D204}$ |
| $L_{C781}$ | $R^{D205}$ | $R^{D205}$ | $L_{C889}$ | $R^{D1}$ | $R^{D205}$ | $L_{C997}$ | $R^{D4}$ | $R^{D205}$ | $L_{C1105}$ | $R^{D9}$ | $R^{D205}$ |
| $L_{C782}$ | $R^{D206}$ | $R^{D206}$ | $L_{C890}$ | $R^{D1}$ | $R^{D206}$ | $L_{C998}$ | $R^{D4}$ | $R^{D206}$ | $L_{C1106}$ | $R^{D9}$ | $R^{D206}$ |
| $L_{C783}$ | $R^{D207}$ | $R^{D207}$ | $L_{C891}$ | $R^{D1}$ | $R^{D207}$ | $L_{C999}$ | $R^{D4}$ | $R^{D207}$ | $L_{C1107}$ | $R^{D9}$ | $R^{D207}$ |
| $L_{C784}$ | $R^{D208}$ | $R^{D208}$ | $L_{C892}$ | $R^{D1}$ | $R^{D208}$ | $L_{C1000}$ | $R^{D4}$ | $R^{D208}$ | $L_{C1108}$ | $R^{D9}$ | $R^{D208}$ |
| $L_{C785}$ | $R^{D209}$ | $R^{D209}$ | $L_{C893}$ | $R^{D1}$ | $R^{D209}$ | $L_{C1001}$ | $R^{D4}$ | $R^{D209}$ | $L_{C1109}$ | $R^{D9}$ | $R^{D209}$ |
| $L_{C786}$ | $R^{D210}$ | $R^{D210}$ | $L_{C894}$ | $R^{D1}$ | $R^{D210}$ | $L_{C1002}$ | $R^{D4}$ | $R^{D210}$ | $L_{C1110}$ | $R^{D9}$ | $R^{D210}$ |
| $L_{C787}$ | $R^{D211}$ | $R^{D211}$ | $L_{C895}$ | $R^{D1}$ | $R^{D211}$ | $L_{C1003}$ | $R^{D4}$ | $R^{D211}$ | $L_{C1111}$ | $R^{D9}$ | $R^{D211}$ |
| $L_{C788}$ | $R^{D212}$ | $R^{D212}$ | $L_{C896}$ | $R^{D1}$ | $R^{D212}$ | $L_{C1004}$ | $R^{D4}$ | $R^{D212}$ | $L_{C1112}$ | $R^{D9}$ | $R^{D212}$ |
| $L_{C789}$ | $R^{D213}$ | $R^{D213}$ | $L_{C897}$ | $R^{D1}$ | $R^{D213}$ | $L_{C1005}$ | $R^{D4}$ | $R^{D213}$ | $L_{C1113}$ | $R^{D9}$ | $R^{D213}$ |
| $L_{C790}$ | $R^{D214}$ | $R^{D214}$ | $L_{C898}$ | $R^{D1}$ | $R^{D214}$ | $L_{C1006}$ | $R^{D4}$ | $R^{D214}$ | $L_{C1114}$ | $R^{D9}$ | $R^{D214}$ |
| $L_{C791}$ | $R^{D215}$ | $R^{D215}$ | $L_{C899}$ | $R^{D1}$ | $R^{D215}$ | $L_{C1007}$ | $R^{D4}$ | $R^{D215}$ | $L_{C1115}$ | $R^{D9}$ | $R^{D215}$ |
| $L_{C792}$ | $R^{D216}$ | $R^{D216}$ | $L_{C900}$ | $R^{D1}$ | $R^{D216}$ | $L_{C1008}$ | $R^{D4}$ | $R^{D216}$ | $L_{C1116}$ | $R^{D9}$ | $R^{D216}$ |
| $L_{C793}$ | $R^{D217}$ | $R^{D217}$ | $L_{C901}$ | $R^{D1}$ | $R^{D217}$ | $L_{C1009}$ | $R^{D4}$ | $R^{D217}$ | $L_{C1117}$ | $R^{D9}$ | $R^{D217}$ |
| $L_{C794}$ | $R^{D218}$ | $R^{D218}$ | $L_{C902}$ | $R^{D1}$ | $R^{D218}$ | $L_{C1010}$ | $R^{D4}$ | $R^{D218}$ | $L_{C1118}$ | $R^{D9}$ | $R^{D218}$ |
| $L_{C795}$ | $R^{D219}$ | $R^{D219}$ | $L_{C903}$ | $R^{D1}$ | $R^{D219}$ | $L_{C1011}$ | $R^{D4}$ | $R^{D219}$ | $L_{C1119}$ | $R^{D9}$ | $R^{D219}$ |
| $L_{C796}$ | $R^{D220}$ | $R^{D220}$ | $L_{C904}$ | $R^{D1}$ | $R^{D220}$ | $L_{C1012}$ | $R^{D4}$ | $R^{D220}$ | $L_{C1120}$ | $R^{D9}$ | $R^{D220}$ |
| $L_{C797}$ | $R^{D221}$ | $R^{D221}$ | $L_{C905}$ | $R^{D1}$ | $R^{D221}$ | $L_{C1013}$ | $R^{D4}$ | $R^{D221}$ | $L_{C1121}$ | $R^{D9}$ | $R^{D221}$ |
| $L_{C798}$ | $R^{D222}$ | $R^{D222}$ | $L_{C906}$ | $R^{D1}$ | $R^{D222}$ | $L_{C1014}$ | $R^{D4}$ | $R^{D222}$ | $L_{C1122}$ | $R^{D9}$ | $R^{D222}$ |
| $L_{C799}$ | $R^{D223}$ | $R^{D223}$ | $L_{C907}$ | $R^{D1}$ | $R^{D223}$ | $L_{C1015}$ | $R^{D4}$ | $R^{D223}$ | $L_{C1123}$ | $R^{D9}$ | $R^{D223}$ |
| $L_{C800}$ | $R^{D224}$ | $R^{D224}$ | $L_{C908}$ | $R^{D1}$ | $R^{D224}$ | $L_{C1016}$ | $R^{D4}$ | $R^{D224}$ | $L_{C1124}$ | $R^{D9}$ | $R^{D224}$ |
| $L_{C801}$ | $R^{D225}$ | $R^{D225}$ | $L_{C909}$ | $R^{D1}$ | $R^{D225}$ | $L_{C1017}$ | $R^{D4}$ | $R^{D225}$ | $L_{C1125}$ | $R^{D9}$ | $R^{D225}$ |
| $L_{C802}$ | $R^{D226}$ | $R^{D226}$ | $L_{C910}$ | $R^{D1}$ | $R^{D226}$ | $L_{C1018}$ | $R^{D4}$ | $R^{D226}$ | $L_{C1126}$ | $R^{D9}$ | $R^{D226}$ |
| $L_{C803}$ | $R^{D227}$ | $R^{D227}$ | $L_{C911}$ | $R^{D1}$ | $R^{D227}$ | $L_{C1019}$ | $R^{D4}$ | $R^{D227}$ | $L_{C1127}$ | $R^{D9}$ | $R^{D227}$ |
| $L_{C804}$ | $R^{D228}$ | $R^{D228}$ | $L_{C912}$ | $R^{D1}$ | $R^{D228}$ | $L_{C1020}$ | $R^{D4}$ | $R^{D228}$ | $L_{C1128}$ | $R^{D9}$ | $R^{D228}$ |
| $L_{C805}$ | $R^{D229}$ | $R^{D229}$ | $L_{C913}$ | $R^{D1}$ | $R^{D229}$ | $L_{C1021}$ | $R^{D4}$ | $R^{D229}$ | $L_{C1129}$ | $R^{D9}$ | $R^{D229}$ |
| $L_{C806}$ | $R^{D230}$ | $R^{D230}$ | $L_{C914}$ | $R^{D1}$ | $R^{D230}$ | $L_{C1022}$ | $R^{D4}$ | $R^{D230}$ | $L_{C1130}$ | $R^{D9}$ | $R^{D230}$ |
| $L_{C807}$ | $R^{D231}$ | $R^{D231}$ | $L_{C915}$ | $R^{D1}$ | $R^{D231}$ | $L_{C1023}$ | $R^{D4}$ | $R^{D231}$ | $L_{C1131}$ | $R^{D9}$ | $R^{D231}$ |
| $L_{C808}$ | $R^{D232}$ | $R^{D232}$ | $L_{C916}$ | $R^{D1}$ | $R^{D232}$ | $L_{C1024}$ | $R^{D4}$ | $R^{D232}$ | $L_{C1132}$ | $R^{D9}$ | $R^{D232}$ |
| $L_{C809}$ | $R^{D233}$ | $R^{D233}$ | $L_{C917}$ | $R^{D1}$ | $R^{D233}$ | $L_{C1025}$ | $R^{D4}$ | $R^{D233}$ | $L_{C1133}$ | $R^{D9}$ | $R^{D233}$ |
| $L_{C810}$ | $R^{D234}$ | $R^{D234}$ | $L_{C918}$ | $R^{D1}$ | $R^{D234}$ | $L_{C1026}$ | $R^{D4}$ | $R^{D234}$ | $L_{C1134}$ | $R^{D9}$ | $R^{D234}$ |
| $L_{C811}$ | $R^{D235}$ | $R^{D235}$ | $L_{C919}$ | $R^{D1}$ | $R^{D235}$ | $L_{C1027}$ | $R^{D4}$ | $R^{D235}$ | $L_{C1135}$ | $R^{D9}$ | $R^{D235}$ |
| $L_{C812}$ | $R^{D236}$ | $R^{D236}$ | $L_{C920}$ | $R^{D1}$ | $R^{D236}$ | $L_{C1028}$ | $R^{D4}$ | $R^{D236}$ | $L_{C1136}$ | $R^{D9}$ | $R^{D236}$ |
| $L_{C813}$ | $R^{D237}$ | $R^{D237}$ | $L_{C921}$ | $R^{D1}$ | $R^{D237}$ | $L_{C1029}$ | $R^{D4}$ | $R^{D237}$ | $L_{C1137}$ | $R^{D9}$ | $R^{D237}$ |
| $L_{C814}$ | $R^{D238}$ | $R^{D238}$ | $L_{C922}$ | $R^{D1}$ | $R^{D238}$ | $L_{C1030}$ | $R^{D4}$ | $R^{D238}$ | $L_{C1138}$ | $R^{D9}$ | $R^{D238}$ |
| $L_{C815}$ | $R^{D239}$ | $R^{D239}$ | $L_{C923}$ | $R^{D1}$ | $R^{D239}$ | $L_{C1031}$ | $R^{D4}$ | $R^{D239}$ | $L_{C1139}$ | $R^{D9}$ | $R^{D239}$ |
| $L_{C816}$ | $R^{D240}$ | $R^{D240}$ | $L_{C924}$ | $R^{D1}$ | $R^{D240}$ | $L_{C1032}$ | $R^{D4}$ | $R^{D240}$ | $L_{C1140}$ | $R^{D9}$ | $R^{D240}$ |
| $L_{C817}$ | $R^{D241}$ | $R^{D241}$ | $L_{C925}$ | $R^{D1}$ | $R^{D241}$ | $L_{C1033}$ | $R^{D4}$ | $R^{D241}$ | $L_{C1141}$ | $R^{D9}$ | $R^{D241}$ |
| $L_{C818}$ | $R^{D242}$ | $R^{D242}$ | $L_{C926}$ | $R^{D1}$ | $R^{D242}$ | $L_{C1034}$ | $R^{D4}$ | $R^{D242}$ | $L_{C1142}$ | $R^{D9}$ | $R^{D242}$ |
| $L_{C819}$ | $R^{D243}$ | $R^{D243}$ | $L_{C927}$ | $R^{D1}$ | $R^{D243}$ | $L_{C1035}$ | $R^{D4}$ | $R^{D243}$ | $L_{C1143}$ | $R^{D9}$ | $R^{D243}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C820}$ | $R^{D244}$ | $R^{D244}$ | $L_{C928}$ | $R^{D1}$ | $R^{D244}$ | $L_{C1036}$ | $R^{D4}$ | $R^{D244}$ | $L_{C1144}$ | $R^{D9}$ | $R^{D244}$ |
| $L_{C821}$ | $R^{D245}$ | $R^{D245}$ | $L_{C929}$ | $R^{D1}$ | $R^{D245}$ | $L_{C1037}$ | $R^{D4}$ | $R^{D245}$ | $L_{C1145}$ | $R^{D9}$ | $R^{D245}$ |
| $L_{C822}$ | $R^{D246}$ | $R^{D246}$ | $L_{C930}$ | $R^{D1}$ | $R^{D246}$ | $L_{C1038}$ | $R^{D4}$ | $R^{D246}$ | $L_{C1146}$ | $R^{D9}$ | $R^{D246}$ |
| $L_{C823}$ | $R^{D17}$ | $R^{D193}$ | $L_{C931}$ | $R^{D50}$ | $R^{D193}$ | $L_{C1039}$ | $R^{D145}$ | $R^{D193}$ | $L_{C1147}$ | $R^{D168}$ | $R^{D193}$ |
| $L_{C824}$ | $R^{D17}$ | $R^{D194}$ | $L_{C932}$ | $R^{D50}$ | $R^{D194}$ | $L_{C1040}$ | $R^{D145}$ | $R^{D194}$ | $L_{C1148}$ | $R^{D168}$ | $R^{D194}$ |
| $L_{C825}$ | $R^{D17}$ | $R^{D195}$ | $L_{C933}$ | $R^{D50}$ | $R^{D195}$ | $L_{C1041}$ | $R^{D145}$ | $R^{D195}$ | $L_{C1149}$ | $R^{D168}$ | $R^{D195}$ |
| $L_{C826}$ | $R^{D17}$ | $R^{D196}$ | $L_{C934}$ | $R^{D50}$ | $R^{D196}$ | $L_{C1042}$ | $R^{D145}$ | $R^{D196}$ | $L_{C1150}$ | $R^{D168}$ | $R^{D196}$ |
| $L_{C827}$ | $R^{D17}$ | $R^{D197}$ | $L_{C935}$ | $R^{D50}$ | $R^{D197}$ | $L_{C1043}$ | $R^{D145}$ | $R^{D197}$ | $L_{C1151}$ | $R^{D168}$ | $R^{D197}$ |
| $L_{C828}$ | $R^{D17}$ | $R^{D198}$ | $L_{C936}$ | $R^{D50}$ | $R^{D198}$ | $L_{C1044}$ | $R^{D145}$ | $R^{D198}$ | $L_{C1152}$ | $R^{D168}$ | $R^{D198}$ |
| $L_{C829}$ | $R^{D17}$ | $R^{D199}$ | $L_{C937}$ | $R^{D50}$ | $R^{D199}$ | $L_{C1045}$ | $R^{D145}$ | $R^{D199}$ | $L_{C1153}$ | $R^{D168}$ | $R^{D199}$ |
| $L_{C830}$ | $R^{D17}$ | $R^{D200}$ | $L_{C938}$ | $R^{D50}$ | $R^{D200}$ | $L_{C1046}$ | $R^{D145}$ | $R^{D200}$ | $L_{C1154}$ | $R^{D168}$ | $R^{D200}$ |
| $L_{C831}$ | $R^{D17}$ | $R^{D201}$ | $L_{C939}$ | $R^{D50}$ | $R^{D201}$ | $L_{C1047}$ | $R^{D145}$ | $R^{D201}$ | $L_{C1155}$ | $R^{D168}$ | $R^{D201}$ |
| $L_{C832}$ | $R^{D17}$ | $R^{D202}$ | $L_{C940}$ | $R^{D50}$ | $R^{D202}$ | $L_{C1048}$ | $R^{D145}$ | $R^{D202}$ | $L_{C1156}$ | $R^{D168}$ | $R^{D202}$ |
| $L_{C833}$ | $R^{D17}$ | $R^{D203}$ | $L_{C941}$ | $R^{D50}$ | $R^{D203}$ | $L_{C1049}$ | $R^{D145}$ | $R^{D203}$ | $L_{C1157}$ | $R^{D168}$ | $R^{D203}$ |
| $L_{C834}$ | $R^{D17}$ | $R^{D204}$ | $L_{C942}$ | $R^{D50}$ | $R^{D204}$ | $L_{C1050}$ | $R^{D145}$ | $R^{D204}$ | $L_{C1158}$ | $R^{D168}$ | $R^{D204}$ |
| $L_{C835}$ | $R^{D17}$ | $R^{D205}$ | $L_{C943}$ | $R^{D50}$ | $R^{D205}$ | $L_{C1051}$ | $R^{D145}$ | $R^{D205}$ | $L_{C1159}$ | $R^{D168}$ | $R^{D205}$ |
| $L_{C836}$ | $R^{D17}$ | $R^{D206}$ | $L_{C944}$ | $R^{D50}$ | $R^{D206}$ | $L_{C1052}$ | $R^{D145}$ | $R^{D206}$ | $L_{C1160}$ | $R^{D168}$ | $R^{D206}$ |
| $L_{C837}$ | $R^{D17}$ | $R^{D207}$ | $L_{C945}$ | $R^{D50}$ | $R^{D207}$ | $L_{C1053}$ | $R^{D145}$ | $R^{D207}$ | $L_{C1161}$ | $R^{D168}$ | $R^{D207}$ |
| $L_{C838}$ | $R^{D17}$ | $R^{D208}$ | $L_{C946}$ | $R^{D50}$ | $R^{D208}$ | $L_{C1054}$ | $R^{D145}$ | $R^{D208}$ | $L_{C1162}$ | $R^{D168}$ | $R^{D208}$ |
| $L_{C839}$ | $R^{D17}$ | $R^{D209}$ | $L_{C947}$ | $R^{D50}$ | $R^{D209}$ | $L_{C1055}$ | $R^{D145}$ | $R^{D209}$ | $L_{C1163}$ | $R^{D168}$ | $R^{D209}$ |
| $L_{C840}$ | $R^{D17}$ | $R^{D210}$ | $L_{C948}$ | $R^{D50}$ | $R^{D210}$ | $L_{C1056}$ | $R^{D145}$ | $R^{D210}$ | $L_{C1164}$ | $R^{D168}$ | $R^{D210}$ |
| $L_{C841}$ | $R^{D17}$ | $R^{D211}$ | $L_{C949}$ | $R^{D50}$ | $R^{D211}$ | $L_{C1057}$ | $R^{D145}$ | $R^{D211}$ | $L_{C1165}$ | $R^{D168}$ | $R^{D211}$ |
| $L_{C842}$ | $R^{D17}$ | $R^{D212}$ | $L_{C950}$ | $R^{D50}$ | $R^{D212}$ | $L_{C1058}$ | $R^{D145}$ | $R^{D212}$ | $L_{C1166}$ | $R^{D168}$ | $R^{D212}$ |
| $L_{C843}$ | $R^{D17}$ | $R^{D213}$ | $L_{C951}$ | $R^{D50}$ | $R^{D213}$ | $L_{C1059}$ | $R^{D145}$ | $R^{D213}$ | $L_{C1167}$ | $R^{D168}$ | $R^{D213}$ |
| $L_{C844}$ | $R^{D17}$ | $R^{D214}$ | $L_{C952}$ | $R^{D50}$ | $R^{D214}$ | $L_{C1060}$ | $R^{D145}$ | $R^{D214}$ | $L_{C1168}$ | $R^{D168}$ | $R^{D214}$ |
| $L_{C845}$ | $R^{D17}$ | $R^{D215}$ | $L_{C953}$ | $R^{D50}$ | $R^{D215}$ | $L_{C1061}$ | $R^{D145}$ | $R^{D215}$ | $L_{C1169}$ | $R^{D168}$ | $R^{D215}$ |
| $L_{C846}$ | $R^{D17}$ | $R^{D216}$ | $L_{C954}$ | $R^{D50}$ | $R^{D216}$ | $L_{C1062}$ | $R^{D145}$ | $R^{D216}$ | $L_{C1170}$ | $R^{D168}$ | $R^{D216}$ |
| $L_{C847}$ | $R^{D17}$ | $R^{D217}$ | $L_{C955}$ | $R^{D50}$ | $R^{D217}$ | $L_{C1063}$ | $R^{D145}$ | $R^{D217}$ | $L_{C1171}$ | $R^{D168}$ | $R^{D217}$ |
| $L_{C848}$ | $R^{D17}$ | $R^{D218}$ | $L_{C956}$ | $R^{D50}$ | $R^{D218}$ | $L_{C1064}$ | $R^{D145}$ | $R^{D218}$ | $L_{C1172}$ | $R^{D168}$ | $R^{D218}$ |
| $L_{C849}$ | $R^{D17}$ | $R^{D219}$ | $L_{C957}$ | $R^{D50}$ | $R^{D219}$ | $L_{C1065}$ | $R^{D145}$ | $R^{D219}$ | $L_{C1173}$ | $R^{D168}$ | $R^{D219}$ |
| $L_{C850}$ | $R^{D17}$ | $R^{D220}$ | $L_{C958}$ | $R^{D50}$ | $R^{D220}$ | $L_{C1066}$ | $R^{D145}$ | $R^{D220}$ | $L_{C1174}$ | $R^{D168}$ | $R^{D220}$ |
| $L_{C851}$ | $R^{D17}$ | $R^{D221}$ | $L_{C959}$ | $R^{D50}$ | $R^{D221}$ | $L_{C1067}$ | $R^{D145}$ | $R^{D221}$ | $L_{C1175}$ | $R^{D168}$ | $R^{D221}$ |
| $L_{C852}$ | $R^{D17}$ | $R^{D222}$ | $L_{C960}$ | $R^{D50}$ | $R^{D222}$ | $L_{C1068}$ | $R^{D145}$ | $R^{D222}$ | $L_{C1176}$ | $R^{D168}$ | $R^{D222}$ |
| $L_{C853}$ | $R^{D17}$ | $R^{D223}$ | $L_{C961}$ | $R^{D50}$ | $R^{D223}$ | $L_{C1069}$ | $R^{D145}$ | $R^{D223}$ | $L_{C1177}$ | $R^{D168}$ | $R^{D223}$ |
| $L_{C854}$ | $R^{D17}$ | $R^{D224}$ | $L_{C962}$ | $R^{D50}$ | $R^{D224}$ | $L_{C1070}$ | $R^{D145}$ | $R^{D224}$ | $L_{C1178}$ | $R^{D168}$ | $R^{D224}$ |
| $L_{C855}$ | $R^{D17}$ | $R^{D225}$ | $L_{C963}$ | $R^{D50}$ | $R^{D225}$ | $L_{C1071}$ | $R^{D145}$ | $R^{D225}$ | $L_{C1179}$ | $R^{D168}$ | $R^{D225}$ |
| $L_{C856}$ | $R^{D17}$ | $R^{D226}$ | $L_{C964}$ | $R^{D50}$ | $R^{D226}$ | $L_{C1072}$ | $R^{D145}$ | $R^{D226}$ | $L_{C1180}$ | $R^{D168}$ | $R^{D226}$ |
| $L_{C857}$ | $R^{D17}$ | $R^{D227}$ | $L_{C965}$ | $R^{D50}$ | $R^{D227}$ | $L_{C1073}$ | $R^{D145}$ | $R^{D227}$ | $L_{C1181}$ | $R^{D168}$ | $R^{D227}$ |
| $L_{C858}$ | $R^{D17}$ | $R^{D228}$ | $L_{C966}$ | $R^{D50}$ | $R^{D228}$ | $L_{C1074}$ | $R^{D145}$ | $R^{D228}$ | $L_{C1182}$ | $R^{D168}$ | $R^{D228}$ |
| $L_{C859}$ | $R^{D17}$ | $R^{D229}$ | $L_{C967}$ | $R^{D50}$ | $R^{D229}$ | $L_{C1075}$ | $R^{D145}$ | $R^{D229}$ | $L_{C1183}$ | $R^{D168}$ | $R^{D229}$ |
| $L_{C860}$ | $R^{D17}$ | $R^{D230}$ | $L_{C968}$ | $R^{D50}$ | $R^{D230}$ | $L_{C1076}$ | $R^{D145}$ | $R^{D230}$ | $L_{C1184}$ | $R^{D168}$ | $R^{D230}$ |
| $L_{C861}$ | $R^{D17}$ | $R^{D231}$ | $L_{C969}$ | $R^{D50}$ | $R^{D231}$ | $L_{C1077}$ | $R^{D145}$ | $R^{D231}$ | $L_{C1185}$ | $R^{D168}$ | $R^{D231}$ |
| $L_{C862}$ | $R^{D17}$ | $R^{D232}$ | $L_{C970}$ | $R^{D50}$ | $R^{D232}$ | $L_{C1078}$ | $R^{D145}$ | $R^{D232}$ | $L_{C1186}$ | $R^{D168}$ | $R^{D232}$ |
| $L_{C863}$ | $R^{D17}$ | $R^{D233}$ | $L_{C971}$ | $R^{D50}$ | $R^{D233}$ | $L_{C1079}$ | $R^{D145}$ | $R^{D233}$ | $L_{C1187}$ | $R^{D168}$ | $R^{D233}$ |
| $L_{C864}$ | $R^{D17}$ | $R^{D234}$ | $L_{C972}$ | $R^{D50}$ | $R^{D234}$ | $L_{C1080}$ | $R^{D145}$ | $R^{D234}$ | $L_{C1188}$ | $R^{D168}$ | $R^{D234}$ |
| $L_{C865}$ | $R^{D17}$ | $R^{D235}$ | $L_{C973}$ | $R^{D50}$ | $R^{D235}$ | $L_{C1081}$ | $R^{D145}$ | $R^{D235}$ | $L_{C1189}$ | $R^{D168}$ | $R^{D235}$ |
| $L_{C866}$ | $R^{D17}$ | $R^{D236}$ | $L_{C974}$ | $R^{D50}$ | $R^{D236}$ | $L_{C1082}$ | $R^{D145}$ | $R^{D236}$ | $L_{C1190}$ | $R^{D168}$ | $R^{D236}$ |
| $L_{C867}$ | $R^{D17}$ | $R^{D237}$ | $L_{C975}$ | $R^{D50}$ | $R^{D237}$ | $L_{C1083}$ | $R^{D145}$ | $R^{D237}$ | $L_{C1191}$ | $R^{D168}$ | $R^{D237}$ |
| $L_{C868}$ | $R^{D17}$ | $R^{D238}$ | $L_{C976}$ | $R^{D50}$ | $R^{D238}$ | $L_{C1084}$ | $R^{D145}$ | $R^{D238}$ | $L_{C1192}$ | $R^{D168}$ | $R^{D238}$ |
| $L_{C869}$ | $R^{D17}$ | $R^{D239}$ | $L_{C977}$ | $R^{D50}$ | $R^{D239}$ | $L_{C1085}$ | $R^{D145}$ | $R^{D239}$ | $L_{C1193}$ | $R^{D168}$ | $R^{D239}$ |
| $L_{C870}$ | $R^{D17}$ | $R^{D240}$ | $L_{C978}$ | $R^{D50}$ | $R^{D240}$ | $L_{C1086}$ | $R^{D145}$ | $R^{D240}$ | $L_{C1194}$ | $R^{D168}$ | $R^{D240}$ |
| $L_{C871}$ | $R^{D17}$ | $R^{D241}$ | $L_{C979}$ | $R^{D50}$ | $R^{D241}$ | $L_{C1087}$ | $R^{D145}$ | $R^{D241}$ | $L_{C1195}$ | $R^{D168}$ | $R^{D241}$ |
| $L_{C872}$ | $R^{D17}$ | $R^{D242}$ | $L_{C980}$ | $R^{D50}$ | $R^{D242}$ | $L_{C1088}$ | $R^{D145}$ | $R^{D242}$ | $L_{C1196}$ | $R^{D168}$ | $R^{D242}$ |
| $L_{C873}$ | $R^{D17}$ | $R^{D243}$ | $L_{C981}$ | $R^{D50}$ | $R^{D243}$ | $L_{C1089}$ | $R^{D145}$ | $R^{D243}$ | $L_{C1197}$ | $R^{D168}$ | $R^{D243}$ |
| $L_{C874}$ | $R^{D17}$ | $R^{D244}$ | $L_{C982}$ | $R^{D50}$ | $R^{D244}$ | $L_{C1090}$ | $R^{D145}$ | $R^{D244}$ | $L_{C1198}$ | $R^{D168}$ | $R^{D244}$ |
| $L_{C875}$ | $R^{D17}$ | $R^{D245}$ | $L_{C983}$ | $R^{D50}$ | $R^{D245}$ | $L_{C1091}$ | $R^{D145}$ | $R^{D245}$ | $L_{C1199}$ | $R^{D168}$ | $R^{D245}$ |
| $L_{C876}$ | $R^{D17}$ | $R^{D246}$ | $L_{C984}$ | $R^{D50}$ | $R^{D246}$ | $L_{C1092}$ | $R^{D145}$ | $R^{D246}$ | $L_{C1200}$ | $R^{D168}$ | $R^{D246}$ |
| $L_{C1201}$ | $R^{D10}$ | $R^{D193}$ | $L_{C125}$ | $R^{D55}$ | $R^{D193}$ | $L_{C1309}$ | $R^{D37}$ | $R^{D193}$ | $L_{C1363}$ | $R^{D143}$ | $R^{D193}$ |
| $L_{C1202}$ | $R^{D10}$ | $R^{D194}$ | $L_{C1256}$ | $R^{D55}$ | $R^{D194}$ | $L_{C1310}$ | $R^{D37}$ | $R^{D194}$ | $L_{C1364}$ | $R^{D143}$ | $R^{D194}$ |
| $L_{C1203}$ | $R^{D10}$ | $R^{D195}$ | $L_{C1257}$ | $R^{D55}$ | $R^{D195}$ | $L_{C1311}$ | $R^{D37}$ | $R^{D195}$ | $L_{C1365}$ | $R^{D143}$ | $R^{D195}$ |
| $L_{C1204}$ | $R^{D10}$ | $R^{D196}$ | $L_{C1258}$ | $R^{D55}$ | $R^{D196}$ | $L_{C1312}$ | $R^{D37}$ | $R^{D196}$ | $L_{C1366}$ | $R^{D143}$ | $R^{D196}$ |
| $L_{C1205}$ | $R^{D10}$ | $R^{D197}$ | $L_{C1259}$ | $R^{D55}$ | $R^{D197}$ | $L_{C1313}$ | $R^{D37}$ | $R^{D197}$ | $L_{C1367}$ | $R^{D143}$ | $R^{D197}$ |
| $L_{C1206}$ | $R^{D10}$ | $R^{D198}$ | $L_{C1260}$ | $R^{D55}$ | $R^{D198}$ | $L_{C1314}$ | $R^{D37}$ | $R^{D198}$ | $L_{C1368}$ | $R^{D143}$ | $R^{D198}$ |
| $L_{C1207}$ | $R^{D10}$ | $R^{D199}$ | $L_{C1261}$ | $R^{D55}$ | $R^{D199}$ | $L_{C1315}$ | $R^{D37}$ | $R^{D199}$ | $L_{C1369}$ | $R^{D143}$ | $R^{D199}$ |
| $L_{C1208}$ | $R^{D10}$ | $R^{D200}$ | $L_{C1262}$ | $R^{D55}$ | $R^{D200}$ | $L_{C1316}$ | $R^{D37}$ | $R^{D200}$ | $L_{C1370}$ | $R^{D143}$ | $R^{D200}$ |
| $L_{C1209}$ | $R^{D10}$ | $R^{D201}$ | $L_{C1263}$ | $R^{D55}$ | $R^{D201}$ | $L_{C1317}$ | $R^{D37}$ | $R^{D201}$ | $L_{C1371}$ | $R^{D143}$ | $R^{D201}$ |
| $L_{C1210}$ | $R^{D10}$ | $R^{D202}$ | $L_{C1264}$ | $R^{D55}$ | $R^{D202}$ | $L_{C1318}$ | $R^{D37}$ | $R^{D202}$ | $L_{C1372}$ | $R^{D143}$ | $R^{D202}$ |
| $L_{C1211}$ | $R^{D10}$ | $R^{D203}$ | $L_{C1265}$ | $R^{D55}$ | $R^{D203}$ | $L_{C1319}$ | $R^{D37}$ | $R^{D203}$ | $L_{C1373}$ | $R^{D143}$ | $R^{D203}$ |
| $L_{C1212}$ | $R^{D10}$ | $R^{D204}$ | $L_{C1266}$ | $R^{D55}$ | $R^{D204}$ | $L_{C1320}$ | $R^{D37}$ | $R^{D204}$ | $L_{C1374}$ | $R^{D143}$ | $R^{D204}$ |
| $L_{C1213}$ | $R^{D10}$ | $R^{D205}$ | $L_{C1267}$ | $R^{D55}$ | $R^{D205}$ | $L_{C1321}$ | $R^{D37}$ | $R^{D205}$ | $L_{C1375}$ | $R^{D143}$ | $R^{D205}$ |
| $L_{C1214}$ | $R^{D10}$ | $R^{D206}$ | $L_{C1268}$ | $R^{D55}$ | $R^{D206}$ | $L_{C1322}$ | $R^{D37}$ | $R^{D206}$ | $L_{C1376}$ | $R^{D143}$ | $R^{D206}$ |
| $L_{C1215}$ | $R^{D10}$ | $R^{D207}$ | $L_{C1269}$ | $R^{D55}$ | $R^{D207}$ | $L_{C1323}$ | $R^{D37}$ | $R^{D207}$ | $L_{C1377}$ | $R^{D143}$ | $R^{D207}$ |
| $L_{C1216}$ | $R^{D10}$ | $R^{D208}$ | $L_{C1270}$ | $R^{D55}$ | $R^{D208}$ | $L_{C1324}$ | $R^{D37}$ | $R^{D208}$ | $L_{C1378}$ | $R^{D143}$ | $R^{D208}$ |
| $L_{C1217}$ | $R^{D10}$ | $R^{D209}$ | $L_{C1271}$ | $R^{D55}$ | $R^{D209}$ | $L_{C1325}$ | $R^{D37}$ | $R^{D209}$ | $L_{C1379}$ | $R^{D143}$ | $R^{D209}$ |
| $L_{C1218}$ | $R^{D10}$ | $R^{D210}$ | $L_{C1272}$ | $R^{D55}$ | $R^{D210}$ | $L_{C1326}$ | $R^{D37}$ | $R^{D210}$ | $L_{C1380}$ | $R^{D143}$ | $R^{D210}$ |
| $L_{C1219}$ | $R^{D10}$ | $R^{D211}$ | $L_{C1273}$ | $R^{D55}$ | $R^{D211}$ | $L_{C1327}$ | $R^{D37}$ | $R^{D211}$ | $L_{C1381}$ | $R^{D143}$ | $R^{D211}$ |
| $L_{C1220}$ | $R^{D10}$ | $R^{D212}$ | $L_{C1274}$ | $R^{D55}$ | $R^{D212}$ | $L_{C1328}$ | $R^{D37}$ | $R^{D212}$ | $L_{C1382}$ | $R^{D143}$ | $R^{D212}$ |

-continued

| $L_{Cj}$ | $R^{201}$ | $R^{202}$ | $L_{Cj}$ | $R^{201}$ | $R^{202}$ | $L_{Cj}$ | $R^{201}$ | $R^{202}$ | $L_{Cj}$ | $R^{201}$ | $R^{202}$ |
|---|---|---|---|---|---|---|---|---|---|---|---|
| $L_{C1221}$ | $R^{D10}$ | $R^{D213}$ | $L_{C1275}$ | $R^{D55}$ | $R^{D213}$ | $L_{C1329}$ | $R^{D37}$ | $R^{D213}$ | $L_{C1383}$ | $R^{D143}$ | $R^{D213}$ |
| $L_{C1222}$ | $R^{D10}$ | $R^{D214}$ | $L_{C1276}$ | $R^{D55}$ | $R^{D214}$ | $L_{C1330}$ | $R^{D37}$ | $R^{D214}$ | $L_{C1384}$ | $R^{D143}$ | $R^{D214}$ |
| $L_{C1223}$ | $R^{D10}$ | $R^{D215}$ | $L_{C1277}$ | $R^{D55}$ | $R^{D215}$ | $L_{C1331}$ | $R^{D37}$ | $R^{D215}$ | $L_{C1385}$ | $R^{D143}$ | $R^{D215}$ |
| $L_{C1224}$ | $R^{D10}$ | $R^{D216}$ | $L_{C1278}$ | $R^{D55}$ | $R^{D216}$ | $L_{C1332}$ | $R^{D37}$ | $R^{D216}$ | $L_{C1386}$ | $R^{D143}$ | $R^{D216}$ |
| $L_{C1225}$ | $R^{D10}$ | $R^{D217}$ | $L_{C1279}$ | $R^{D55}$ | $R^{D217}$ | $L_{C1333}$ | $R^{D37}$ | $R^{D217}$ | $L_{C1387}$ | $R^{D143}$ | $R^{D217}$ |
| $L_{C1226}$ | $R^{D10}$ | $R^{D218}$ | $L_{C1280}$ | $R^{D55}$ | $R^{D218}$ | $L_{C1334}$ | $R^{D37}$ | $R^{D218}$ | $L_{C1388}$ | $R^{D143}$ | $R^{D218}$ |
| $L_{C1227}$ | $R^{D10}$ | $R^{D219}$ | $L_{C1281}$ | $R^{D55}$ | $R^{D219}$ | $L_{C1335}$ | $R^{D37}$ | $R^{D219}$ | $L_{C1389}$ | $R^{D143}$ | $R^{D219}$ |
| $L_{C1228}$ | $R^{D10}$ | $R^{D220}$ | $L_{C1282}$ | $R^{D55}$ | $R^{D220}$ | $L_{C1336}$ | $R^{D37}$ | $R^{D220}$ | $L_{C1390}$ | $R^{D143}$ | $R^{D220}$ |
| $L_{C1229}$ | $R^{D10}$ | $R^{D221}$ | $L_{C1283}$ | $R^{D55}$ | $R^{D221}$ | $L_{C1337}$ | $R^{D37}$ | $R^{D221}$ | $L_{C1391}$ | $R^{D143}$ | $R^{D221}$ |
| $L_{C1230}$ | $R^{D10}$ | $R^{D222}$ | $L_{C1284}$ | $R^{D55}$ | $R^{D222}$ | $L_{C1338}$ | $R^{D37}$ | $R^{D222}$ | $L_{C1392}$ | $R^{D143}$ | $R^{D222}$ |
| $L_{C1231}$ | $R^{D10}$ | $R^{D223}$ | $L_{C1285}$ | $R^{D55}$ | $R^{D223}$ | $L_{C1339}$ | $R^{D37}$ | $R^{D223}$ | $L_{C1393}$ | $R^{D143}$ | $R^{D223}$ |
| $L_{C1232}$ | $R^{D10}$ | $R^{D224}$ | $L_{C1286}$ | $R^{D55}$ | $R^{D224}$ | $L_{C1340}$ | $R^{D37}$ | $R^{D224}$ | $L_{C1394}$ | $R^{D143}$ | $R^{D224}$ |
| $L_{C1233}$ | $R^{D10}$ | $R^{D225}$ | $L_{C1287}$ | $R^{D55}$ | $R^{D225}$ | $L_{C1341}$ | $R^{D37}$ | $R^{D225}$ | $L_{C1395}$ | $R^{D143}$ | $R^{D225}$ |
| $L_{C1234}$ | $R^{D10}$ | $R^{D226}$ | $L_{C1288}$ | $R^{D55}$ | $R^{D226}$ | $L_{C1342}$ | $R^{D37}$ | $R^{D226}$ | $L_{C1396}$ | $R^{D143}$ | $R^{D226}$ |
| $L_{C1235}$ | $R^{D10}$ | $R^{D227}$ | $L_{C1289}$ | $R^{D55}$ | $R^{D227}$ | $L_{C1343}$ | $R^{D37}$ | $R^{D227}$ | $L_{C1397}$ | $R^{D143}$ | $R^{D227}$ |
| $L_{C1236}$ | $R^{D10}$ | $R^{D228}$ | $L_{C1290}$ | $R^{D55}$ | $R^{D228}$ | $L_{C1344}$ | $R^{D37}$ | $R^{D228}$ | $L_{C1398}$ | $R^{D143}$ | $R^{D228}$ |
| $L_{C1237}$ | $R^{D10}$ | $R^{D229}$ | $L_{C1291}$ | $R^{D55}$ | $R^{D229}$ | $L_{C1345}$ | $R^{D37}$ | $R^{D229}$ | $L_{C1399}$ | $R^{D143}$ | $R^{D229}$ |
| $L_{C1238}$ | $R^{D10}$ | $R^{D230}$ | $L_{C1292}$ | $R^{D55}$ | $R^{D230}$ | $L_{C1346}$ | $R^{D37}$ | $R^{D230}$ | $L_{C1400}$ | $R^{D143}$ | $R^{D230}$ |
| $L_{C1239}$ | $R^{D10}$ | $R^{D231}$ | $L_{C1293}$ | $R^{D55}$ | $R^{D231}$ | $L_{C1347}$ | $R^{D37}$ | $R^{D231}$ | $L_{C1401}$ | $R^{D143}$ | $R^{D231}$ |
| $L_{C1240}$ | $R^{D10}$ | $R^{D232}$ | $L_{C1294}$ | $R^{D55}$ | $R^{D232}$ | $L_{C1348}$ | $R^{D37}$ | $R^{D232}$ | $L_{C1402}$ | $R^{D143}$ | $R^{D232}$ |
| $L_{C1241}$ | $R^{D10}$ | $R^{D233}$ | $L_{C1295}$ | $R^{D55}$ | $R^{D233}$ | $L_{C1349}$ | $R^{D37}$ | $R^{D233}$ | $L_{C1403}$ | $R^{D143}$ | $R^{D233}$ |
| $L_{C1242}$ | $R^{D10}$ | $R^{D234}$ | $L_{C1296}$ | $R^{D55}$ | $R^{D234}$ | $L_{C1350}$ | $R^{D37}$ | $R^{D234}$ | $L_{C1404}$ | $R^{D143}$ | $R^{D234}$ |
| $L_{C1243}$ | $R^{D10}$ | $R^{D235}$ | $L_{C1297}$ | $R^{D55}$ | $R^{D235}$ | $L_{C1351}$ | $R^{D37}$ | $R^{D235}$ | $L_{C1405}$ | $R^{D143}$ | $R^{D235}$ |
| $L_{C1244}$ | $R^{D10}$ | $R^{D236}$ | $L_{C1298}$ | $R^{D55}$ | $R^{D236}$ | $L_{C1352}$ | $R^{D37}$ | $R^{D236}$ | $L_{C1406}$ | $R^{D143}$ | $R^{D236}$ |
| $L_{C1245}$ | $R^{D10}$ | $R^{D237}$ | $L_{C1299}$ | $R^{D55}$ | $R^{D237}$ | $L_{C1353}$ | $R^{D37}$ | $R^{D237}$ | $L_{C1407}$ | $R^{D143}$ | $R^{D237}$ |
| $L_{C1246}$ | $R^{D10}$ | $R^{D238}$ | $L_{C1300}$ | $R^{D55}$ | $R^{D238}$ | $L_{C1354}$ | $R^{D37}$ | $R^{D238}$ | $L_{C1408}$ | $R^{D143}$ | $R^{D238}$ |
| $L_{C1247}$ | $R^{D10}$ | $R^{D239}$ | $L_{C1301}$ | $R^{D55}$ | $R^{D239}$ | $L_{C1355}$ | $R^{D37}$ | $R^{D239}$ | $L_{C1409}$ | $R^{D143}$ | $R^{D239}$ |
| $L_{C1248}$ | $R^{D10}$ | $R^{D240}$ | $L_{C1302}$ | $R^{D55}$ | $R^{D240}$ | $L_{C1356}$ | $R^{D37}$ | $R^{D240}$ | $L_{C1410}$ | $R^{D143}$ | $R^{D240}$ |
| $L_{C1249}$ | $R^{D10}$ | $R^{D241}$ | $L_{C1303}$ | $R^{D55}$ | $R^{D241}$ | $L_{C1357}$ | $R^{D37}$ | $R^{D241}$ | $L_{C1411}$ | $R^{D143}$ | $R^{D241}$ |
| $L_{C1250}$ | $R^{D10}$ | $R^{D242}$ | $L_{C1304}$ | $R^{D55}$ | $R^{D242}$ | $L_{C1358}$ | $R^{D37}$ | $R^{D242}$ | $L_{C1412}$ | $R^{D143}$ | $R^{D242}$ |
| $L_{C1251}$ | $R^{D10}$ | $R^{D243}$ | $L_{C1305}$ | $R^{D55}$ | $R^{D243}$ | $L_{C1359}$ | $R^{D37}$ | $R^{D243}$ | $L_{C1413}$ | $R^{D143}$ | $R^{D243}$ |
| $L_{C1252}$ | $R^{D10}$ | $R^{D24}$ | $L_{C1306}$ | $R^{D55}$ | $R^{D244}$ | $L_{C1360}$ | $R^{D37}$ | $R^{D244}$ | $L_{C1414}$ | $R^{D143}$ | $R^{D244}$ |
| $L_{C1253}$ | $R^{D10}$ | $R^{D245}$ | $L_{C1307}$ | $R^{D55}$ | $R^{D245}$ | $L_{C1361}$ | $R^{D37}$ | $R^{D245}$ | $L_{C1415}$ | $R^{D143}$ | $R^{D245}$ |
| $L_{C1254}$ | $R^{D10}$ | $R^{D246}$ | $L_{C1308}$ | $R^{D55}$ | $R^{D246}$ | $L_{C1362}$ | $R^{D37}$ | $R^{D246}$ | $L_{C1416}$ | $R^{D143}$ | $R^{D246}$ |

wherein $R^{D1}$ to $R^{D216}$ have the structures as defined in the following LIST 7:

$R^{D1}$, $R^{D2}$, $R^{D3}$, $R^{D4}$, $R^{D5}$, $R^{D6}$, $R^{D7}$, $R^{D8}$

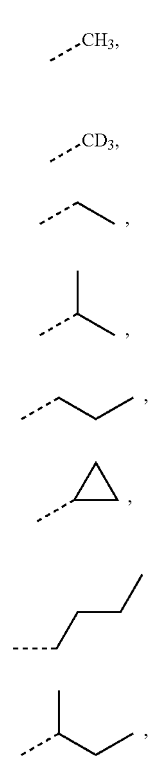

-continued $R^{D9}$, $R^{D10}$, $R^{D11}$, $R^{D12}$, $R^{D13}$, $R^{D14}$, $R^{D15}$

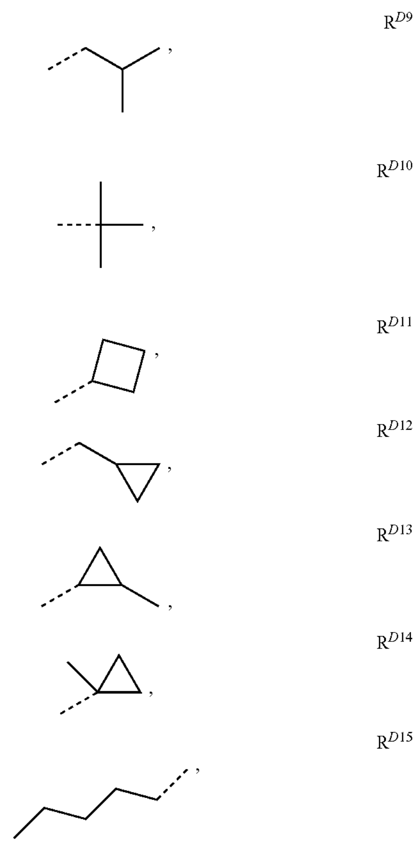

-continued
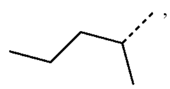
$R^{D16}$
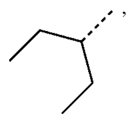
$R^{D17}$
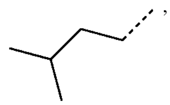
$R^{D18}$
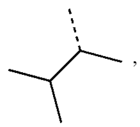
$R^{D19}$
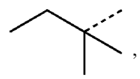
$R^{D20}$
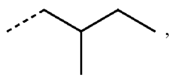
$R^{D21}$
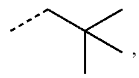
$R^{D22}$
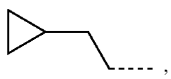
$R^{D23}$
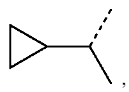
$R^{D24}$
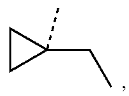
$R^{D25}$
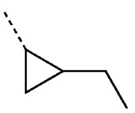
$R^{D26}$
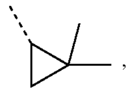
$R^{D27}$
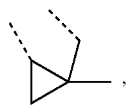
$R^{D28}$
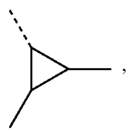
$R^{D29}$
-continued
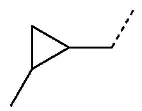
$R^{D30}$
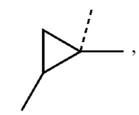
$R^{D31}$
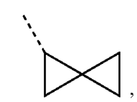
$R^{D32}$
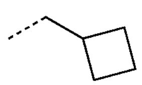
$R^{D33}$
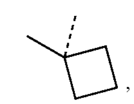
$R^{D34}$
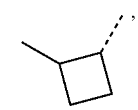
$R^{D35}$
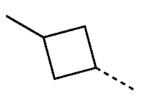
$R^{D36}$
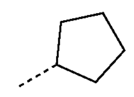
$R^{D37}$
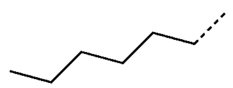
$R^{D38}$
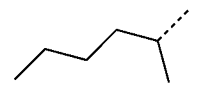
$R^{D39}$
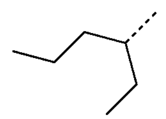
$R^{D40}$
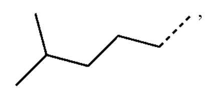
$R^{D41}$
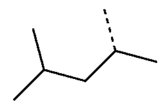
$R^{D42}$ -continued
$R^{D43}$
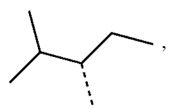,
$R^{D44}$
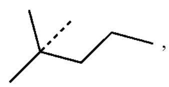,
$R^{D45}$
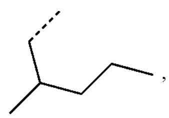,
$R^{D46}$
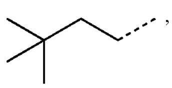,
$R^{D47}$
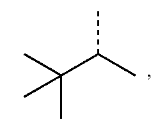,
$R^{D48}$
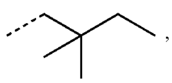,
$R^{D49}$
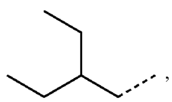,
$R^{D50}$
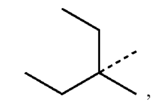,
$R^{D51}$
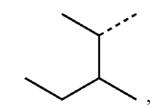,
$R^{D52}$
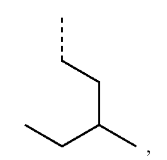,
$R^{D53}$
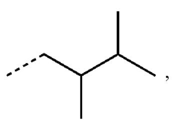,
$R^{D54}$
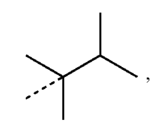,
$R^{D55}$
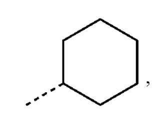,
-continued
$R^{D56}$
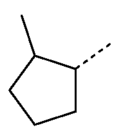,
$R^{D57}$
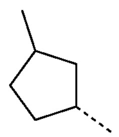,
$R^{D58}$
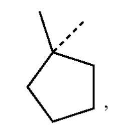,
$R^{D59}$
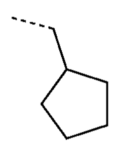,
$R^{D60}$
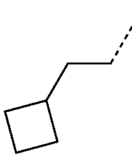,
$R^{D61}$
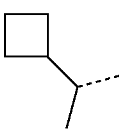,
$R^{D62}$
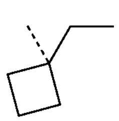,
$R^{D63}$
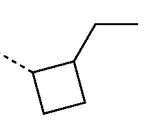,
$R^{D64}$
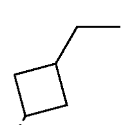,
$R^{D65}$
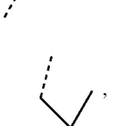,
$R^{D66}$
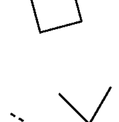, -continued
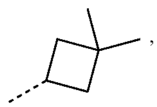
$R^{D67}$
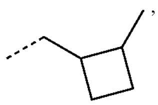
$R^{D68}$
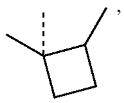
$R^{D69}$
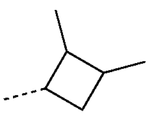
$R^{D70}$
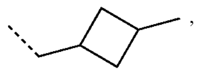
$R^{D71}$
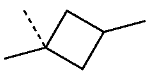
$R^{D72}$
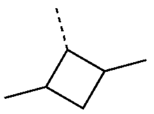
$R^{D73}$
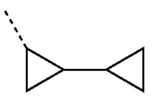
$R^{D74}$
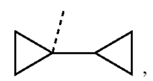
$R^{D75}$
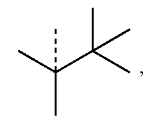
$R^{D76}$
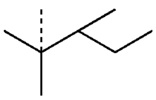
$R^{D77}$
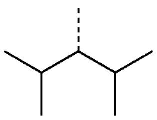
$R^{D78}$
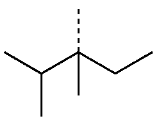
$R^{D79}$
-continued
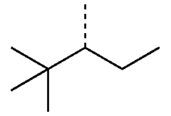
$R^{D80}$
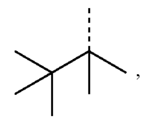
$R^{D81}$
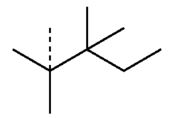
$R^{D82}$
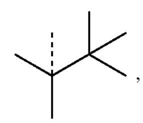
$R^{D83}$
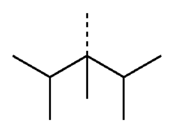
$R^{D84}$
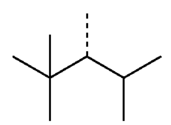
$R^{D85}$
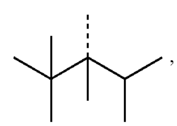
$R^{D86}$
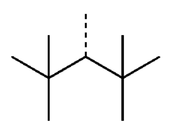
$R^{D87}$
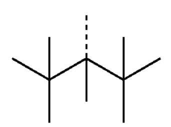
$R^{D88}$
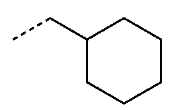
$R^{D89}$
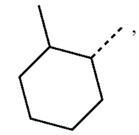
$R^{D90}$
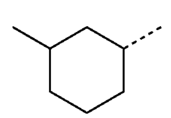
$R^{D91}$ -continued
$R^{D92}$
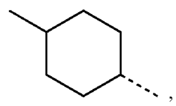
$R^{D93}$
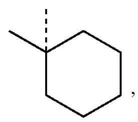
$R^{D94}$
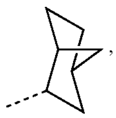
$R^{D95}$
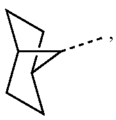
$R^{D96}$
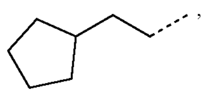
$R^{D97}$
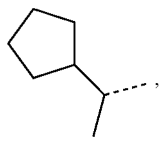
$R^{D98}$
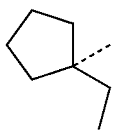
$R^{D99}$
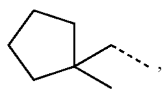
$R^{D100}$
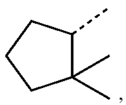
$R^{D101}$
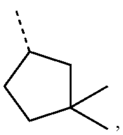
$R^{D102}$
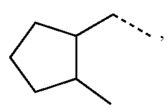
$R^{D103}$
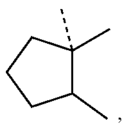
-continued
$R^{D104}$
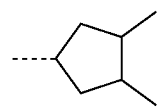
$R^{D105}$
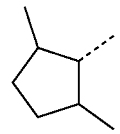
$R^{D106}$
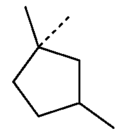
$R^{D107}$
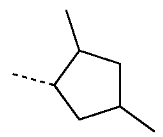
$R^{D108}$
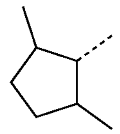
$R^{D109}$
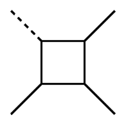
$R^{D110}$
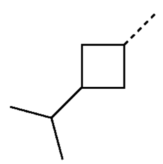
$R^{D111}$
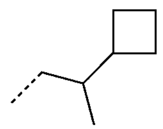
$R^{D112}$
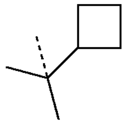
$R^{D113}$
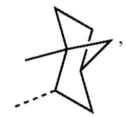
$R^{D114}$
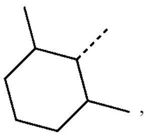

-continued
$R^{D115}$
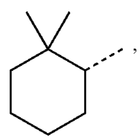
$R^{D116}$
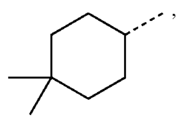
$R^{D117}$
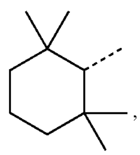
$R^{D118}$
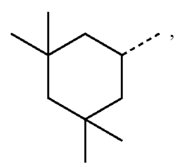
$R^{D119}$
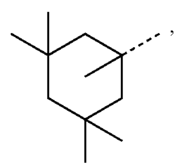
$R^{D120}$
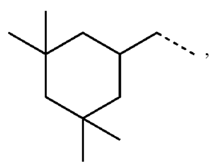
$R^{D121}$
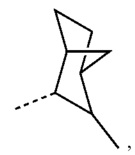
$R^{D122}$
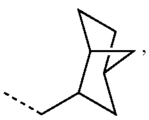
$R^{D123}$
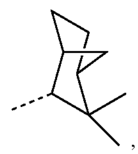
$R^{D124}$
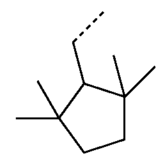
-continued
$R^{D125}$
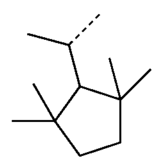
$R^{D126}$
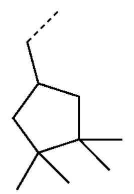
$R^{D127}$
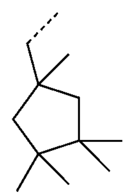
$R^{D128}$
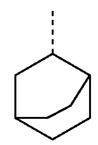
$R^{D129}$
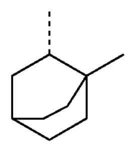
$R^{D130}$
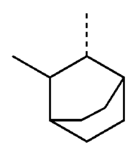
$R^{D131}$
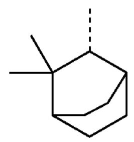
$R^{D132}$
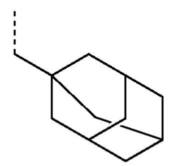
$R^{D133}$
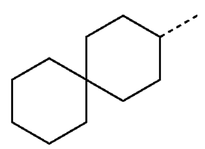

-continued
$R^{D134}$
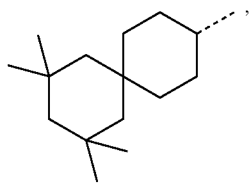
$R^{D135}$
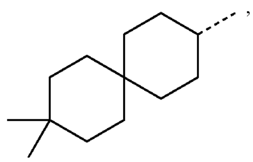
$R^{D136}$
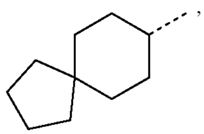
$R^{D137}$
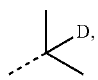
$R^{D138}$
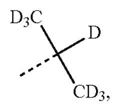
$R^{D139}$
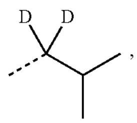
$R^{D140}$
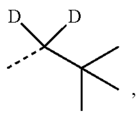
$R^{D141}$
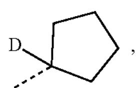
$R^{D142}$
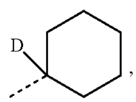
$R^{D143}$
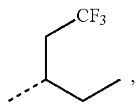
$R^{D144}$
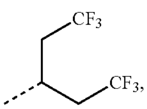
$R^{D145}$
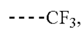
$R^{D146}$
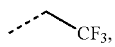
-continued
$R^{D147}$
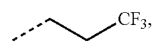
$R^{D148}$
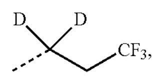
$R^{D149}$
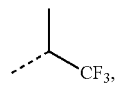
$R^{D150}$
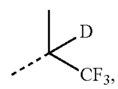
$R^{D151}$
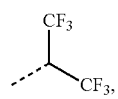
$R^{D152}$
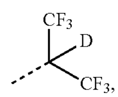
$R^{D153}$
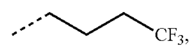
$R^{D154}$
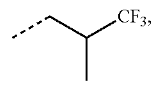
$R^{D155}$
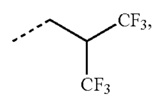
$R^{D156}$
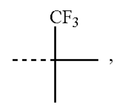
$R^{D157}$
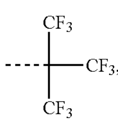
$R^{D158}$
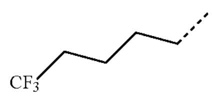
$R^{D159}$
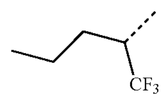
$R^{D160}$
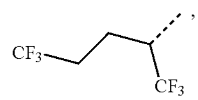
$R^{D161}$
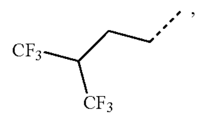

-continued
$R^{D162}$
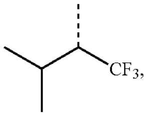
$R^{D163}$
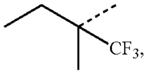
$R^{D164}$
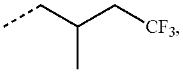
$R^{D165}$
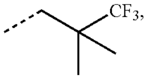
$R^{D166}$
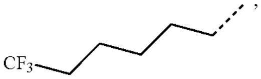
$R^{D167}$
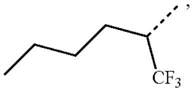
$R^{D168}$
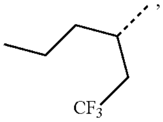
$R^{D169}$
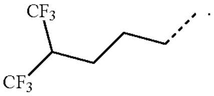
$R^{D170}$
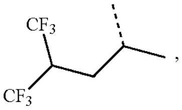
$R^{D171}$
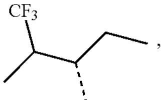
$R^{D172}$
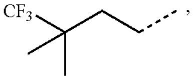
$R^{D173}$
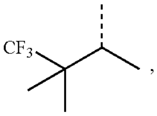
$R^{D174}$
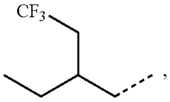
-continued
$R^{D175}$
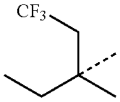
$R^{D176}$
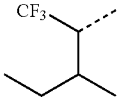
$R^{D177}$
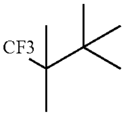
$R^{D178}$
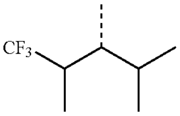
$R^{D179}$
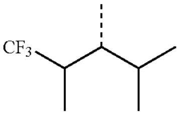
$R^{D180}$
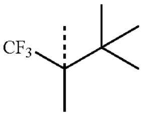
$R^{D181}$
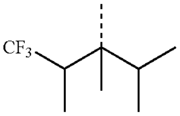
$R^{D182}$
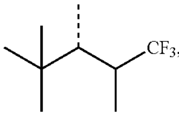
$R^{D183}$
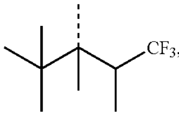
$R^{D184}$
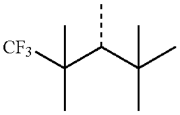
$R^{D185}$
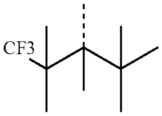
$R^{D186}$
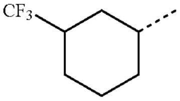

-continued
$R^{D187}$
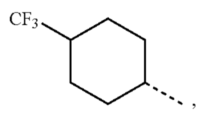
$R^{D188}$
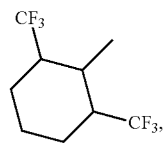
$R^{D189}$
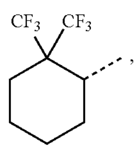
$R^{D190}$
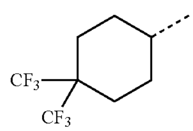
$R^{D191}$
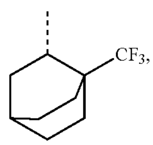
$R^{D192}$
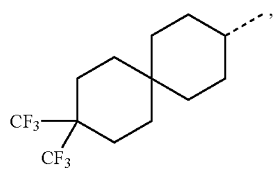
$R^{D193}$
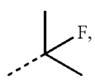
$R^{D194}$
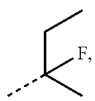
$R^{D195}$
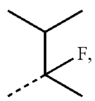
$R^{D196}$
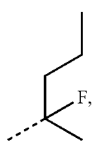
$R^{D197}$
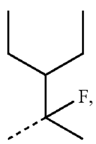
-continued
$R^{D198}$
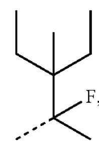
$R^{D199}$
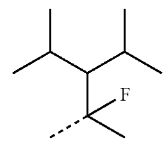
$R^{D200}$
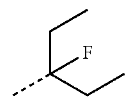
$R^{D201}$
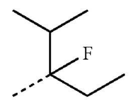
$R^{D202}$
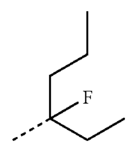
$R^{D203}$
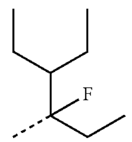
$R^{D204}$
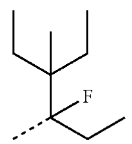
$R^{D205}$
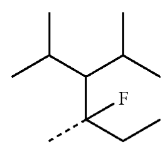
$R^{D206}$
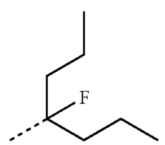
$R^{D207}$
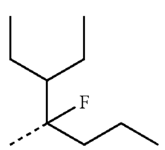
$R^{D208}$
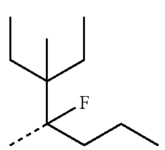

-continued
$R^{D209}$
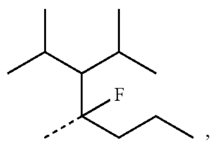
$R^{D210}$
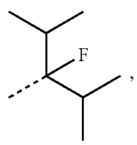
$R^{D211}$
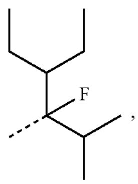
$R^{D212}$
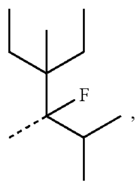
$R^{D213}$
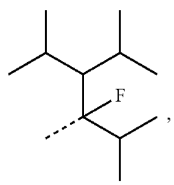
$R^{D214}$
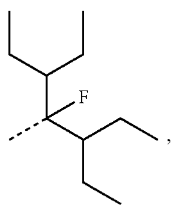
$R^{D215}$
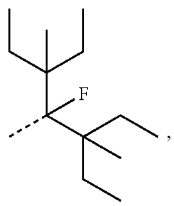
$R^{D216}$
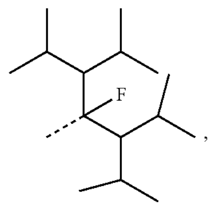
-continued
$R^{D217}$
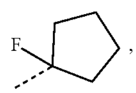
$R^{D218}$
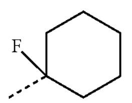
$R^{D219}$
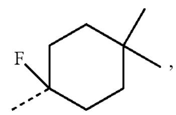
$R^{D220}$
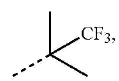
$R^{D221}$
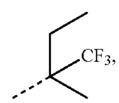
$R^{D222}$
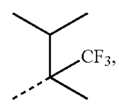
$R^{D223}$
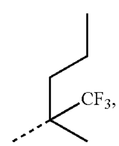
$R^{D224}$
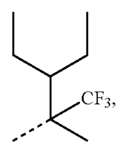
$R^{D225}$
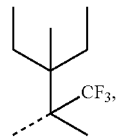
$R^{D226}$
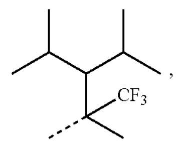
$R^{D227}$
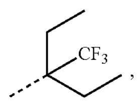
$R^{D228}$
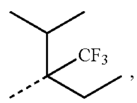

-continued $R^{D229}$

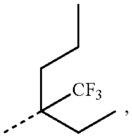

$R^{D230}$

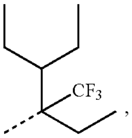

$R^{D231}$

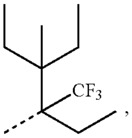

$R^{D232}$

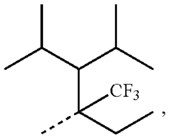

$R^{D233}$

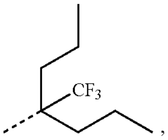

$R^{D234}$

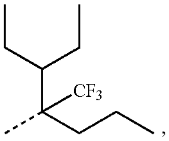

$R^{D235}$

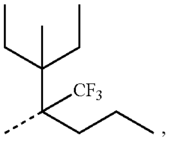

$R^{D236}$

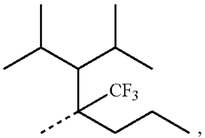

$R^{D237}$

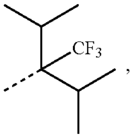

$R^{D238}$

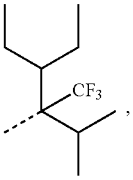

-continued $R^{D239}$

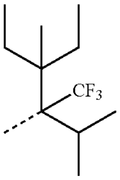

$R^{D240}$

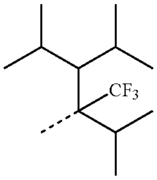

$R^{D241}$

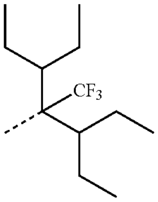

$R^{D242}$

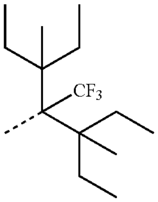

$R^{D243}$

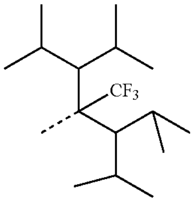

$R^{D244}$

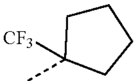

$R^{D245}$

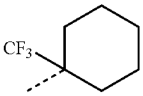

and $R^{D246}$

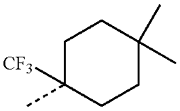

In some embodiments, the compound is selected from the group consisting of only those compounds whose $L_{Bk}$ corresponds to one of the following: $L^{B1}$, $L^{B2}$, $L^{B18}$, $L^{B28}$, $L^{B38}$, $L^{B108}$, $L^{B118}$, $L^{B122}$, $L^{B124}$, $L^{B126}$, $L^{B128}$, $L^{B130}$, $L^{B132}$, $L^{B134}$, $L^{B136}$, $L^{B138}$, $L^{B140}$, $L^{B142}$, $L^{B144}$, $L^{B156}$, $L^{B158}$, $L^{B160}$, $L^{B162}$, $L^{B164}$, $L^{B168}$, $L^{B172}$, $L^{B175}$, $L^{B204}$, $L^{B206}$, $L^{B214}$, $L^{B216}$, $L^{B218}$, $L^{B220}$, $L^{B222}$, $L^{B231}$, $L^{B233}$, $L^{B235}$, $L^{B237}$, $L^{B240}$, $L^{B242}$, $L^{B244}$, $L^{B246}$, $L^{B248}$, $L^{B250}$, $L^{B252}$, $L^{B254}$, $L^{B256}$, $L^{B258}$, $L^{B260}$, $L^{B262}$ and $L^{B264}$, $L^{B265}$, $L^{B266}$, $L^{B267}$, $L^{B268}$, $L^{B269}$, and $L^{B270}$.

In some embodiments, the compound is selected from the group consisting of only those compounds whose $L_{Bk}$ corresponds to one of the following: $L^{B1}$, $L^{B2}$, $L^{B18}$, $L^{B28}$, $L^{B38}$, $L^{B108}$, $L^{B118}$, $L^{B122}$, $L^{B126}$, $L^{B128}$, $L^{B132}$, $L^{B136}$, $L^{B138}$, $L^{B142}$, $L^{B156}$, $L^{B162}$, $L^{B204}$, $L^{B206}$, $L^{B214}$, $L^{B216}$, $L^{B218}$, $L^{B220}$, $L^{B231}$, $L^{B233}$, $L^{B237}$, $L^{B264}$, $L^{B265}$, $L^{B266}$, $L^{B267}$, $L^{B268}$, $L^{B269}$, and $L^{B270}$.

In some embodiments, the compound is selected from the group consisting of only those compounds having $L_{Cj-I}$ or $L_{Cj-II}$ ligand whose corresponding $R^{201}$ and $R^{202}$ are defined to be one of the following structures: $R^{D1}$, $R^{D3}$, $R^{D4}$, $R^{D5}$, $R^{D9}$, $R^{D10}$, $R^{D17}$, $R^{D18}$, $R^{D20}$, $R^{D22}$, $R^{D37}$, $R^{D40}$, $R^{D41}$, $R^{D42}$, $R^{D43}$, $R^{D48}$, $R^{D49}$, $R^{D50}$, $R^{D54}$, $R^{D55}$, $R^{D58}$, $R^{D59}$, $R^{D78}$, $R^{D79}$, $R^{D81}$, $R^{D87}$, $R^{D88}$, $R^{D89}$, $R^{D93}$, $R^{D116}$, $R^{D117}$, $R^{D118}$, $R^{D119}$, $R^{D120}$, $R^{D133}$, $R^{D134}$, $R^{D135}$, $R^{D136}$, $R^{D143}$, $R^{D144}$, $R^{D145}$, $R^{D146}$, $R^{D147}$, $R^{D149}$, $R^{D151}$, $R^{D154}$, $R^{D155}$, $R^{D161}$, $R^{D175}$ $R^{D190}$, $R^{D193}$, $R^{D200}$, $R^{D201}$, $R^{D206}$, $R^{D210}$, $R^{D214}$, $R^{D215}$, $R^{D216}$, $R^{D218}$, $R^{D219}$, $R^{D220}$, $R^{D27}$, $R^{D237}$, $R^{D241}$, $R^{D242}$, $R^{D245}$, and $R^{D246}$.

In some embodiments, the compound is selected from the group consisting of only those compounds having $L_{Cj-I}$ or $L_{Cj-II}$ ligand whose corresponding $R^{201}$ and $R^{202}$ are defined to be one of selected from the following structures $R^{D1}$, $R^{D3}$, $R^{D4}$, $R^{D5}$, $R^{D9}$, $R^{D10}$, $R^{D17}$, $R^{D22}$, $R^{D43}$, $R^{D50}$, $R^{D78}$, $R^{D116}$, $R^{D118}$, $R^{D133}$, $R^{D134}$, $R^{D135}$, $R^{D136}$, $R^{D143}$, $R^{D144}$, $R^{D145}$, $R^{D146}$, $R^{D149}$, $R^{D151}$, $R^{D154}$, $R^{D155}$ $R^{D190}$, $R^{D193}$, $R^{D200}$, $R^{D201}$, $R^{D206}$, $R^{D210}$, $R^{D214}$, $R^{D215}$, $R^{D216}$, $R^{D218}$, $R^{D219}$, $R^{D220}$, $R^{D27}$, $R^{D237}$, $R^{D241}$, $R^{D242}$, $R^{D245}$, and $R^{D246}$.

In some embodiments, the compound is selected from the group consisting of only those compounds having one of the following structures for the $L_{Cj-I}$ ligand:

$L_{C1-I}$, $L_{C4-I}$, $L_{C9-I}$, $L_{C10-I}$, $L_{C17-I}$

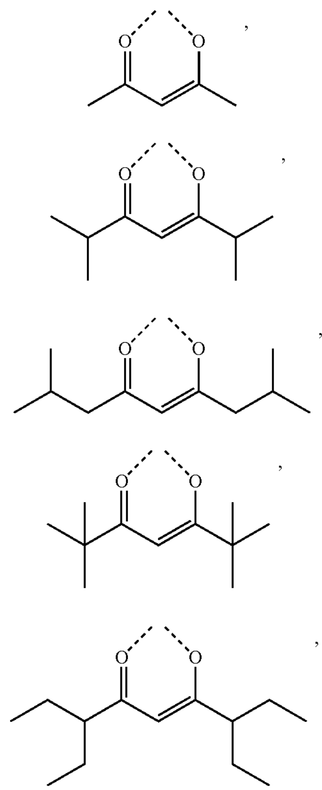

-continued $L_{C55-I}$

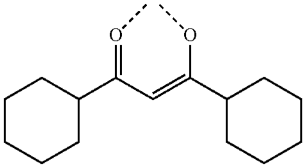

, $L_{C78-I}$

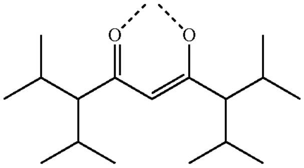

, $L_{C116-I}$

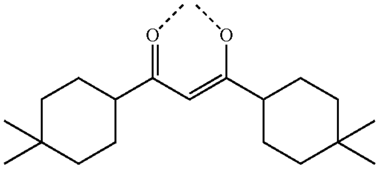

, $L_{C50-I}$

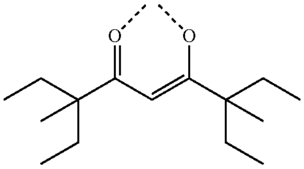

, $L_{C190-I}$

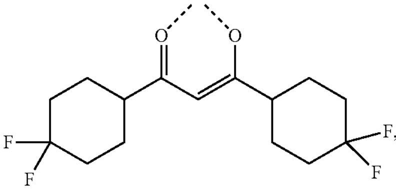

$L_{C144-I}$

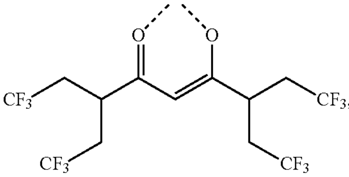

$L_{C145-I}$

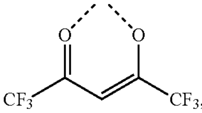

$L_{C143-I}$

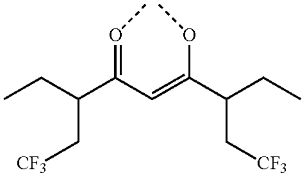

, $L_{C232-I}$

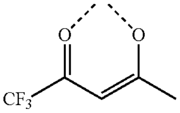

,

-continued
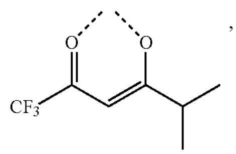
,
$L_{C279\text{-}I}$
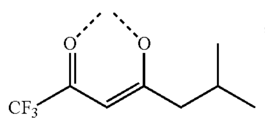
,
$L_{C325\text{-}I}$
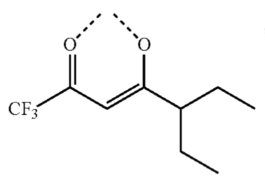
,
$L_{C414\text{-}I}$
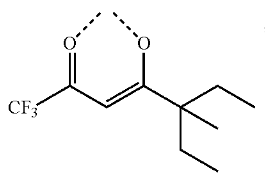
,
$L_{C457\text{-}I}$
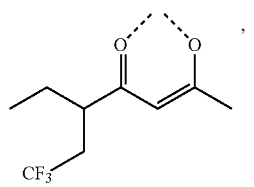
,
$L_{C230\text{-}I}$
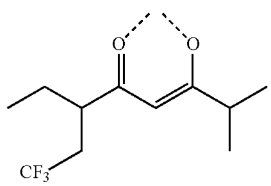
,
$L_{C277\text{-}I}$
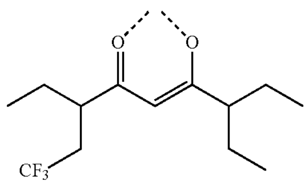
,
$L_{C412\text{-}I}$
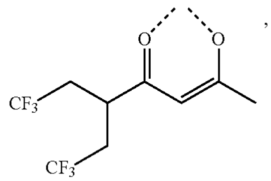
,
$L_{C231\text{-}I}$
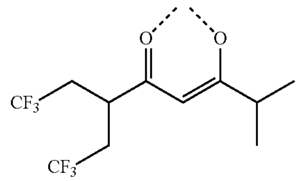
,
$L_{C278\text{-}I}$
-continued
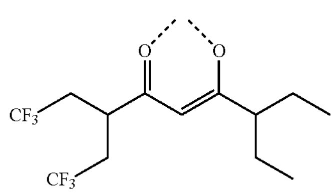
,
$L_{C413\text{-}I}$
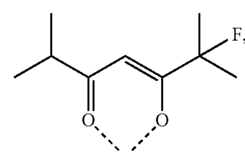
$L_{C985\text{-}I}$
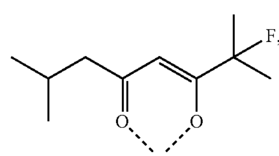
$L_{C1093\text{-}I}$
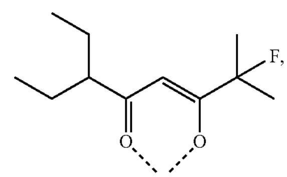
$L_{C823\text{-}I}$
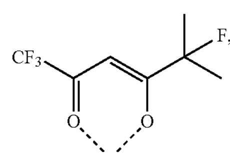
$L_{C1039\text{-}I}$
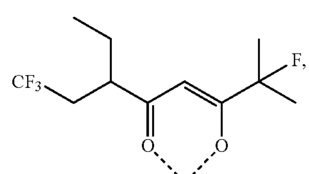
$L_{C1147\text{-}I}$
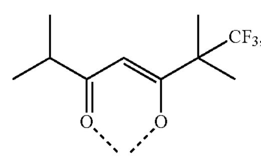
$L_{C1012\text{-}I}$
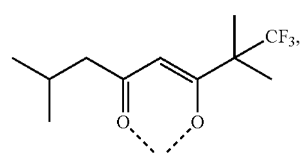
$L_{C1120\text{-}I}$
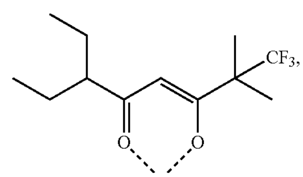
$L_{C850\text{-}I}$ -continued $L_{C1066\text{-}I}$

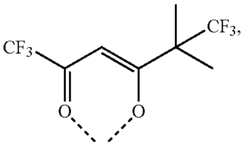

$L_{C1174\text{-}I}$

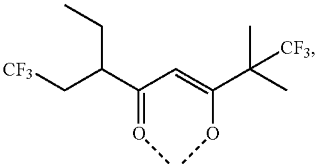

$L_{C769\text{-}I}$

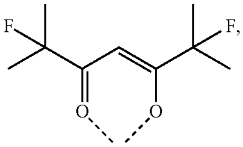

$L_{C1201\text{-}I}$

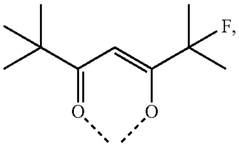

$L_{C796\text{-}I}$

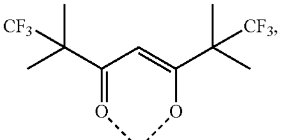

$L_{C1228\text{-}I}$

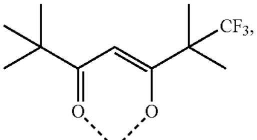

$L_{C803\text{-}I}$

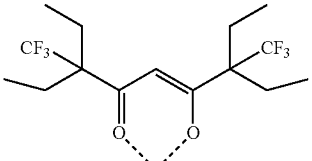

, and

-continued $L_{C776\text{-}I}$

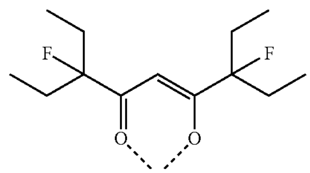

.

In some embodiments, $L_A$ is selected from the group consisting of the structures of LIST 1, LIST 2, and LIST 3, and $L_B$ is selected from the group consisting of the structures of LIST 4, LIST 5, and LIST 6.

In some embodiments, $L_A$ is selected from the group consisting of the structures of LIST 1 and $L_B$ is selected from the group consisting of the structures of LIST 6.

In some embodiments, $L_A$ is selected from the group consisting of the structures of LIST 2 and $L_B$ is selected from the group consisting of the structures of LIST 6.

In some embodiments, the compound can be $Ir(L_A)_2(L_B)$, $Ir(L_A)(L_B)_2$, or $Ir(L_A)(L_B)(L_C)$.

In some of these embodiments, $L_A$ can have a Formula I as defined herein.

In some of these embodiments, $L_A$ can be selected from the group consisting of the structures of LIST 1, LIST 2, and LIST 3 as defined herein.

In some of these embodiments, $L_B$ can be selected from the group consisting of the structures of LIST 4, LIST 5, and LIST 6 as defined herein.

In some of these embodiments, the compound can be $Ir(L_A)_3$, $Ir(L_{Ai}(R^E)(R^F)(W)(G))_3$ consisting of the compounds of $Ir(L_{A1}\text{-}(R^1)(R^1)(W1)(G^1))_3$ to $Ir(L_{A52}\text{-}(R^{89})(R^{89})(W42)(G^{53}))_3$, $Ir(L_A)_2(L_{Bk})$, $Ir(L_{Ai}(R^E)(R^F)(W)(G))_2(L_B)$, $Ir(L_{Ai}(R^E)(R^F)(W)(G))_2(L_{Bk})$ consisting of the compounds of $Ir(L_{A1}\text{-}(R^1)(R^1)(W1)(G^1))_2(L_{B1})$ to $Ir(L_{A52}\text{-}(R^{89})(R^{89})(W42)(G^{53}))_2(L^{B474})$, $Ir(L_A)(L_{Bk})_2$, $Ir(L_{Ai}(R^E)(R^F)(W)(G))(L_B)_2$, $Ir(L_{Ai}(R^E)(R^F)(W)(G))(L_{Bk})_2$ consisting of the compounds of $Ir(L_{A1}\text{-}(R^1)(R^1)(W1)(G^1))(L^{B1})_2$ to $Ir(L_{A52}\text{-}(R^{89})(R^{89})(W42)(G^{53})(L^{B474})_2$, $Ir(L_{Ai}(R^E)(R^F)(W)(G))(L_{Bk})(L_{Cj\text{-}I})$ consisting of the compounds of $Ir(L_{A1}\text{-}(R^1)(R^1)(W1(G^1)(L_{B1})(L_{Cj\text{-}I})$ to $Ir(L_{A52}\text{-}(R^{89})(R^{89})(W42)(G^{53}))(L_{B474})(L_{C1416\text{-}I})$ or $Ir(L_{Ai}(R^E)(R^F)(W)(G)(L_{Bk})(L_{Cj\text{-}II})$ consisting of the compounds of $Ir(L_{A1}\text{-}(R_1)(R^1)(W)(G^1)(L_{B1})(L_{Cj\text{-}II})$ to $Ir(L_{A52}\text{-}(R^{89})(R^{89})(W42)(G^{53}))(L_{B474})(L_{C1416\text{-}II})$.

In some embodiments, the compound is selected from the group consisting of the structures from the following LIST 8:

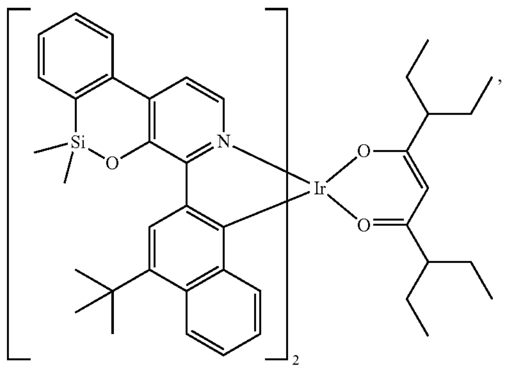

,

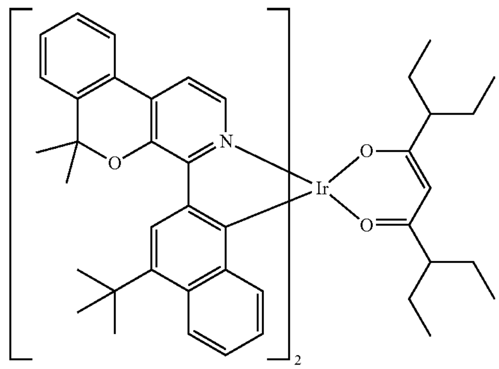

,

-continued
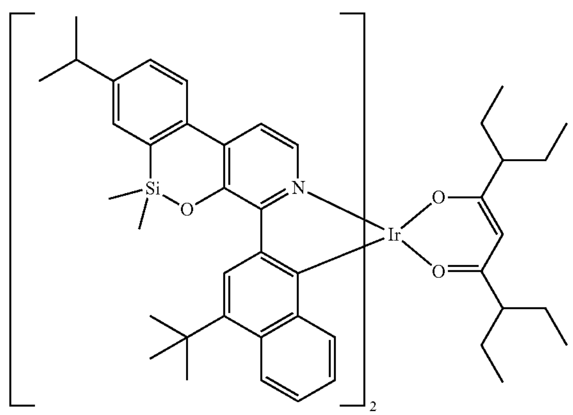
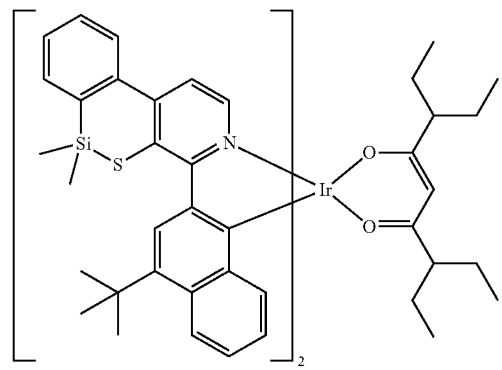
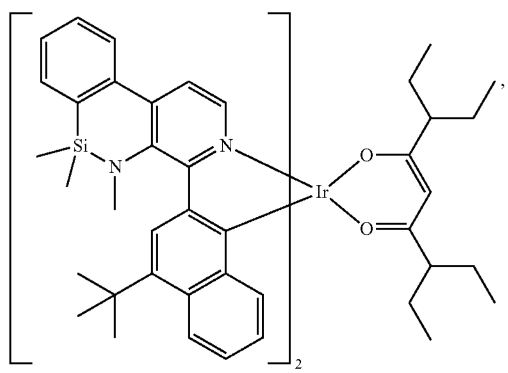
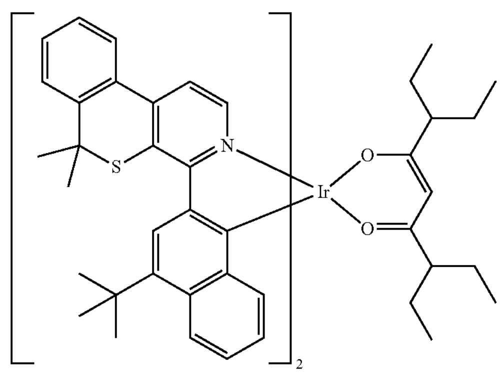
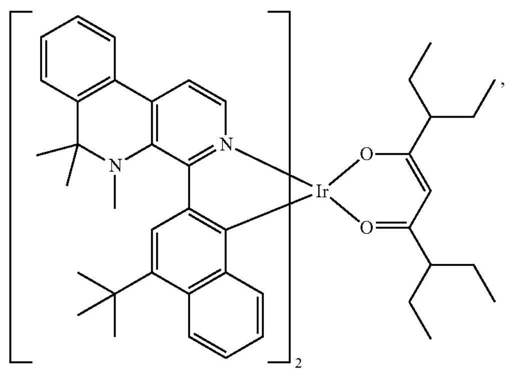
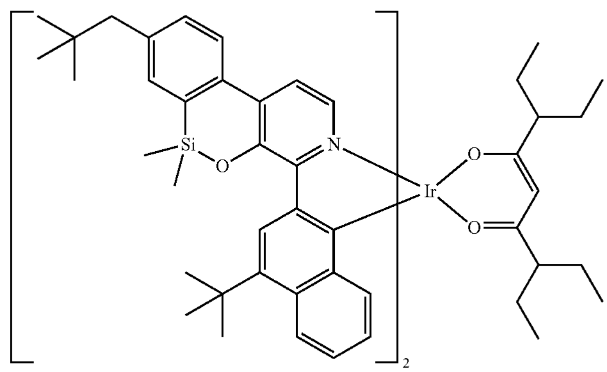
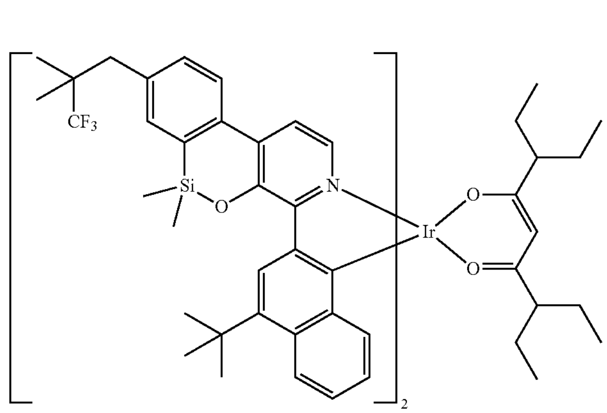
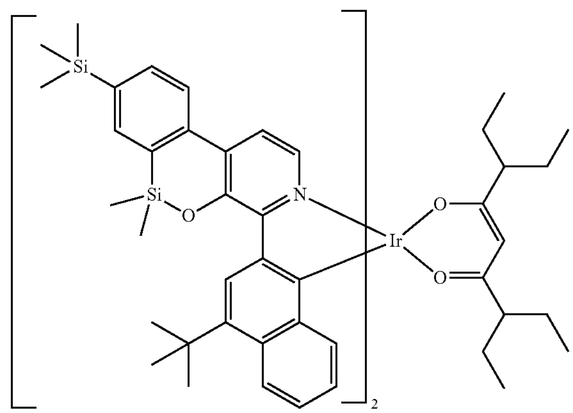

-continued
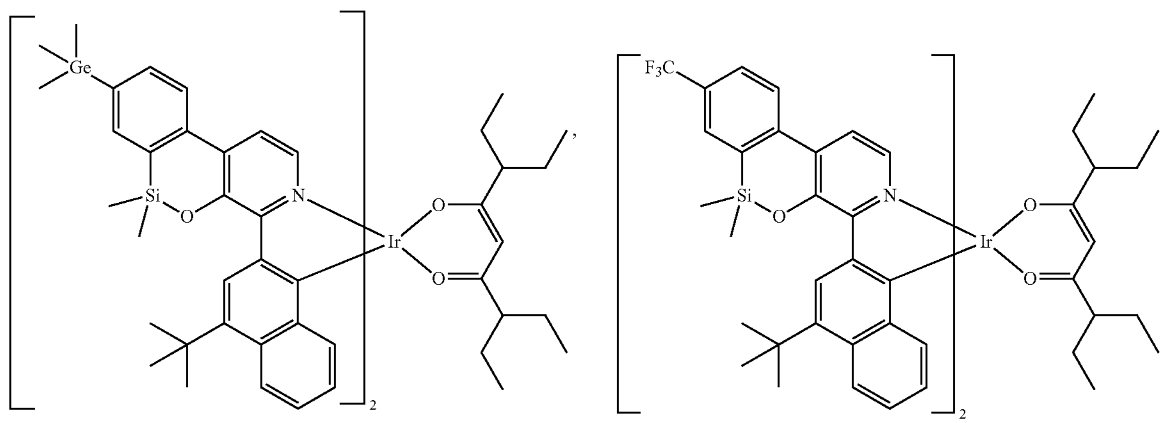
,
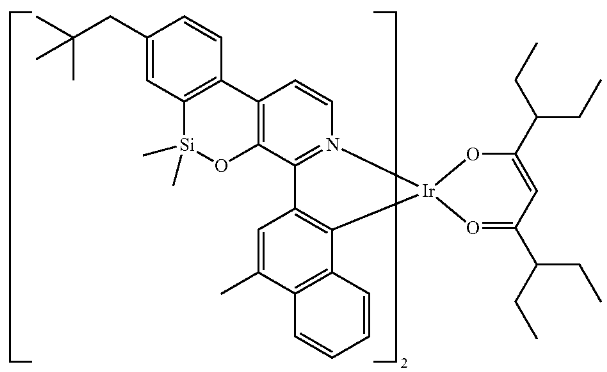
,
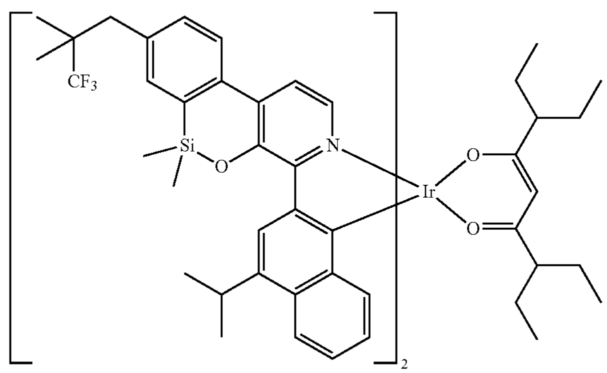
,
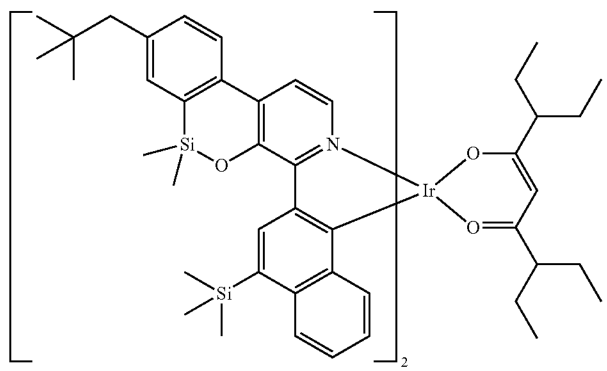
,

-continued
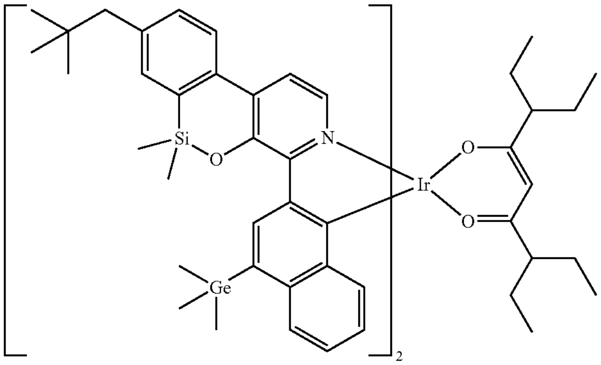
,
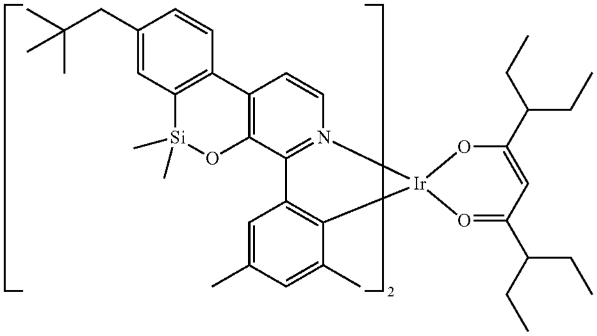
,
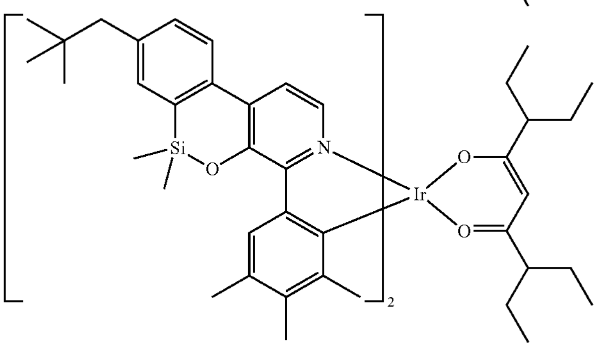
,
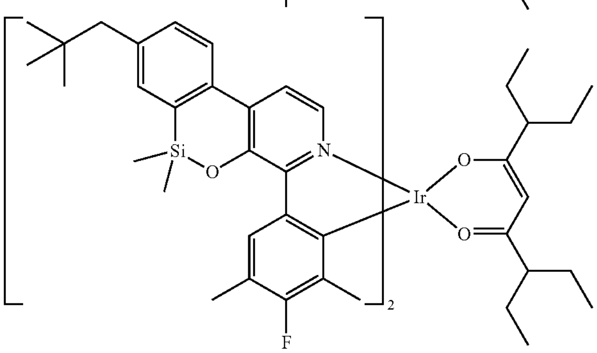
,
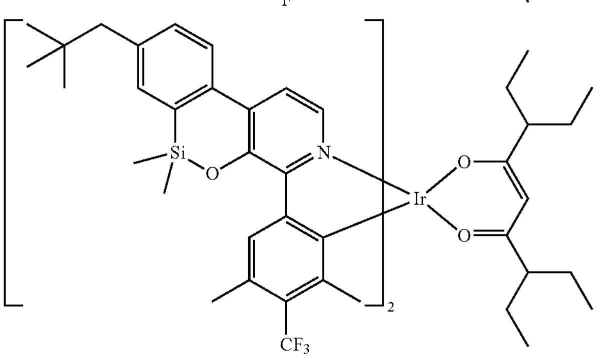
, -continued
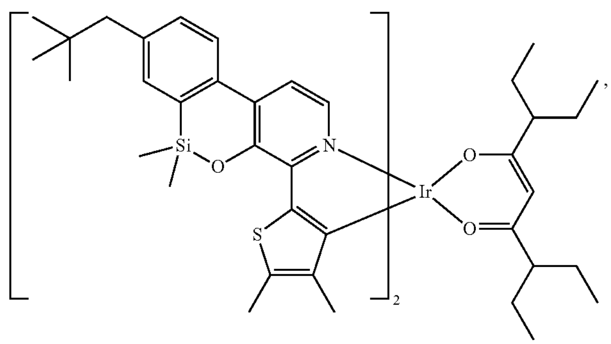
,
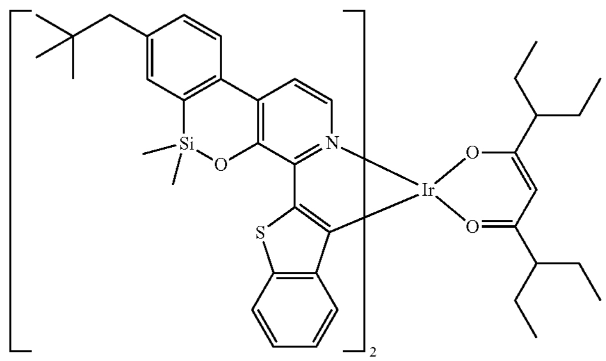
,
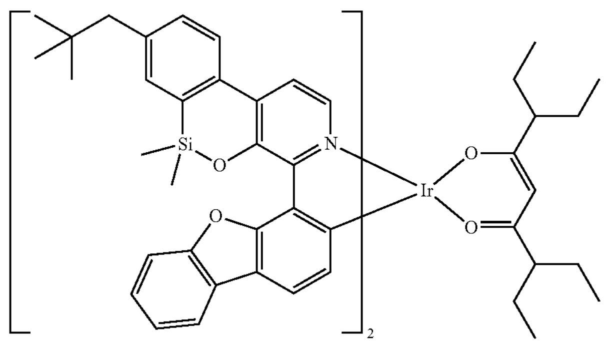
,
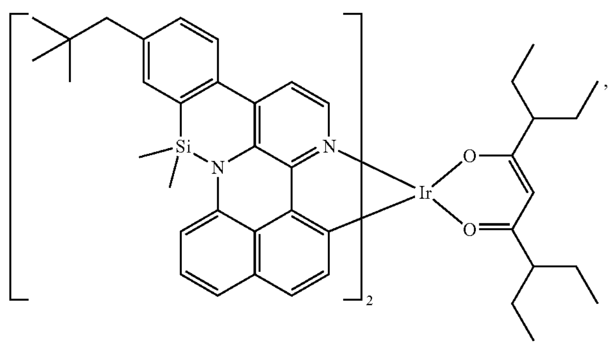
,
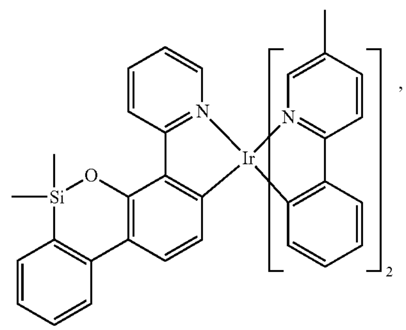
,
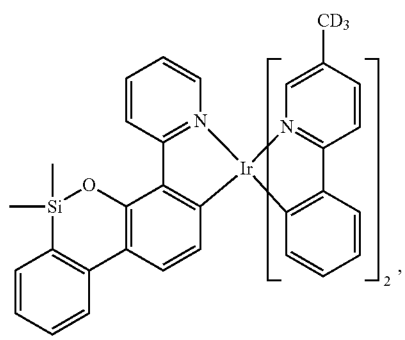
,
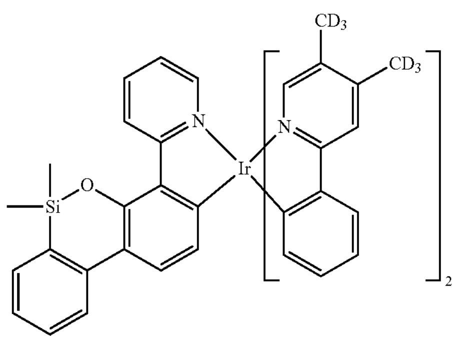
, -continued
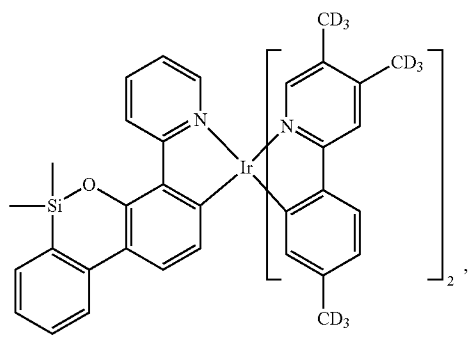
,
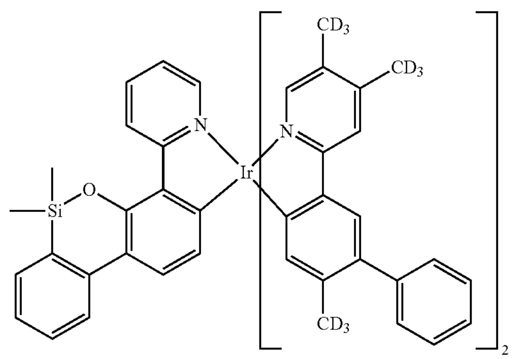
,
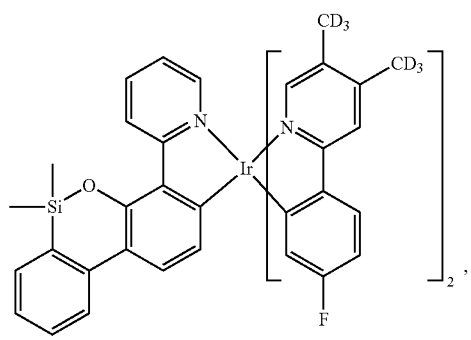
,
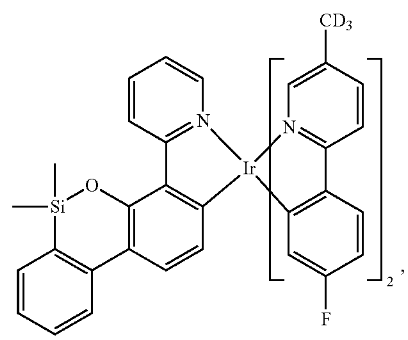
,
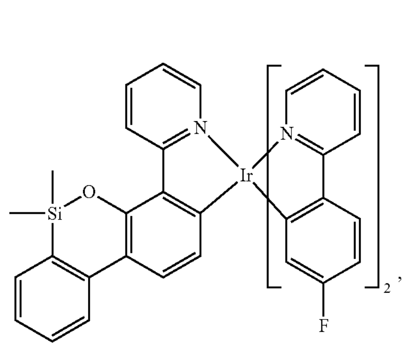
,
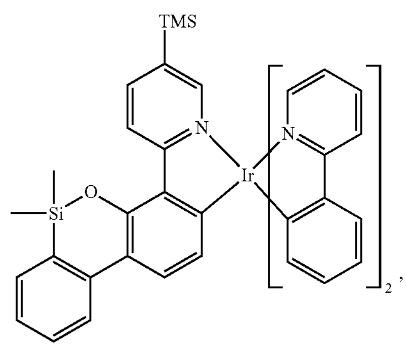
,
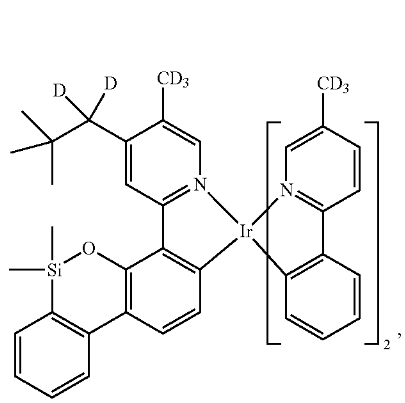
,
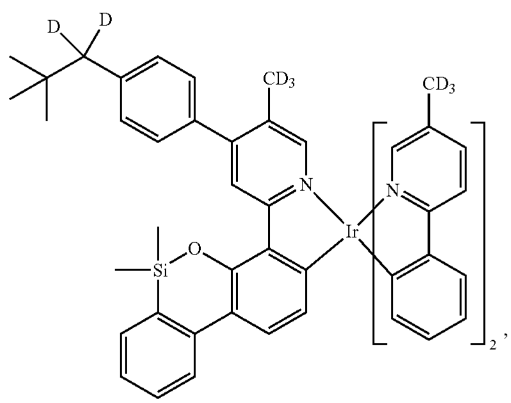
, -continued
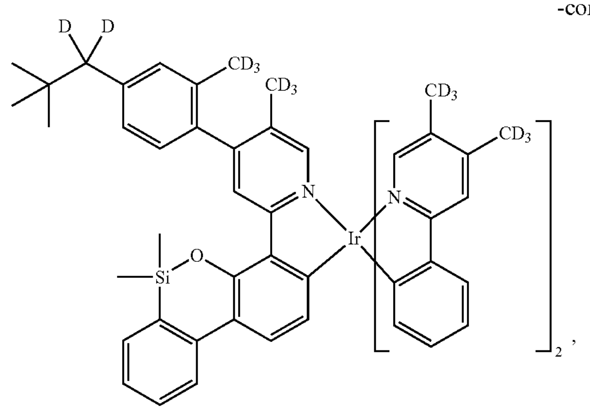
,
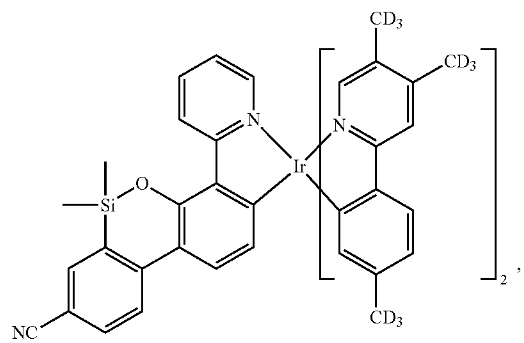
,
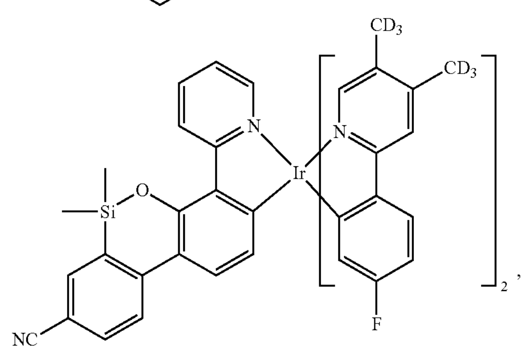
,
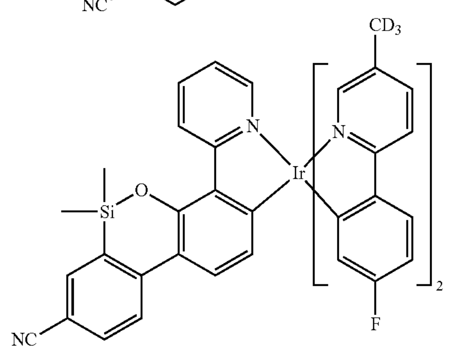
,
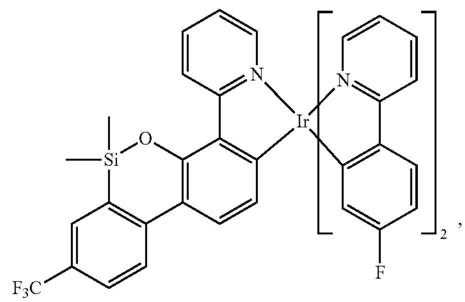
,
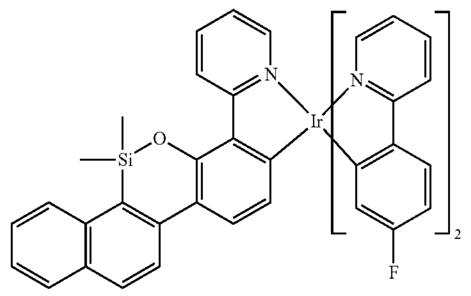
,
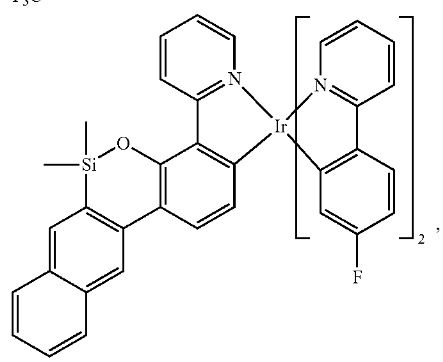
,
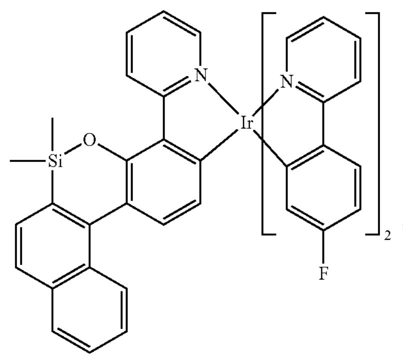
,
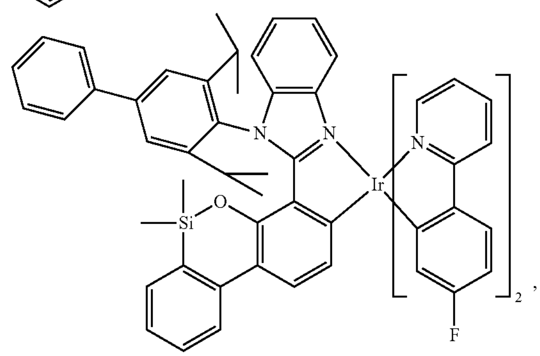
,
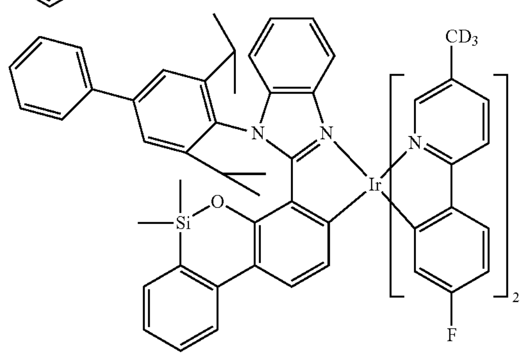
, -continued
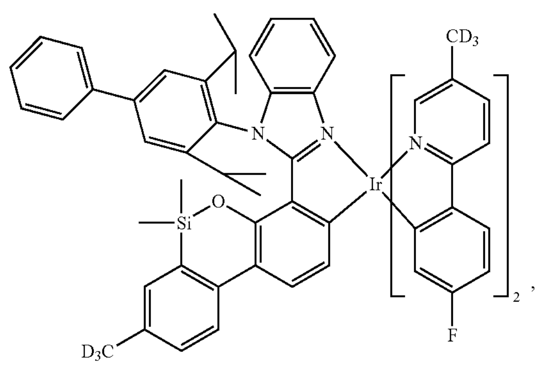
,
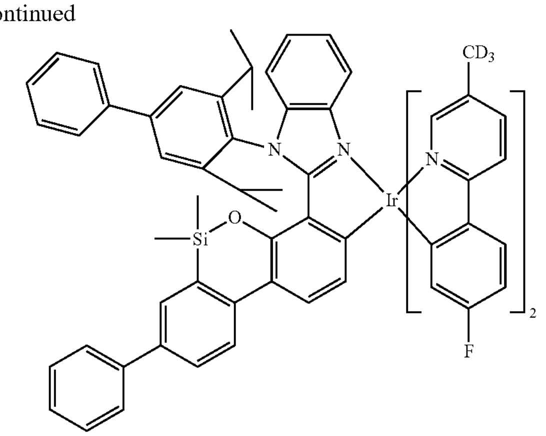
,
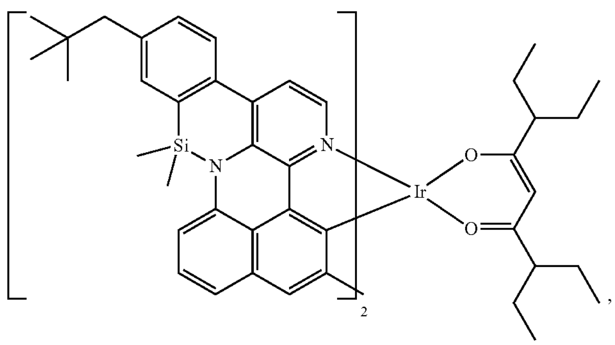
,
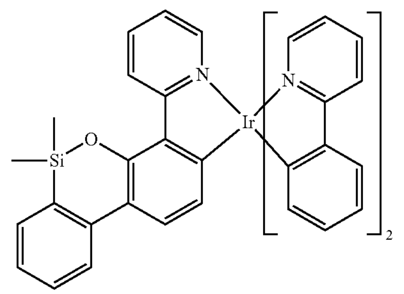
,
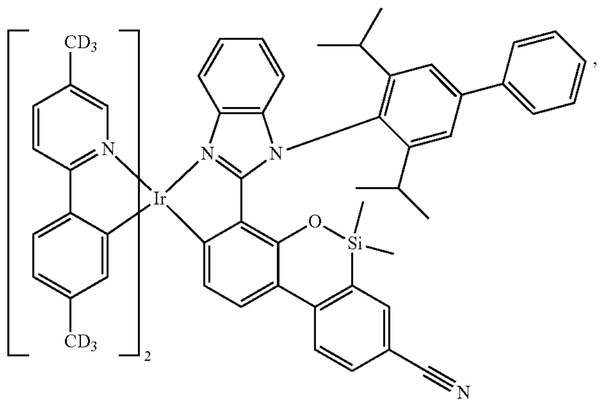
,
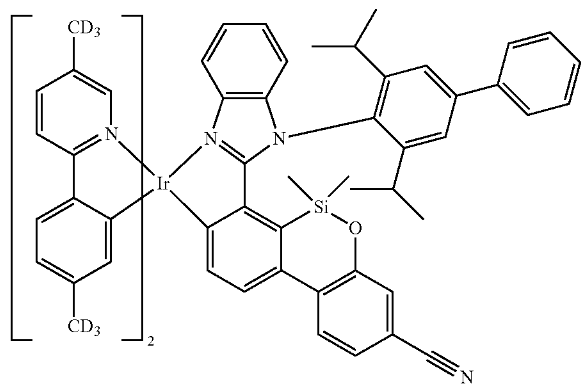
,
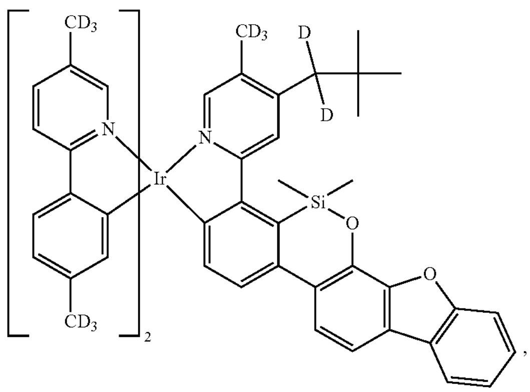
,
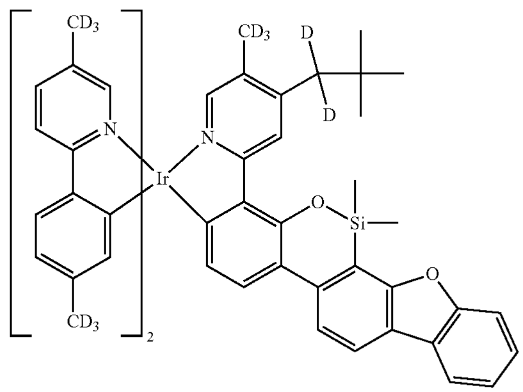
, -continued
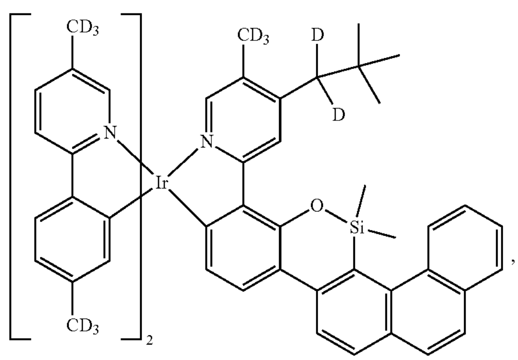,
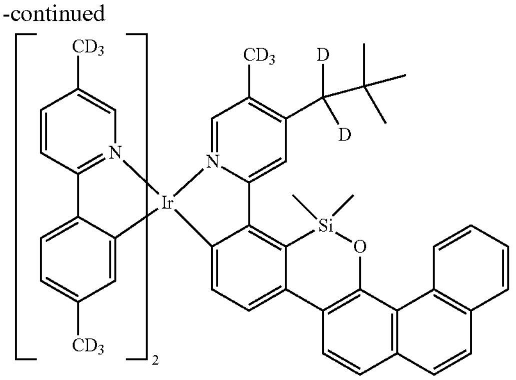,
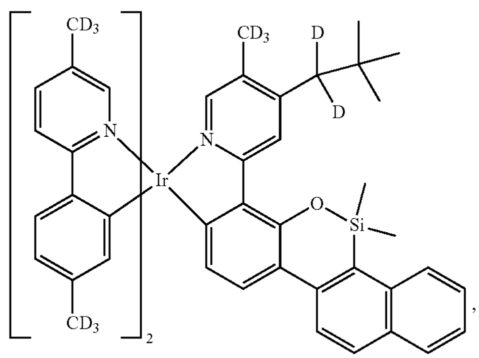,
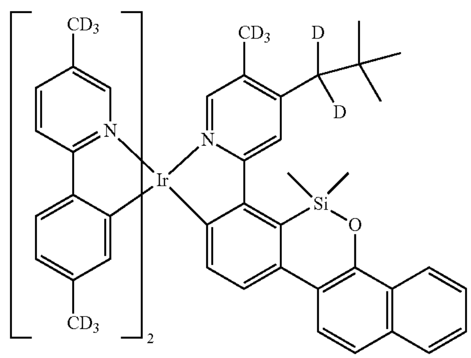,
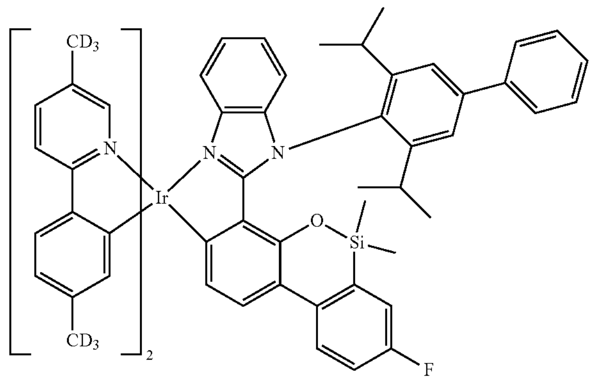,
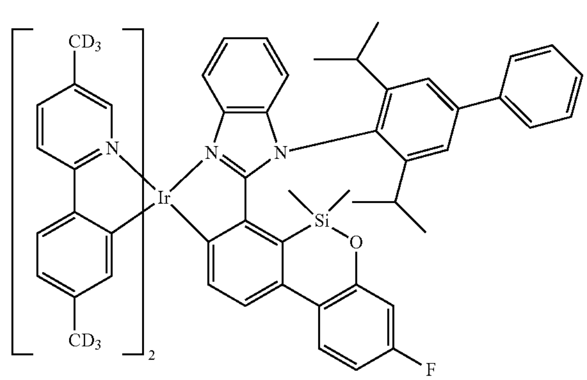,
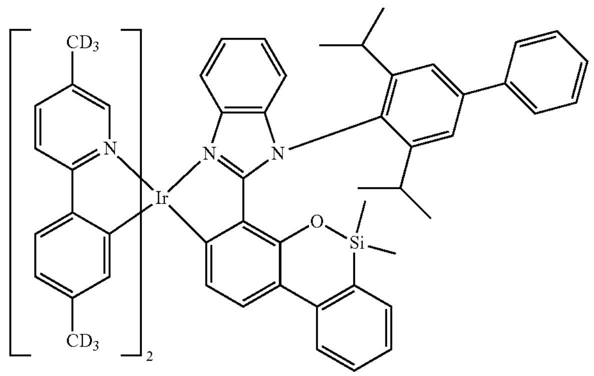,
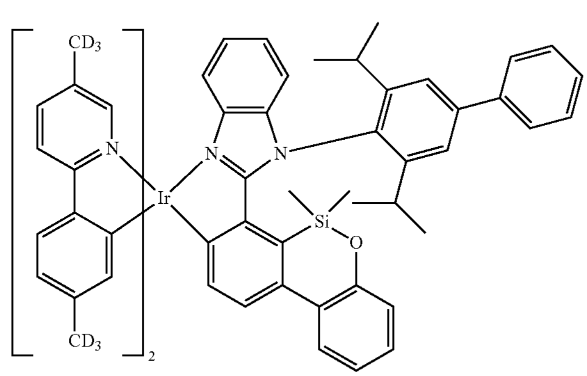, -continued
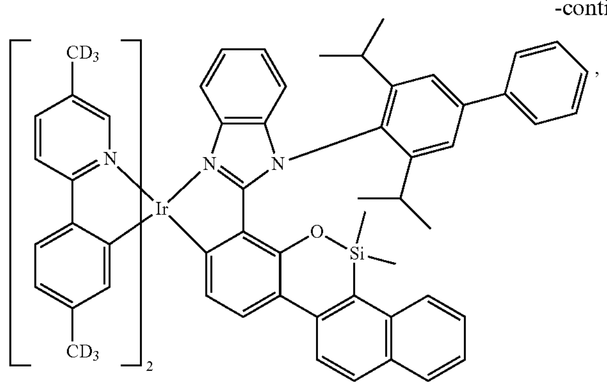
,
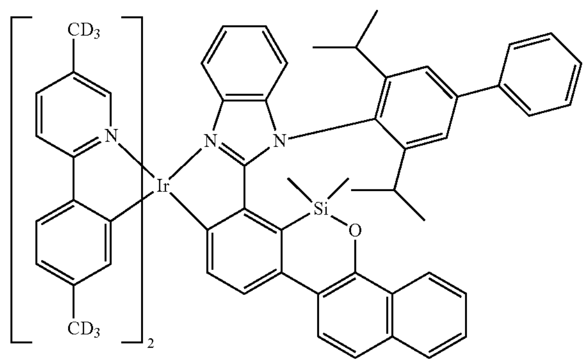
,
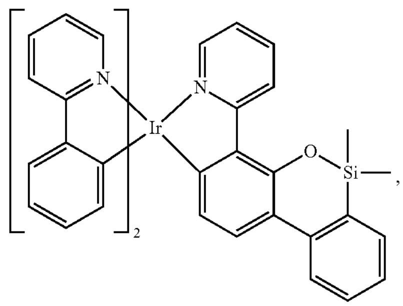
,
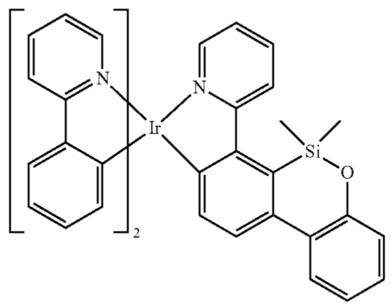
,
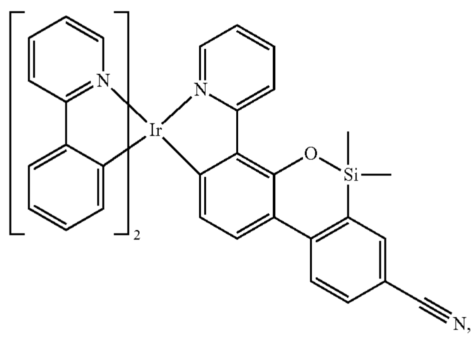
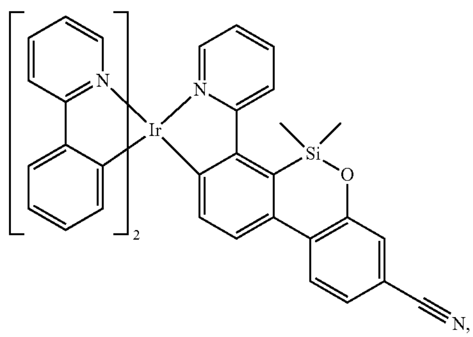
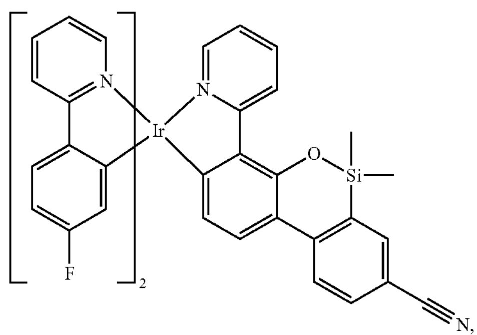
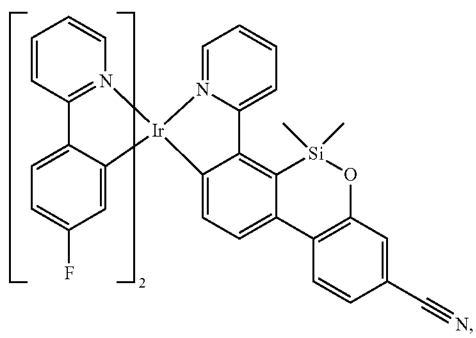
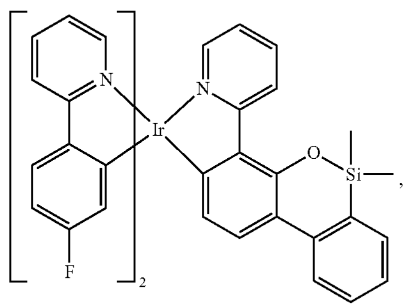
,
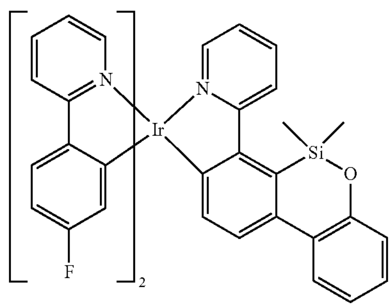
, -continued
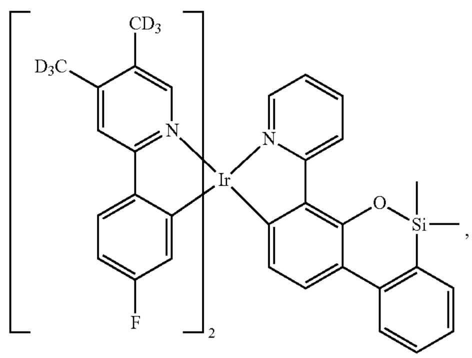
,
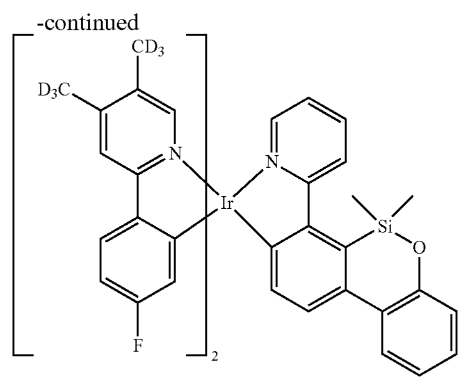
,
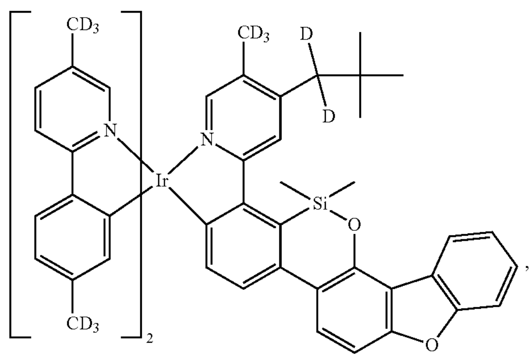
,
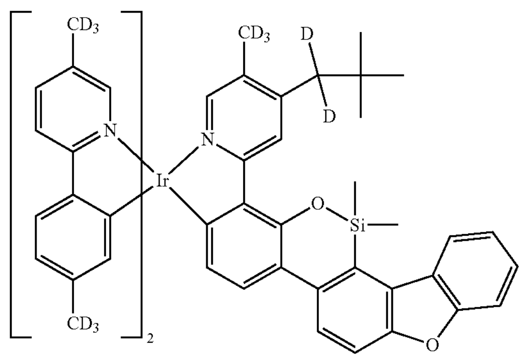
,
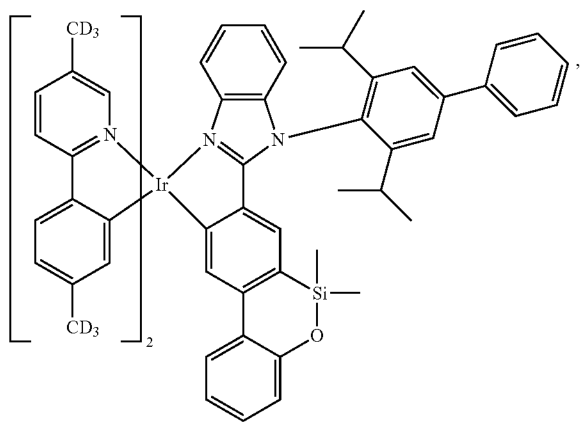
,
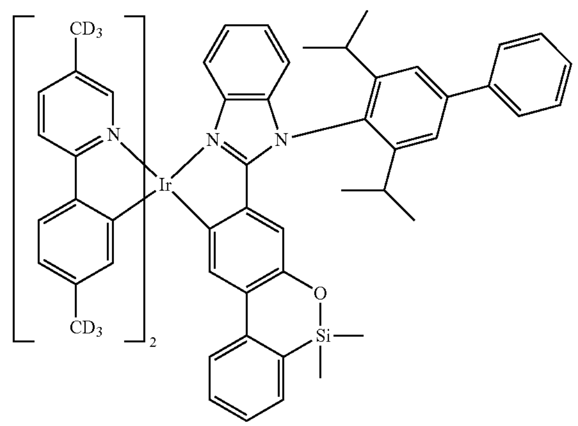
,
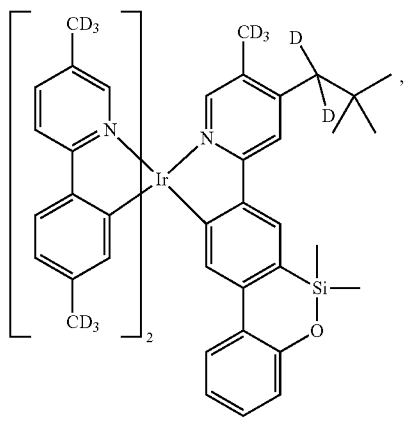
,
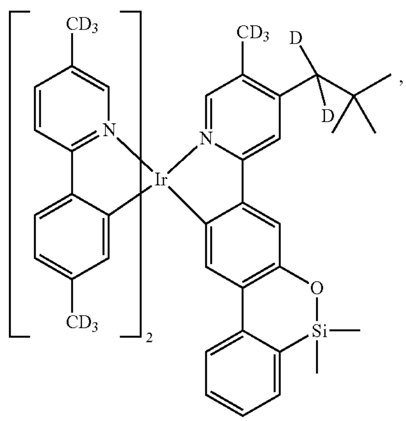
, -continued
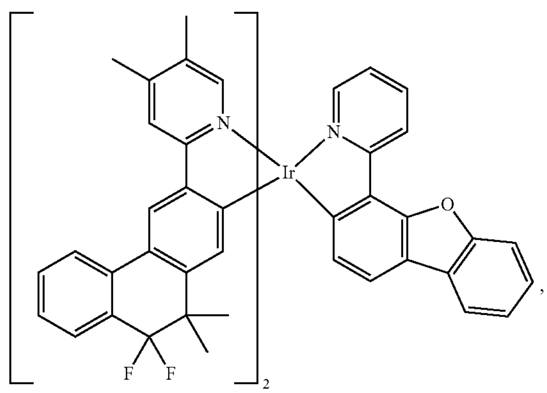,
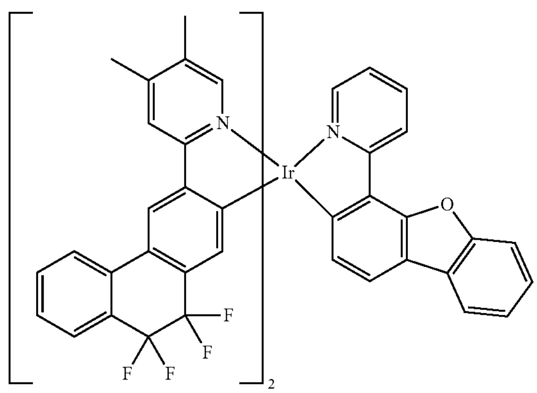,
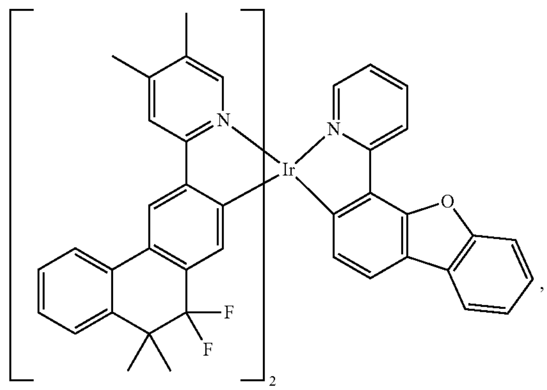,
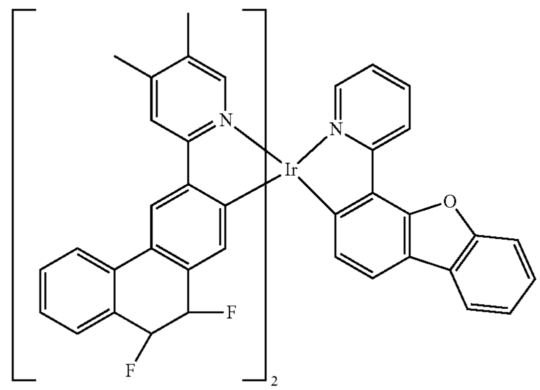,
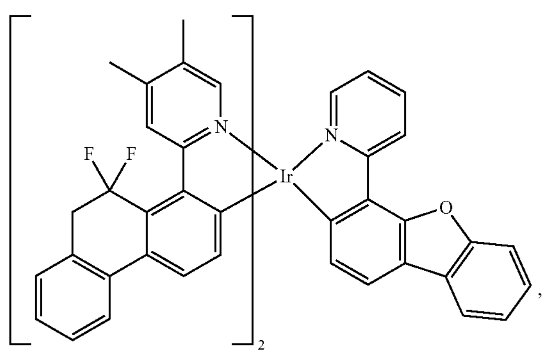,
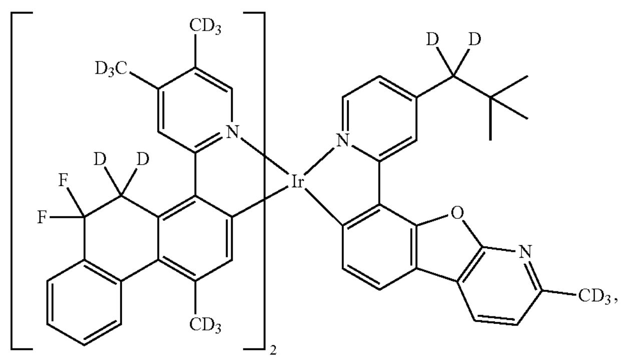,
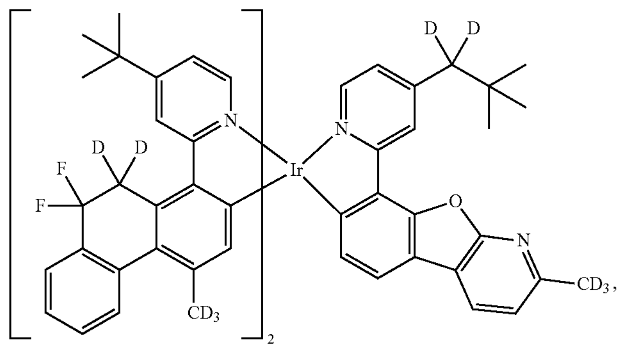, -continued
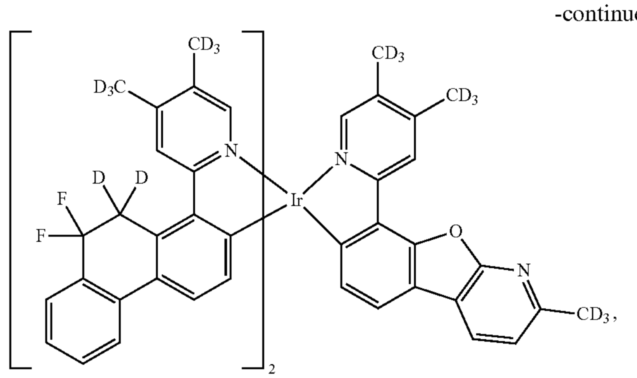
,
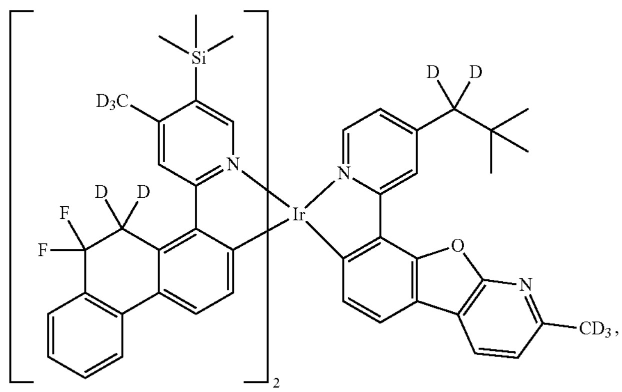
,
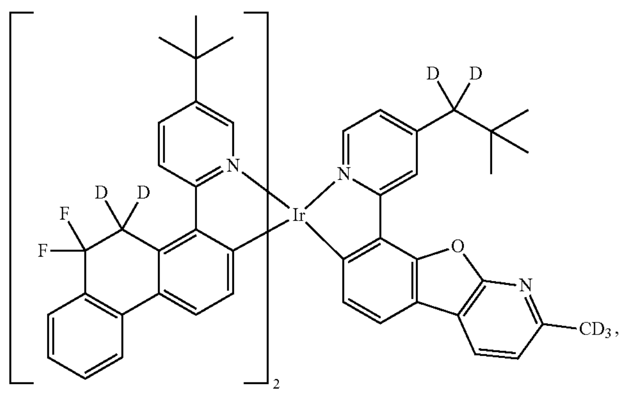
,
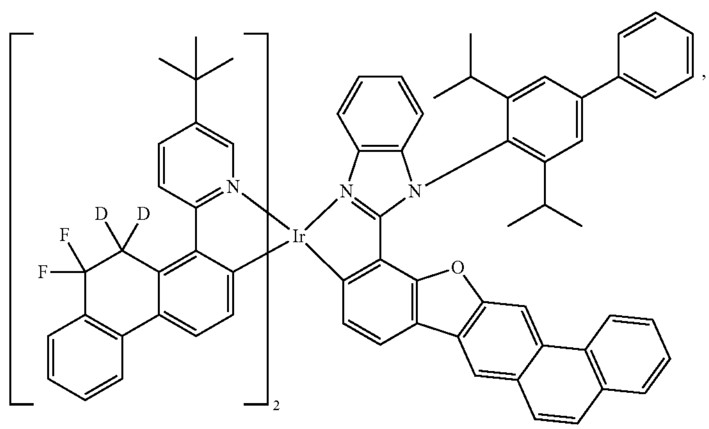
, -continued
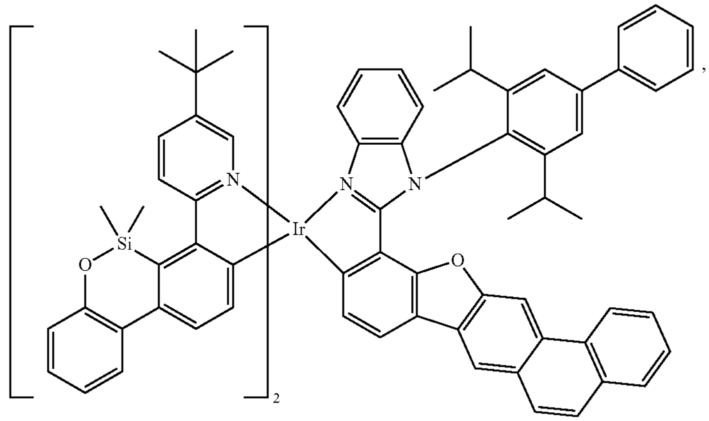
,
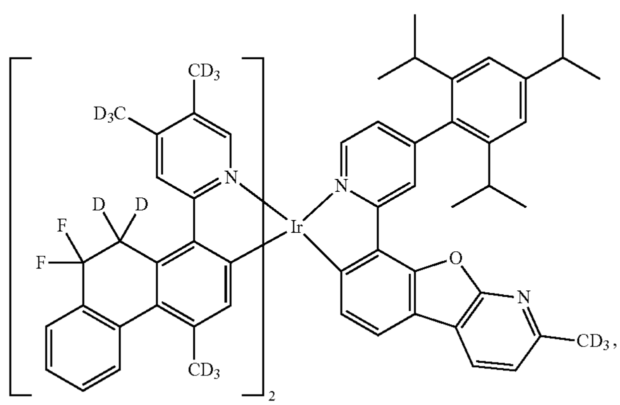
,
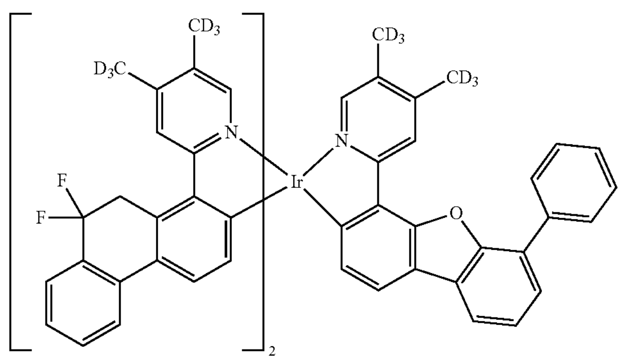
,
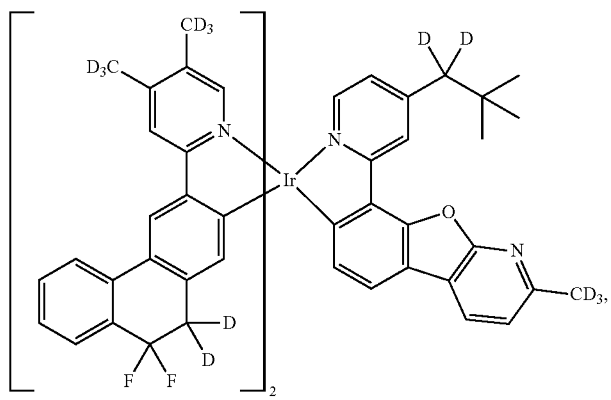
, -continued
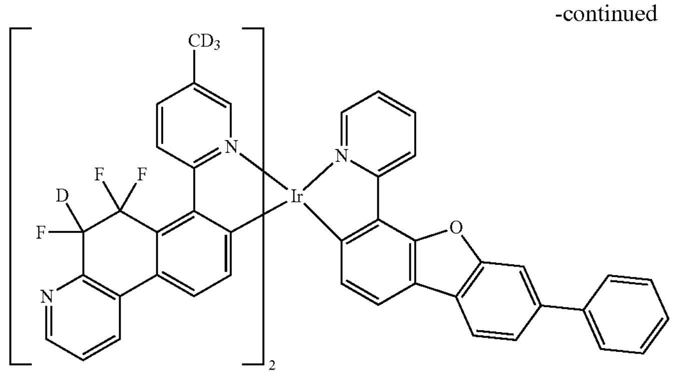
,
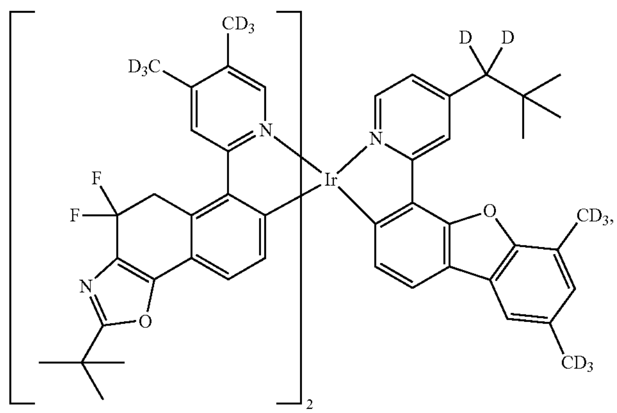
,
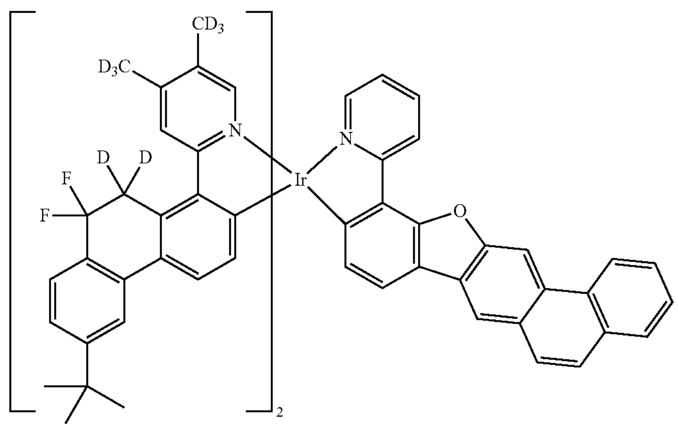
,
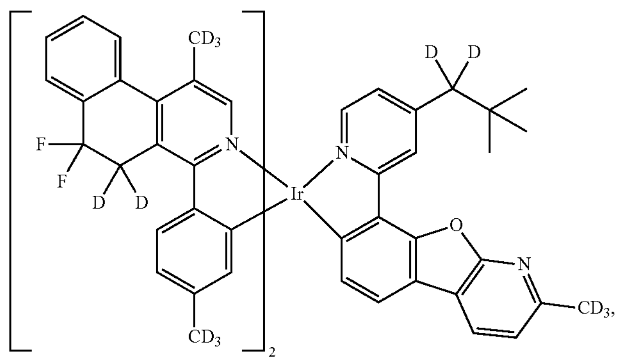
, -continued
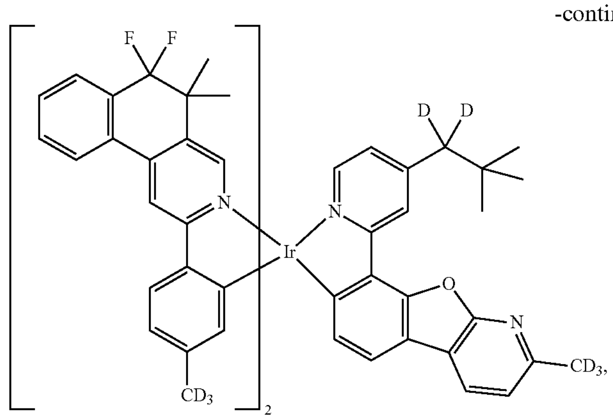
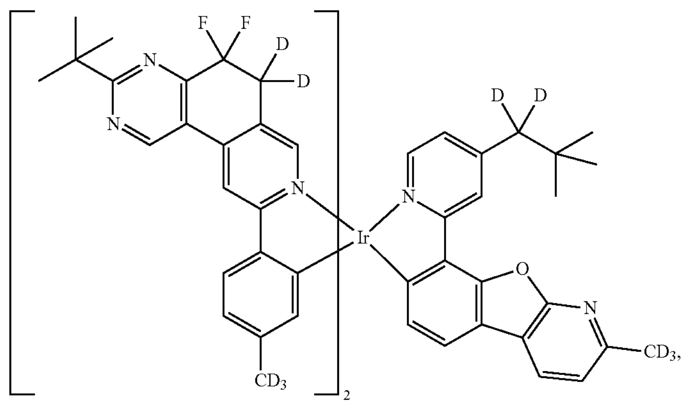
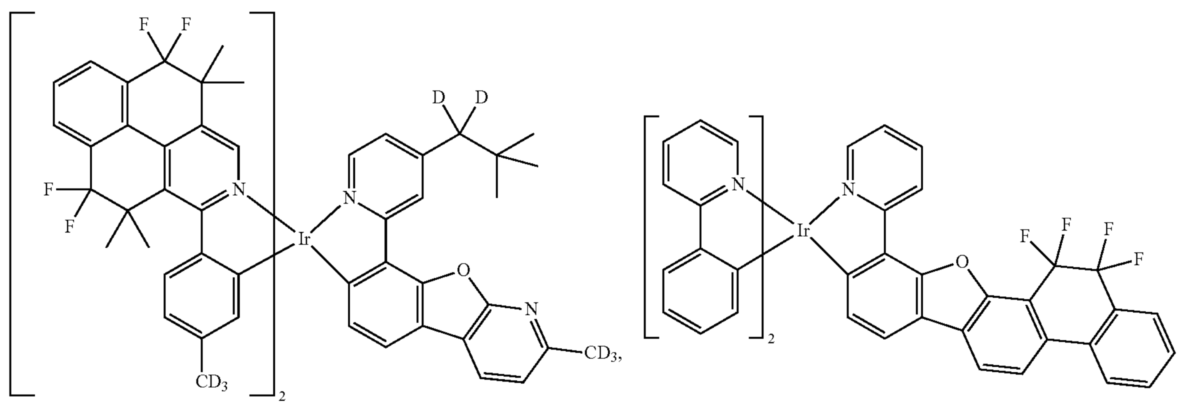
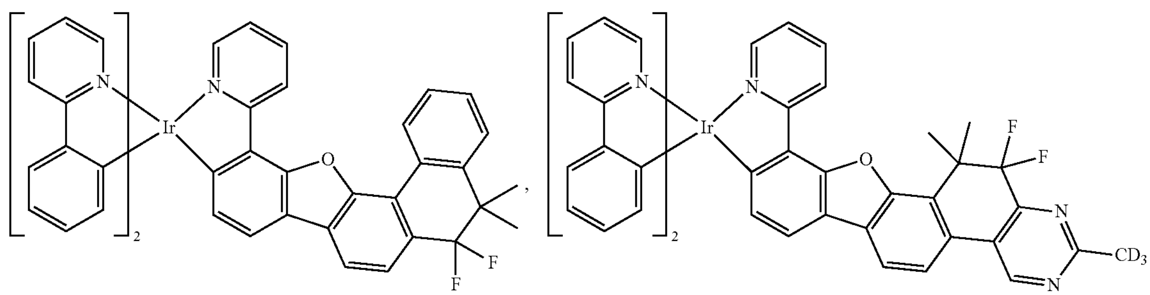

-continued
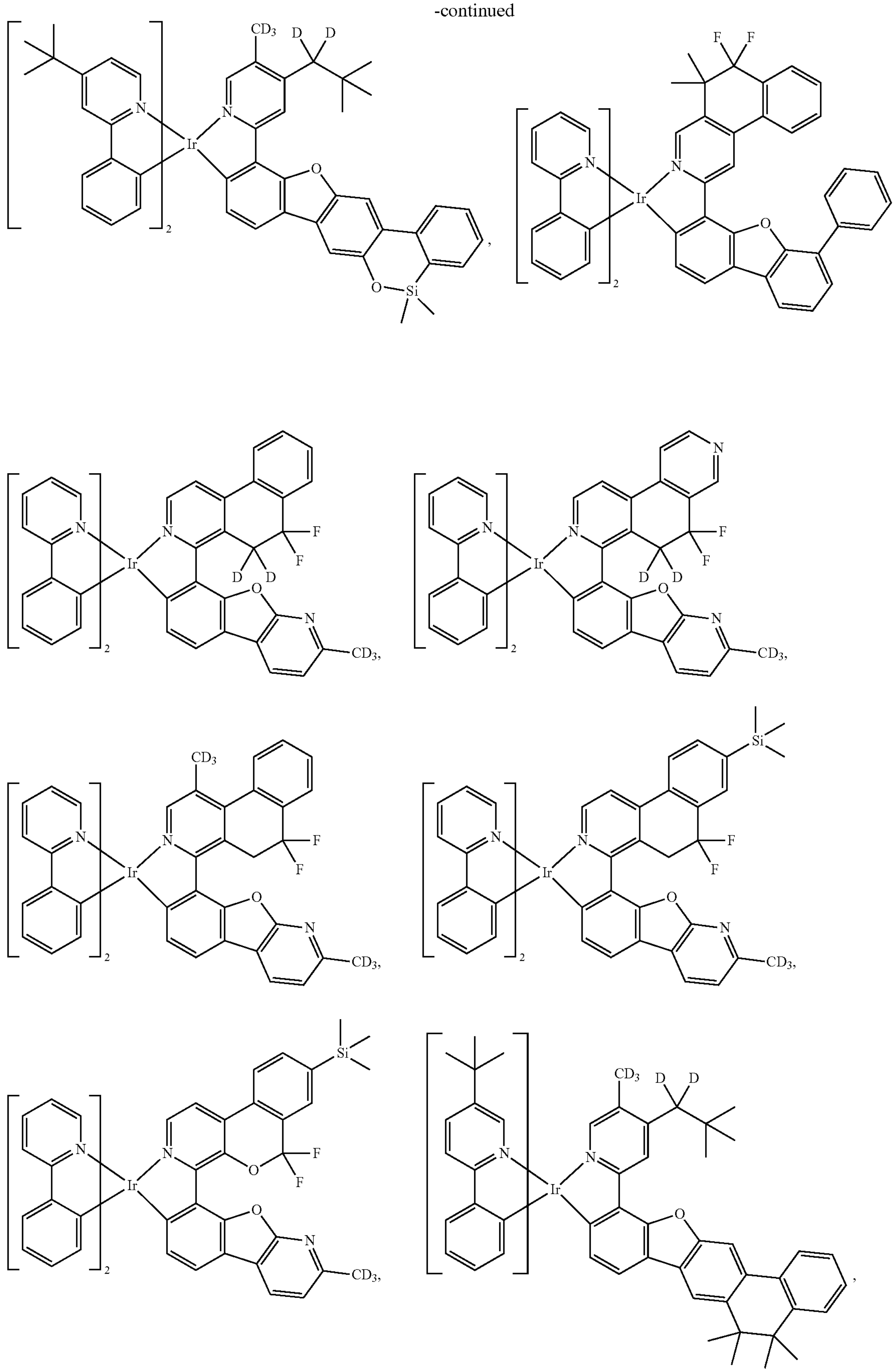

-continued
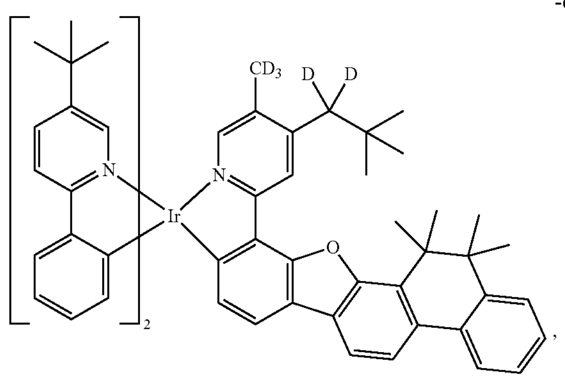
,
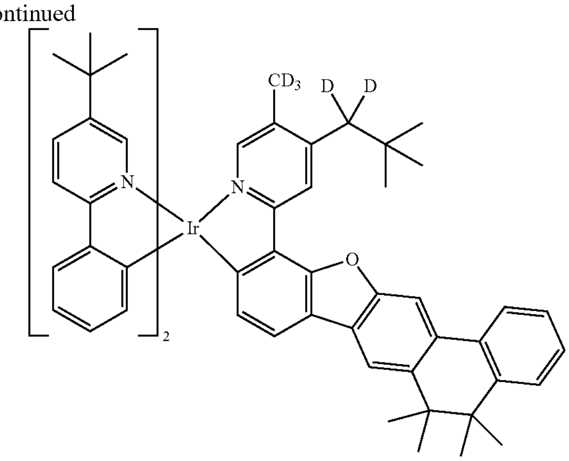
,
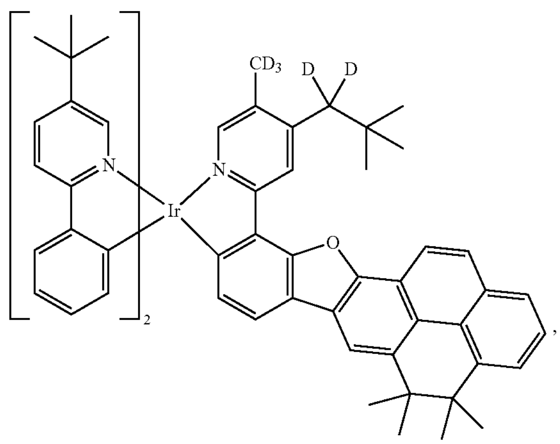
,
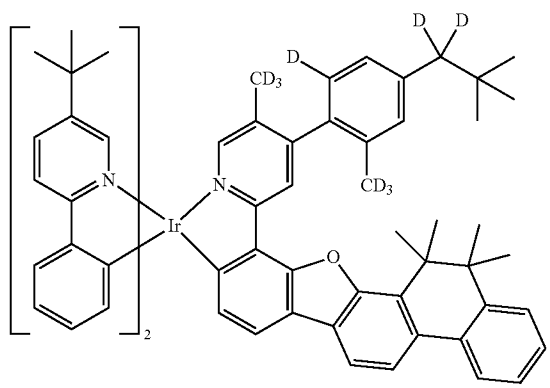
,
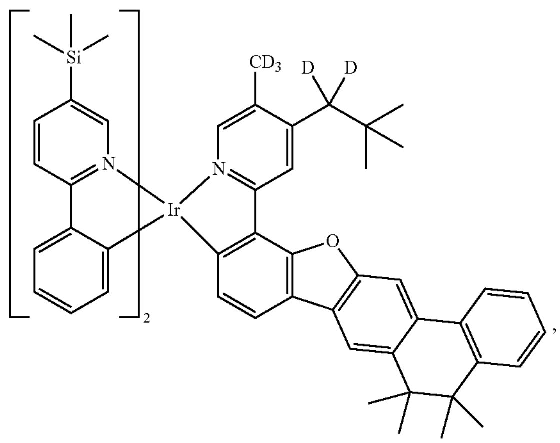
,
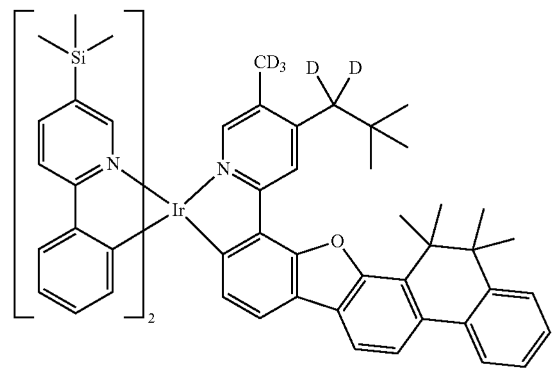
, -continued
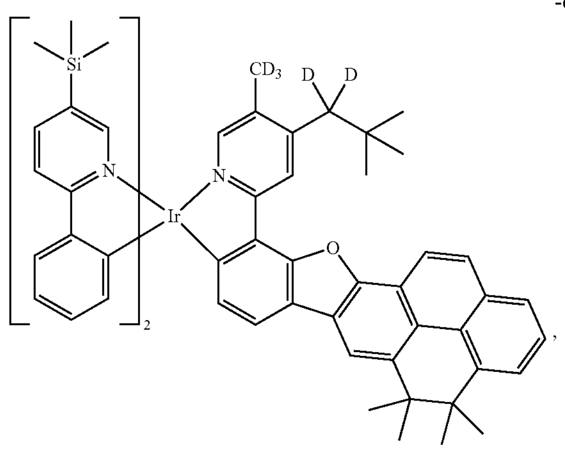
,
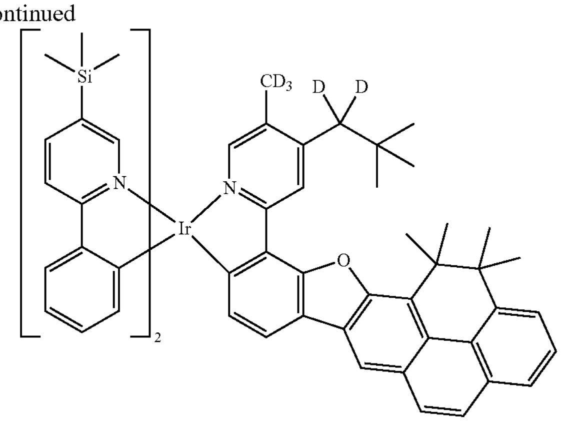
,
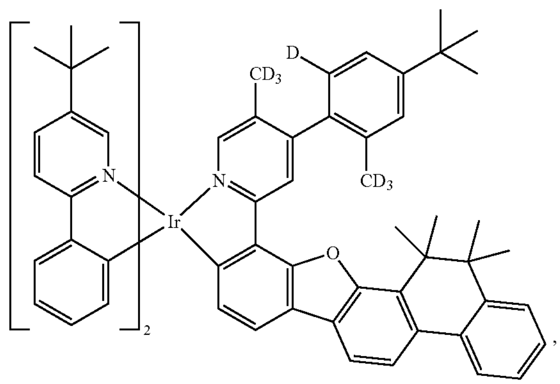
,
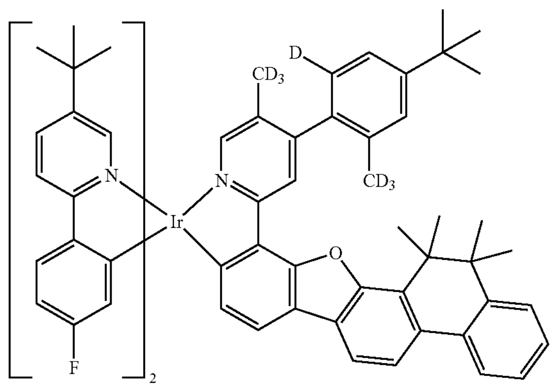
,
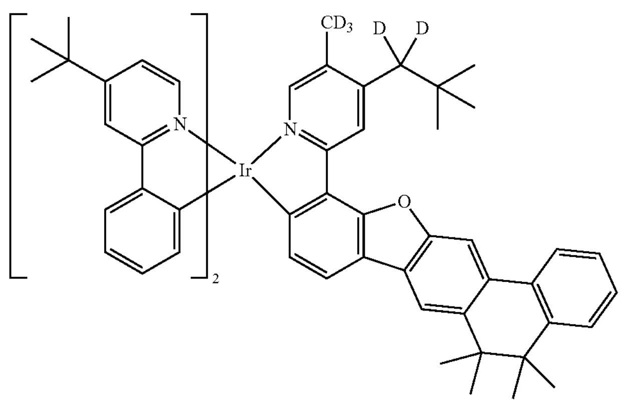
,
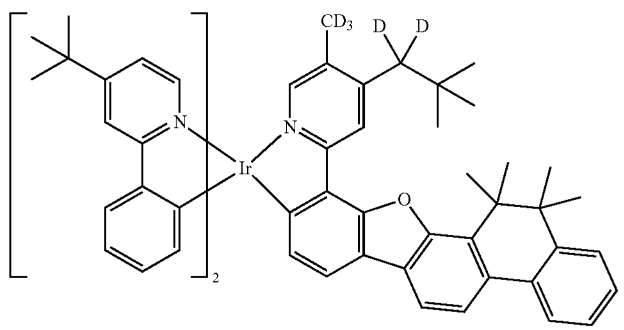
, -continued
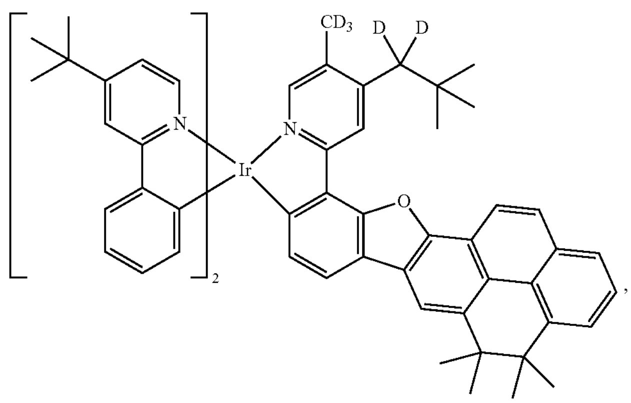
,
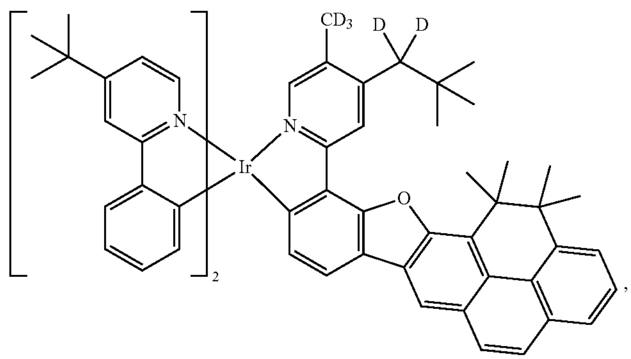
,
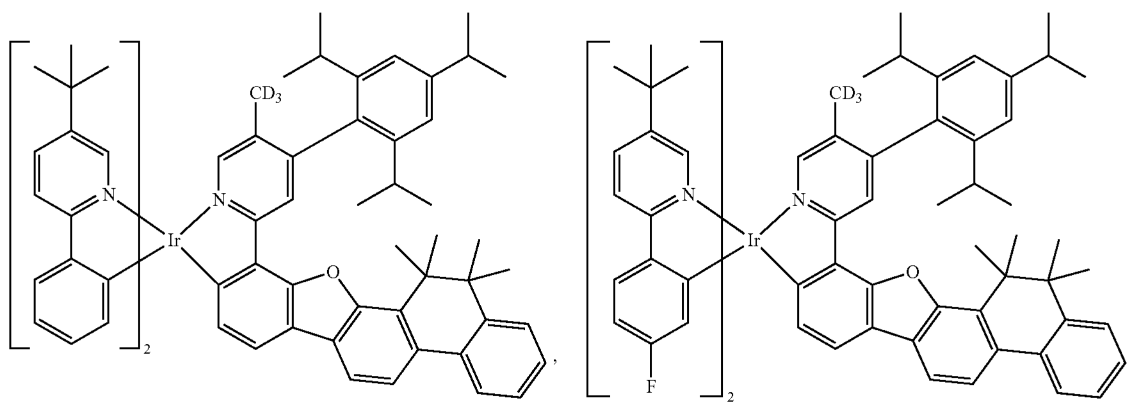
,
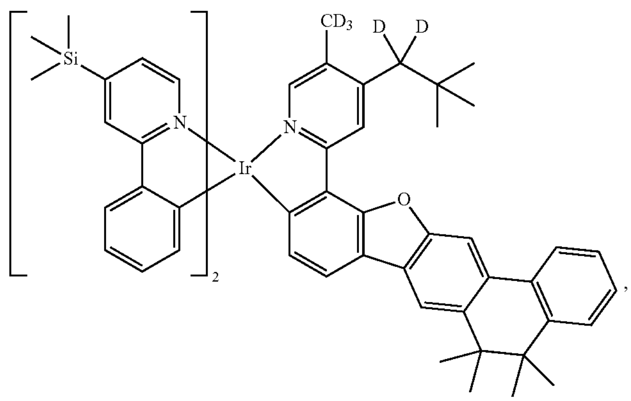
, -continued
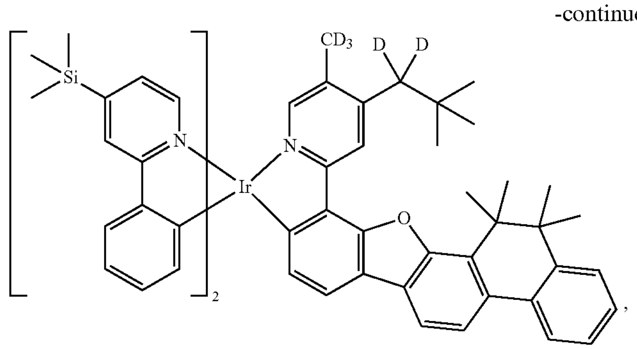
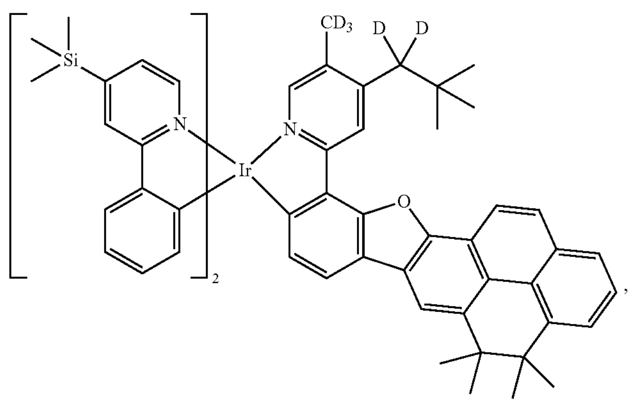
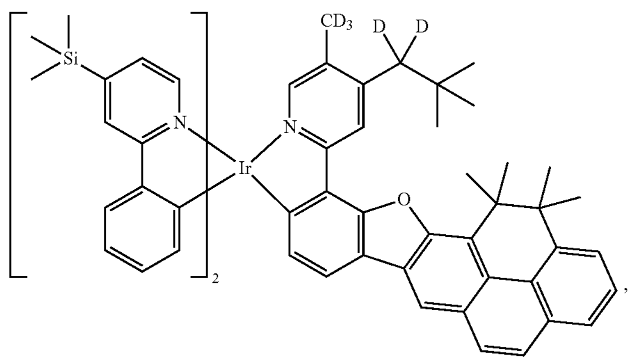
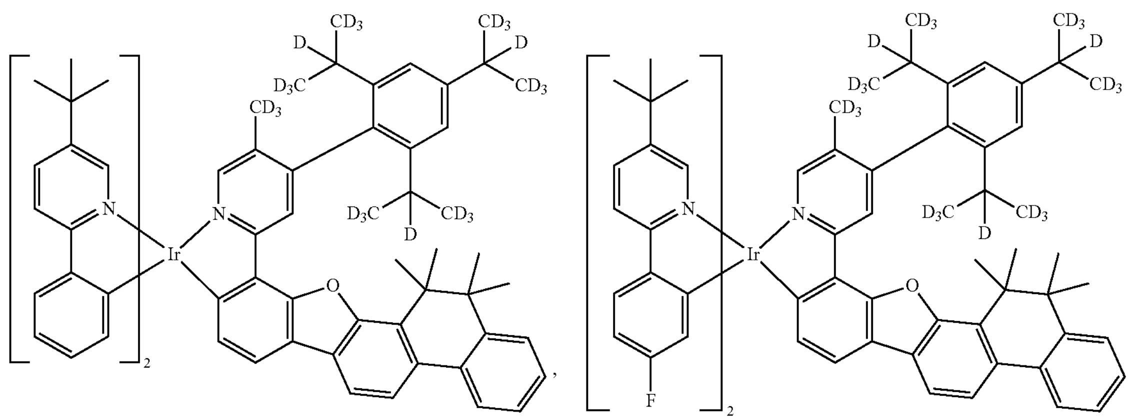

-continued
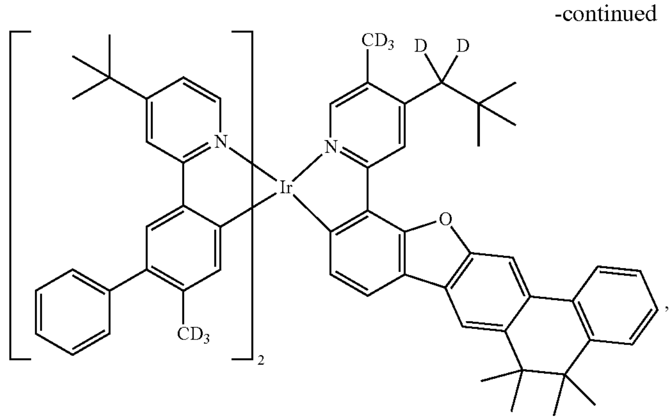
,
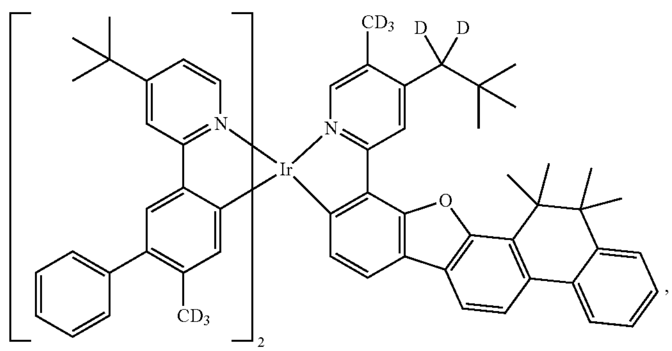
,
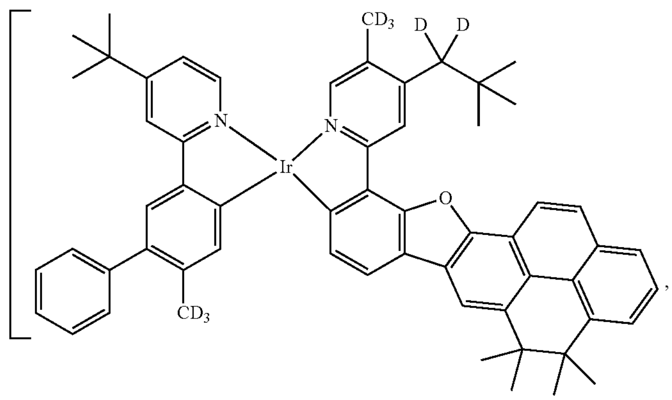
,
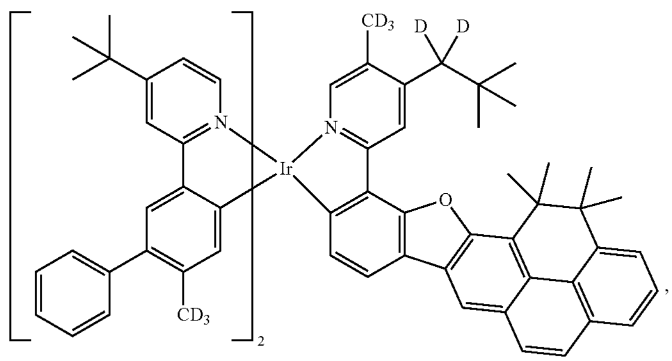
,

-continued
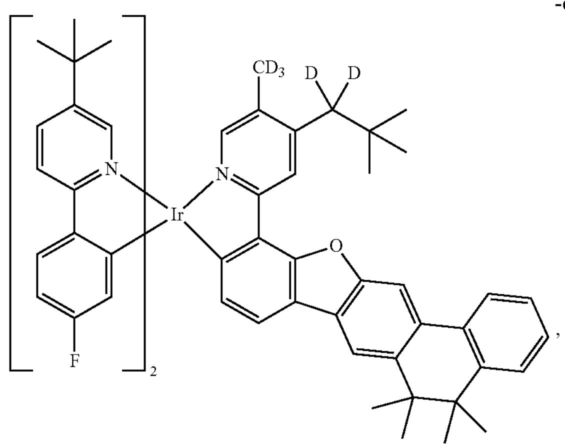,
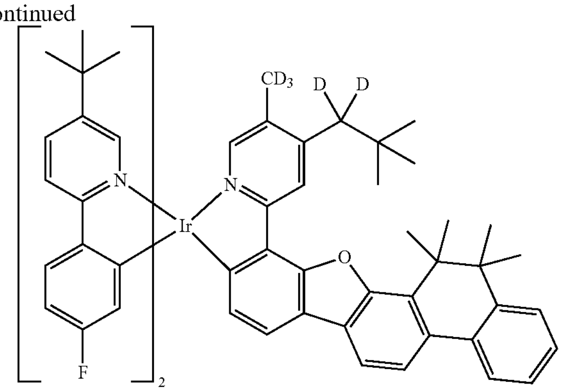,
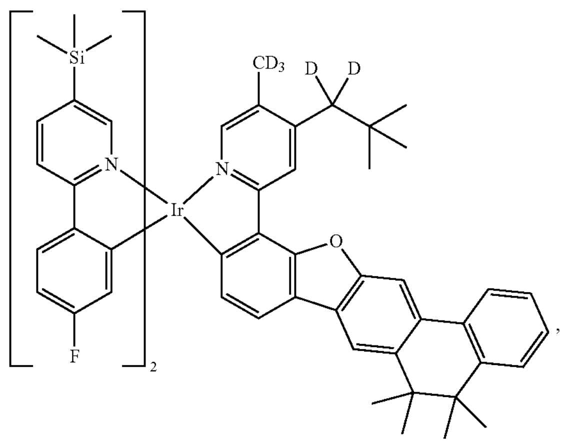,
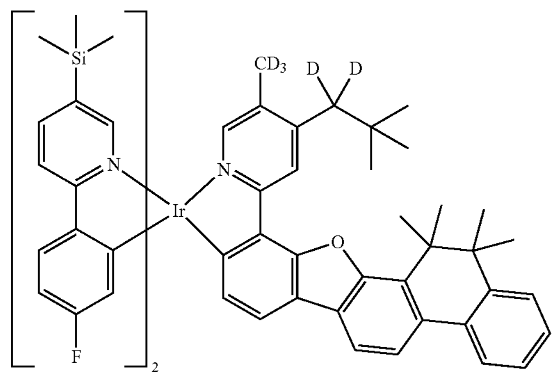,
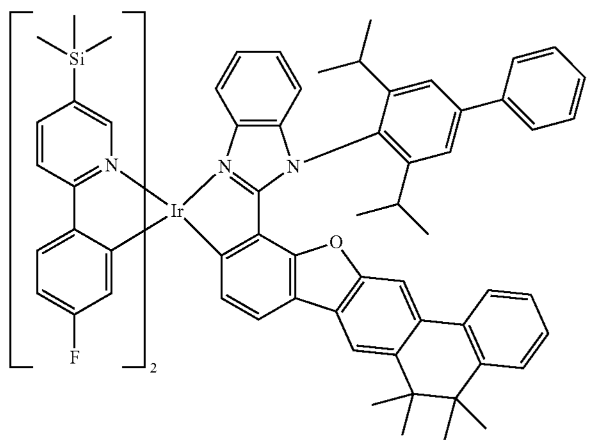,
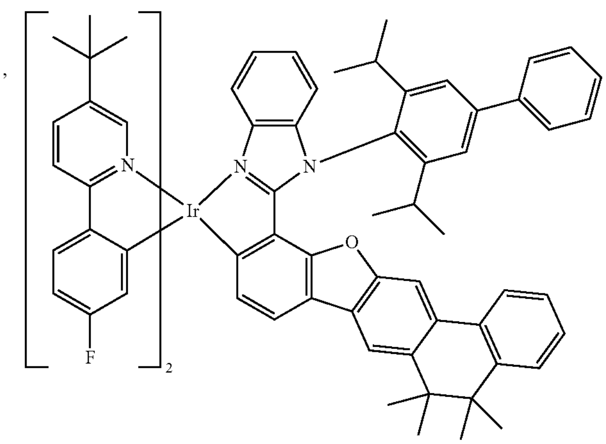, -continued
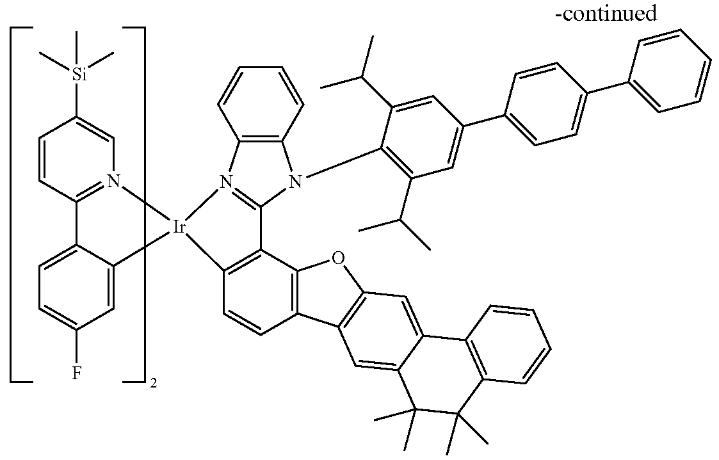
,
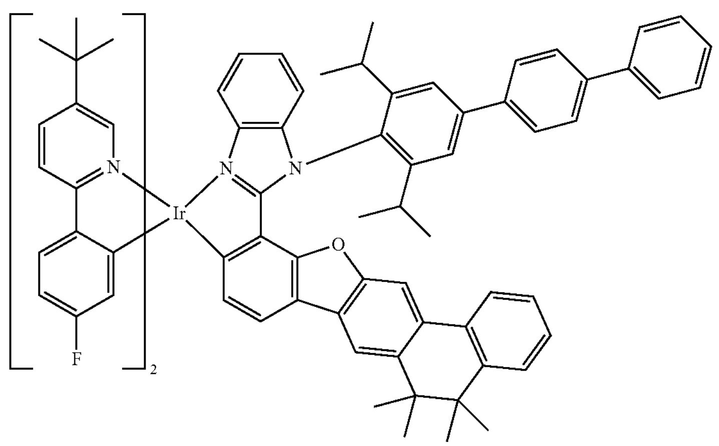
,
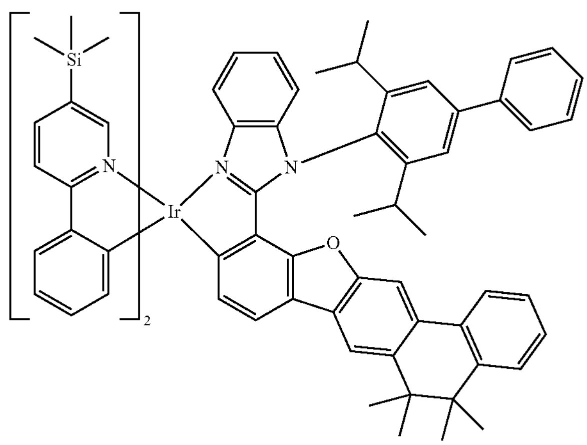
,
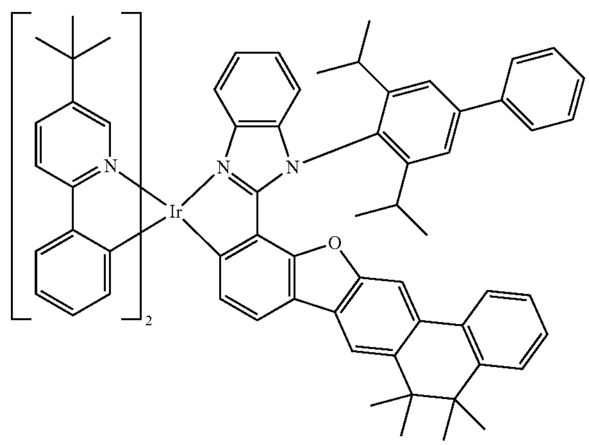
, -continued
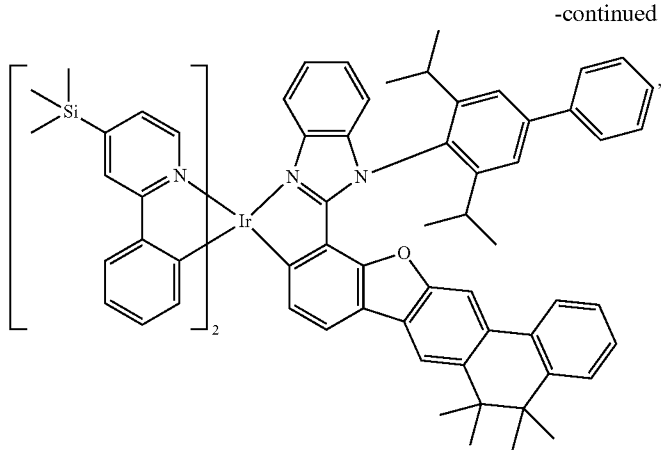
,
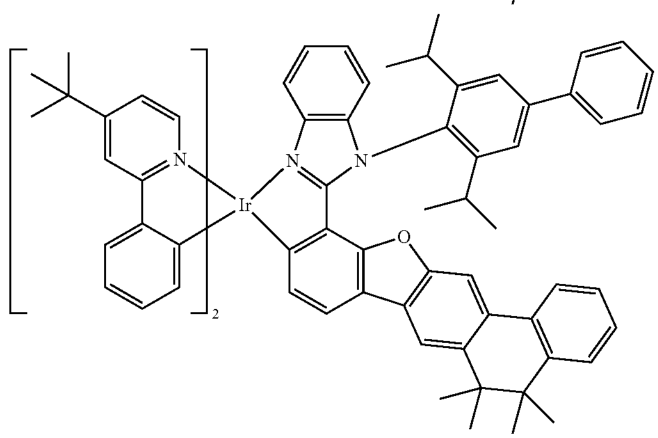
,
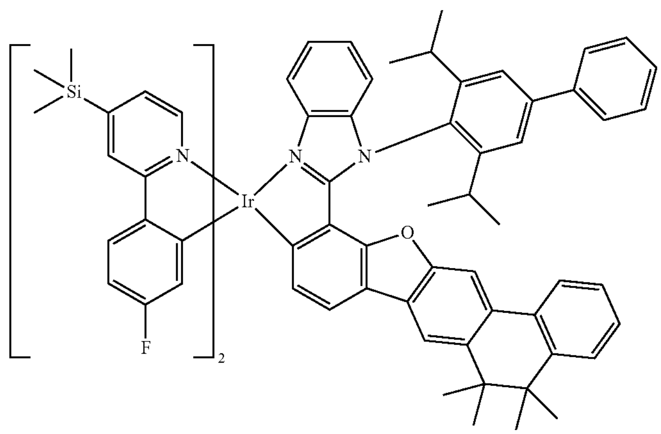
,
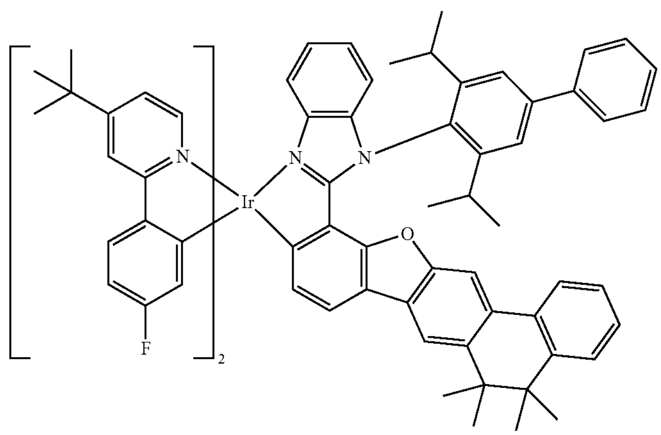
, -continued
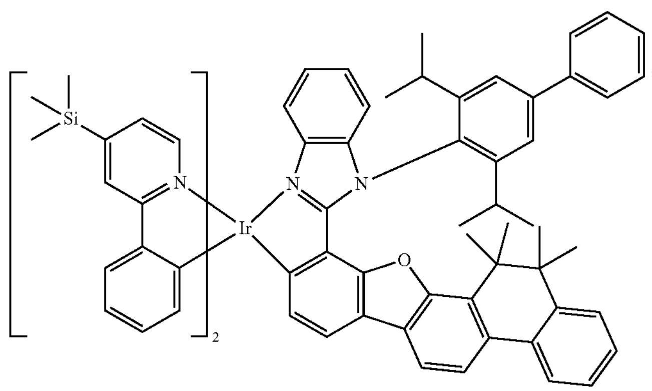
,
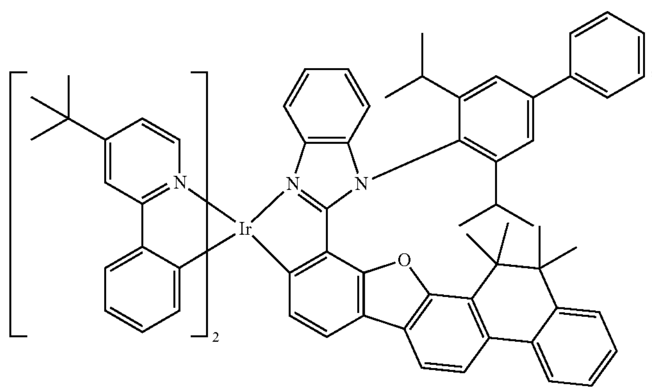
,
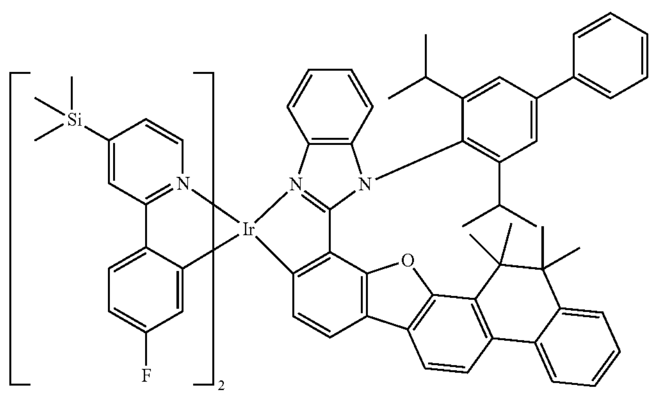
,
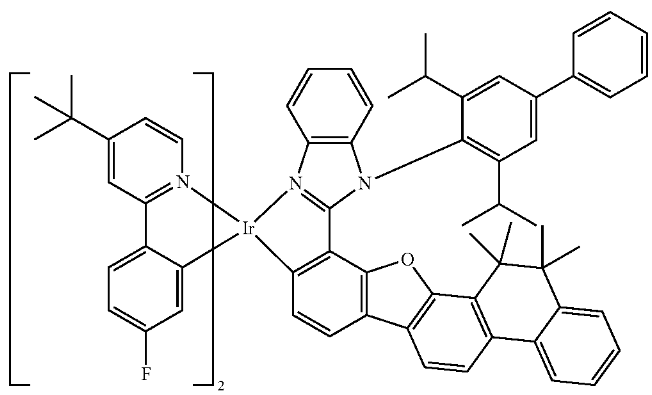
, -continued
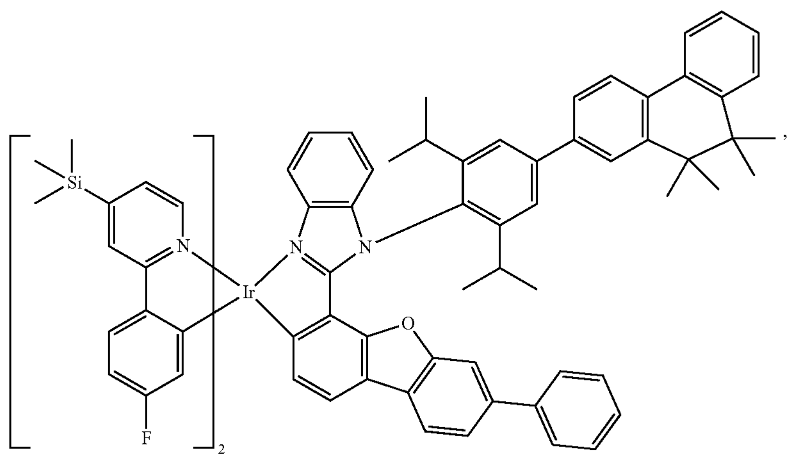
,
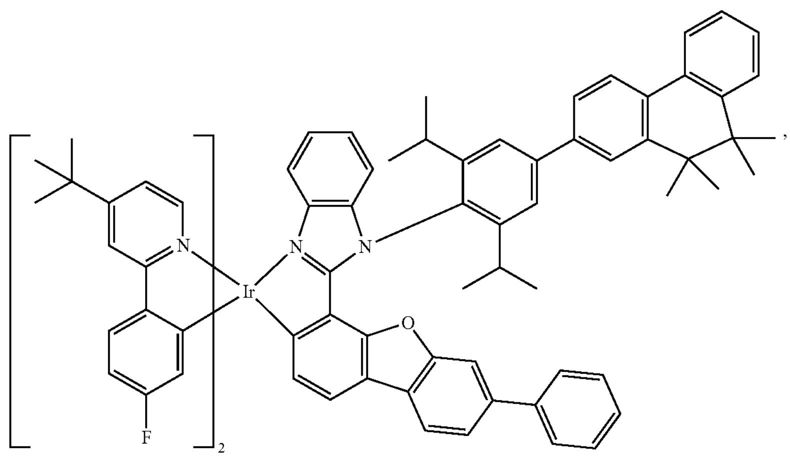
,
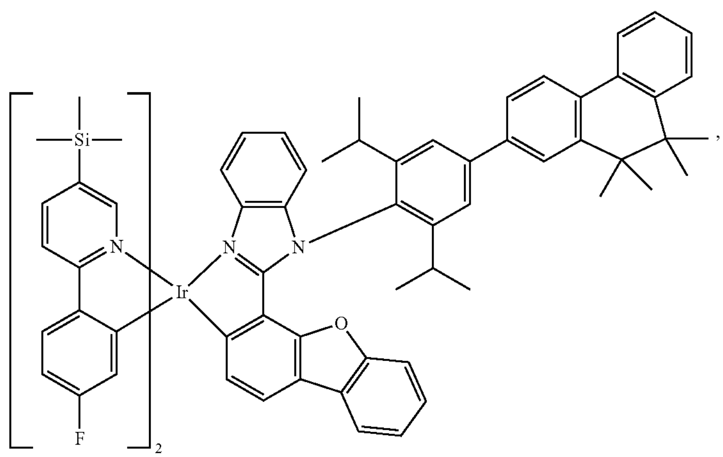
, -continued
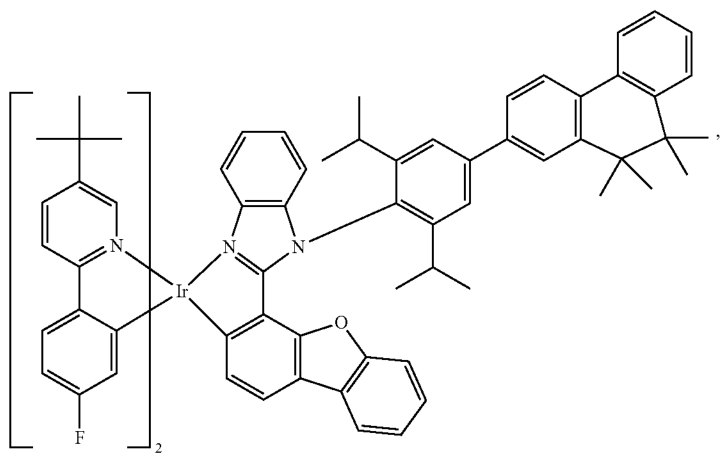
,
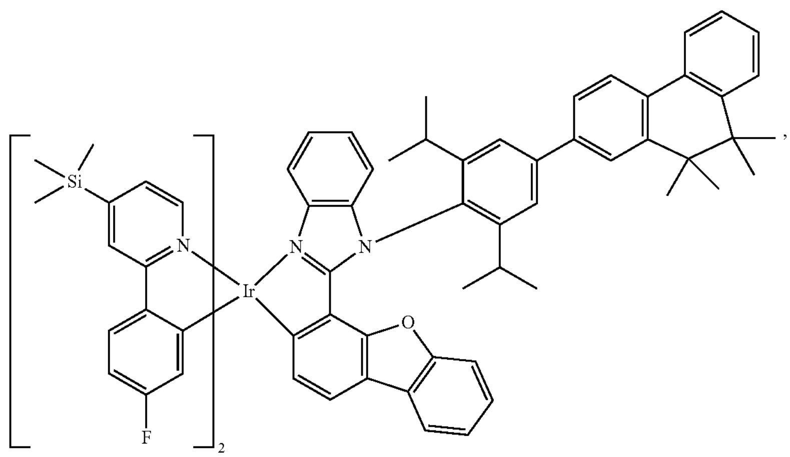
,
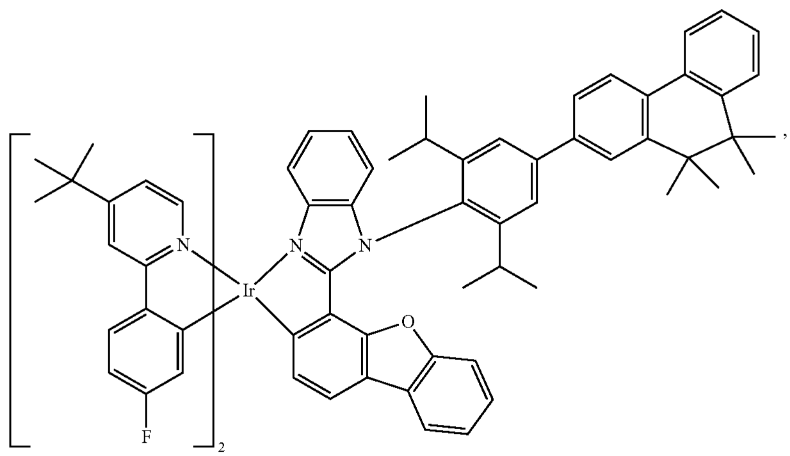
, -continued
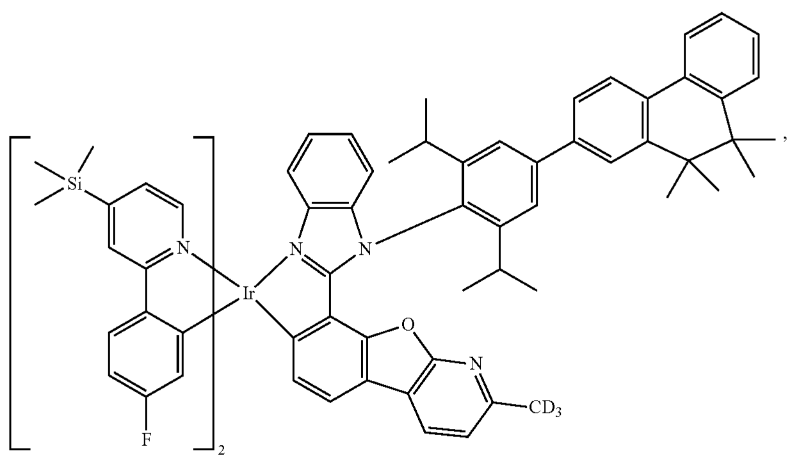
,
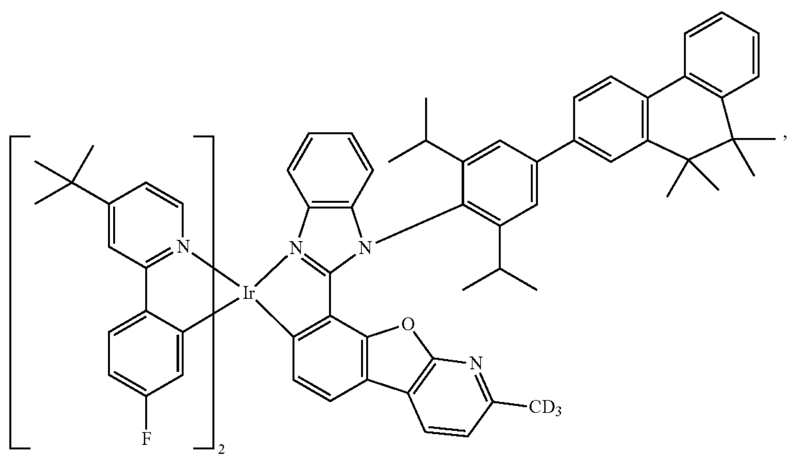
,
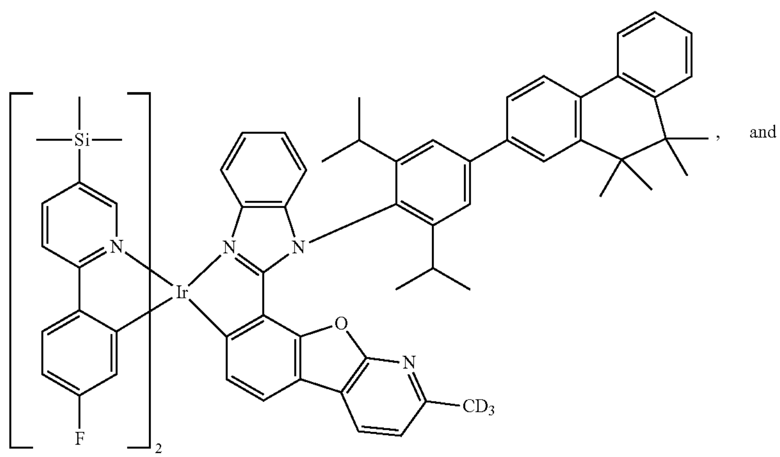
, and -continued

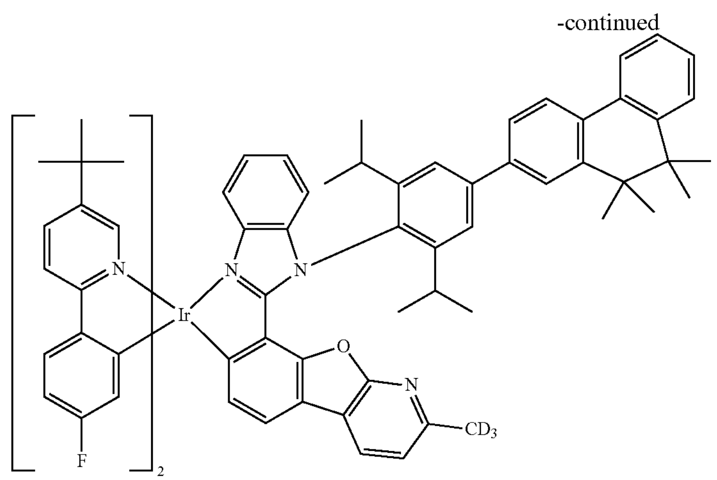

In some embodiments, the compound has the Formula IV:

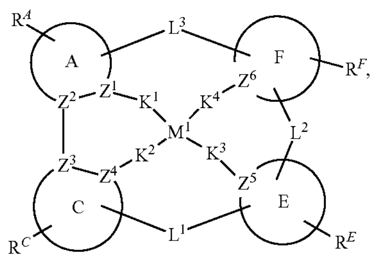

wherein:

$M^1$ is Pd or Pt;

moieties E and F are each independently a monocyclic ring or a polycyclic fused ring structure, wherein the monocyclic ring or each ring of the polycyclic fused ring structure is independently a 5-membered to 10-membered carbocyclic or heterocyclic ring;

$Z^5$ and $Z^6$ are each independently C or N;

$K^1$, $K^2$, $K^3$, and $K^4$ are each independently selected from the group consisting of a direct bond, O, S, $N(R^\alpha)$, $P(R^\alpha)$, $B(R^\alpha)$, $C(R^\alpha)(R^\beta)$, and $Si(R^\alpha)(R^\beta)$, wherein at least two of them are direct bonds;

$L^1$, $L^2$, and $L^3$ are each independently absent or selected from the group consisting of a single bond, BR, BRR', NR, $PR_e$, P(O)R, O, S, Se, C═O, C═S, C═Se, C═NR, C═CRR', S═O, $SO_2$, CR, CRR', SiRR', and GeRR', wherein at least one of $L^1$ and $L^2$ is present;

$R^E$ and $R^F$ each independently represent zero, mono, or up to a maximum allowed number of substitutions to its associated ring;

each of $R^\alpha$, $R^\beta$, R', R", $R^E$, and $R^F$ is independently a hydrogen or a substituent selected from the group consisting of deuterium, fluorine, alkyl, cycloalkyl, heteroalkyl, alkoxy, aryloxy, amino, silyl, germyl, boryl, alkenyl, cycloalkenyl, heteroalkenyl, aryl, heteroaryl, nitrile, isonitrile, sulfanyl, and combinations thereof;

two adjacent $R^A$, $R^B$, $R^C$, $R^E$, and $R^F$ can be joined or fused together to form a ring; and moieties A and C, $Z^1$-$Z^4$, $R^A$, and $R^B$ are all defined the same as above.

In some embodiments of Formula IV, at least one R', R", $R^A$, $R^B$, $R^E$, or $R^F$ is partially or fully deuterated. In some embodiments, at least one $R^A$ is partially or fully deuterated. In some embodiments, at least one $R^B$ is partially or fully deuterated. In some embodiments, at least one $R^E$ is partially or fully deuterated. In some embodiments, at least one $R^F$ is partially or fully deuterated. In some embodiments of Formula II, at least R' or R" is present and is partially or fully deuterated.

In some embodiments of Formula IV, at least one R', R", $R^A$, $R^B$, $R^E$, or $R^F$ is or comprises an electron-withdrawing group from the LIST EWG 1 as defined herein. In some embodiments, at least one R', R", $R^A$, $R^B$, $R^E$, or $R^F$ is or comprises an electron-withdrawing group from the LIST EWG 2 as defined herein. In some embodiments, at least one R', R", $R^A$, $R^B$, $R^E$, or $R^F$ is or comprises an electron-withdrawing group from the LIST EWG 3 as defined herein. In some embodiments, at least one R', R", $R^A$, $R^B$, $R^E$, or $R^F$ is or comprises an electron-withdrawing group from the LIST EWG 4 as defined herein. In some embodiments, at least one R', R", $R^A$, $R^B$, $R^E$, or $R^F$ is or comprises an electron-withdrawing group from the LIST Pi-EWG as defined herein.

In some embodiments of Formula IV, at least one $R^A$ is or comprises an electron-withdrawing group from the LIST EWG 1 as defined herein. In some embodiments, at least one $R^A$ is or comprises an electron-withdrawing group from the LIST EWG 2 as defined herein. In some embodiments, at least one $R^A$ is or comprises an electron-withdrawing group from the LIST EWG 3 as defined herein. In some embodiments, at least one $R^A$ is or comprises an electron-withdrawing group from the LIST EWG 4 as defined herein. In some embodiments, at least one $R^A$ is or comprises an electron-withdrawing group from the LIST Pi-EWG as defined herein.

In some embodiments of Formula IV, at least one $R^B$ is or comprises an electron-withdrawing group from the LIST EWG 1 as defined herein. In some embodiments, at least one $R^B$ is or comprises an electron-withdrawing group from the LIST EWG 2 as defined herein. In some embodiments, at least one $R^B$ is or comprises an electron-withdrawing group from the LIST EWG 3 as defined herein. In some embodiments, at least one $R^B$ is or comprises an electron-withdrawing group from the LIST EWG 4 as defined herein. In some embodiments, at least one $R^B$ is or comprises an electron-withdrawing group from the LIST Pi-EWG as defined herein.

In some embodiments of Formula IV, at least one $R^E$ is or comprises an electron-withdrawing group from the LIST EWG 1 as defined herein. In some embodiments, at least one $R^E$ is or comprises an electron-withdrawing group from the LIST EWG 2 as defined herein. In some embodiments, at least one $R^E$ is or comprises an electron-withdrawing group from the LIST EWG 3 as defined herein. In some embodiments, at least one $R^E$ is or comprises an electron-withdrawing group from the LIST EWG 4 as defined herein. In some embodiments, at least one $R^E$ is or comprises an electron-withdrawing group from the LIST Pi-EWG as defined herein.

In some embodiments of Formula IV, at least one $R^F$ is or comprises an electron-withdrawing group from the LIST EWG 1 as defined herein. In some embodiments, at least one $R^F$ is or comprises an electron-withdrawing group from the LIST EWG 2 as defined herein. In some embodiments, at least one $R^F$ is or comprises an electron-withdrawing group from the LIST EWG 3 as defined herein. In some embodiments, at least one $R^F$ is or comprises an electron-withdrawing group from the LIST EWG 4 as defined herein. In some embodiments, at least one $R^F$ is or comprises an electron-withdrawing group from the LIST Pi-EWG as defined herein.

In some embodiments, Formula IV comprises an electron-withdrawing group from the LIST EWG 1 as defined herein. In some embodiments, Formula IV comprises an electron-withdrawing group from the LIST EWG 2 as defined herein. In some embodiments, Formula IV comprises an electron-withdrawing group from the LIST EWG 3 as defined herein. In some embodiments, Formula IV comprises an electron-withdrawing group from the LIST EWG 4 as defined herein. In some embodiments, Formula IV comprises an electron-withdrawing group from the LIST Pi-EWG as defined herein.

In some embodiments, moiety E and moiety Fare each independently a monocyclic ring comprising one 5-membered and/or 6-membered carbocyclic or heterocyclic ring, or a fused polycyclic ring system comprising at least two fused 5-membered and/or 6-membered carbocyclic or heterocyclic rings.

In some embodiments, moiety E and moiety F are both 6-membered aromatic rings.

In some embodiments, moiety F is a 5-membered or 6-membered heteroaromatic ring.

In some embodiments, L' is O or CR'R".

In some embodiments, $Z^2$ is N and $Z^1$ is C.

In some embodiments, $Z^2$ is C and $Z^1$ is N.

In some embodiments, L' is a direct bond.

In some embodiments, L' is NR.

In some embodiments, $K^1$, $K^2$, $K^3$, and $K^4$ are all direct bonds.

In some embodiments, one of $K^1$, $K^2$, $K^3$, and $K^4$ is O.

In some embodiments, the compound is selected from the group consisting of compounds having the formula of $Pt(L_{A'})(Ly)$:

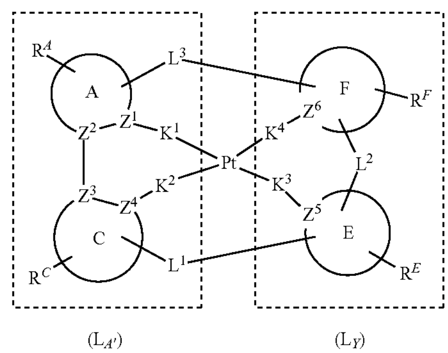

wherein $L_{A'}$ is selected from the group consisting of the structure shown below:

wherein $L_{A'}$ is selected from the group consisting of the structures in the following LIST:

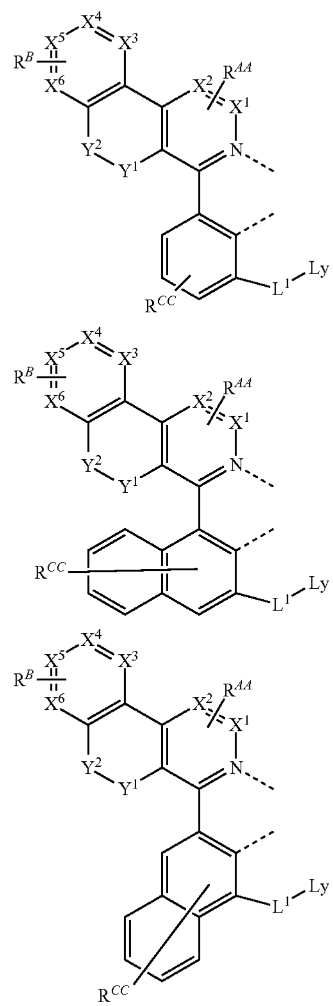

-continued
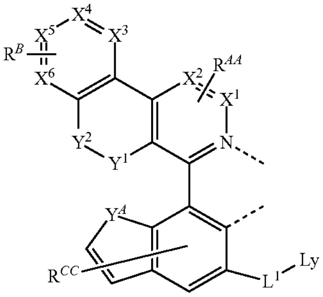
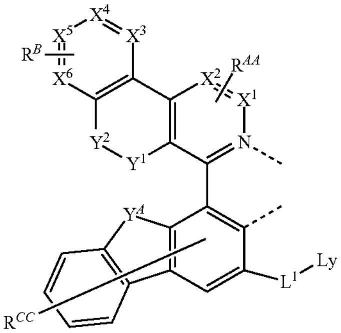
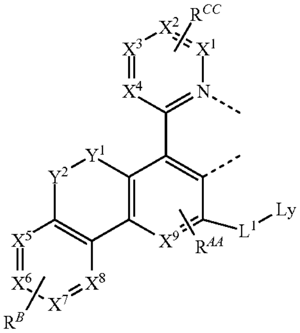
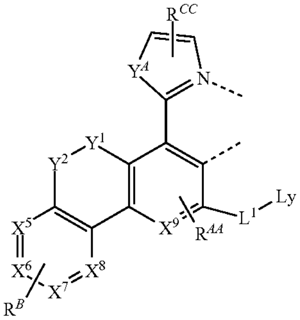
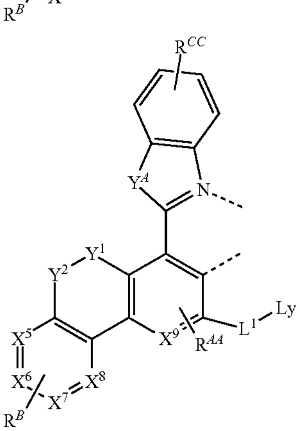
-continued
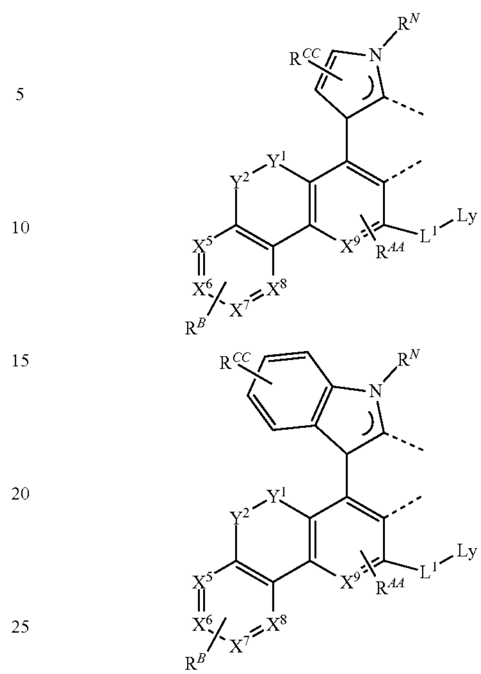
wherein $L_y$, is selected from the group consisting of the structures shown below:
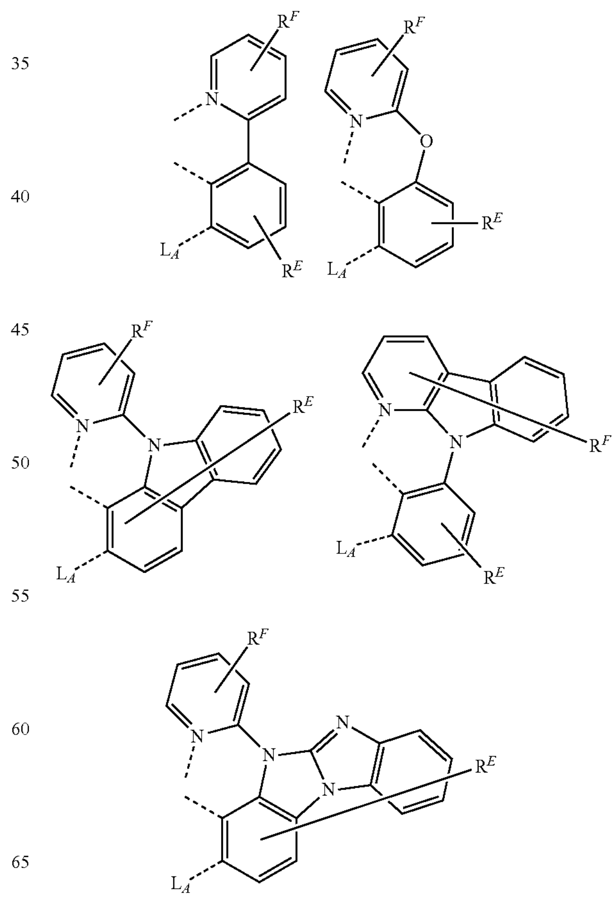

-continued
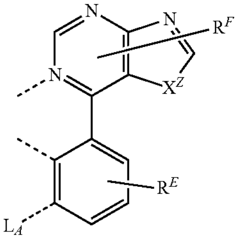
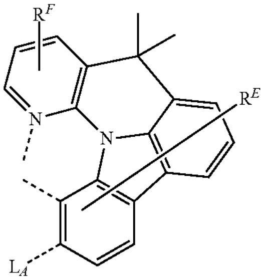
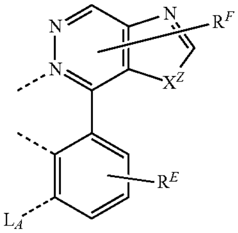
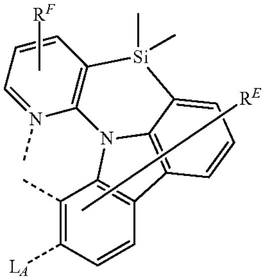
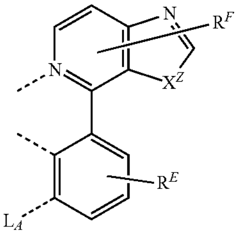
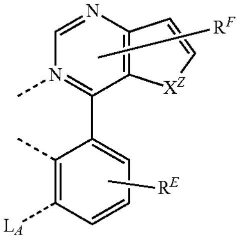
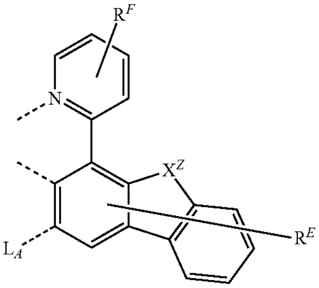
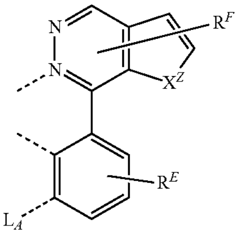
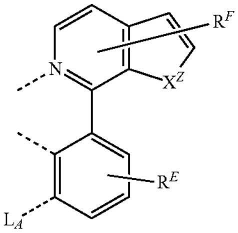
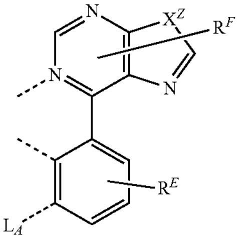
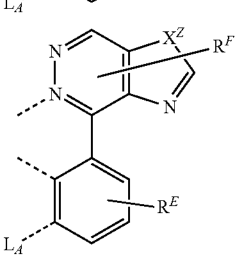
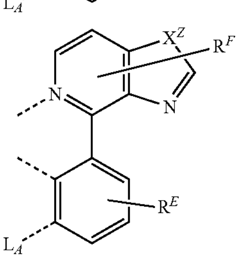
-continued
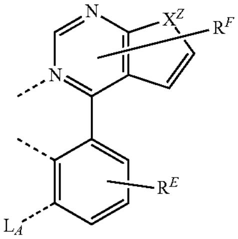
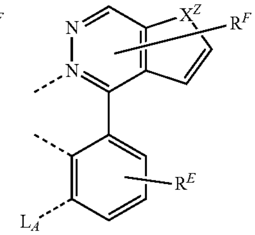
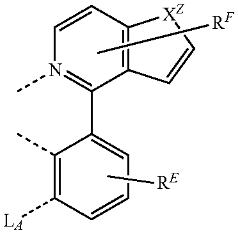
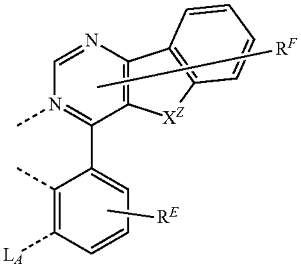
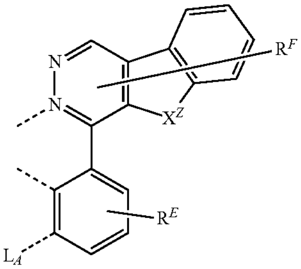
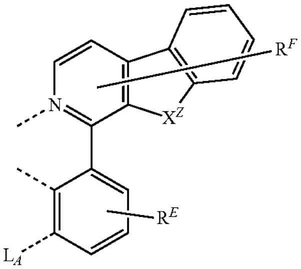
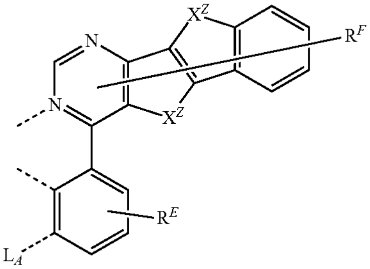
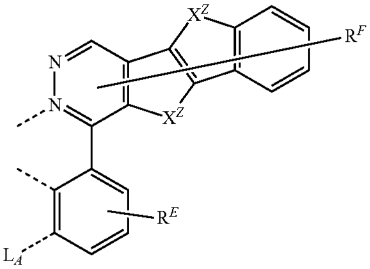

-continued
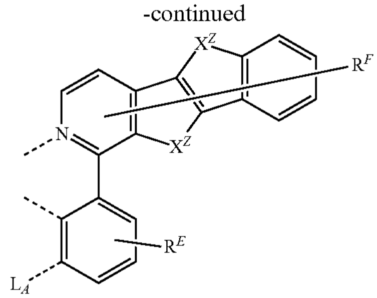
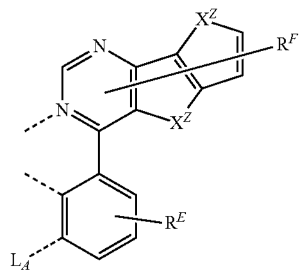
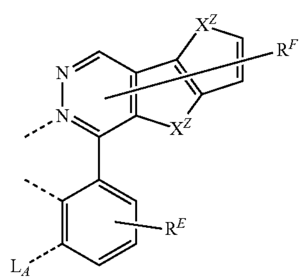
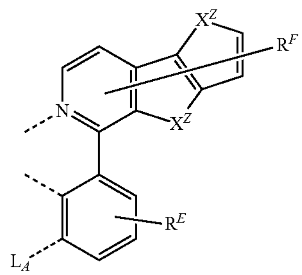
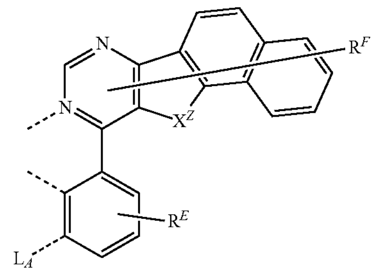
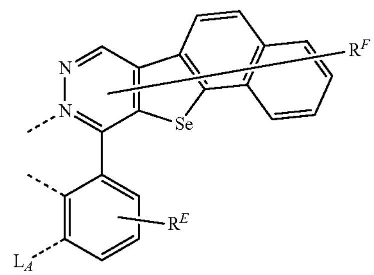
-continued
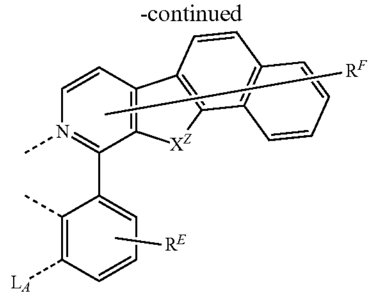
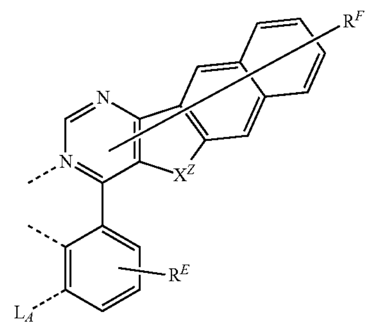
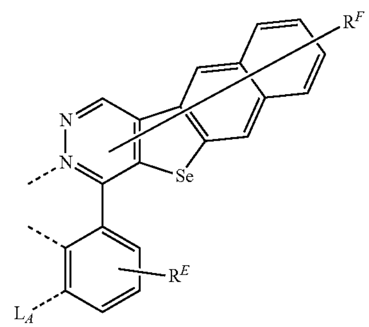
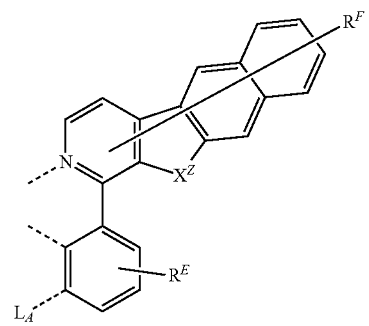
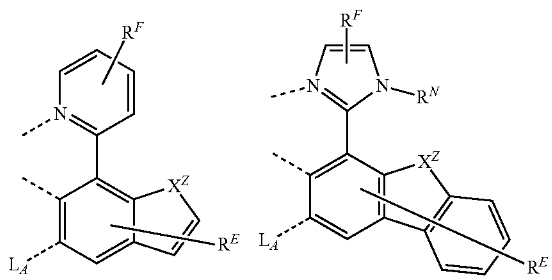

-continued
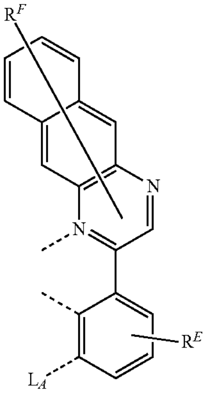
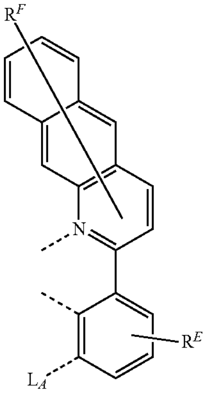
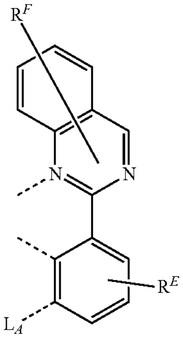
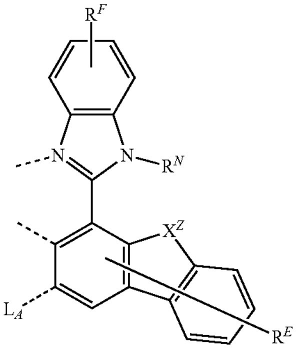
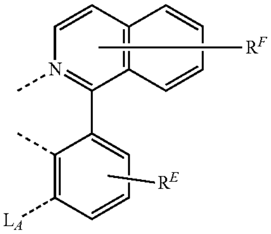
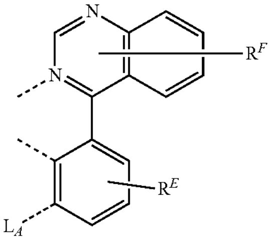
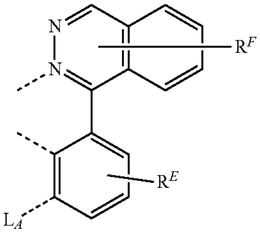
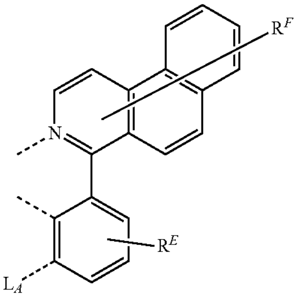
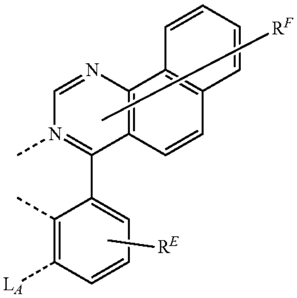
-continued
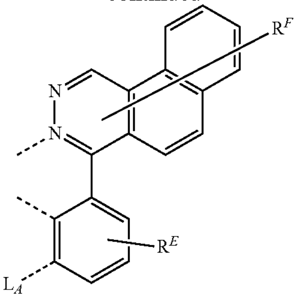
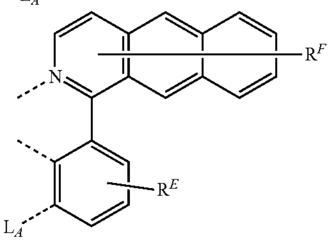
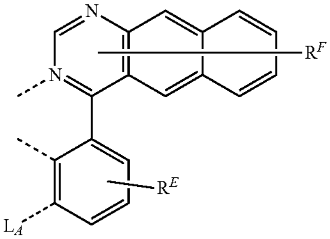
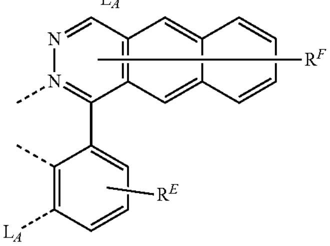
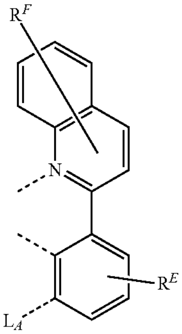
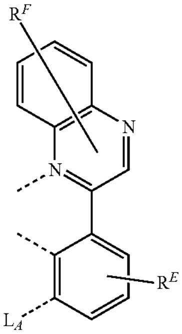
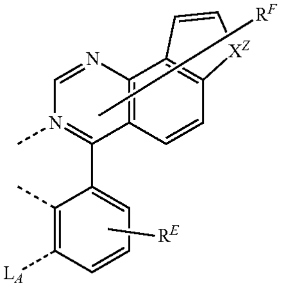
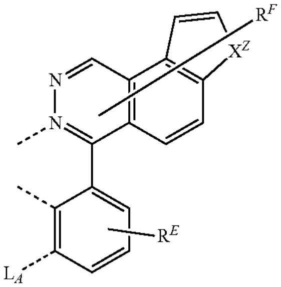
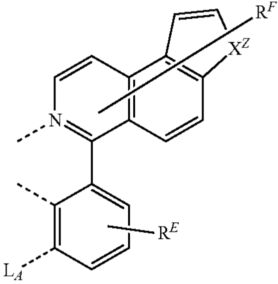

-continued

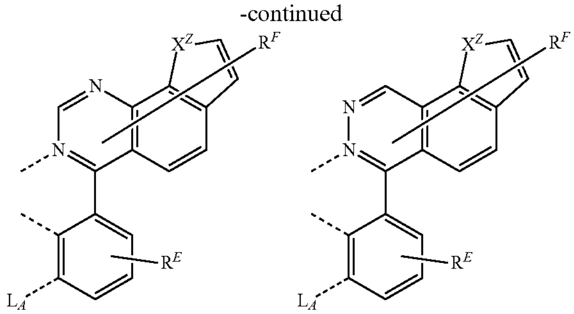

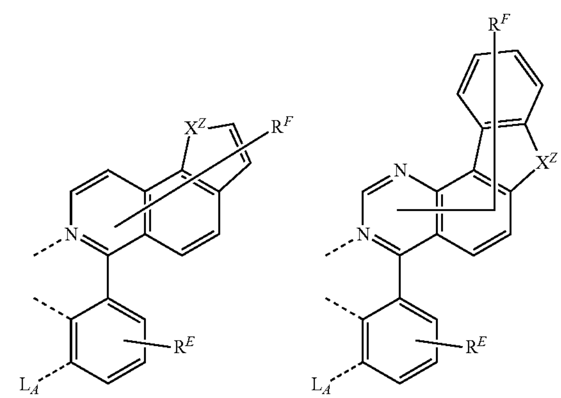

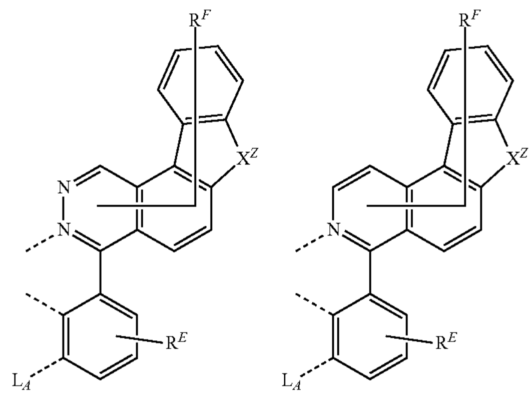

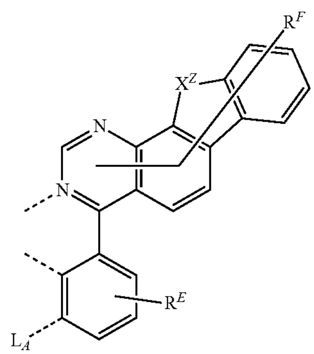

-continued

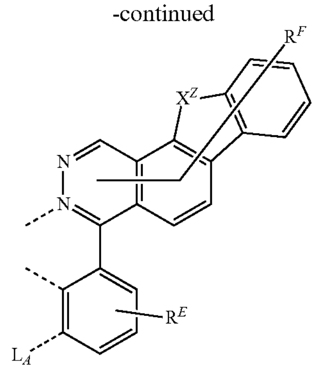

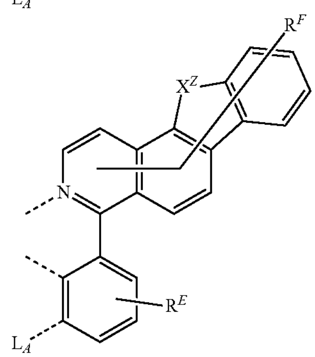

wherein $X^Z$ is $BR_e$, $NR_e$, $PR_e$, O, S, Se, C=O, C=S, C=Se, S=O, $SO_2$, $P(O)R_e$, $C{=}NR_e$, $C{=}CR_eR_f$, $CR_eR_f$, $SiR_eR_f$, or $GeR_eR_f$, $R^N$ is independently a hydrogen or a substituent selected from the group consisting of the general substituents defined herein;

the remaining variables are the same as previously defined; and any two substituents may be optionally joined or fused to form a ring.

In some embodiments, the compound is selected from the group consisting of the compounds having the formula of $Pt(L_{A'})(L_y)$:

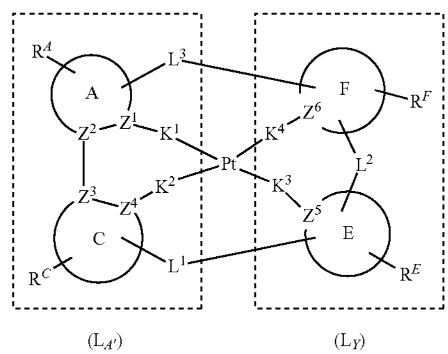

($L_{A'}$) ($L_Y$)

wherein $L_{A'}$ is selected from the group consisting of the structures shown below:

wherein $L_{A'}$ is selected from the group consisting of $L_A(R^E)(R^F)(R^H)(W)(P)$, wherein i is an integer from 1 to 30, E, F, and H are each independently integers from 1 to 89 and each $R^1$ to $R^{89}$ has independently the structure as defined above, W is an integer from 1 to 42, and P is an integer from 1 to 5, wherein $L_{A'1}(R^1)(R^1)(R^1)(W1)(1)$ to $L_{A'24}(R^{89})(R^{89})(R^{89})(W30)(5)$ have the structure defined in the following LIST:

| $L_{A'}$ | Structure of $L_{A'}$ |
| --- | --- |
| $L_{A'1}$-$(R^1)(R^1)(R^1)(W1)(1)$ to $L_{A'1}$-$(R^{89})(R^{89})(R^{89})(W30)(5)$ have the structure | 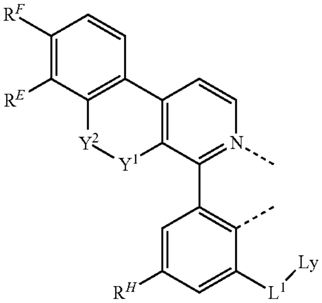 |
| $L_{A'2}$-$(R^1)(R^1)(R^1)(W1)(1)$ to $L_{A'2}$-$(R^{89})(R^{89})(R^{89})(W30)(5)$ have the structure | 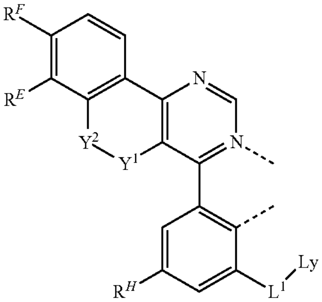 |
| $L_{A'3}$-$(R^1)(R^1)(R^1)(W1)(1)$ to $L_{A'3}$-$(R^{89})(R^{89})(R^{89})(W30)(5)$ have the structure | 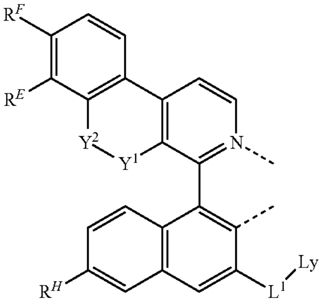 |
| $L_{A'4}$-$(R^1)(R^1)(R^1)(W1)(1)$ to $L_{A'4}$-$(R^{89})(R^{89})(R^{89})(W30)(5)$ have the structure | 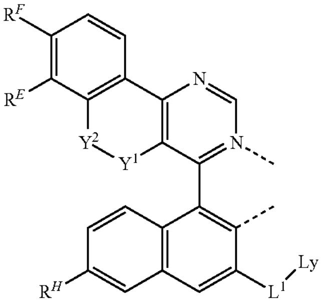 |

-continued

| $L_{A'}$ | Structure of $L_{A'}$ |
| --- | --- |
| $L_{A'5}$-$(R^1)(R^1)(R^1)(W1)(1)$ to $L_{A'5}$-$(R^{89})(R^{89})(R^{89})(W30)(5)$ have the structure | 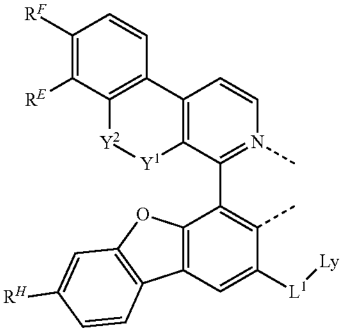 |
| $L_{A'6}$-$(R^1)(R^1)(R^1)(W1)(1)$ to $L_{A'6}$-$(R^{89})(R^{89})(R^{89})(W30)(5)$ have the structure | 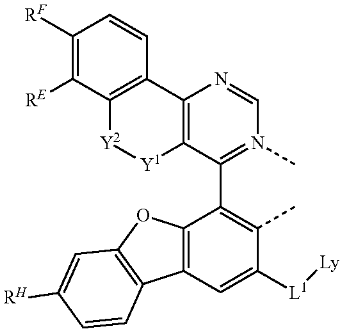 |
| $L_{A'7}$-$(R^1)(R^1)(R^1)(W1)(1)$ to $L_{A'7}$-$(R^{89})(R^{89})(R^{89})(W30)(5)$ have the structure | 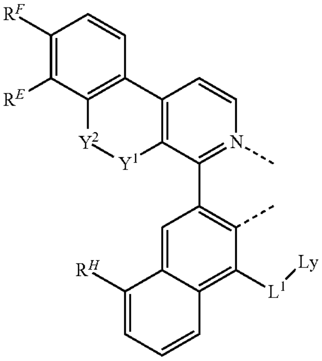 |
| $L_{A'8}$-$(R^1)(R^1)(R^1)(W1)(1)$ to $L_{A'8}$-$(R^{89})(R^{89})(R^{89})(W30)(5)$ have the structure | 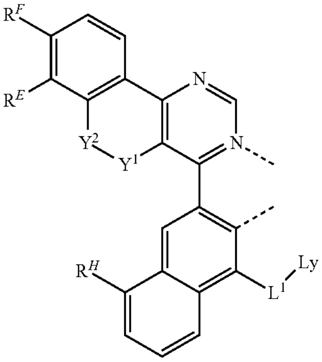 |

-continued

| $L_{A'}$ | Structure of $L_{A'}$ |
|---|---|
| $L_{A'9}$-$(R^1)(R^1)(R^1)(W1)(1)$ to $L_{A'9}$-$(R^{89})(R^{89})(R^{89})(W30)(5)$have the structure | 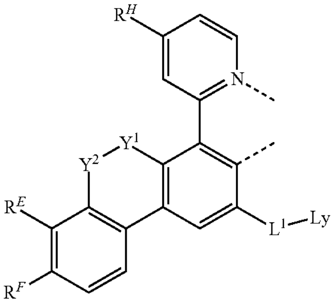 |
| $L_{A'10}$-$(R^1)(R^1)(R^1)(W1)(1)$ to $L_{A'10}$-$(R^{89})(R^{89})(R^{89})(W30)(5)$ have the structure | 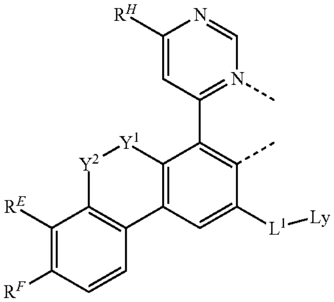 |
| $L_{A'11}$-$(R^1)(R^1)(R^1)(W1)(1)$ to $L_{A'11}$-$(R^{89})(R^{89})(R^{89})(W30)(5)$ have the structure | 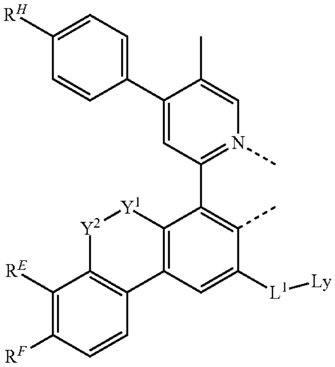 |
| $L_{A'12}$-$(R^1)(R^1)(R^1)(W1)(1)$ to $L_{A'12}$-$(R^{89})(R^{89})(R^{89})(W30)(5)$ have the structure | 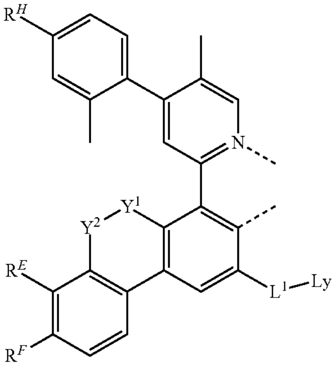 |

-continued

| $L_{A'}$ | Structure of $L_{A'}$ |
|---|---|
| $L_{A'13}$-$(R^1)(R^1)(R^1)(W1)(1)$ to $L_{A'13}$-$(R^{89})(R^{89})(R^{89})(W30)(5)$ have the structure | 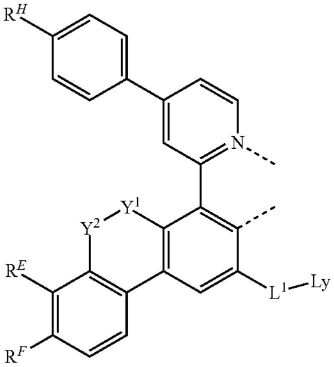 |
| $L_{A'14}$-$(R^1)(R^1)(R^1)(W1)(1)$ to $L_{A'14}$-$(R^{89})(R^{89})(R^{89})(W30)(5)$ have the structure | 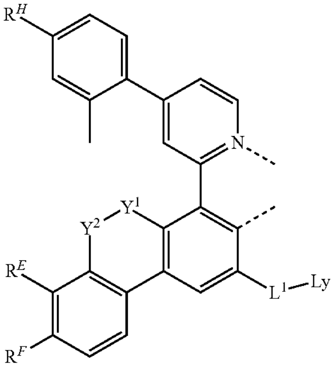 |
| $L_{A'15}$-$(R^1)(R^1)(R^1)(W1)(1)$ to $L_{A'15}$-$(R^{89})(R^{89})(R^{89})(W30)(5)$ have the structure | 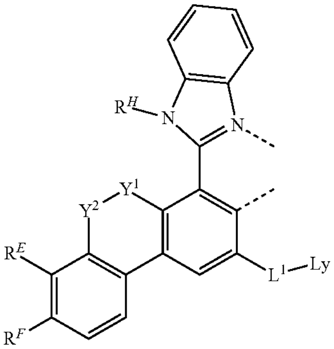 |
| $L_{A'16}$-$(R^1)(R^1)(R^1)(W1)(1)$ to $L_{A'16}$-$(R^{89})(R^{89})(R^{89})(W30)(5)$ have the structure | 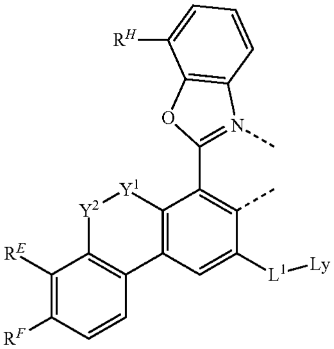 |

-continued

| $L_{A'}$ | Structure of $L_{A'}$ |
|---|---|
| $L_{A'17}$-($R^1$)($R^1$)($R^1$)(W1)(1) to $L_{A'17}$-($R^{89}$)($R^{89}$)($R^{89}$)(W30)(5) have the structure | 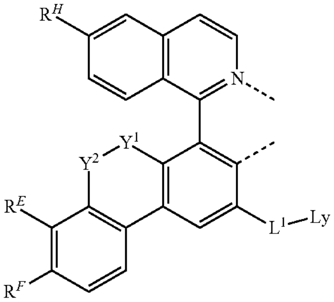 |
| $L_{A'18}$-($R^1$)($R^1$)($R^1$)(W1)(1) to $L_{A'18}$-($R^{89}$)($R^{89}$)($R^{89}$)(W30)(5) have the structure | 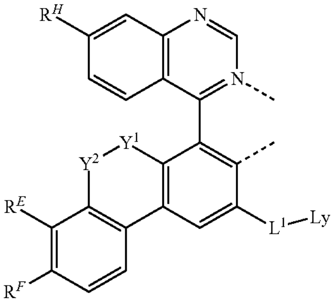 |
| $L_{A'19}$-($R^1$)($R^1$)($R^1$)(W1)(1) to $L_{A'19}$-($R^{89}$)($R^{89}$)($R^{89}$)(W30)(5) have the structure | 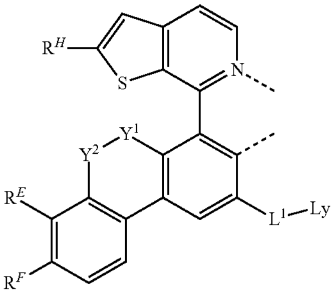 |
| $L_{A'20}$-($R^1$)($R^1$)($R^1$)(W1)(1) to $L_{A'20}$-($R^{89}$)($R^{89}$)($R^{89}$)(W30)(5) have the structure | 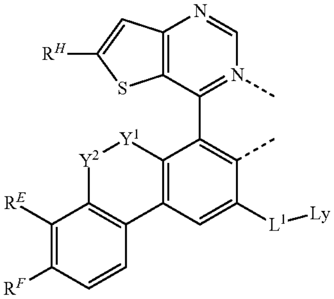 |
| $L_{A'21}$-($R^1$)($R^1$)($R^1$)(W1)(1) to $L_{A'21}$-($R^{89}$)($R^{89}$)($R^{89}$)(W30)(5) have the structure | 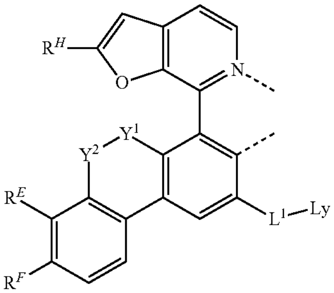 |
| $L_{A'22}$-($R^1$)($R^1$)($R^1$)(W1)(1) to $L_{A'22}$-($R^{89}$)($R^{89}$)($R^{89}$)(W30)(5) have the structure | 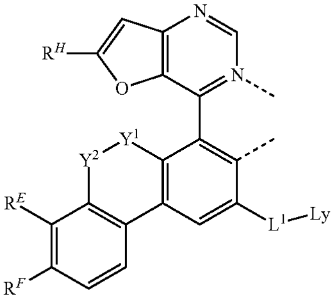 |
| $L_{A'23}$-($R^1$)($R^1$)($R^1$)(W1)(1) to $L_{A'23}$-($R^{89}$)($R^{89}$)($R^{89}$)(W30)(5) have the structure | 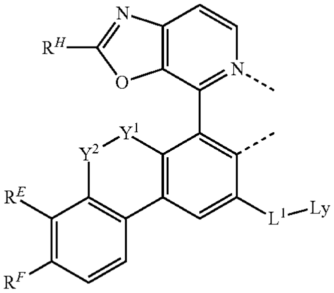 |
| $L_{A'24}$-($R^1$)($R^1$)($R^1$)(W1)(1) to $L_{A'24}$-($R^{89}$)($R^{89}$)($R^{89}$)(W30)(5) have the structure | 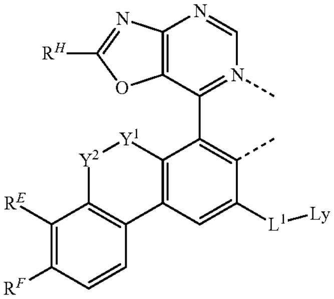 |
| $L_{A'25}$-($R^1$)($R^1$)($R^1$)(W1)(1) to $L_{A'25}$-($R^{89}$)($R^{89}$)($R^{89}$)(W30)(5) have the structure | 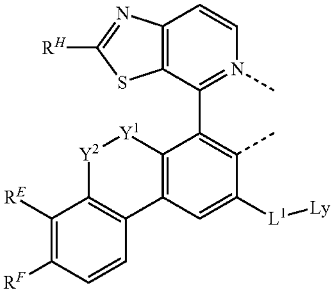 |
| $L_{A'26}$-($R^1$)($R^1$)($R^1$)(W1)(1) to $L_{A'26}$-($R^{89}$)($R^{89}$)($R^{89}$)(W30)(5) have the structure | 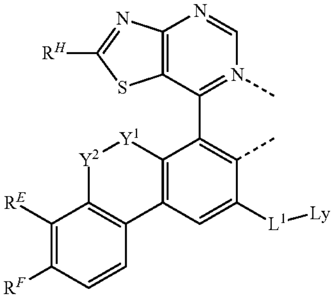 |

-continued

| $L_{A'}$ | Structure of $L_{A'}$ |
|---|---|
| $L_{A'27}$-$(R^1)(R^1)(R^1)(W1)(1)$ to $L_{A'27}$-$(R^{89})(R^{89})(R^{89})(W30)(5)$ have the structure | 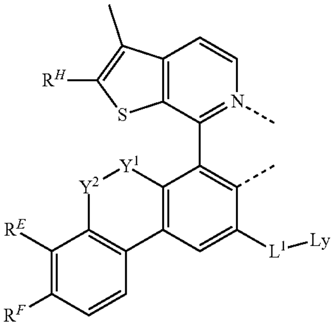 |
| $L_{A'28}$-$(R^1)(R^1)(R^1)(W1)(1)$ to $L_{A'28}$-$(R^{89})(R^{89})(R^{89})(W30)(5)$ have the structure | 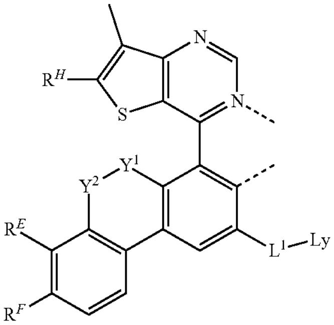 |
| $L_{A'29}$-$(R^1)(R^1)(R^1)(W1)(1)$ to $L_{A'29}$-$(R^{89})(R^{89})(R^{89})(W30)(5)$ have the structure | 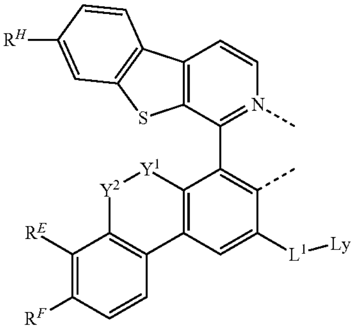 |
| $L_{A'30}$-$(R^1)(R^1)(R^1)(W1)(1)$ to $L_{A'30}$-$(R^{89})(R^{89})(R^{89})(W30)(5)$ have the structure | 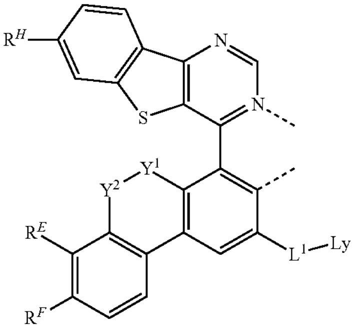 |

wherein, for each P from 1 to 5, $L^1$ has the meaning in the following LIST:

| P = 1 | P = 2 | P = 3 | P = 4 | P = 5 |
|---|---|---|---|---|
| $L^1$ = direct bond | $L^1$ = O | $L^1$ = S | $L^1$ = Se | $L^1 = N(CH_3)$ |

wherein $L_y$ is selected from the group consisting of the structures shown below:

wherein $L_Y$ is selected from the group consisting of $L_{Yw}(R^E)(R^F)$, wherein w is an integer from 1 to 3, and E and F are each independently integers from 1 to 89;

wherein $L_{Y1}(R^1)(R^1)$ to $L_{Y3}(R^{89})(R^{89})$ have the structure defined in the following LIST:

| $L_Y$ | Structure of $L_Y$ |
|---|---|
| for $L_{Y1}(R^E)(R^F)$, $L_{Y1}(R^1)(R^1)$ to $L_{Y1}(R^{89})(R^{89})$ have the structure | 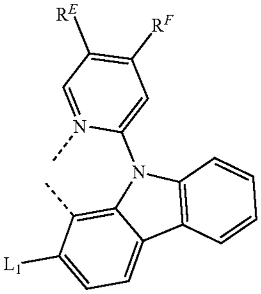 , |
| for $L_{Y2}(R^E)(R^F)$, $L_{Y2}(R^1)(R^1)$ to $L_{Y2}(R^{89})(R^{89})$ have the structure | 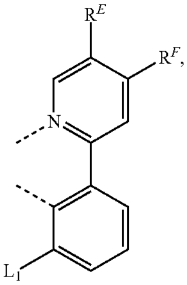 , |
| for $L_{Y3}(R^E)(R^F)$, $L_{Y3}(R^1)(R^1)$ to $L_{Y3}(R^{89})(R^{89})$ have the structure | 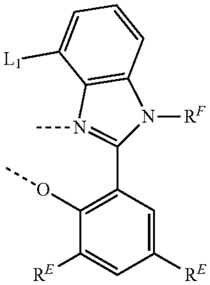 |

wherein $R^1$ to $R^{89}$ have the structures as defined previously.

In some embodiments, the compound is selected from the group consisting of:

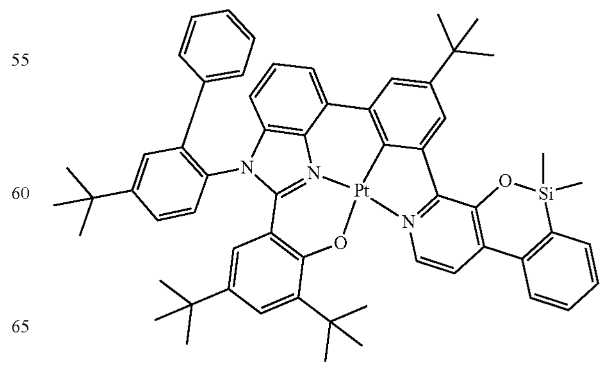
,

-continued
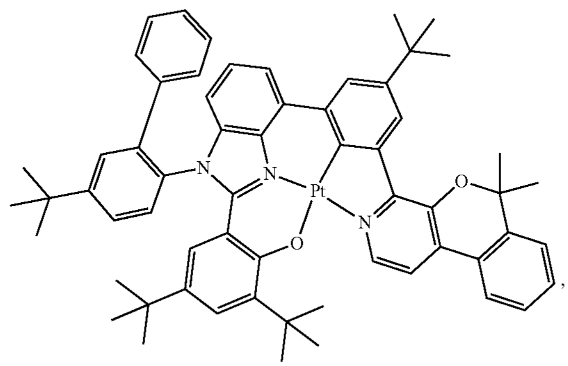
,
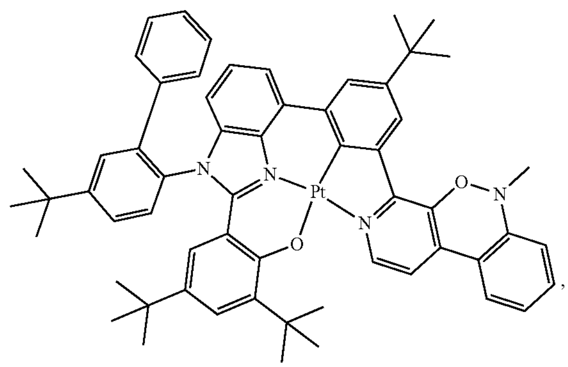
,
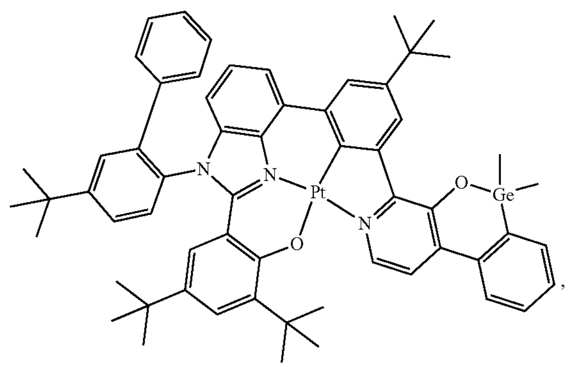
,
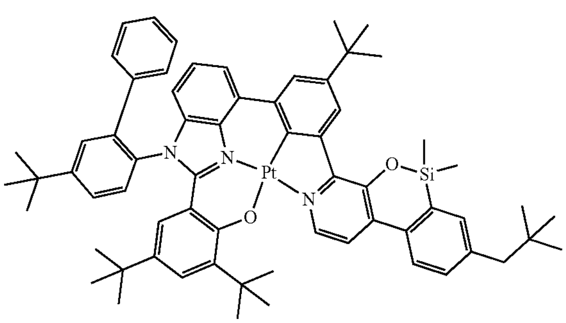
,
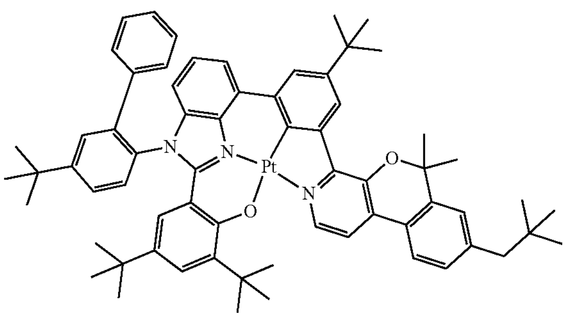
,
-continued
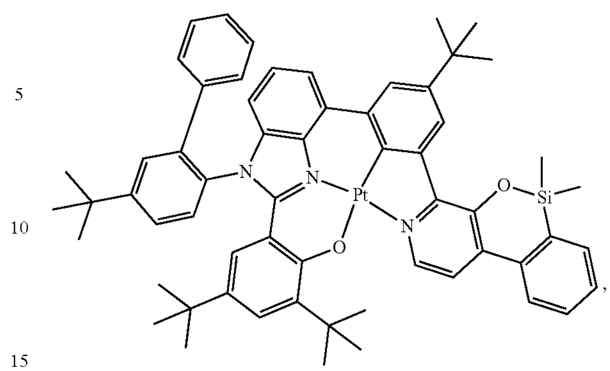
,
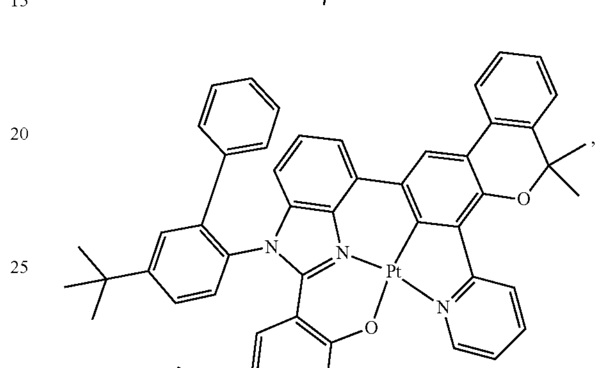
,
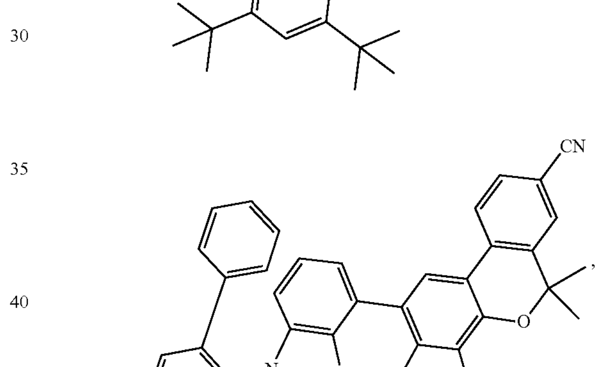
,
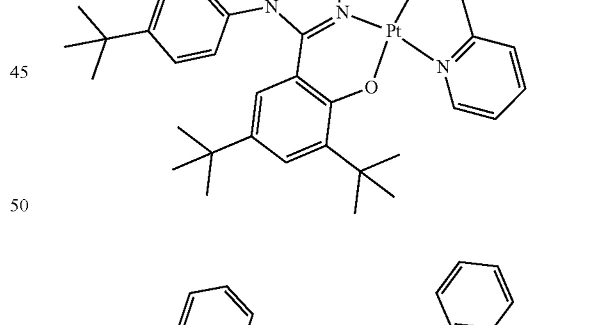
,
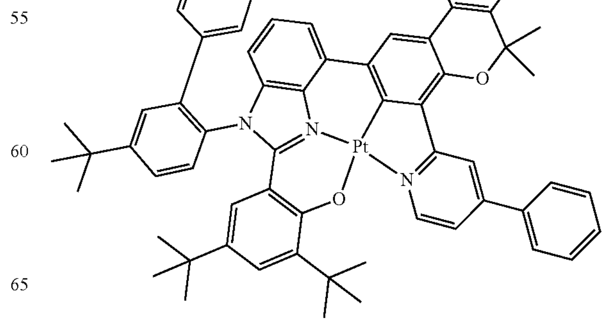
, -continued
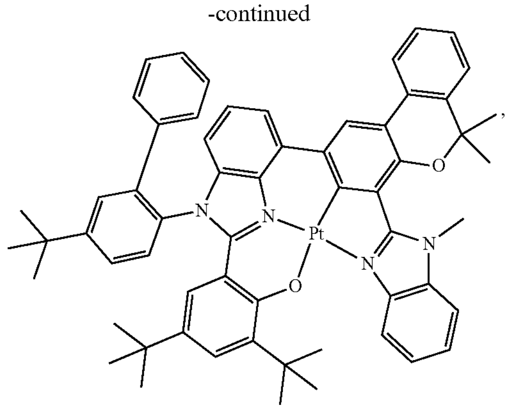
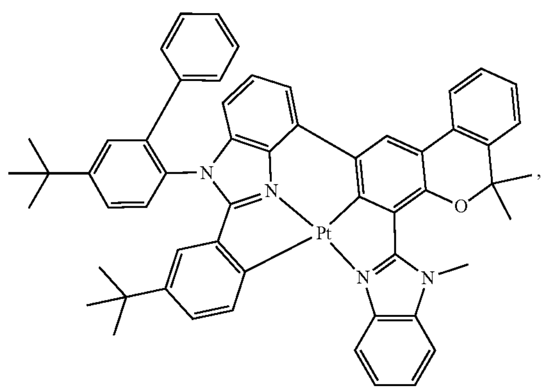
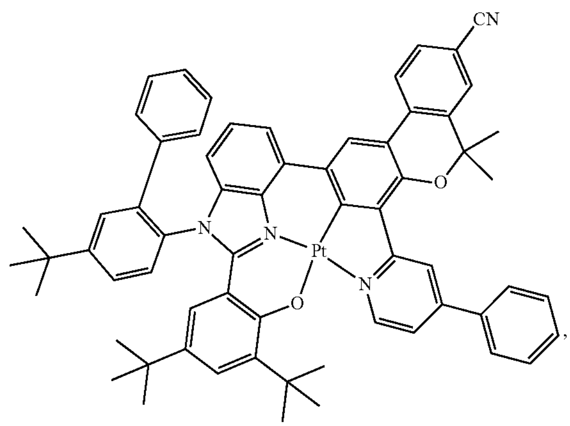
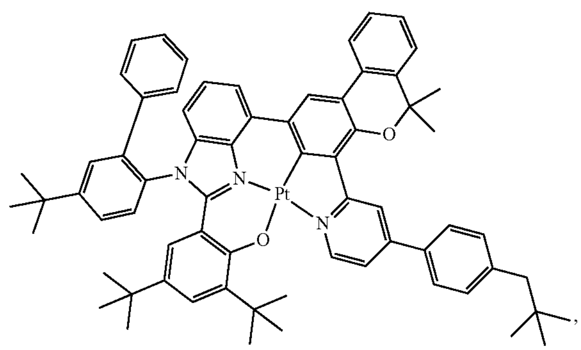
-continued
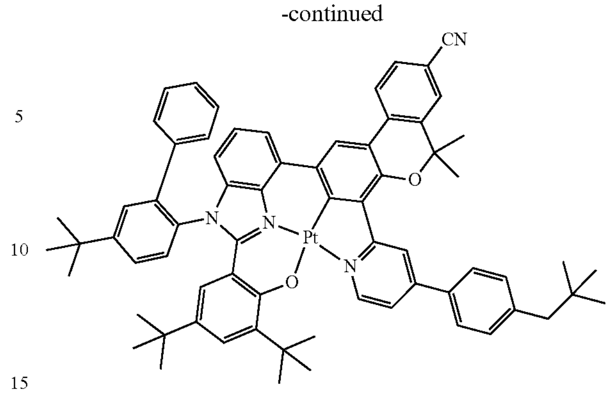
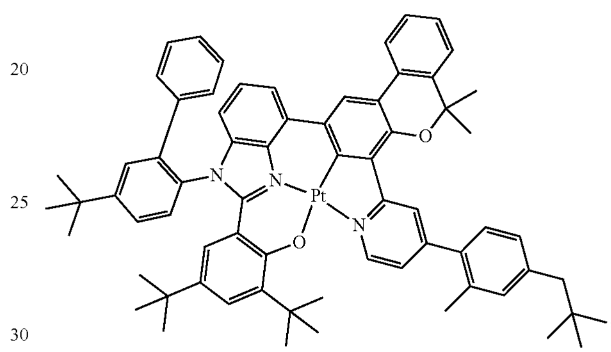
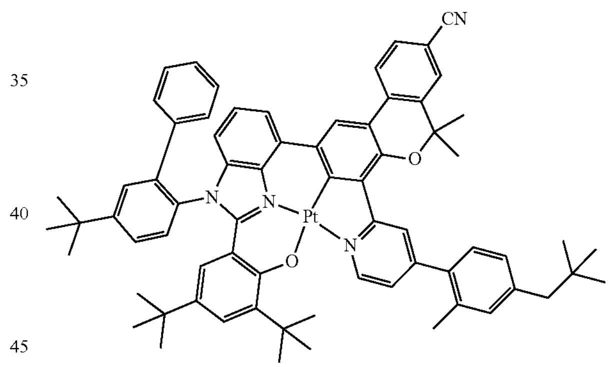
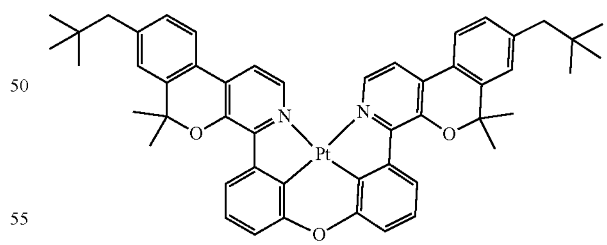
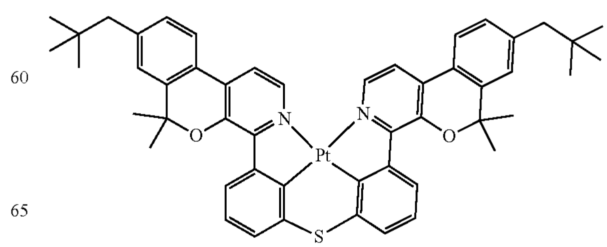

-continued

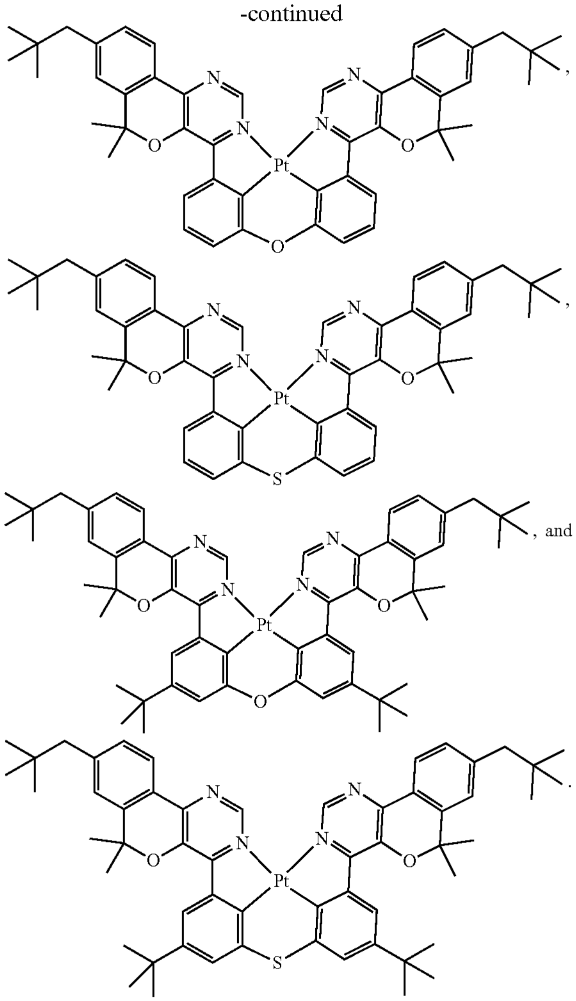

, , , and .

In some embodiments, the compound having a first ligand $L_A$ of Formula I described herein can be at least 30% deuterated, at least 40% deuterated, at least 50% deuterated, at least 60% deuterated, at least 70% deuterated, at least 80% deuterated, at least 90% deuterated, at least 95% deuterated, at least 99% deuterated, or 100% deuterated. As used herein, percent deuteration has its ordinary meaning and includes the percent of all possible hydrogen atoms in the compound (e.g., positions that are hydrogen or deuterium) that are occupied by deuterium atoms. In some embodiments, carbon atoms comprised the ring coordinated to the metal M are fully or partially deuterated. In some embodiments, carbon atoms comprised by a polycyclic ring system coordinated to the metal M are fully or partially deuterated. In some embodiments, a substituent attached to a monocyclic or fused polycyclic ring system coordinated to the metal M is fully or partially deuterated.

In some embodiments, the compound of formula I has an emission at room temperature with a full width at half maximum (FWHM) of equal to or less than 50, 45, 40, 35, 30, 25, 20, 15, 10, or 5 nm. Narrower FWHM means better color purity for the OLED display application.

In some embodiments of heteroleptic compound having the formula of $M(L_A)_p(L_B)_r(L_C)$, as defined above, the ligand $L_A$ has a first substituent $R^I$, where the first substituent R' has a first atom a-I that is the farthest away from the metal M among all atoms in the ligand $L_A$. Additionally, the ligand $L_B$, if present, has a second substituent $R^{II}$, where the second substituent $R^{II}$ has a first atom a-II that is the farthest away from the metal M among all atoms in the ligand $L_B$. Furthermore, the ligand $L_C$, if present, has a third substituent $R^{III}$, where the third substituent $R^{III}$ has a first atom a-III that is the farthest away from the metal M among all atoms in the ligand $L_C$.

In such heteroleptic compounds, vectors $V_{D1}$, $V_{D2}$, and $V_{D3}$ can be defined as follows. $V_{D1}$ represents the direction from the metal M to the first atom a-I and the vector $V_{D1}$ has a value $D^1$ that represents the straight line distance between the metal M and the first atom a-I in the first substituent $R^I$. $V_{D2}$ represents the direction from the metal M to the first atom a-II and the vector $V_{D2}$ has a value $D^2$ that represents the straight line distance between the metal M and the first atom a-II in the second substituent $R^{II}$. $V_{D3}$ represents the direction from the metal M to the first atom a-III and the vector $V_{D3}$ has a value $D^3$ that represents the straight line distance between the metal M and the first atom a-III in the third substituent $R^{III}$.

In such heteroleptic compounds, a sphere having a radius r is defined whose center is the metal M and the radius r is the smallest radius that will allow the sphere to enclose all atoms in the compound that are not part of the substituents $R^I$, $R^{II}$ and $R^{III}$; and where at least one of $D^1$, $D^2$, and $D^3$ is greater than the radius r by at least 1.5 Å. In some embodiments, at least one of $D^1$, $D^2$, and $D^3$ is greater than the radius r by at least 2.9, 3.0, 4.3, 4.4, 5.2, 5.9, 7.3, 8.8, 10.3, 13.1, 17.6, or 19.1 Å. In some embodiments, at least two of $D^1$, $D^2$, and $D^3$ is greater than the radius r by at least 1.5, 2.9, 3.0, 4.3, 4.4, 5.2, 5.9, 7.3, 8.8, 10.3, 13.1, 17.6, or 19.1 Å.

In some embodiments of such heteroleptic compound, the compound has a transition dipole moment axis and angles are defined between the transition dipole moment axis and the vectors $V_{D1}$, $V_{D2}$, and $V_{D3}$, where at least one of the angles between the transition dipole moment axis and the vectors $V_{D1}$, $V_{D2}$, and $V_{D3}$ is less than 40°. In some embodiments, at least one of the angles between the transition dipole moment axis and the vectors $V_{D1}$, $V_{D2}$, and $V_{D3}$ is less than 30°, 20°, 15°, or 10°. In some embodiments, at least two of the angles between the transition dipole moment axis and the vectors $V_{D1}$, $V_{D2}$, and $V_{D3}$ are less than 20°. In some embodiments, at least two of the angles between the transition dipole moment axis and the vectors $V_{D1}$, $V_{D2}$, and $V_{D3}$ are less than 15° or 10°.

In some embodiments, all three angles between the transition dipole moment axis and the vectors $V_{D1}$, $V_{D2}$, and $V_{D3}$ are less than 20°. In some embodiments, all three angles between the transition dipole moment axis and the vectors $V_{D1}$, $V_{D2}$, and $V_{D3}$ are less than 15° or 10°.

In some embodiments of such heteroleptic compounds, the compound has a vertical dipole ratio (VDR) of 0.33 or less. In some embodiments of such heteroleptic compounds, the compound has a VDR of 0.30, 0.25, 0.20, or 0.15 or less.

One of ordinary skill in the art would readily understand the meaning of the terms transition dipole moment axis of a compound and vertical dipole ratio of a compound. Nevertheless, the meaning of these terms can be found in U.S. Pat. No. 10,672,997 whose disclosure is incorporated herein by reference in its entirety. In U.S. Pat. No. 10,672,997, horizontal dipole ratio (HDR) of a compound, rather than VDR, is discussed. However, one skilled in the art readily understands that VDR=1−HDR.

In some embodiments, the compound can be an emissive dopant. In some embodiments, the compound can produce emissions via phosphorescence, fluorescence, thermally activated delayed fluorescence, triplet-triplet annihilation, or combinations of these processes. In some embodiments, the emissive dopant can be a racemic mixture, or can be enriched in one enantiomer. In some embodiments, the present compounds can have different stereoisomers, such as fac and mer. The current compound relates both to individual isomers and to mixtures of various isomers in any mixing ratio. In some embodiments, the compound can be homoleptic (each ligand is the same). In some embodiments, the compound can be heteroleptic (at least one ligand is different from others). When there are more than one ligand coordinated to a metal, the ligands can all be the same in some embodiments. In some other embodiments, at least one ligand is different from the other ligands. In some embodiments, every ligand can be different from every other ligand. This is also true in embodiments where a ligand being coordinated to a metal can be linked with other ligands being coordinated to that metal to form a tridentate, tetradentate, pentadentate, or hexadentate ligands. Thus, where the coordinating ligands are being linked together, all of the ligands can be the same in some embodiments, and at least one of the ligands being linked can be different from the other ligand(s) in some other embodiments.

In yet another aspect of the present disclosure, a formulation that comprises the novel compound disclosed herein is described. The formulation can include one or more components selected from the group consisting of a solvent, an emitter, a host, a hole injection material, hole transport material, electron blocking material, hole blocking material, and an electron transport material, disclosed herein.

The present disclosure encompasses any chemical structure comprising the novel compound of the present disclosure, or a monovalent or polyvalent variant thereof. In other words, the inventive compound, or a monovalent or polyvalent variant thereof, can be a part of a larger chemical structure. Such chemical structure can be selected from the group consisting of a monomer, a polymer, a macromolecule, and a supramolecule (also known as supermolecule). As used herein, a "monovalent variant of a compound" refers to a moiety that is identical to the compound except that one hydrogen has been removed and replaced with a bond to the rest of the chemical structure. As used herein, a "polyvalent variant of a compound" refers to a moiety that is identical to the compound except that more than one hydrogen has been removed and replaced with a bond or bonds to the rest of the chemical structure. In the instance of a supramolecule, the inventive compound can also be incorporated into the supramolecule complex without covalent bonds. As used in this context, the description that a structure A comprises a moiety B means that the structure A includes the structure of moiety B not including the H or D atoms that can be attached to the moiety B. This is because at least one H or D on a given moiety structure has to be replaced to become a substituent so that the moiety B can be part of the structure A, and one or more of the H or D on a given moiety B structure can be further substituted once it becomes a part of structure A.

C. The OLEDs and the Devices of the Present Disclosure

In another aspect, the present disclosure also provides an OLED device comprising a first organic layer that contains a compound as disclosed in the above compounds section of the present disclosure.

In some embodiments, the OLED comprises: an anode; a cathode; and an organic layer disposed between the anode and the cathode, where the organic layer comprises a compound comprising a first ligand $L_A$ which comprises a structure of Formula I as defined herein.

In some embodiments, the organic layer is selected from the group consisting of HIL, HTL, EBL, EML, HBL, ETL, and EIL. In some embodiments, the organic layer may be an emissive layer and the compound as described herein may be an emissive dopant or a non-emissive dopant.

In some embodiments, the organic layer may further comprise a host, wherein host comprises at least one chemical group selected from the group consisting of triphenylene, carbazole, indolocarbazole, dibenzothiophene, dibenzofuran, dibenzoselenophene, 512-benzo[d]benzo[4,5]imidazo[3,2-a]imidazole, 5,9-dioxa-13b-boranaphtho[3,2,1-de]anthracene, azaborinine, oxaborinine, dihydroacridine, xanthene, dihydrobenzoazasiline, dibenzooxasiline, phenoxazine, phenoxathiine, phenothiazine, dihydrophenazine, fluorene, naphthalene, anthracene, phenanthrene, phenanthroline, benzoquinoline, quinoline, isoquinoline, quinazoline, pyrimidine, pyrazine, pyridine, triazine, boryl, silyl, aza-triphenylene, aza-carbazole, aza-indolocarbazole, aza-dibenzothiophene, aza-dibenzofuran, aza-dibenzoselenophene, aza-512-benzo[d]benzo[4,5]imidazo[3,2-a]imidazole, and aza-(5,9-dioxa-13b-boranaphtho[3,2,1-de]anthracene).

In some embodiments, the host can be selected from the group consisting of the structures of the following HOST Group 1:

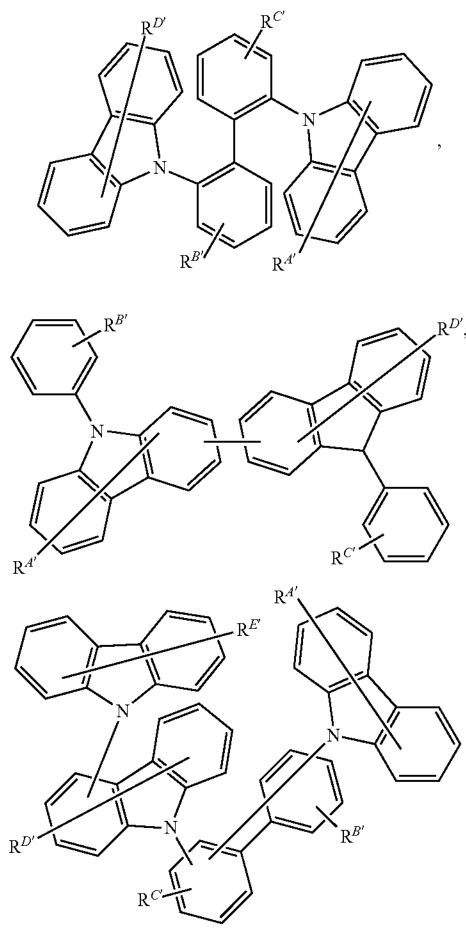

-continued
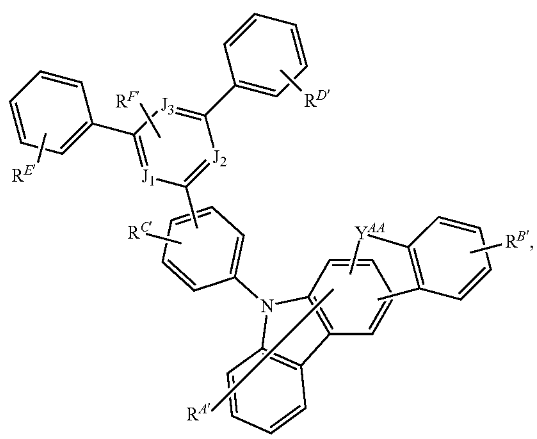
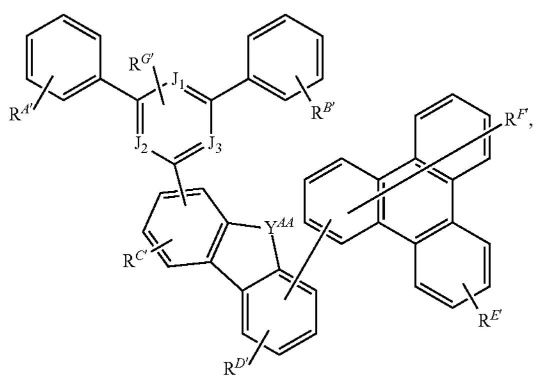
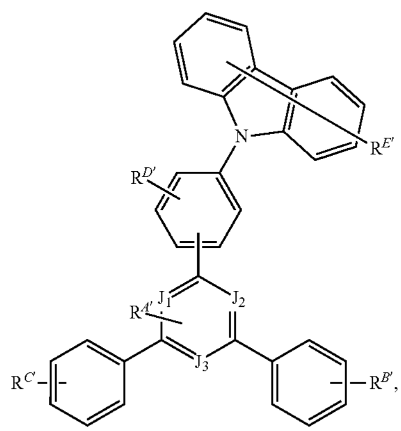
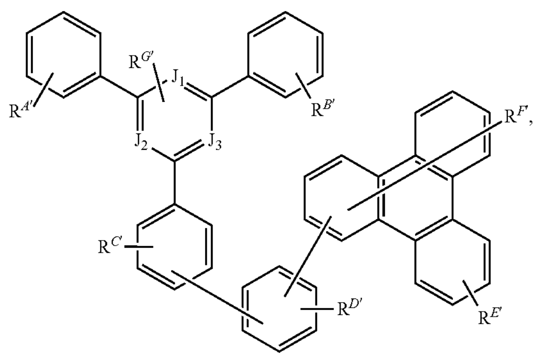
-continued
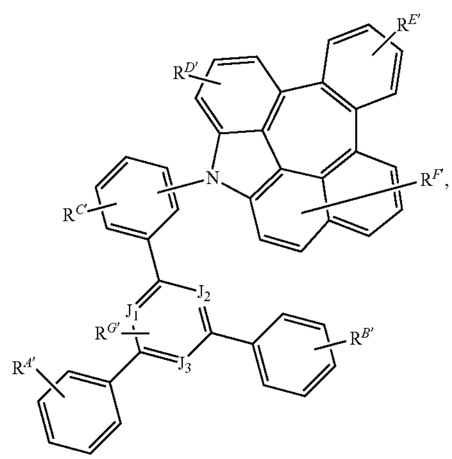
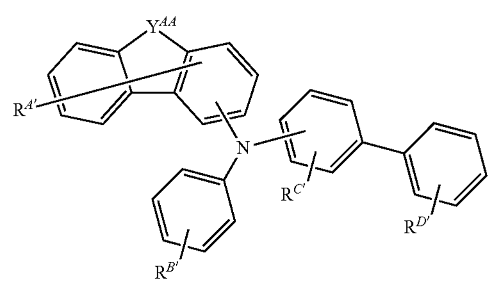
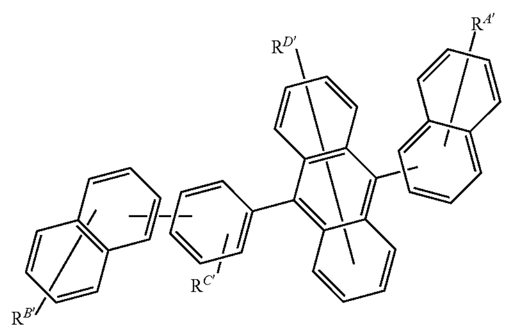
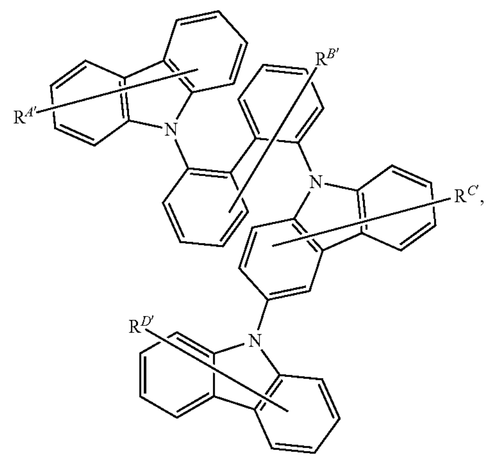

-continued
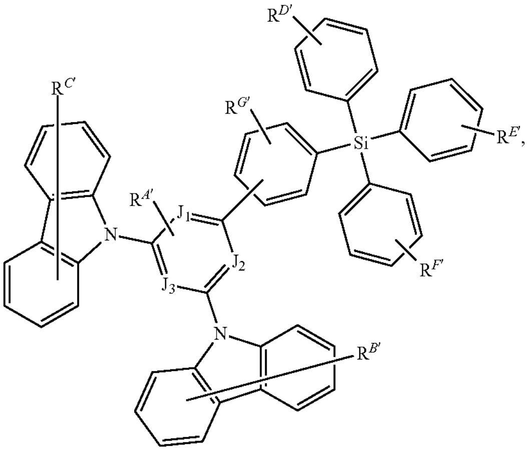
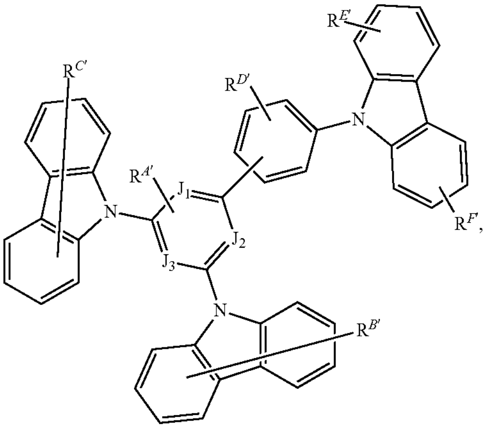
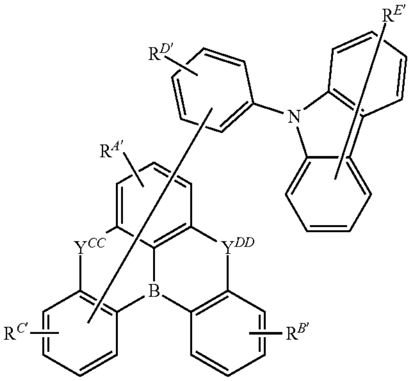
,
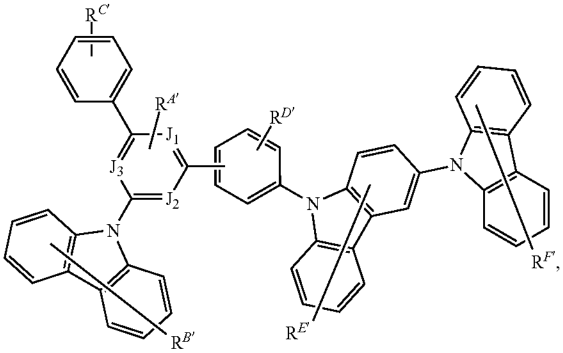
-continued
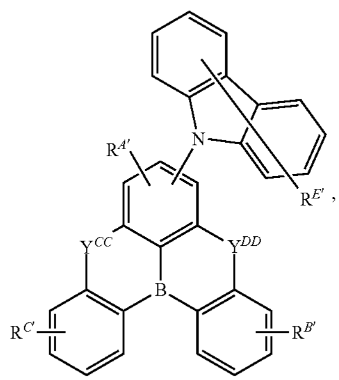
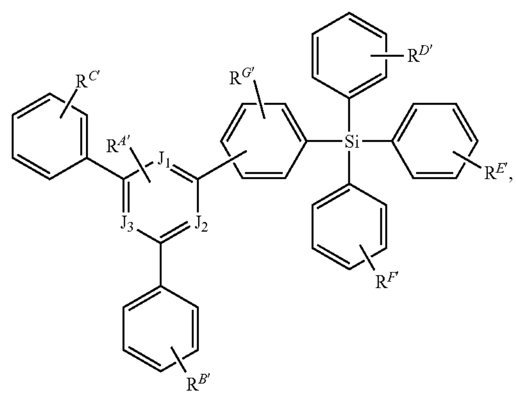
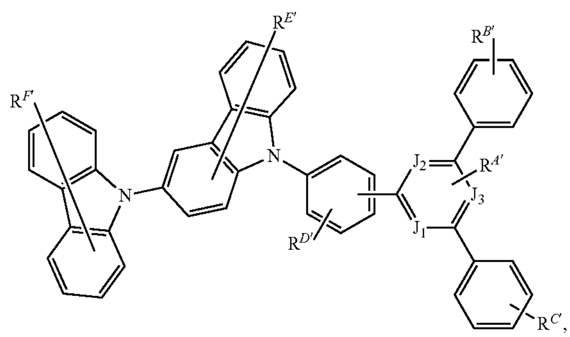
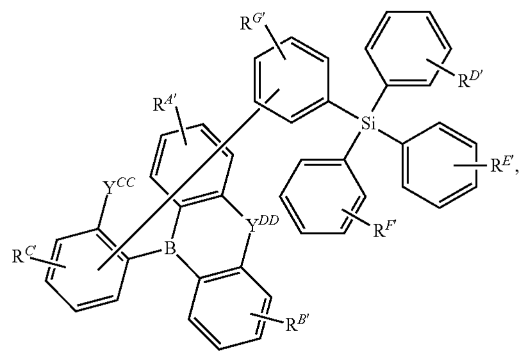

-continued
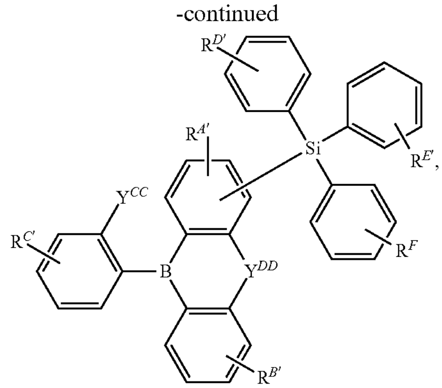
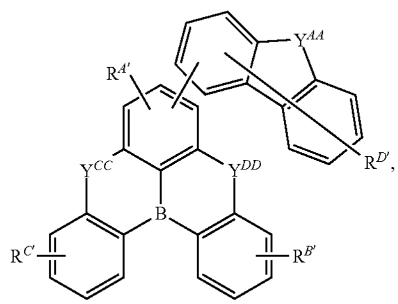
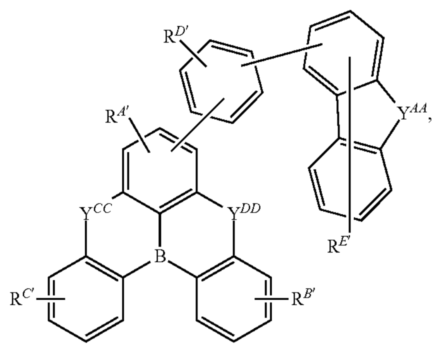
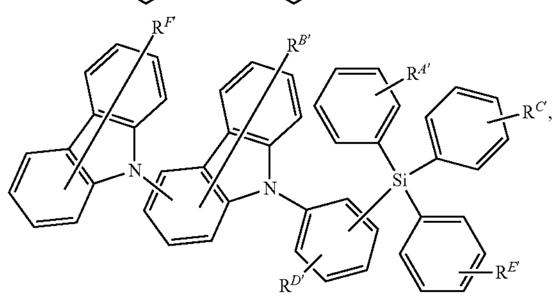
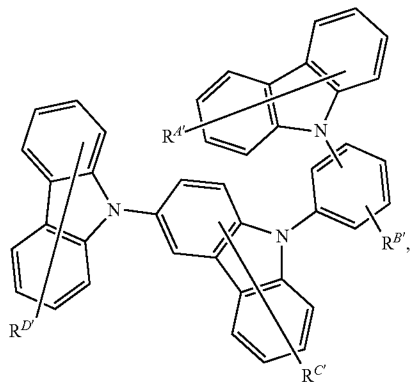
-continued
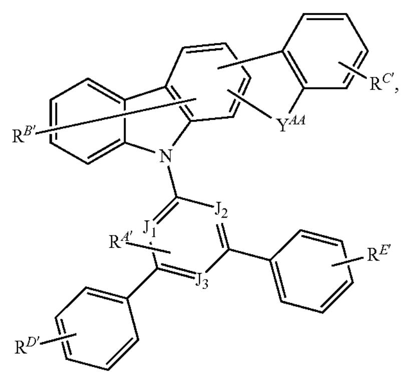
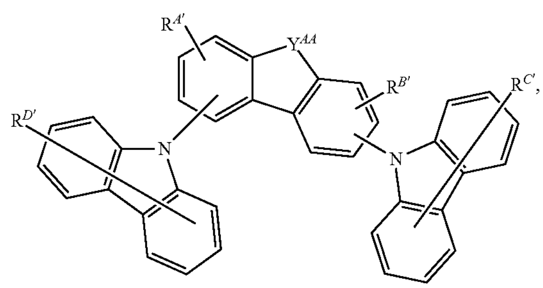
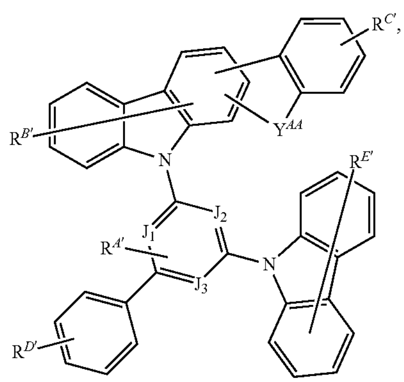
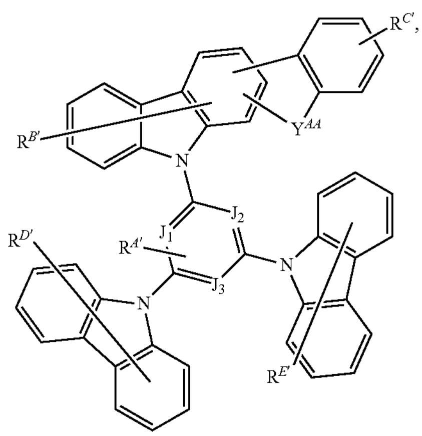

-continued
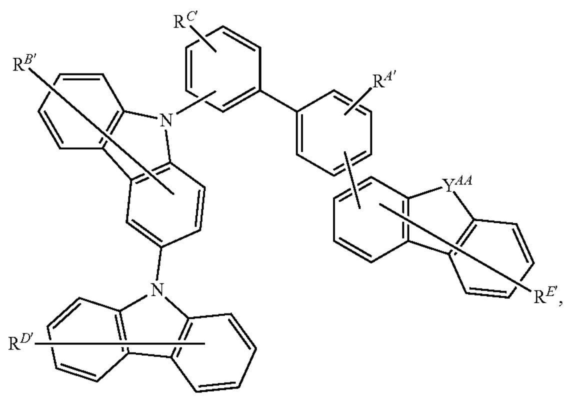
,
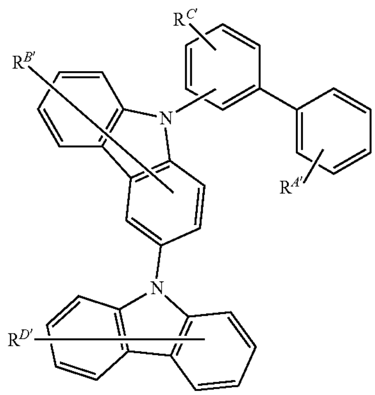
,
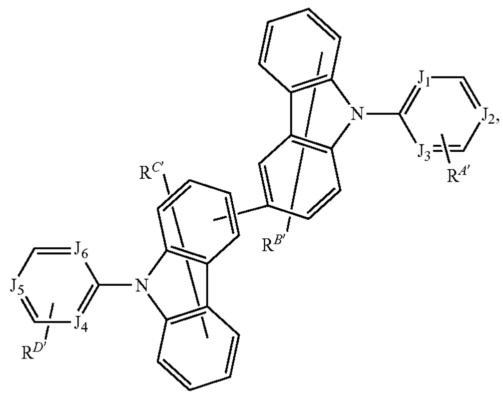
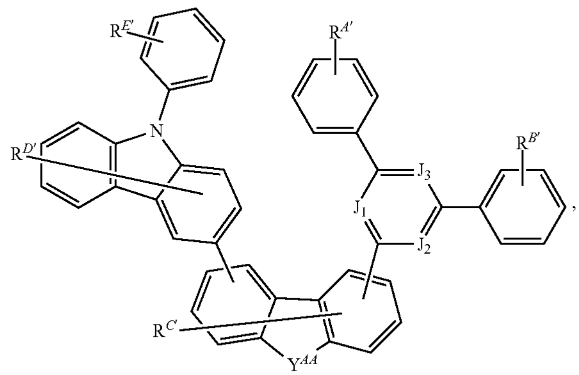
,
-continued
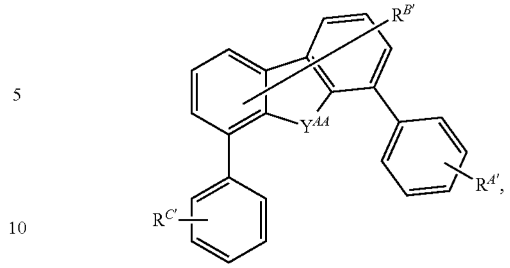
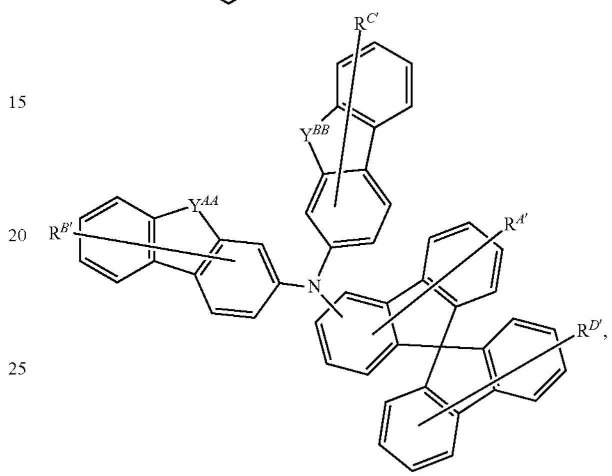
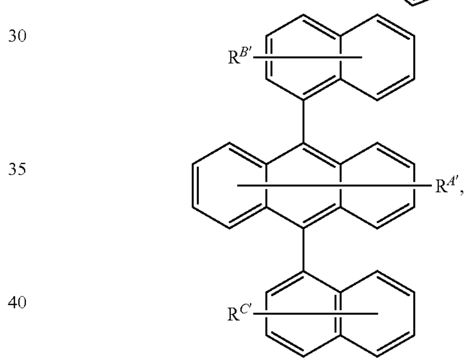
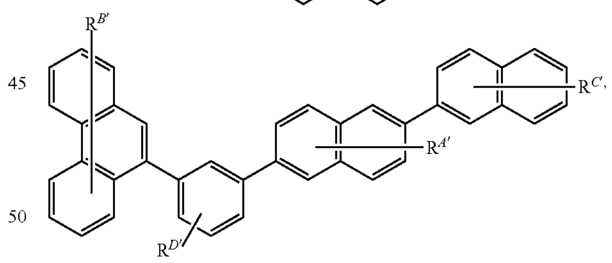
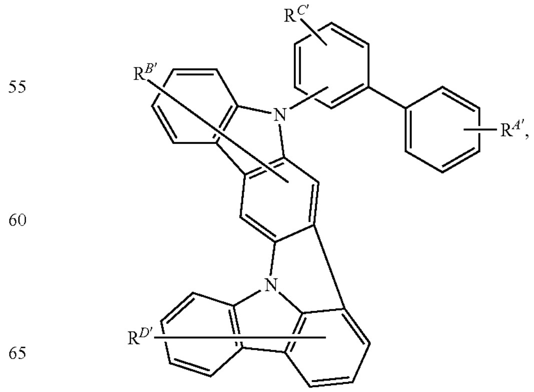

-continued
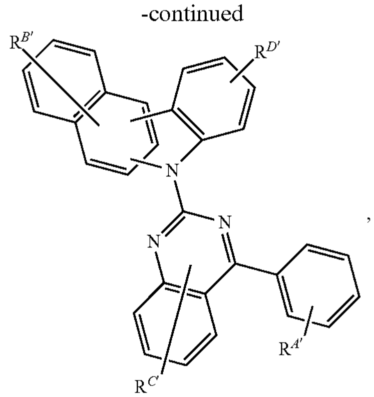
,
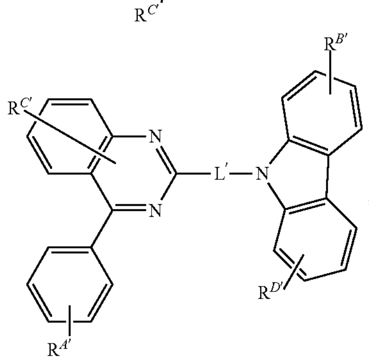
,
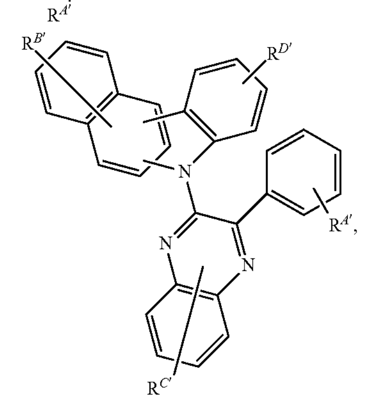
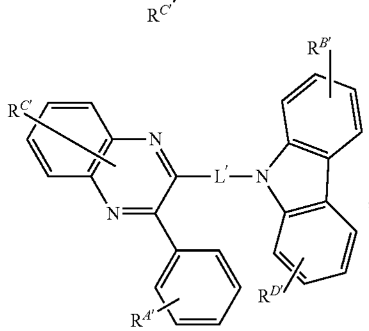
,
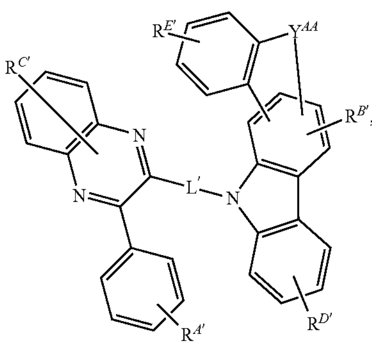
-continued
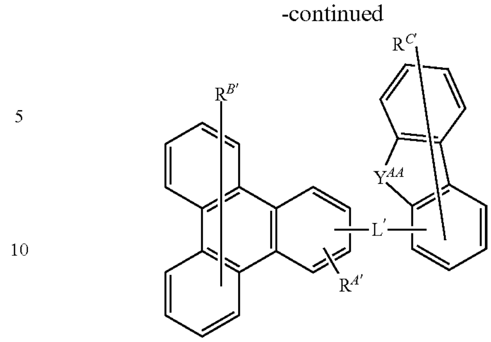
,
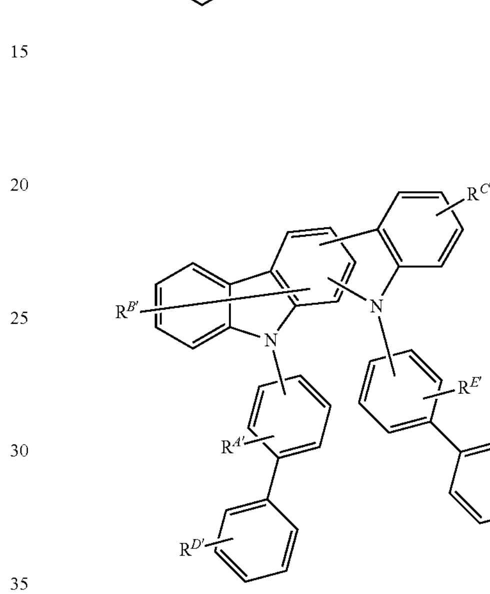
,
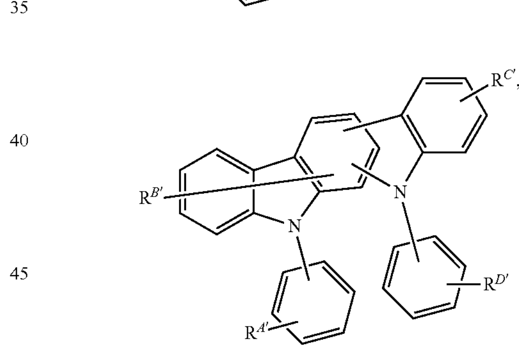
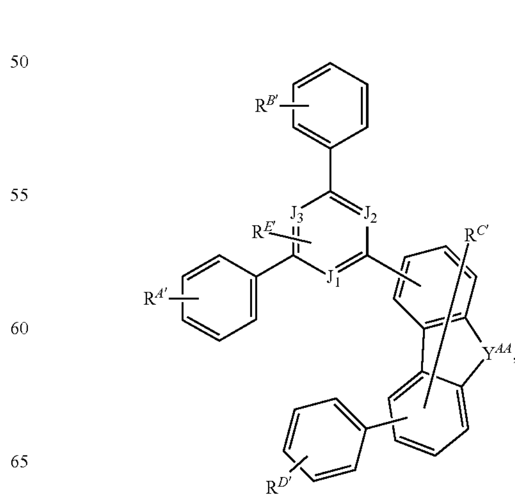

-continued
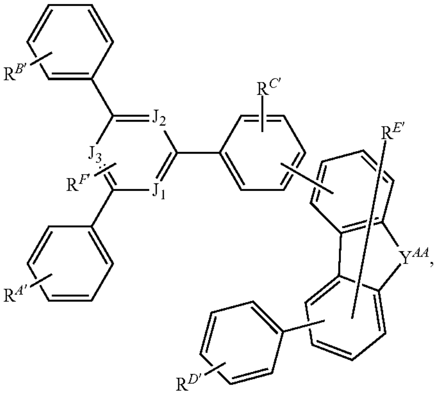
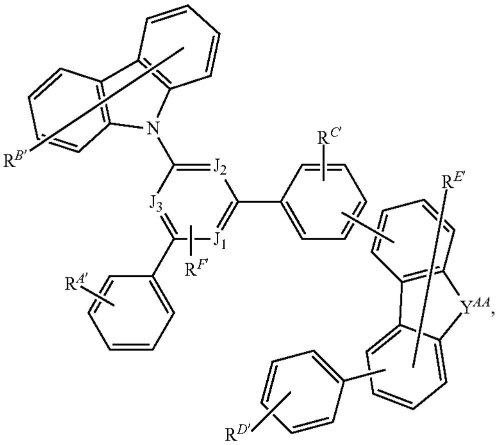
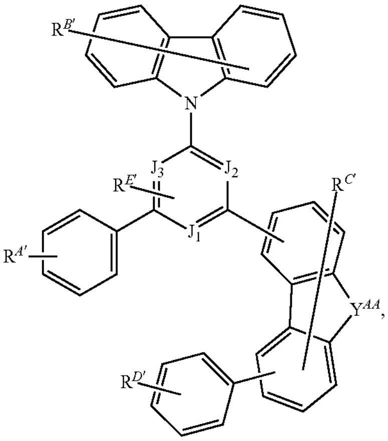
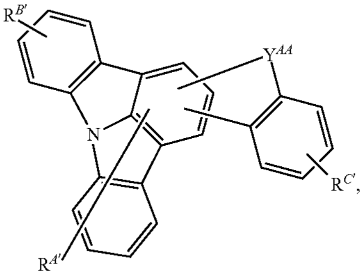
-continued
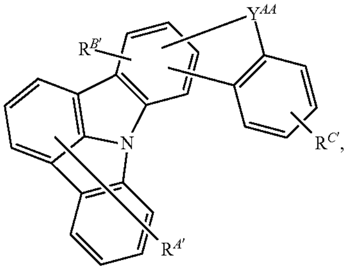
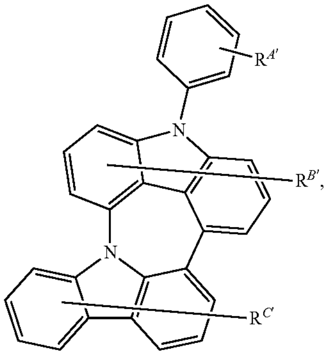
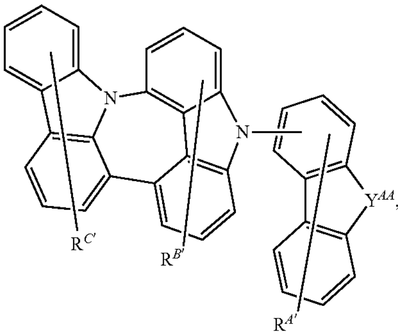
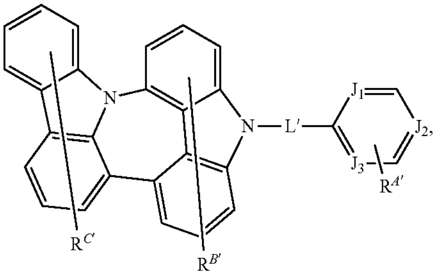
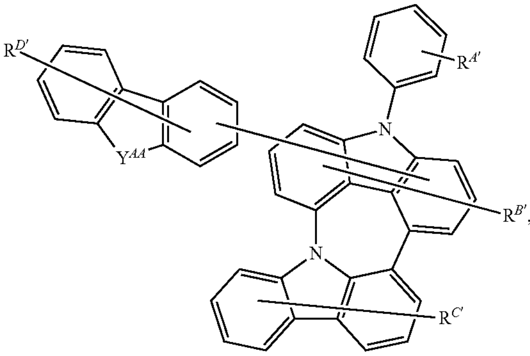

-continued
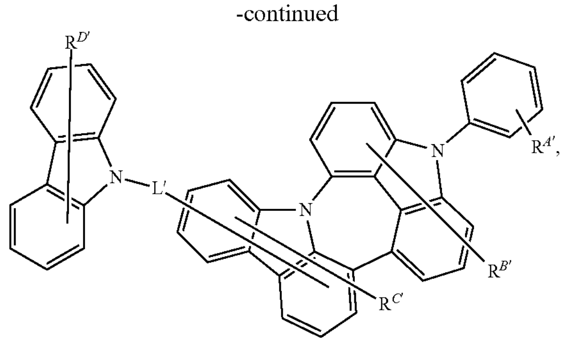
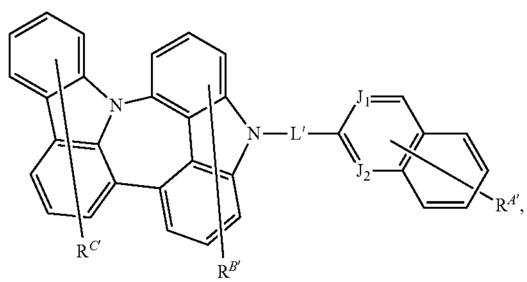
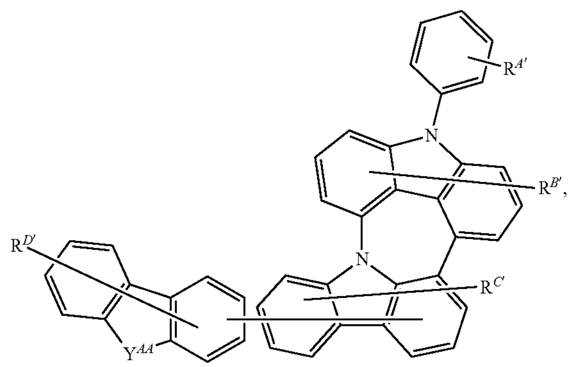
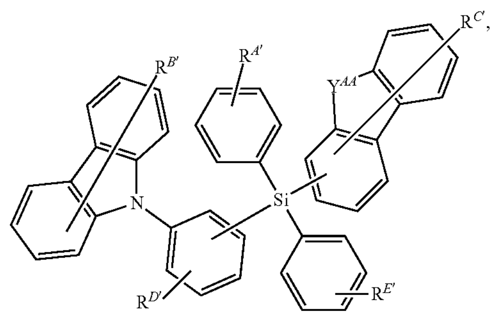
-continued
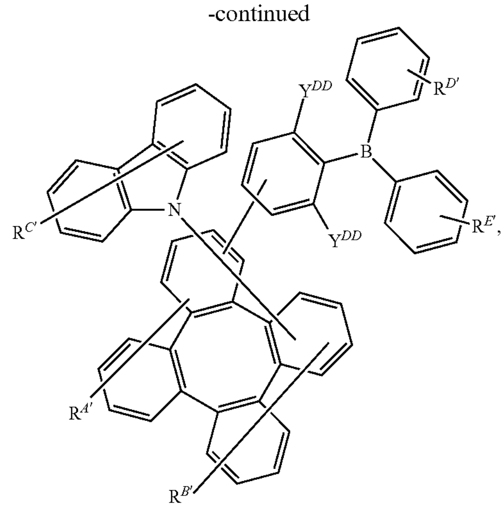
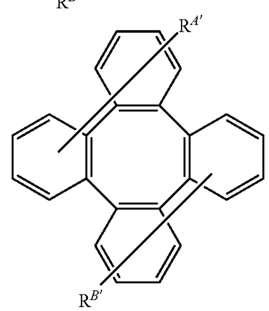
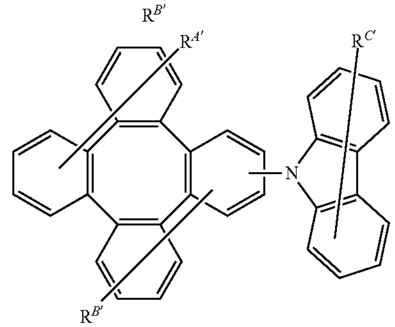
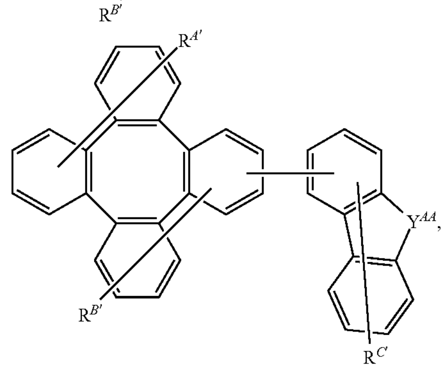
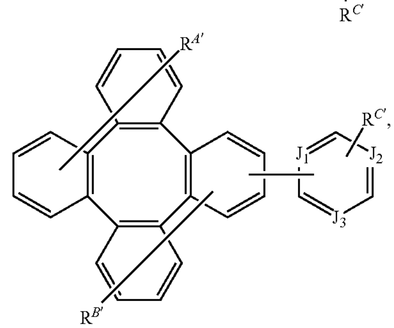

-continued

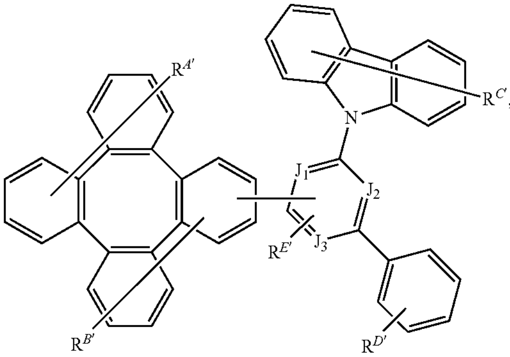

,

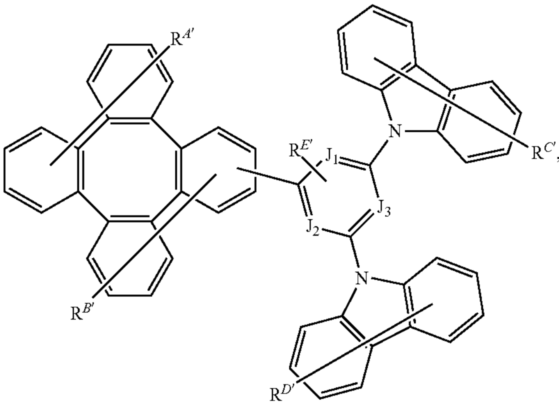

,

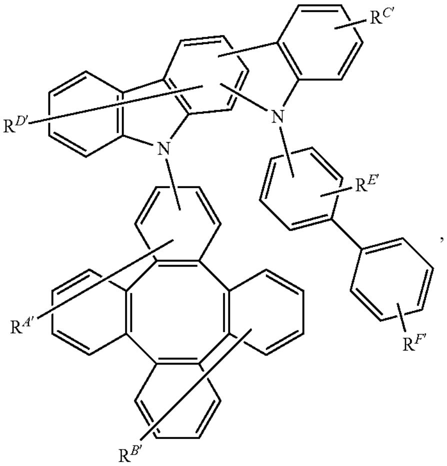

,

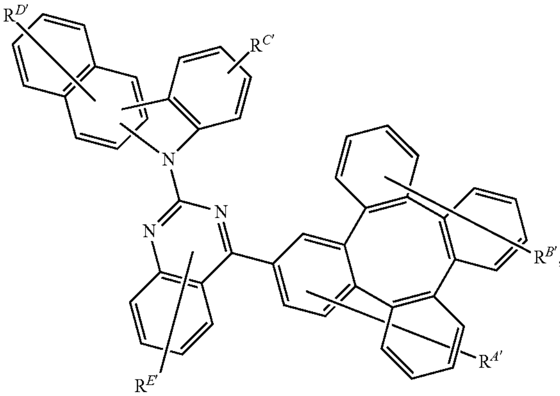

,

-continued

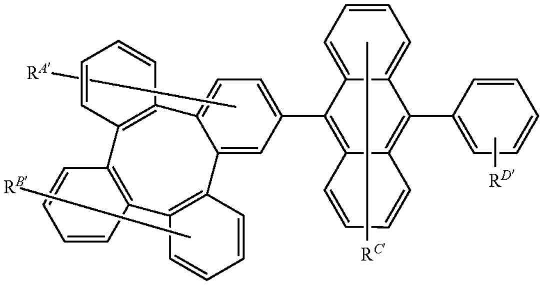

,

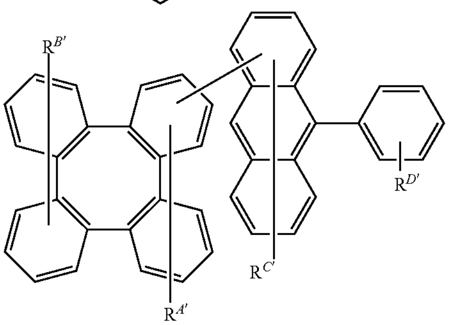

,

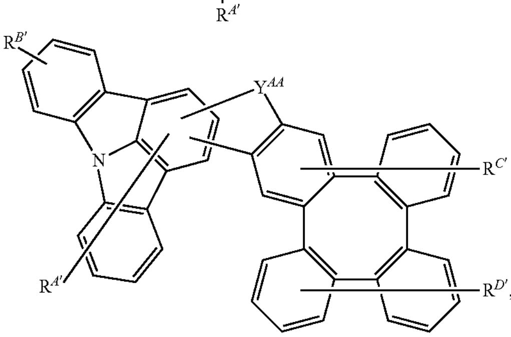

, and

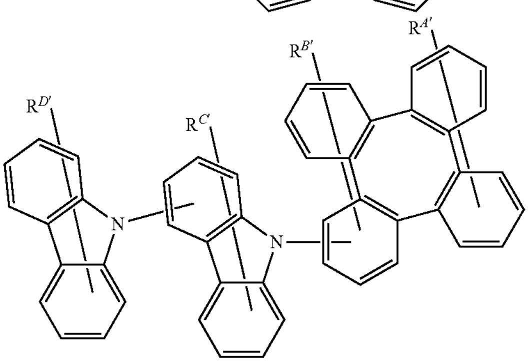

, wherein:

each of $J_1$ to $J_6$ is independently C or N;

L' is a direct bond or an organic linker, each $Y^{AA}$, $Y^{BB}$, $Y^{CC}$, and $Y^{DD}$ is independently selected from the group consisting of absent a bond, direct bond, O, S, Se, CRR', SiRR', GeRR', NR, BR, BRR';

each of $R^{A'}$, $R^{B'}$, $R^{C'}$, $R^{D'}$, $R^{E'}$, $R^{F'}$, and $R^{G'}$ independently represents mono, up to the maximum substitutions, or no substitutions;

each R, R', $R^{A'}$, $R^{B'}$, $R^{C'}$, $R^{D'}$, $R^{E'}$, $R^{F'}$, and $R^{G'}$ is independently a hydrogen or a substituent selected from the group consisting of the General Substituents as defined herein; any two substituents can be joined or fused to form a ring;

and where possible, each unsubstituted aromatic carbon atom is optionally replaced with N to form an aza-substituted ring.

In some embodiments at least one of $J_1$ to $J_3$ is N. In some embodiments at least two of $J_1$ to $J_3$ are N. In some embodiments, all three of $J_1$ to $J_3$ are N. In some embodiments, each $Y^{CC}$ and $Y^{DD}$ is independently O, S, or SiRR', or more preferably O or S. In some embodiments, at least one unsubstituted aromatic carbon atom is replaced with N to form an aza-ring.

In some embodiments, the host is selected from the group consisting of EG1-MG1-EG1 to EG53-MG27-EG53 with a formula of EGa-MGb-EGc, or EG1-EG1 to EG53-EG53 with a formula of EGa-EGc when MGb is absent, wherein a is an integer from 1 to 53, b is an integer from 1 to 27, c is an integer from 1 to 53. The structure of EG1 to EG53 is shown below:

EG1

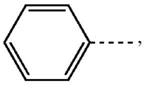

EG2

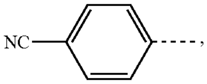

EG3

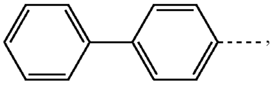

EG4

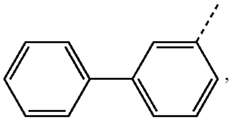

EG5

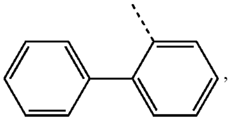

EG6

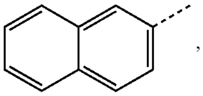

EG7

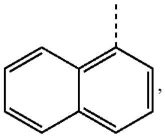

EG8

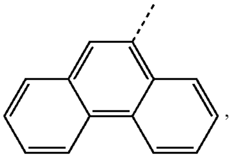

EG9

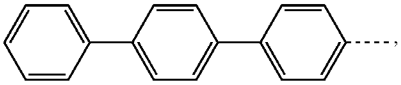

EG10

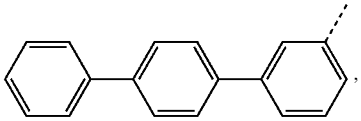

-continued

EG11

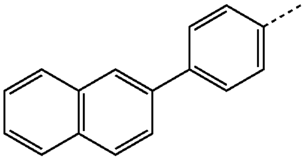

EG12

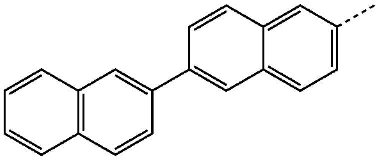

EG13

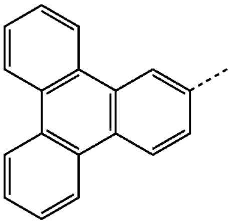

EG14

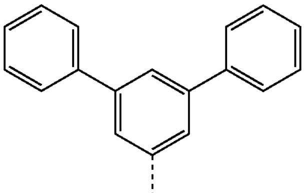

EG15

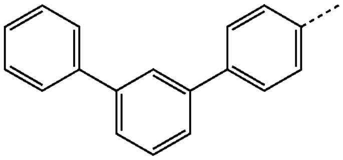

EG16

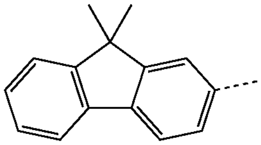

EG17

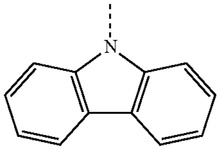

EG18

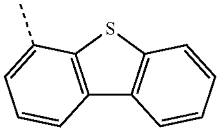

EG19

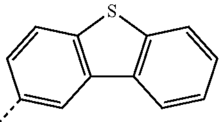

-continued
EG20
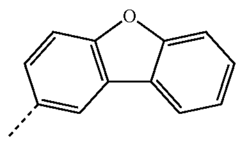
EG21
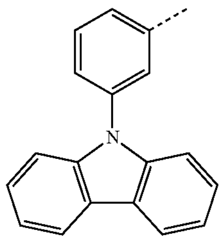
EG22
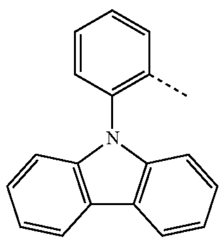
EG23
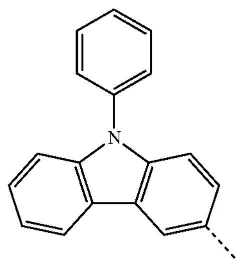
EG24
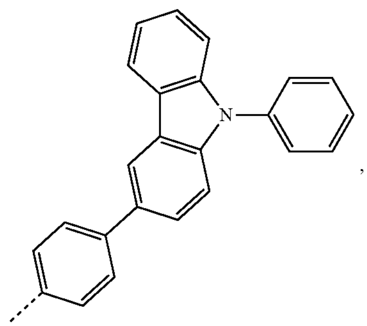
EG25
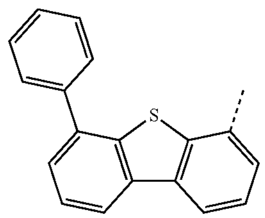
-continued
EG26
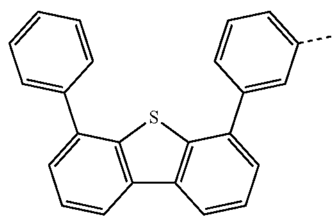
EG27
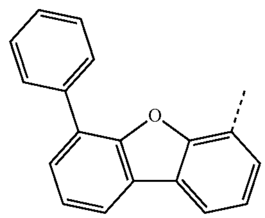
EG28
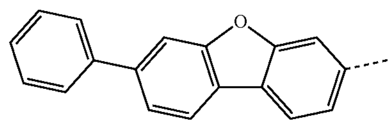
EG29
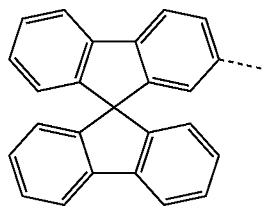
EG30
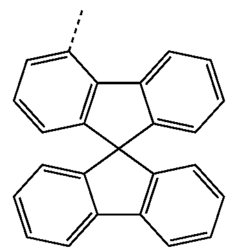
EG31
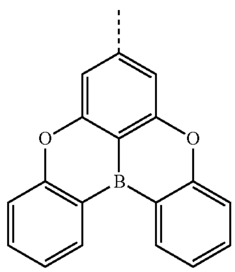
EG32
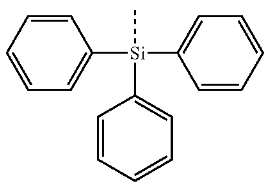

-continued
EG33
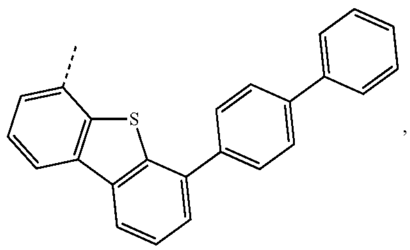
,
EG34
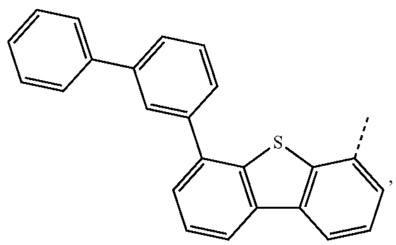
,
EG35
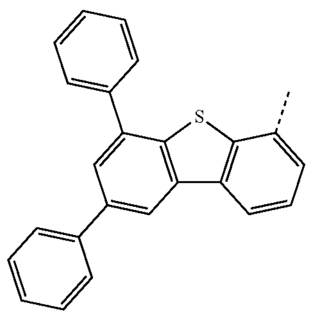
,
EG36
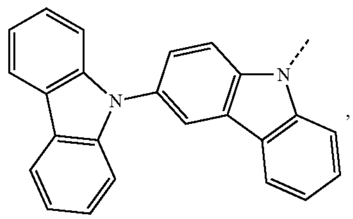
,
EG37
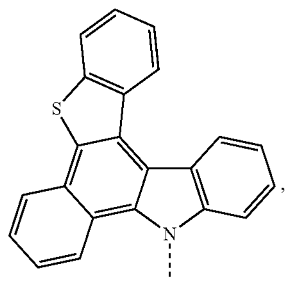
,
EG38
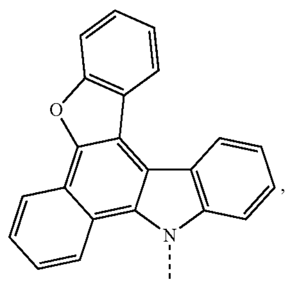
,
-continued
EG39
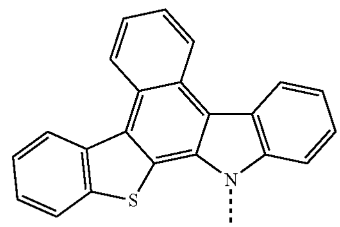
,
EG40
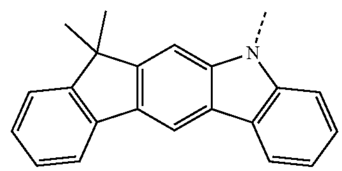
,
EG41
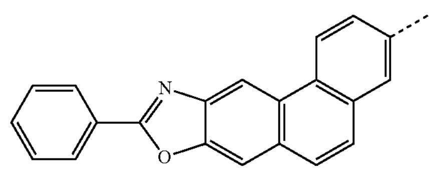
,
EG42
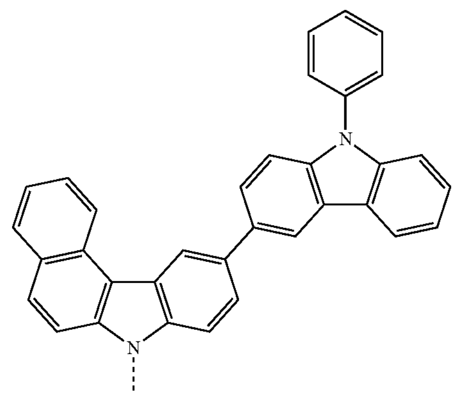
,
EG43
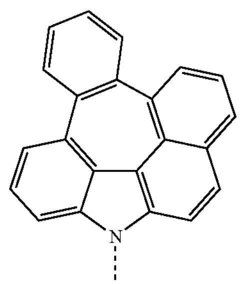
,
EG44
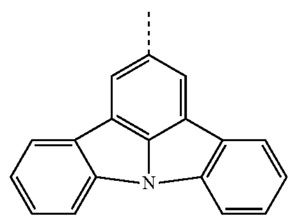
, -continued
EG45
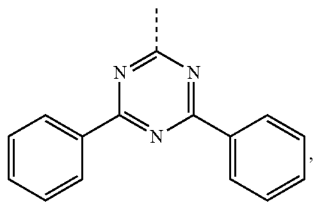
EG46
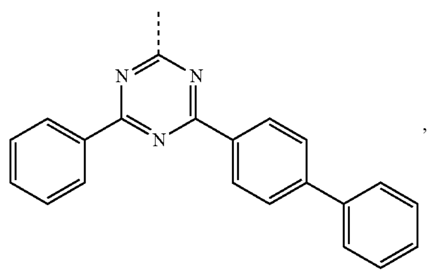
EG47
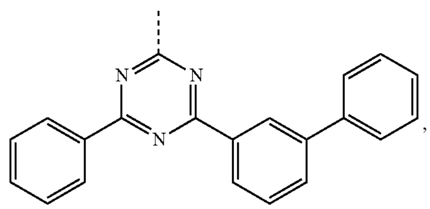
EG48
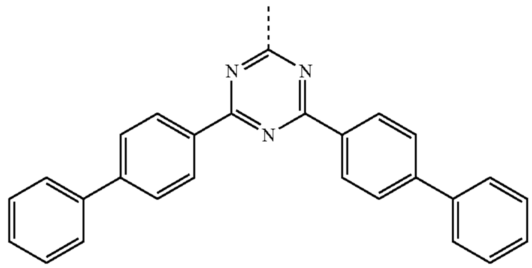
EG49
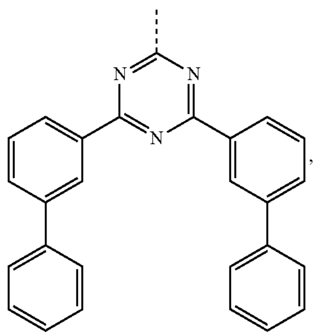
EG50
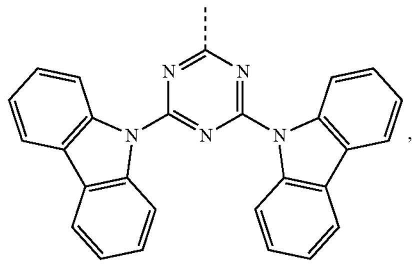
-continued
EG51
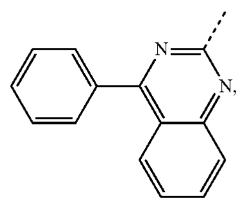
EG52
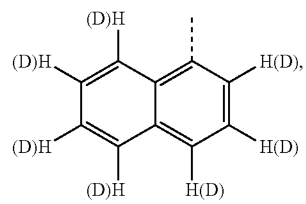
EG53
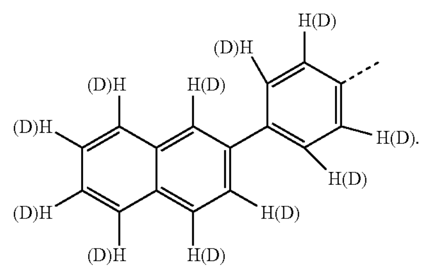
The structure of MG1 to MG27 is shown below:
MG1
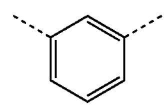
MG2
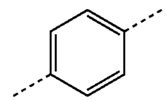
MG3
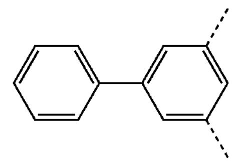
MG4
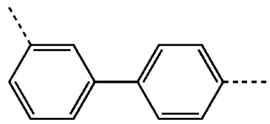
MG5
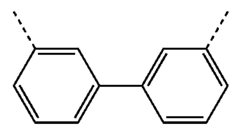
MG6
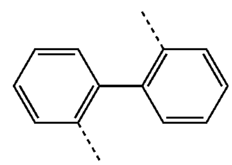

-continued
MG7
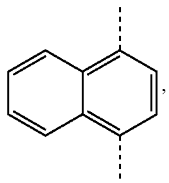
MG8
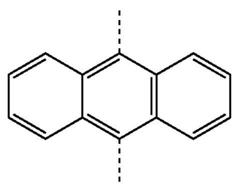
MG9
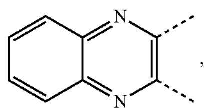
MG10
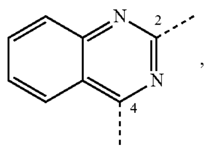
MG11
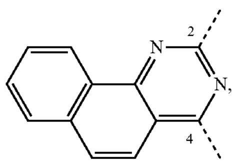
MG12
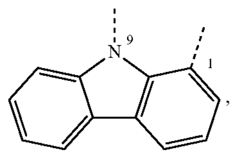
MG13
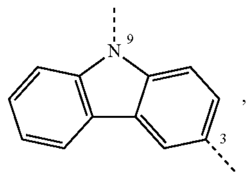
MG14
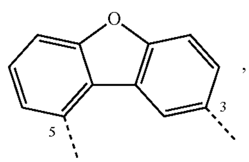
MG15
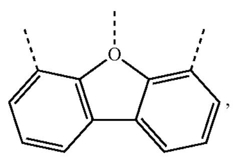
-continued
MG16
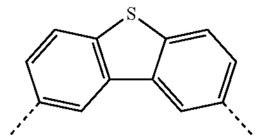
MG17
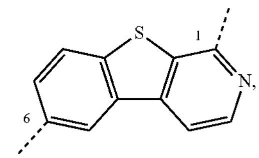
MG18
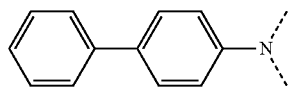
MG19
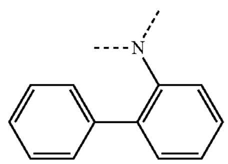
MG20
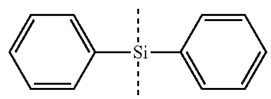
MG21
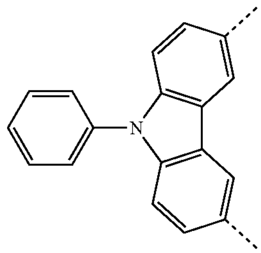
MG22
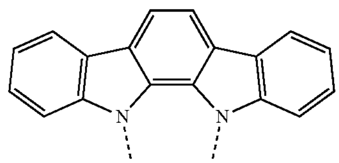
MG23
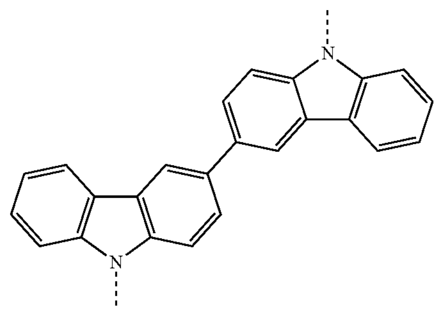
MG24
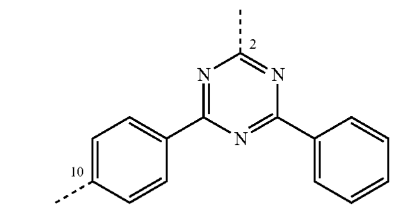

-continued

MG25

MG26

MG27

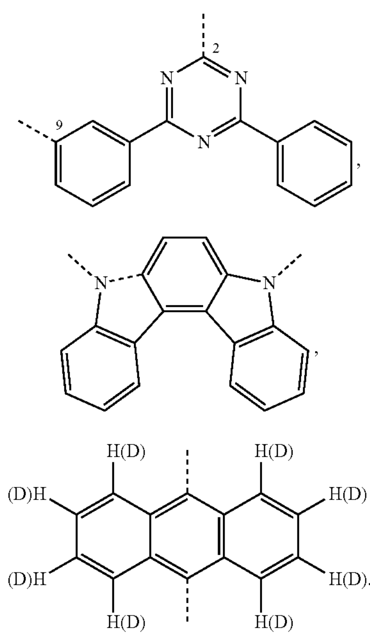

In some embodiments, the host can be any of the aza-substituted variants thereof, fully or partially deuterated variants thereof, and combinations thereof. In some embodiments, the host has formula selected from the HOST Group 2 consisting of h1 to h112.

| h | MGb | EGa | EGc |
|---|---|---|---|
| h1 | MG1 | EG3 | EG36 |
| h2 | MG1 | EG8 | EG12 |
| h3 | MG1 | EG13 | EG14 |
| h4 | MG1 | EG13 | EG18 |
| h5 | MG1 | EG13 | EG25 |
| h6 | MG1 | EG13 | EG36 |
| h7 | MG1 | EG22 | EG36 |
| h8 | MG1 | EG25 | EG46 |
| h9 | MG1 | EG27 | EG46 |
| h10 | MG1 | EG27 | EG48 |
| h11 | MG1 | EG32 | EG50 |
| h12 | MG1 | EG35 | EG46 |
| h13 | MG1 | EG36 | EG45 |
| h14 | MG1 | EG36 | EG49 |
| h15 | MG1 | EG40 | EG45 |
| h16 | MG2 | EG3 | EG36 |
| h17 | MG2 | EG25 | EG31 |
| h18 | MG2 | EG31 | EG33 |
| h19 | MG2 | EG36 | EG45 |
| h20 | MG2 | EG36 | EG46 |
| h21 | MG3 | EG4 | EG36 |
| h22 | MG3 | EG34 | EG45 |
| h23 | MG4 | EG13 | EG17 |
| h24 | MG5 | EG13 | EG45 |
| h25 | MG5 | EG17 | EG36 |
| h26 | MG5 | EG18 | EG36 |
| h27 | MG6 | EG17 | EG17 |
| h28 | MG7 | EG43 | EG45 |
| h29 | MG8 | EG1 | EG28 |
| h30 | MG8 | EG6 | EG7 |
| h31 | MG8 | EG7 | EG7 |
| h32 | MG8 | EG7 | EG11 |
| h33 | MG9 | EG1 | EG43 |
| h34 | MG10 | 4-EG1 | 2-EG37 |
| h35 | MG10 | 4-EG1 | 2-EG38 |
| h36 | MG10 | EG1 | EG42 |
| h37 | MG11 | 4-EG1 | 2-EG39 |
| h38 | MG12 | 1-EG17 | 9-EG31 |

-continued

| h | MGb | EGa | EGc |
|---|---|---|---|
| h39 | MG13 | 3-EG17 | 9-EG4 |
| h40 | MG13 | 3-EG17 | 9-EG13 |
| h41 | MG13 | 3-EG17 | 9-EG31 |
| h42 | MG13 | 3-EG17 | 9-EG45 |
| h43 | MG13 | 3-EG17 | 9-EG46 |
| h44 | MG13 | 3-EG17 | 9-EG48 |
| h45 | MG13 | 3-EG17 | 9-EG49 |
| h46 | MG13 | 3-EG32 | 9-EG31 |
| h47 | MG13 | 3-EG44 | 9-EG3 |
| h48 | MG14 | 3-EG13 | 5-EG45 |
| h49 | MG14 | 3-EG23 | 5-EG45 |
| h50 | MG15 | EG3 | EG48 |
| h51 | MG15 | EG17 | EG31 |
| h52 | MG15 | EG31 | EG36 |
| h53 | MG16 | EG17 | EG17 |
| h54 | MG17 | EG17 | EG17 |
| h55 | MG18 | EG16 | EG24 |
| h56 | MG18 | EG16 | EG30 |
| h57 | MG18 | EG20 | EG41 |
| h58 | MG19 | EG16 | EG29 |
| h59 | MG20 | EG1 | EG31 |
| h60 | MG20 | EG17 | EG18 |
| h61 | MG21 | EG23 | EG23 |
| h62 | MG22 | EG1 | EG45 |
| h63 | MG22 | EG1 | EG46 |
| h64 | MG22 | EG3 | EG46 |
| h65 | MG22 | EG4 | EG46 |
| h66 | MG22 | EG4 | EG47 |
| h67 | MG22 | EG9 | EG45 |
| h68 | MG23 | EG1 | EG3 |
| h69 | MG23 | EG1 | EG6 |
| h70 | MG23 | EG1 | EG14 |
| h71 | MG23 | EG1 | EG18 |
| h72 | MG23 | EG1 | EG19 |
| h73 | MG23 | EG1 | EG23 |
| h74 | MG23 | EG1 | EG51 |
| h75 | MG23 | EG2 | EG18 |
| h76 | MG23 | EG3 | EG3 |
| h77 | MG23 | EG3 | EG4 |
| h78 | MG23 | EG3 | EG5 |
| h79 | MG23 | EG4 | EG4 |
| h80 | MG23 | EG4 | EG5 |
| h81 | MG24 | 2-EG1 | 10-EG33 |
| h82 | MG24 | 2-EG4 | 10-EG36 |
| h83 | MG24 | 2-EG21 | 10-EG36 |
| h84 | MG24 | 2-EG23 | 10-EG36 |
| h85 | MG25 | 2-EG1 | 9-EG33 |
| h86 | MG25 | 2-EG3 | 9-EG36 |
| h87 | MG25 | 2-EG4 | 9-EG36 |
| h88 | MG25 | 2-EG17 | 9-EG27 |
| h89 | MG25 | 2-EG17 | 9-EG36 |
| h90 | MG25 | 2-EG21 | 9-EG36 |
| h91 | MG25 | 2-EG23 | 9-EG27 |
| h92 | MG25 | 2-EG23 | 9-EG36 |
| h93 | MG26 | EG1 | EG9 |
| h94 | MG26 | EG1 | EG10 |
| h95 | MG26 | EG1 | EG21 |
| h96 | MG26 | EG1 | EG23 |
| h97 | MG26 | EG1 | EG26 |
| h98 | MG26 | EG3 | EG3 |
| h99 | MG26 | EG3 | EG9 |
| h100 | MG26 | EG3 | EG23 |
| h101 | MG26 | EG3 | EG26 |
| h102 | MG26 | EG4 | EG10 |
| h103 | MG26 | EG5 | EG10 |
| h104 | MG26 | EG6 | EG10 |
| h105 | MG26 | EG10 | EG10 |
| h106 | MG26 | EG10 | EG14 |
| h107 | MG26 | EG10 | EG15 |
| h108 | MG27 | EG52 | EG53 |
| h109 | — | EG13 | EG18 |
| h110 | — | EG17 | EG31 |
| h111 | — | EG17 | EG50 |
| h112 | — | EG40 | EG45 |

In some embodiments, the organic layer may further comprise a host, wherein the host comprises a metal complex.

In some embodiments, the emissive layer can comprise two hosts, a first host and a second host. In some embodiments, the first host is a hole transporting host, and the second host is an electron transporting host. In some embodiments, the first host is a hole transporting host, and the second host is a bipolar host. In some embodiments, the first host is an electron transporting host, and the second host is a bipolar host. In some embodiments, the first host and the second host can form an exciplex. In some embodiments, the emissive layer can comprise a third host. In some embodiments, the third host is selected from the group consisting of an insulating host (wide band gap host), a hole transporting host, and an electron transporting host. In some embodiments, the third host forms an exciplex with one of the first host and the second host, or with both the first host and the second host. In some embodiments, the emissive layer can comprise a fourth host. In some embodiments, the fourth host is selected from the group consisting of an insulating host (wide band gap host), a hole transporting host, and an electron transporting host. In some embodiments, the fourth host forms an exciplex with one of the first host, the second host, and the third host, with two of the first host, the second host, and the third host, or with each of the first host, the second host, and the third host. In some embodiments, the electron transporting host has a LUMO less than −2.4 eV, less than −2.5 eV, less than −2.6 eV, or less than −2.7 eV. In some embodiments, the hole transporting host has a HOMO higher than −5.6 eV, higher than −5.5 eV, higher than −5.4 eV, or higher than −5.35 eV. The HOMO and LUMO values can be determined using solution electrochemistry. Solution cyclic voltammetry and differential pulsed voltammetry can be performed using a CH Instruments model 6201B potentiostat using anhydrous dimethylformamide (DMF) solvent and tetrabutylammonium hexafluorophosphate as the supporting electrolyte. Glassy carbon, platinum wire, and silver wire were used as the working, counter and reference electrodes, respectively. Electrochemical potentials can be referenced to an internal ferrocene-ferroconium redox couple (Fc/Fc+) by measuring the peak potential differences from differential pulsed voltammetry. The corresponding highest occupied molecular orbital (HOMO) and lowest unoccupied molecular orbital (LUMO) energies can be determined by referencing the cationic and anionic redox potentials to ferrocene (4.8 eV vs. vacuum) according to literature ((a) Fink, R.; Heischkel, Y.; Thelakkat, M.; Schmidt, H. W. *Chem. Mater.* 1998, 10, 3620-3625. (b) Pommerehne, J.; Vestweber, H.; Guss, W.; Mahrt, R. F.; Bassler, H.; Porsch, M.; Daub, *J. Adv. Mater.* 1995, 7, 551).

In some embodiments, the compound as described herein may be a sensitizer or a component of a sensitizer; wherein the device may further comprise an acceptor that receives the energy from the sensitizer. In some embodiments, the acceptor is an emitter in the device. In some embodiments, the acceptor may be a fluorescent material. In some embodiments, the compound described herein can be used as a phosphorescent sensitizer in an OLED where one or multiple layers in the OLED contain an acceptor in the form of one or more non-delayed fluorescent and/or delayed fluorescence material. In some embodiments, the compound described herein can be used as one component of an exciplex to be used as a sensitizer. As a phosphorescent sensitizer, the compound must be capable of energy transfer to the acceptor and the acceptor will emit the energy or further transfer energy to a final emitter. The acceptor concentrations can range from 0.001% to 99.9%. The acceptor could be in either the same layer as the phosphorescent sensitizer or in one or more different layers. In some embodiments, the acceptor is a thermally activated delayed fluorescence (TADF) material. In some embodiments, the acceptor is a non-delayed fluorescent material. In some embodiments, the emission can arise from any or all of the sensitizer, acceptor, and final emitter. In some embodiments, the acceptor has an emission at room temperature with a full width at half maximum (FWHM) of equal to or less than 50, 45, 40, 35, 30, 25, 20, 15, 10, or 5 nm. Narrower FWHM means better color purity for the OLED display application.

As used herein, phosphorescence generally refers to emission of a photon with a change in electron spin quantum number, i.e., the initial and final states of the emission have different electron spin quantum numbers, such as from T1 to S0 state. Most of the Ir and Pt complexes currently used in OLED are phosphorescent emitters. In some embodiments, if an exciplex formation involves a triplet emitter, such exciplex can also emit phosphorescent light. On the other hand, fluorescent emitters generally refer to emission of a photon without a change in electron spin quantum number, such as from S1 to S0 state, or from D1 to D0 state. Fluorescent emitters can be delayed fluorescent or non-delayed fluorescent emitters. Depending on the spin state, fluorescent emitter can be a singlet emitter or a doublet emitter, or other multiplet emitter. It is believed that the internal quantum efficiency (IQE) of fluorescent OLEDs can exceed the 25% spin statistics limit through delayed fluorescence. There are two types of delayed fluorescence, i.e. P-type and E-type delayed fluorescence. P-type delayed fluorescence is generated from triplet-triplet annihilation (TTA). On the other hand, E-type delayed fluorescence does not rely on the collision of two triplets, but rather on the thermal population between the triplet states and the singlet excited states. Thermal energy can activate the transition from the triplet state back to the singlet state. This type of delayed fluorescence is also known as TADF. E-type delayed fluorescence characteristics can be found in an exciplex system or in a single compound. Without being bound by theory, it is believed that TADF emissions require a compound or an exciplex having a small singlet-triplet energy gap ($\Delta E_{S-T}$) less than or equal to 400, 350, 300, 250, 200, 150, 100, or 50 meV. There are two major types of TADF emitters, one is called donor-acceptor type TADF, the other one is called multiple resonance (MR) TADF. Often, single compound donor-acceptor TADF compounds are constructed by connecting an electron donor moiety such as amino- or carbazole-derivatives and an electron acceptor moiety such as N-containing six-membered aromatic rings or cyano-substituted aromatic rings. Donor-acceptor exciplexes can be formed between a hole transporting compound and an electron transporting compound. Examples of MR-TADF materials include highly conjugated fused ring systems. In some embodiments, MR-TADF materials comprises boron, carbon, and nitrogen atoms. Such materials may comprise other atoms, such as oxygen, as well. In some embodiments, the reverse intersystem crossing time from T1 to S1 of the delayed fluorescent emission at 293K is less than or equal to 10 microseconds. In some embodiments, such time can be greater than 10 microseconds and less than 100 microseconds.

In some embodiments, the OLED may comprise an additional compound selected from the group consisting of a non-delayed fluorescence material, a delayed fluorescence material, a phosphorescent material, and combination thereof.

In some embodiments, the inventive compound described herein is a phosphorescent material.

In some embodiments, the phosphorescent material is an emitter which emits light within the OLED. In some embodiments, the phosphorescent material does not emit light within the OLED. In some embodiments, the phosphorescent material energy transfers its excited state to another material within the OLED. In some embodiments, the phosphorescent material participates in charge transport within the OLED. In some embodiments, the phosphorescent material is a sensitizer or a component of a sensitizer, and the OLED further comprises an acceptor. In some embodiments, the phosphorescent material forms an exciplex with another material within the OLED, for example a host material, an emitter material.

In some embodiments, the non-delayed fluorescence material or the delayed fluorescence material is an emitter which emits light within the OLED. In some embodiments, the non-delayed fluorescence material or the delayed fluorescence material does not emit light within the OLED. In some embodiments, the non-delayed fluorescence material or the delayed fluorescence material energy transfers its excited state to another material within the OLED. In some embodiments, the non-delayed fluorescence material or the delayed fluorescence material participates in charge transport within the OLED. In some embodiments, the non-delayed fluorescence material or the delayed fluorescence material is an acceptor, and the OLED further comprises a sensitizer.

In some embodiments of the OLED, the delayed fluorescence material comprises at least one donor group and at least one acceptor group. In some embodiments, the delayed fluorescence material is a metal complex. In some embodiments, the delayed fluorescence material is a non-metal complex. In some embodiments, the delayed fluorescence material is a Pt, Pd, Zn, Cu, Ag, or Au complex (some of them are also called metal-assisted (MA) TADF). In some embodiments, the metal-assisted delayed fluorescence material comprises a metal-carbene bond. In some embodiments, the non-delayed fluorescence material or delayed fluorescence material comprises at least one chemical group selected from the group consisting of aryl-amine, aryloxy, arylthio, triphenylene, carbazole, indolocarbazole, dibenzothiophene, dibenzofuran, dibenzoselenophene, $5\lambda^2$-benzo[d]benzo[4,5]imidazo[3,2-a]imidazole, 5,9-dioxa-13b-boranaphtho[3,2,1-de]anthracene, $5\lambda^2$, $9\lambda^2$-diaza-13b-boranaphtho[2,3,4-de]anthracene, 5-oxa-$9\lambda^2$-aza-13b-boranaphtho[3,2,1-de]anthracene, azaborinine, oxaborinine, dihydroacridine, xanthene, dihydrobenzoazasiline, dibenzooxasiline, phenoxazine, phenoxathiine, phenothiazine, dihydrophenazine, fluorene, naphthalene, anthracene, phenanthrene, phenanthroline, benzoquinoline, quinoline, isoquinoline, quinazoline, pyrimidine, pyrazine, pyridine, triazine, boryl, amino, silyl, aza-variants thereof, and combinations thereof. In some embodiments, non-delayed the fluorescence material or delayed fluorescence material comprises a tri(aryl/heteroaryl)borane with one or more pairs of the substituents from the aryl/heteroaryl being joined to form a ring. In some embodiments, the fluorescence material comprises at least one chemical group selected from the group consisting of naphthalene, anthracene, phenalene, phenanthrene, fluorene, pyrene, chrysene, perylene, and azulene.

In yet another aspect, the OLED of the present disclosure may also comprise an emissive region containing a compound or a formulation of the compound as disclosed in the above compounds section of the present disclosure. In some embodiments, the emissive region can comprise a compound or a formulation of the compound comprising a first ligand $L_A$ of Formula I as defined herein. In some embodiments, the emissive region consists of one or more organic layers, wherein at least one of the one or more organic layers has a minimum thickness selected from the group consisting of 350, 400, 450, 500, 550, 600, 650 and 700 Å. In some embodiments, the at least one of the one or more organic layers are formed from an Emissive System that has a figure of merit (FOM) value equal to or larger than the number selected from the group consisting of 2.50, 2.55, 2.60, 2.65, 2.70, 2.75, 2.80, 2.85, 2.90, 2.95, 3.00, 5.00, 10.0, 15.0, and 20.0. The definition of FOM is available in U.S. patent Application Publication No. 2023/0292605, and its entire contents are incorporated herein by reference. In some embodiments, the at least one of the one or more organic layers comprises a compound or a formulation of the compound as disclosed in Sections A and D of the present disclosure.

In some embodiments, the OLED or the emissive region comprising the inventive compound disclosed herein can be incorporated into a full-color pixel arrangement of a device. The full-color pixel arrangement of such device comprises at least one pixel, wherein the at least one pixel comprises a first subpixel and a second subpixel. The first subpixel includes a first OLED comprising a first emissive region. The second subpixel includes a second OLED comprising a second emissive region. In some embodiments, the first and/or second OLED, the first and/or second emissive region can be the same or different and each can independently have the various device characteristics and the various embodiments of the inventive compounds included therein, and various combinations and subcombinations of the various device characteristics and the various embodiments of the inventive compounds included therein, as disclosed herein.

In some embodiments, the first emissive region is configured to emit a light having a peak wavelength $\lambda_{max1}$; the second emissive region is configured to emit a light having a peak wavelength $\lambda_{max2}$. In some embodiments, the difference between the peak wavelengths $\lambda_{max1}$ and $\lambda_{max2}$ is at least 4 nm but within the same color. For example, a light blue and a deep blue light as described above. In some embodiments, a first emissive region is configured to emit a light having a peak wavelength $\lambda_{max1}$ in one region of the visible spectrum of 400-500 nm, 500-600 nm, 600-700 nm; and a second emissive region is configured to emit light having a peak wavelength $\lambda_{max2}$ in one of the remaining regions of the visible spectrum of 400-500 nm, 500-600 nm, 600-700 nm. In some embodiments, the first emissive region comprises a first number of emissive layers that are deposited one over the other if more than one; and the second emissive region comprises a second number of emissive layers that is deposited one over the other if more than one; and the first number is different from the second number. In some embodiments, both the first emissive region and the second emissive region comprise a phosphorescent materials, which may be the same or different. In some embodiments, the first emissive region comprises a phosphorescent material, while the second emissive region comprises a fluorescent material. In some embodiments, both the first emissive region and the second emissive region comprise a fluorescent materials, which may be the same or different.

In some embodiments, the at least one pixel of the OLED or emissive regions includes a total of N subpixels; wherein the N subpixels comprises the first subpixel and the second subpixel; wherein each of the N subpixels comprises an emissive region; wherein the total number of the emissive regions within the at least one pixel is equal to or less than N−1. In some embodiments, the second emissive region is exactly the same as the first emissive region; and each subpixel of the at least one pixel comprises the same one emissive region as the first emissive region. In some embodiments, the full-color pixel arrangements can have a plurality of pixels comprising a first pixel region and a second pixel region; wherein at least one display characteristic in the first pixel region is different from the corresponding display characteristic of the second pixel region, and wherein the at least one display characteristic is selected from the group consisting of resolution, cavity mode, color, outcoupling, and color filter.

In some embodiments, the OLED is a stacked OLED comprising one or more charge generation layers (CGLs). In some embodiments, the OLED comprises a first electrode, a first emissive region disposed over the first electrode, a first CGL disposed over the first emissive region, a second emissive region disposed over the first CGL, and a second electrode disposed over the second emissive region. In some embodiments, the first and/or the second emissive regions can have the various device characteristics as described above for the pixelated device. In some embodiments, the stacked OLED is configured to emit white color. In some embodiments, one or more of the emissive regions in a pixelated or in a stacked OLED comprises a sensitizer and an acceptor with the various sensitizing device characteristics and the various embodiments of the inventive compounds disclosed herein. For example, the first emissive region is comprised in a sensitizing device, while the second emissive region is not comprised in a sensitizing device; in some instances, both the first and the second emissive regions are comprised in sensitizing devices.

In some embodiments, the OLED can emit light having at least 1%, 5%, 10, 30%, 50%, 70%, 80%, 90%, 95%, 99%, or 100% from the plasmonic mode. In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. In some embodiments, the enhancement layer is provided no more than a threshold distance away from the organic emissive layer, wherein the emitter material has a total non-radiative decay rate constant and a total radiative decay rate constant due to the presence of the enhancement layer. A threshold distance is where the total non-radiative decay rate constant is equal to the total radiative decay rate constant. Another threshold distance is the distance at which the total radiative decay rate constant divided by the sum of the total non-radiative decay rate constant and total radiative decay rate constant is equal to the photoluminescent yield of the emissive material without the enhancement layer present.

In some embodiments, the OLED further comprises an outcoupling layer. In some embodiments, the outcoupling layer is disposed over the enhancement layer on a side opposite the organic emissive layer The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and a reduced efficiency roll-off of the OLED device. Placement of the enhancement layer on the cathode side, anode side, or on both sides, or the enhancement layer itself being as the CGL, results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

In some embodiments, the enhancement layer can be comprised of plasmonic materials, optically active metamaterials, or hyperbolic metamaterials. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, or Ca, alloys or mixtures of these materials, and stacks of these materials. In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly.

In some embodiments, the outcoupling layer has wavelength-sized or sub-wavelength sized features that are arranged periodically, quasi-periodically, or randomly. In some embodiments, the outcoupling layer may be composed of a plurality of nanoparticles. In some embodiments, the outcoupling layer is composed of a plurality of nanoparticles disposed over a material. In these embodiments the outcoupling layer may be tunable by at least one of: varying a size of the plurality of nanoparticles, varying a shape of the plurality of nanoparticles, changing a material of the plurality of nanoparticles, adjusting a thickness of the material, changing the refractive index of the material, adding an additional layer disposed on the plurality of nanoparticles, varying a thickness of the enhancement layer, or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, and Ca, alloys or mixtures of these materials, and stacks of these materials. In some embodiments the outcoupling layer is formed by lithography.

In some embodiments of plasmonic device, the emitter, and/or host compounds used in the emissive layer has a vertical dipole ratio (VDR) of 0.33 or more. In some such embodiments, the emitter, and/or host compounds have a VDR of 0.40, 0.50, 0.60, 0.70, or more.

In yet another aspect, the present disclosure also provides a consumer product comprising an organic light-emitting device (OLED) having an anode; a cathode; and an organic layer disposed between the anode and the cathode, wherein the organic layer may comprise a compound or a formulation of the compound as disclosed in the above compounds section of the present disclosure.

In some embodiments, the consumer product comprises an OLED having an anode; a cathode; and an organic layer disposed between the anode and the cathode, wherein the organic layer may comprise a compound comprising a first ligand $L_A$ which comprises a structure of Formula I as described herein.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, and an "exciton," which is a localized electron-hole pair having an excited energy state, is formed. Light is emitted when the exciton relaxes via a photoemissive mechanism. In some cases, the exciton may be localized as an excimer or an exciplex. Non-radiative mechanisms, such as thermal relaxation, may also occur, but are generally considered undesirable.

FIG. 1 shows an organic light emitting device 100. The figures are not necessarily drawn to scale. Device 100 may include a substrate 110, an anode 115, a hole injection layer (HIL) 120, a hole transport layer (HTL) 125, an electron blocking layer (EBL) 130, an emissive layer (EML) 135, a hole blocking layer (HBL) 140, an electron transport layer (ETL) 145, an electron injection layer (EIL) 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
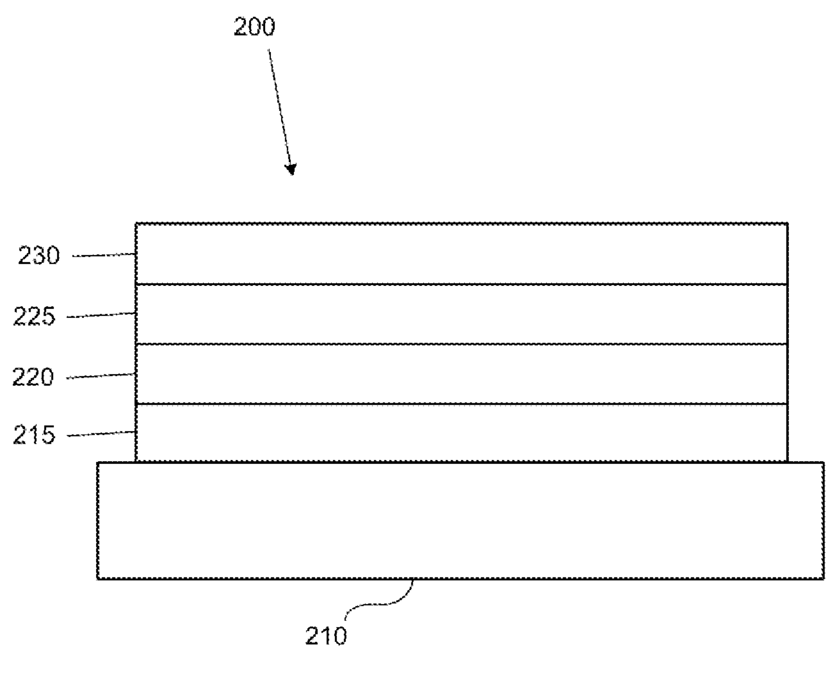
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP, also referred to as organic vapor jet deposition (OVJD)), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation, sputtering, chemical vapor deposition, atomic layer deposition, and electron beam deposition. Preferred patterning methods include deposition through a mask, photolithography, and cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a plurality of alternative layers of polymeric material and non-polymeric material; organic material and inorganic material; or a mixture of a polymeric material and a non-polymeric material as one example described in U.S. Pat. No. 7,968,146, PCT Pat. Application Nos. PCT/US2007/023098 and PCT/US2009/042829, which are herein incorporated by reference in their entireties.

Devices fabricated in accordance with embodiments of the present disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the present disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 degrees C. to 30 degrees C., and more preferably at room temperature (20-25° C.), but could be used outside this temperature range, for example, from −40 degree C. to +80° C.

More details on OLEDs, and the definitions described above, can be found in U.S. Pat. No. 7,279,704, which is incorporated herein by reference in its entirety.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes. In some embodiments, the OLED further comprises one or more quantum dots. Such quantum dots can be in the emissive layer, or in other functional layers, such as a down conversion layer.

In some embodiments, the OLED comprises a RGB pixel arrangement or white plus color filter pixel arrangement. In some embodiments, the OLED is a mobile device, a handheld device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

D. Other Materials Used in the OLED

The materials described herein are as various examples useful for a particular layer in an OLED. They may also be used in combination with a wide variety of other materials present in the device. For example, emissive dopants disclosed herein may be used by themselves in the EML, or in conjunction with a wide variety of other emitters, hosts, transport layers, blocking layers, injection layers, electrodes and other layers that may be present. The materials described or referred to below are non-limiting examples of materials that may be useful in combination with the compounds and the devices disclosed herein, and one of skill in the art can readily consult the literature to identify other materials that may be useful in combination.

a) Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer. In some embodiments, conductivity dopants comprises at least one chemical moiety selected from the group consisting of cyano, fluorinated aryl or heteroaryl, fluorinated alkyl or cycloalkyl, alkylene, heteroaryl, amide, benzodithiophene, and highly conjugated heteroaryl groups extended by non-ring double bonds.

b) HIL/HTL:

A hole injecting/transporting material to be used in the present disclosure is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

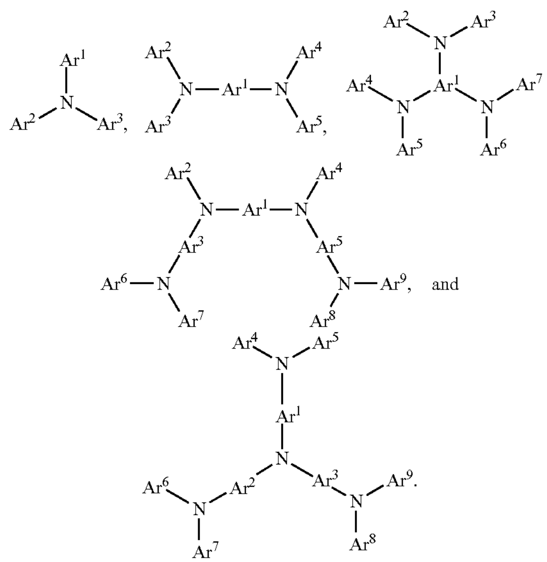

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each of $Ar^1$ to $Ar^9$ may be unsubstituted or may be substituted by a general substituent as described above, any two substituents can be joined or fused into a ring.

In some embodiments, each $Ar^1$ to $Ar^9$ independently comprises a moiety selected from the group consisting of:

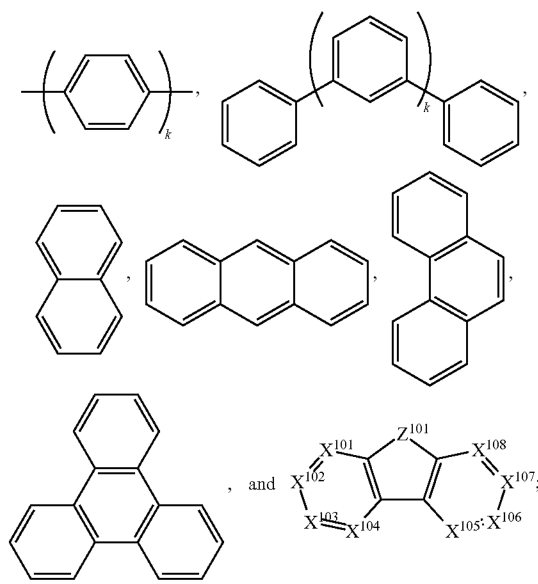

wherein k is an integer from 1 to 20; $X^{101}$ to $X^{108}$ is C or N; $Z^{101}$ is C, N, O, or S.

Examples of metal complexes used in HIL or HTL include, but are not limited to the following general formula:

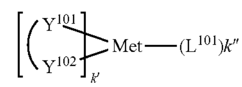

wherein Met is a metal, which can have an atomic weight greater than 40; $(Y^{101}\text{-}Y^{102})$ is a bidentate ligand, the coordinating atoms of $Y^{101}$ and $Y^{102}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In some embodiments, $(Y^{101}\text{-}Y^{102})$ is a 2-phenylpyridine or 2-phenylimidazole derivative. In some embodiments, $(Y^{101}\text{-}Y^{102})$ is a carbene ligand. In some embodiments, Met is selected from Ir, Pt, Pd, Os, Cu, and Zn. In some embodiments, the metal complex has a smallest oxidation potential in solution vs. Fc+/Fc couple less than about 0.6 V.

In some embodiments, the HIL/HTL material is selected from the group consisting of phthalocyanine and porphryin compounds, starburst triarylamines, $CF_x$ fluorohydrocarbon polymer, conducting polymers (e.g., PEDOT:PSS, polyaniline, polypthiophene), phosphonic acid and sliane SAMs, triarylamine or polythiophene polymers with conductivity dopants, Organic compounds with conductive inorganic compounds (such as molybdenum and tungsten oxides), n-type semiconducting organic complexes, metal organometallic complexes, cross-linkable compounds, polythiophene based polymers and copolymers, triarylamines, triaylamine with spirofluorene core, arylamine carbazole compounds, triarylamine with (di)benzothiophene/(di)benzofuran, indolocarbazoles, isoindole compounds, and metal carbene complexes.

c) EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than one or more emitters closest to the EBL interface. In some embodiments, the compound used in EBL contains at least one carbazole group and/or at least one arylamine group. In some embodiments the HOMO level of the compound used in the EBL is shallower than the HOMO level of one or more of the hosts in the EML. In some embodiments, the compound used in EBL contains the same molecule or the same functional groups used as one of the hosts described herein.

d) Hosts:

The light emitting layer of the organic EL device of the present disclosure preferably contains at least a light emitting material as the dopant, and a host material. Examples of the host material are not particularly limited, and any metal complexes or organic compounds may be used as long as the host won't fully quench the emission of the dopant.

Examples of metal complexes used as host are preferred to have the following general formula:

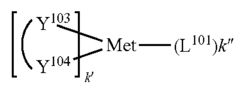

wherein Met is a metal; ($Y^{103}$-$Y^{104}$) is a bidentate ligand, the coordinating atoms of $Y^{103}$ and $Y^{104}$ are independently selected from C, N, O, P, and S; is an another ligand; k' is an integer value from 1 to the maximum number of ligands that may be attached to the metal; and k'+k" is the maximum number of ligands that may be attached to the metal.

In some embodiments, the metal complexes are:

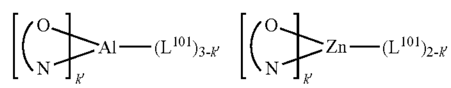

wherein (O—N) is a bidentate ligand, having metal coordinated to atoms O and N.

In some embodiments, Met is selected from Ir and Pt. In further embodiments, ($Y^{103}$-$Y^{104}$) is a carbene ligand.

In some embodiments, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, aza-dibenzothiophene, aza-dibenzofuran, aza-dibenzoselenophene, aza-carbazole, aza-indolocarbazole, aza-triphenylene, aza-tetraphenylene, 5λ2-benzo[d]benzo[4,5]imidazo[3,2-a]imidazole, 5,9-dioxa-13b-boranaphtho[3,2,1-de]anthracene, and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by the general substituents as described herein or may be further fused.

In some embodiments, the host compound comprises at least one of the moieties selected from the group consisting of:

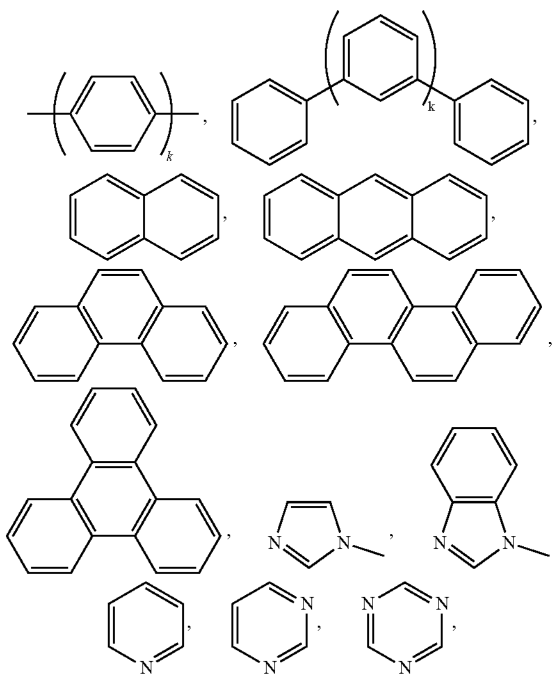

-continued

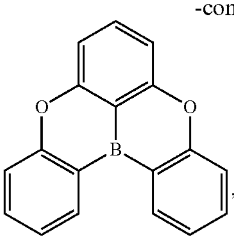,
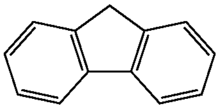,

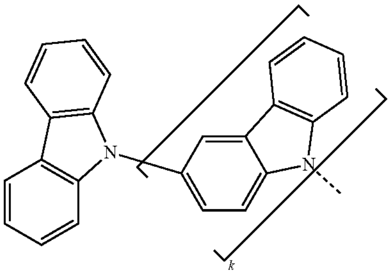,

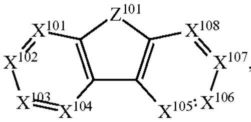,
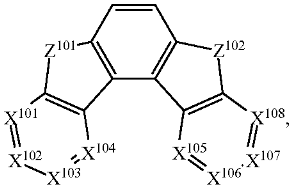,

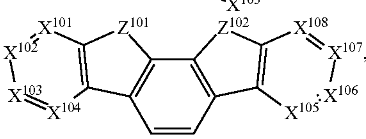,

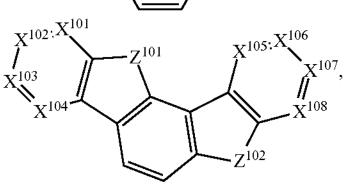,

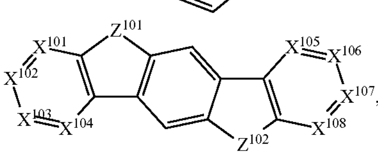, and

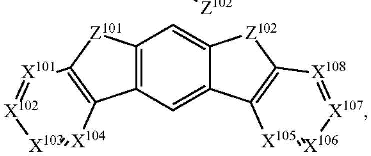, wherein k is an integer from 0 to 20 or 1 to 20. $X^{101}$ to $X^{108}$ are independently selected from C or N. $Z^{101}$ and $Z^{102}$ are independently selected from C, N, O, or S.

In some embodiments, the host material is selected from the group consisting of arylcarbazoles, metal 8-hydroxyquinolates, (e.g., alq3, balq), metal phenoxybenzothiazole compounds, conjugated oligomers and polymers (e.g., polyfluorene), aromatic fused rings, zinc complexes, chrysene based compounds, aryltriphenylene compounds, poly-fused heteroaryl compounds, donor acceptor type molecules, dibenzofuran/dibenzothiophene compounds, polymers (e.g., pvk), spirofluorene compounds, spirofluorene-carbazole compounds, indolocabazoles, 5-member ring electron deficient heterocycles (e.g., triazole, oxadiazole), tetraphenylene complexes, metal phenoxypyridine compounds, metal coordination complexes (e.g., Zn, Al with N^N ligands), dibenzothiophene/dibenzofuran-carbazole compounds, silicon/germanium aryl compounds, aryl benzoyl esters, carbazole linked by non-conjugated groups, aza-carbazole/dibenzofuran/dibenzothiophene compounds, and high triplet metal organometallic complexes (e.g., metal-carbene complexes).

e) Emitter Materials in EML:

One or more emitter materials may be used in conjunction with the compound or device of the present disclosure. The emitter material can be emissive or non-emissive in the current device as described herein. Examples of the emitter materials are not particularly limited, and any compounds may be used as long as the compounds are capable of producing emissions in a regular OLED device. Examples of suitable emitter materials include, but are not limited to, compounds which are capable of producing emissions via phosphorescence, non-delayed fluorescence, delayed fluorescence, especially the thermally activated delayed fluorescence, i.e., TADF (also referred to as E-type delayed fluorescence), triplet-triplet annihilation, or combinations of these processes.

In some embodiments, the emitter material has the formula of $M(L^1)_x(L^2)_y(L^3)_z$;

wherein $L^1$, $L^2$, and $L^3$ can be the same or different;

wherein x is 1, 2, or 3;

wherein y is 0, 1, or 2;

wherein z is 0, 1, or 2;

wherein x+y+z is the oxidation state of the metal M;

wherein $L^1$ is selected from the group consisting of the structures of LIGAND LIST:

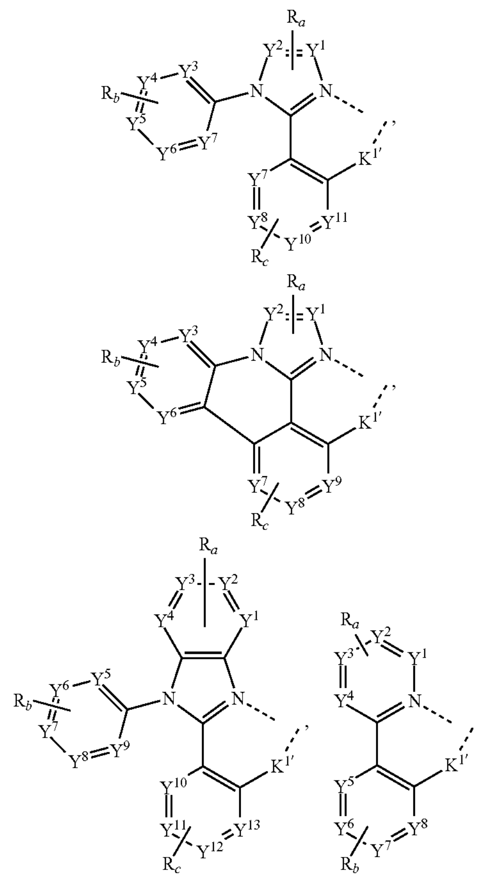

-continued
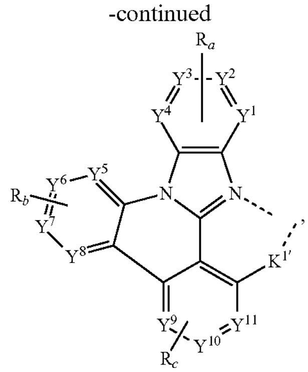
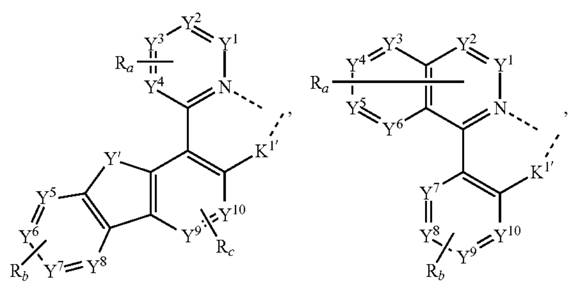
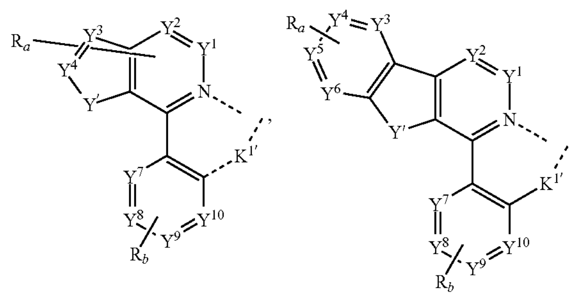
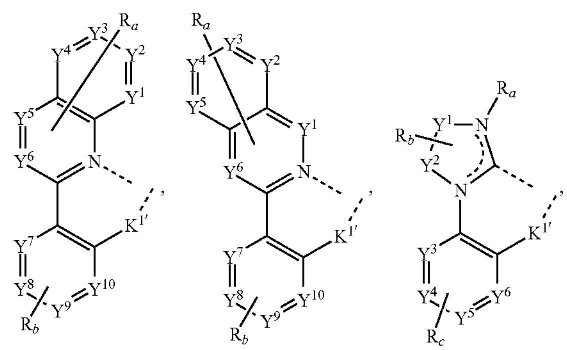
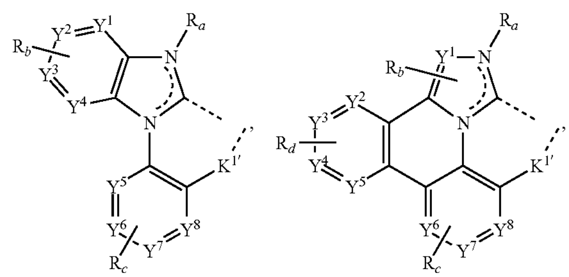
-continued
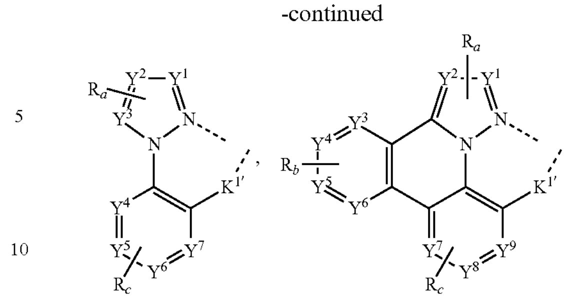
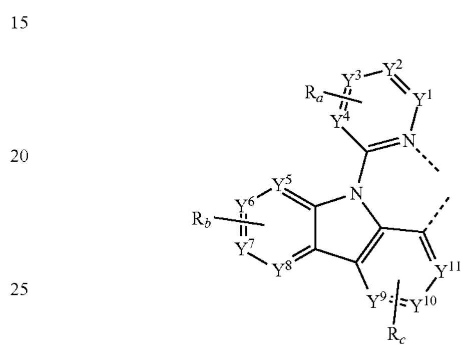
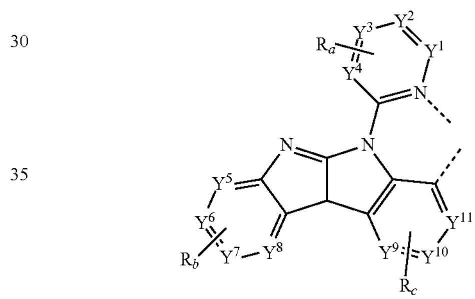
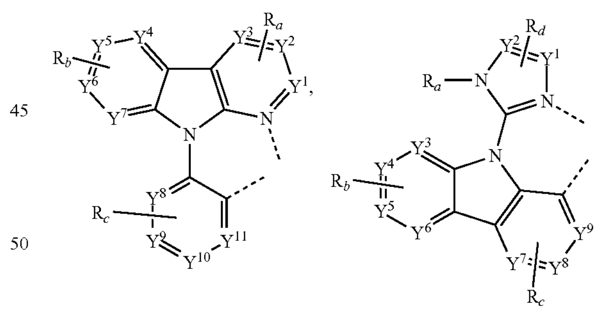
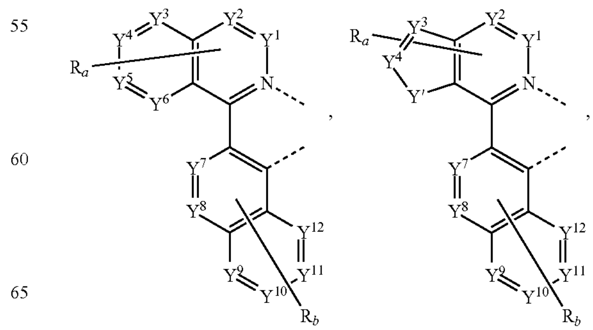

-continued

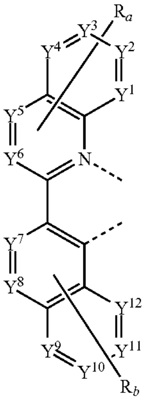

,

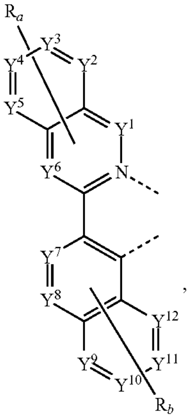

,

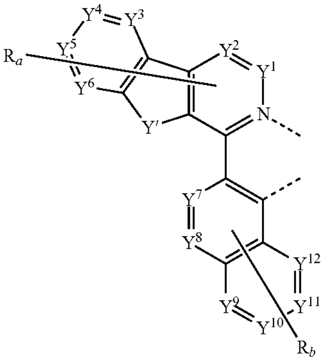

,

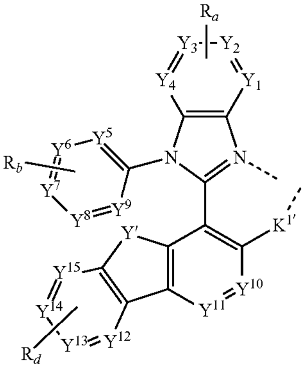

,

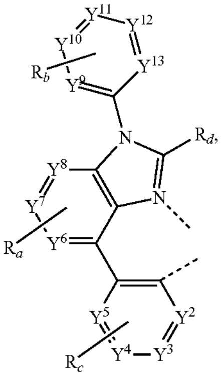

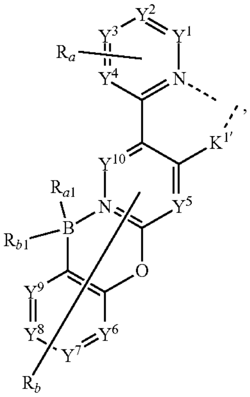

,

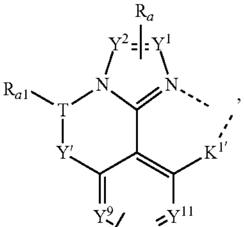

,

-continued

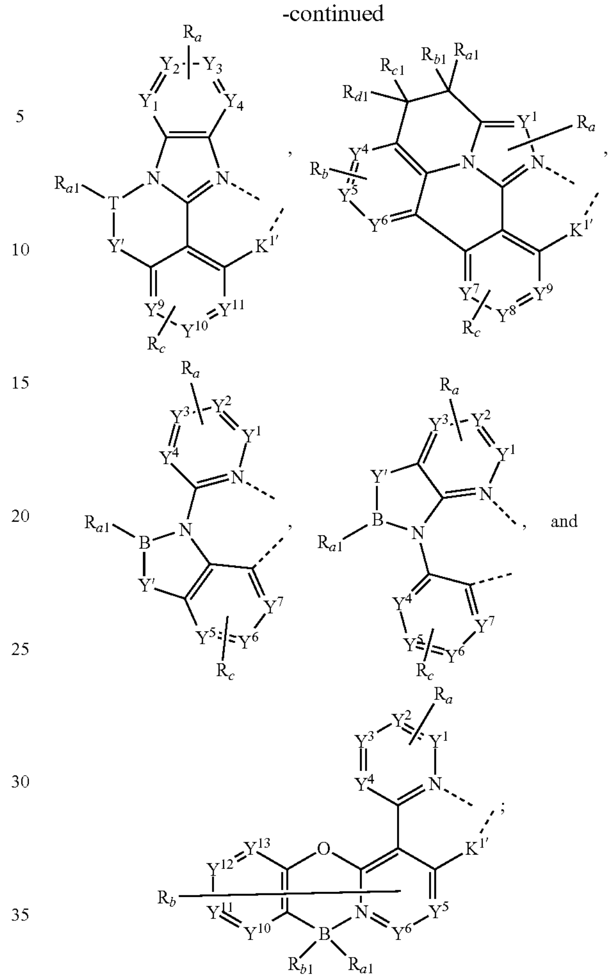

and wherein each $L^2$ and $L^3$ are independently selected from the group consisting of

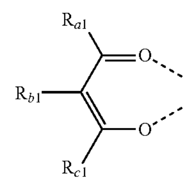

and the structures of LIGAND LIST; wherein:

M is selected from the group consisting of Ir, Rh, Re, Ru, Os, Pt, Pd, Zn, Au, Ag, and Cu;

T is selected from the group consisting of B, Al, Ga, and In;

$K^{1'}$ is a direct bond or is selected from the group consisting of $NR_e$, $PR_e$, O, S, and Se;

each $Y^1$ to $Y^{15}$ are independently selected from the group consisting of carbon and nitrogen;

Y' is selected from the group consisting of $BR_e$, $NR_e$, $PR_e$, O, S, Se, C═O, S═O, $SO_2$, $CR_eR_f$, $SiR_eR_f$, and $GeR_eR_f$;

each $R_a$, $R_b$, $R_c$, and $R_d$ can independently represent from mono to the maximum possible number of substitutions, or no substitution;

each $R_{a1}$, $R_{b1}$, $R_{c1}$, $R_{d1}$, $R_a$, $R_b$, $R_c$, $R_d$, $R_e$, and $R_f$ is independently a hydrogen or a substituent selected from the group consisting of the general substituents as defined herein; and wherein any two substituents can be fused or joined to form a ring or form a multidentate ligand.

In some embodiments, the emitter material is selected from the group consisting of the following Dopant Group 1:

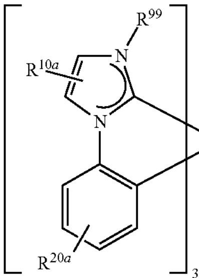
,
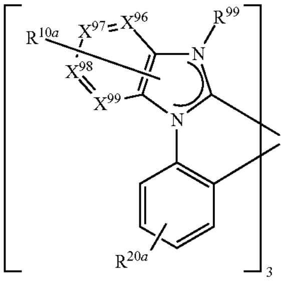
,

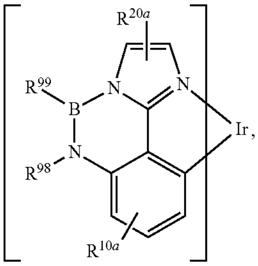

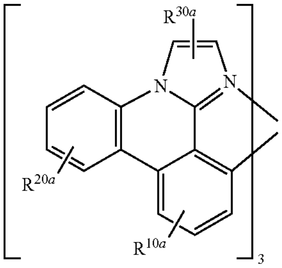
,
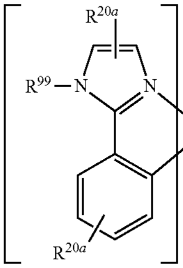
,

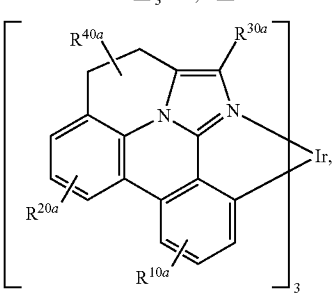

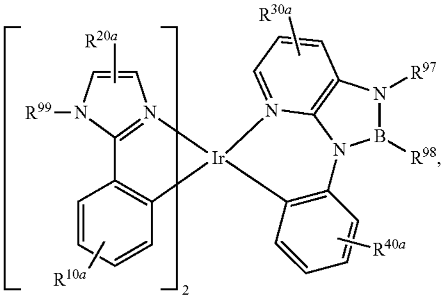

-continued

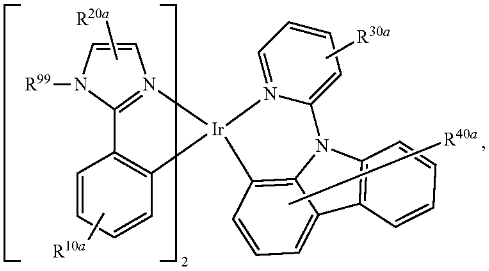

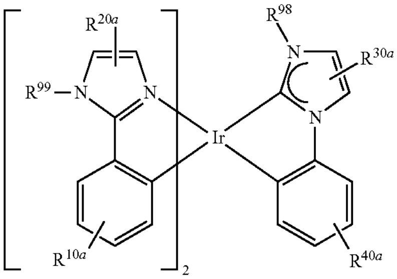

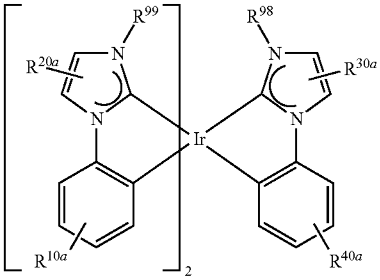

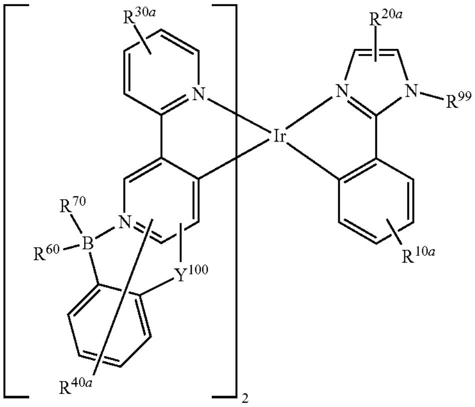

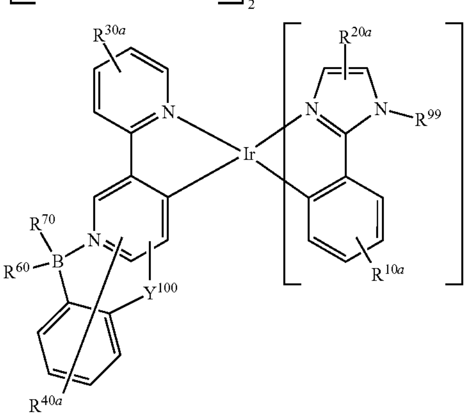
,

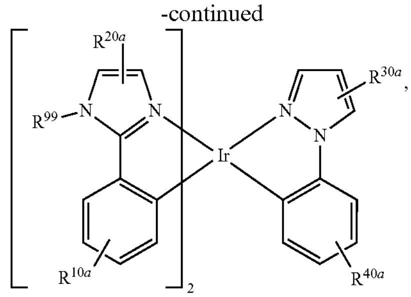
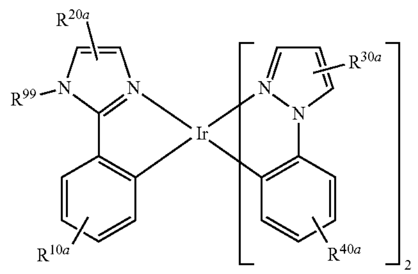
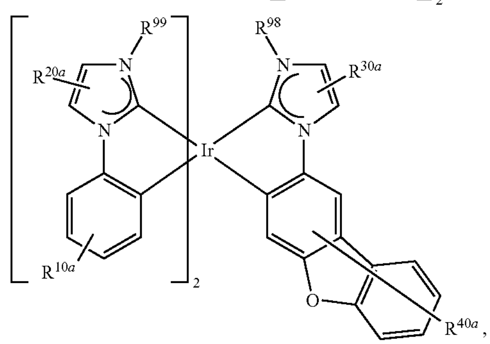
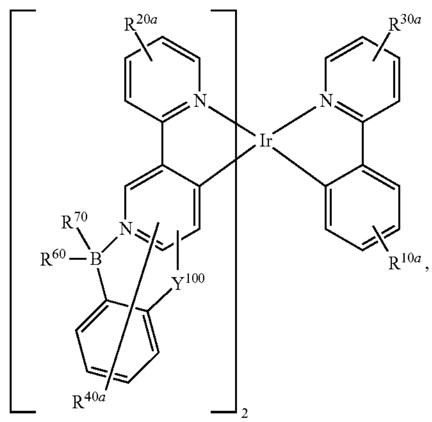
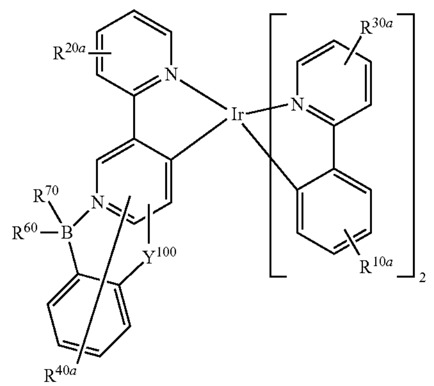
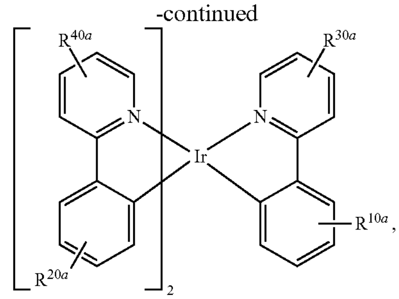
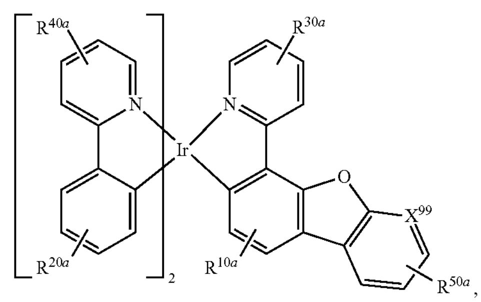
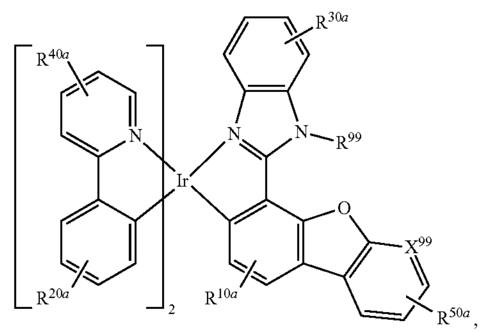
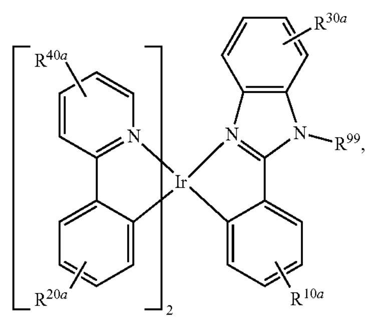
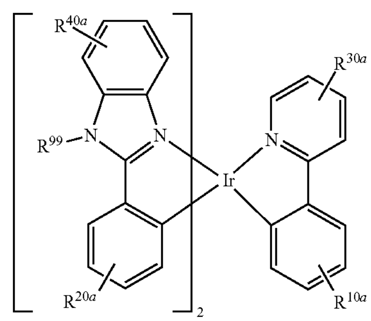

-continued
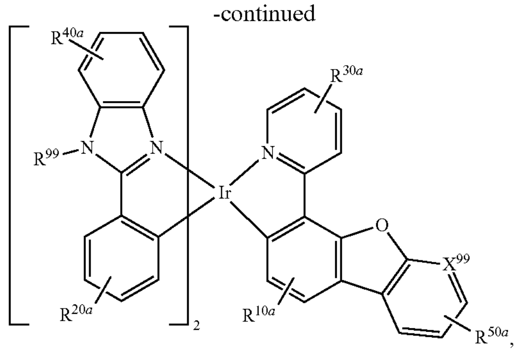
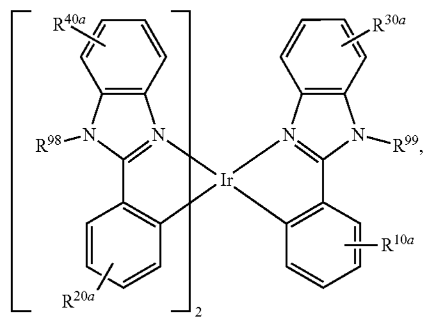
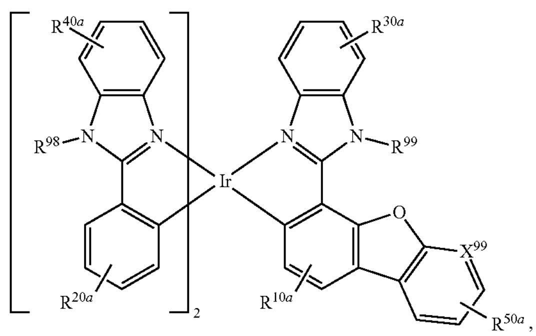
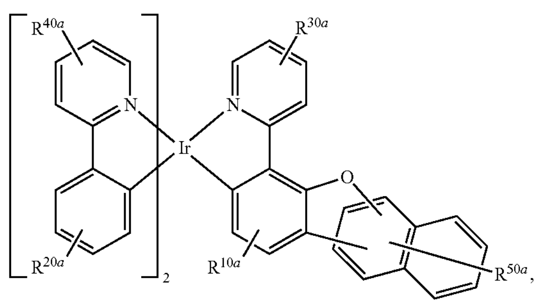
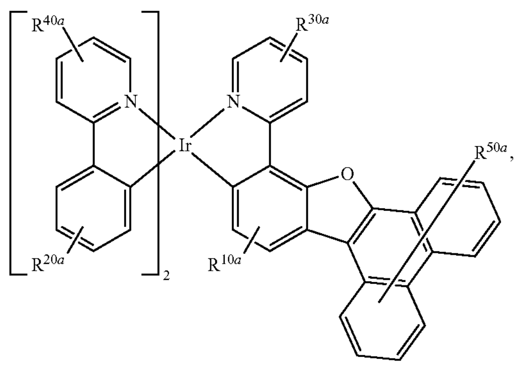
-continued
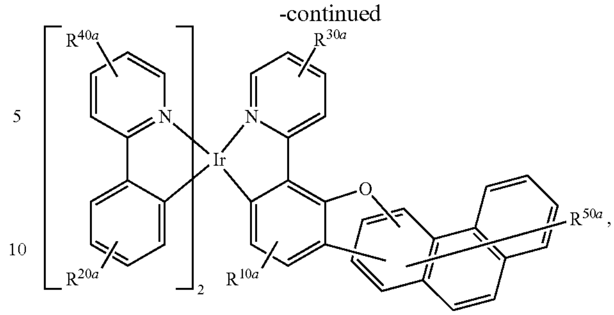
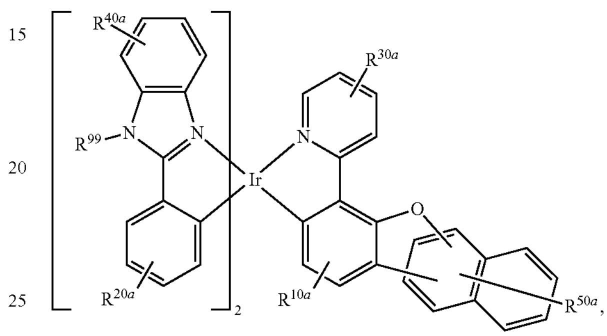
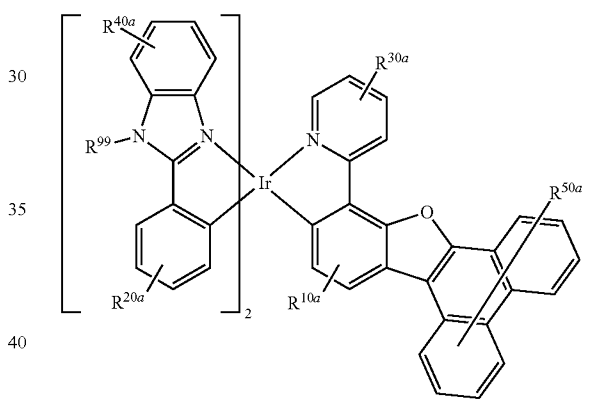
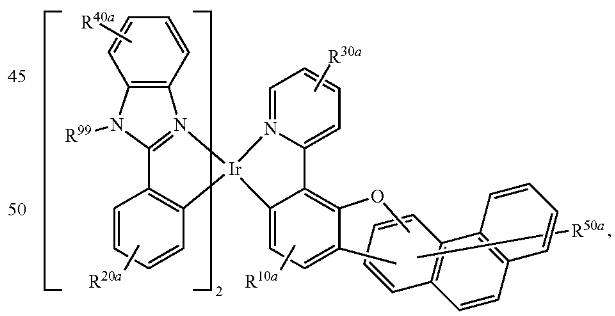
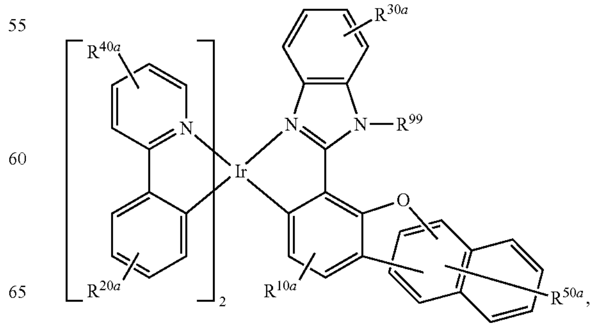

-continued
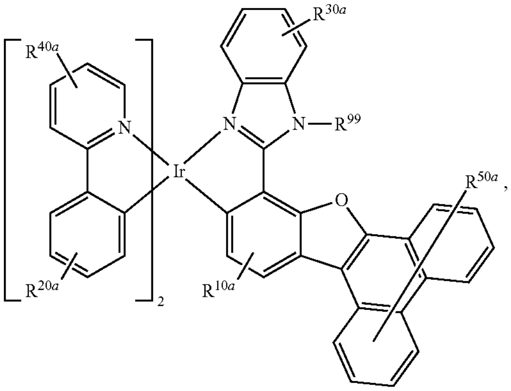
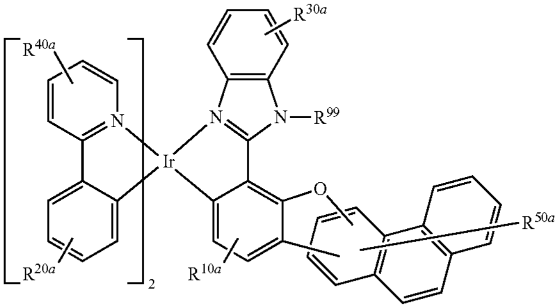
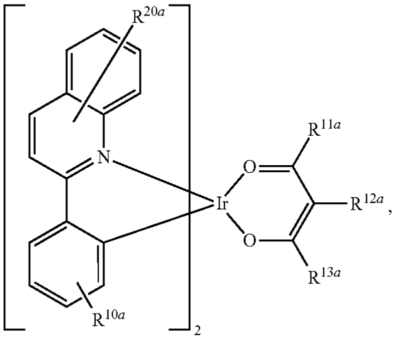
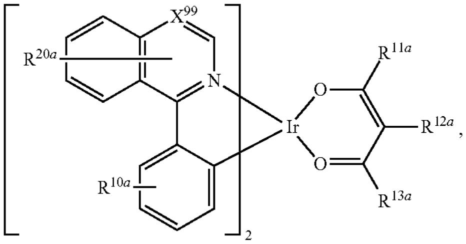
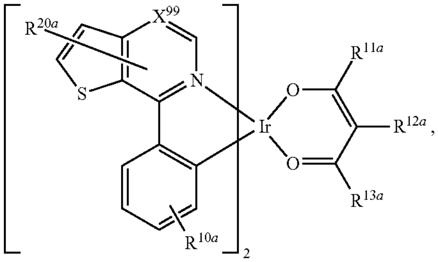
-continued
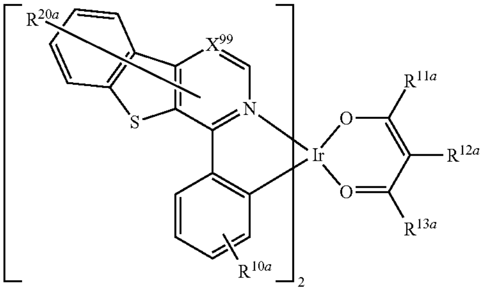
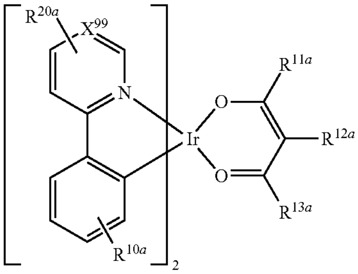
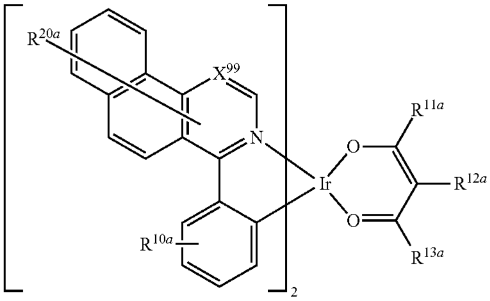
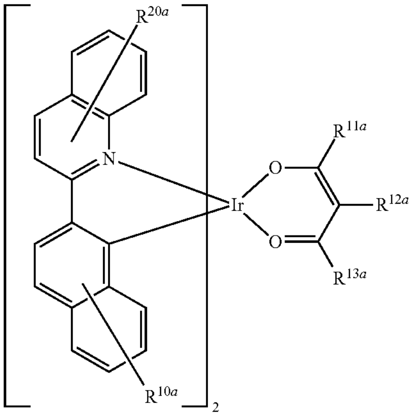
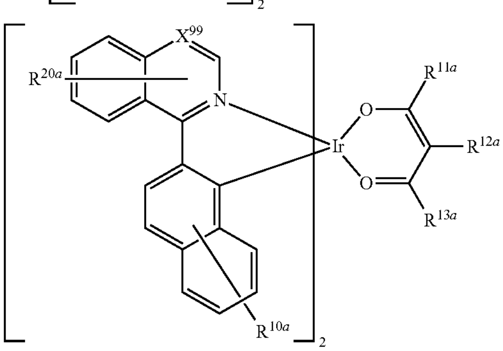

-continued

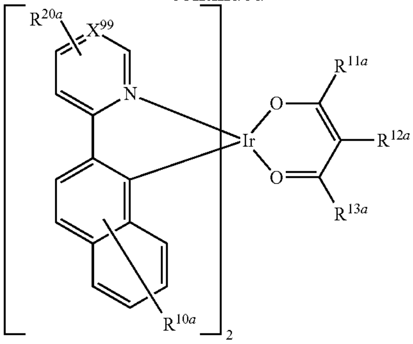

,

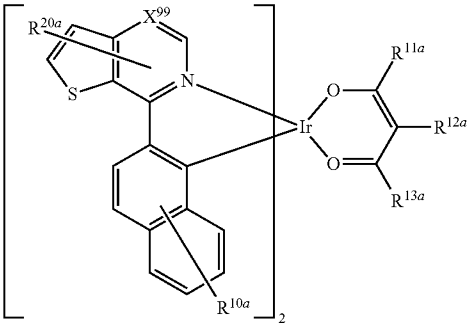

,

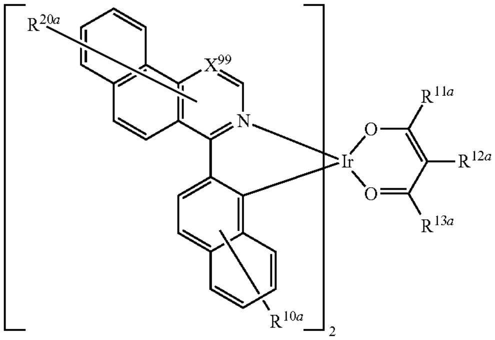

, and

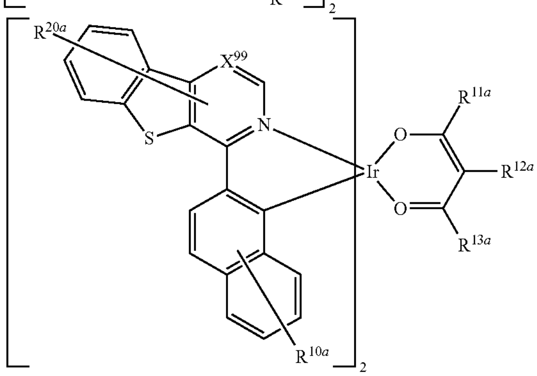

, wherein each of $X^{96}$ to $X^{99}$ is independently C or N;

each $Y^{100}$ is independently selected from the group consisting of a NR", O, S, and Se;

each of $R^{10a}$, $R^{20a}$, $R^{30a}$, $R^{40a}$, and $R^{50a}$ independently represents mono substitution, up to the maximum substitutions, or no substitution;

each of R, R', R", $R^{10a}$, $R^{11a}$, $R^{12a}$, $R^{13a}$, $R^{20a}$, $R^{30a}$, $R^{40a}$, $R^{50a}$, $R^{60}$, $R^{70}$, $R^{97}$, $R^{98}$, and $R^{99}$ is independently a hydrogen or a substituent selected from the group consisting of the general substituents as defined herein; any two substituents can be joined or fused to form a ring.

In some embodiments, the emitter material is selected from the group consisting of the following Dopant Group 2:

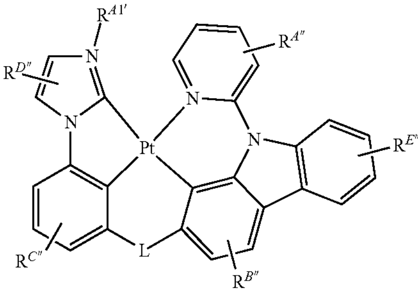

,

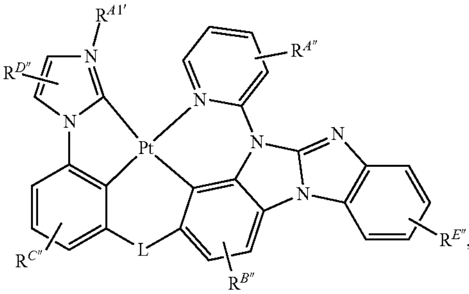

,

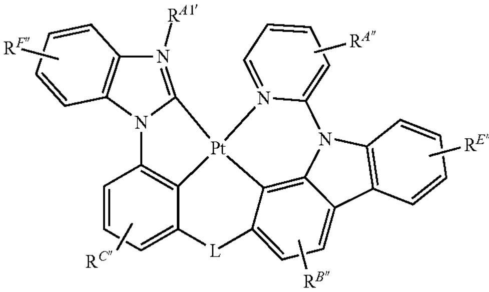

,

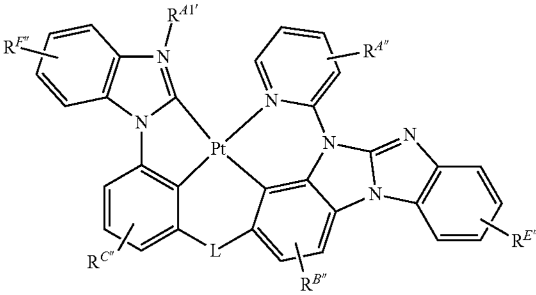

,

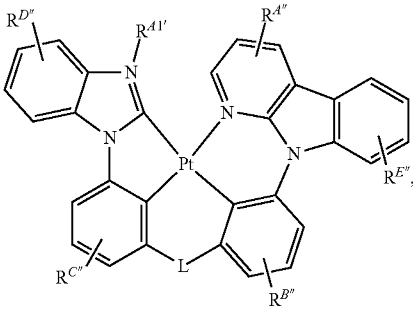

,

-continued
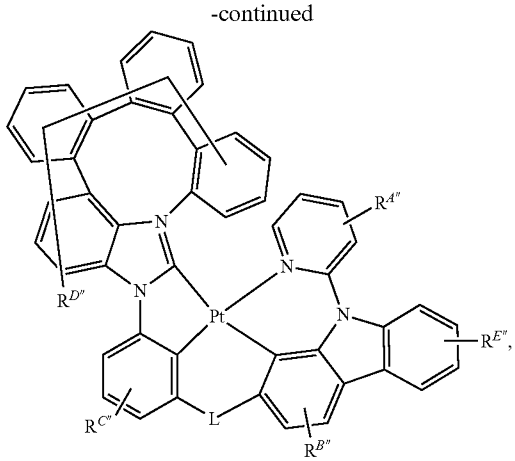
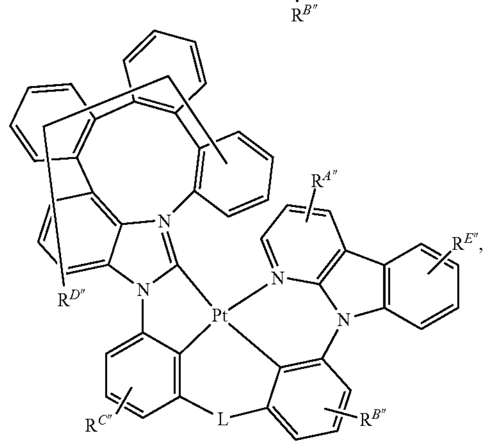
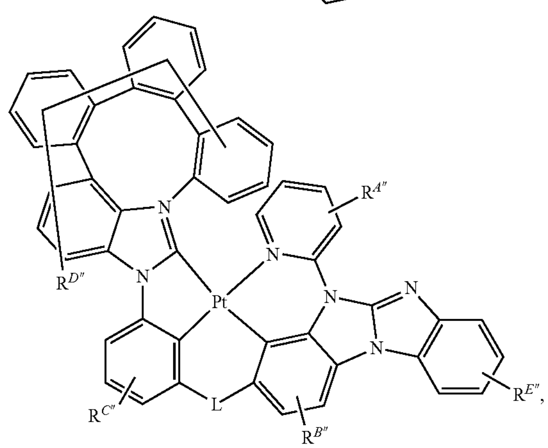
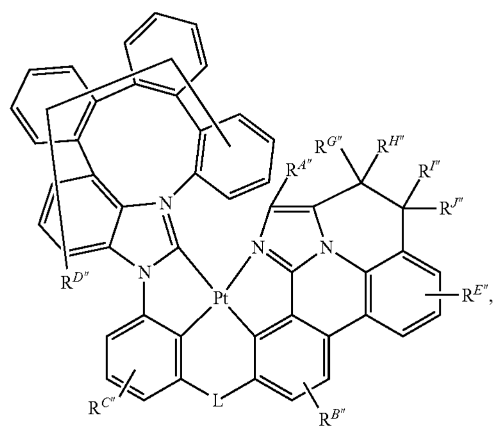
-continued
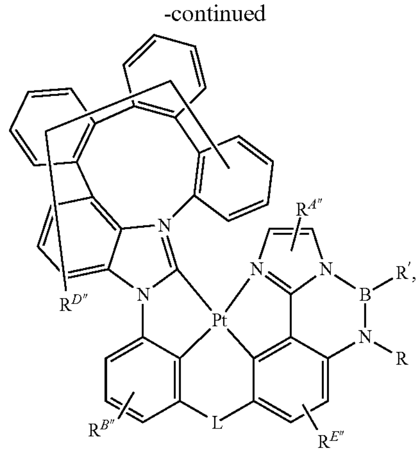
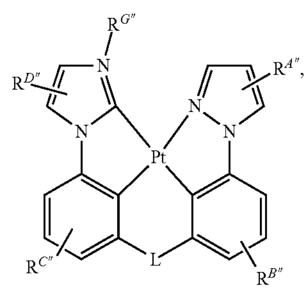
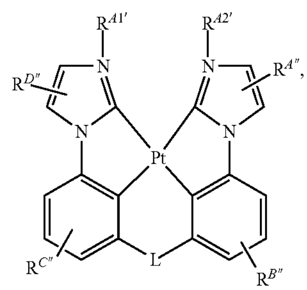
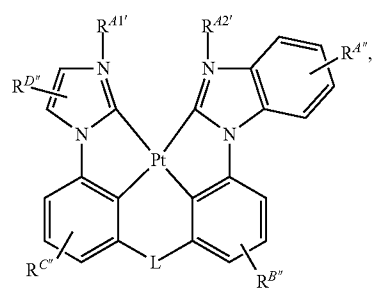
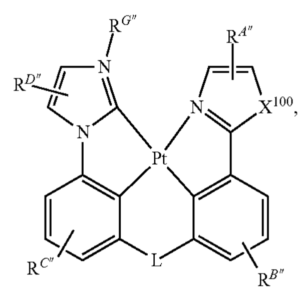

-continued
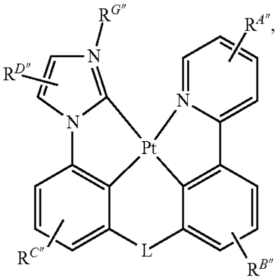
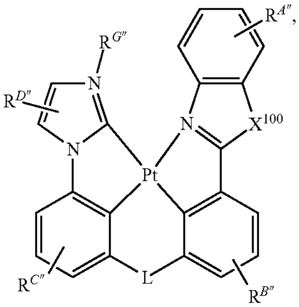
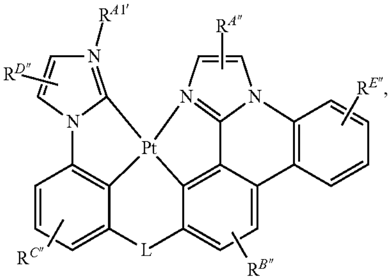
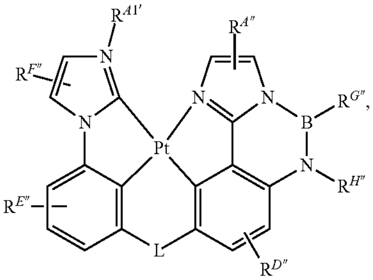
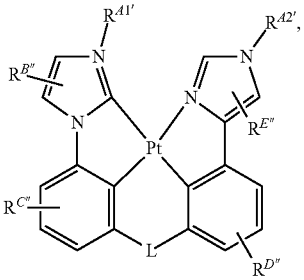
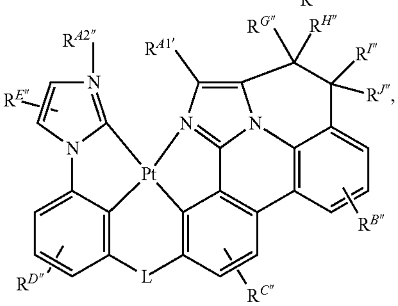
-continued
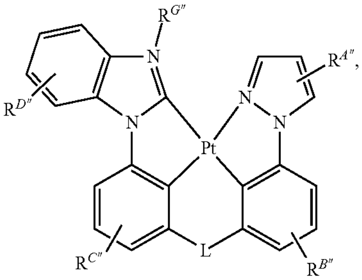
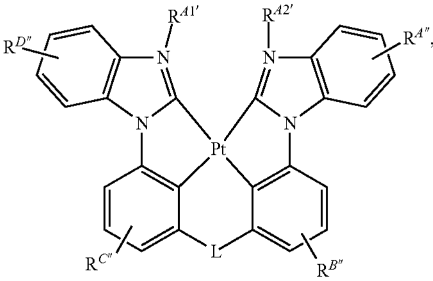
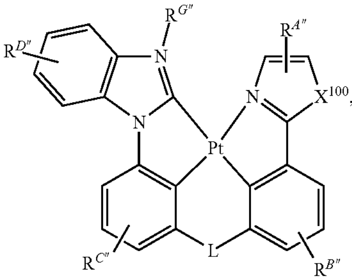
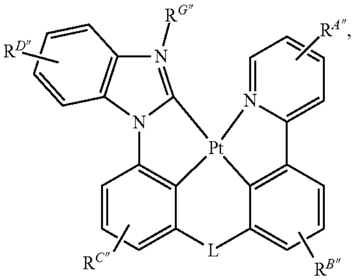
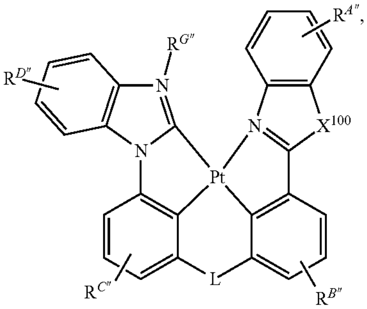

-continued
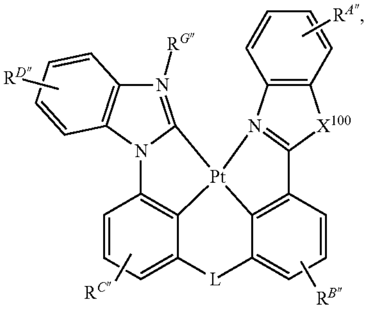
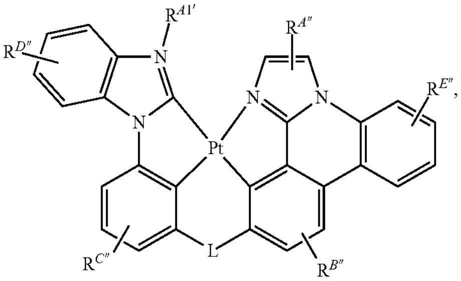
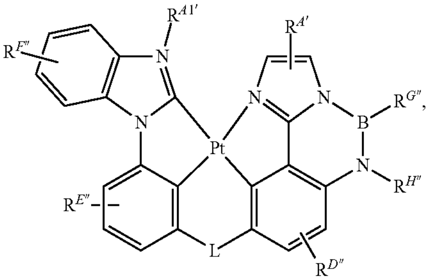
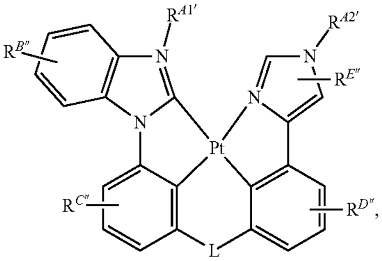
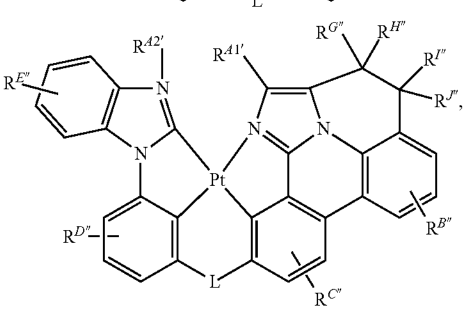
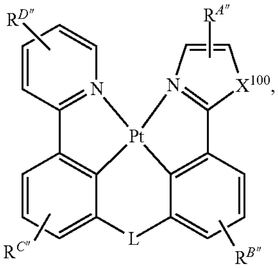
-continued
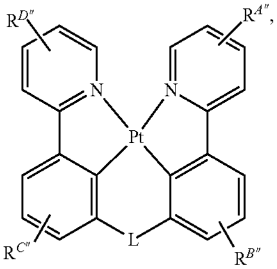
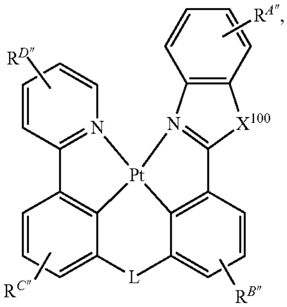
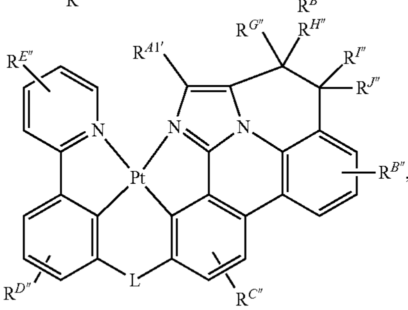
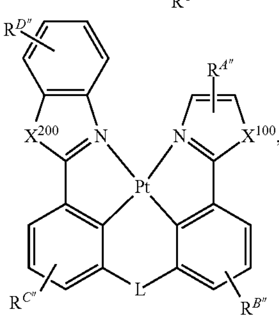
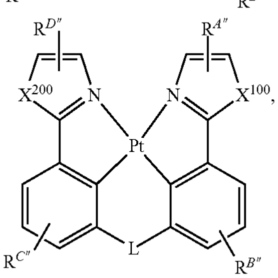
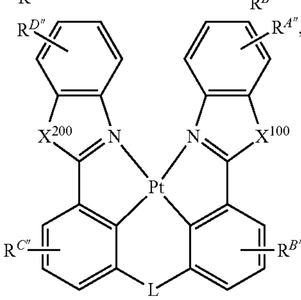

-continued
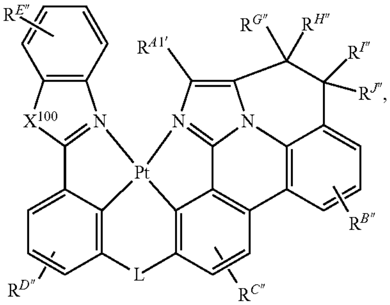
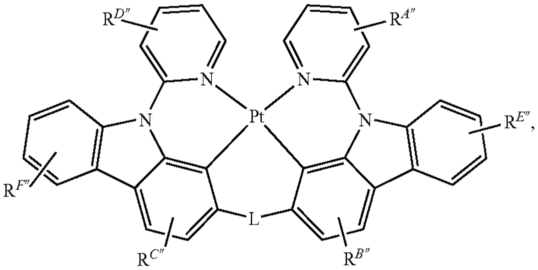
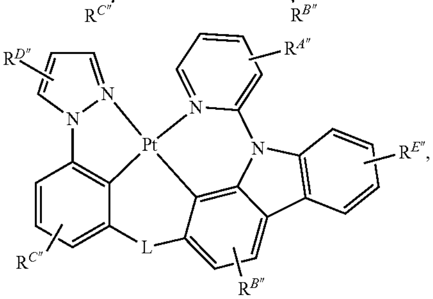
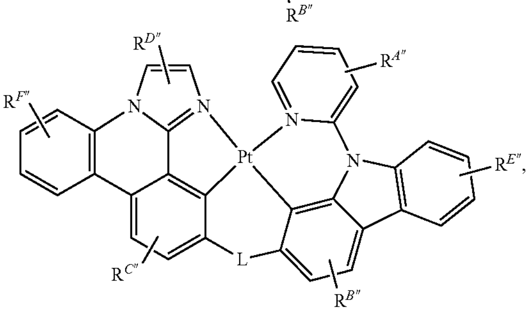
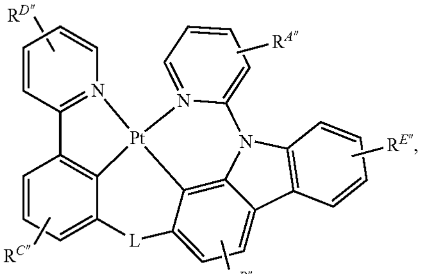
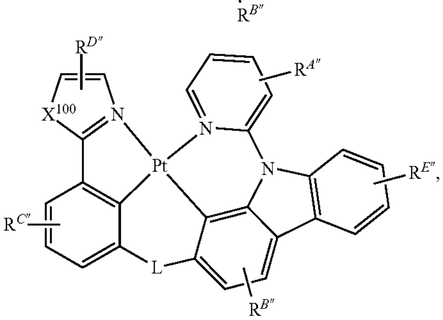
-continued
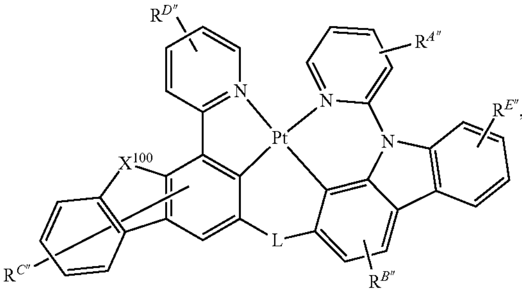
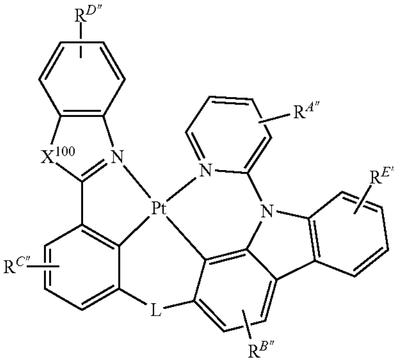
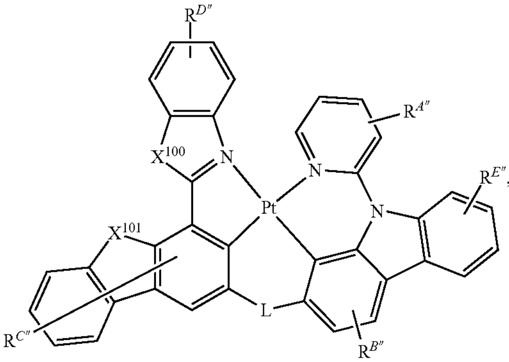
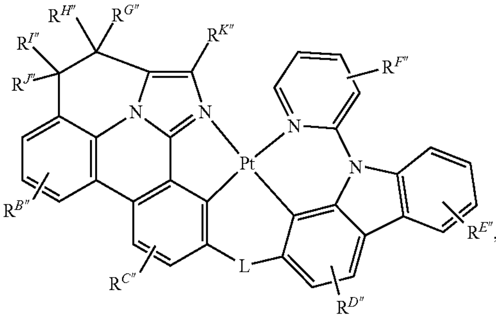
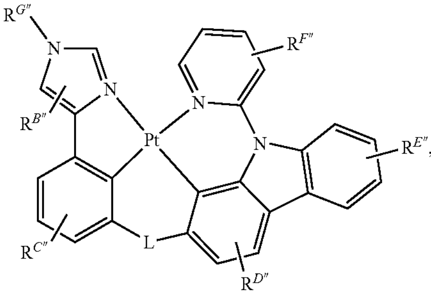

-continued
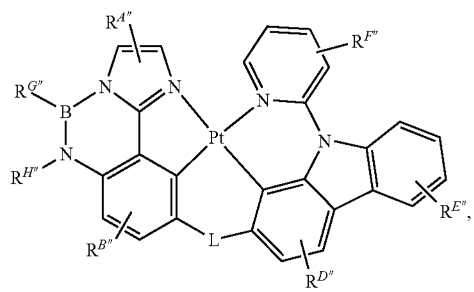
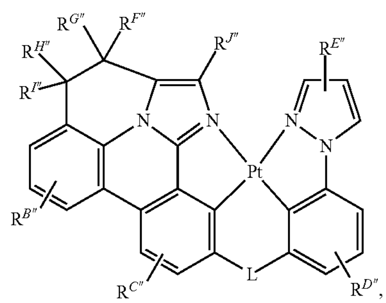
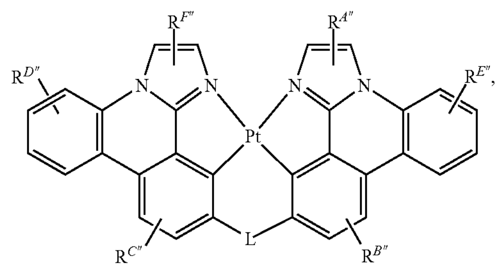
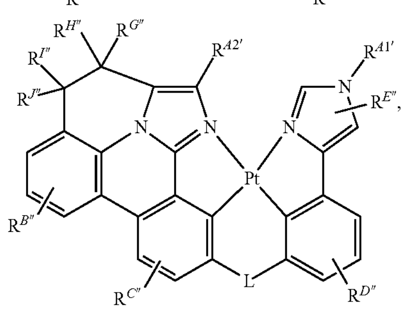
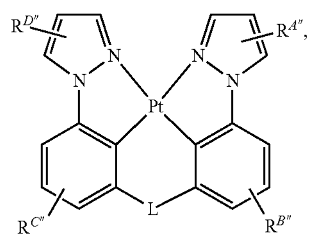
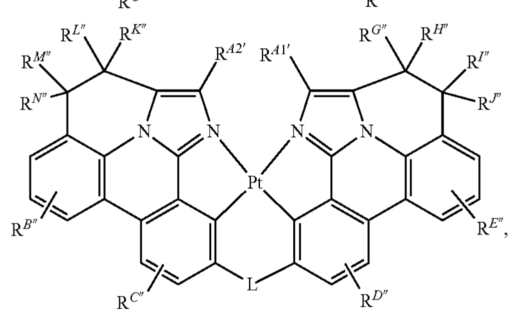
-continued
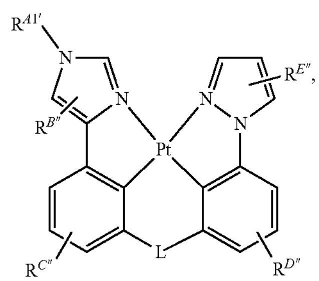
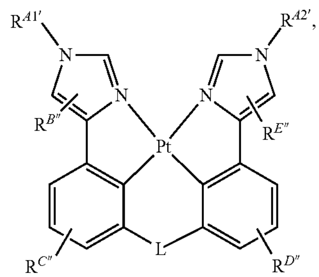
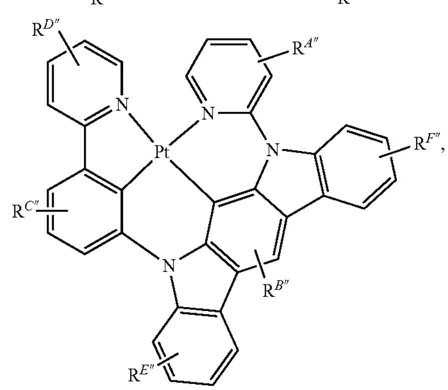
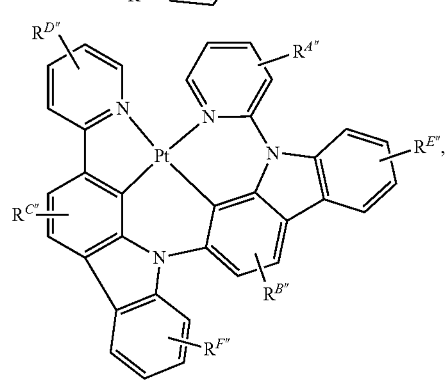
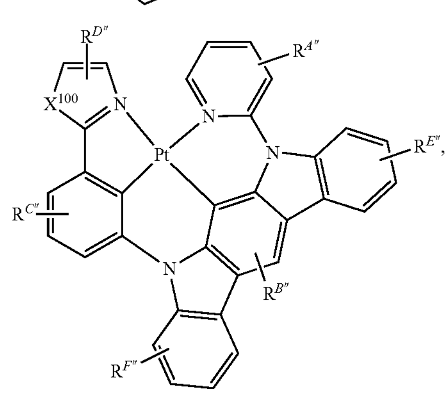

-continued
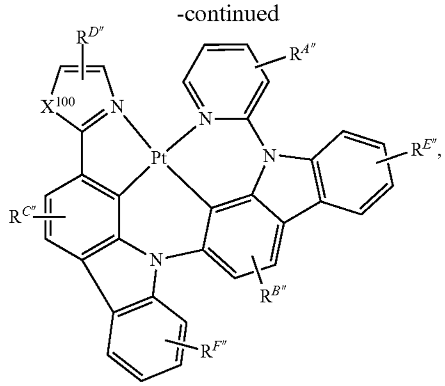
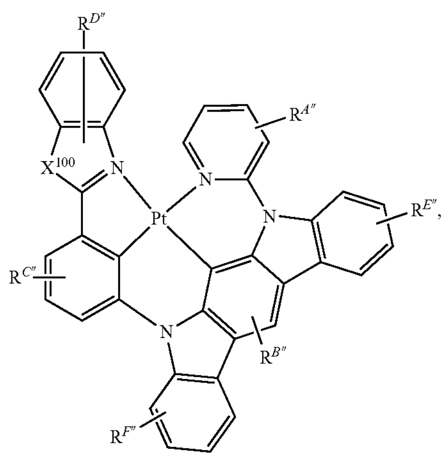
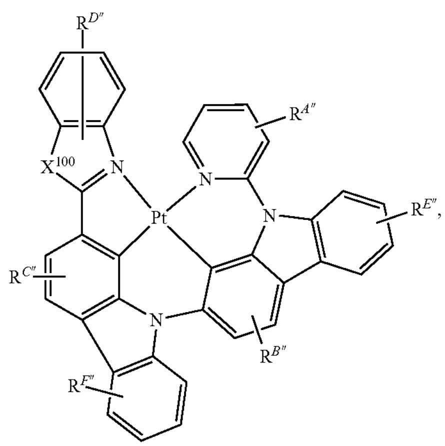
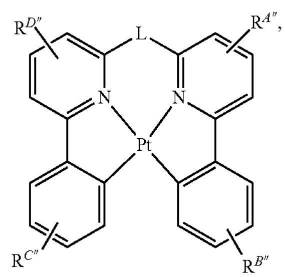
-continued
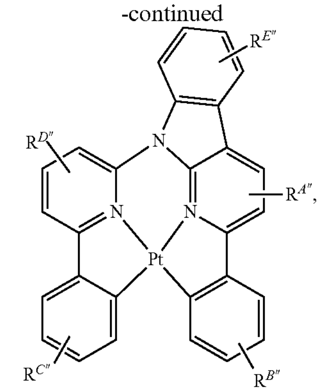
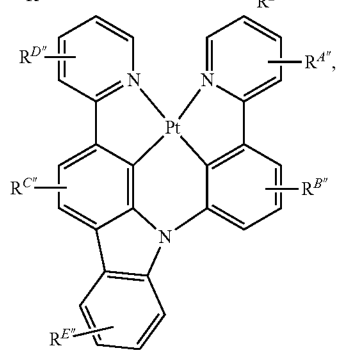
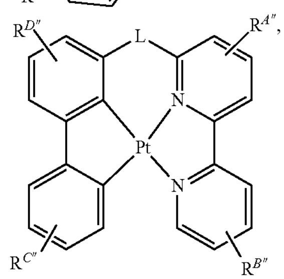
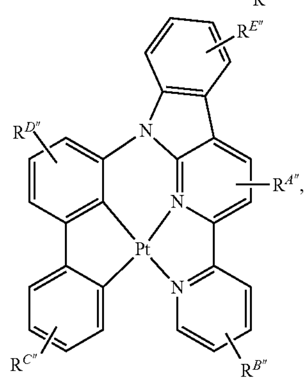
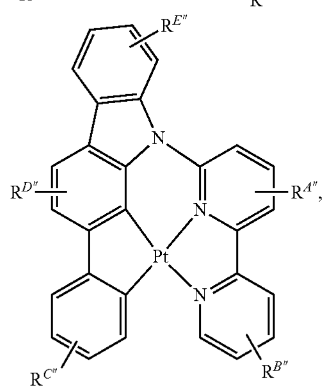

-continued
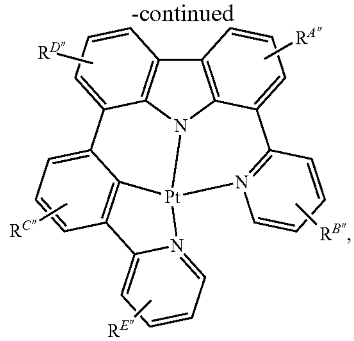
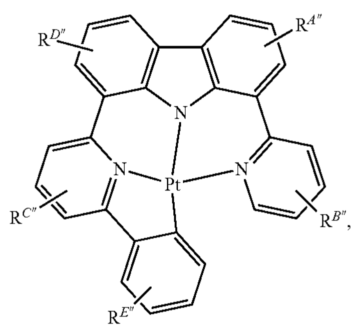
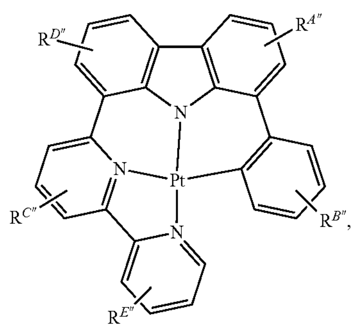
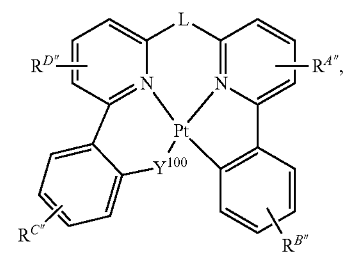
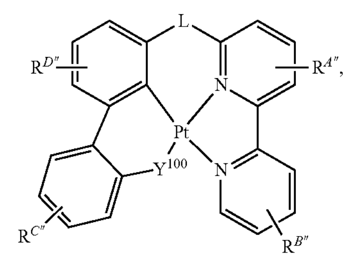
-continued
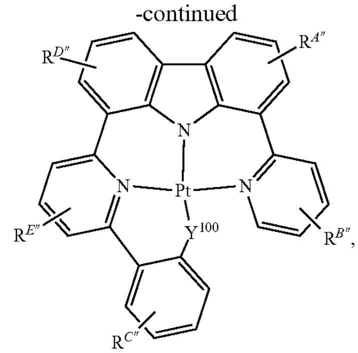
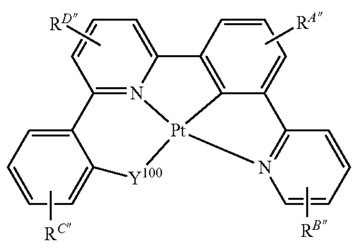
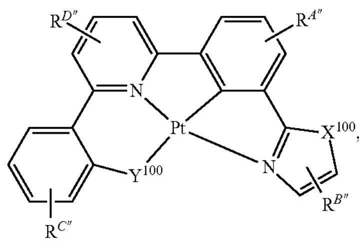
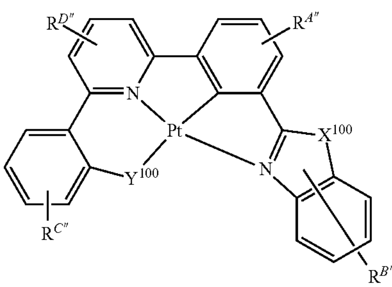
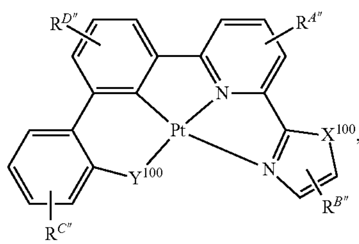
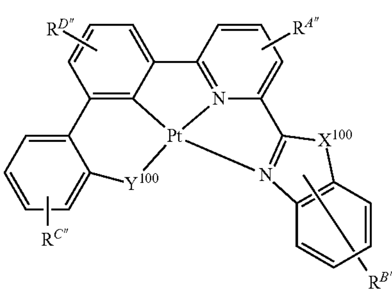

-continued

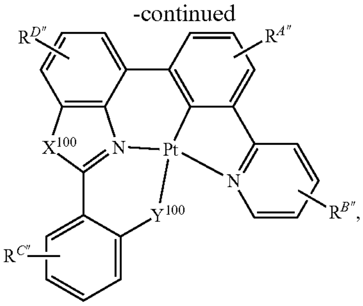

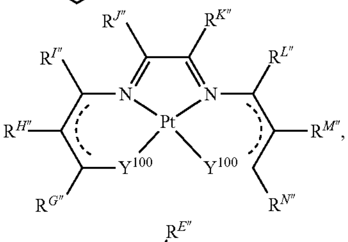

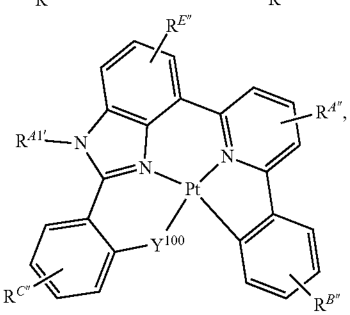

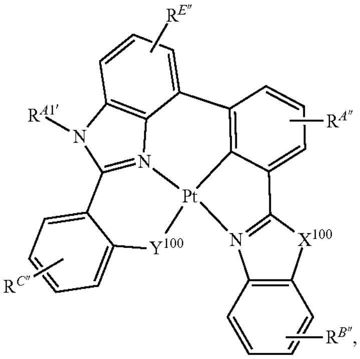

and

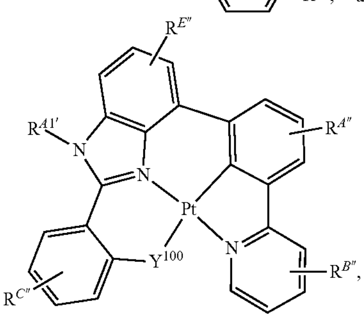

wherein:

each $Y^{100}$ is independently selected from the group consisting of a NR", O, S, and Se;

L is independently selected from the group consisting of a direct bond, BR", BR"R"', NR", PR", O, S, Se, C=O, C=S, C=Se, C=NR", C=CR"R"', S=O, $SO_2$, CR", CR"R"', SiR"R"', GeR"R"', alkyl, cycloalkyl, aryl, heteroaryl, and combinations thereof;

$X^{100}$ and $X^{200}$ for each occurrence is selected from the group consisting of O, S, Se, NR", and CR"R";

each $R^{A''}$, $R^{B''}$, $R^{C''}$, $R^{D''}$, $R^{E''}$, and $R^{F''}$ independently represents mono-, up to the maximum substitutions, or no substitutions;

each of R, R', R", R"', $R^{A1'}$, $R^{A2'}$, $R^{A''}$, $R^{B''}$, $R^{C''}$, $R^{D''}$, $R^{E''}$, $R^{F''}$, $R^{G''}$, $R^{H''}$, $R^{I''}$, $R^{J''}$, $R^{K''}$, $R^{L''}$, $R^{M''}$, and $R^{N''}$ is independently a hydrogen or a substituent selected from the group consisting of the general substituents as defined herein; any two substituents can be joined or fused to form a ring;

In some embodiments of the above Dopant Groups 1 and 2, each unsubstituted aromatic carbon atom can be replaced with N to form an aza-ring. In some embodiments, the maximum number of N atom in one ring is 1 or 2. In some embodiments of the above Dopant Groups 2, Pt atom in each formula can be replaced by Pd atom.

In some embodiments of the OLED, the delayed fluorescence material comprises at least one donor group and at least one acceptor group. In some embodiments, the delayed fluorescence material is a metal complex. In some embodiments, the delayed fluorescence material is a non-metal complex. In some embodiments, the delayed fluorescence material is a Zn, Cu, Ag, or Au complex.

In some embodiments of the OLED, the delayed fluorescence material has the formula of $M(L^5)(L^6)$, wherein M is Cu, Ag, or Au, $L^5$ and $L^6$ are different, and $L^5$ and $L^6$ are independently selected from the group consisting of:

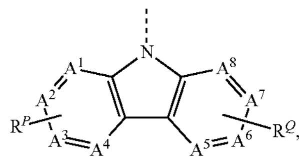

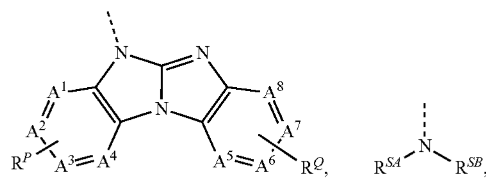

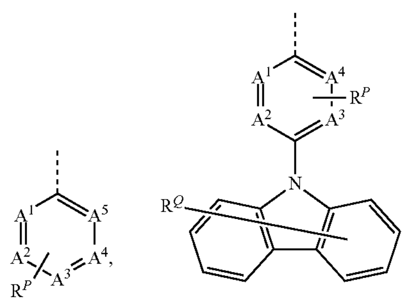

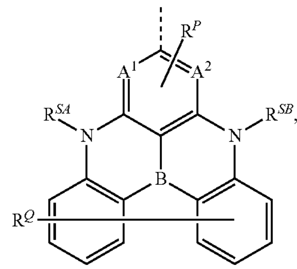

-continued

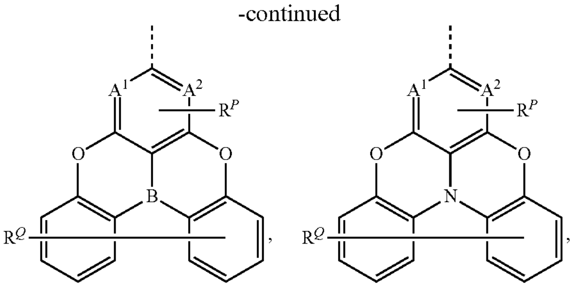

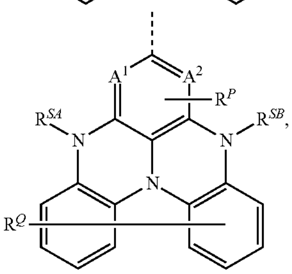

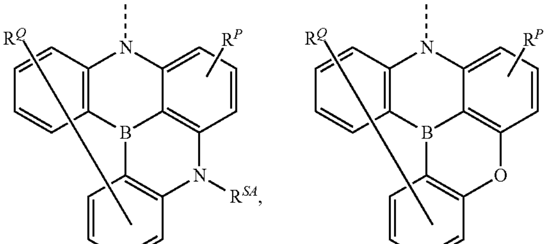

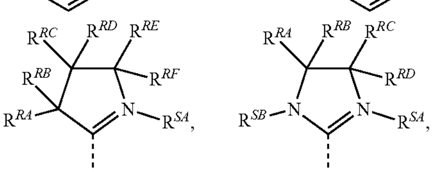

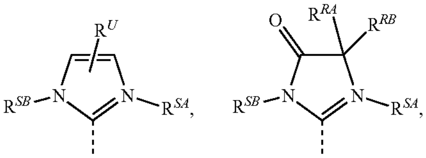

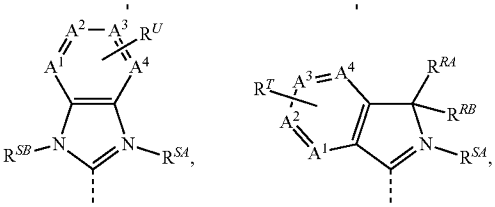

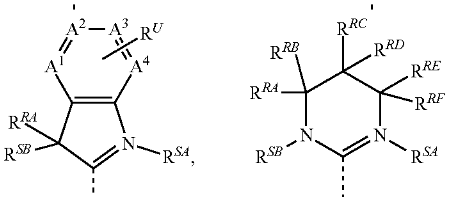

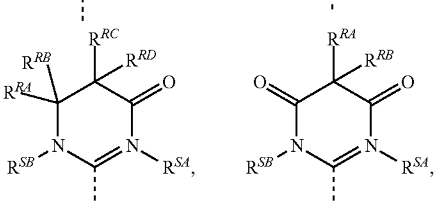

-continued

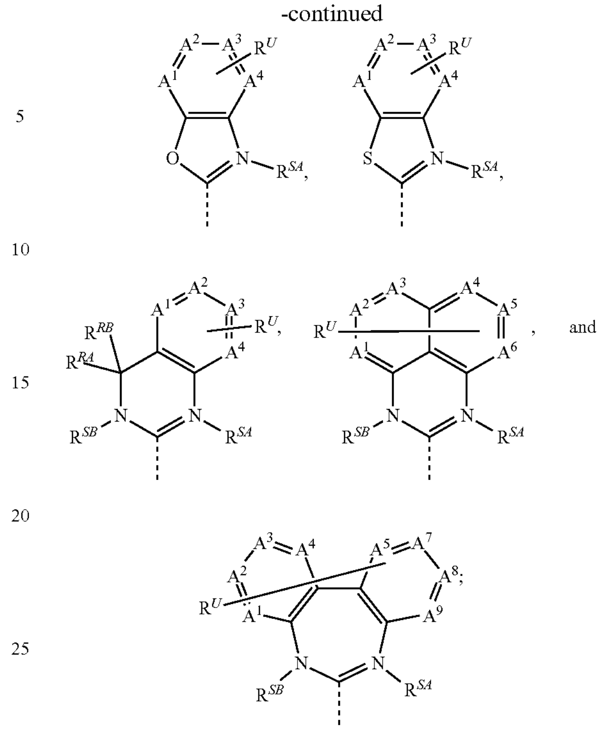

wherein $A^1$-$A^9$ are each independently selected from C or N;

each $R^P$, $R^Q$, and $R^U$ independently represents mono-, up to the maximum substitutions, or no substitutions;

wherein each $R^P$, $R^P$, $R^U$, $R^{SA}$, $R^{SB}$, $R^{RA}$, $R^{RB}$, $R^{RC}$, $R^{RD}$, $R^{RE}$, and $R^{RF}$ is independently a hydrogen or a substituent selected from the group consisting of the general substituents as defined herein; any two substituents can be joined or fused to form a ring.

In some embodiments of the OLED, the delayed fluorescence material comprises at least one of the donor moieties selected from the group consisting of:

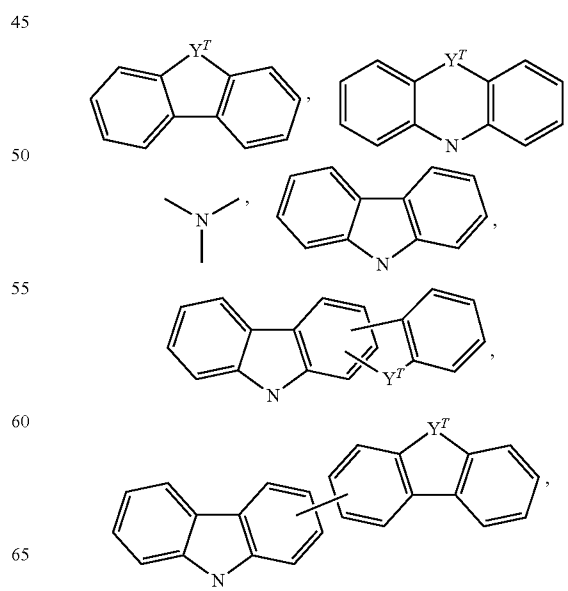

-continued

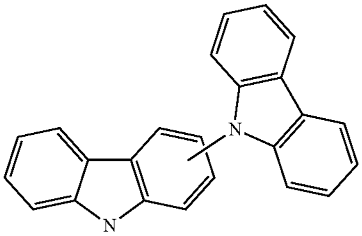
,

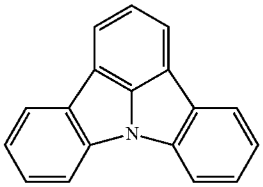
,

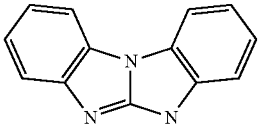
,

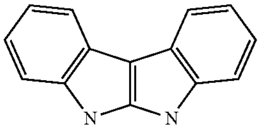
,

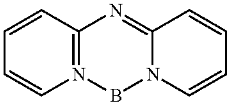
,

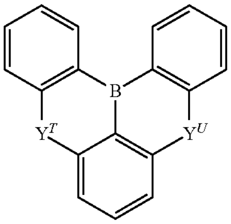
,

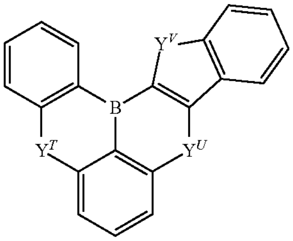
,

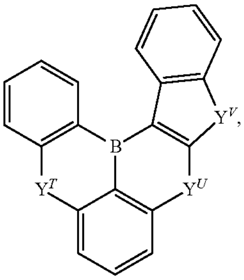

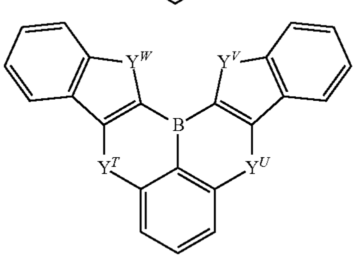
,

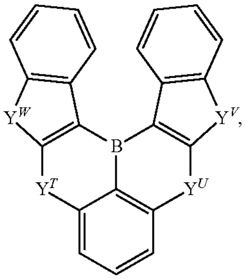

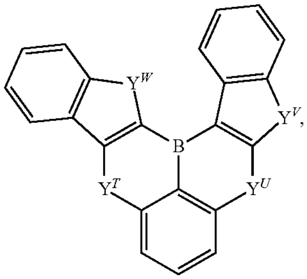

-continued

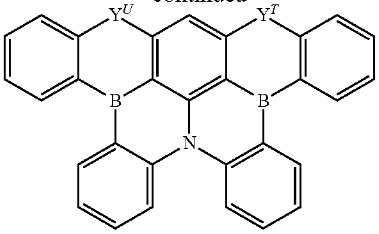
,

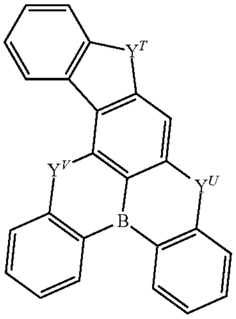

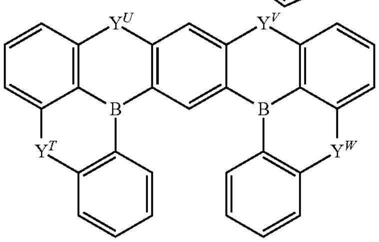
, and

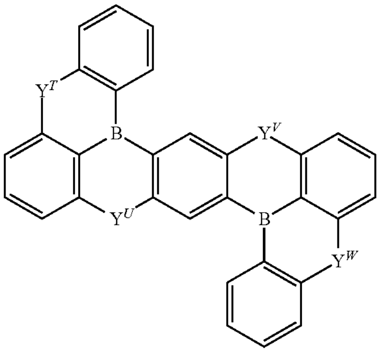
;

wherein $Y^T$, $Y^U$, $Y^V$, and $Y^W$ are each independently selected from the group consisting of B, C, Si, Ge, N, P, O, S, Se, C═O, S═O, and $SO_2$.

In some of the above embodiments, any carbon ring atoms up to maximum of a total number of three, together with their substituents, in each phenyl ring of any of above structures can be replaced with N.

In some embodiments, the delayed fluorescence material comprises at least one of the acceptor moieties selected from the group consisting of nitrile, isonitrile, borane, fluoride, pyridine, pyrimidine, pyrazine, triazine, aza-carbazole, aza-dibenzothiophene, aza-dibenzofuran, aza-dibenzoselenophene, aza-triphenylene, imidazole, pyrazole, oxazole, thiazole, isoxazole, isothiazole, triazole, thiadiazole, and oxadiazole. In some embodiments, the acceptor moieties and the donor moieties as described herein can be connected directly, through a conjugated linker, or a non-conjugated linker, such as a $sp^3$ carbon or silicon atom.

In some embodiments, the fluorescent material comprises at least one of the chemical moieties selected from the group consisting of:

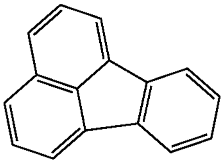,
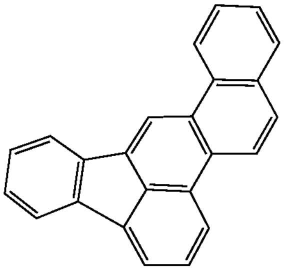,
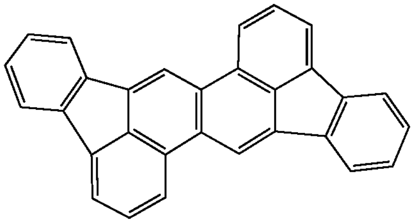,
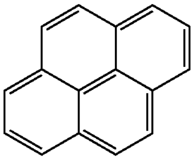,
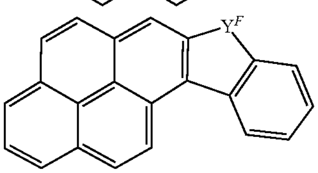,
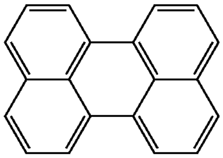,
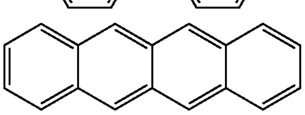,
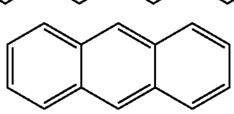,
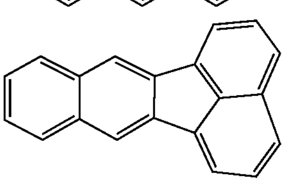,
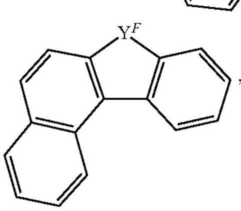,
-continued
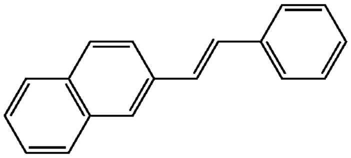,
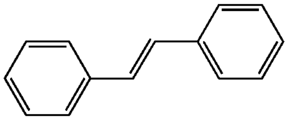,
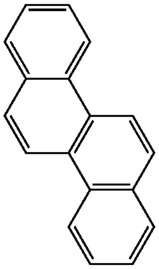,
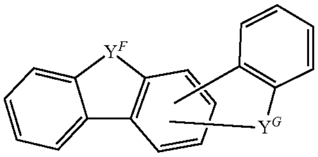,
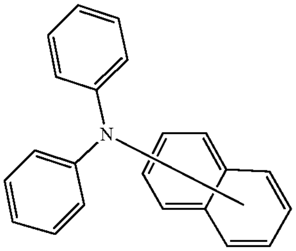,
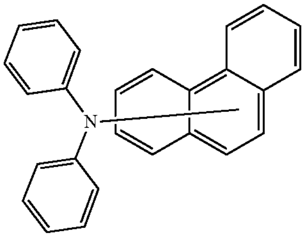,
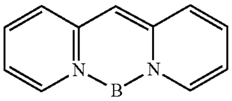,
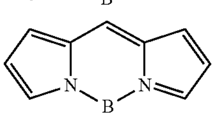,
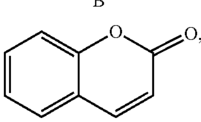,
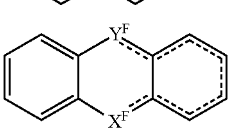, -continued
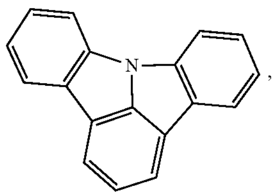
,
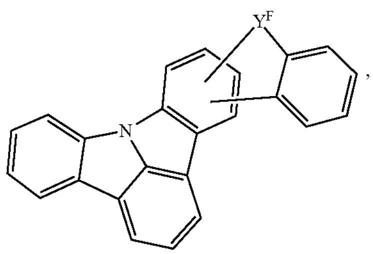
,
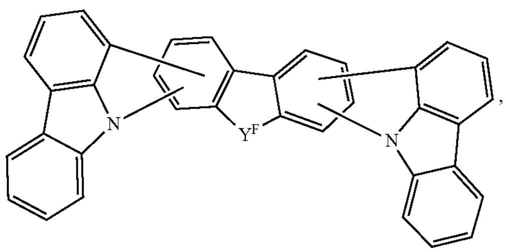
,
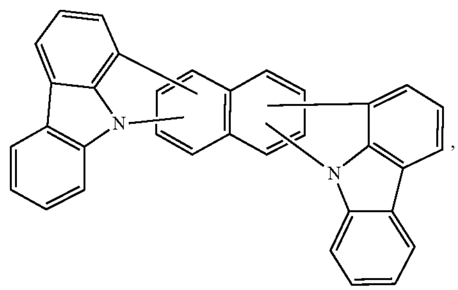
,
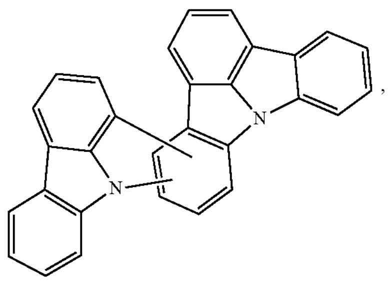
,
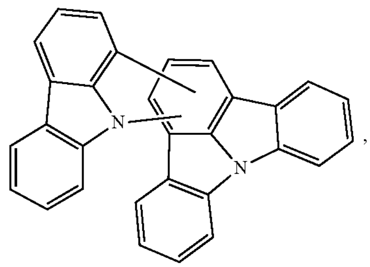
,
-continued
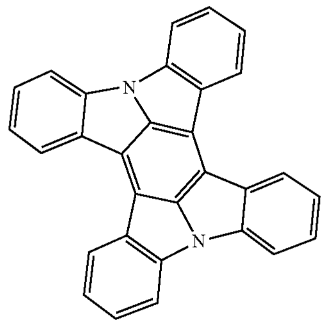
,
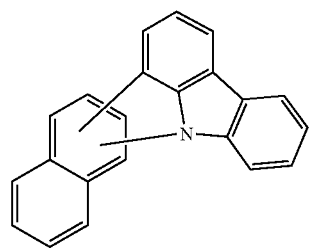
,
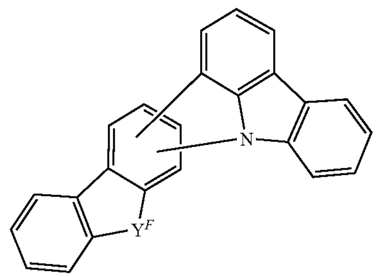
,
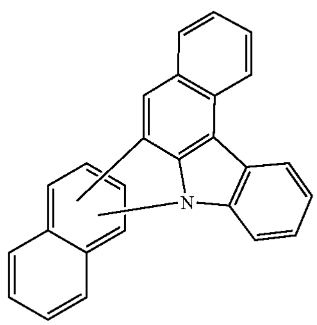
,
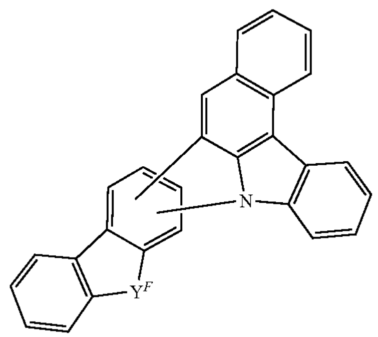
, -continued
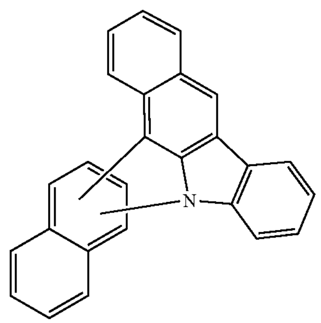
,
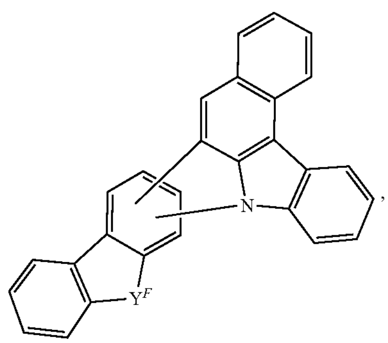
,
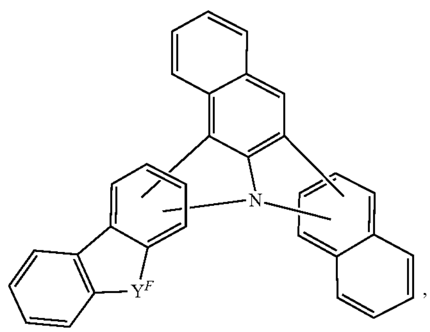
,
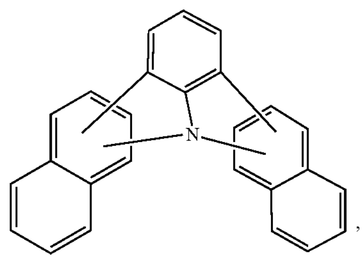
,
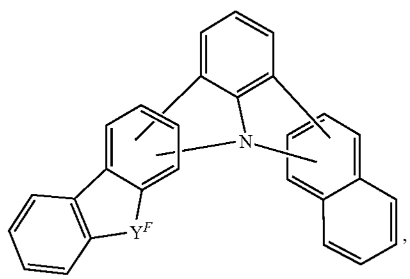
,
-continued
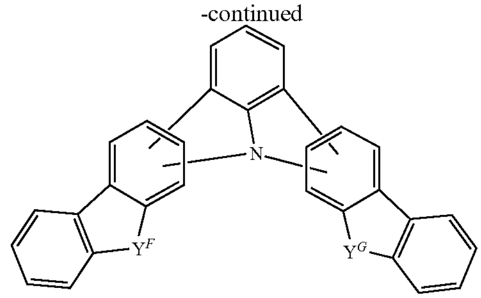
,
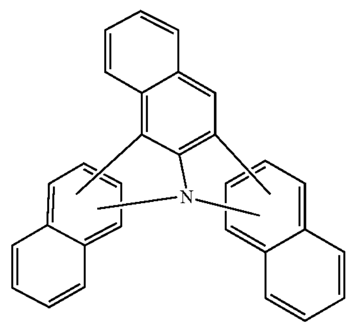
,
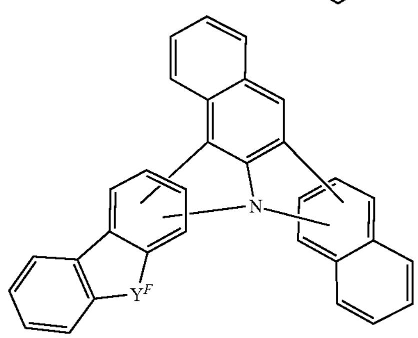
,
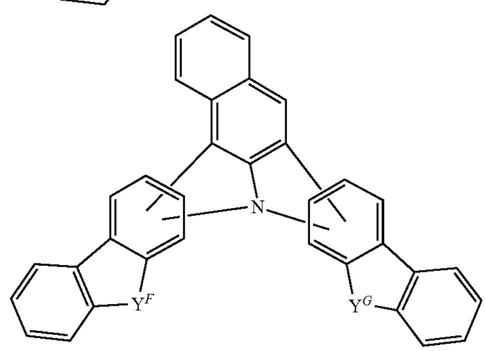
,
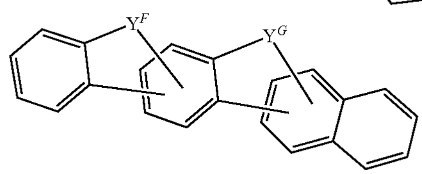
,
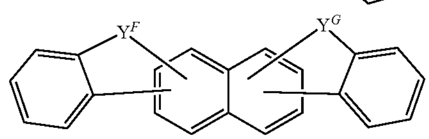
,
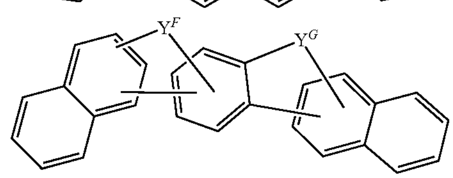
, -continued

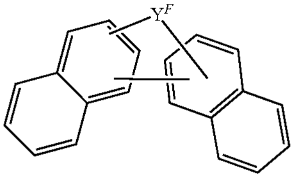,

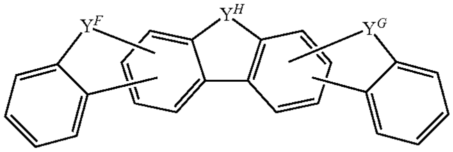,

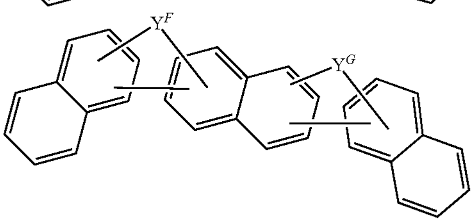,

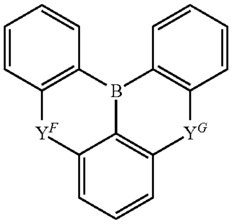,

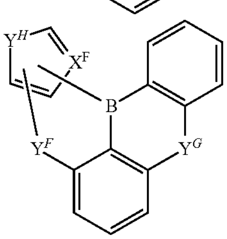

and

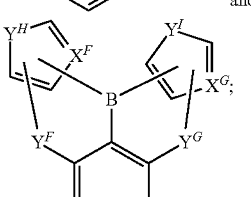

wherein $Y^F$, $Y^G$, $Y^H$, and $Y^I$ are each independently selected from the group consisting of B, C, Si, Ge, N, P, O, S, Se, C═O, S═O, and $SO_2$;

wherein $X^F$ and $X^G$ are each independently selected from the group consisting of C and N.

In some of the above embodiments, any carbon ring atoms up to maximum of a total number of three, together with their substituents, in each phenyl ring of any of above structures can be replaced with N.

f) HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further away from the vacuum level) and/or higher triplet energy than one or more of the emitters closest to the HBL interface.

In some embodiments, compound used in HBL contains the same molecule or the same functional groups used as host described above.

In some embodiments, compound used in HBL comprises at least one of the following moieties selected from the group consisting of:

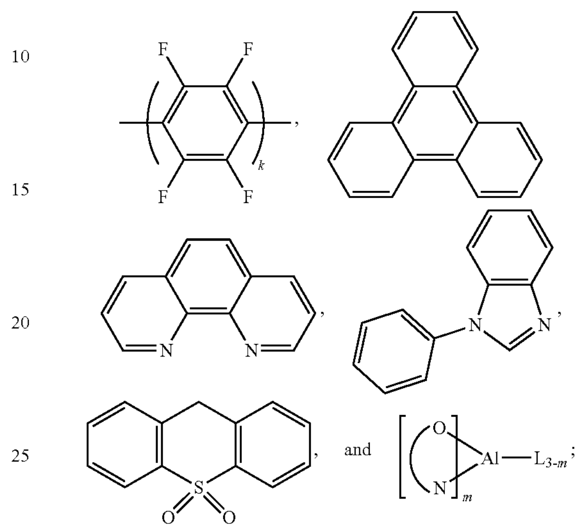

wherein k is an integer from 1 to 20; $L^{101}$ is another ligand, k' is an integer from 1 to 3.

g) ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In some embodiments, compound used in ETL comprises at least one of the following moieties in the molecule:

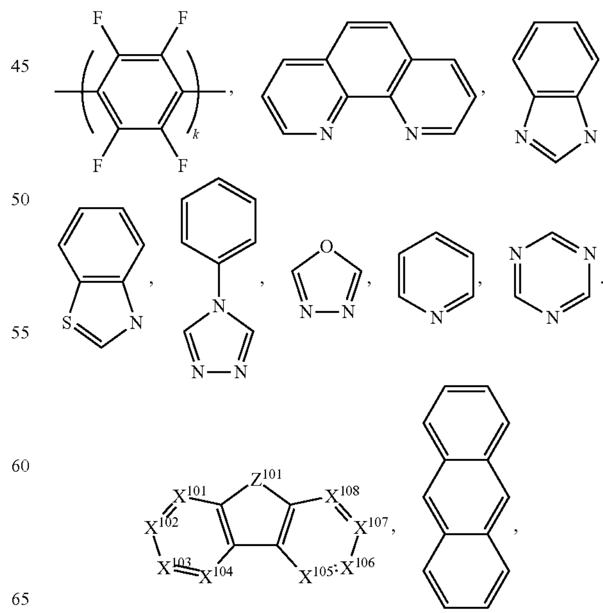

and fullerenes; wherein k is an integer from 1 to 20, $X^{101}$ to $X^{108}$ is selected from C or N; $Z^{101}$ is selected from the group consisting of C, N, O, and S.

In some embodiments, the metal complexes used in ETL contains, but not limit to the following general formula:

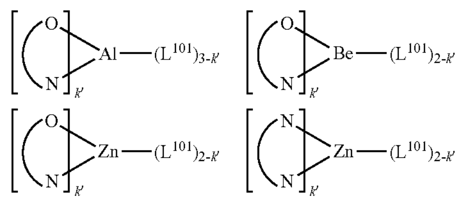

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

In some embodiments, the ETL material is selected from the group consisting of anthracene-benzoimidazole compounds, aza triphenylene derivatives, anthracene-benzothiazole compounds, metal 8-hydroxyquinolates, metal hydroxy benoquinolates, bathocuprine compounds, 5-member ring electron deficient heterocycles (e.g., triazole, oxadiazole, imidazole, benzoimidazole), silole compounds, arylborane compounds, fluorinated aromatic compounds, fullerene (e.g., C60), triazine complexes, and Zn (N^N) complexes.

h) Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. The minimum amount of hydrogen of the compound being deuterated is selected from the group consisting of 30%, 40%, 50%, 60%, 70%, 80%, 90%, 95%, 99%, and 100%. As used herein, percent deuteration has its ordinary meaning and includes the percent of all possible hydrogen and deuterium atoms that are replaced by deuterium atoms. In some embodiments, the deuterium atoms are attached to an aromatic ring. In some embodiments, the deuterium atoms are attached to a saturated carbon atom, such as an alkyl or cycloalkyl carbon atom. In some other embodiments, the deuterium atoms are attached to a heteroatom, such as Si, or Ge atom.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

E. Experimental Section

Inventive example 1

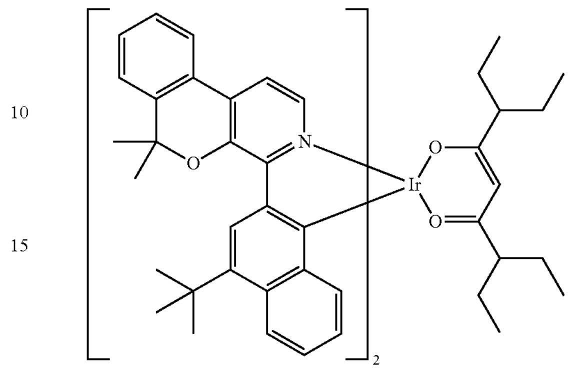

Comparative example 1

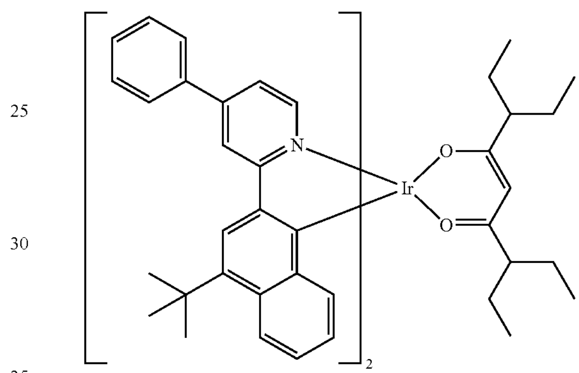

DFT calculations were performed on the inventive and comparative examples, and the geometries of both were optimized, respectively. The dihedral angle between the substituted phenyl ring and pyridine ring of the comparative example 1 is 32.3 degree, which is significantly reduced to 13.7 degree in the inventive example 1 due to the linkage of —$C(Me)_2$-O—. In addition, phenyl ring in the comparative example is expected to freely rotate, which results in large structure change between the ground state ($S_0$) and the excited state ($T_1$), however such structure change is restricted in the inventive example 1. According to the Frank-Condon principle, geometry change between ground and excited states leads to intense vibronic transitions and large non-radiative rate, which usually results in low photoluminescence quantum yield and broad emission spectrum. Therefore, the inventive example can be used as emissive dopants in OLED to improve device performance.

Calculations were performed using the B3LYP functional with a CEP-31G basis set. Geometry optimizations were performed in vacuum. Excitation energies were obtained at these optimized geometries using time-dependent density functional theory (TDDFT). A continuum solvent model was applied in the TDDFT calculation to simulate tetrahydrofuran solvent. All calculations were carried out using the program Gaussian.

The calculations obtained with the above-identified DFT functional set and basis set are theoretical. Computational composite protocols, such as Gaussian with the 6-31G* basis set used herein (or CEP-31G basis set which may be used for organometallic molecules), rely on the assumption that electronic effects are additive and, therefore, larger basis sets can be used to extrapolate to the complete basis set (CBS) limit. However, when the goal of a study is to understand variations in HOMO, LUMO, $S_1$, $T_1$, bond dissociation energies, etc. over a series of structurally-related compounds, the additive effects are expected to be similar. Accordingly, while absolute errors from using the B3LYP may be significant compared to other computational methods, the relative differences between the HOMO, LUMO, $S_1$, $T_1$, and bond dissociation energy values calculated with B3LYP protocol are expected to reproduce experiment quite well. See, e.g., Hong et al., *Chem. Mater.* 2016, 28, 5791-98, 5792-93 and Supplemental Information (discussing the reliability of DFT calculations in the context of OLED materials). Moreover, with respect to iridium or platinum complexes that are useful in the OLED art, the data obtained from DFT calculations correlates very well to actual experimental data. See Tavasli et al., *J. Mater. Chem.* 2012, 22, 6419-29, 6422 (Table 3) (showing DFT calculations closely correlating with actual data for a variety of emissive complexes); Morello, G. R., *J. Mol. Model.* 2017, 23:174 (studying of a variety of DFT functional sets and basis sets and concluding the combination of B3LYP and CEP-31G is particularly accurate for emissive complexes). Therefore, the difference of 28 nm of the triplet energy between the experimental data and the DFT result in Inventive Compound 1 can be used as a baseline to calculate the real experimental triplet energy for the rest of the inventive compounds.

What is claimed is:

1. A compound comprising a first ligand $L_A$;

wherein $L_A$ comprises a structure R of Formula I:

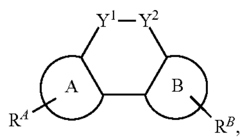

wherein moieties A and B are each independently a monocyclic ring or a polycyclic fused ring structure, wherein the monocyclic ring or each ring of the polycyclic fused ring structure is independently a 5-membered to 10-membered carbocyclic or heterocyclic ring;

wherein $Y^1$ and $Y^2$ are each independently selected from the group consisting of O, S, Se, NR, BR, BRR', $PR_e$, CR, C═O, C═NR, C═CRR', C═S, CRR', SO, $SO_2$, P(O)R, SiRR', and GeRR';

wherein each of $R^A$ and $R^B$ independently represents mono to the maximum allowable substitution, or no substitution;

wherein $L_A$ is coordinated to a metal M;

wherein moiety A and moiety B are not both joined to M by direct bonds;

wherein M is selected from the group consisting of Ir, Rh, Re, Ru, Os, Pt, Pd, Ag, Au, and Cu;

wherein M may be coordinated to other ligands;

wherein $L_A$ may be joined with other ligands to comprise a tridentate, tetradentate, pentadentate, or hexadentate ligand;

wherein any two substituents may be joined or fused to form a ring;

with the proviso that if moiety A is a pyridine ring joined to Ir by an Ir—N bond, then Y' is not $CF_2$ and $Y^2$ is not CRR'; and with the proviso that if moiety A is a benzene ring joined to Ir by a direct bond, then $Y^1$ is not O and $Y^2$ is not CRR';

wherein each R, R', $R^A$ and $R^B$ is independently hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof.

2. The compound of claim 1, wherein the first ligand $L_A$ has Formula II:

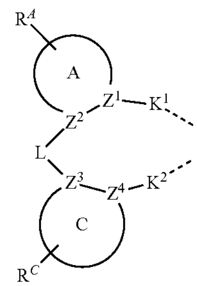

wherein moiety C is a monocyclic ring comprising one 5-membered to 10-membered carbocyclic or heterocyclic ring, or a polycyclic fused ring structure comprising at least two 5-membered to 10-membered carbocyclic or heterocyclic rings;

wherein $Z^1$-$Z^4$ are each independently C or N;

wherein $K^1$ and $K^2$ are each independently selected from the group consisting of a direct bond, O, S, $N(R^\alpha)$, $P(R^\alpha)$, $B(R^\alpha)$, $C(R^\alpha)(R^\beta)$, and $Si(R^\alpha)(R^\beta)$;

wherein L is a direct bond or an organic linker, wherein $R^C$ represents mono to the maximum allowable substitution, or no substitution;

wherein each $R^\alpha$, $R^\beta$, and $R^C$ is independently hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof;

wherein two $R^A$ substituents are joined to form a structure of Formula III fused to ring A:

Formula III

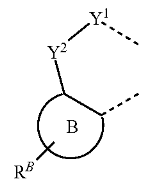

wherein moieties A and B, $R^A$, $R^B$, $Y^1$, and $Y^2$ are as defined above.

3. The compound of claim 1, wherein each R, R', $R^\alpha$, $R^\beta$, $R^A$, $R^B$; and $R^C$ is independently a hydrogen or a substituent selected from the group consisting of deuterium, fluorine, alkyl, cycloalkyl, heteroalkyl, alkoxy, aryloxy, amino, silyl, boryl, germyl, alkenyl, cycloalkenyl, heteroalkenyl, aryl, heteroaryl, nitrile, isonitrile, sulfanyl, and combinations thereof.

4. The compound of claim 2, wherein moiety A is an aromatic ring; and/or wherein moieties A and B are both aromatic rings; and/or wherein moiety C is a 6-membered aromatic ring; and/or wherein at least one of moieties A, B and C is a 5-membered ring.

5. The compound of claim 1, wherein $Y^1$ and $Y^2$ are independently selected from the group consisting of O, S, NR, CRR', and SiRR'; and/or wherein both of $K^1$ and $K^2$ are a direct bond or wherein one of $K^1$ and $K^2$ is O; and/or wherein at least one of $Z^1$-$Z^4$ is N; and/or wherein two $R^C$ are joined to form a ring.

6. The compound of claim 1, wherein the ligand $L_A$ is selected from the group consisting of the structures of LIST 1 as defined herein;

wherein each of $R^{AA}$ independently represents mono to the maximum allowable substitution, or no substitution;

each $R^{AA}$ is independently hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof; and any two substituents can be joined or fused to form a ring.

7. The compound of claim 1, wherein the ligand $L_A$ is selected from the group consisting of the structures of LIST 2 as defined herein;

wherein each of $R^{CC}$ independently represents mono to the maximum allowable substitution, or no substitution;

each $R_e$, $R_f$, $R^N$, and $R^{CC}$ is independently hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof;

$Y^A$ is selected from the group consisting of $BR_e$, $NR_e$, $PR_e$, O, S, Se, C═O, C═S, C═Se, S═O, $SO_2$, $P(O)R_e$, $C{=}NR_e$ $C{=}CR_eR_f$, $CR_eR_f$, $SiR_eR_f$, and $GeR_eR_f$, and any two substituents can be joined or fused to form a ring.

8. The compound of claim 1, wherein the ligand $L_A$ is selected from $L_{Ai}(R^E)(R^F)(W)(G)$ consisting of the structures of the following LIST 3:

| $L_A$ | Structure of $L_A$ |
|---|---|
| $L_{A1}$-$(R^1)(R^1)(W1)(G^1)$ to $L_{A1}$-$(R^{89})(R^{89})(W36)(G^{25})$ have the structure | 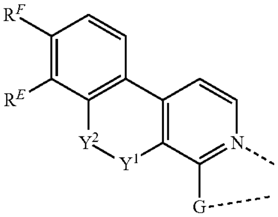 |
| $L_{A2}$-$(R^1)(R^1)(W1)(G^1)$ to $L_{A2}$-$(R^{89})(R^{89})(W42)(G^{25})$ have the structure | 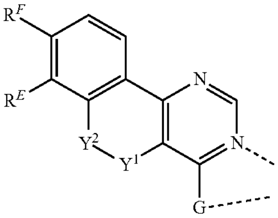 |
| $L_{A3}$-$(R^1)(R^1)(W1)(G^1)$ to $L_{A3}$-$(R^{89})(R^{89})(W36)(G^{25})$ have the structure | 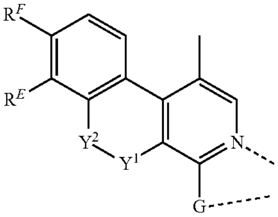 |
| $L_{A4}$-$(R^1)(R^1)(W1)(G^1)$ to $L_{A4}$-$(R^{89})(R^{89})(W36)(G^{25})$ have the structure | 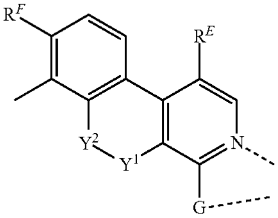 |

-continued

| $L_A$ | Structure of $L_A$ |
|---|---|
| $L_{A5}$-($R^1$)($R^1$)(W1)($G^1$) to $L_{A5}$-($R^{89}$)($R^{89}$)(W36)($G^{25}$) have the structure | 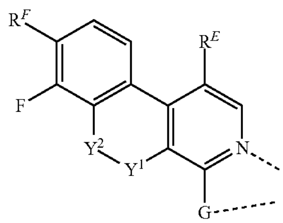 |
| $L_{A6}$-($R^1$)($R^1$)(W1)($G^1$) to $L_{A6}$-($R^{89}$)($R^{89}$)(W36)($G^{25}$) have the structure | 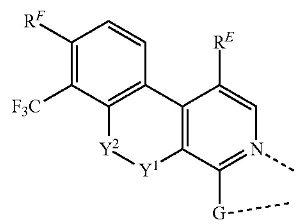 |
| $L_{A7}$-($R^1$)($R^1$)(W1)($G^1$) to $L_{A7}$-($R^{89}$)($R^{89}$)(W36)($G^{25}$) have the structure | 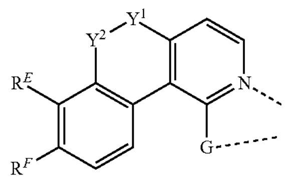 |
| $L_{A8}$-($R^1$)($R^1$)(W1)($G^1$) to $L_{A8}$-($R^{89}$)($R^{89}$)(W42)($G^{25}$) have the structure | 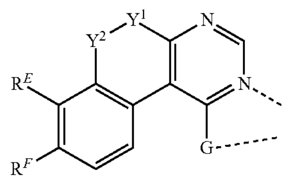 |
| $L_{A9}$-($R^1$)($R^1$)(W1)($G^1$) to $L_{A9}$-($R^{89}$)($R^{89}$)(W36)($G^{25}$) have the structure | 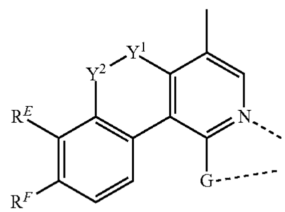 |
| $L_{A10}$-($R^1$)($R^1$)(W1)($G^1$) to $L_{A10}$-($R^{89}$)($R^{89}$)(W36)($G^{25}$) have the structure | 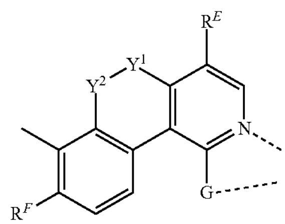 |
| $L_{A11}$-($R^1$)($R^1$)(W1)($G^1$) to $L_{A11}$-($R^{89}$)($R^{89}$)(W36)($G^{25}$) have the structure | 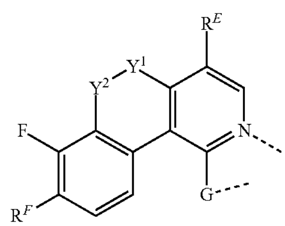 |

-continued

| $L_A$ | Structure of $L_A$ |
| --- | --- |
| $L_{A12}$-($R^1$)($R^1$)(W1)($G^1$) to $L_{A12}$-($R^{89}$)($R^{89}$)(W36)($G^{25}$) have the structure | 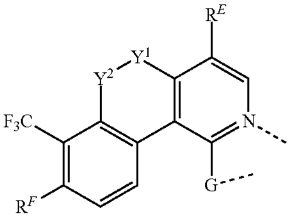 |
| $L_{A13}$-($R^1$)($R^1$)(W1)($G^1$) to $L_{A13}$-($R^{89}$)($R^{89}$)(W36)($G^{25}$) have the structure | 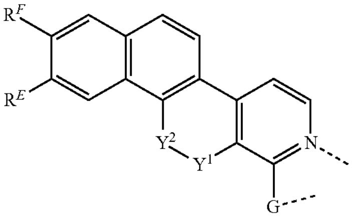 |
| $L_{A14}$-($R^1$)($R^1$)(W1)($G^1$) to $L_{A14}$-($R^{89}$)($R^{89}$)(W42)($G^{25}$) have the structure | 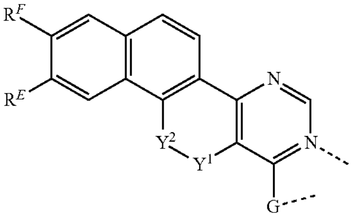 |
| $L_{A15}$-($R^1$)($R^1$)(W1)($G^1$) to $L_{A15}$-($R^{89}$)($R^{89}$)(W36)($G^{25}$) have the structure | 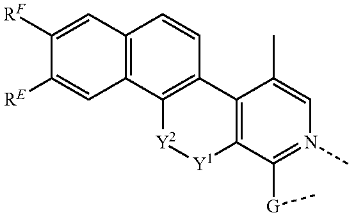 |
| $L_{A16}$-($R^1$)($R^1$)(W1)($G^1$) to $L_{A16}$-($R^{89}$)($R^{89}$)(W42)($G^{25}$) have the structure | 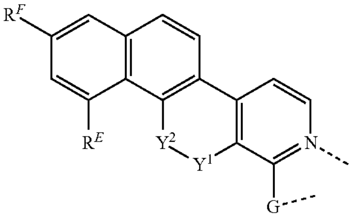 |
| $L_{A17}$-($R^1$)($R^1$)(W1)($G^1$) to $L_{A17}$-($R^{89}$)($R^{89}$)(W42)($G^{25}$) have the structure | 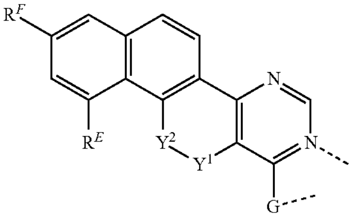 |
| $L_{A18}$-($R^1$)($R^1$)(W1)($G^1$) to $L_{A18}$-($R^{89}$)($R^{89}$)(W36)($G^{25}$) have the structure | 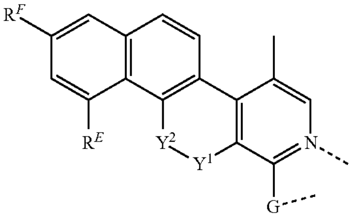 |

-continued

| $L_A$ | Structure of $L_A$ |
| --- | --- |
| $L_{A19}$-($R^1$)($R^1$)(W1)($G^1$) to $L_{A19}$-($R^{89}$)($R^{89}$)(W36)($G^{25}$) have the structure | 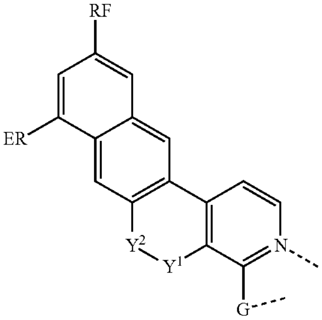 |
| $L_{A20}$-($R^1$)($R^1$)(W1)($G^1$) to $L_{A20}$-($R^{89}$)($R^{89}$)(W42)($G^{25}$) have the structure | 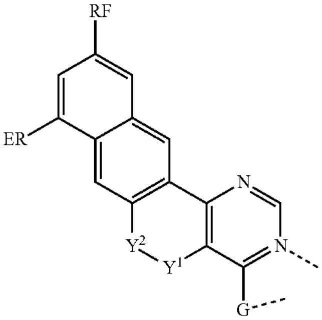 |
| $L_{A21}$-($R^1$)($R^1$)(W1)($G^{26}$) to $L_{A21}$-($R^{89}$)($R^{89}$)(W42)($G^{53}$) have the structure | 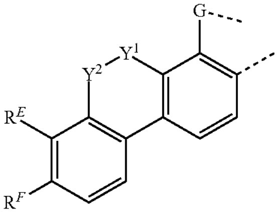 |
| $L_{A22}$-($R^1$)($R^1$)(W1)($G^{26}$) to $L_{A22}$-($R^{89}$)($R^{89}$)(W42)($G^{53}$) have the structure | 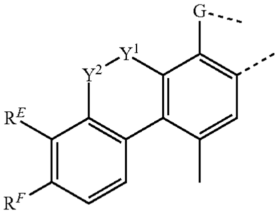 |
| $L_{A23}$-($R^1$)($R^1$)(W1)($G^{26}$) to $L_{A23}$-($R^{89}$)($R^{89}$)(W42)($G^{53}$) have the structure | 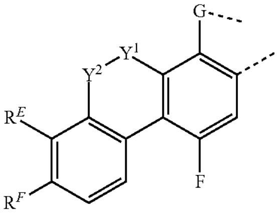 |
| $L_{A24}$-($R^1$)($R^1$)(W1)($G^{26}$) to $L_{A24}$-($R^{89}$)($R^{89}$)(W42)($G^{53}$) have the structure | 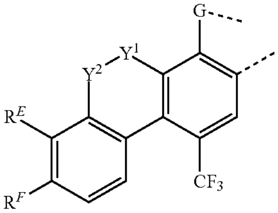 |

-continued
| $L_A$ | Structure of $L_A$ |
|---|---|
| $L_{A25}$-($R^1$)($R^1$)(W1)($G^{26}$) to $L_{A25}$-($R^{89}$)($R^{89}$)(W42)($G^{53}$) have the structure | 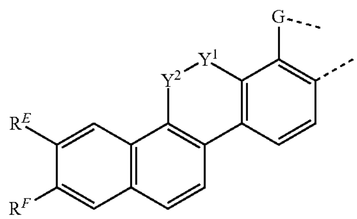 |
| $L_{A26}$-($R^1$)($R^1$)(W1)($G^{26}$) to $L_{A26}$-($R^{89}$)($R^{89}$)(W42)($G^{53}$) have the structure | 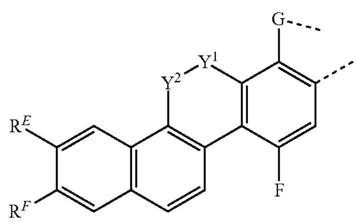 |
| $L_{A27}$-($R^1$)($R^1$)(W1)($G^{26}$) to $L_{A27}$-($R^{89}$)($R^{89}$)(W42)($G^{53}$) have the structure | 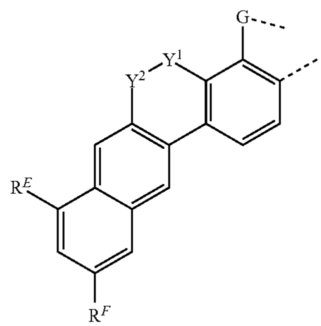 |
| $L_{A28}$-($R^1$)($R^1$)(W1)($G^{26}$) to $L_{A28}$-($R^{89}$)($R^{89}$)(W42)($G^{53}$) have the structure | 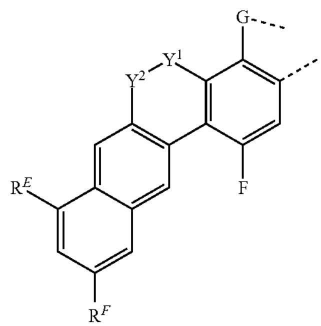 |
| $L_{A29}$-($R^1$)($R^1$)(W1)($G^{26}$) to $L_{A29}$-($R^{89}$)($R^{89}$)(W42)($G^{53}$) have the structure | 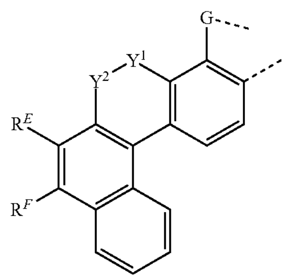 |

-continued
| $L_A$ | Structure of $L_A$ |
|---|---|
| $L_{A430}$-($R^1$)($R^1$)(W1)($G^{26}$) to $L_{A430}$-($R^{89}$)($R^{89}$)(W42)($G^{53}$) have the structure | 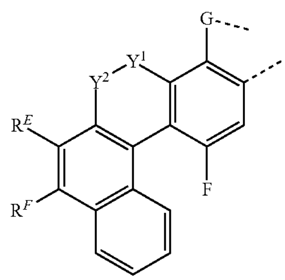 |
| $L_{A431}$-($R^1$)($R^1$)(W1)($G^1$) to $L_{A431}$-($R^{89}$)($R^{89}$)(W42)($G^{25}$) have the structure | 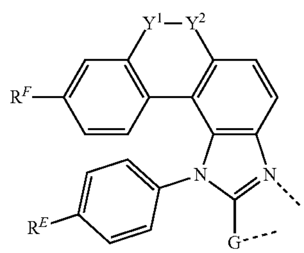 |
| $L_{A432}$-($R^1$)($R^1$)(W1)($G^1$) to $L_{A432}$-($R^{89}$)($R^{89}$)(W42)($G^{25}$) have the structure | 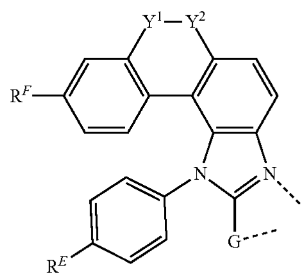 |
| $L_{A433}$-($R^1$)($R^1$)(W1)($G^1$) to $L_{A433}$-($R^{89}$)($R^{89}$)(W42)($G^{25}$) have the structure | 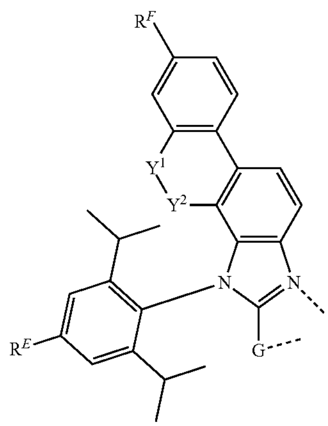 |

-continued
| $L_A$ | Structure of $L_A$ |
|---|---|
| $L_{A434}$-$(R^1)(R^1)(W1)(G^1)$ to $L_{A434}$-$(R^{89})(R^{89})(W42)(G^{25})$ have the structure | 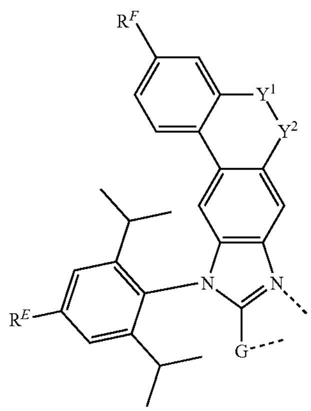 |
| $L_{A435}$-$(R^1)(R^1)(W1)(G^1)$ to $L_{A435}$-$(R^{89})(R^{89})(W42)(G^{25})$ have the structure | 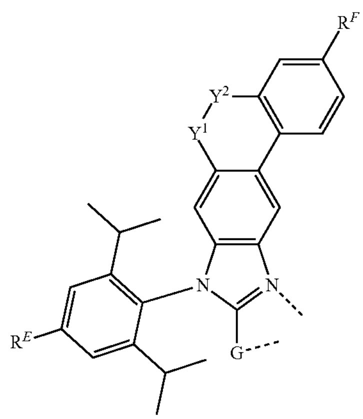 |
| $L_{A436}$-$(R^1)(R^1)(W1)(G^1)$ to $L_{A436}$-$(R^{89})(R^{89})(W42)(G^{25})$ have the structure | 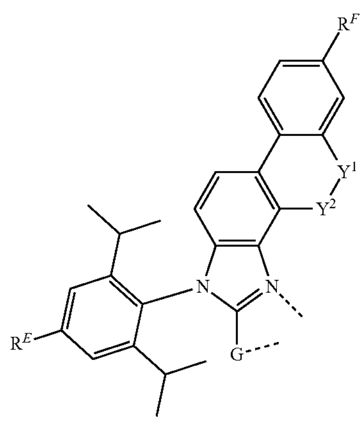 |
| $L_{A437}$-$(R^1)(R^1)(W1)(G^1)$ to $L_{A437}$-$(R^{89})(R^{89})(W42)(G^{25})$ have the structure | 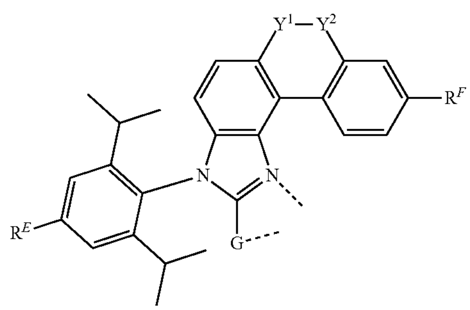 |

-continued

| $L_A$ | Structure of $L_A$ |
|---|---|
| $L_{A438}$-($R^1$)($R^1$)(W1)($G^1$) to $L_{A438}$-($R^{89}$)($R^{89}$)(W42)($G^{25}$) have the structure | 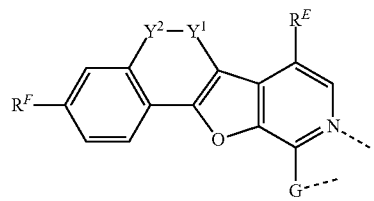 |
| $L_{A439}$-($R^1$)($R^1$)(W1)($G^{26}$) to $L_{A439}$-($R^{89}$)($R^{89}$)(W42)($G^{53}$) have the structure | 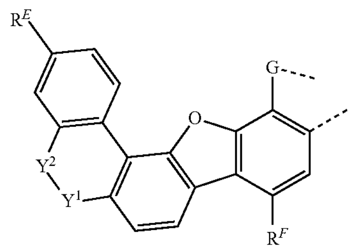 |
| $L_{A440}$-($R^1$)($R^1$)(W1)($G^{26}$) to $L_{A440}$-($R^{89}$)($R^{89}$)(W42)($G^{53}$) have the structure | 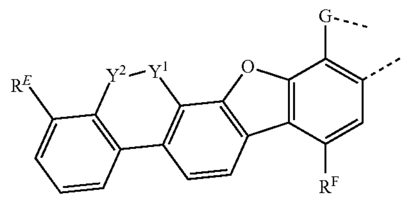 |
| $L_{A441}$-($R^1$)($R^1$)(W1)($G^1$) to $L_{A441}$-($R^{89}$)($R^{89}$)(W42)($G^{25}$) have the structure | 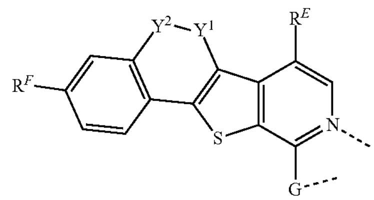 |
| $L_{A442}$-($R^1$)($R^1$)(W1)($G^1$) to $L_{A442}$-($R^{89}$)($R^{89}$)(W42)($G^{25}$) have the structure | 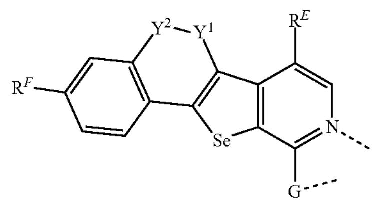 |
| $L_{A443}$-($R^1$)($R^1$)(W1)($G^1$) to $L_{A443}$-($R^{89}$)($R^{89}$)(W42)($G^{25}$) have the structure | 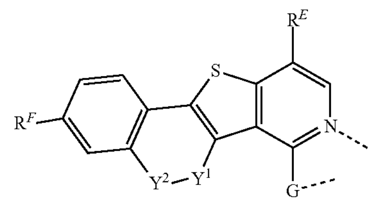 |
| $L_{A444}$-($R^1$)($R^1$)(W1)($G^1$) to $L_{A444}$-($R^{89}$)($R^{89}$)(W42)($G^{25}$) have the structure | 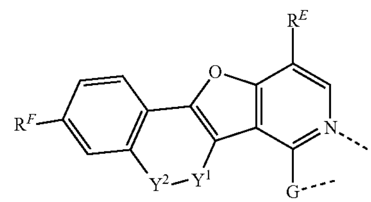 |

-continued
| $L_A$ | Structure of $L_A$ |
|---|---|
| $L_{A445}$-$(R^1)(R^1)(W1)(G^1)$ to $L_{A445}$-$(R^{89})(R^{89})(W42)(G^{25})$ have the structure | 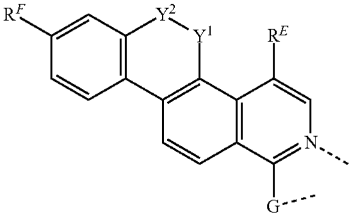 |
| $L_{A446}$-$(R^1)(R^1)(W1)(G^1)$ to $L_{A446}$-$(R^{89})(R^{89})(W42)(G^{25})$ have the structure | 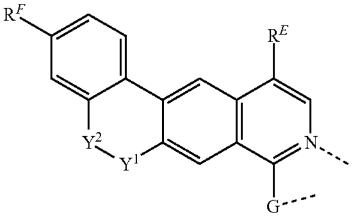 |
| $L_{A447}$-$(R^1)(R^1)(W1)(G^{26})$ to $L_{A447}$-$(R^{89})(R^{89})(W42)(G^{53})$ have the structure | 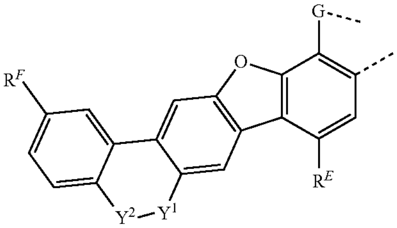 |
| $L_{A448}$-$(R^1)(R^1)(W1)(G^{26})$ to $L_{A448}$-$(R^{89})(R^{89})(W42)(G^{53})$ have the structure | 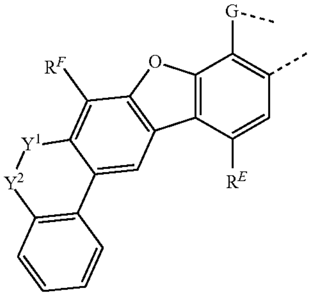 |
| $L_{A449}$-$(R^1)(R^1)(W1)(G^{26})$ to $L_{A449}$-$(R^{89})(R^{89})(W42)(G^{53})$ have the structure | 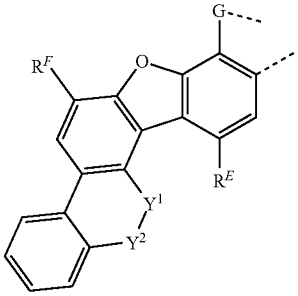 |
| $L_{A05}$-$(R^1)(R^1)(W1)(G^{26})$ to $L_{A450}$-$(R^{89})(R^{89})(W42)(G^{53})$ have the structure | 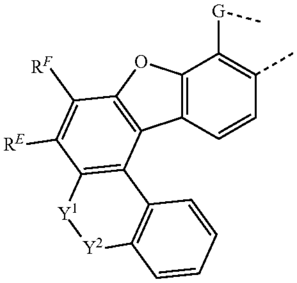 |

-continued

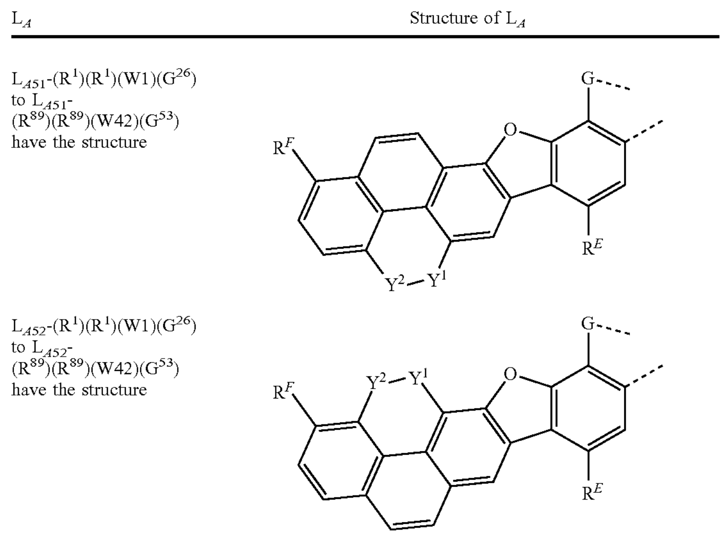

| $L_A$ | Structure of $L_A$ |
| --- | --- |
| $L_{A51}$-($R^1$)($R^1$)(W1)($G^{26}$) to $L_{A51}$-($R^{89}$)($R^{89}$)(W42)($G^{53}$) have the structure | |
| $L_{A52}$-($R^1$)($R^1$)(W1)($G^{26}$) to $L_{A52}$-($R^{89}$)($R^{89}$)(W42)($G^{53}$) have the structure | |

wherein, each of W1 to W42 representing $Y^1$ and $Y^2$, is defined in the following LIST:

| W1 | W2 | W3 | W4 | W5 | W6 |
| --- | --- | --- | --- | --- | --- |
| $Y^1 = Ge(CH_3)_2$; $Y^2 = N(CH_3)_2$ | $Y^1 = O$; $Y^2 = Si(CH_3)_2$ | $Y^1 = S$; $Y^2 = Ge(CH_3)_2$ | $Y^1 = S$; $Y^2 = C(CH_3)_2$ | $Y^1 = S$; $Y^2 = Si(CH_3)_2$ | $Y^1 = S$; $Y^2 = Ge(CH_3)_2$ |
| W7 | W8 | W9 | W10 | W11 | W12 |
| $Y^1 = N(CH_3)$; $Y^2 = C(CH_3)_2$ | $Y^1 = N(CH_3)$; $Y^2 = Si(CH_3)_2$ | $Y^1 = N(CH_3)$; $Y^2 = Ge(CH_3)_2$ | $Y^1 = Se$; $Y^2 = C(CH_3)_2$ | $Y^1 = Se$; $Y^2 = Si(CH_3)_2$ | $Y^1 = Se$; $Y^2 = Ge(CH_3)_2$ |
| W13 | W14 | W15 | W16 | W17 | W18 |
| $Y^1 = C(CH_3)_2$; $Y^2 = C(CH_3)_2$ | $Y^1 = C(CH_3)_2$; $Y^2 = Si(CH_3)_2$ | $Y^1 = C(CH_3)_2$; $Y^2 = Ge(CH_3)_2$ | $Y^1 = Si(CH_3)_2$; $Y^2 = C(CH_3)_2$ | $Y^1 = Si(CH_3)_2$; $Y^2 = Si(CH_3)_2$ | $Y^1 = Si(CH_3)_2$; $Y^2 = Ge(CH_3)_2$ |
| W19 | W20 | W21 | W22 | W23 | W24 |
| $Y^1 = C(CH_3)_2$; $Y^2 = O$ | $Y^1 = C(CH_3)_2$; $Y^2 = S$ | $Y^1 = C(CH_3)_2$; $Y^2 = Se$ | $Y^1 = Su(CH_3)_2$; $Y^2 = O$ | $Y^1 = Si(CH_3)_2$; $Y^2 = S$ | $Y^1 = Si(CH_3)_2$; $Y^2 = Se$ |
| W25 | W26 | W27 | W28 | W29 | W30 |
| $Y^1 = Ge(CH_3)_2$; $Y^2 = O$ | $Y^1 = Ge(CH_3)_2$; $Y^2 = S$ | $Y^1 = Ge(CH_3)_2$; $Y^2 = Se$ | $Y^1 = C(CH_3)_2$; $Y^2 = N(CH_3)_2$ | $Y^1 = Si(CH_3)_2$; $Y^2 = N(CH_3)_2$ | $Y^1 = O$; $Y^2 = C(CH_3)_2$ |
| W31 | W32 | W33 | W34 | W35 | W36 |
| $Y^1 = CH_2$; $Y^2 = CF_2$ | $Y^1 = CMe_2$; $Y^2 = CF_2$ | $Y^1 = CH_2$; $Y^2 = CHF$ | $Y^1 = CMe_2$; $Y^2 = CHF$ | $Y^1 = CHF$; $Y^2 = CH_2$ | $Y^1 = CHF$; $Y^2 = CMe_2$ |
| W37 $Y^1 = CF_2$; $Y^2 = CHF$ | W38 $Y^1 = CHF$; $Y^2 = CHF$ | W39 $Y^1 = CF_2$; $Y^2 = CF_2$ | W40 $Y^1 = CF_2$; $Y^2 = CH_2$ | W41 $Y^1 = CF_2$; $Y^2 = CMe_2$ | W42 $Y^1 = C(CF_3)_2$; $Y^2 = CH_2$ |

wherein $R^1$ to $R^{89}$ have the structures in the following LIST:

-continued

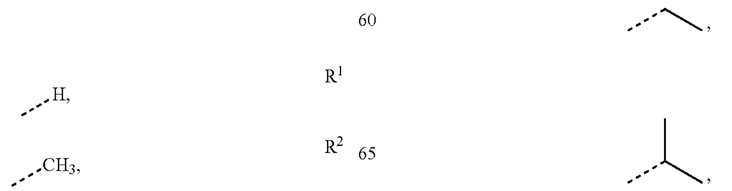

$R^1$ $R^2$ $R^3$ $R^4$

-continued
R[5]
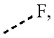
R[6]
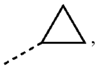
R[7]
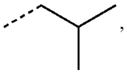
R[8]
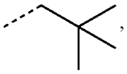
R[9]
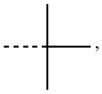
R[10]
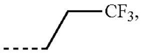
R[11]
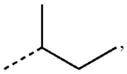
R[12]
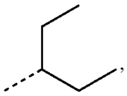
R[13]
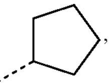
R[14]
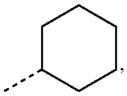
R[15]
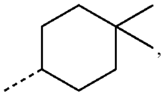
R[16]
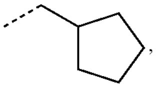
R[17]
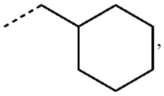
R[18]
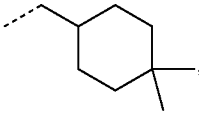
R[19]
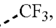
R[20]
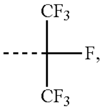
-continued
R[21]
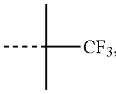
R[22]
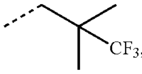
R[23]
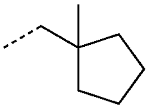
R[24]
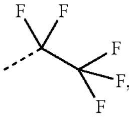
R[25]
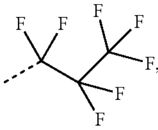
R[26]
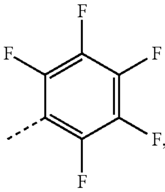
R[27]
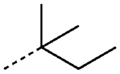
R[28]
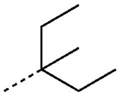
R[29]
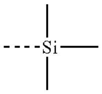
R[30]
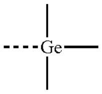
R[31]
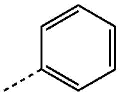
R[32]
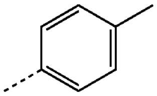
R[33]
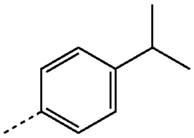

-continued
$R^{34}$
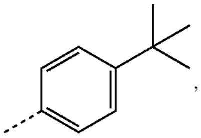,
$R^{35}$
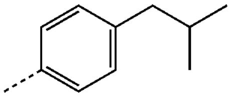,
$R^{36}$
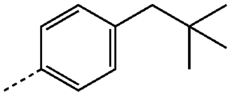,
$R^{37}$
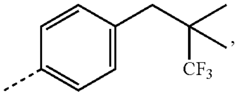,
$R^{38}$
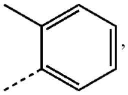,
$R^{39}$
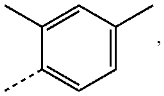,
$R^{40}$
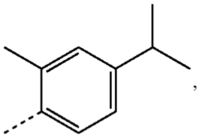,
$R^{41}$
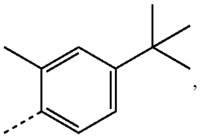,
$R^{42}$
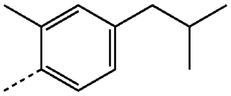,
$R^{43}$
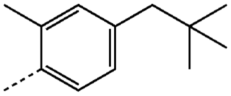,
$R^{44}$
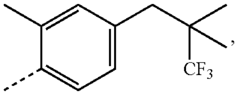,
$R^{45}$
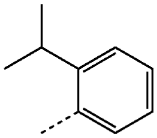,
-continued
$R^{46}$
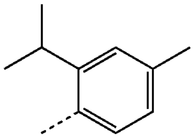,
$F^{47}$
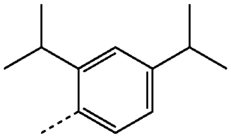,
$F^{48}$
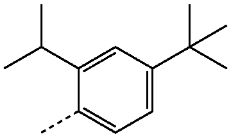,
$R^{49}$
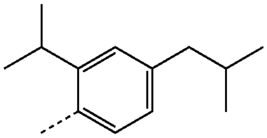,
$R^{50}$
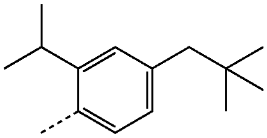,
$R^{51}$
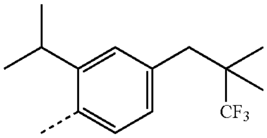,
$R^{52}$
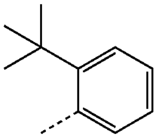,
$R^{53}$
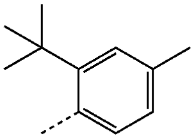,
$R^{54}$
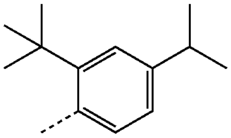,
$R^{55}$
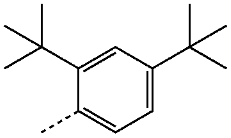, -continued
R56
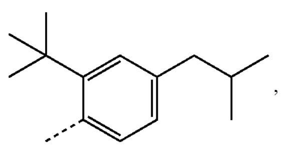
R57
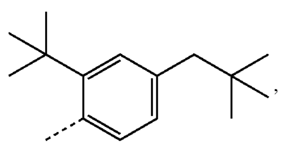
R58
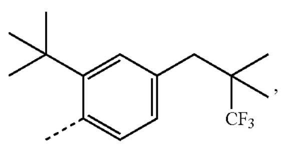
R59
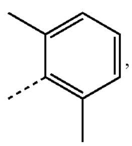
R60
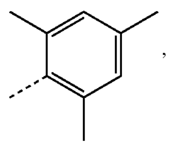
R61
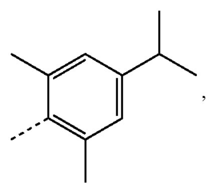
R62
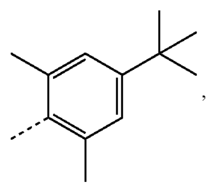
R63
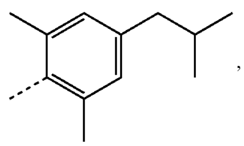
R64
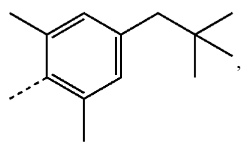
R65
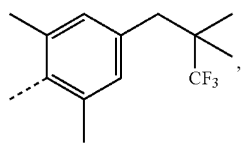
-continued
R66
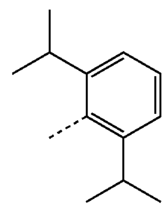
R67
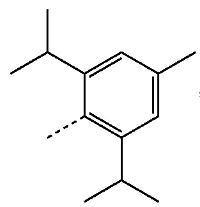
R68
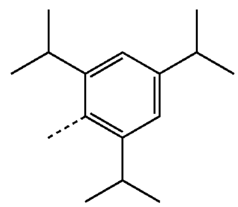
R69
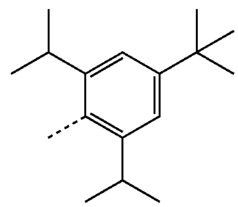
R70
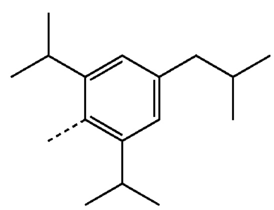
R71
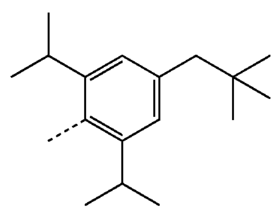
R72
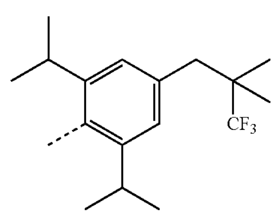

-continued
R[73]
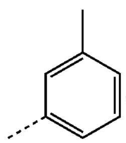,
R[74]
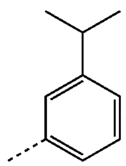,
R[75]
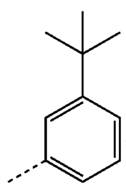,
R[76]
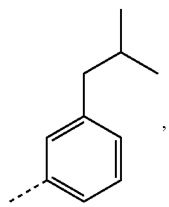,
R[77]
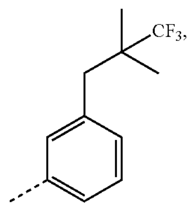
R[78]
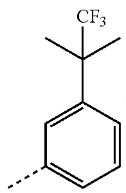,
R[79]
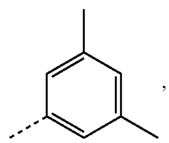,
R[80]
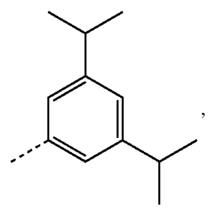,
-continued
R[81]
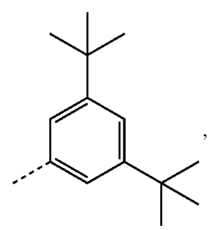,
R[82]
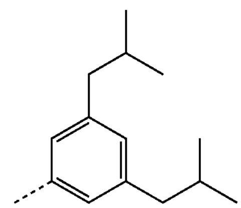,
R[83]
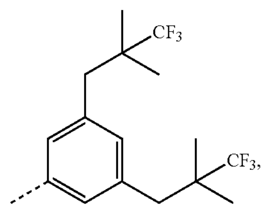
R[84]
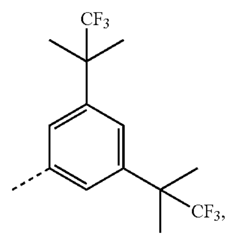
R[85]
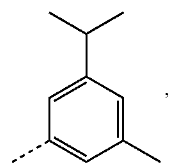,
R[86]
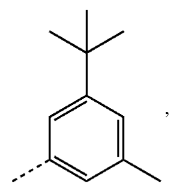,
R[87]
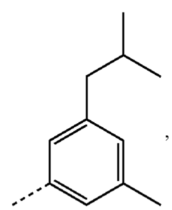,
R[88]
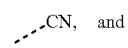 and -continued
R89
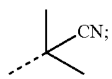
and
wherein $G^1$ to $G^{53}$ have the structures in the following LIST:
G1
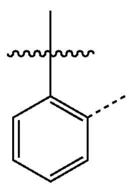
,
G2
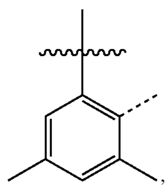
,
G3
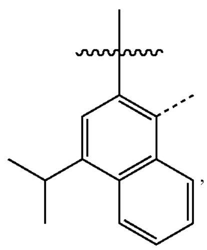
,
G4
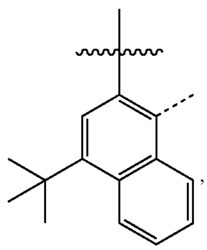
,
G5
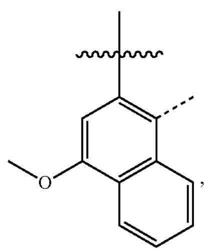
,
-continued
G6
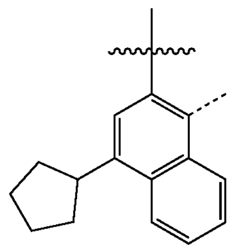
,
G7
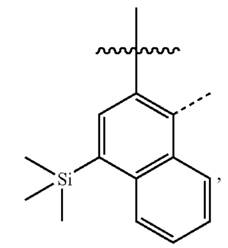
,
G8
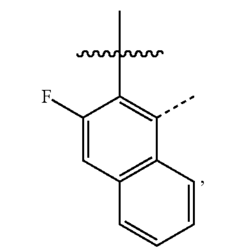
,
G9
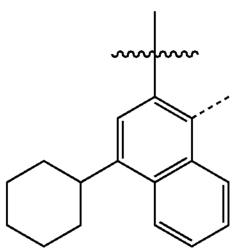
,
G10
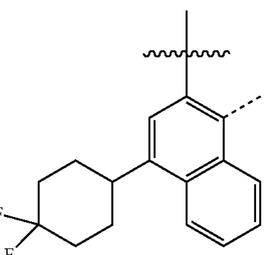
,
G11
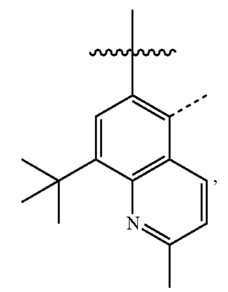
, -continued
G[12]
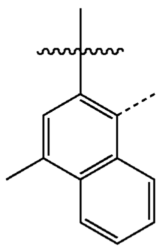
G[13]
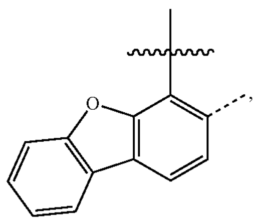
G[14]
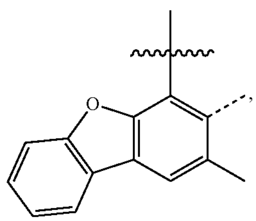
G[15]
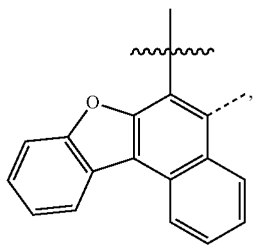
G[16]
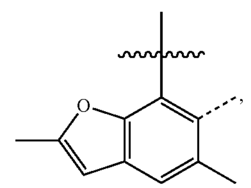
G[17]
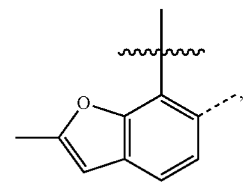
G[18]
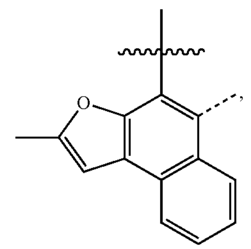
-continued
G[19]
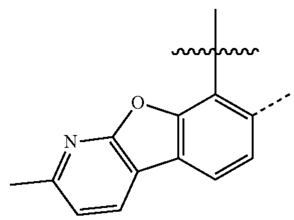
G[20]
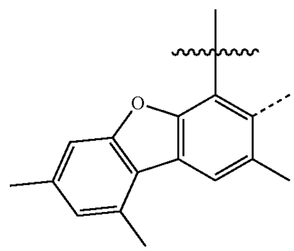
G[21]
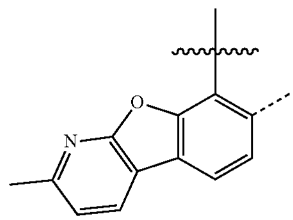
G[22]
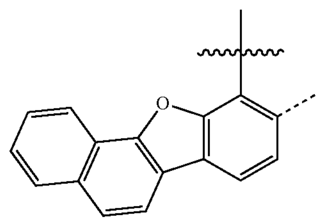
G[23]
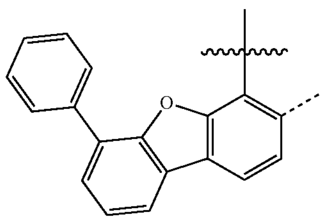
G[24]
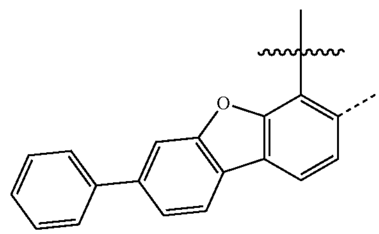

-continued
G[25]
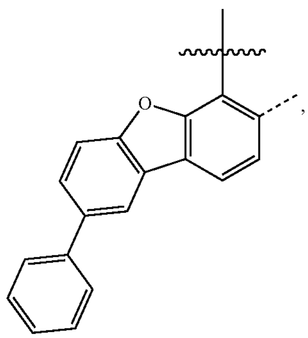
G[26]
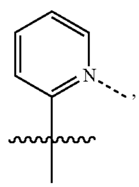
G[27]
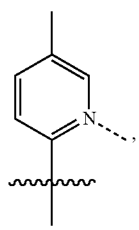
G[28]
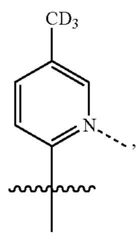
G[29]
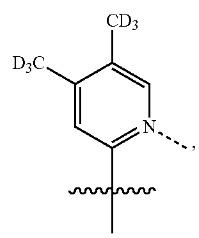
G[30]
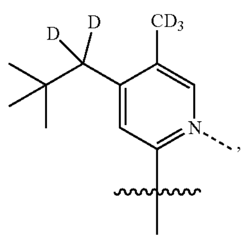
-continued
G[31]
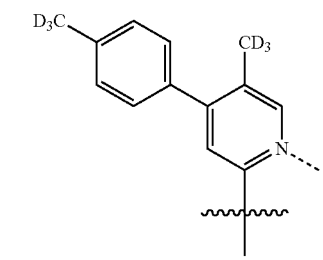
G[32]
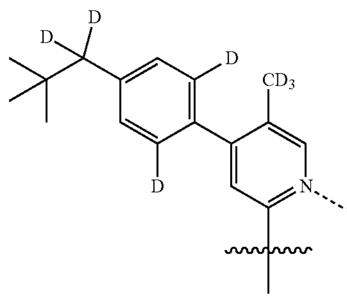
G[33]
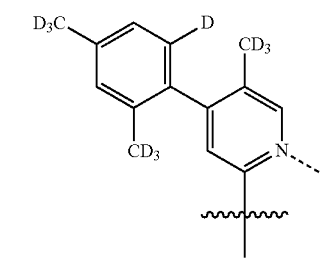
G[34]
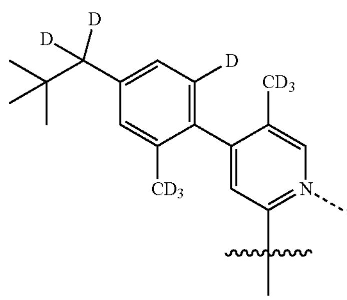
G[35]
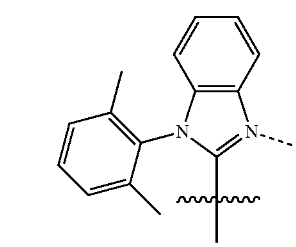
G[36]
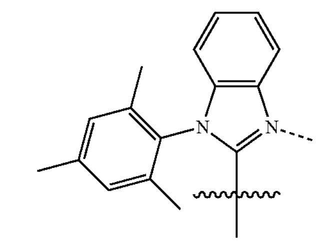

-continued
G[37]
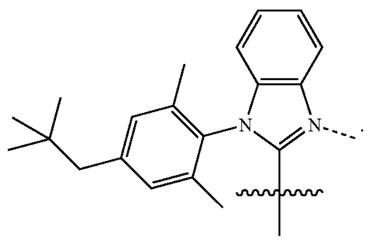
G[38]
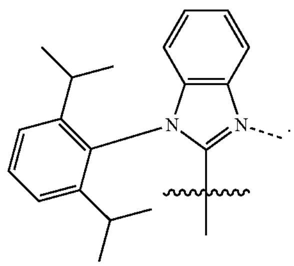
G[39]
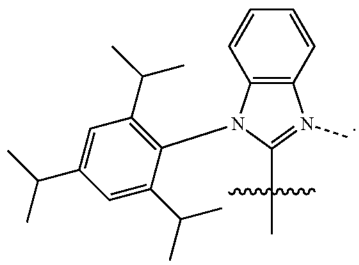
G[40]
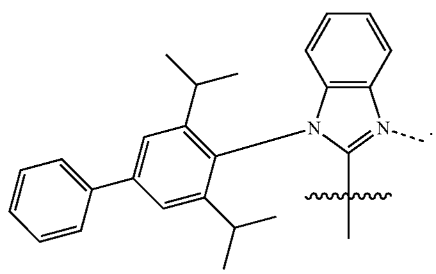
G[41]
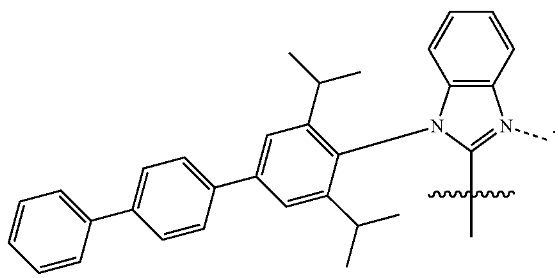
G[42]
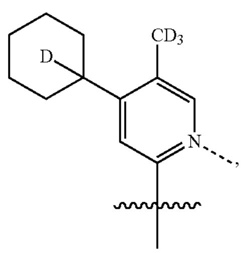
-continued
G[43]
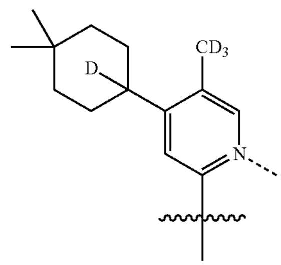
G[44]
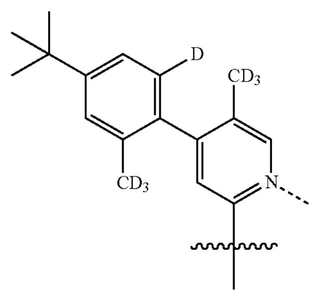
G[45]
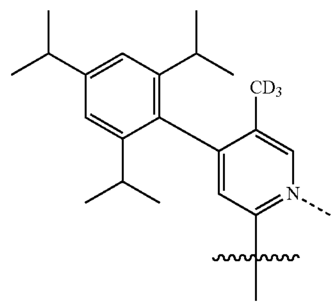
G[46]
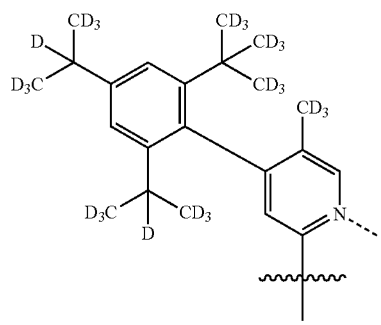
G[47]
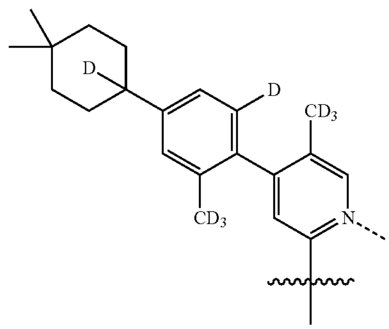

-continued

G[48]

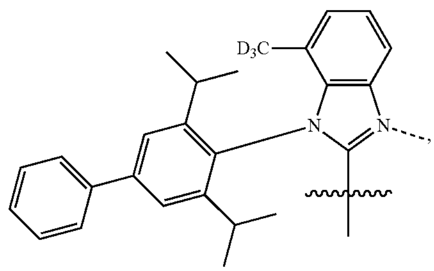

G[49]

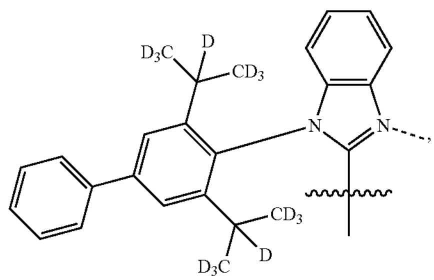

G[50]

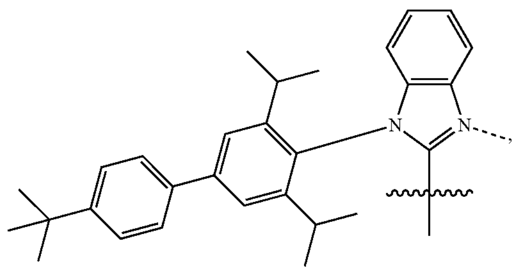

G[51]

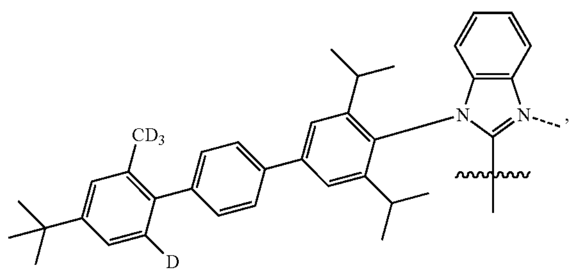

G[52]

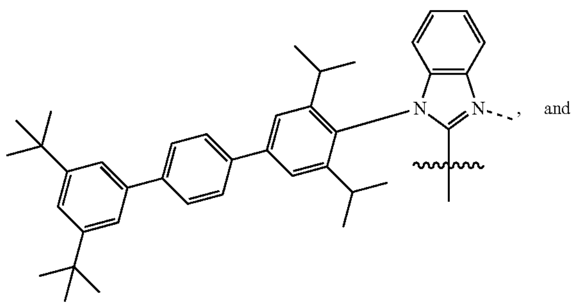

and

-continued

G[53]

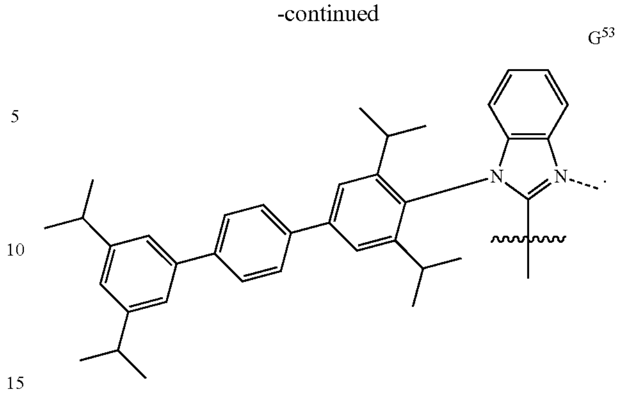

9. The compound of claim 1, wherein the compound has a formula of $M(L_A)_p(L_B)_q(L_C)_r$ wherein $L_B$ and $L_C$ are each a bidentate ligand; and wherein p is 1, 2, or 3; q is 0, 1, or 2; r is 0, 1, or 2; and p+q+r is the oxidation state of the metal M.

10. The compound of claim 9, wherein the compound has a formula selected from the group consisting of $Ir(L_A)_3$, $Ir(L_A)(L_B)_2$, $Ir(L_A)_2(L_B)$, $Ir(L_A)_2(L_C)$, and $Ir(L_A)(L_B)(L_C)$; and wherein $L_A$, $L_B$, and $L_C$ are different from each other, or a formula of $Pt(L_A)(L_B)$; and wherein $L_A$ and $L_B$ can be same or different.

11. The compound of claim 9, wherein $L_B$ and $L_C$ are each independently selected from the group consisting of the structures of LIST 4 as defined herein;

wherein:

T is selected from the group consisting of B, Al, Ga, and In;

wherein $K^{1'}$ is a direct bond or is selected from the group consisting of $NR_e$, $PR_e$, O, S, and Se;

each of $Y^1$ to $Y^{13}$ is independently selected from the group consisting of carbon and nitrogen;

Y' is selected from the group consisting of $BR_e$, $NR_e$, $PR_e$, O, S, Se, C═O, C═S, C═Se, S═O, $SO_2$, $P(O)R_e$, C═$NR_e$, C═$CR_eR_f$, $CR_eR_f$, $SiR_eR_f$, and $GeR_eR_f$, $R_e$ and $R_f$ can be fused or joined to form a ring;

each $R_a$, $R_b$, $R_c$, and $R_d$ independently represent zero, mono, or up to a maximum allowed number of substitutions to its associated ring;

each of $R_{a1}$, $R_{b1}$, $R_{c1}$, $R_{d1}$, $R_a$, $R_b$, $R_c$, $R_d$, $R_e$ and $R_f$ is independently a hydrogen or a substituent selected from the group consisting of deuterium, halide, alkyl, cycloalkyl, heteroalkyl, arylalkyl, alkoxy, aryloxy, amino, silyl, germyl, boryl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, selenyl, and combinations thereof; the general substituents defined herein; and any two adjacent $R_a$, $R_b$, $R_c$, $R_d$, $R_e$ and $R_f$ can be fused or joined to form a ring or form a multidentate ligand.

12. The compound of claim 9, wherein the compound has formula $Ir(L_A)_3$, formula $Ir(L_A)(L_{B}+)_2$, formula $Ir(L_A)_2(L_{Bk})$, formula $Ir(L_A)_2(L_{Cj-I})$, or, formula $Ir(L_A)_2(L_{Cj-II})$, wherein $L_A$ comprises a structure of Formula I;

wherein each $L_{Bk}$ has the structure as defined in LIST 6 as defined herein;

wherein each $L_{Cj-I}$ has a structure based on formula

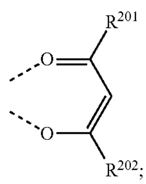

and each $L_{Cj-II}$ has a structure based on formula

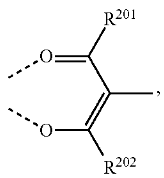

wherein for each $L_{Cj}$ in $L_{Cj-I}$ and $L_{Cj-II}$, $R^{201}$ and $R^{202}$ are each independently defined as in TABLE 1 as defined herein;

wherein $R^{D1}$ to $R^{D246}$ have the structures as defined in LIST 7 as defined herein.

13. The compound of claim 9, wherein the compound is selected from the group consisting of the structures of LIST 8 as defined herein.

14. The compound of claim 9, wherein the compound has the Formula IV:

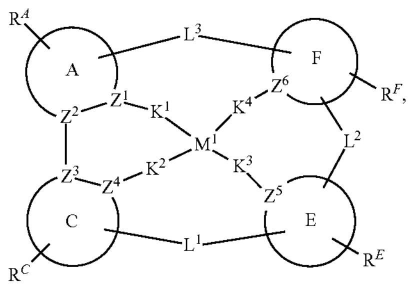

wherein:

$M^1$ is Pd or Pt;

moieties E and F are each independently a monocyclic ring or a polycyclic fused ring structure, wherein the monocyclic ring or each ring of the polycyclic fused ring structure is independently a 5-membered to 10-membered carbocyclic or heterocyclic ring;

$Z^5$ and $Z^6$ are each independently C or N;

$K^1$, $K^2$, $K^3$, and $K^4$ are each independently selected from the group consisting of a direct bond, O, S, $N(R^\alpha)$, $P(R^\alpha)$, $B(R^\alpha)$, $C(R^\alpha)(R^\beta)$, and $Si(R^\alpha)(R^\beta)$, wherein at least two of them are direct bonds;

$L^1$, $L^2$, and $L^3$ are each independently absent or selected from the group consisting of a direct bond, BR, BRR', NR, $PR_e$, P(O)R, O, S, Se, C═O, C═S, C═Se, C═NR, C═CRR', S═O, $SO_2$, CR, CRR', SiRR', and GeRR', wherein at least one of $L^1$ and $L^2$ is present;

$R^E$ and $R^F$ each independently represent zero, mono, or up to a maximum allowed number of substitutions to its associated ring;

each of $(R^\alpha)$, $(R^\beta)$, R', R", $R^E$, and $R^F$ is independently a hydrogen or a substituent selected from the group consisting of deuterium, fluorine, alkyl, cycloalkyl, heteroalkyl, alkoxy, aryloxy, amino, silyl, germyl, boryl, alkenyl, cycloalkenyl, heteroalkenyl, aryl, heteroaryl, nitrile, isonitrile, sulfanyl, and combinations thereof;

two adjacent $R^A$, $R^B$, $R^C$, $R^E$, and $R^F$ can be joined or fused together to form a ring where chemically feasible; and moieties A and C, $Z^1$-$Z^4$, $R^A$, and $R^B$ are all defined the same as above.

15. The compound of claim 14, wherein the compound is selected from the group consisting of compounds having the formula of $Pt(L_{A'})(L_y)$:

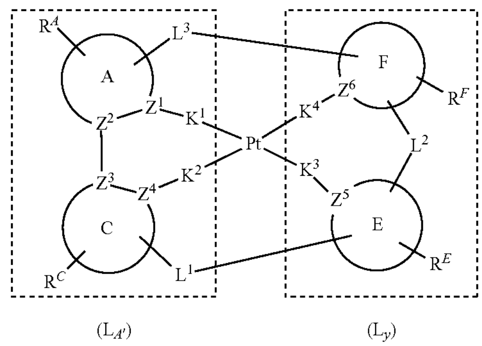

wherein $L_{A'}$ is selected from the group consisting of the structures shown below:

wherein $L_{A'}$ is selected from the group consisting of the structures in the following LIST:

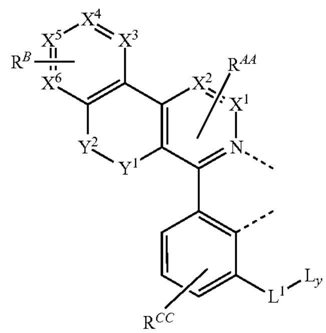

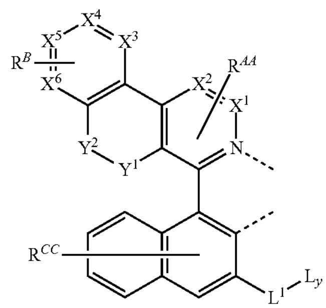

-continued
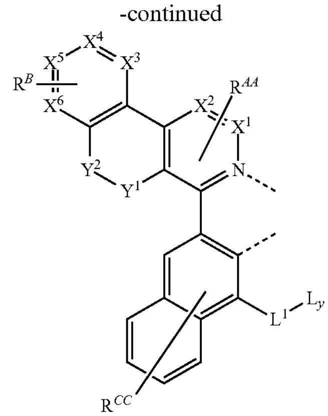
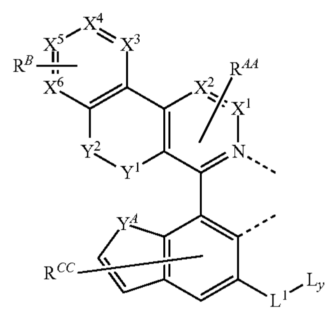
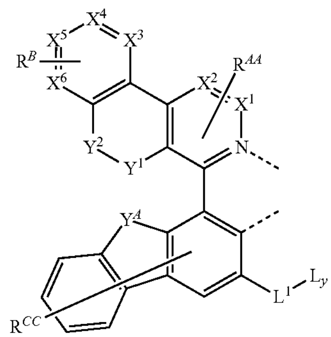
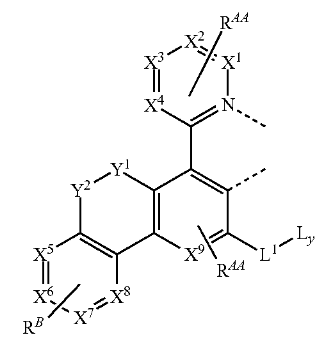
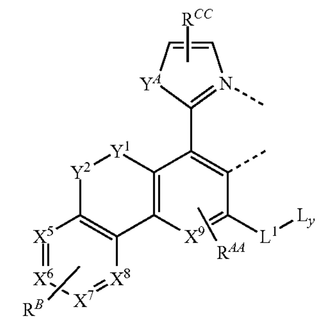
-continued
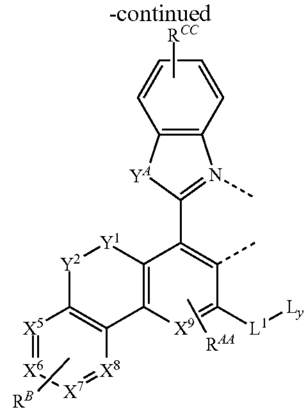
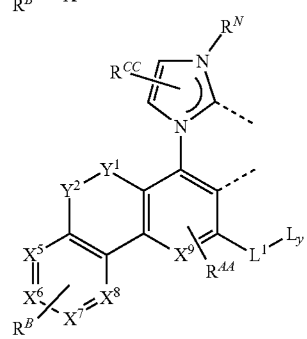
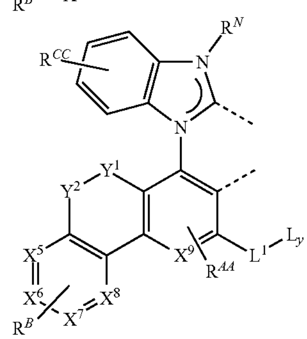
wherein $L_y$ is selected from the group consisting of the structures shown below:
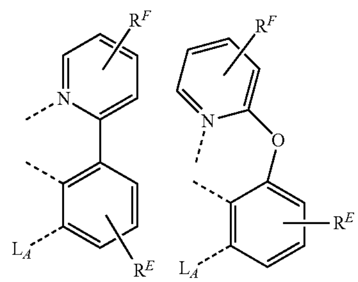
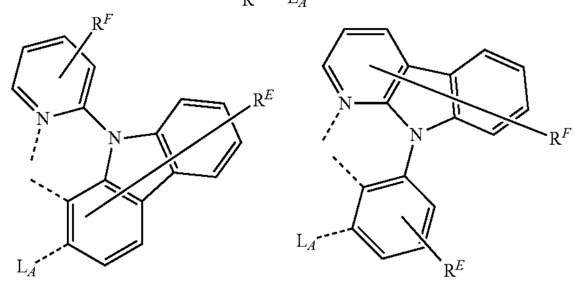

-continued
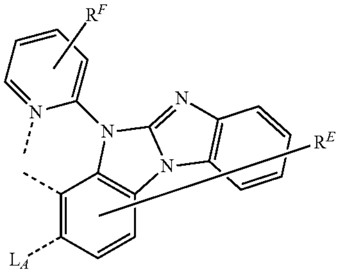
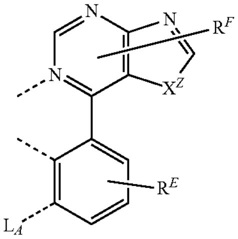
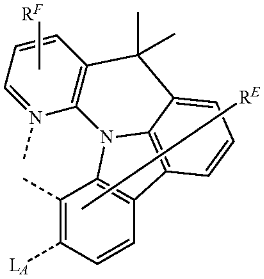
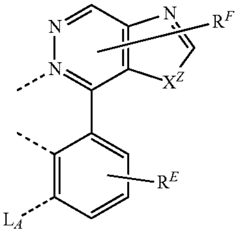
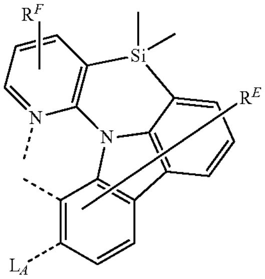
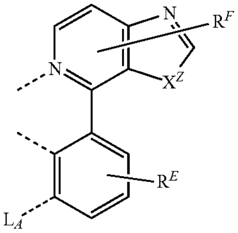
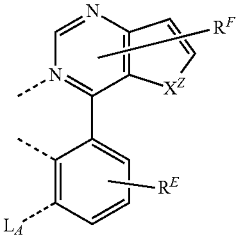
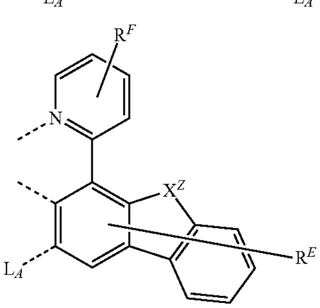
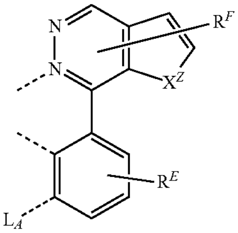
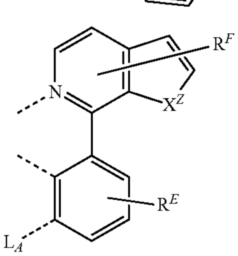
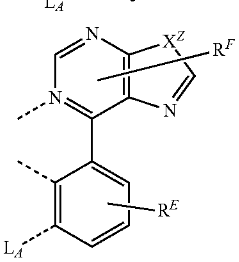
-continued
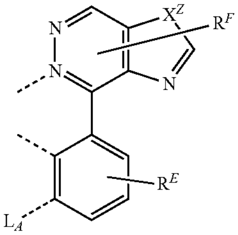
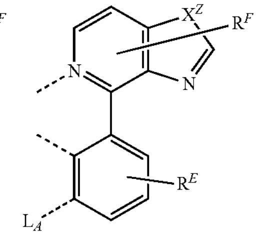
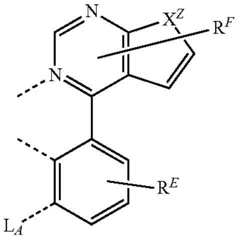
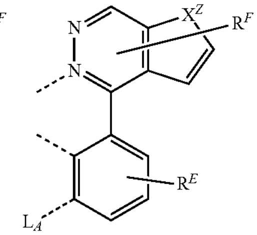
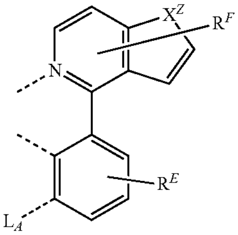
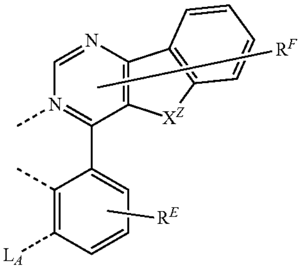
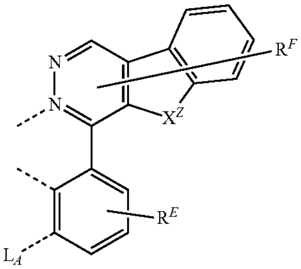
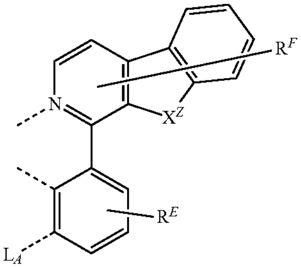
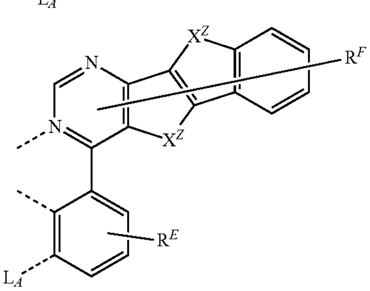

-continued
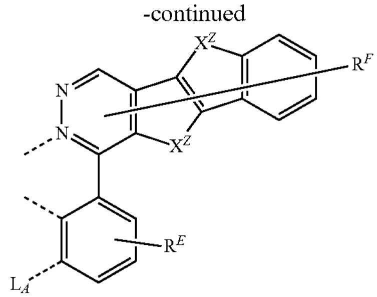
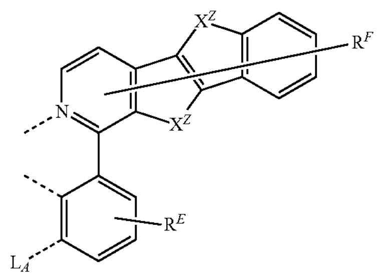
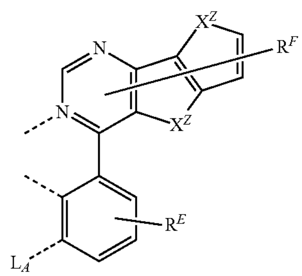
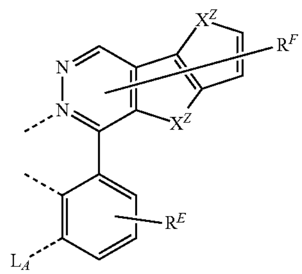
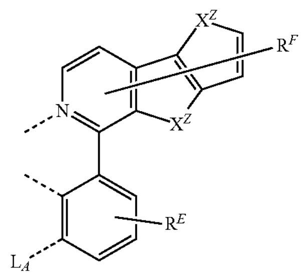
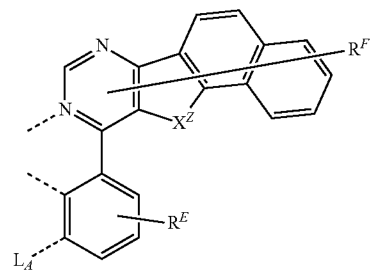
-continued
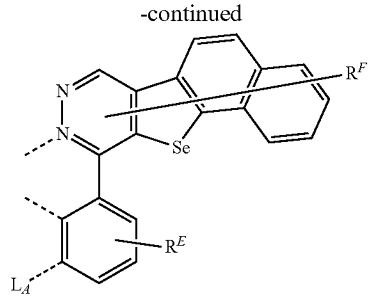
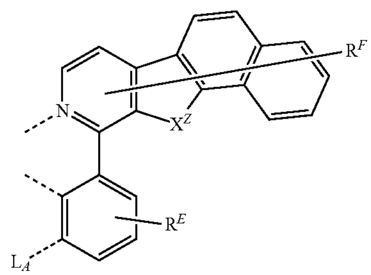
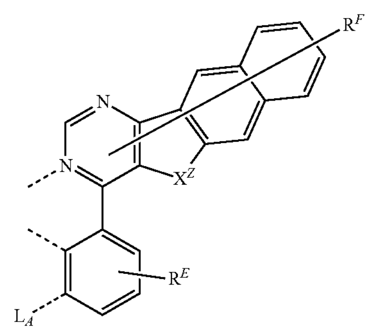
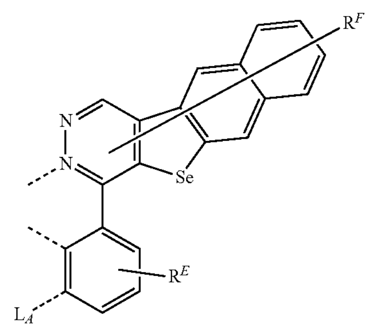
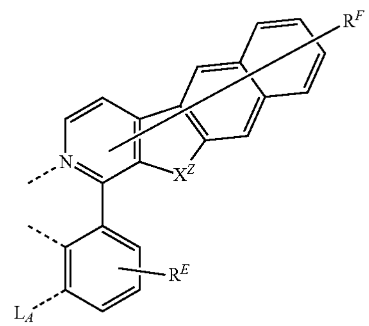

-continued
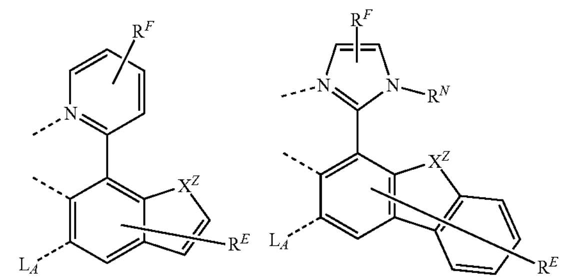
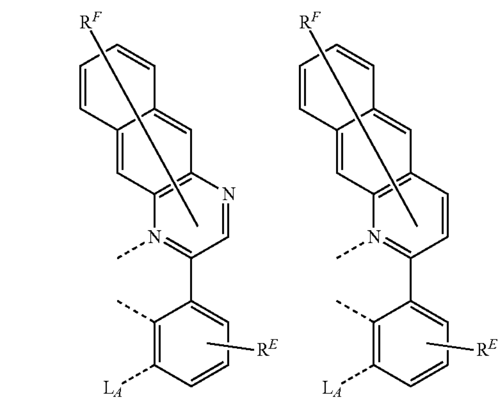
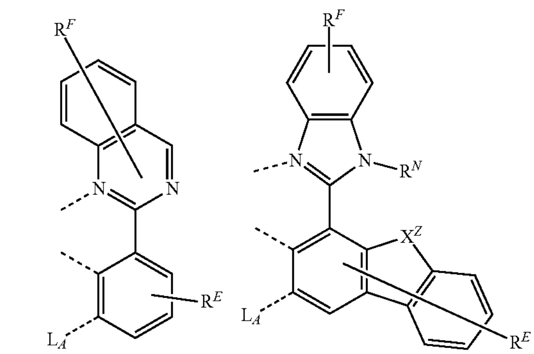
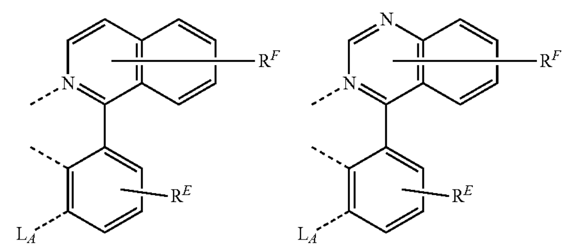
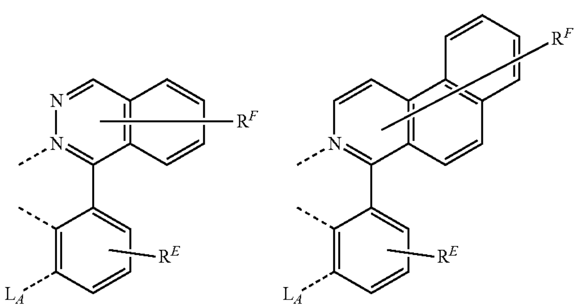
-continued
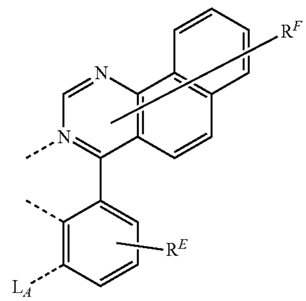
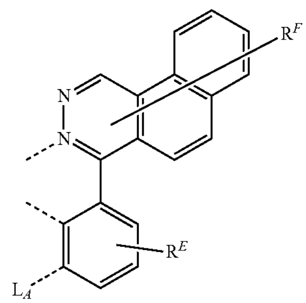
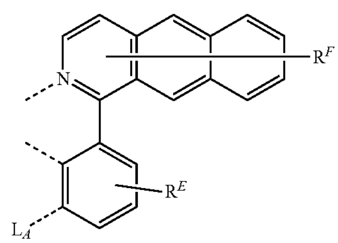
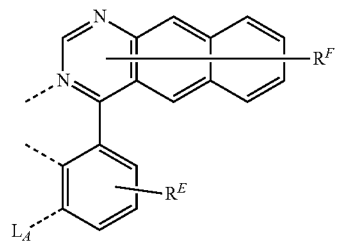
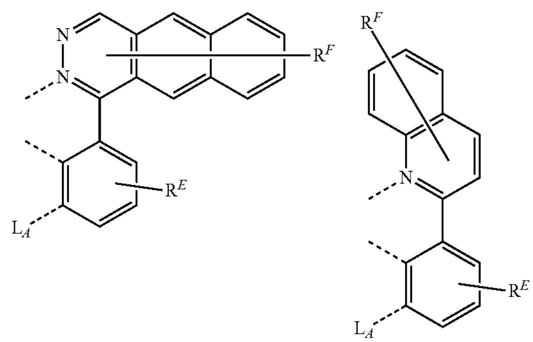

-continued

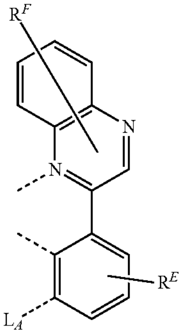

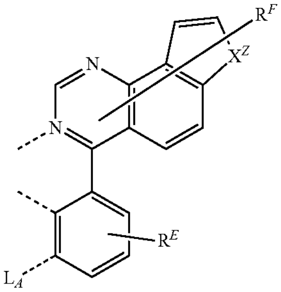

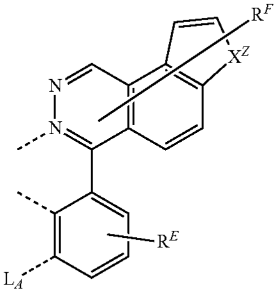

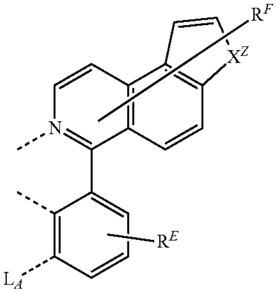

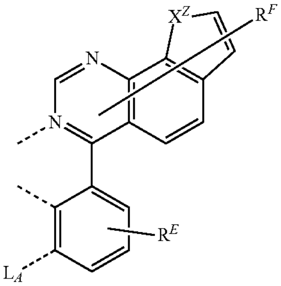

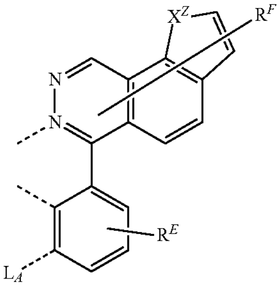

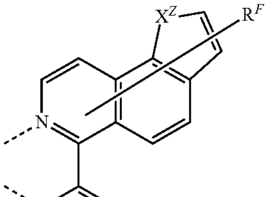

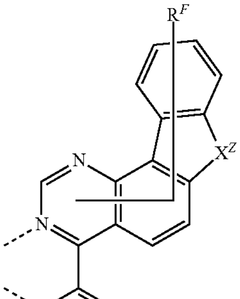

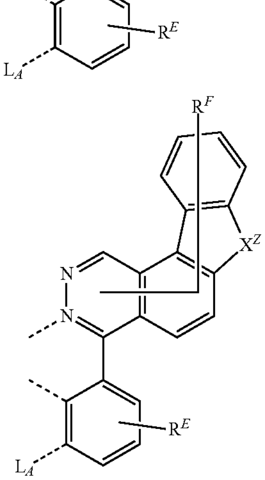

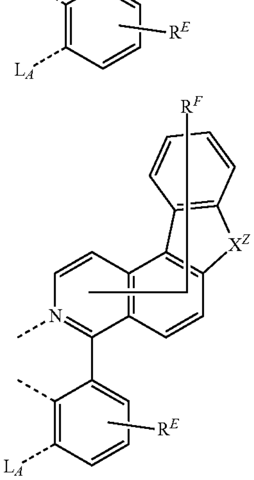

-continued

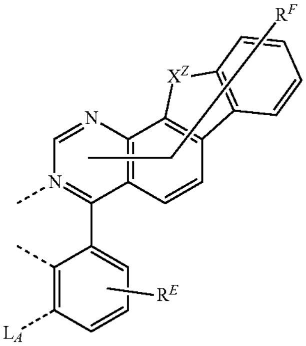

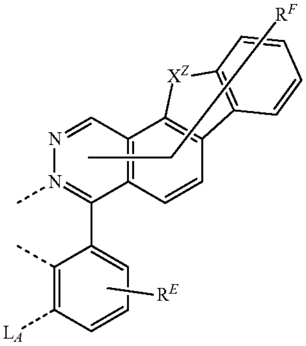

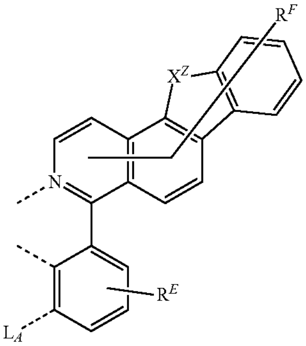

wherein $X^Z$ is $BR_e$, $NR_e$, $PR_e$, O, S, Se, C═O, C═S, C═Se, S═O, $SO_2$, P(O)R, $C{=}NR_e$, $C{=}CR_eR_f$, $CR_eR_f$, $SiR_eR_f$, or $GeR_eR_f$, $R^N$ is independently a hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof;

the remaining variables are the same as previously defined; and any two substituents may be optionally joined or fused to for a ring.

16. The compound of claim 14, wherein the compound is selected from the group consisting of the compounds having the formula of $Pt(L_{A'})(L_y)$:

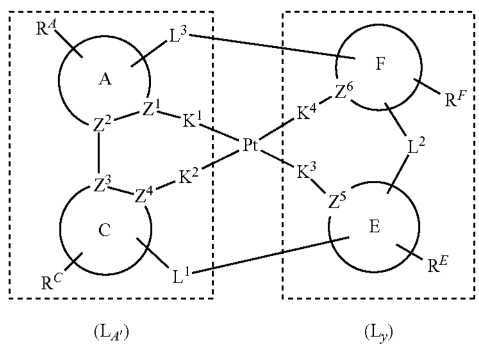

$(L_{A'})$ $(L_y)$ wherein $L_{A'}$ is selected from the group consisting of the structures shown below:

wherein $L_{A'}$ is selected from the group consisting of $L_{A'i}(R^E)(R^F)(R^H)(W)(P)$, wherein i is an integer from 1 to 30, E, F, and H are each independently integers from 1 to 89 and each $R^1$ to $R^{89}$ has independently the structure as defined in the list of claim 8, W is an integer from 1 to 42 as defined previously, and P is an integer from 1 to 5, wherein $L_{A'1}(R^1)(R^1)(R^1)(W1)(1)$ to $L_{A'24}(R^{89})(R^{89})(R^{89})(W30)(5)$ have the structure defined in the following LIST:

| $L_{A'}$ | Structure of $L_{A'}$ |
|---|---|
| $L_{A'1}$-$(R^1)(R^1)(R^1)(W1)(1)$ to $L_{A'1}$-$(R^{89})(R^{89})(R^{89})(W30)(5)$ have the structure | 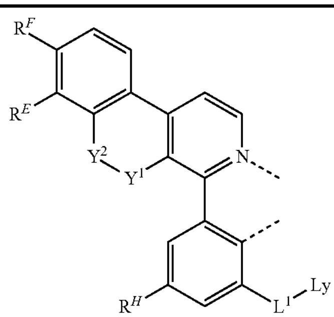 |
| $L_{A'2}$-$(R^1)(R^1)(R^1)(W1)(1)$ to $L_{A'2}$-$(R^{89})(R^{89})(R^{89})(W30)(5)$ have the structure | 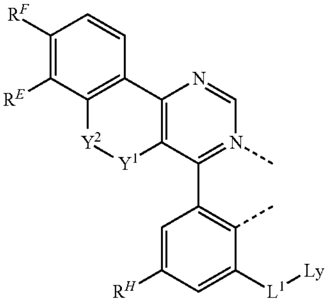 |
| $L_{A'3}$-$(R^1)(R^1)(R^1)(W1)(1)$ to $L_{A'3}$-$(R^{89})(R^{89})(R^{89})(W30)(5)$ have the structure | 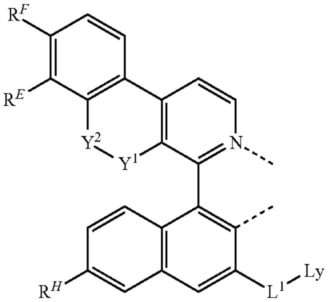 |

-continued

| $L_{A'}$ | Structure of $L_{A'}$ |
|---|---|
| $L_{A'4}$-$(R^1)(R^1)(R^1)(W1)(1)$ to $L_{A'4}$-$(R^{89})(R^{89})(R^{89})(W30)(5)$ have the structure | 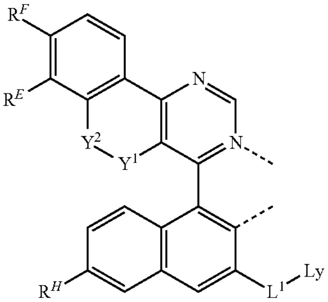 |
| $L_{A'5}$-$(R^1)(R^1)(R^1)(W1)(1)$ to $L_{A'5}$-$(R^{89})(R^{89})(R^{89})(W30)(5)$ have the structure | 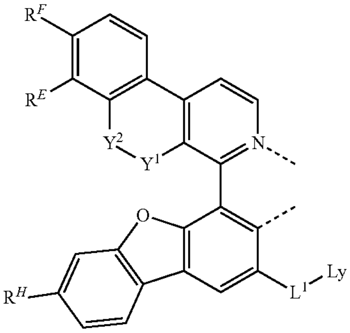 |
| $L_{A'6}$-$(R^1)(R^1)(R^1)(W1)(1)$ to $L_{A'6}$-$(R^{89})(R^{89})(R^{89})(W30)(5)$ have the structure | 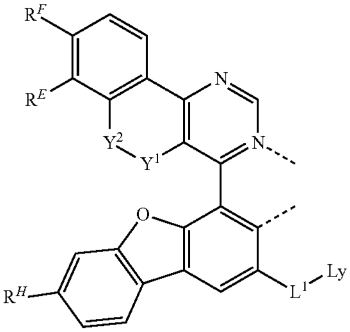 |
| $L_{A'7}$-$(R^1)(R^1)(R^1)(W1)(1)$ to $L_{A'7}$-$(R^{89})(R^{89})(R^{89})(W30)(5)$ have the structure | 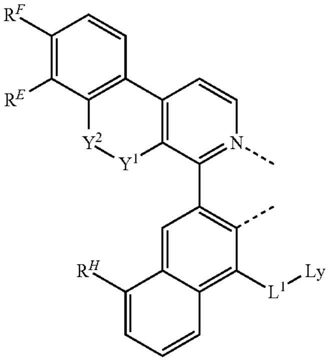 |

| $L_{A'}$ | Structure of $L_{A'}$ |
|---|---|
| $L_{A'8}$-($R^1$)($R^1$)($R^1$)(W1)(1) to $L_{A'8}$-($R^{89}$)($R^{89}$)($R^{89}$)(W30)(5) have the structure | 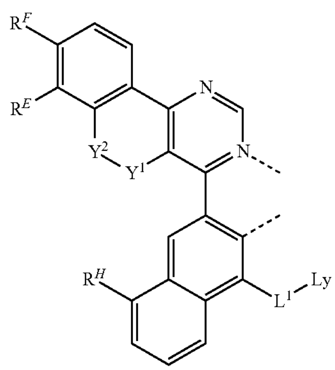 |
| $L_{A'9}$-($R^1$)($R^1$)($R^1$)(W1)(1) to $L_{A'9}$-($R^{89}$)($R^{89}$)($R^{89}$)(W30)(5)have the structure | 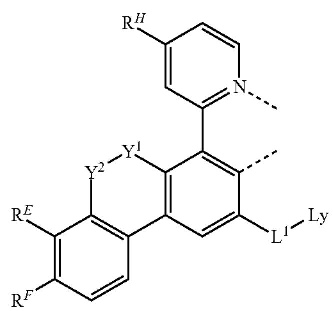 |
| $L_{A'10}$-($R^1$)($R^1$)($R^1$)(W1)(1) to $L_{A'10}$-($R^{89}$)($R^{89}$)($R^{89}$)(W30)(5) have the structure | 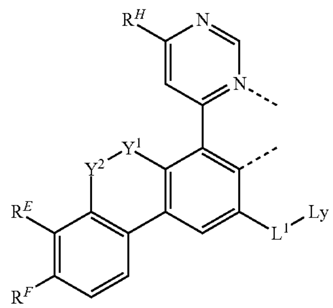 |
| $L_{A'11}$-($R^1$)($R^1$)($R^1$)(W1)(1) to $L_{A'11}$-($R^{89}$)($R^{89}$)($R^{89}$)(W30)(5) have the structure | 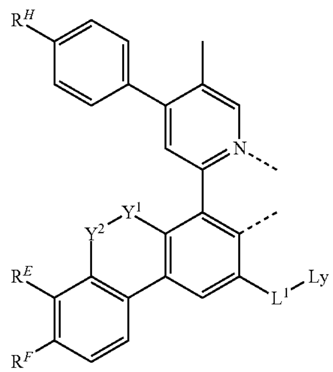 |

| $L_{A'}$ | Structure of $L_{A'}$ |
|---|---|
| $L_{A'12}$-($R^1$)($R^1$)($R^1$)(W1)(1) to $L_{A'12}$-($R^{89}$)($R^{89}$)($R^{89}$)(W30)(5) have the structure | 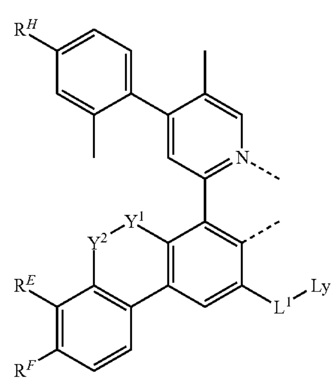 |
| $L_{A'13}$-($R^1$)($R^1$)($R^1$)(W1)(1) to $L_{A'13}$-($R^{89}$)($R^{89}$)($R^{89}$)(W30)(5) have the structure | 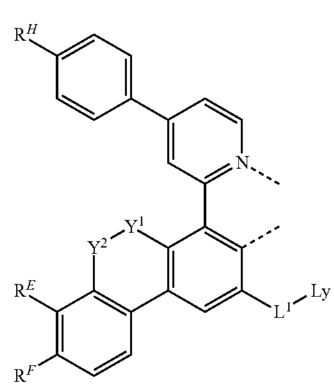 |
| $L_{A'14}$-($R^1$)($R^1$)($R^1$)(W1)(1) to $L_{A'14}$-($R^{89}$)($R^{89}$)($R^{89}$)(W30)(5) have the structure | 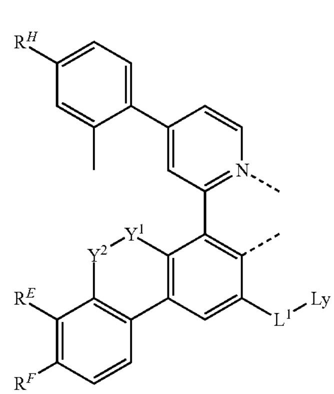 |
| $L_{A'15}$-($R^1$)($R^1$)($R^1$)(W1)(1) to $L_{A'15}$-($R^{89}$)($R^{89}$)($R^{89}$)(W30)(5) have the structure | 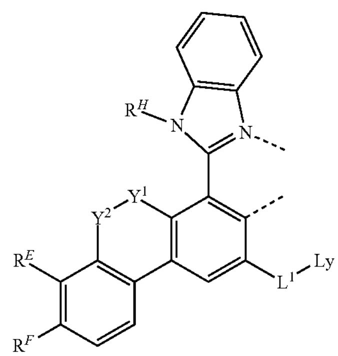 |

-continued

| $L_{A'}$ | Structure of $L_{A'}$ |
|---|---|
| $L_{A'16}$-($R^1$)($R^1$)($R^1$)(W1)(1) to $L_{A'16}$-($R^{89}$)($R^{89}$)($R^{89}$)(W30)(5) have the structure | 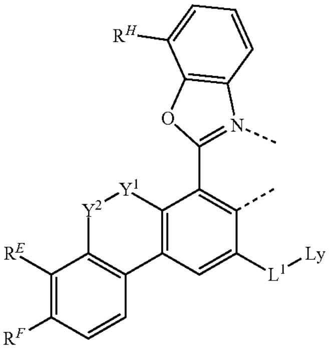 |
| $L_{A'17}$-($R^1$)($R^1$)($R^1$)(W1)(1) to $L_{A'17}$-($R^{89}$)($R^{89}$)($R^{89}$)(W30)(5) have the structure | 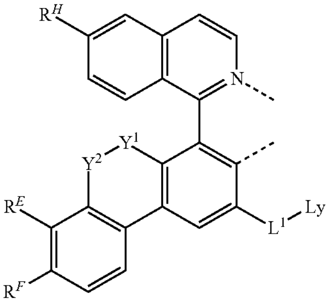 |
| $L_{A'18}$-($R^1$)($R^1$)($R^1$)(W1)(1) to $L_{A'18}$-($R^{89}$)($R^{89}$)($R^{89}$)(W30)(5) have the structure | 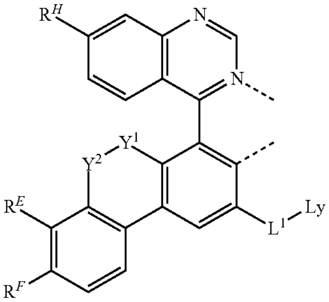 |
| $L_{A'19}$-($R^1$)($R^1$)($R^1$)(W1)(1) to $L_{A'19}$-($R^{89}$)($R^{89}$)($R^{89}$)(W30)(5) have the structure | 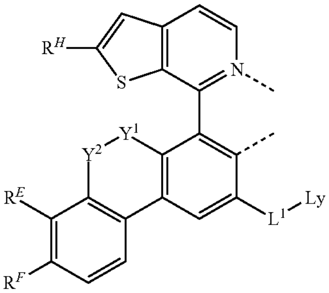 |
| $L_{A'20}$-($R^1$)($R^1$)($R^1$)(W1)(1) to $L_{A'20}$-($R^{89}$)($R^{89}$)($R^{89}$)(W30)(5) have the structure | 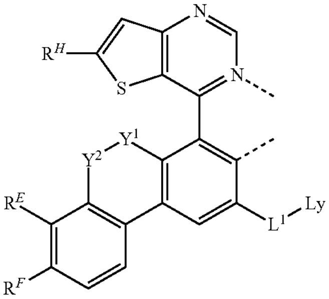 |

-continued

| $L_{A'}$ | Structure of $L_{A'}$ |
|---|---|
| $L_{A'21}$-($R^1$)($R^1$)($R^1$)(W1)(1) to $L_{A'21}$-($R^{89}$)($R^{89}$)($R^{89}$)(W30)(5) have the structure | 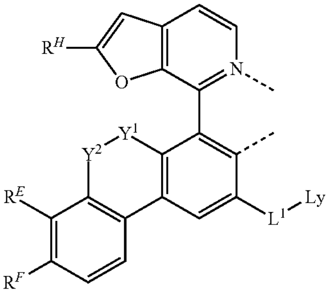 |
| $L_{A'22}$-($R^1$)($R^1$)($R^1$)(W1)(1) to $L_{A'22}$-($R^{89}$)($R^{89}$)($R^{89}$)(W30)(5) have the structure | 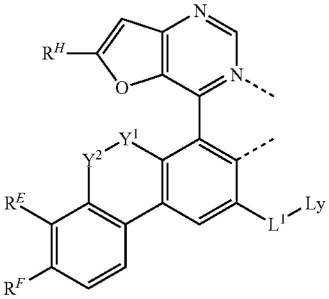 |
| $L_{A'23}$-($R^1$)($R^1$)($R^1$)(W1)(1) to $L_{A'23}$-($R^{89}$)($R^{89}$)($R^{89}$)(W30)(5) have the structure | 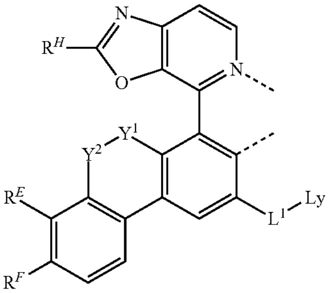 |
| $L_{A'24}$-($R^1$)($R^1$)($R^1$)(W1)(1) to $L_{A'24}$-($R^{89}$)($R^{89}$)($R^{89}$)(W30)(5) have the structure | 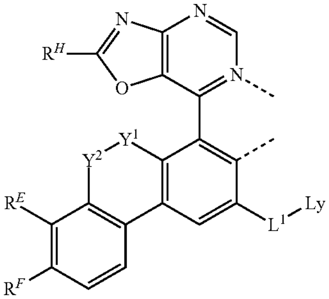 |
| $L_{A'25}$-($R^1$)($R^1$)($R^1$)(W1)(1) to $L_{A'25}$-($R^{89}$)($R^{89}$)($R^{89}$)(W30)(5) have the structure | 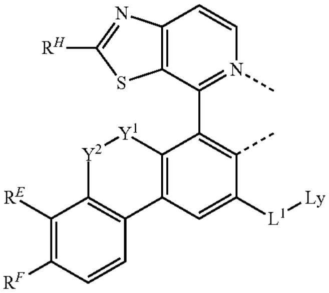 |

-continued

| $L_{A'}$ | Structure of $L_{A'}$ |
|---|---|
| $L_{A'26}$-$(R^1)(R^1)(R^1)(W1)(1)$ to $L_{A'26}$-$(R^{89})(R^{89})(R^{89})(W30)(5)$ have the structure | 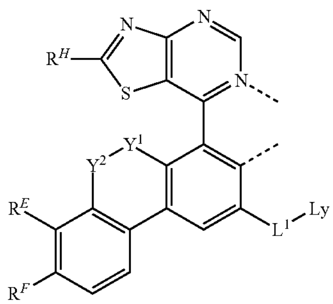 |
| $L_{A'27}$-$(R^1)(R^1)(R^1)(W1)(1)$ to $L_{A'27}$-$(R^{89})(R^{89})(R^{89})(W30)(5)$ have the structure | 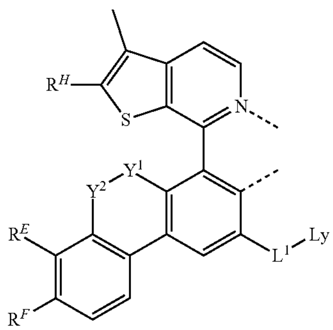 |
| $L_{A'28}$-$(R^1)(R^1)(R^1)(W1)(1)$ to $L_{A'28}$-$(R^{89})(R^{89})(R^{89})(W30)(5)$ have the structure | 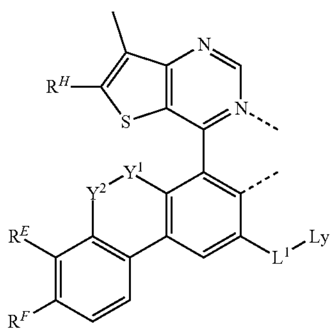 |
| $L_{A'29}$-$(R^1)(R^1)(R^1)(W1)(1)$ to $L_{A'29}$-$(R^{89})(R^{89})(R^{89})(W30)(5)$ have the structure | 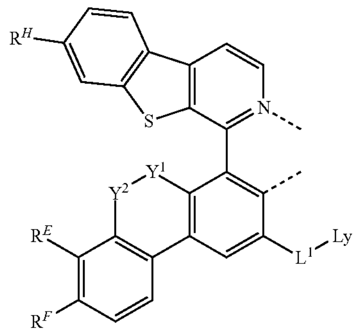 |

-continued

| $L_{A'}$ | Structure of $L_{A'}$ |
|---|---|
| $L_{A'30}$-$(R^1)(R^1)(R^1)(W1)(1)$ to $L_{A'30}$-$(R^{89})(R^{89})(R^{89})(W30)(5)$ have the structure | 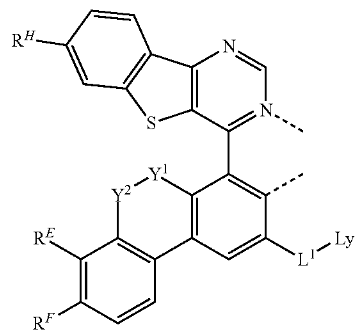 |

wherein, for each P from 1 to 5, $L^1$ has the meaning in the following LIST:

| P = 1 | P = 2 | P = 3 | P = 4 | P = 5 |
|---|---|---|---|---|
| $L^1$ = direct bond | $L^1$ = O | $L^1$ = S | $L^1$ = Se | $L^1$ = $N(CH_3)$ |

wherein $L_y$ is selected from the group consisting of the structures shown below:

wherein $L_Y$ is selected from the group consisting of $L_{Yw}(R^E(R^F)$, wherein w is an integer from 1 to 3, and E and F are each independently integers from 1 to 89, wherein $L_{Y1}(R^1)(R^1)$ to $L_{Y3}(R^{89})(R^{89})$ have the structure defined in the following LIST:

| $L_Y$ | Structure of $L_Y$ |
|---|---|
| for $L_{Y1}(R^E)(R^F)$, $L_{Y1}(R^1)(R^1)$ to $L_{Y1}(R^{89})(R^{89})$ have the structure | 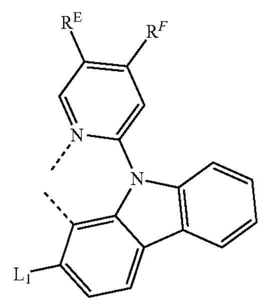 , |
| for $L_{Y2}(R^E)(R^F)$, $L_{Y2}(R^1)(R^1)$ to $L_{Y2}(R^{89})(R^{89})$ have the structure | 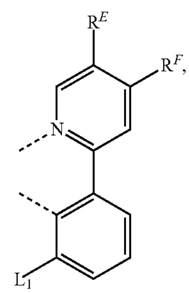 |

-continued

| $L_Y$ | Structure of $L_Y$ |
|---|---|
| for $L_{Y3}(R^E)(R^F)$, $L_{Y3}(R^1)(R^1)$ to $L_{Y3}(R^{89})(R^{89})$ have the structure | 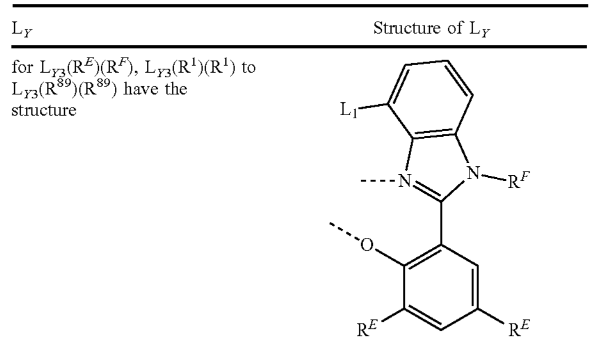 |

wherein $R^1$ to $R^{89}$ have the structures as defined in claim 8.

17. An organic light emitting device (OLED) comprising:

an anode;

a cathode; and an organic layer disposed between the anode and the cathode, wherein the organic layer comprises a A compound comprising a first ligand $L_A$;

wherein $L_A$ comprises a structure R of Formula I:

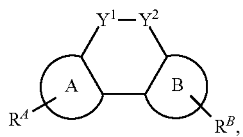

wherein moieties A and B are each independently a monocyclic ring or a polycyclic fused ring structure, wherein the monocyclic ring or each ring of the polycyclic fused ring structure is independently a 5-membered to 10-membered carbocyclic or heterocyclic ring;

wherein $Y^1$ and $Y^2$ are each independently selected from the group consisting of O, S, Se, NR, BR, BRR', $PR_e$, CR, C═O, C═NR, C═CRR', C═S, CRR', SO, $SO_2$, P(O)R, SiRR', and GeRR';

wherein each of $R^A$ and $R^B$ independently represents mono to the maximum allowable substitution, or no substitution;

wherein $L_A$ is coordinated to a metal M;

wherein moiety A and moiety B are not both joined to M by direct bonds;

wherein M is selected from the group consisting of Ir, Rh, Re, Ru, Os, Pt, Pd, Ag, Au, and Cu;

wherein M may be coordinated to other ligands;

wherein $L_A$ may be joined with other ligands to comprise a tridentate, tetradentate, pentadentate, or hexadentate ligand;

wherein any two substituents may be joined or fused to form a ring;

with the proviso that if moiety A is a pyridine ring joined to Ir by an Ir—N bond, then $Y^1$ is not $CF_2$ and $Y^2$ is not CRR'; and with the proviso that if moiety A is a benzene ring joined to Ir by a direct bond, then $Y^1$ is not O and $Y^2$ is not CRR';

wherein each R, R', $R^A$ and $R^B$ is independently hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof.

18. The OLED of claim 17, wherein the organic layer further comprises a host, wherein the host comprises at least one chemical moiety selected from the group consisting of triphenylene, carbazole, indolocarbazole, dibenzothiophene, dibenzofuran, dibenzoselenophene, 5λ$^2$-benzo[d]benzo[4,5]imidazo[3,2-a]imidazole, 5,9-dioxa-13b-boranaphtho[3,2,1-de]anthracene, triazine, aza-triphenylene, aza-carbazole, aza-indolocarbazole, aza-dibenzothiophene, aza-dibenzofuran, aza-dibenzoselenophene, aza-5λ2-benzo[d]benzo[4,5]imidazo[3,2-a]imidazole, and aza-(5,9-dioxa-13b-boranaphtho[3,2,1-de]anthracene).

19. The OLED of claim 17, wherein the organic layer further comprises a host, wherein the host is selected from the group consisting of the following HOST group 1 as defined herein.

20. A consumer product comprising an organic light-emitting device (OLED) comprising:

an anode;

a cathode; and an organic layer disposed between the anode and the cathode, wherein the organic layer comprises a compound comprising a first ligand $L_A$;

wherein $L_A$ comprises a structure R of Formula I:

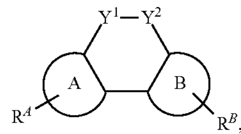

wherein moieties A and B are each independently a monocyclic ring or a polycyclic fused ring structure, wherein the monocyclic ring or each ring of the polycyclic fused ring structure is independently a 5-membered to 10-membered carbocyclic or heterocyclic ring;

wherein $Y^1$ and $Y^2$ are each independently selected from the group consisting of O, S, Se, NR, BR, BRR', $PR_e$, CR, C═O, C═NR, C═CRR', C═S, CRR', SO, $SO_2$, P(O)R, SiRR', and GeRR';

wherein each of $R^A$ and $R^B$ independently represents mono to the maximum allowable substitution, or no substitution;

wherein $L_A$ is coordinated to a metal M;

wherein moiety A and moiety B are not both joined to M by direct bonds;

wherein M is selected from the group consisting of Ir, Rh, Re, Ru, Os, Pt, Pd, Ag, Au, and Cu;

wherein M may be coordinated to other ligands;

wherein $L_A$ may be joined with other ligands to comprise a tridentate, tetradentate, pentadentate, or hexadentate ligand;

wherein any two substituents may be joined or fused to form a ring;

with the proviso that if moiety A is a pyridine ring joined to Ir by an Ir—N bond, then $Y^1$ is not $CF_2$ and $Y^2$ is not CRR'; and with the proviso that if moiety A is a benzene ring joined to Ir by a direct bond, then Y' is not O and $Y^2$ is not CRR';

wherein each R, R', $R^A$ and $R^B$ is independently hydrogen or a substituent selected from the group consisting of deuterium, halogen, alkyl, cycloalkyl, heteroalkyl, heterocycloalkyl, boryl, arylalkyl, alkoxy, aryloxy, amino, silyl, germyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, selenyl, and combinations thereof.

* * * * *